US010700289B2

(12) United States Patent
Han et al.

(10) Patent No.: US 10,700,289 B2
(45) Date of Patent: *Jun. 30, 2020

(54) HETEROCYCLIC COMPOUND AND ORGANIC LIGHT EMITTING ELEMENT COMPRISING SAME

(71) Applicant: LG CHEM, LTD., Seoul (KR)

(72) Inventors: Miyeon Han, Daejeon (KR); Sung Kil Hong, Daejeon (KR); Dong Hoon Lee, Daejeon (KR); Hyungjin Lee, Daejeon (KR); Boojae Jang, Daejeon (KR); Minyong Kang, Daejeon (KR); Dong Uk Heo, Daejeon (KR); Wooyung Jung, Daejeon (KR)

(73) Assignee: LG CHEM, LTD., Seoul (KR)

( * ) Notice: Subject to any disclaimer, the term of this patent is extended or adjusted under 35 U.S.C. 154(b) by 179 days.

This patent is subject to a terminal disclaimer.

(21) Appl. No.: 15/553,956

(22) PCT Filed: Mar. 4, 2016

(86) PCT No.: PCT/KR2016/002207

§ 371 (c)(1),
(2) Date: Aug. 25, 2017

(87) PCT Pub. No.: WO2016/140549

PCT Pub. Date: Sep. 9, 2016

(65) Prior Publication Data

US 2018/0076395 A1 Mar. 15, 2018

(30) Foreign Application Priority Data

Mar. 5, 2015 (KR) ........................ 10-2015-0030746
Mar. 5, 2015 (KR) ........................ 10-2015-0030749

(51) Int. Cl.
*H01L 51/00* (2006.01)
*C09K 11/06* (2006.01)
(Continued)

(52) U.S. Cl.
CPC ........ *H01L 51/0072* (2013.01); *C07F 9/6561* (2013.01); *C09B 57/00* (2013.01);
(Continued)

(58) Field of Classification Search
None
See application file for complete search history.

(56) References Cited

U.S. PATENT DOCUMENTS 9,000,169 B2 4/2015 Lee et al.
9,502,669 B2 * 11/2016 Huh-Jungoh ............. H01L 1/50 257/40
(Continued)

FOREIGN PATENT DOCUMENTS

EP 2719741 A2 4/2014
EP 3312256 A1 4/2018
(Continued)

OTHER PUBLICATIONS

Chen et al. "Modular SYnthesis of Benzimidazole-Fused Phenanthridines from 2-Arylbenzimidazoles and o-Dibromoarenes by a Palladium-Catalyzed Cascade Process" Org. Lett. 2014, 16, 1872-1875. (Year: 2014).*

*Primary Examiner* — Robert S Loewe
(74) *Attorney, Agent, or Firm* — Dentons US LLP

(57) ABSTRACT

The present specification provides a hetero-cyclic compound and an organic light emitting device including the same.

15 Claims, 1 Drawing Sheet

(51) Int. Cl.

| | |
|---|---|
| ***C09B 57/00*** | (2006.01) |
| ***C07F 9/6561*** | (2006.01) |
| *H01L 51/50* | (2006.01) |

(52) U.S. Cl.

CPC .......... *C09K 11/06* (2013.01); *H01L 51/0052* (2013.01); *C09K 2211/107* (2013.01); *C09K 2211/1011* (2013.01); *C09K 2211/1014* (2013.01); *C09K 2211/1018* (2013.01); *C09K 2211/1022* (2013.01); *C09K 2211/1044* (2013.01); *C09K 2211/1055* (2013.01); *C09K 2211/1059* (2013.01); *C09K 2211/1074* (2013.01); *C09K 2211/1085* (2013.01); *H01L 51/0058* (2013.01); *H01L 51/0067* (2013.01); *H01L 51/5012* (2013.01); *H01L 51/5056* (2013.01); *H01L 51/5072* (2013.01); *H01L 51/5088* (2013.01); *H01L 51/5092* (2013.01)

(56) References Cited

U.S. PATENT DOCUMENTS

| | | | | |
|---|---|---|---|---|
| 2012/0261651 | A1 | 10/2012 | Noto et al. | |
| 2013/0181196 | A1 | 7/2013 | Lee et al. | |
| 2014/0048792 | A1 | 2/2014 | Chun et al. | |
| 2014/0110694 | A1 | 4/2014 | Shin et al. | |
| 2014/0251816 | A1 | 9/2014 | Leo et al. | |
| 2016/0005979 | A1 | 1/2016 | Kim et al. | |
| 2016/0005980 | A1* | 1/2016 | Ito | H01L 51/0072 257/40 |
| 2016/0013427 | A1* | 1/2016 | Kim | H01L 51/0074 257/40 |
| 2016/0293852 | A1 | 10/2016 | Huh et al. | |

FOREIGN PATENT DOCUMENTS

| | | | | |
|---|---|---|---|---|
| KR | 1020000051826 A | | 8/2000 | |
| KR | 1020120138673 A | | 12/2012 | |
| KR | 1020130006293 A | | 1/2013 | |
| KR | 1020130037186 A | | 4/2013 | |
| KR | 101317495 B1 | | 10/2013 | |
| KR | 1020140111898 A | | 9/2014 | |
| KR | 1020160004466 A | | 1/2016 | |
| WO | 2003012890 A2 | | 2/2003 | |
| WO | 2007095118 A2 | | 8/2007 | |
| WO | 201102385 A1 | | 2/2011 | |
| WO | WO 2014142488 | * | 9/2014 | C07D 471/14 |
| WO | 2016024728 A1 | | 2/2016 | |

* cited by examiner

[Figure 1]
[Figure 2]
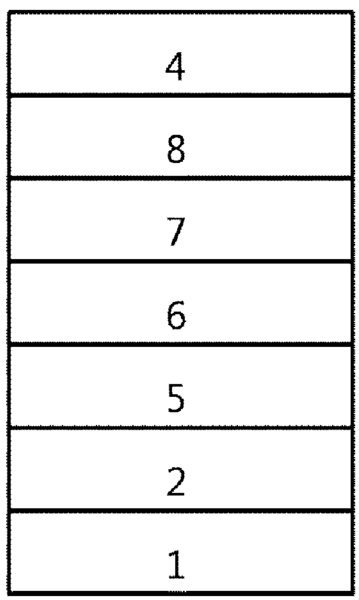

HETEROCYCLIC COMPOUND AND ORGANIC LIGHT EMITTING ELEMENT COMPRISING SAME

This application is a National Stage Application of International Application No. PCT/KR2016/002207, filed Mar. 4, 2016, and claims benefit of Korean Patent Application No. 10-2015-0030746, filed Mar. 5, 2015, and Korean Patent Application No. 10-2015-0030749, filed Mar. 5, 2015 the contents of which are incorporated herein by reference in their entirety for all purposes as if fully set forth below.

TECHNICAL FIELD

The present specification relates to a hetero-cyclic compound and an organic light emitting device comprising the same. This application claims priority to and the benefit of Korean Patent Application Nos. 10-2015-0030746 and 10-2015-0030749 filed in the Korean Intellectual Property Office on Mar. 5, 2015, the entire contents of which are incorporated herein by reference.

BACKGROUND ART

In general, an organic light emitting phenomenon refers to a phenomenon in which electric energy is converted into light energy by using an organic material. An organic light emitting device using the organic light emitting phenomenon usually has a structure including a positive electrode, a negative electrode, and an organic material layer interposed therebetween. Here, the organic material layer may have a multilayered structure composed of different materials in order to improve the efficiency and stability of an organic light emitting device in many cases, and for example, may be composed of a hole injection layer, a hole transporting layer, a light emitting layer, an electron transporting layer, an electron injection layer, and the like. In the structure of the organic light emitting device, if a voltage is applied between two electrodes, holes are injected from a positive electrode into the organic material layer and electrons are injected from a negative electrode into the organic material layer, and when the injected holes and electrons meet each other, an exciton is formed, and light is emitted when the exciton falls down again to a ground state.

There is a continuous need for developing a new material for the aforementioned organic light emitting device.

DETAILED DESCRIPTION OF THE INVENTION

Technical Problem

The present specification describes a hetero-cyclic compound and an organic light emitting device comprising the same.

Technical Solution

An exemplary embodiment of the present specification provides a compound represented by the following Chemical Formula 1:

[Chemical Formula 1]

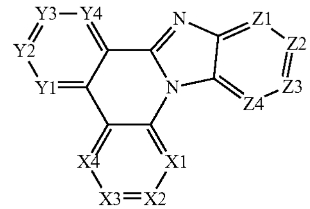

In Chemical Formula 1,

X1 is N or CR1, X2 is N or CR2, X3 is N or CR3, and X4 is N or CR4,

Y1 is N or CR5, Y2 is N or CR6, Y3 is N or CR7, and Y4 is N or CR8,

Z1 is N or CR9, Z2 is N or CR10, Z3 is N or CR11, and Z4 is N or CR12,

X1 to X4, Y1 to Y4, and Z1 to Z4 are not simultaneously N,

R1 to R12 are the same as or different from each other, and are each independently hydrogen; deuterium; a halogen group; a nitrile group; a nitro group; a hydroxy group; a carbonyl group; an ester group; an imide group; an amino group; a substituted or unsubstituted silyl group; a substituted or unsubstituted boron group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted aralkyl group; a substituted or unsubstituted aralkenyl group; a substituted or unsubstituted alkylaryl group; a substituted or unsubstituted alkylamine group; a substituted or unsubstituted aralkylamine group; a substituted or unsubstituted heteroarylamine group; a substituted or unsubstituted arylamine group; a substituted or unsubstituted arylphosphine group; a substituted or unsubstituted phosphine oxide group; a substituted or unsubstituted aryl group; or a substituted or unsubstituted hetero-cyclic group, or may combine with an adjacent group to form a substituted or unsubstituted ring, at least one of a substituent of a ring formed by combining two or more adjacent groups of R1 to R12; and a group of R1 to R12, which does not form a ring, is

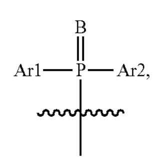

B is O, S, or Se, and

Ar1 and Ar2 are the same as or different from each other, and are each independently a substituted or unsubstituted aryl group; or a substituted or unsubstituted hetero-cyclic group, or combine with each other to form a substituted or unsubstituted ring.

Further, an exemplary embodiment of the present specification provides an organic light emitting device including: a first electrode; a second electrode provided to face the first electrode; and one or more organic material layers provided between the first electrode and the second electrode, in which one or more of the organic material layers include the compound of Chemical Formula 1.

Advantageous Effects

The compound described in the present specification may be used as a material for an organic material layer of an organic light emitting device. The compound according to at least one exemplary embodiment may improve the efficiency, achieve low driving voltage and/or improve lifespan characteristics in the organic light emitting device. In particular, the compound described in the present specification may be used as a material for hole injection, hole transport, hole injection and hole transport, light emission, electron transport, or electron injection. In addition, the compound described in the present specification may be preferably used as a material for a light emitting layer, and electron transport or electron injection.

BRIEF DESCRIPTION OF DRAWINGS

FIG. 1 illustrates an example of an organic light emitting device composed of a substrate 1, a positive electrode 2, a light emitting layer 3, and a negative electrode 4.

FIG. 2 illustrates an example of an organic light emitting device composed of a substrate 1, a positive electrode 2, a hole injection layer 5, a hole transporting layer 6, a light emitting layer 7, an electron transporting layer 8, and a negative electrode 4.

BEST MODE

Hereinafter, the present specification will be described in more detail.

An exemplary embodiment of the present specification provides the compound represented by Chemical Formula 1. Examples of the substituents will be described below, but are not limited thereto.

In the present specification, the term "substituted or unsubstituted" means being unsubstituted or substituted with one or more substituents selected from the group consisting of deuterium; a halogen group; a nitrile group; a nitro group; a hydroxy group; a carbonyl group; an ester group; an imide group; an amino group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkylamine group; an aralkylamine group; a heteroarylamine group; an arylamine group; an arylphosphine group; and a hetero-cyclic group, or being unsubstituted or substituted with a substituent to which two or more substituents are linked among the substituents exemplified above. For example, "the substituent to which two or more substituents are linked" may be a biphenyl group. That is, the biphenyl group may also be an aryl group, and may be interpreted as a substituent to which two phenyl groups are linked.

In the present specification, the "adjacent" group may mean a substituent substituted with an atom directly linked to an atom in which the corresponding substituent is substituted, a substituent disposed sterically closest to the corresponding substituent, or another substituent substituted with an atom in which the corresponding substituent is substituted. For example, two substituents substituted at the ortho position in a benzene ring and two substituents substituted with the same carbon in an aliphatic ring may be interpreted as groups which are "adjacent" to each other.

In the present specification, the number of carbon atoms of a carbonyl group is not particularly limited, but is preferably 1 to 40. Specifically, the carbonyl group may be a compound having the following structures, but is not limited thereto.

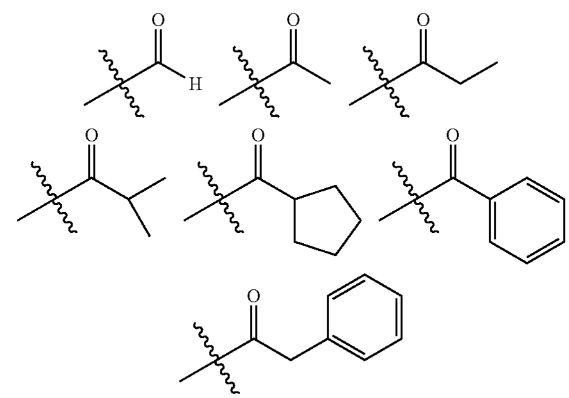

In the present specification, in an ester group, the oxygen of the ester group may be substituted with a straight-chained, branched, or cyclic alkyl group having 1 to 25 carbon atoms, or an aryl group having 6 to 25 carbon atoms. Specifically, the ester group may be a compound having the following structural formulae, but is not limited thereto.

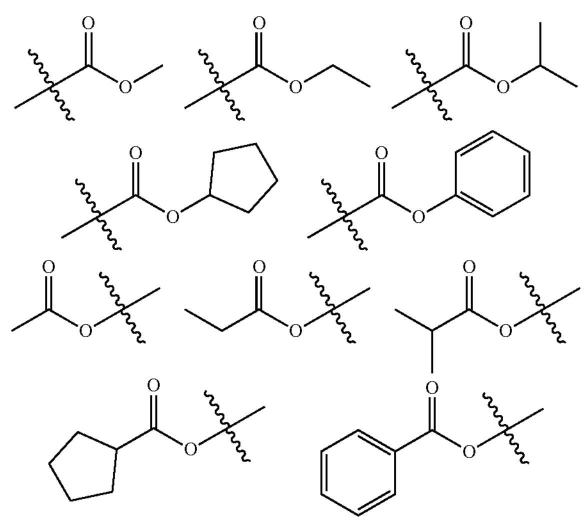

In the present specification, the number of carbon atoms of an imide group is not particularly limited, but is preferably 1 to 25. Specifically, the imide group may be a compound having the following structures, but is not limited thereto.

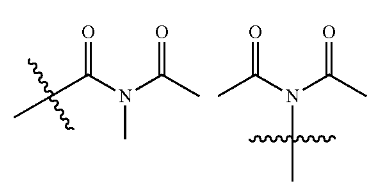

-continued

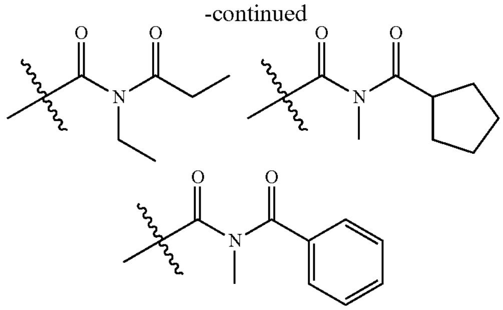

In the present specification, specific examples of a silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but are not limited thereto.

In the present specification, specific examples of a boron group include a trimethylboron group, a triethylboron group, a t-butyldimethylboron group, a triphenylboron group, a phenylboron group, and the like, but are not limited thereto.

In the present specification, examples of a halogen group include fluorine, chlorine, bromine or iodine.

In the present specification, the alkyl group may be straight-chained or branched, and the number of carbon atoms thereof is not particularly limited, but is preferably 1 to 40. According to an exemplary embodiment, the number of carbon atoms of the alkyl group is 1 to 20. According to another exemplary embodiment, the number of carbon atoms of the alkyl group is 1 to 10. According to still another exemplary embodiment, the number of carbon atoms of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethyl-propyl, isohexyl, 4-methylhexyl, 5-methylhexyl, and the like, but are not limited thereto.

In the present specification, the alkenyl group may be straight-chained or branched, and the number of carbon atoms thereof is not particularly limited, but is preferably 2 to 40. According to an exemplary embodiment, the number of carbon atoms of the alkenyl group is 2 to 20. According to another exemplary embodiment, the number of carbon atoms of the alkenyl group is 2 to 10. According to still another exemplary embodiment, the number of carbon atoms of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, a cycloalkyl group is not particularly limited, but has preferably 3 to 60 carbon atoms, and according to an exemplary embodiment, the number of carbon atoms of the cycloalkyl group is 3 to 30. According to another exemplary embodiment, the number of carbon atoms of the cycloalkyl group is 3 to 20. According to still another exemplary embodiment, the number of carbon atoms of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, examples of an arylamine group mean a substituted or unsubstituted monocyclic diarylamine group, a substituted or unsubstituted polycyclic diarylamine group, or a substituted or unsubstituted monocyclic and polycyclic diarylamine group.

In the present specification, an aryl group is not particularly limited, but has preferably 6 to 60 carbon atoms, and may be a monocyclic aryl group or a polycyclic aryl group. According to an exemplary embodiment, the number of carbon atoms of the aryl group is 6 to 30. According to an exemplary embodiment, the number of carbon atoms of the aryl group is 6 to 20. When the aryl group is a monocyclic aryl group, examples of the monocyclic aryl group include a phenyl group, a biphenyl group, a terphenyl group, and the like, but are not limited thereto. Examples of the polycyclic aryl group include a naphthyl group, an anthracenyl group, a phenanthryl group, a pyrenyl group, a perylenyl group, a chrysenyl group, a fluorenyl group, and the like, but are not limited thereto.

In the present specification, a fluorenyl group may be substituted, and two substituents may combine with each other to form a spiro structure.

When the fluorenyl group is substituted, the fluorenyl group may be

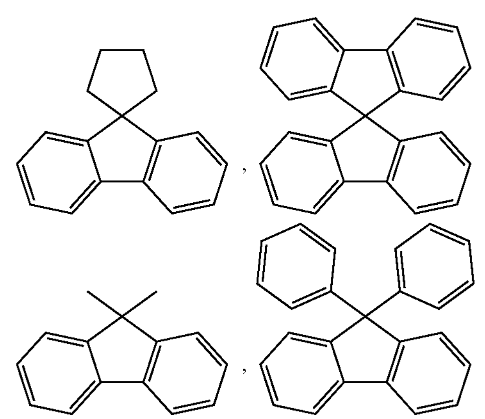

and the like. However, the fluorenyl group is not limited thereto.

In the present specification, a hetero-cyclic group is a hetero-cyclic group including one or more of N, O, S, Si, and Se as a hetero atom, and the number of carbon atoms thereof is not particularly limited, but is preferably 2 to 60. Examples of the hetero-cyclic group include a thiophene group, a furan group, a pyrrole group, an imidazole group, a thiazole group, an oxazole group, an oxadiazole group, a triazole group, a pyridyl group, a bipyridyl group, a pyrimidyl group, a triazine group, an acridyl group, a pyridazine group, a pyrazinyl group, a qinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a benzothiazolyl group, a phenothiazinyl group, a dibenzofuranyl group, and the like, but are not limited thereto.

In the present specification, the description on the above-described hetero-cyclic group may be applied to a heteroaryl group except for an aromatic group.

In the present specification, the description on the above-described aryl group may be applied to an aryl group of an aryloxy group, an arylthioxy group, an arylsulfoxy group, an arylphosphine group, an aralkyl group, an aralkylamine group, an aralkenyl group, an alkylaryl group, and an arylamine group.

In the present specification, the description on the above-described alkyl group may be applied to an alkyl group of an alkylthioxy group, an alkylsulfoxy group, an aralkyl group, an aralkylamine group, an alkylaryl group, and an alkylamine group.

In the present specification, the description on the above-described hetero-cyclic group may be applied to a heteroaryl group of a heteroaryl group and a heteroarylamine group.

In the present specification, the description on the above-described alkenyl group may be applied to an alkenyl group of an aralkenyl group.

In the present specification, the meaning of combining with an adjacent group to form a ring means combining with an adjacent group to form a substituted or unsubstituted aliphatic hydrocarbon ring; a substituted or unsubstituted aromatic hydrocarbon ring; a substituted or unsubstituted aliphatic hetero ring; a substituted or unsubstituted aromatic hetero ring; and a condensed ring thereof.

In the present specification, the aliphatic hydrocarbon ring means a ring composed only of carbon and hydrogen atoms as a ring which is not an aromatic group. In the present specification, examples of the aromatic hydrocarbon ring include a phenyl group, a naphthyl group, an anthracenyl group, and the like, but are not limited thereto.

In the present specification, the aliphatic hetero ring means an aliphatic ring including one or more of hetero atoms.

In the present specification, the aromatic hetero ring means an aromatic ring including one or more of hetero atoms.

In the present specification, the aliphatic hydrocarbon ring, the aromatic hydrocarbon ring, the aliphatic hetero ring, and the aromatic hetero ring may be monocyclic or polycyclic.

In an exemplary embodiment of the present specification, at least one of a substituent of a ring formed by combining two or more adjacent groups of R1 to R12; and a group of R1 to R12, which does not form a ring, is

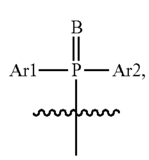

and when P is directly bonded to the core of the present invention, there is a difference in synthesis method as follows. In the case of a Suzuki-Miyaura cross coupling which is the existing synthesis method, a phosphine oxide compound could not be directly bonded to a desired position of cyclic imidazole. However, a phosphine oxide compound may be directly bonded to a desired position of cyclic imidazole using an Ni-catalyzed coupling method which is applied to the present patent, and accordingly, it is possible to obtain more improved effects in terms of driving voltage, efficiency, and lifespan characteristics than materials in which a linker is linked between cyclic imidazole and the phosphine oxide compound.

According to an exemplary embodiment of the present specification, at least one of R1 to R8 is

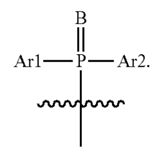

According to an exemplary embodiment of the present specification, at least one of R5 to R12 is

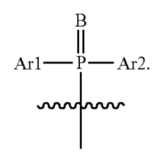

According to an exemplary embodiment of the present specification, at least one of R1 to R4 and R9 to R12 is

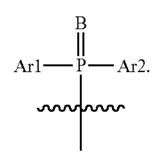

According to an exemplary embodiment of the present specification, at least one of R1 to R4 is

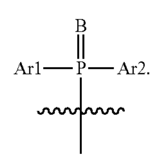

According to an exemplary embodiment of the present specification, at least one of R5 to R8 is

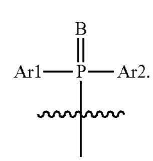

According to an exemplary embodiment of the present specification, at least one of R9 to R12 is

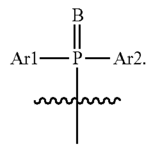

According to an exemplary embodiment of the present specification, at least one of R1 to R4 is

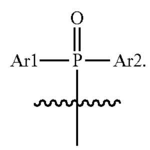

According to an exemplary embodiment of the present specification, at least one of R5 to R8 is

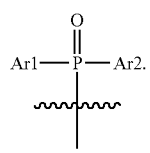

According to an exemplary embodiment of the present specification, at least one of R9 to R12 is

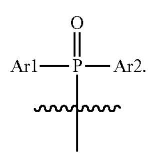

According to an exemplary embodiment of the present specification, R1 is

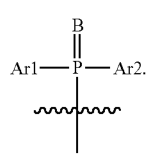

According to an exemplary embodiment of the present specification, R2 is

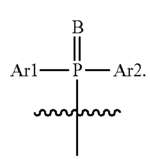

According to an exemplary embodiment of the present specification, R3 is

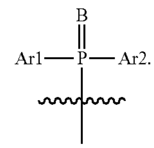

According to an exemplary embodiment of the present specification, R4 is

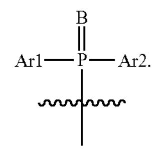

According to an exemplary embodiment of the present specification, R5 is

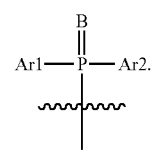

According to an exemplary embodiment of the present specification, R6 is

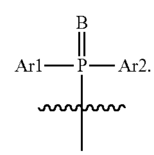

According to an exemplary embodiment of the present specification, R7 is

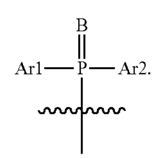

According to an exemplary embodiment of the present specification, R8 is

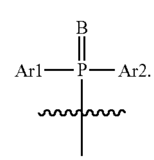

According to an exemplary embodiment of the present specification, R9 is

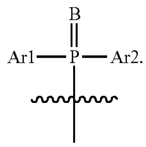

According to an exemplary embodiment of the present specification, R10 is

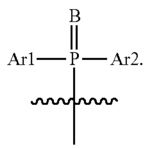

According to an exemplary embodiment of the present specification, R11 is

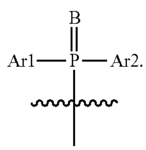

According to an exemplary embodiment of the present specification, R12 is

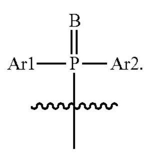

According to an exemplary embodiment of the present specification, two or more of R1 to R12 are

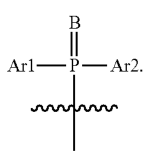

According to an exemplary embodiment of the present specification, at least one of R1 to R4 is

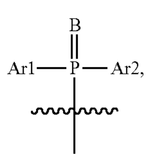

and at least one of R5 to R8 is

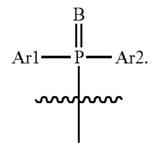

According to an exemplary embodiment of the present specification, at least one of R5 to R8 is

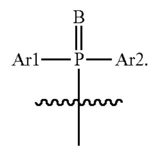

and at least one of R9 to R12 is

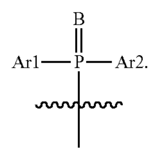

According to an exemplary embodiment of the present specification, at least one of R1 to R4 is

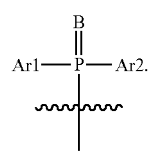

and at least one of R9 to R12 is

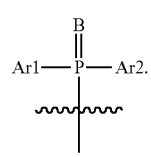

According to an exemplary embodiment of the present specification, at least one of R1 to R4 is

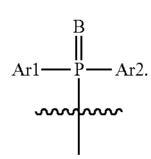

at least one of R5 to R8 is

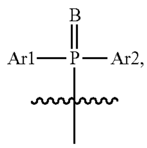

and at least one of R9 to R12 is

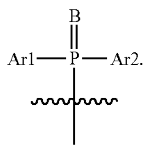

According to an exemplary embodiment of the present specification, at least two of R1 to R12 are

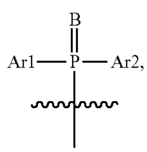

and at least one of the groups which are not

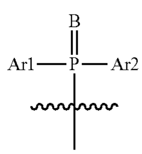

among R1 to R12 is a substituted or unsubstituted aryl group; or a substituted or unsubstituted hetero-cyclic group.

According to an exemplary embodiment of the present specification, at least one of R1 to R4 is

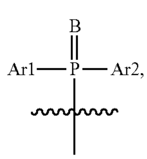

and at least one of R5 to R12 is a substituted or unsubstituted aryl group; or a substituted or unsubstituted hetero-cyclic group.

According to an exemplary embodiment of the present specification, at least one of R5 to R8 is

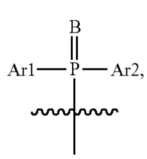

and at least one of R1 to R4 and R9 to R12 is a substituted or unsubstituted aryl group; or a substituted or unsubstituted hetero-cyclic group.

According to an exemplary embodiment of the present specification, at least one of R9 to R12 is

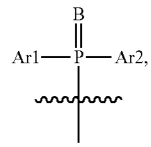

and at least one of R1 to R8 is a substituted or unsubstituted aryl group; or a substituted or unsubstituted hetero-cyclic group.

According to an exemplary embodiment of the present specification, at least one of R1 to R4 is

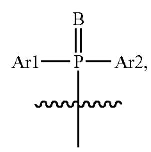

at least one of R9 to R12 is

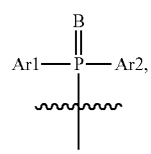

and at least one of R5 to R8 is a substituted or unsubstituted aryl group; or a substituted or unsubstituted hetero-cyclic group.

According to an exemplary embodiment of the present specification, X1 is N.

According to an exemplary embodiment of the present specification, X2 is N.

According to an exemplary embodiment of the present specification, X3 is N.

According to an exemplary embodiment of the present specification, X4 is N.

According to an exemplary embodiment of the present specification, Y1 is N.

According to an exemplary embodiment of the present specification, Y2 is N.

According to an exemplary embodiment of the present specification, Y3 is N.

According to an exemplary embodiment of the present specification, Y4 is N.

According to an exemplary embodiment of the present specification, Z1 is N.

According to an exemplary embodiment of the present specification, Z2 is N.

According to an exemplary embodiment of the present specification, Z3 is N.

According to an exemplary embodiment of the present specification, Z4 is N.

According to an exemplary embodiment of the present specification, B is O.

According to an exemplary embodiment of the present specification, B is S.

According to an exemplary embodiment of the present specification, B is Se.

According to an exemplary embodiment of the present specification, Chemical Formula 1 may be represented by any one of the following Chemical Formulae 2 to 4.

[Chemical Formula 2]

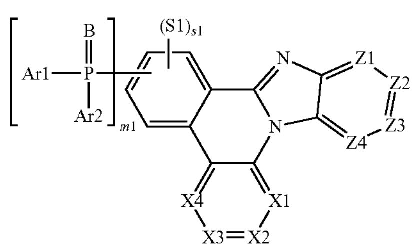

[Chemical Formula 3]

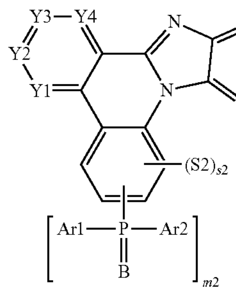

[Chemical Formula 4]

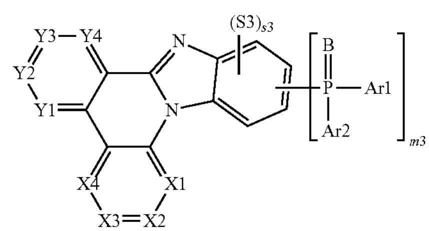

In Chemical Formulae 2 to 4,

X1 is N or CR1, X2 is N or CR2, X3 is N or CR3, and X4 is N or CR4,

Y1 is N or CR5, Y2 is N or CR6, Y3 is N or CR7, and Y4 is N or CR8,

Z1 is N or CR9, Z2 is N or CR10, Z3 is N or CR11, and Z4 is N or CR12,

R1 to R12 and S1 to S3 are the same as or different from each other, and are each independently hydrogen; deuterium; a halogen group; a nitrile group; a nitro group; a hydroxy group; a carbonyl group; an ester group; an imide group; an amino group; a substituted or unsubstituted silyl group; a substituted or unsubstituted boron group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted aralkyl group; a substituted or unsubstituted aralkenyl group; a substituted or unsubstituted alkylaryl group; a substituted or unsubstituted alkylamine group; a substituted or unsubstituted aralkylamine group; a substituted or unsubstituted heteroarylamine group; a substituted or unsubstituted arylamine group; a substituted or unsubstituted arylphosphine group; a substituted or unsubstituted phosphine oxide group; a substituted or unsubstituted aryl group; or a substituted or unsubstituted hetero-cyclic group, or may combine with an adjacent group to form a substituted or unsubstituted ring, B is O, S, or Se, Ar1 and Ar2 are the same as or different from each other, and are each independently a substituted or unsubstituted aryl group; or a substituted or unsubstituted hetero-cyclic group, m1 to m3 are the same as or different from each other, and are each independently an integer of 0 to 4, s1 to s3 are the same as or different from each other, and are each independently an integer of 0 to 3, $m1+s1 \leq 4$, $m2+s2 \leq 4$, $m3+s3 \leq 4$, and when m1 to m3 and s1 to s3 are each 2 or more, the structures in the parenthesis are the same as or different from each other.

According to an exemplary embodiment of the present specification, at least one of S1, R1 to R4, and R9 to R12

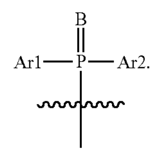

According to an exemplary embodiment of the present specification, at least one of S2 and R5 to R12 is

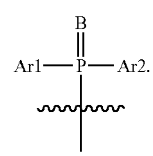

According to an exemplary embodiment of the present specification, at least one of S3 and R1 to R9 is

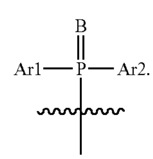

According to an exemplary embodiment of the present specification, Chemical Formula 1 may be represented by any one of the following Chemical Formulae 12 to 14.

[Chemical Formula 12]

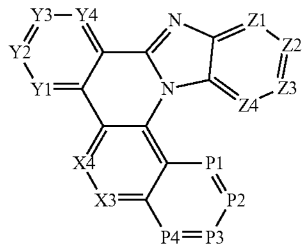

[Chemical Formula 13]

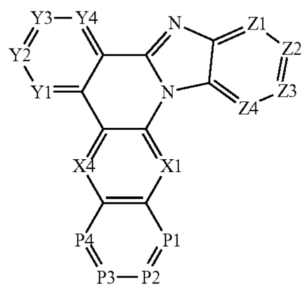

[Chemical Formula 14]

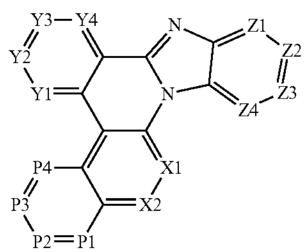

In Chemical Formulae 12 to 14,

X1 is N or CR1, X2 is N or CR2, X3 is N or CR3, and X4 is N or CR4,

Y1 is N or CR5, Y2 is N or CR6, Y3 is N or CR7, and Y4 is N or CR8,

Z1 is N or CR9, Z2 is N or CR10, Z3 is N or CR11, and Z4 is N or CR12,

P1 is N or CR13, P2 is N or CR14, P3 is N or CR15, and P4 is N or CR16,

R1 to R16 are the same as or different from each other, and are each independently hydrogen; deuterium; a halogen group; a nitrile group; a nitro group; a hydroxy group; a carbonyl group; an ester group; an imide group; an amino group; a substituted or unsubstituted silyl group; a substituted or unsubstituted boron group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted aralkyl group; a substituted or unsubstituted aralkenyl group; a substituted or unsubstituted alkylaryl group; a substituted or unsubstituted alkylamine group; a substituted or unsubstituted aralkylamine group; a substituted or unsubstituted heteroarylamine group; a substituted or unsubstituted arylamine group; a substituted or unsubstituted arylphosphine group; a substituted or unsubstituted phosphine oxide group; a substituted or unsubstituted aryl group; or a substituted or unsubstituted hetero-cyclic group, or may combine with an adjacent group to form a substituted or unsubstituted ring, at least one of R1 to R16 is

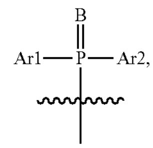

B is O, S, or Se, and

Ar1 and Ar2 are the same as or different from each other, and are each independently a substituted or unsubstituted aryl group; or a substituted or unsubstituted hetero-cyclic group, or combine with each other to form a substituted or unsubstituted ring.

According to an exemplary embodiment of the present specification, Chemical Formula 1 may be represented by any one of the following Chemical Formulae 15 to 17.

[Chemical Formula 15]

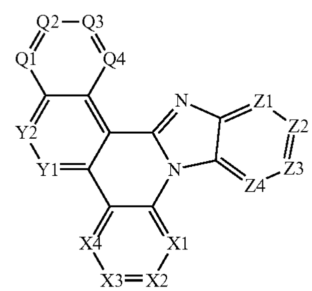

[Chemical Formula 16]

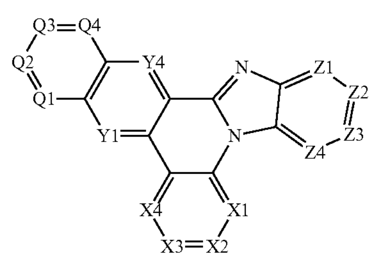

[Chemical Formula 17]

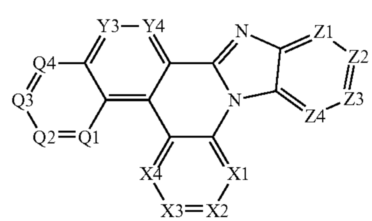

In Chemical Formulae 15 to 17,

X1 is N or CR1, X2 is N or CR2, X3 is N or CR3, and X4 is N or CR4,

Y1 is N or CR5, Y2 is N or CR6, Y3 is N or CR7, and Y4 is N or CR8,

Z1 is N or CR9, Z2 is N or CR10, Z3 is N or CR11, and Z4 is N or CR12,

Q1 is N or CR17, Q2 is N or CR18, Q3 is N or CR19, and Q4 is N or CR20,

R1 to R12 and R17 to R20 are the same as or different from each other, and are each independently hydrogen;

deuterium; a halogen group; a nitrile group; a nitro group; a hydroxy group; a carbonyl group; an ester group; an imide group; an amino group; a substituted or unsubstituted silyl group; a substituted or unsubstituted boron group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted aralkyl group; a substituted or unsubstituted aralkenyl group; a substituted or unsubstituted alkylaryl group; a substituted or unsubstituted alkylamine group; a substituted or unsubstituted aralkylamine group; a substituted or unsubstituted heteroarylamine group; a substituted or unsubstituted arylamine group; a substituted or unsubstituted arylphosphine group; a substituted or unsubstituted phosphine oxide group; a substituted or unsubstituted aryl group; or a substituted or unsubstituted hetero-cyclic group, or may combine with an adjacent group to form a substituted or unsubstituted ring, at least one of R1 to R12 and R17 to R20 is

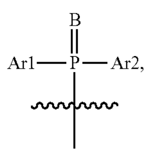

B is O, S, or Se, and

Ar1 and Ar2 are the same as or different from each other, and are each independently a substituted or unsubstituted aryl group; or a substituted or unsubstituted hetero-cyclic group, or combine with each other to form a substituted or unsubstituted ring.

According to an exemplary embodiment of the present specification, Chemical Formula 1 may be represented by any one of the following Chemical Formulae 18 to 26.

[Chemical Formula 18]

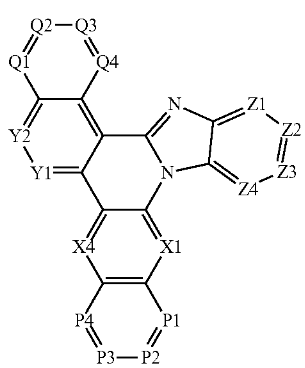

-continued

[Chemical Formula 19]

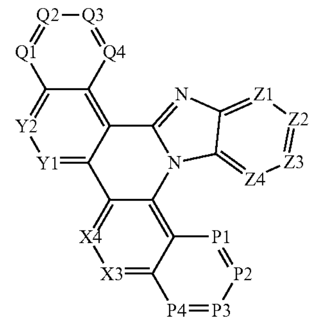

[Chemical Formula 20]

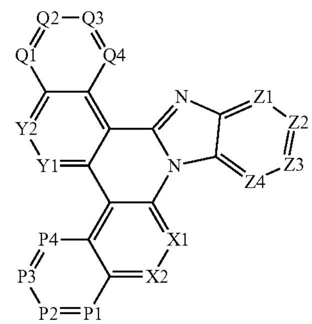

[Chemical Formula 21]

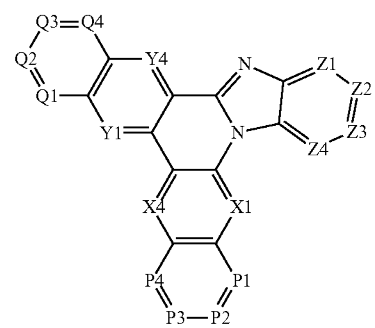

[Chemical Formula 22]

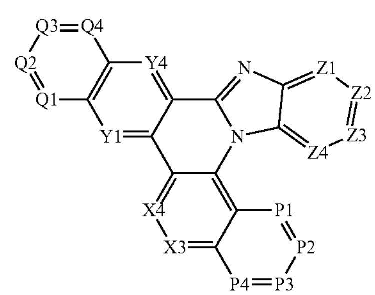

[Chemical Formula 23]

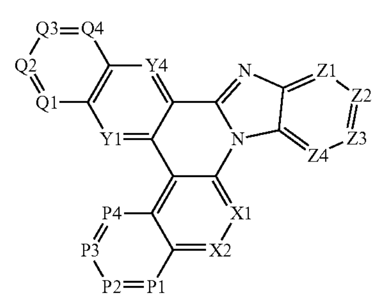

-continued

[Chemical Formula 24]

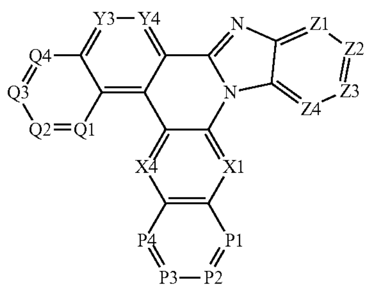

[Chemical Formula 25]

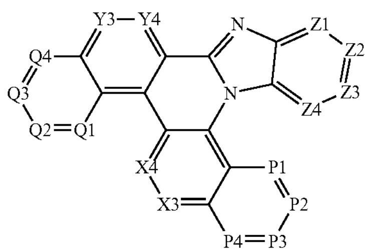

[Chemical Formula 26]

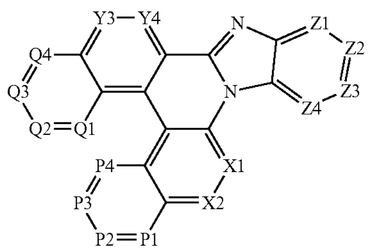

In Chemical Formulae 18 to 26,

X1 is N or CR1, X2 is N or CR2, X3 is N or CR3, and X4 is N or CR4,

Y1 is N or CR5, Y2 is N or CR6, Y3 is N or CR7, and Y4 is N or CR8,

Z1 is N or CR9, Z2 is N or CR10, Z3 is N or CR11, and Z4 is N or CR12,

P1 is N or CR13, P2 is N or CR14, P3 is N or CR15, and P4 is N or CR16,

Q1 is N or CR17, Q2 is N or CR18, Q3 is N or CR19, and Q4 is N or CR20,

R1 to R20 are the same as or different from each other, and are each independently hydrogen; deuterium; a halogen group; a nitrile group; a nitro group; a hydroxy group; a carbonyl group; an ester group; an imide group; an amino group; a substituted or unsubstituted silyl group; a substituted or unsubstituted boron group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted aralkyl group; a substituted or unsubstituted aralkenyl group; a substituted or unsubstituted alkylaryl group; a substituted or unsubstituted alkylamine group; a substituted or unsubstituted aralkylamine group; a substituted or unsubstituted heteroarylamine group; a substituted or unsubstituted arylamine group; a substituted or unsubstituted arylphosphine group; a substituted or unsubstituted phosphine oxide group; a substituted or unsubstituted aryl group; or a substituted or unsubstituted hetero-cyclic group, or may combine with an adjacent group to form a substituted or unsubstituted ring,

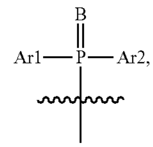

at least one of R1 to R20 is

B is O, S, or Se, and

Ar1 and Ar2 are the same as or different from each other, and are each independently a substituted or unsubstituted aryl group; or a substituted or unsubstituted hetero-cyclic group, or combine with each other to form a substituted or unsubstituted ring.

According to an exemplary embodiment of the present specification, Ar1 and Ar2 are the same as or different from each other, and are each independently a substituted or unsubstituted aryl group; or a substituted or unsubstituted hetero-cyclic group, or combine with each other to form a substituted or unsubstituted ring.

According to an exemplary embodiment of the present specification, Ar1 and Ar2 are the same as or different from each other, and are each independently a substituted or unsubstituted monocyclic to tricyclic aryl group; or a substituted or unsubstituted monocyclic to tricyclic hetero-cyclic group, or combine with each other to form a substituted or unsubstituted ring.

According to an exemplary embodiment of the present specification, Ar1 and Ar2 are the same as or different from each other, and are each independently a substituted or unsubstituted aryl group; or a substituted or unsubstituted hetero-cyclic group including one or more of N, or combine with each other to form a substituted or unsubstituted ring.

According to an exemplary embodiment of the present specification, Ar1 and Ar2 are the same as or different from each other, and are each independently a substituted or unsubstituted monocyclic to tricyclic aryl group; or a substituted or unsubstituted monocyclic to tricyclic hetero-cyclic group including one or more of N, or combine with each other to form a substituted or unsubstituted ring.

According to an exemplary embodiment of the present specification, Ar1 and Ar2 are the same as or different from each other, and are each independently a substituted or unsubstituted monocyclic to tricyclic aryl group, or combine with each other to form a substituted or unsubstituted ring.

According to an exemplary embodiment of the present specification, Ar1 and Ar2 are the same as or different from each other, and are each independently a substituted or unsubstituted phenyl group; a substituted or unsubstituted naphthyl group; a substituted or unsubstituted phenanthryl group; a substituted or unsubstituted pyridyl group; a substituted or unsubstituted quinoline group; a substituted or unsubstituted isoquinoline group; a substituted or unsubstituted quinazoline group; or a substituted or unsubstituted carbazole group, or combine with each other to form a substituted or unsubstituted ring.

According to an exemplary embodiment of the present specification, Ar1 and Ar2 are the same as or different from each other, and are each independently a substituted or unsubstituted phenyl group; a substituted or unsubstituted naphthyl group; or a substituted or unsubstituted phenanthryl group, or combine with each other to form a substituted or unsubstituted ring.

According to an exemplary embodiment of the present specification, Ar1 and Ar2 are the same as or different from each other, and are each independently a phenyl group; a naphthyl group; or a phenanthryl group, or combine with each other to form a substituted or unsubstituted ring.

According to an exemplary embodiment of the present specification, Ar1 and Ar2 are the same as or different from each other, and are each independently a substituted or unsubstituted monocyclic to tricyclic hetero-cyclic group, or combine with each other to form a substituted or unsubstituted ring.

According to an exemplary embodiment of the present specification, Ar1 and Ar2 are the same as or different from each other, and are each independently a substituted or unsubstituted monocyclic to tricyclic hetero-cyclic group including one or more of N, or combine with each other to form a substituted or unsubstituted ring.

According to an exemplary embodiment of the present specification, Ar1 and Ar2 are the same as or different from each other, and are each independently a substituted or unsubstituted pyridyl group; a substituted or unsubstituted quinoline group; a substituted or unsubstituted isoquinoline group; a substituted or unsubstituted quinazoline group; or a substituted or unsubstituted carbazole group, or combine with each other to form a substituted or unsubstituted ring.

According to an exemplary embodiment of the present specification, Ar1 and Ar2 are the same as or different from each other, and are each independently a pyridyl group; a quinoline group; an isoquinoline group; a quinazoline group;

or a carbazole group, or combine with each other to form a substituted or unsubstituted ring.

According to an exemplary embodiment of the present specification, Ar1 and Ar2 are the same as or different from each other, and are each independently a phenyl group; a biphenyl group; a naphthyl group; a phenanthryl group; a fluorenyl group; a pyrenyl group; a pyridyl group; a quinoline group; a quinazoline group; a qunoxaline group; a carbazole group; a phenanthroline group; or a dihydroacenaphthalene group, or combine with each other to form a ring.

According to an exemplary embodiment of the present specification,

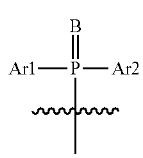

may be

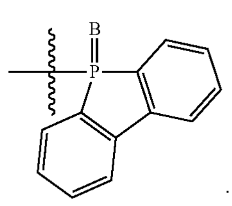

.

According to an exemplary embodiment of the present invention, the compound of Chemical Formula 1 may be any one selected from the following Compounds 1-1 to 1-299. However, the compound of Chemical Formula 1 is not limited to the following compounds.

[Compound 1-1]

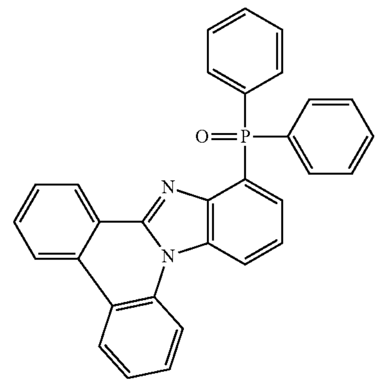

[Compound 1-2]

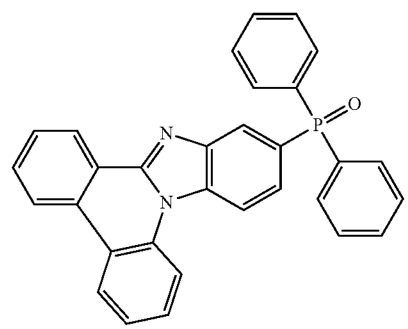

[Compound 1-3]

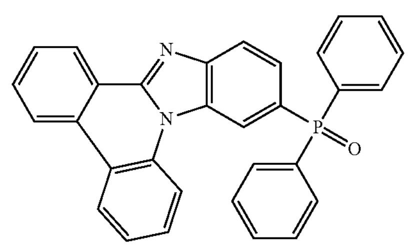

[Compound 1-4]

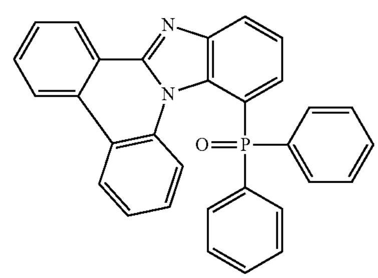

[Compound 1-5]

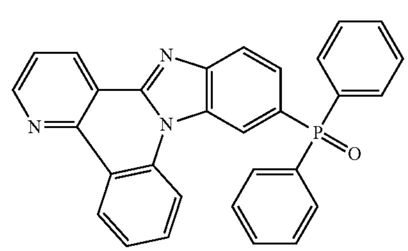

-continued
[Compound 1-6]
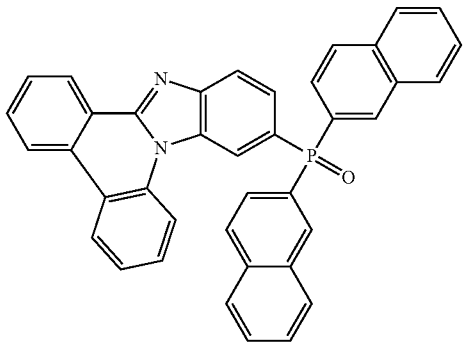
[Compound 1-7]
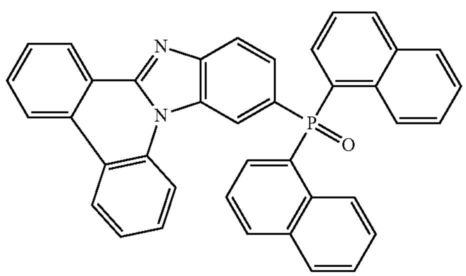
[Compound 1-8]
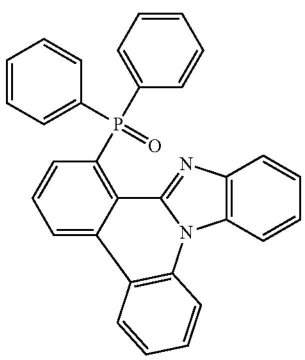
[Compound 1-9]
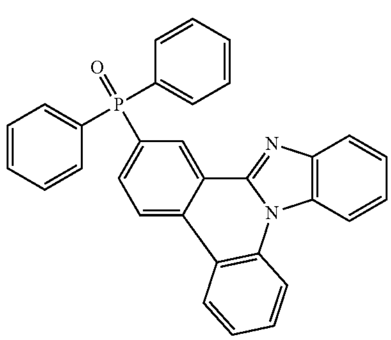
-continued
[Compound 1-10]
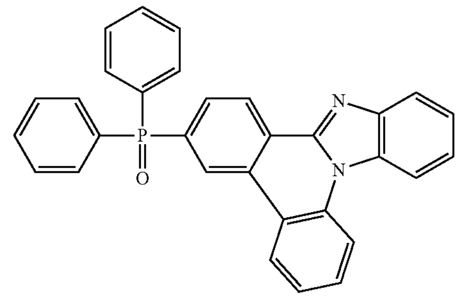
[Compound 1-11]
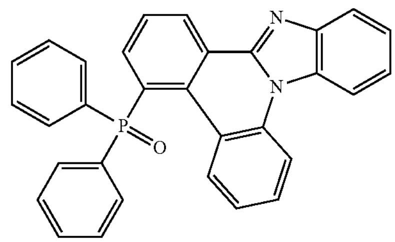
[Compound 1-12]
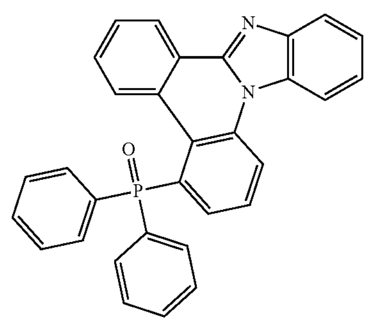
[Compound 1-13]
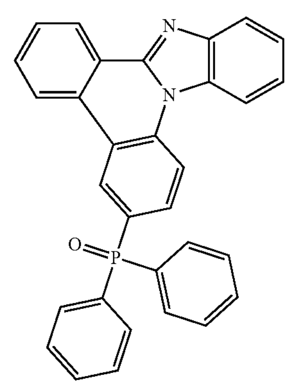

-continued
[Compound 1-14]
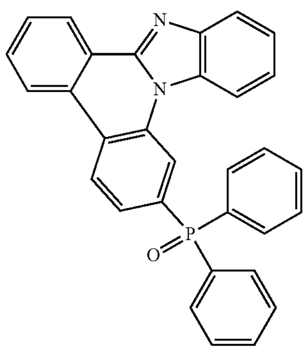
[Compound 1-15]
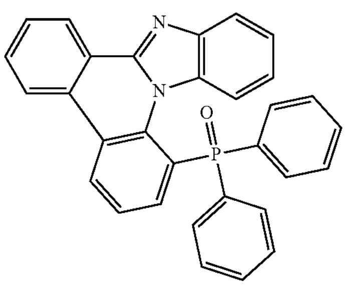
[Compound 1-16]
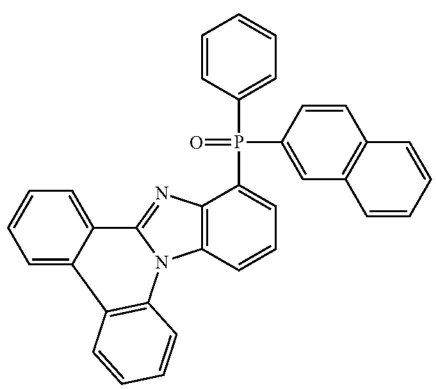
[Compound 1-17]
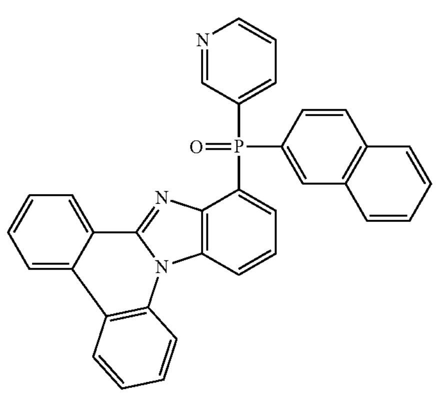
-continued
[Compound 1-18]
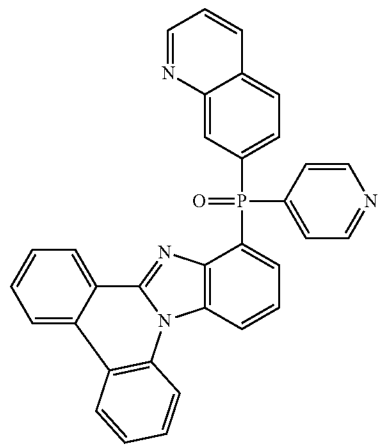
[Compound 1-19]
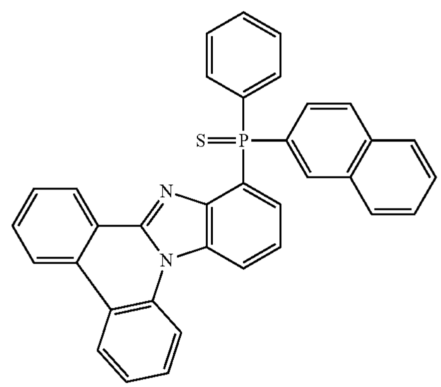
[Compound 1-20]
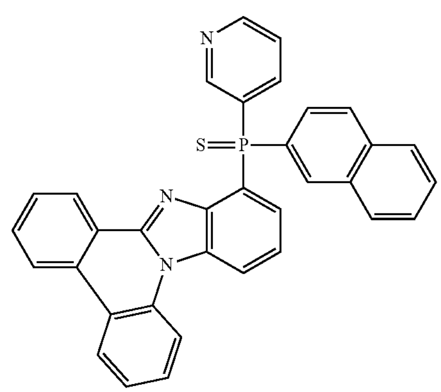

-continued
[Compound 1-21]
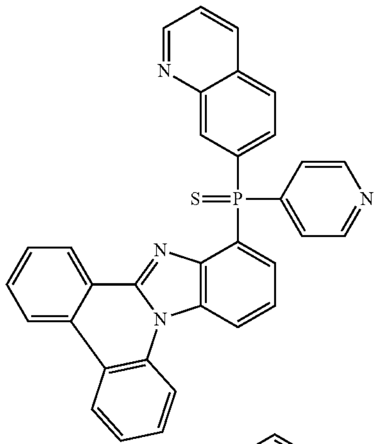
[Compound 1-22]
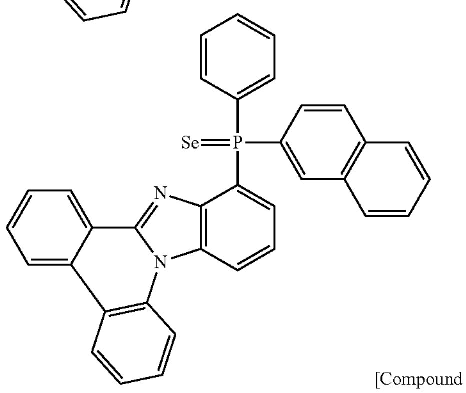
[Compound 1-23]
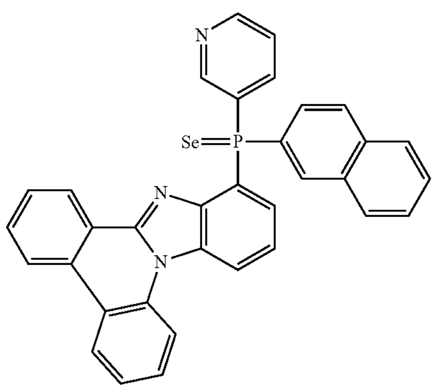
[Compound 1-24]
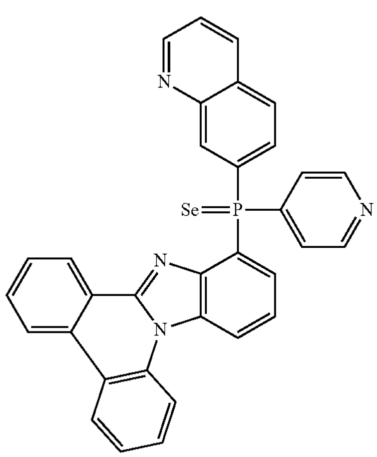
-continued
[Compound 1-25]
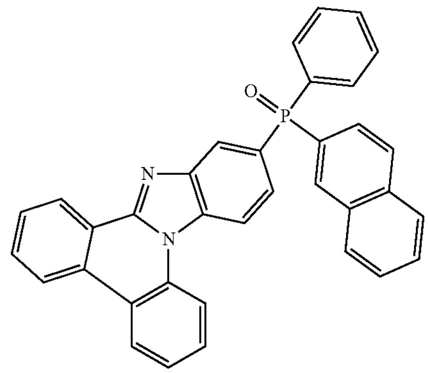
[Compound 1-26]
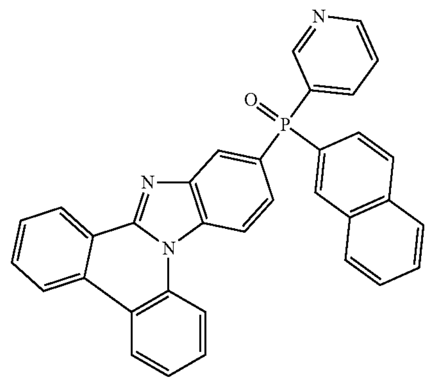
[Compound 1-27]
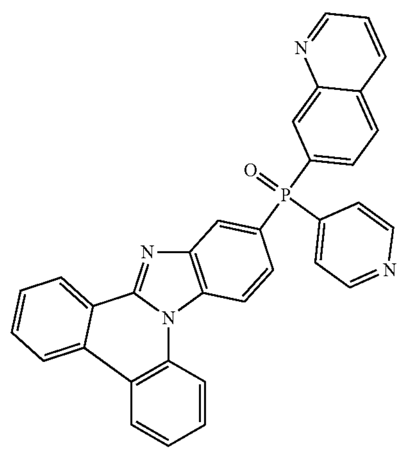
[Compound 1-28]
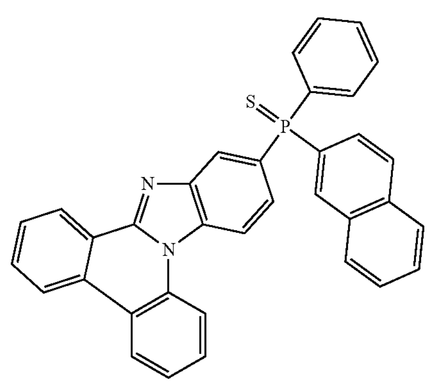

[Compound 1-29]
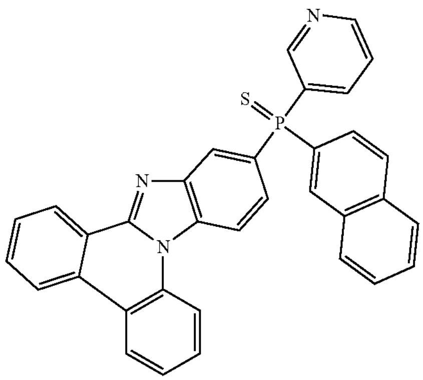
[Compound 1-30]
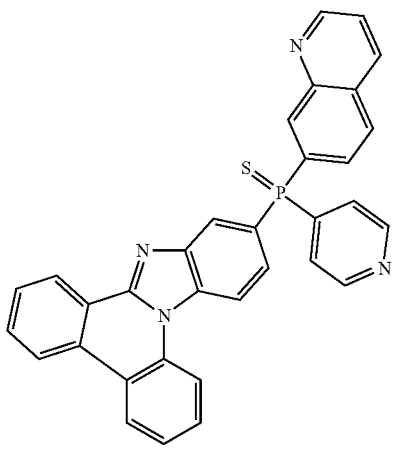
[Compound 1-31]
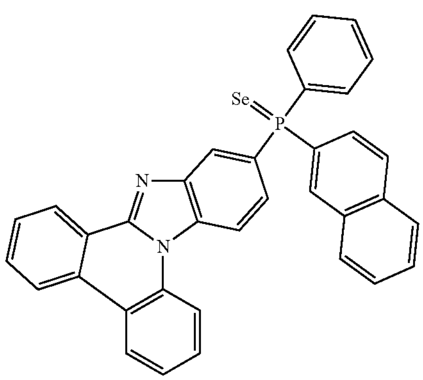
[Compound 1-32]
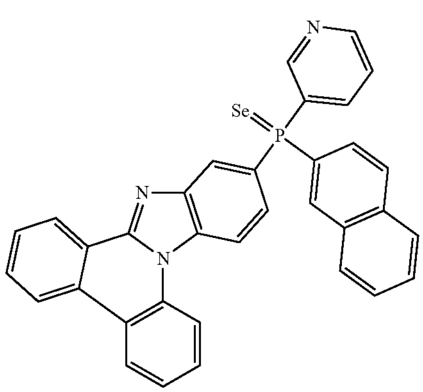
[Compound 1-33]
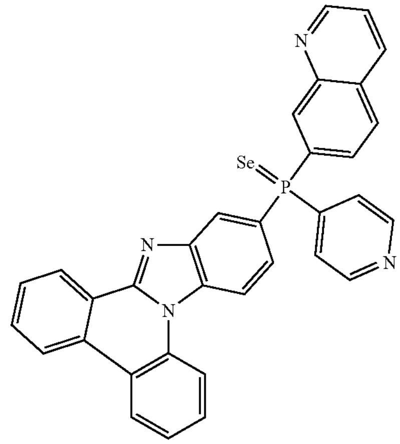
[Compound 1-34]
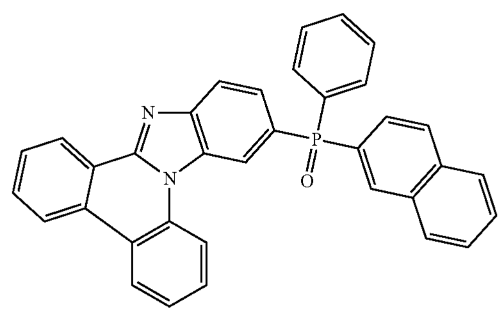
[Compound 1-35]
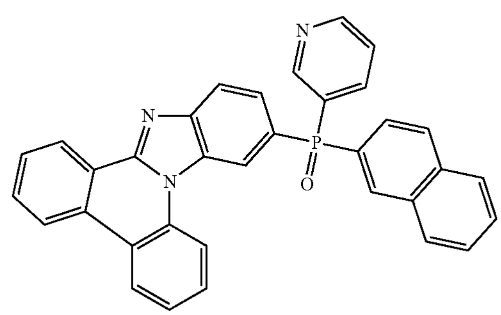
[Compound 1-36]
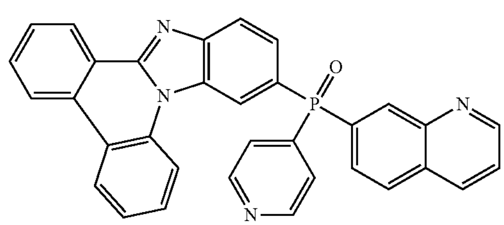

-continued
[Compound 1-37]
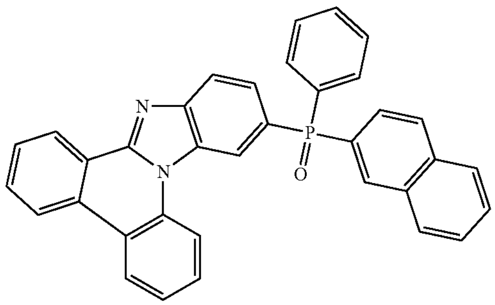
[Compound 1-38]
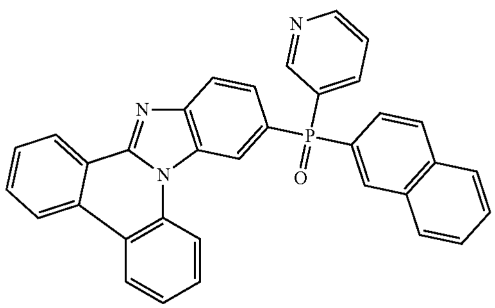
[Compound 1-39]
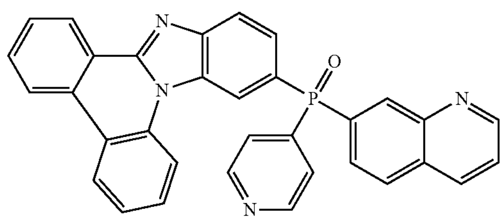
[Compound 1-40]
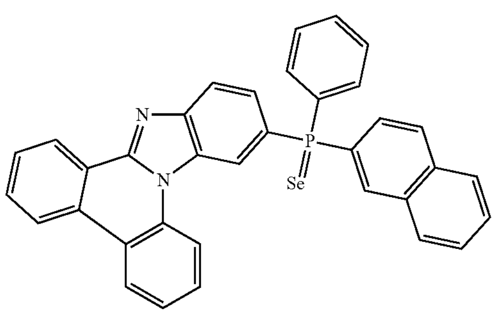
[Compound 1-41]
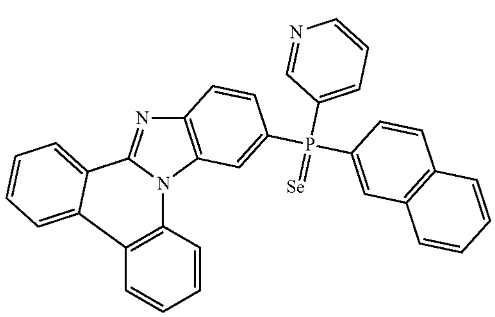
-continued
[Compound 1-42]
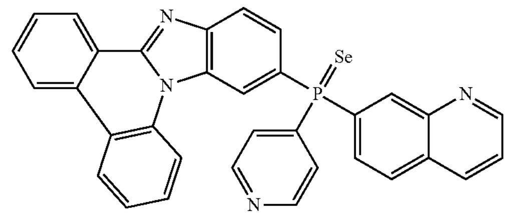
[Compound 1-43]
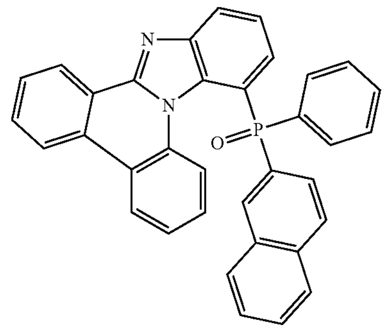
[Compound 1-44]
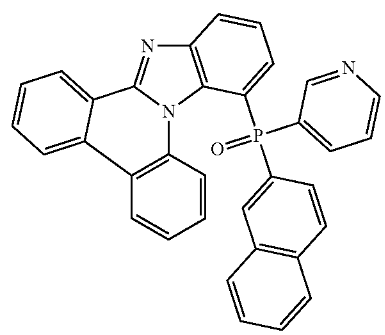
[Compound 1-45]
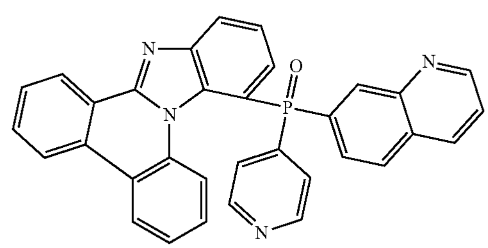
[Compound 1-46]
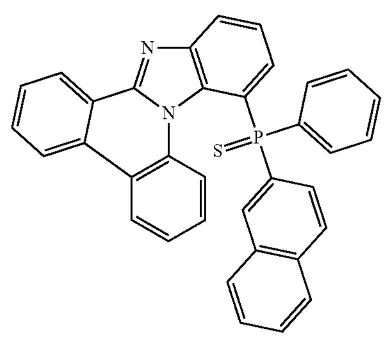

-continued
[Compound 1-47]
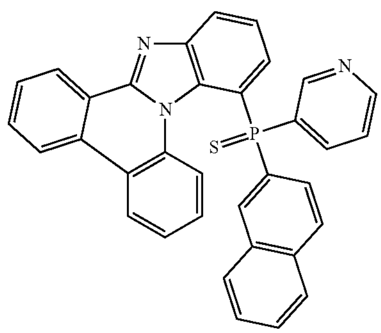
[Compound 1-48]
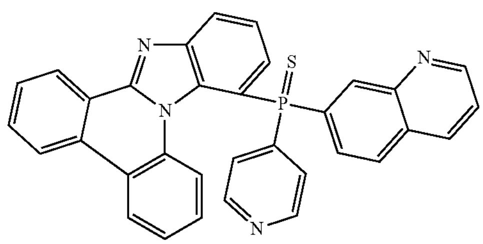
[Compound 1-49]
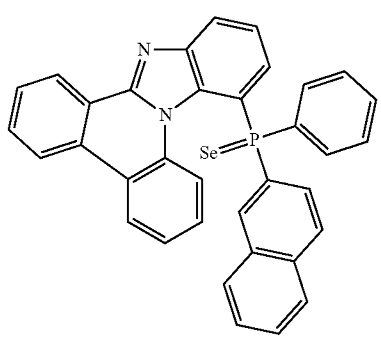
[Compound 1-50]
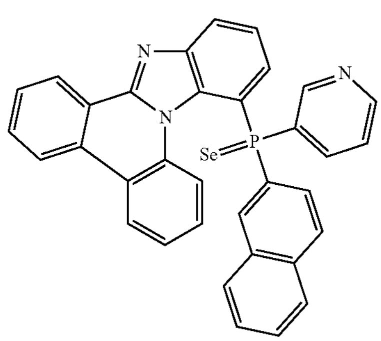
[Compound 1-51]
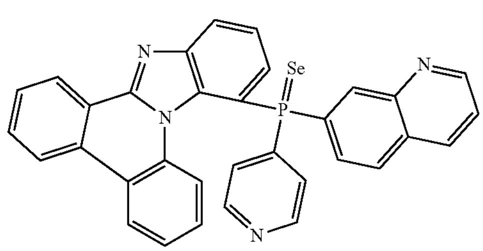
-continued
[Compound 1-52]
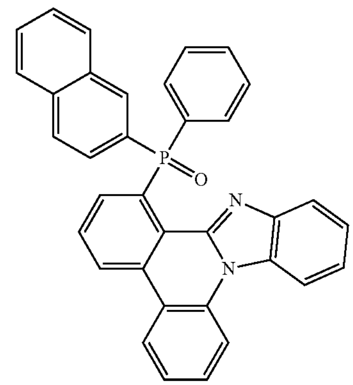
[Compound 1-53]
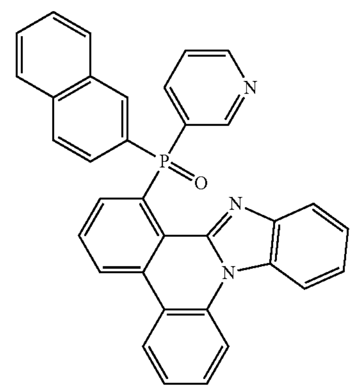
[Compound 1-54]
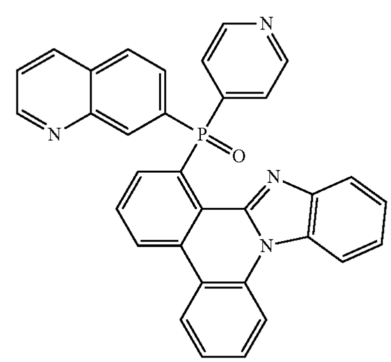
[Compound 1-55]
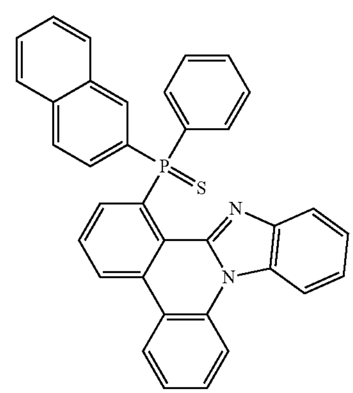

[Compound 1-56]
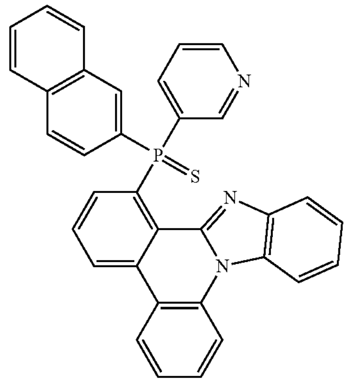
[Compound 1-57]
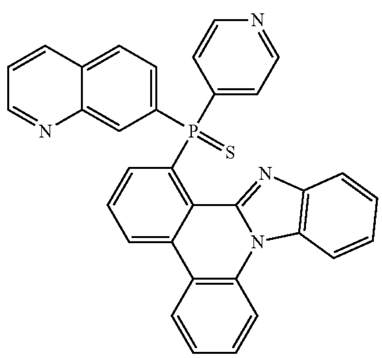
[Compound 1-58]
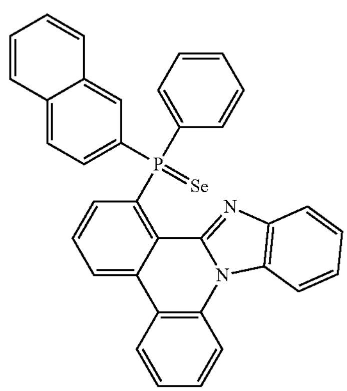
[Compound 1-59]
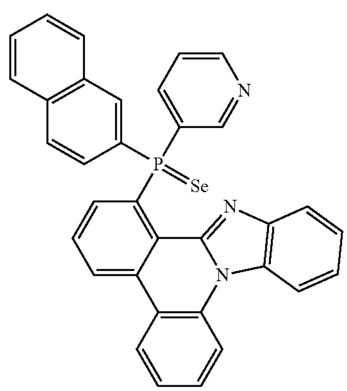
[Compound 1-60]
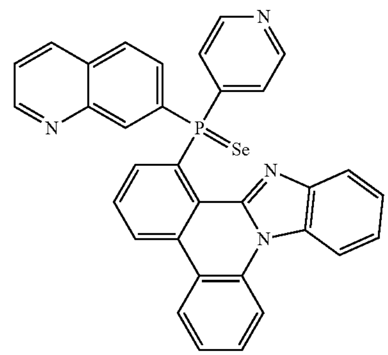
[Compound 1-61]
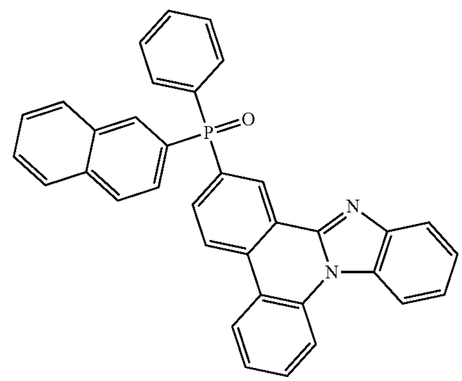
[Compound 1-62]
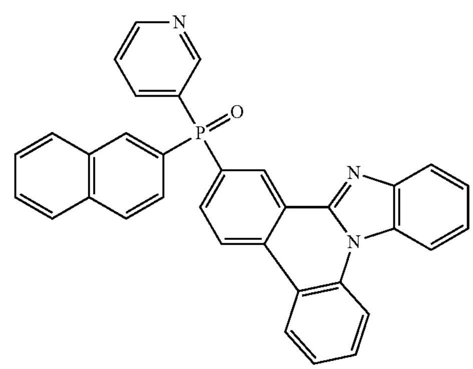
[Compound 1-63]
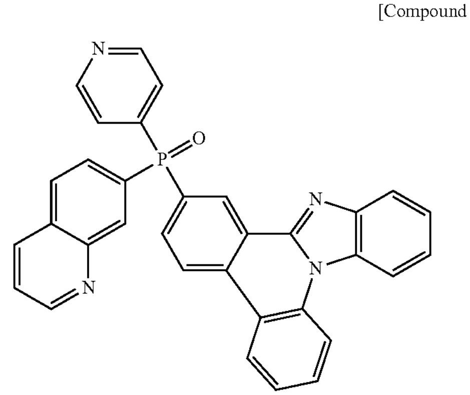

-continued
[Compound 1-64]
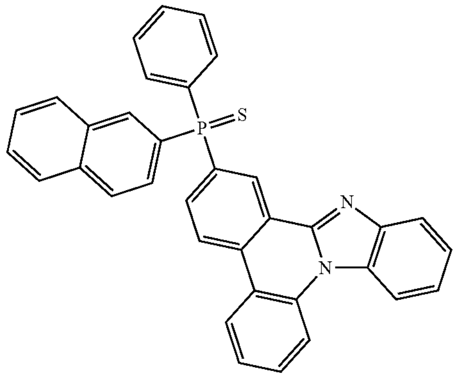
[Compound 1-65]
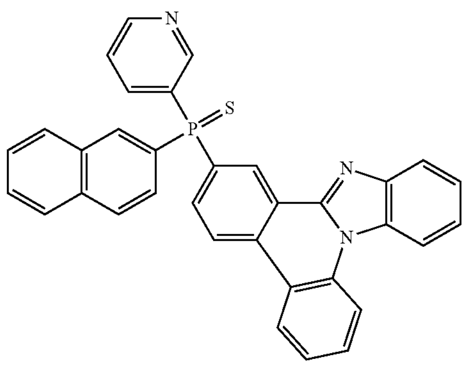
[Compound 1-66]
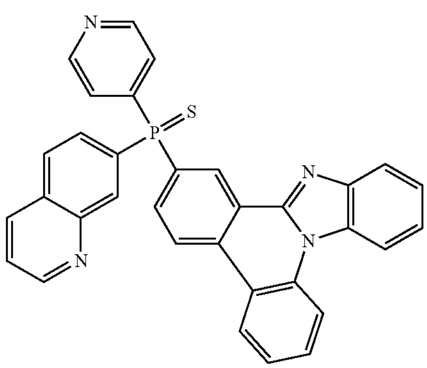
[Compound 1-67]
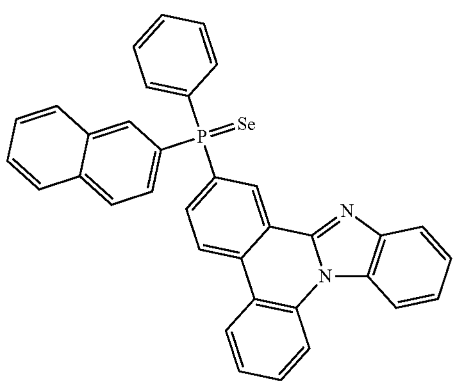
-continued
[Compound 1-68]
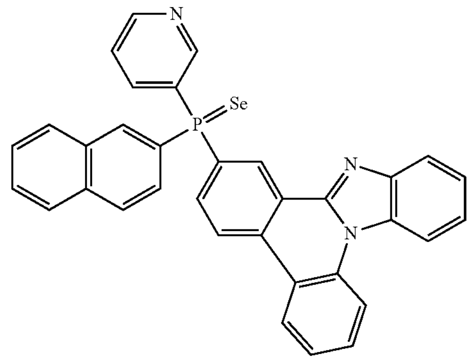
[Compound 1-69]
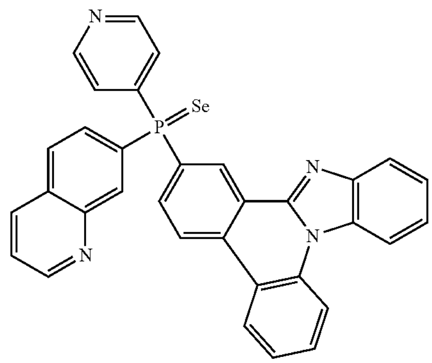
[Compound 1-70]
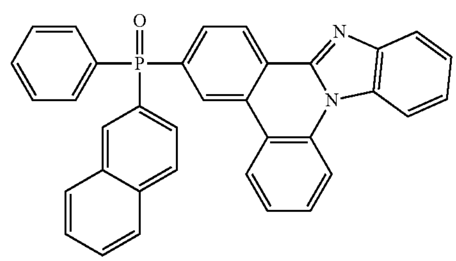
[Compound 1-71]
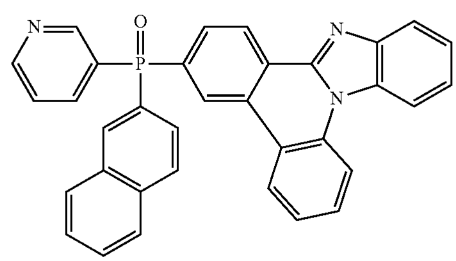
[Compound 1-72]
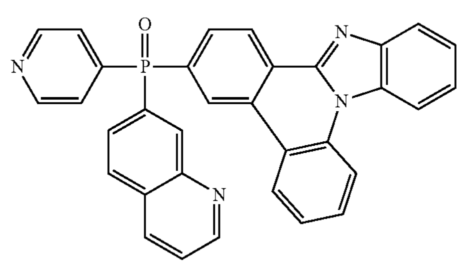

-continued
[Compound 1-73]
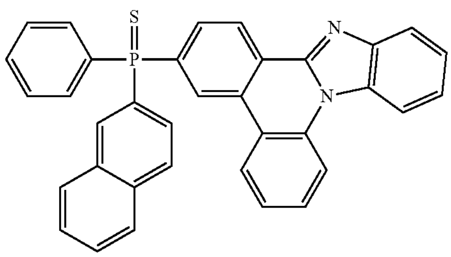
[Compound 1-74]
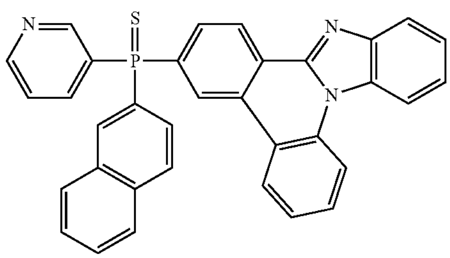
[Compound 1-75]
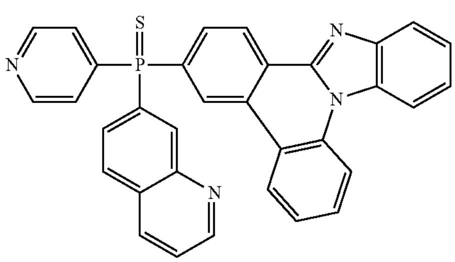
[Compound 1-76]
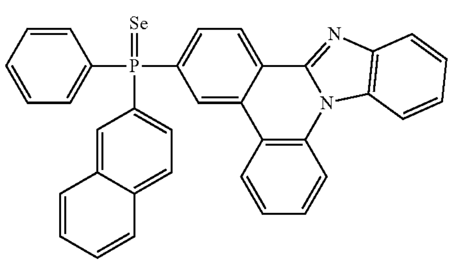
[Compound 1-77]
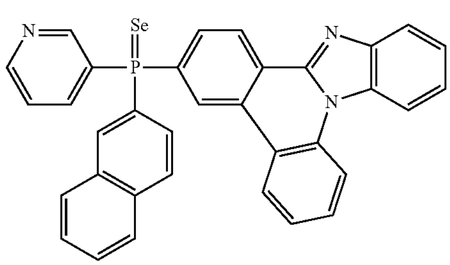
-continued
[Compound 1-78]
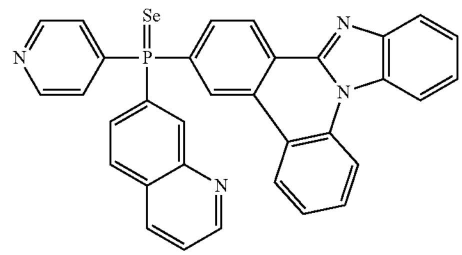
[Compound 1-79]
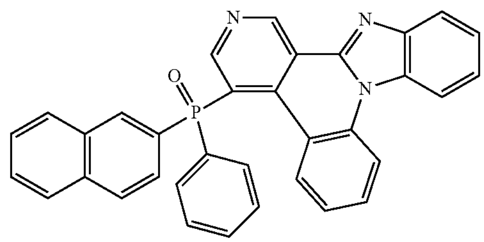
[Compound 1-80]
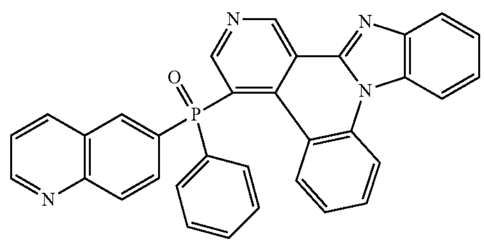
[Compound 1-81]
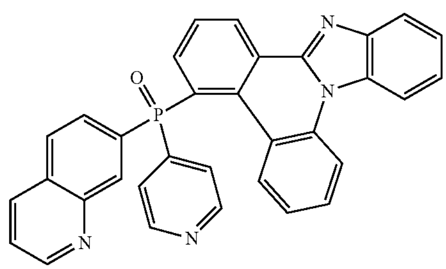
[Compound 1-82]
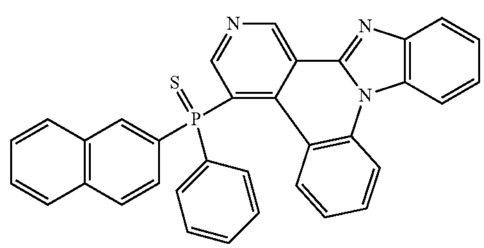
[Compound 1-83]
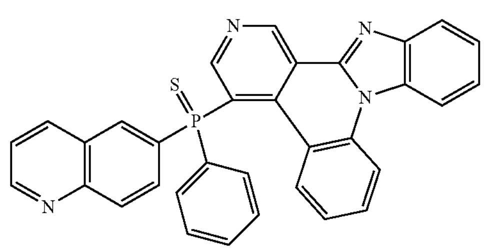

[Compound 1-84]
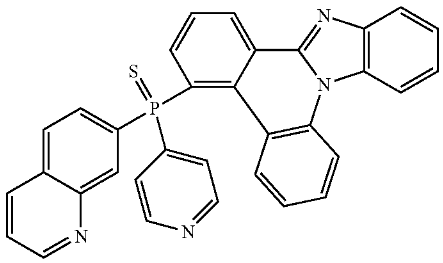
[Compound 1-85]
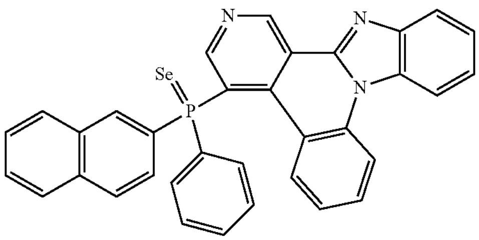
[Compound 1-86]
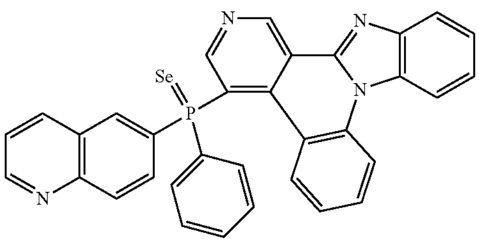
[Compound 1-87]
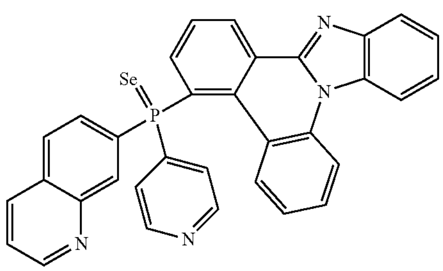
[Compound 1-88]
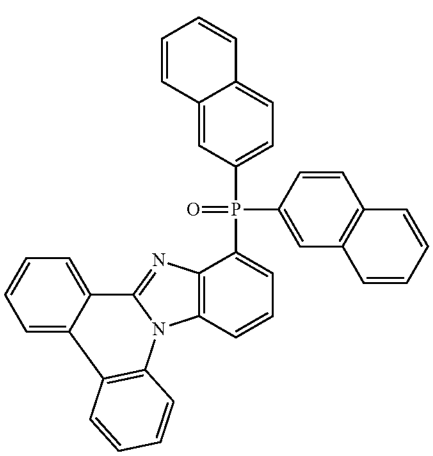
[Compound 1-89]
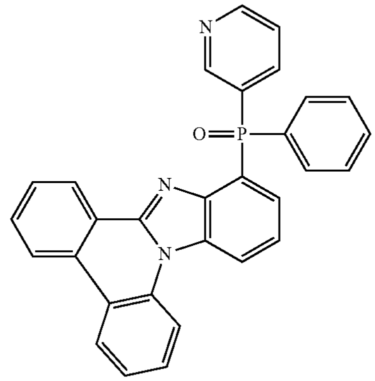
[Compound 1-90]
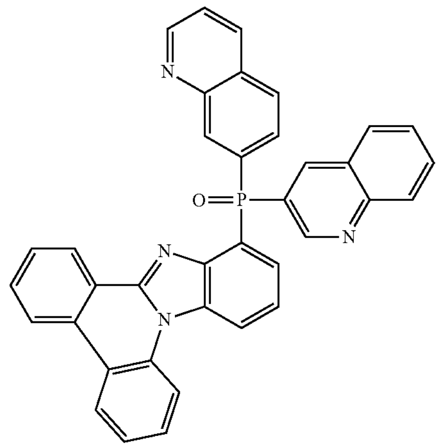
[Compound 1-91]
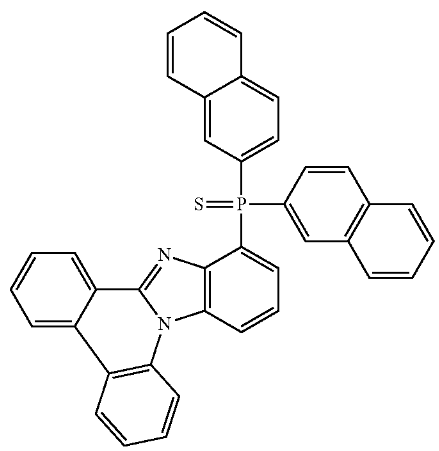
[Compound 1-92]
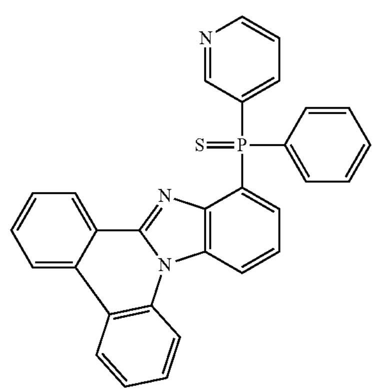

-continued
[Compound 1-93]
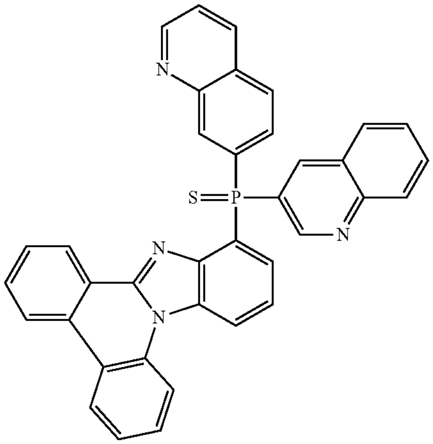
[Compound 1-94]
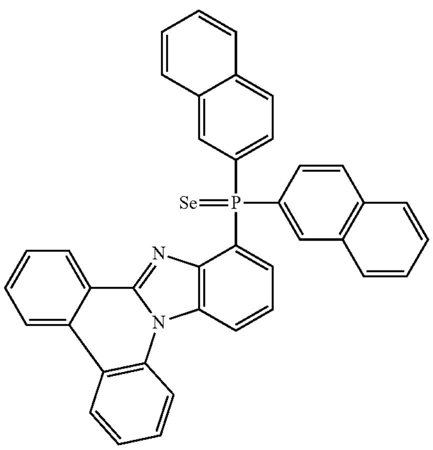
[Compound 1-95]
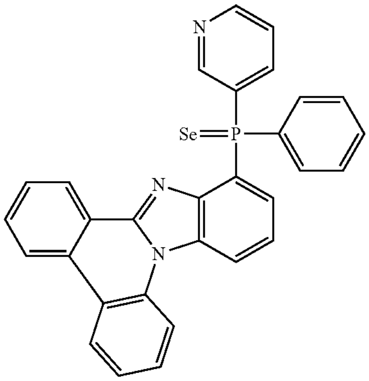
-continued
[Compound 1-96]
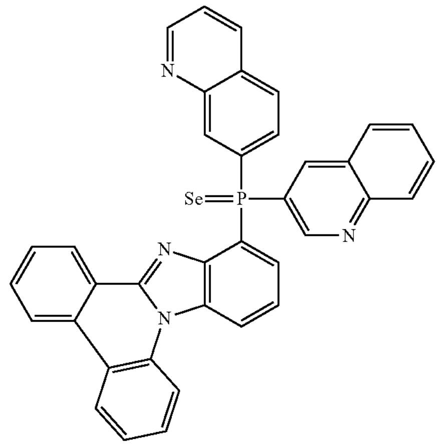
[Compound 1-97]
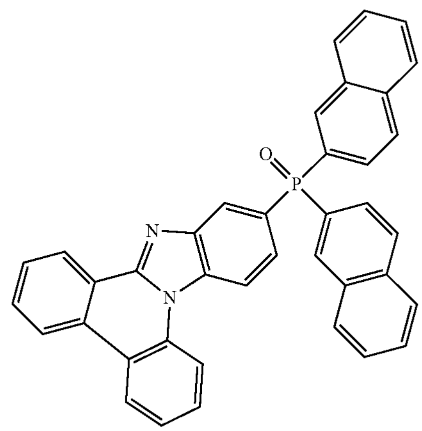
[Compound 1-98]
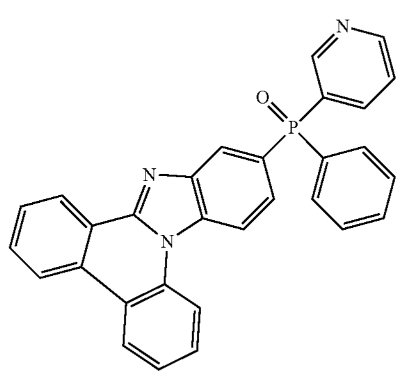

-continued
[Compound 1-99]
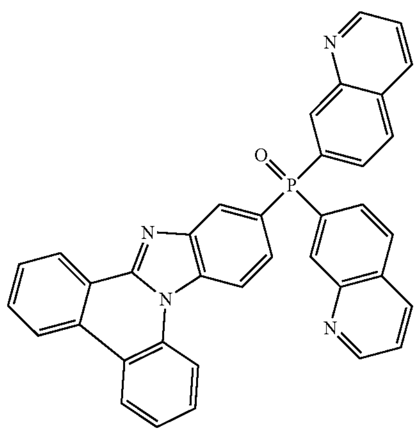
[Compound 1-100]
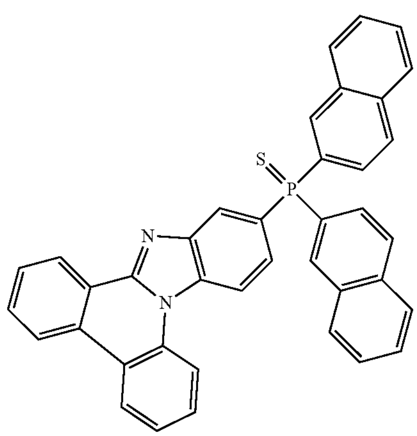
[Compound 1-101]
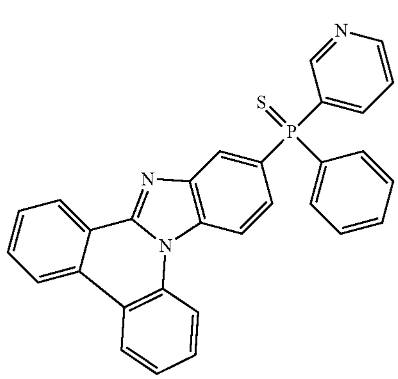
-continued
[Compound 1-102]
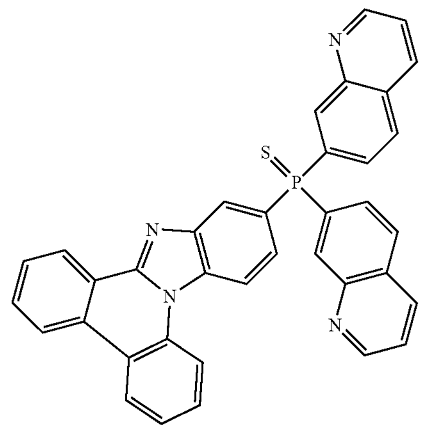
[Compound 1-103]
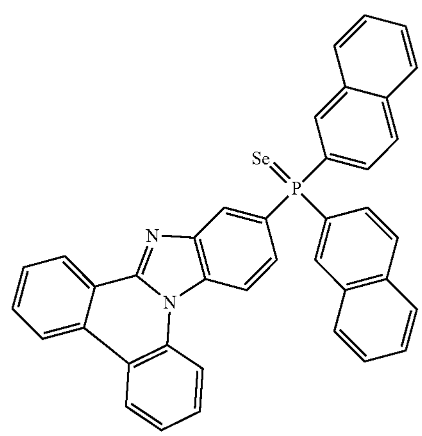
[Compound 1-104]
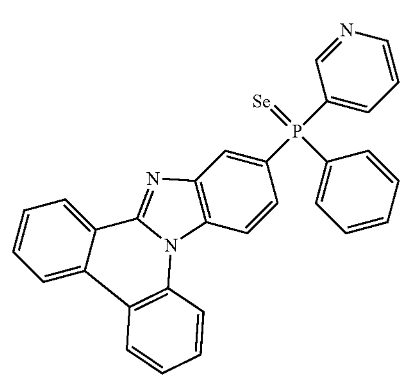

-continued
[Compound 1-105]
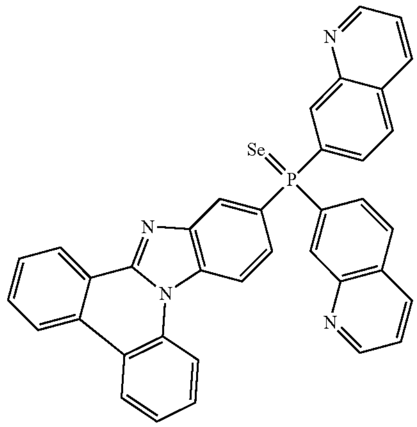
[Compound 1-106]
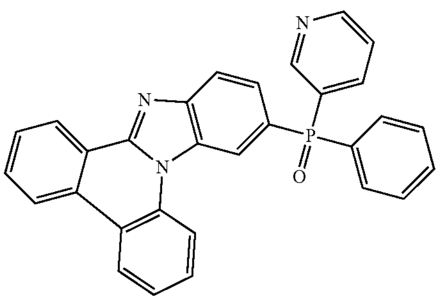
[Compound 1-107]
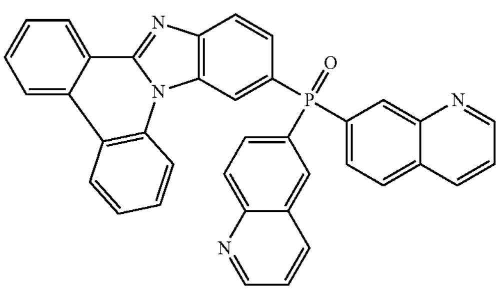
[Compound 1-108]
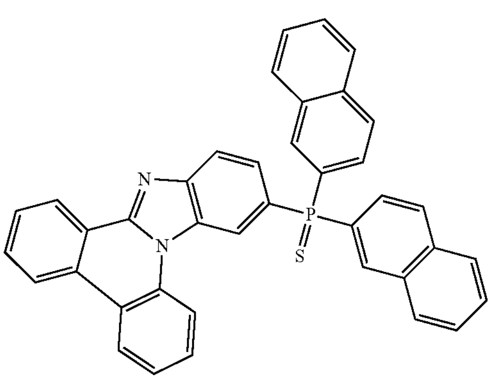
-continued
[Compound 1-109]
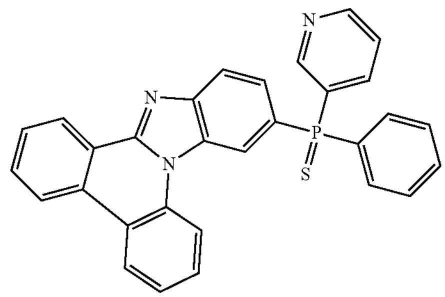
[Compound 1-110]
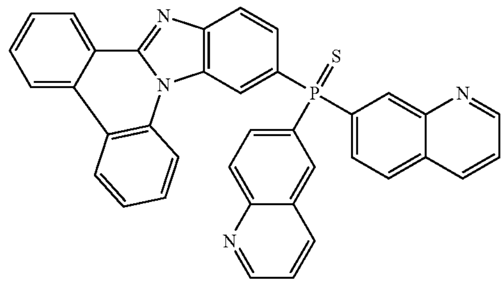
[Compound 1-111]
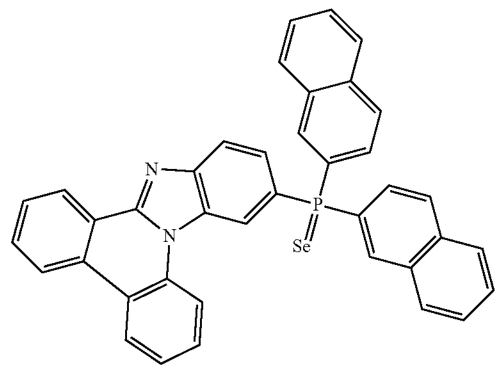
[Compound 1-112]
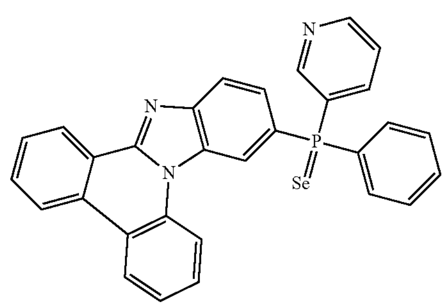
[Compound 1-113]
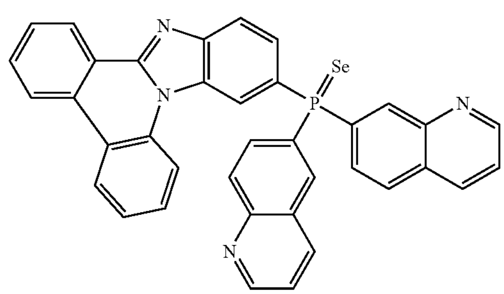

-continued
[Compound 1-114]
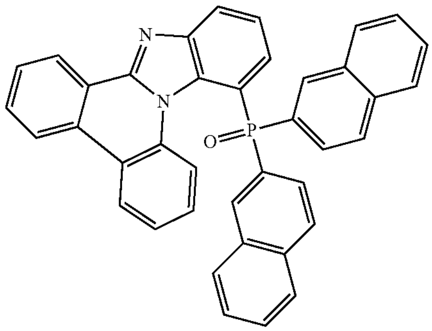
[Compound 1-115]
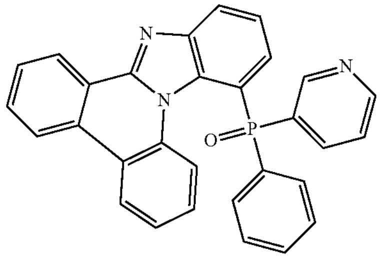
[Compound 1-116]
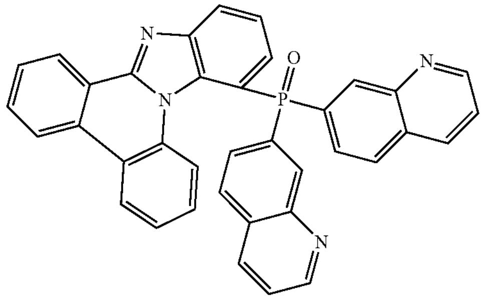
[Compound 1-117]
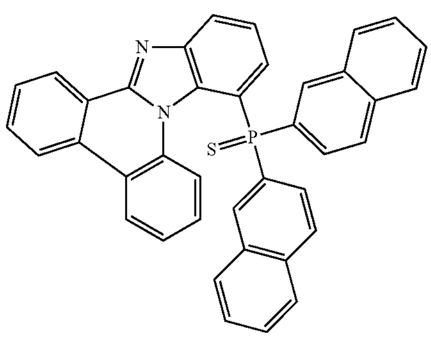
-continued
[Compound 1-118]
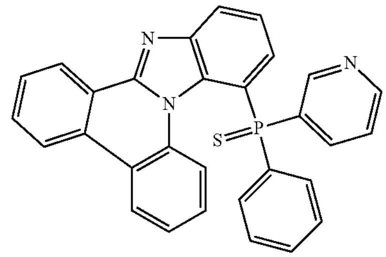
[Compound 1-119]
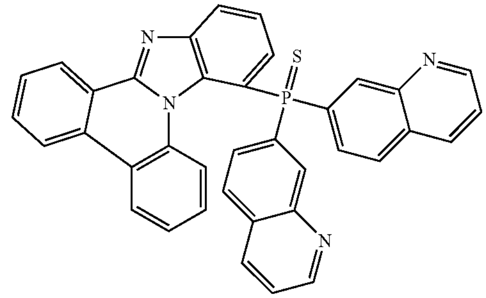
[Compound 1-120]
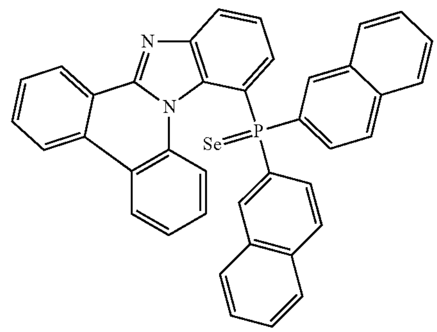
[Compound 1-121]
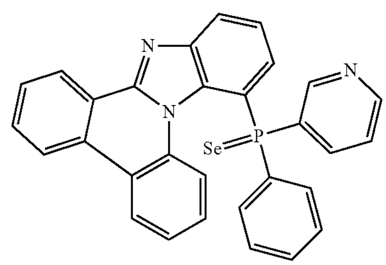
[Compound 1-122]
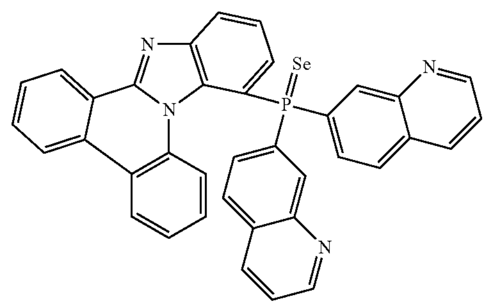

-continued
[Compound 1-123]
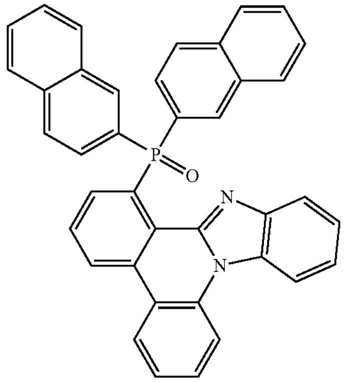
[Compound 1-124]
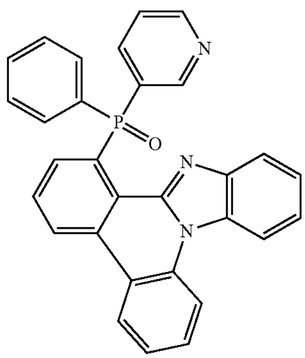
[Compound 1-125]
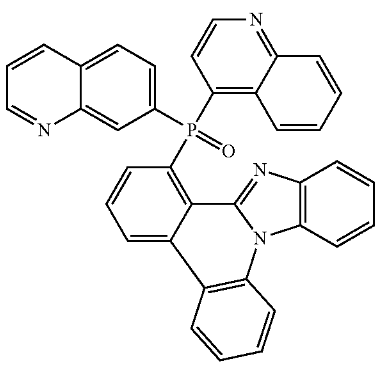
[Compound 1-126]
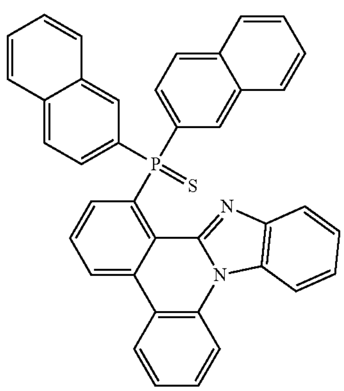
-continued
[Compound 1-127]
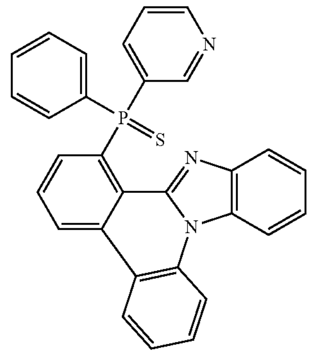
[Compound 1-128]
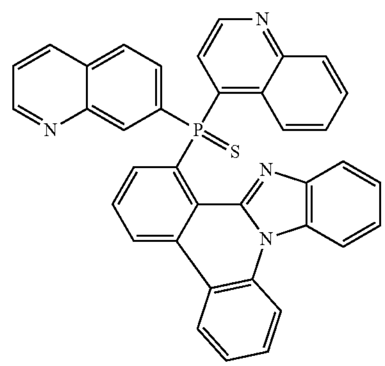
[Compound 1-129]
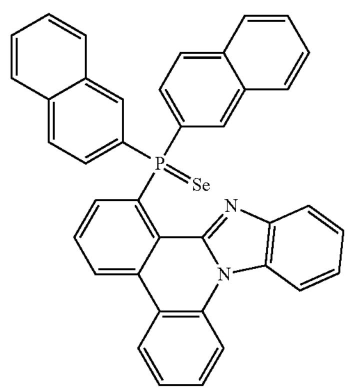
[Compound 1-130]
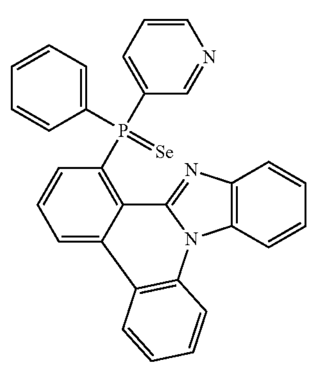

-continued
[Compound 1-131]
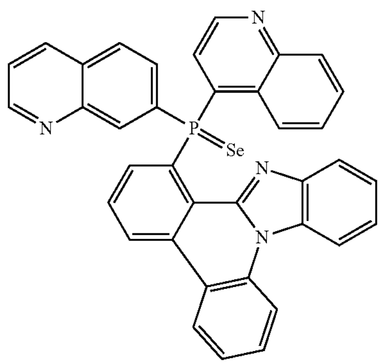
[Compound 1-132]
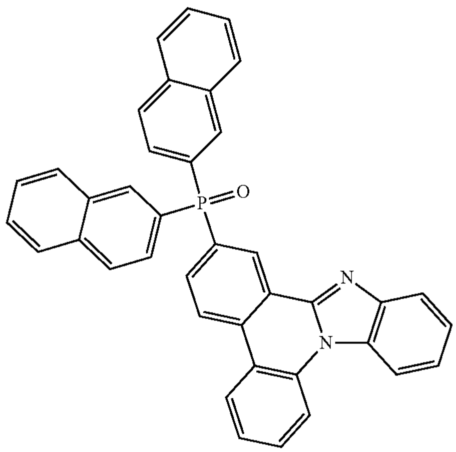
[Compound 1-133]
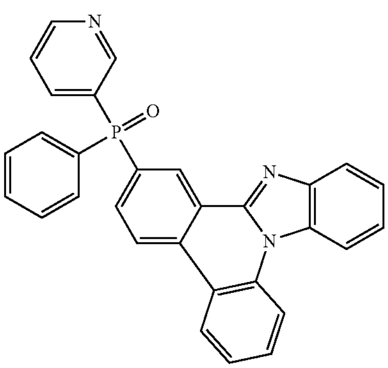
[Compound 1-134]
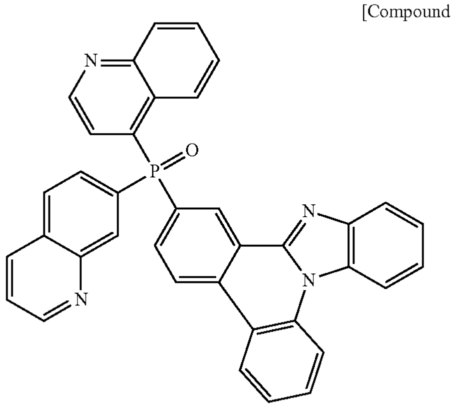
-continued
[Compound 1-135]
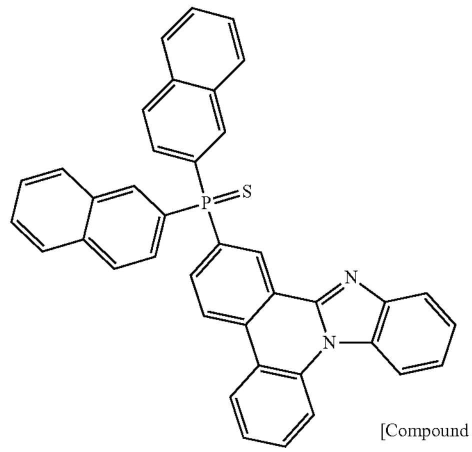
[Compound 1-136]
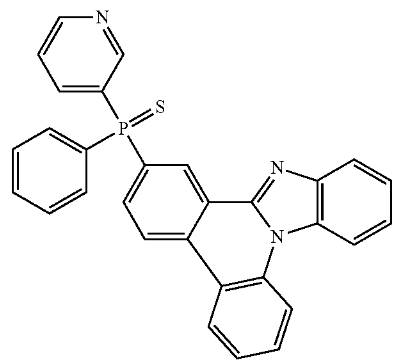
[Compound 1-137]
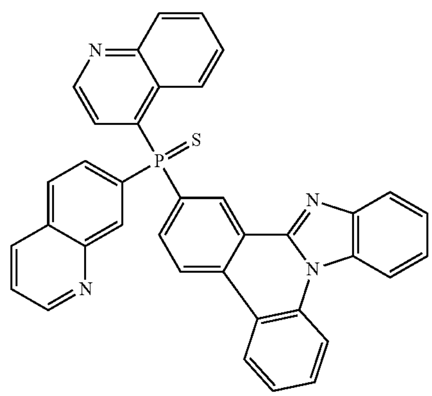
[Compound 1-138]
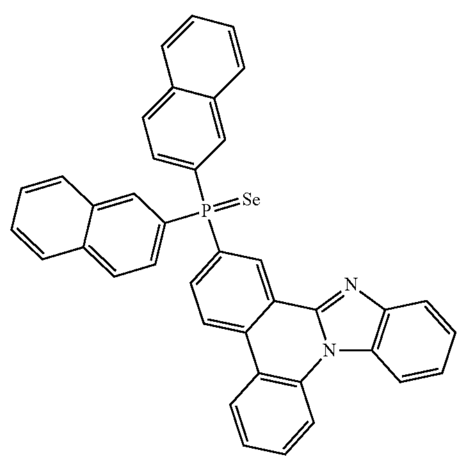

-continued
[Compound 1-139]
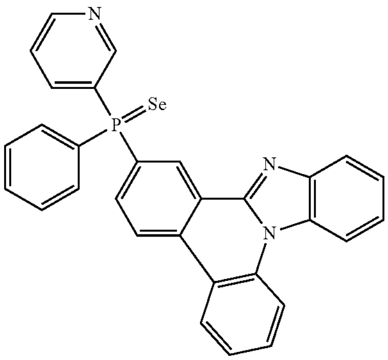
[Compound 1-140]
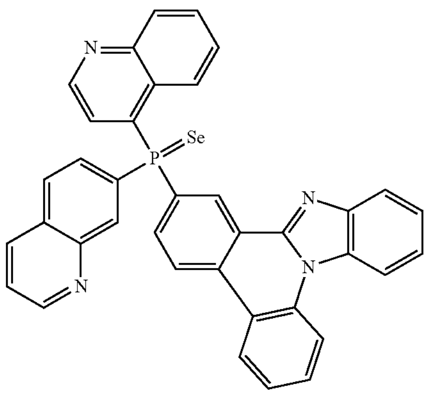
[Compound 1-141]
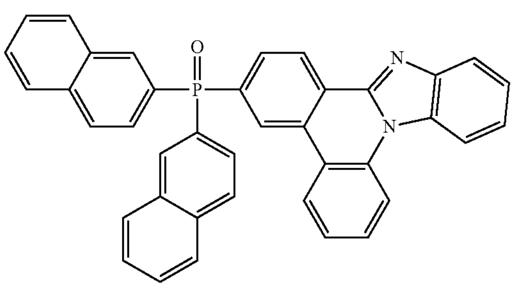
[Compound 1-142]
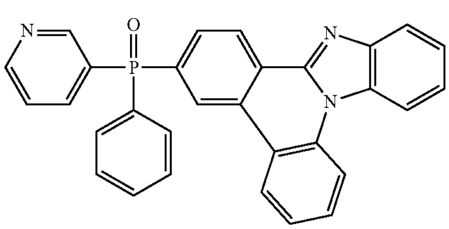
-continued
[Compound 1-143]
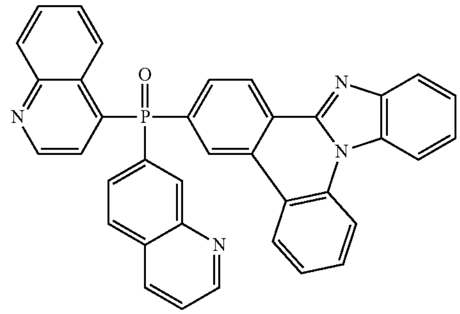
[Compound 1-144]
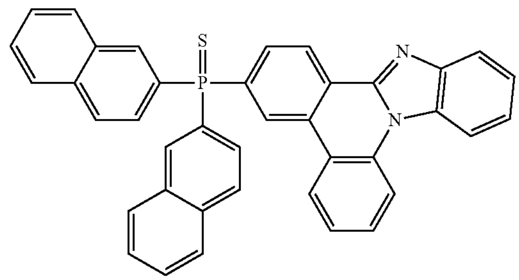
[Compound 1-145]
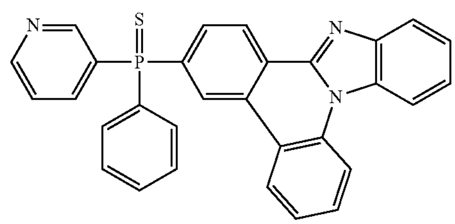
[Compound 1-146]
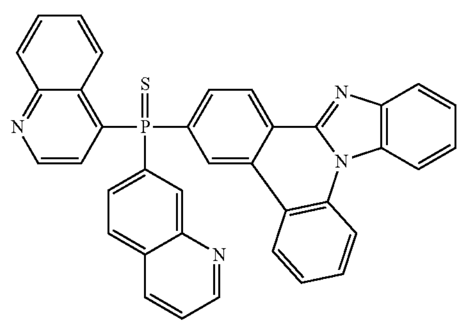
[Compound 1-147]
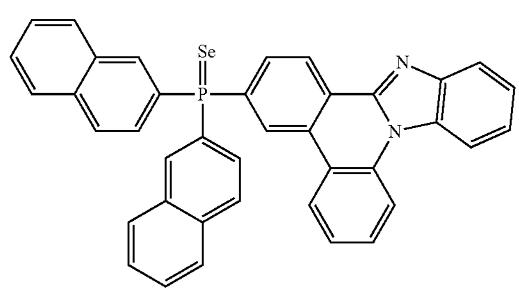

-continued
[Compound 1-148]
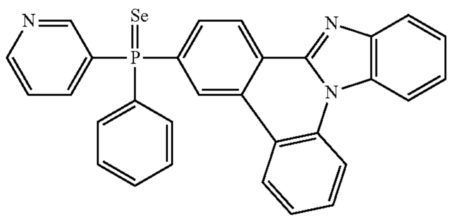
[Compound 1-149]
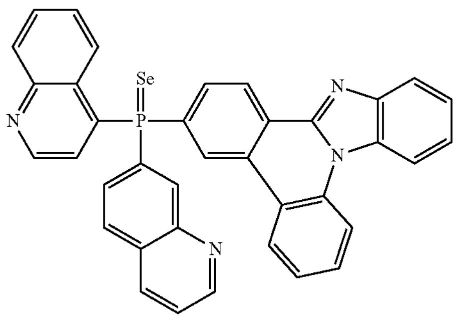
[Compound 1-150]
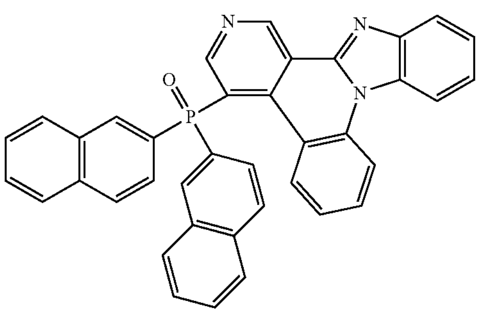
[Compound 1-151]
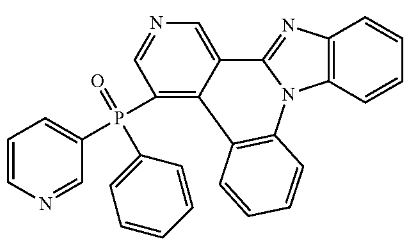
[Compound 1-152]
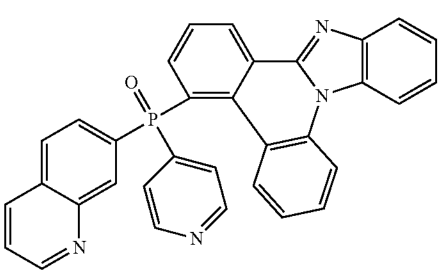
-continued
[Compound 1-153]
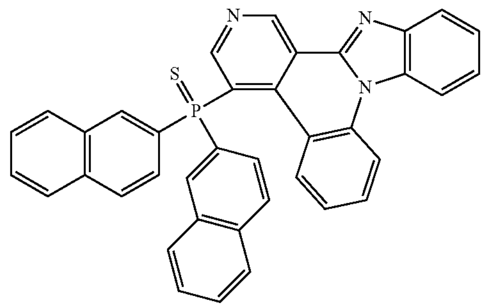
[Compound 1-154]
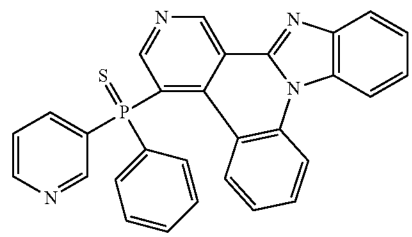
[Compound 1-155]
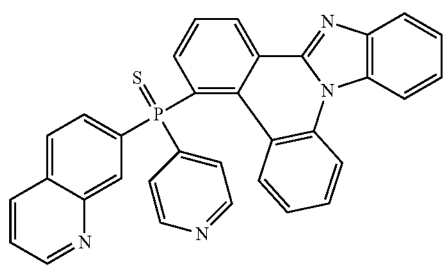
[Compound 1-156]
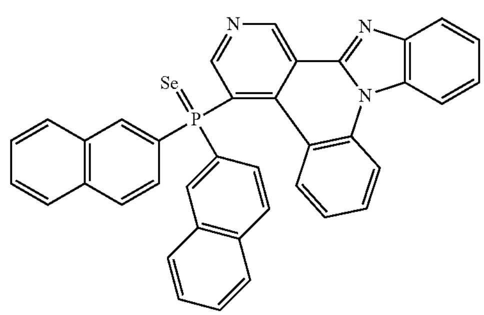
[Compound 1-157]
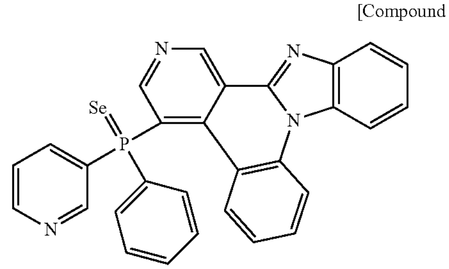

-continued
[Compound 1-158]
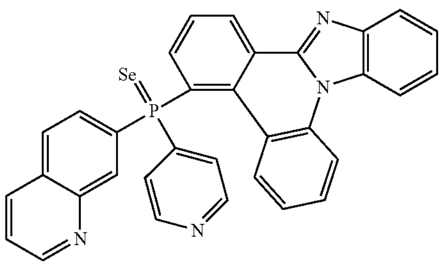
[Compound 1-159]
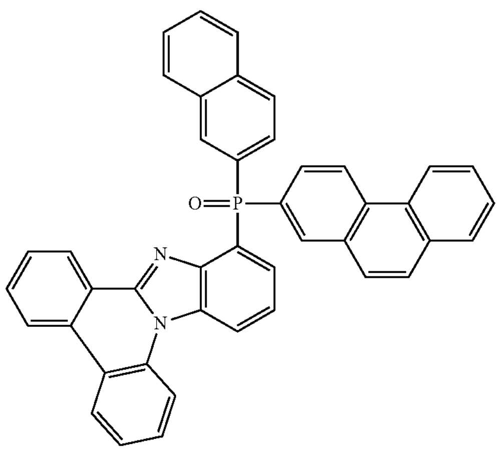
[Compound 1-160]
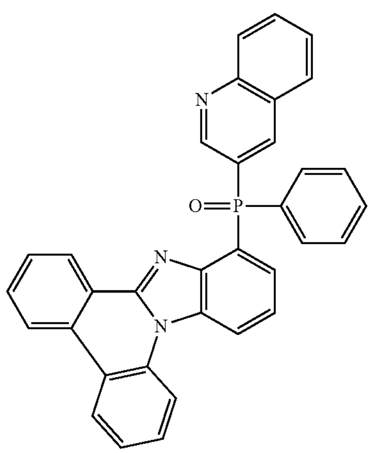
[Compound 1-161]
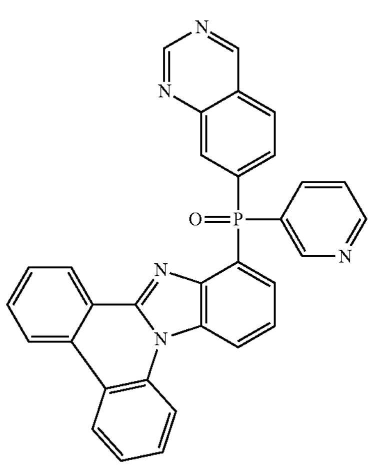
-continued
[Compound 1-162]
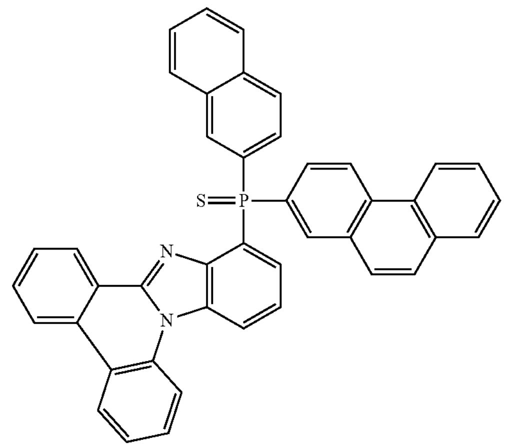
[Compound 1-163]
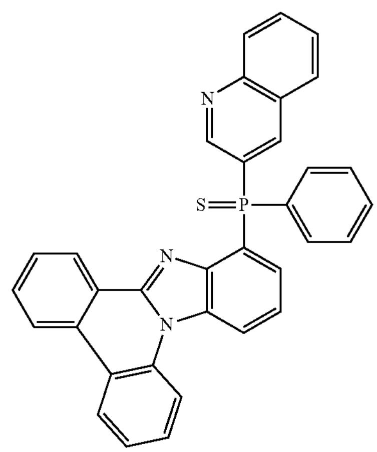
[Compound 1-164]
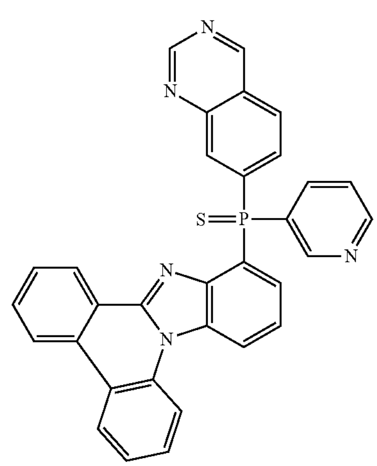

-continued
[Compound 1-165]
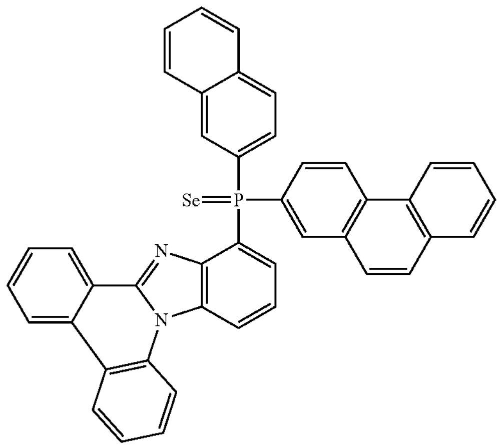
[Compound 1-166]
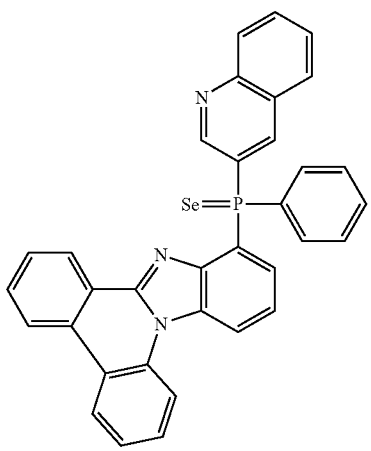
[Compound 1-167]
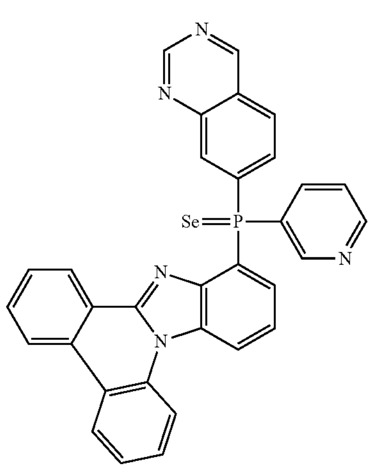
-continued
[Compound 1-168]
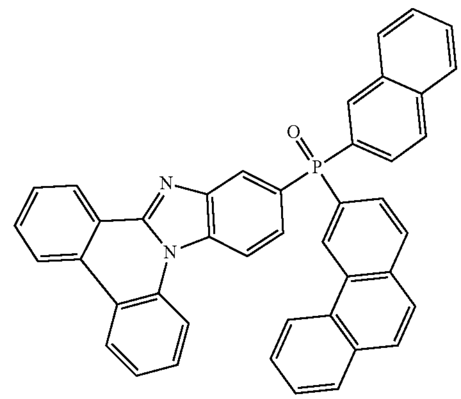
[Compound 1-169]
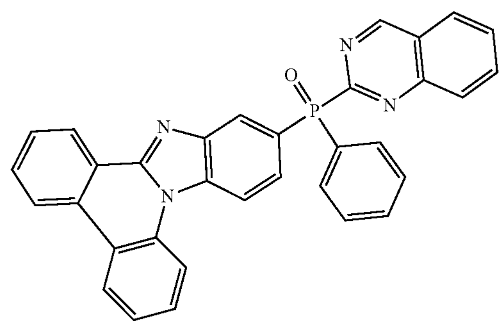
[Compound 1-170]
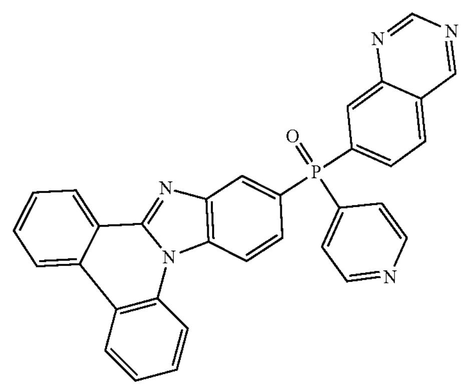
[Compound 1-171]
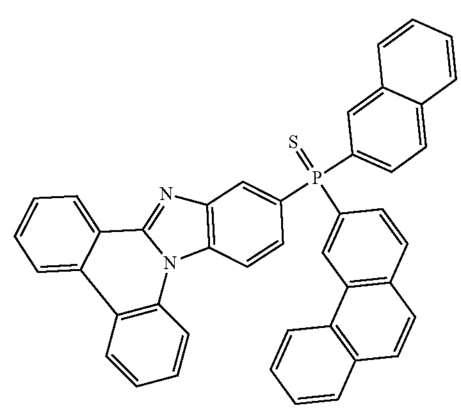

-continued
[Compound 1-172]
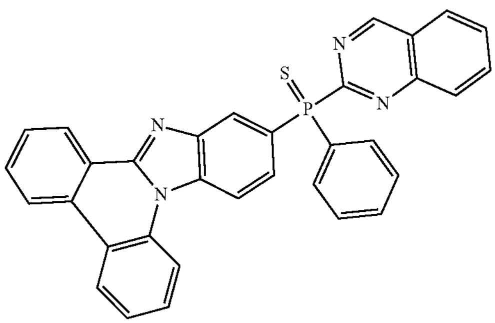
[Compound 1-173]
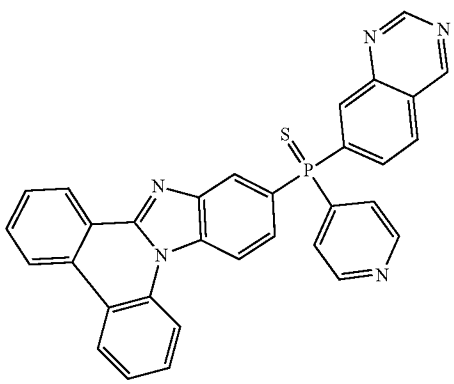
[Compound 1-174]
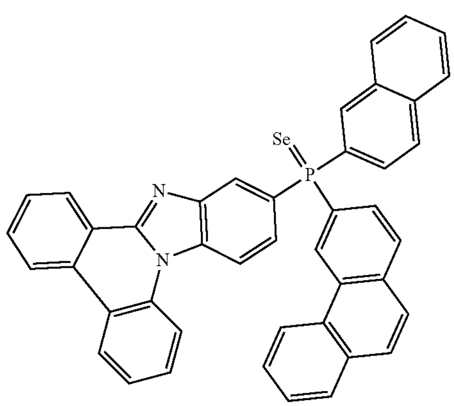
[Compound 1-175]
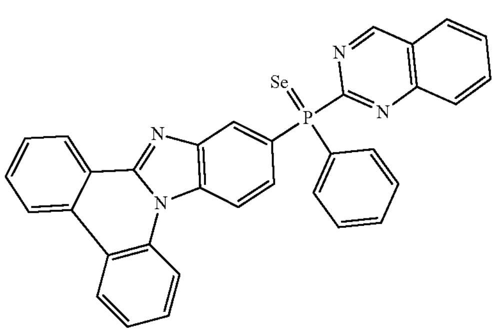
-continued
[Compound 1-176]
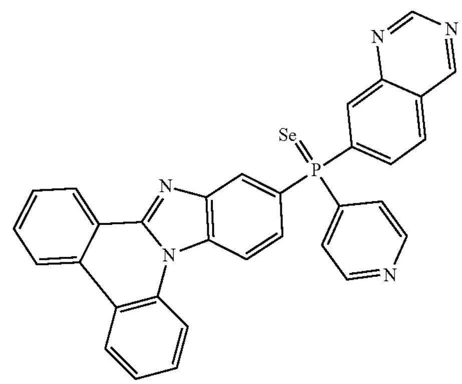
[Compound 1-177]
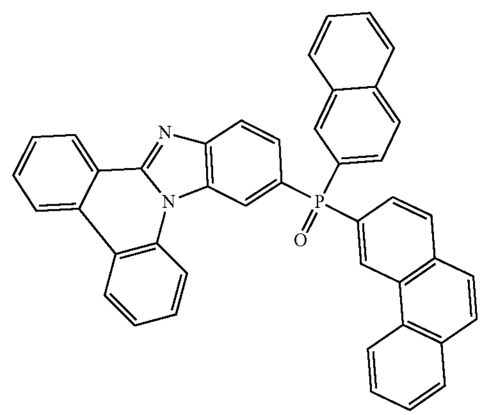
[Compound 1-178]
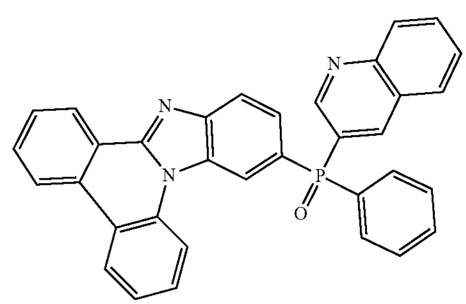
[Compound 1-179]
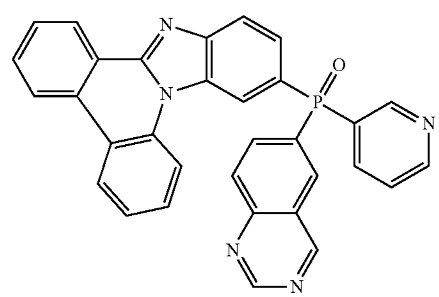

-continued
[Compound 1-180]
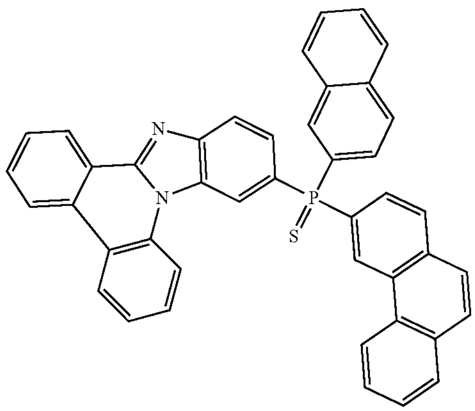
[Compound 1-181]
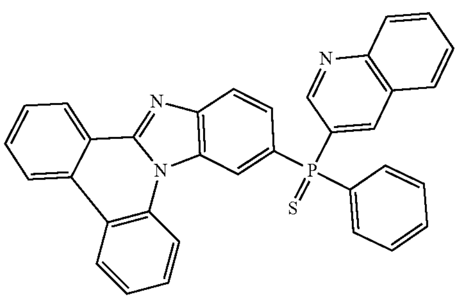
[Compound 1-182]
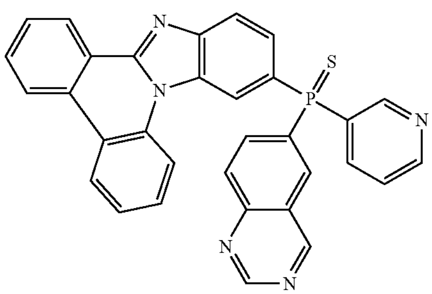
[Compound 1-183]
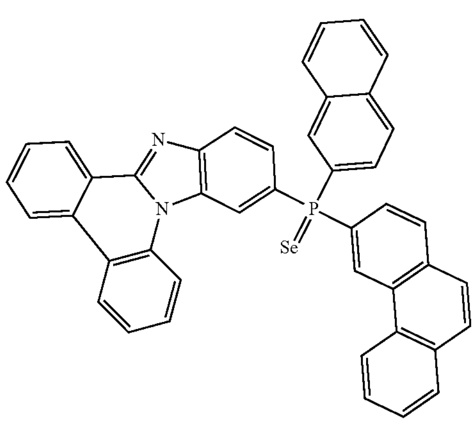
-continued
[Compound 1-184]
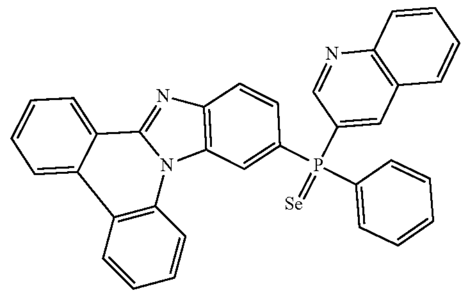
[Compound 1-185]
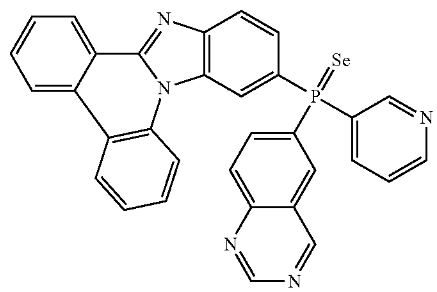
[Compound 1-186]
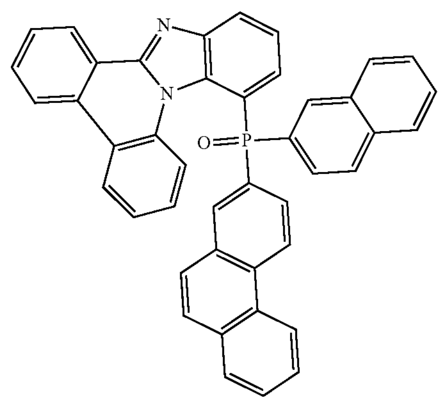
[Compound 1-187]
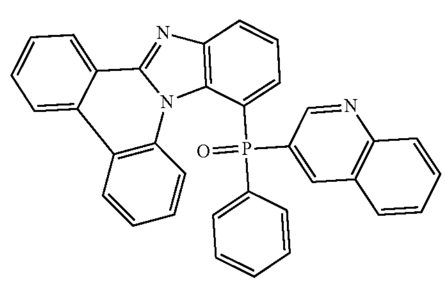
[Compound 1-188]
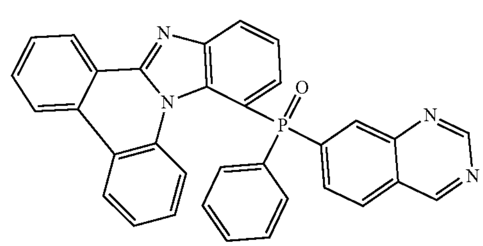

-continued
[Compound 1-189]
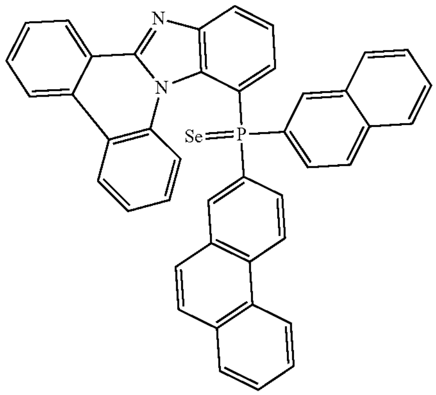
[Compound 1-190]
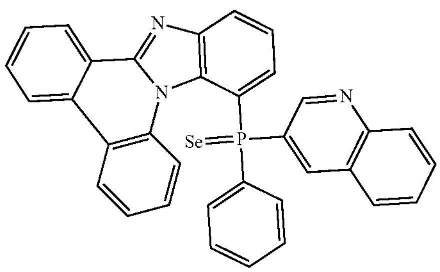
[Compound 1-191]
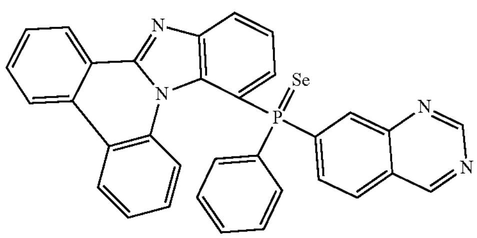
[Compound 1-192]
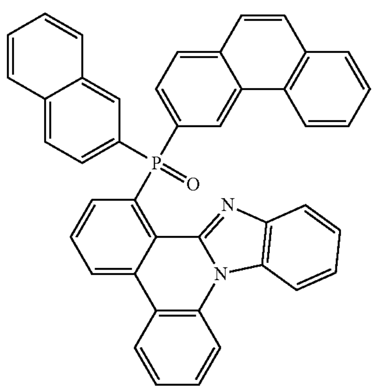
-continued
[Compound 1-193]
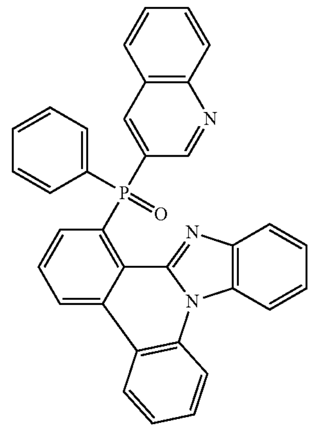
[Compound 1-194]
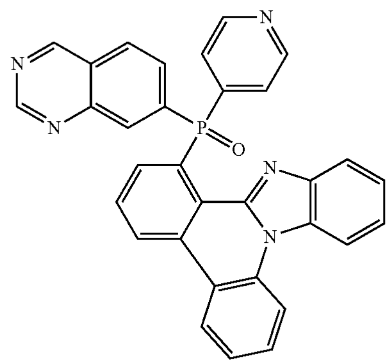
[Compound 1-195]
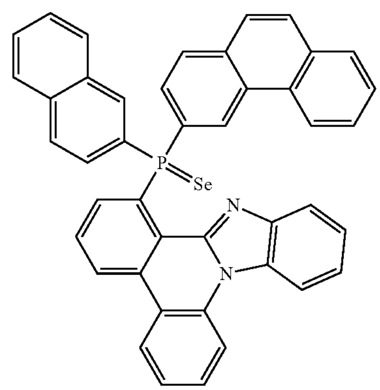
[Compound 1-196]
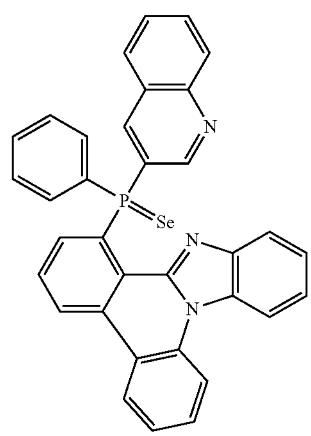

-continued
[Compound 1-197]
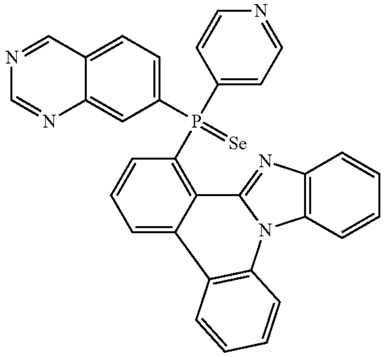
[Compound 1-198]
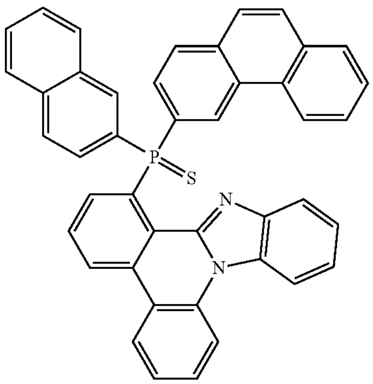
[Compound 1-199]
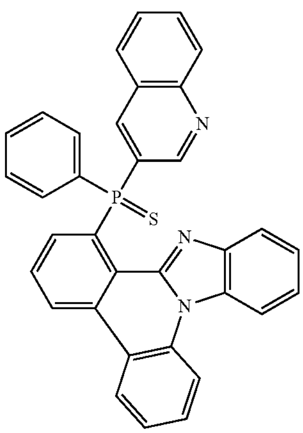
[Compound 1-200]
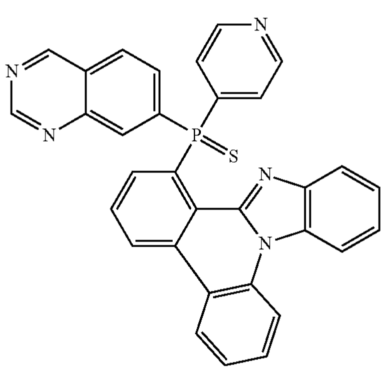
-continued
[Compound 1-201]
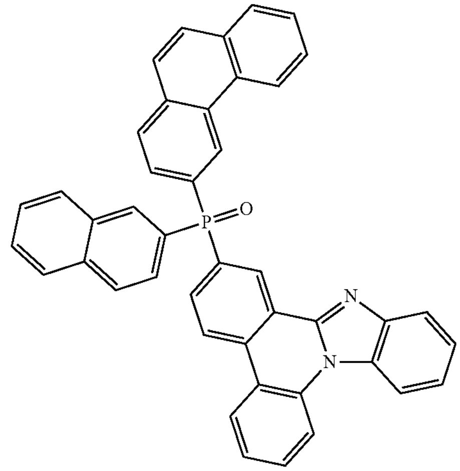
[Compound 1-202]
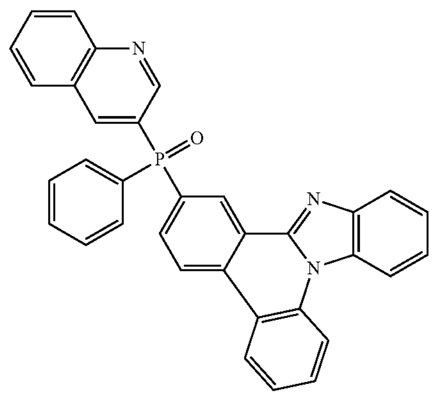
[Compound 1-203]
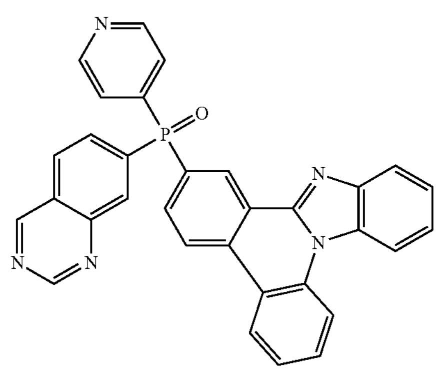

-continued
[Compound 1-204]
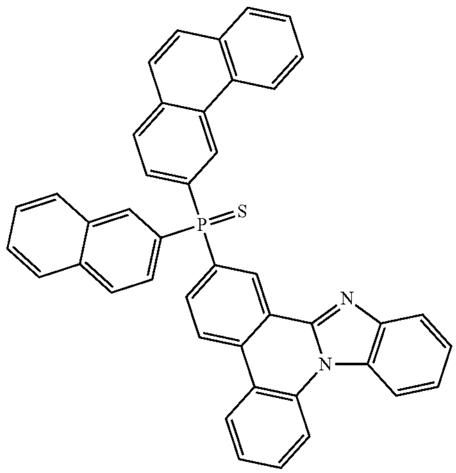
[Compound 1-205]
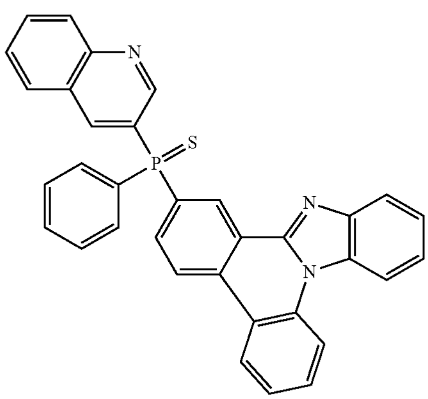
[Compound 1-206]
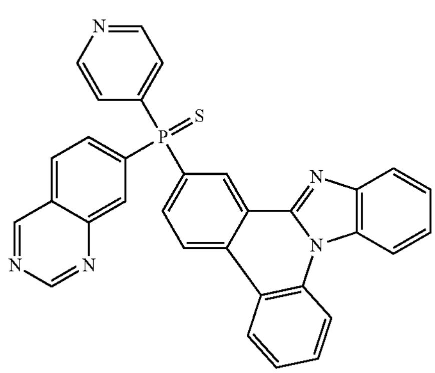
-continued
[Compound 1-207]
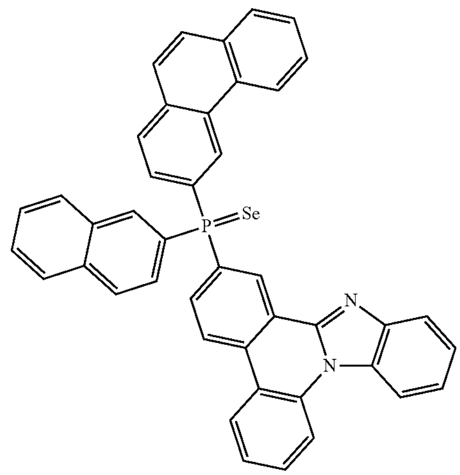
[Compound 1-208]
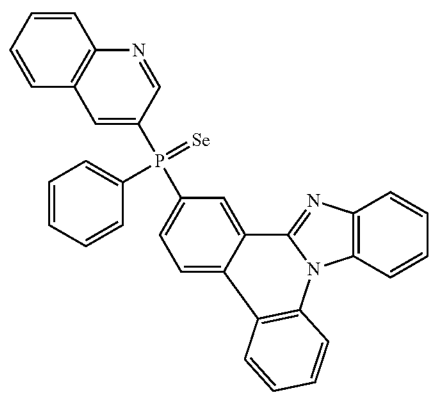
[Compound 1-209]
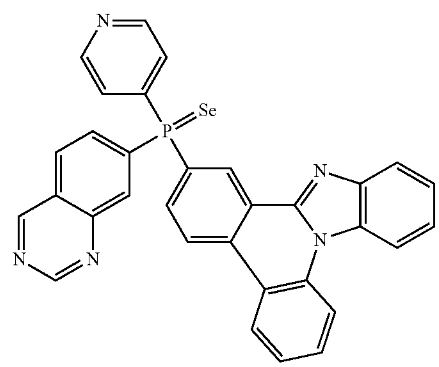
[Compound 1-210]
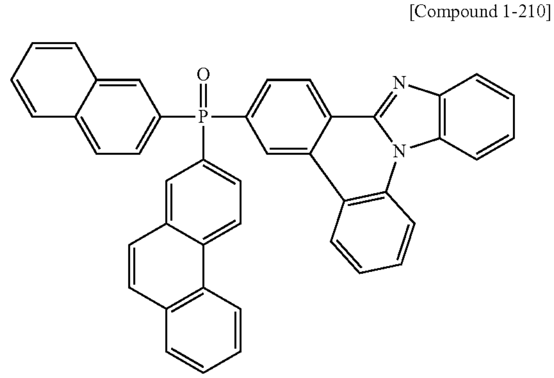

[Compound 1-211]
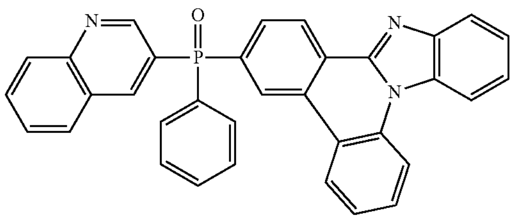
[Compound 1-212]
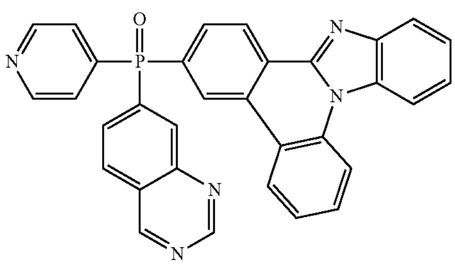
[Compound 1-213]
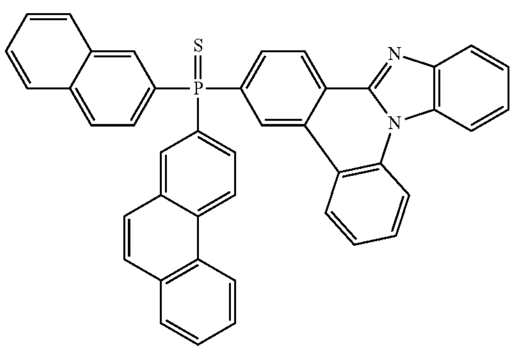
[Compound 1-214]
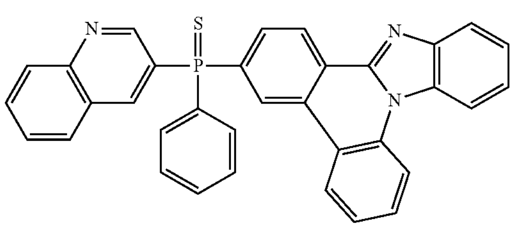
[Compound 1-215]
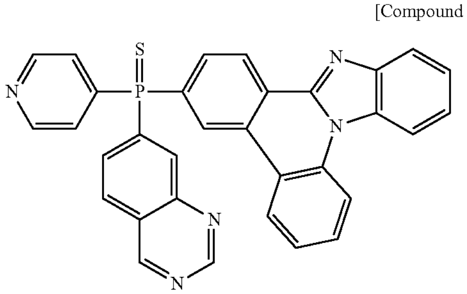
[Compound 1-216]
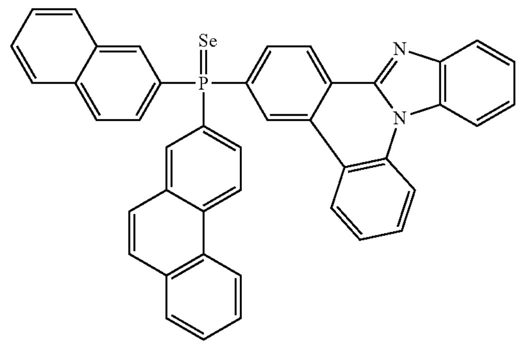
[Compound 1-217]
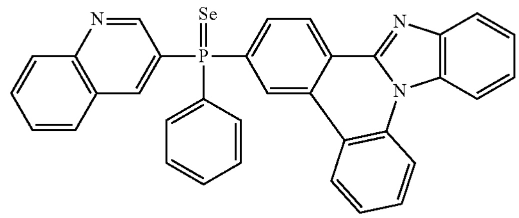
[Compound 1-218]
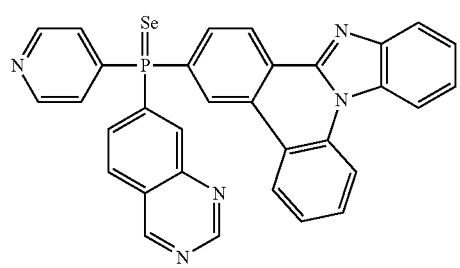
[Compound 1-219]
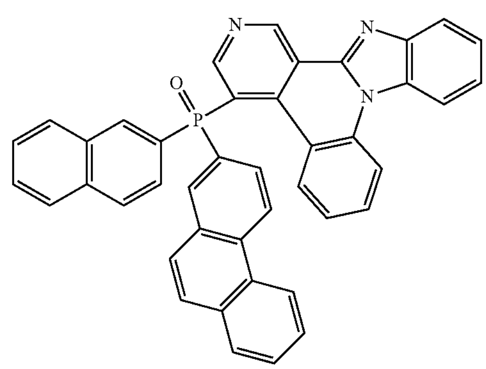
[Compound 1-220]
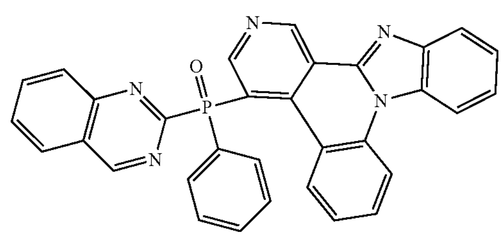

-continued
[Compound 1-221]
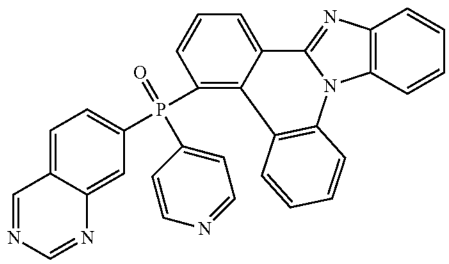
[Compound 1-222]
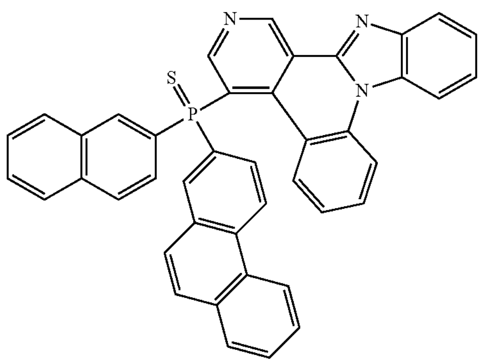
[Compound 1-223]
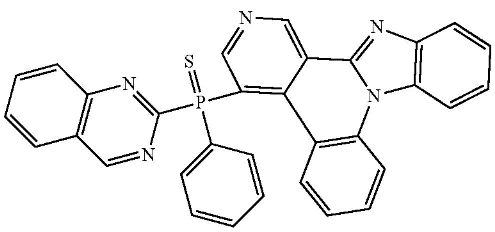
[Compound 1-224]
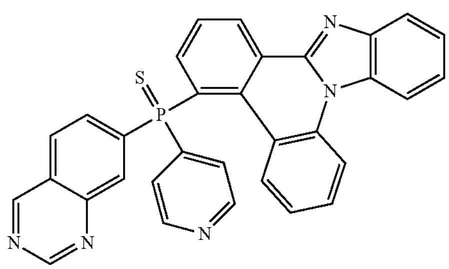
[Compound 1-225]
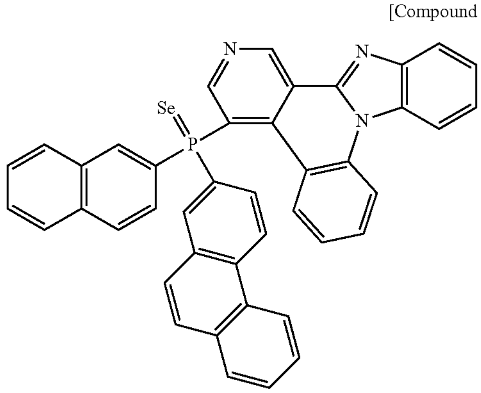
-continued
[Compound 1-226]
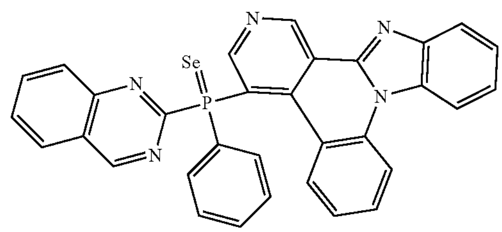
[Compound 1-227]
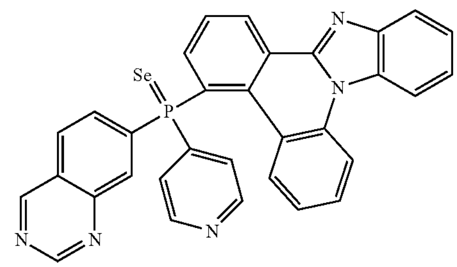
[Compound 1-228]
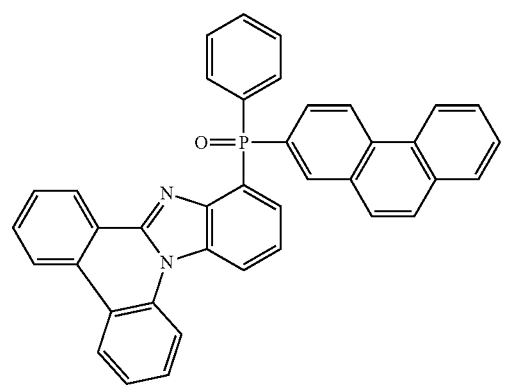
[Compound 1-229]
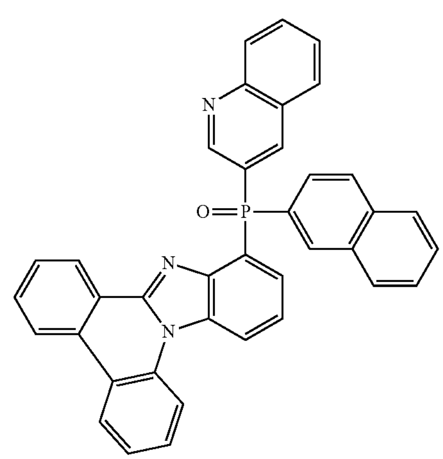

-continued
[Compound 1-230]
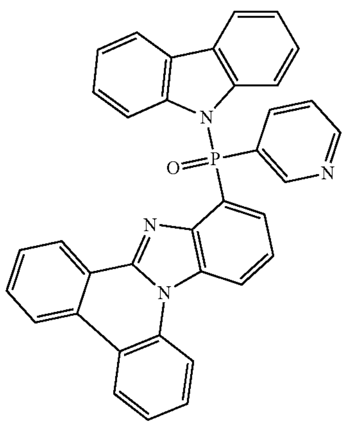
[Compound 1-231]
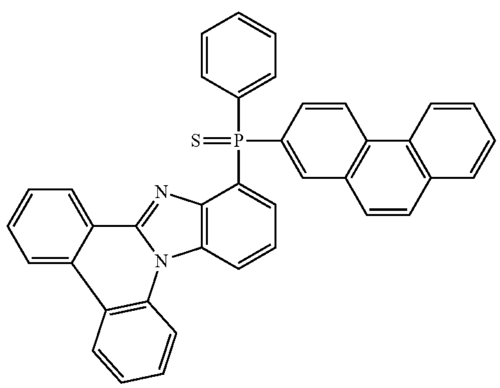
[Compound 1-232]
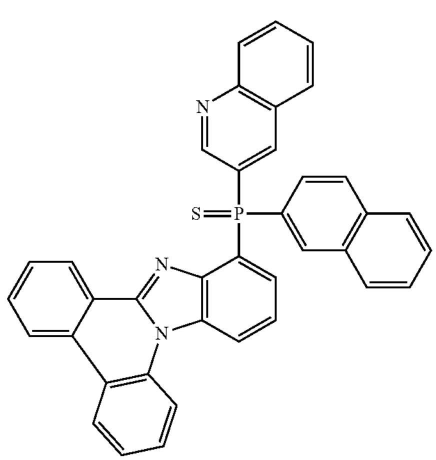
-continued
[Compound 1-233]
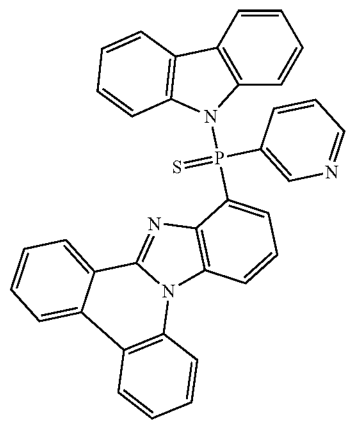
[Compound 1-234]
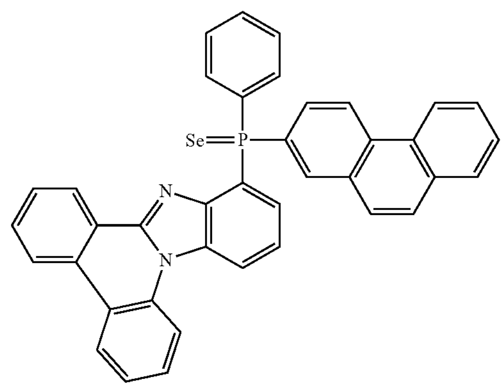
[Compound 1-235]
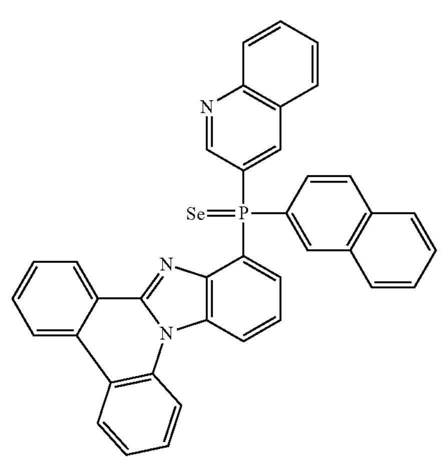

-continued
[Compound 1-236]
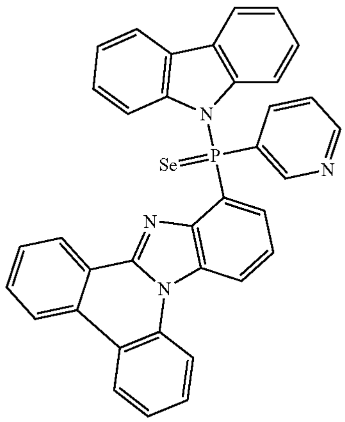
[Compound 1-237]
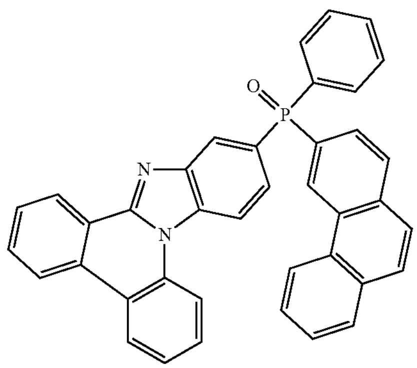
[Compound 1-238]
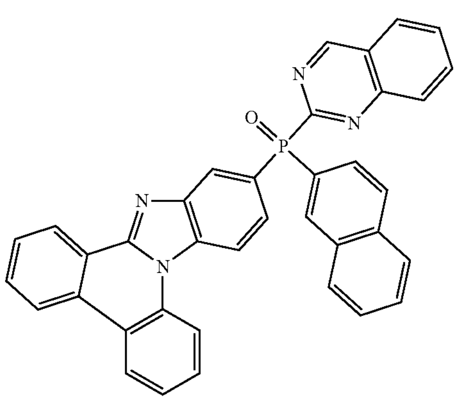
-continued
[Compound 1-239]
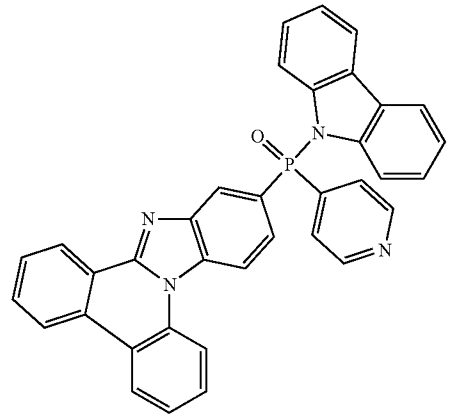
[Compound 1-240]
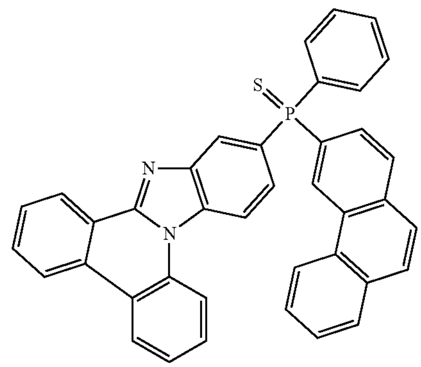
[Compound 1-241]
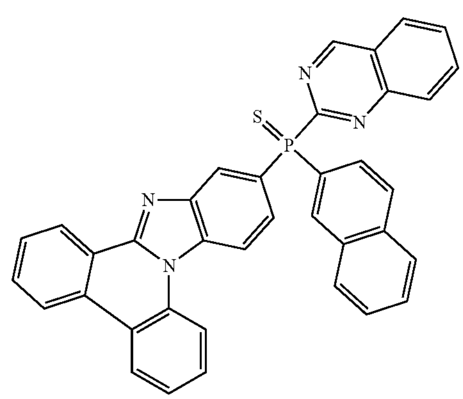

-continued
[Compound 1-242]
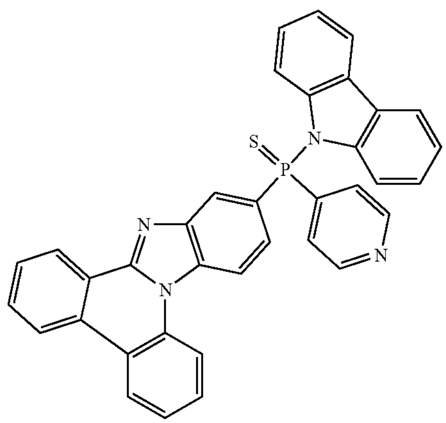
[Compound 1-243]
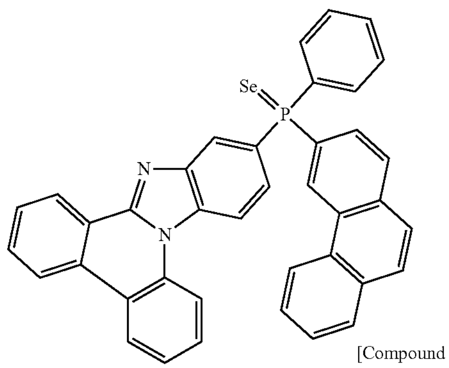
[Compound 1-244]
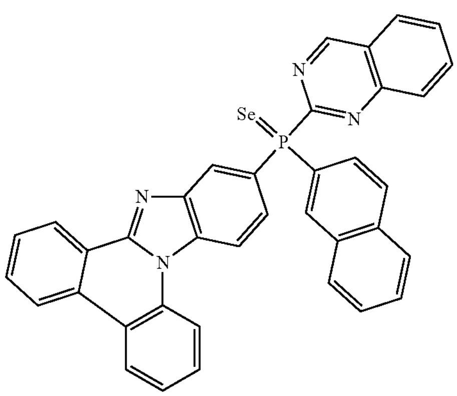
[Compound 1-245]
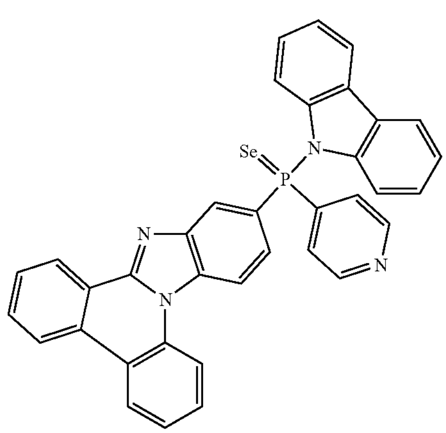
-continued
[Compound 1-246]
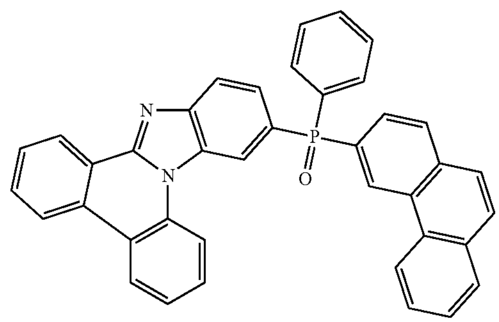
[Compound 1-247]
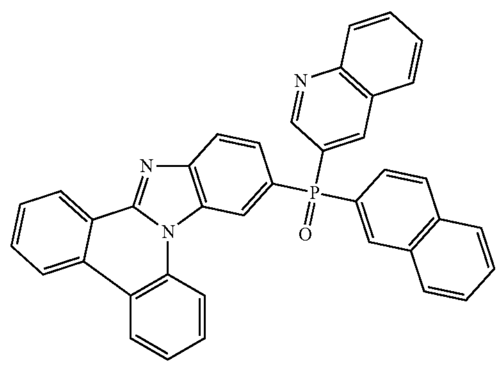
[Compound 1-248]
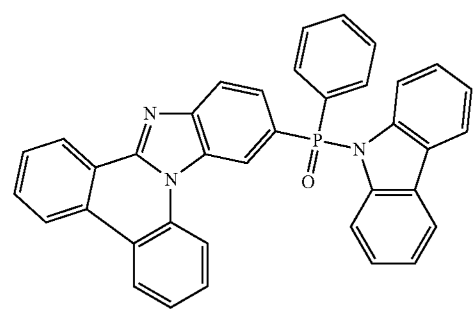
[Compound 1-249]
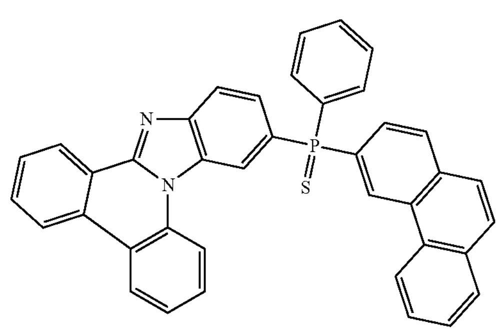

[Compound 1-250]
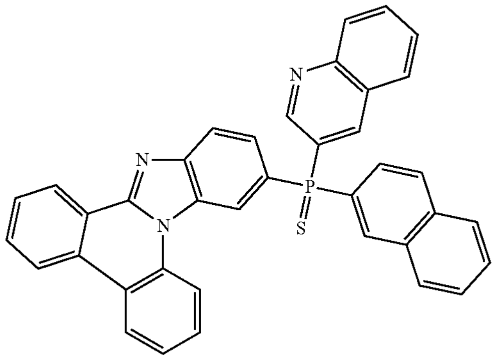
[Compound 1-251]
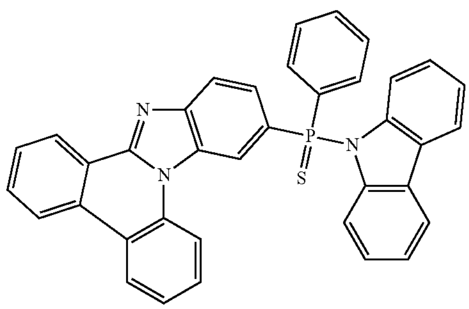
[Compound 1-252]
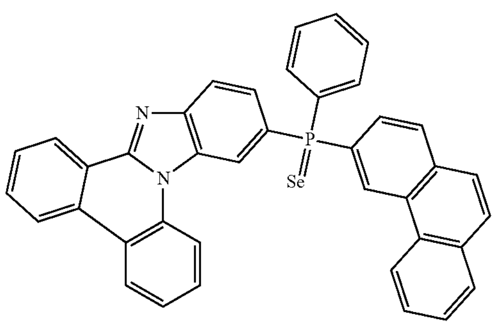
[Compound 1-253]
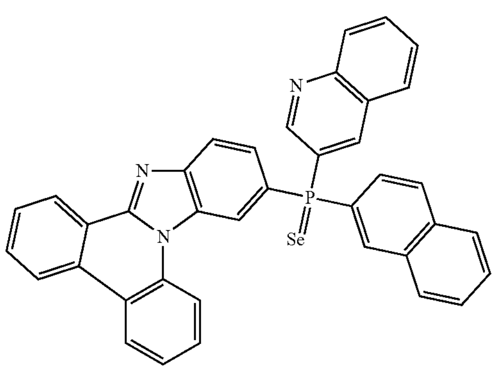
[Compound 1-254]
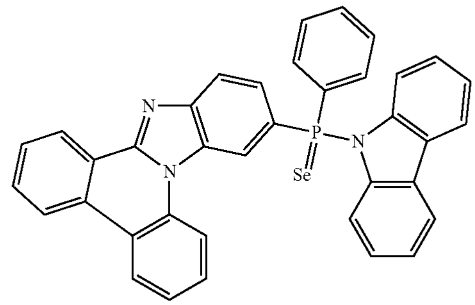
[Compound 1-255]
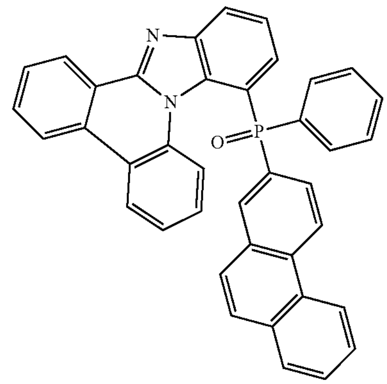
[Compound 1-256]
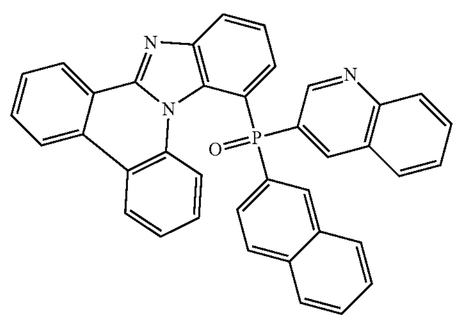
[Compound 1-257]
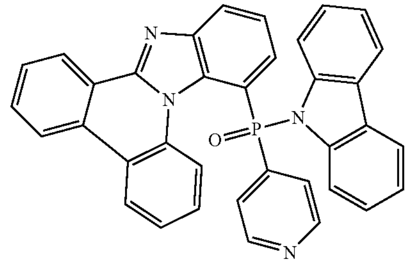

[Compound 1-258]
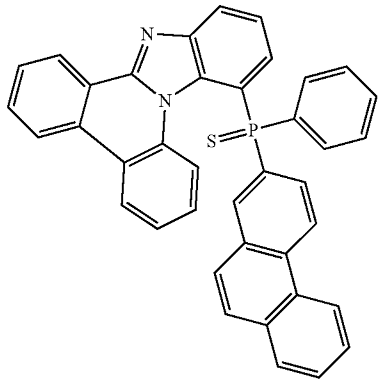
[Compound 1-259]
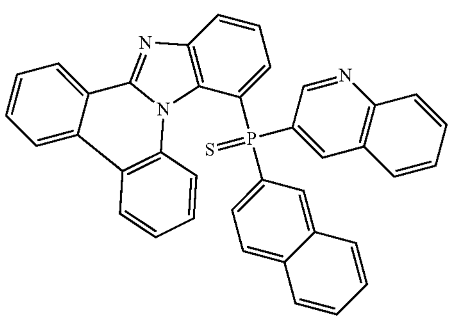
[Compound 1-260]
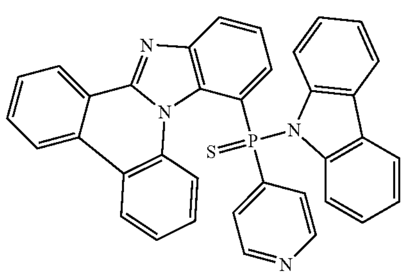
[Compound 1-261]
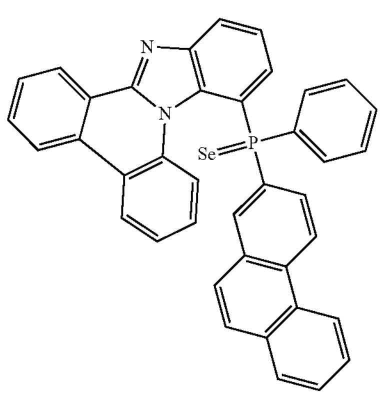
[Compound 1-262]
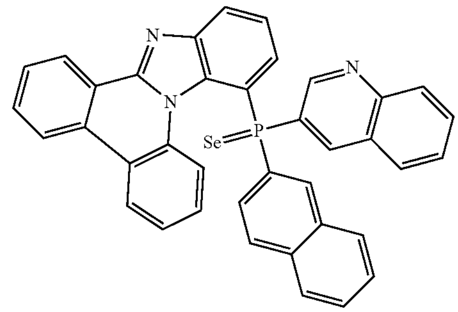
[Compound 1-263]
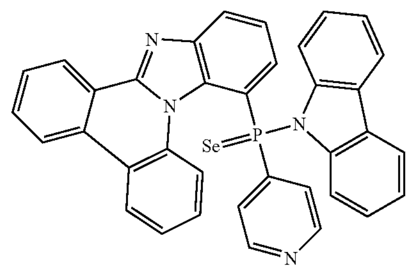
[Compound 1-264]
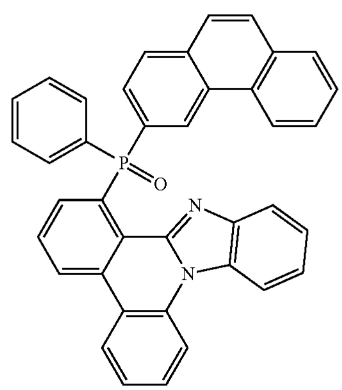
[Compound 1-265]
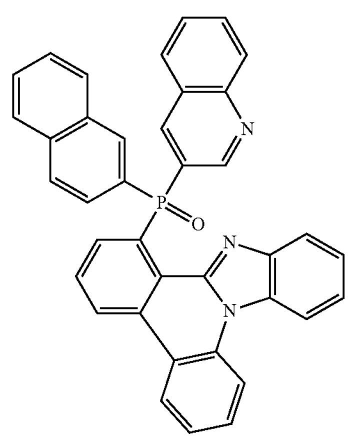

-continued
[Compound 1-266]
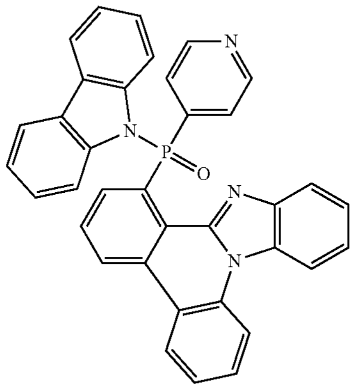
[Compound 1-267]
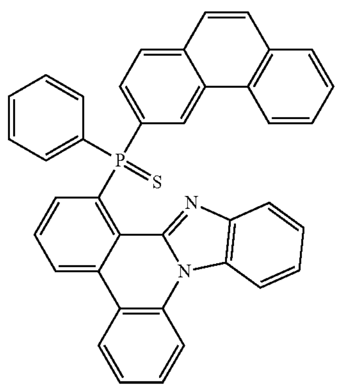
[Compound 1-268]
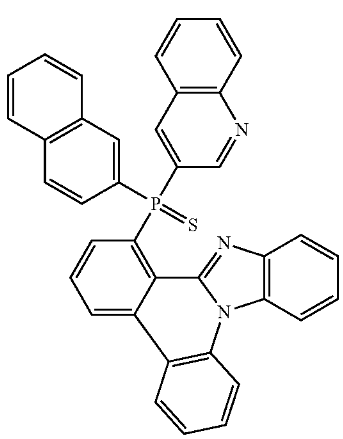
-continued
[Compound 1-269]
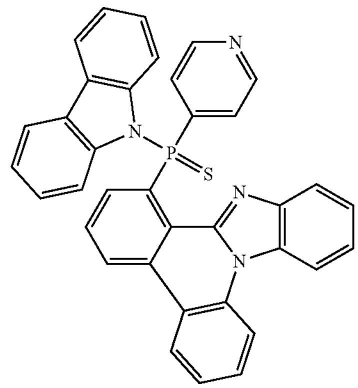
[Compound 1-270]
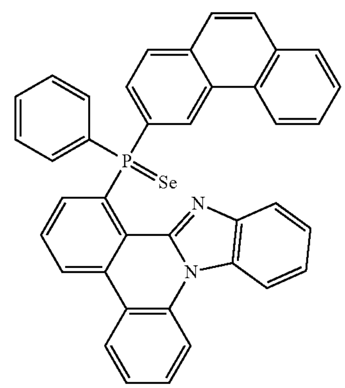
[Compound 1-271]
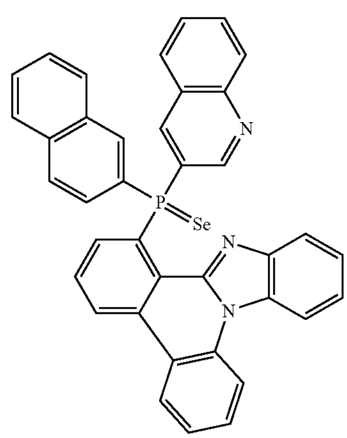

-continued
[Compound 1-272]
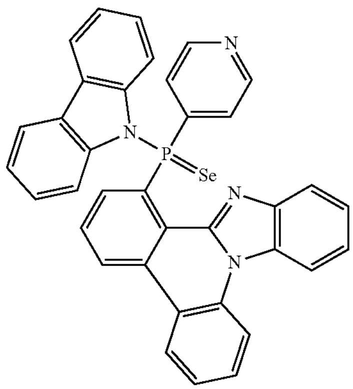
[Compound 1-273]
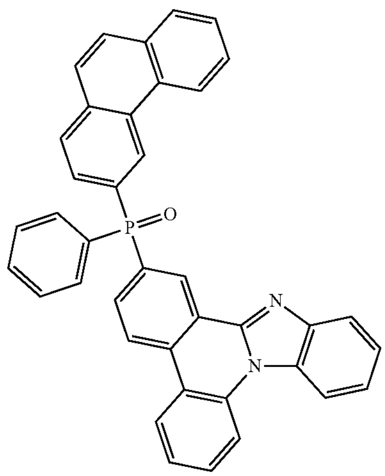
[Compound 1-274]
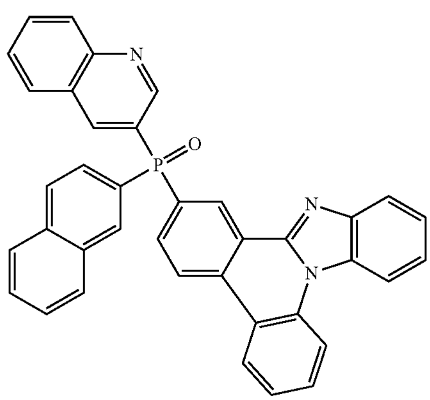
[Compound 1-275]
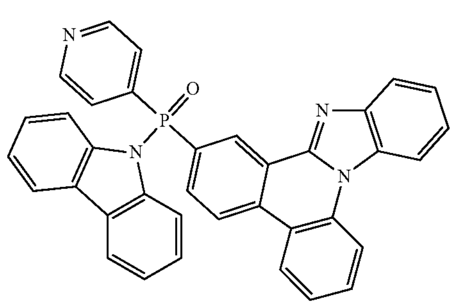
-continued
[Compound 1-276]
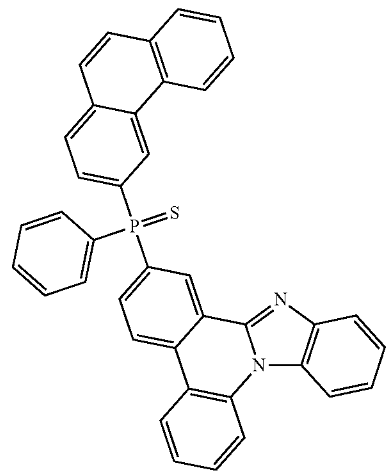
[Compound 1-277]
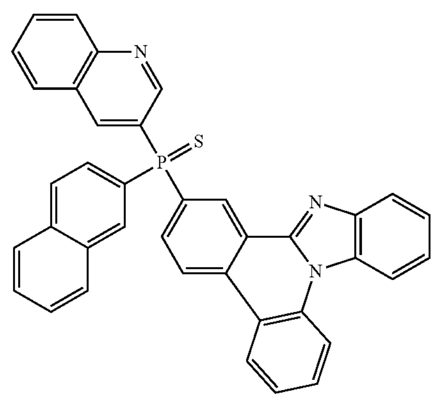
[Compound 1-278]
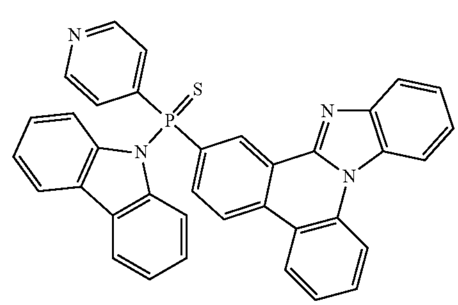

[Compound 1-279]
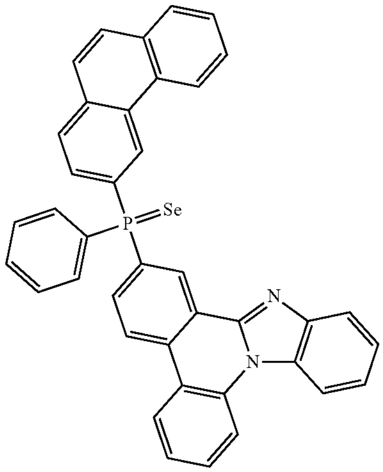
[Compound 1-280]
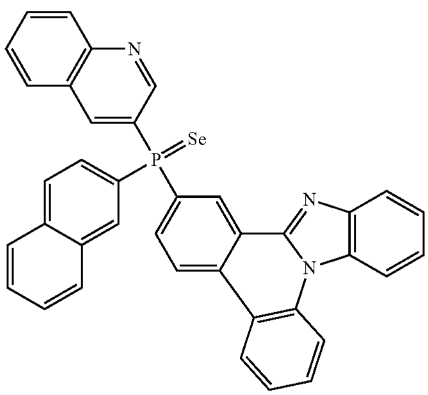
[Compound 1-281]
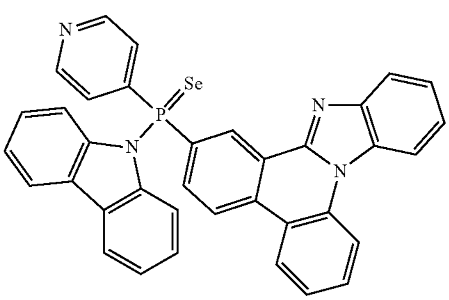
[Compound 1-282]
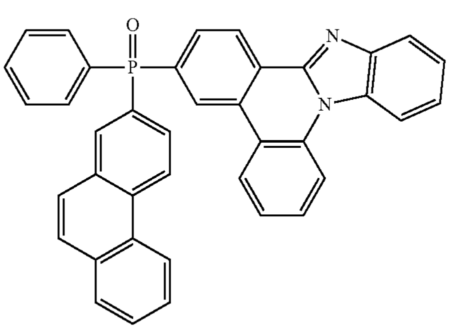
[Compound 1-283]
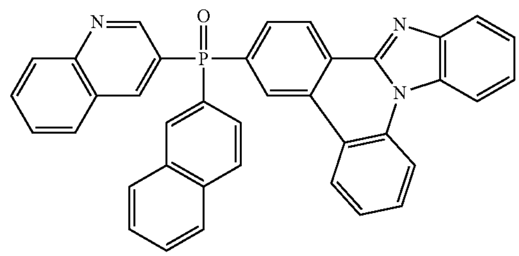
[Compound 1-284]
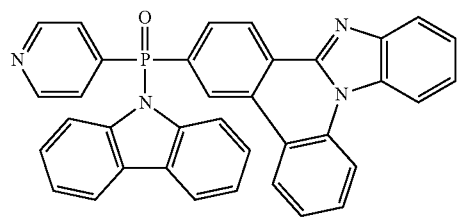
[Compound 1-285]
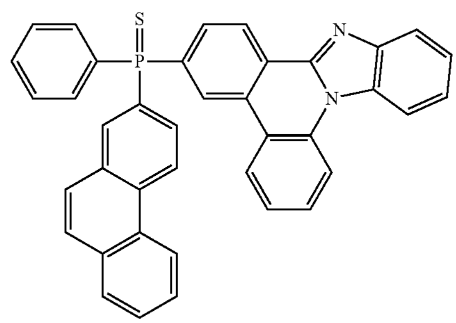
[Compound 1-286]
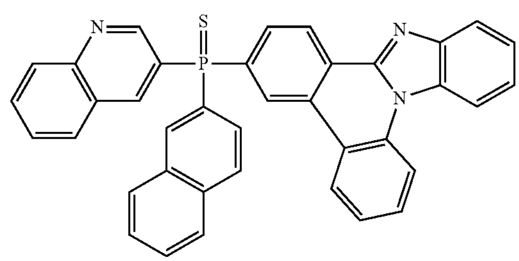
[Compound 1-287]
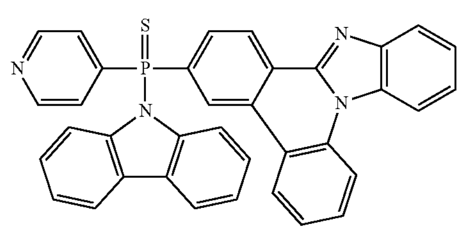

-continued
[Compound 1-288]
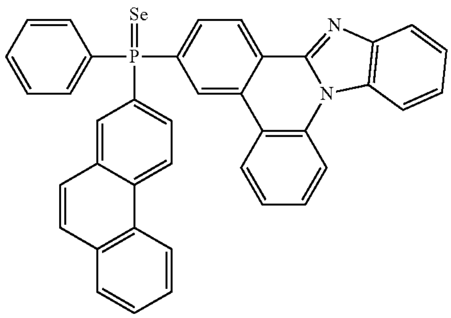
[Compound 1-289]
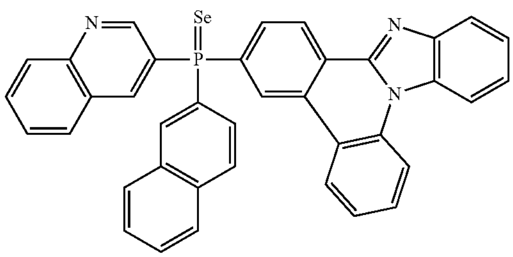
[Compound 1-290]
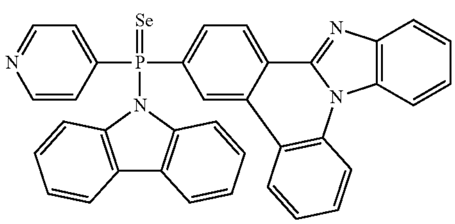
[Compound 1-291]
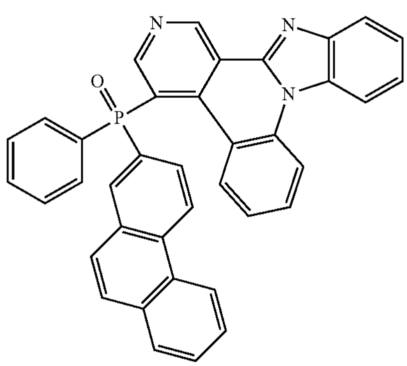
[Compound 1-292]
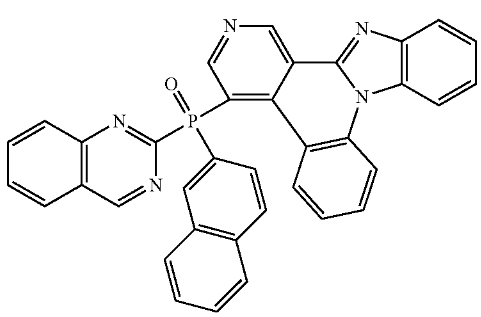
-continued
[Compound 1-293]
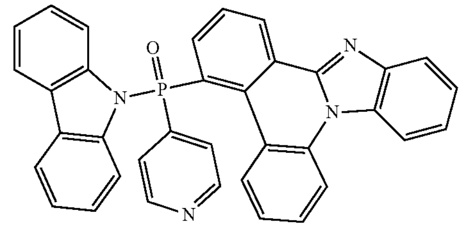
[Compound 1-294]
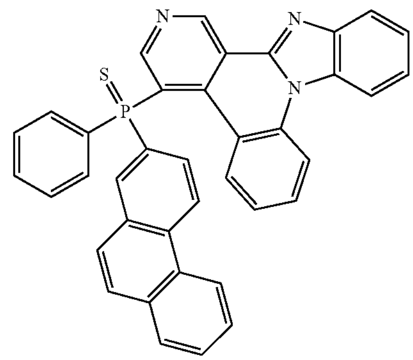
[Compound 1-295]
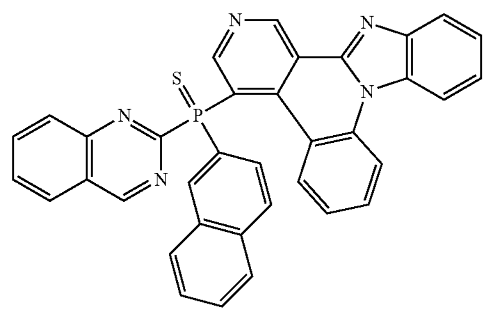
[Compound 1-296]
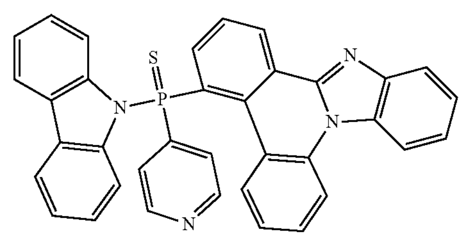
[Compound 1-297]
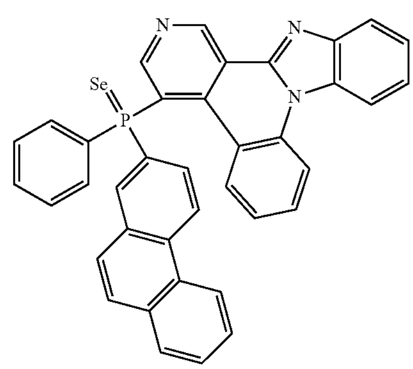

-continued
[Compound 1-298]
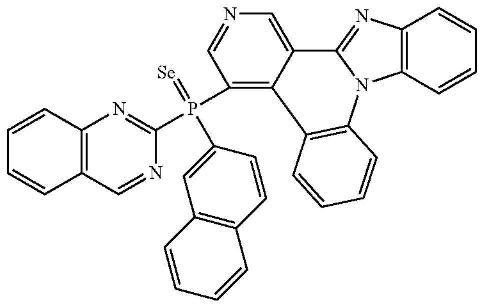
[Compound 1-299]
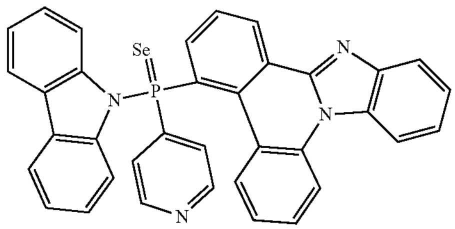
According to an exemplary embodiment of the present invention, the compound of Chemical Formula 1 may be any one selected from the following Compounds 2-1 to 2-51. However, the compound of Chemical Formula 1 is not limited to the following compounds.
[Compound 2-1]
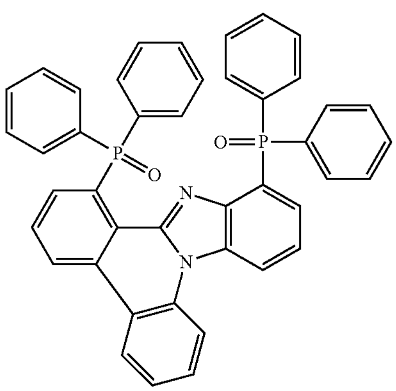
[Compound 2-2]
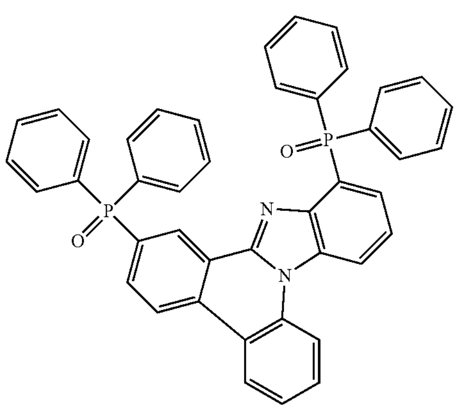
-continued
[Compound 2-3]
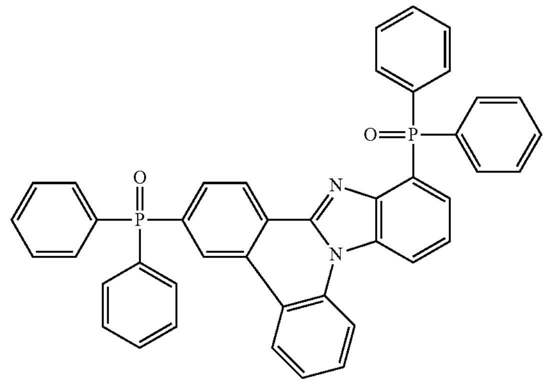
[Compound 2-4]
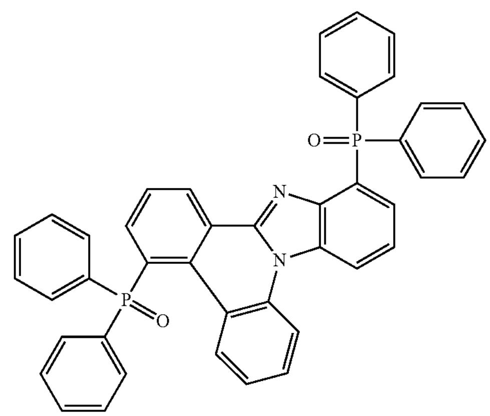
[Compound 2-5]
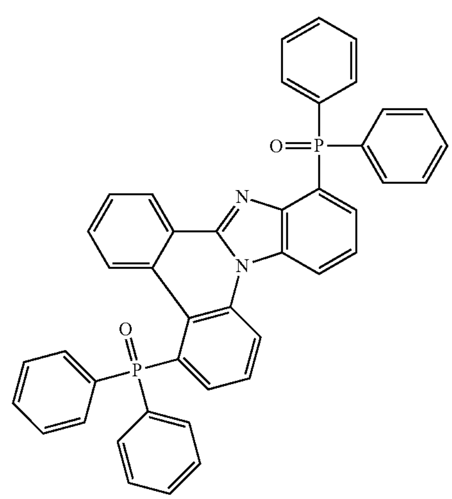

-continued
[Compound 2-6]
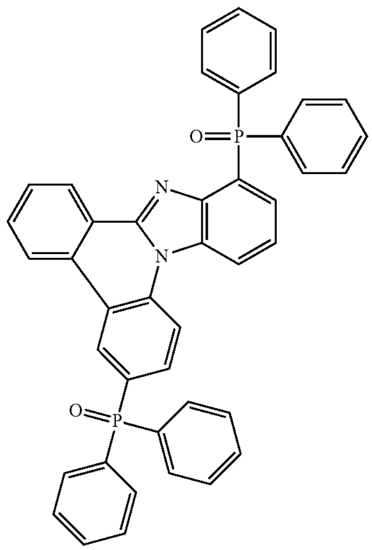
[Compound 2-7]
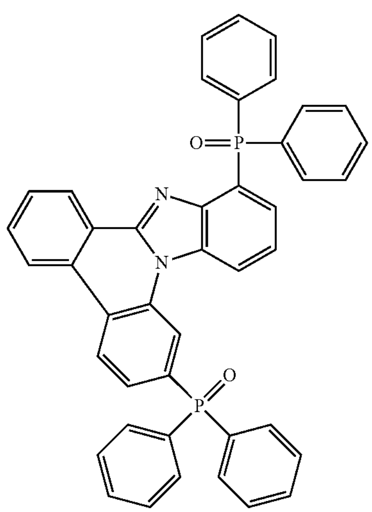
[Compound 2-8]
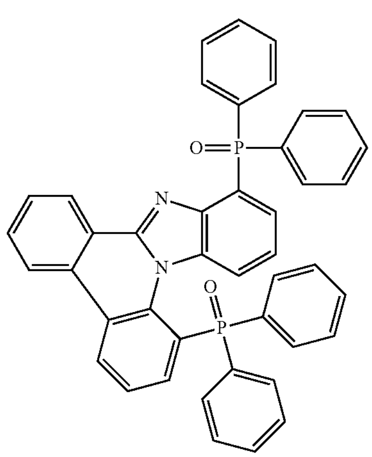
-continued
[Compound 2-9]
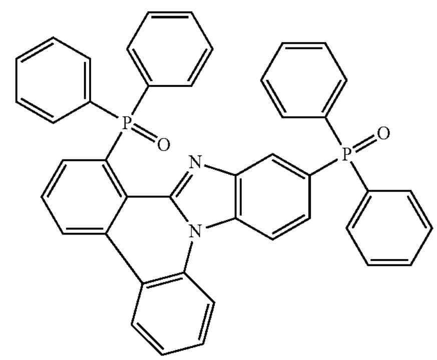
[Compound 2-10]
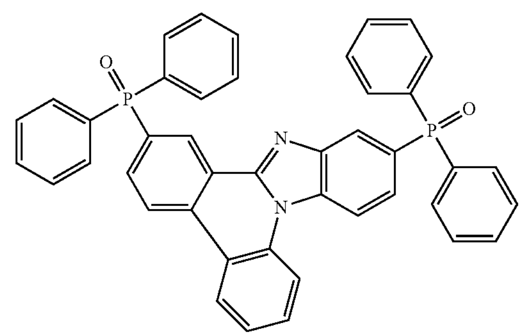
[Compound 2-11]
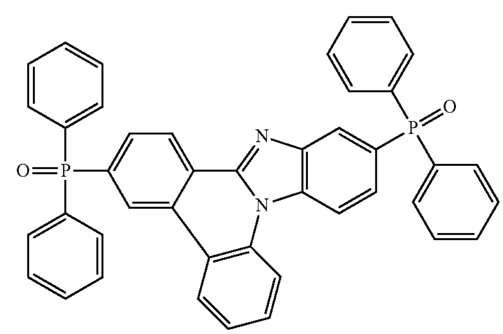
[Compound 2-12]
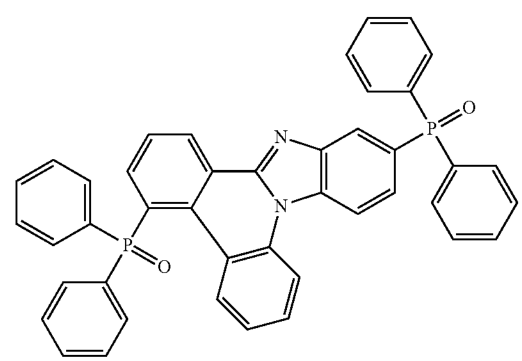

-continued
[Compound 2-13]
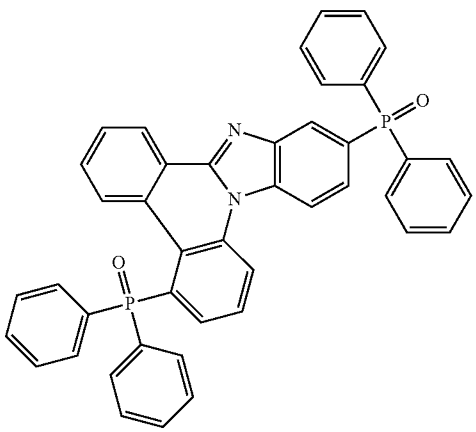
[Compound 2-14]
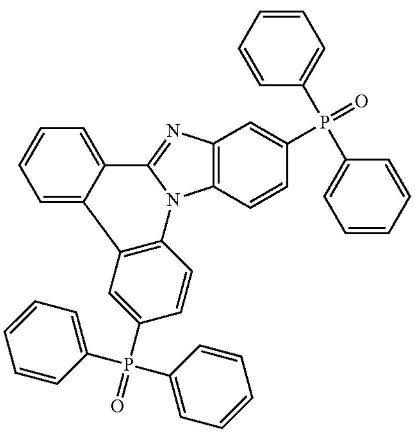
[Compound 2-15]
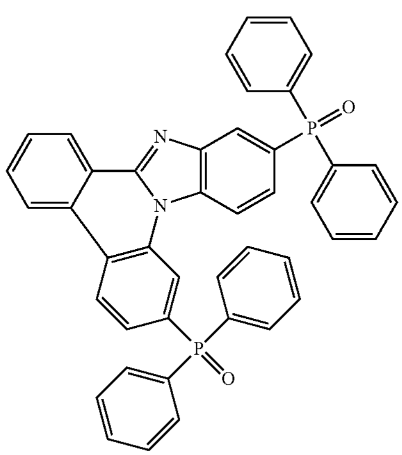
-continued
[Compound 2-16]
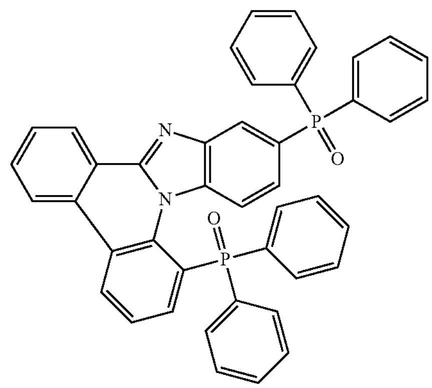
[Compound 2-17]
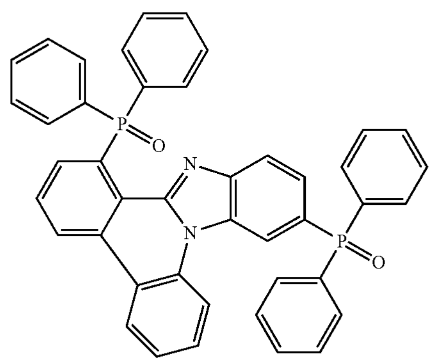
[Compound 2-18]
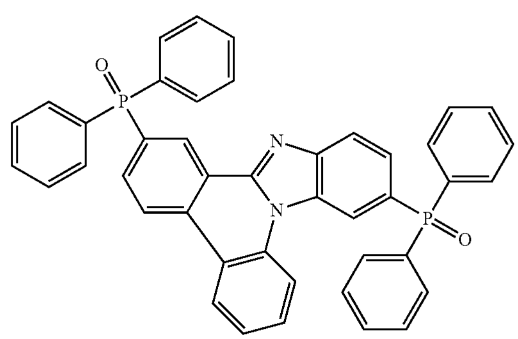
[Compound 2-19]
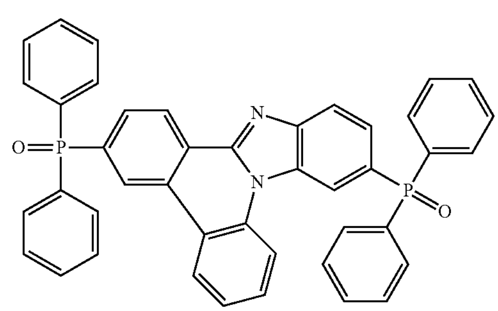

-continued
[Compound 2-20]
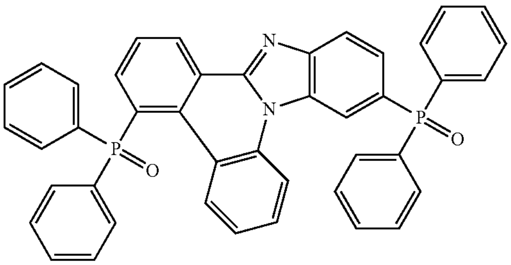
[Compound 2-21]
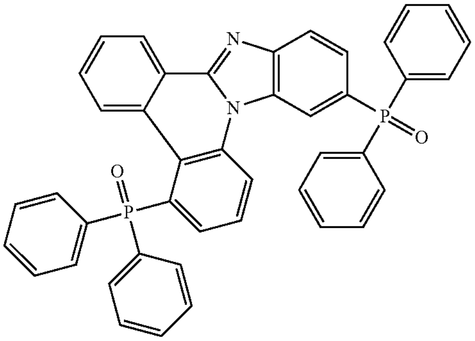
[Compound 2-22]
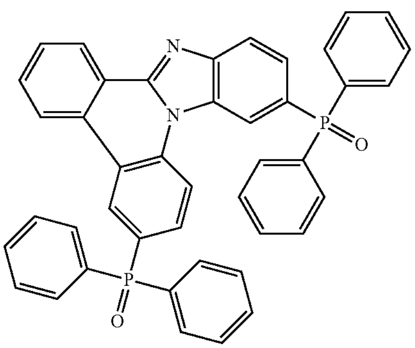
[Compound 2-23]
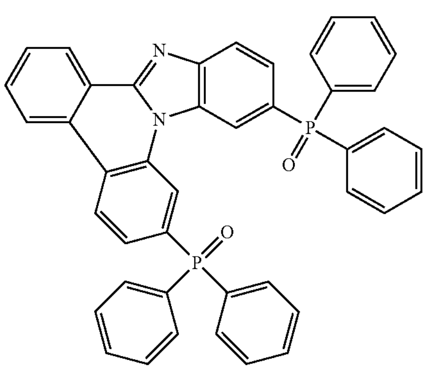
-continued
[Compound 2-24]
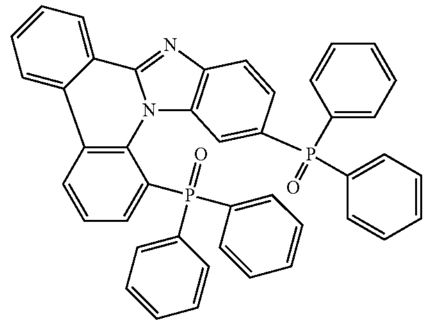
[Compound 2-25]
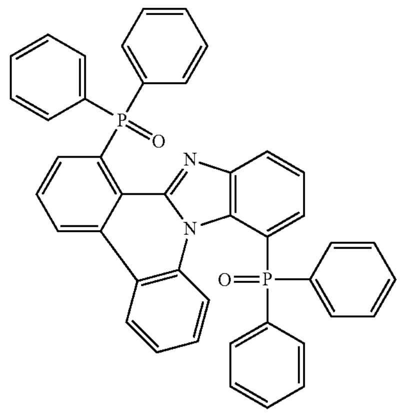
[Compound 2-26]
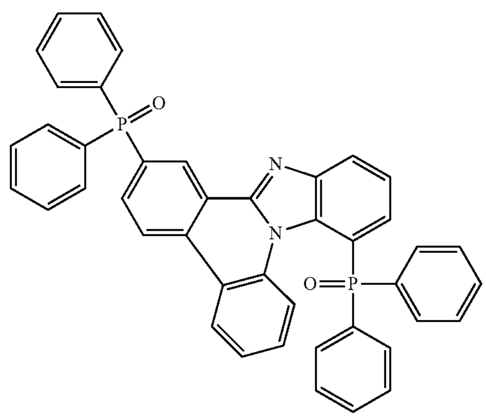
[Compound 2-27]
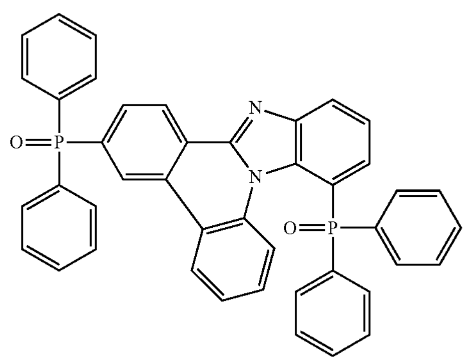

-continued
[Compound 2-28]
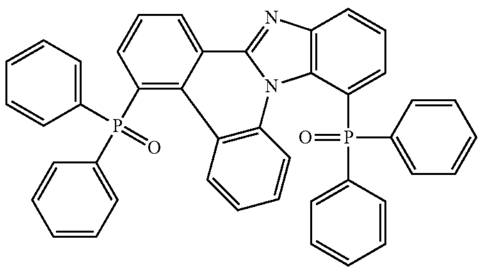
[Compound 2-29]
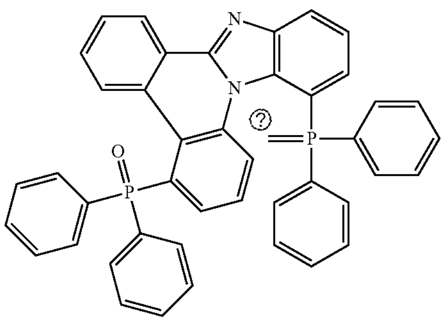
[Compound 2-30]
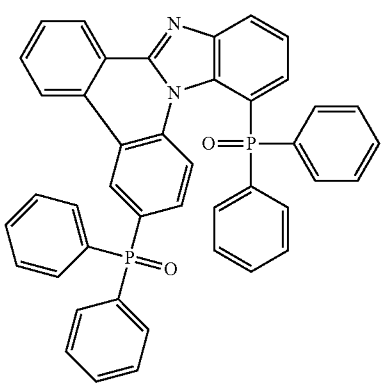
[Compound 2-31]
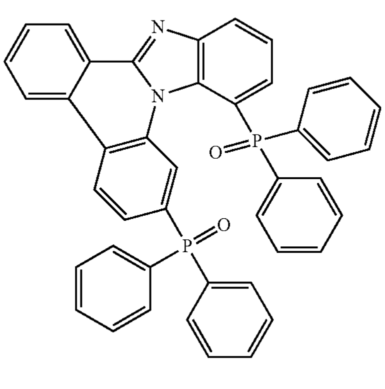
-continued
[Compound 2-32]
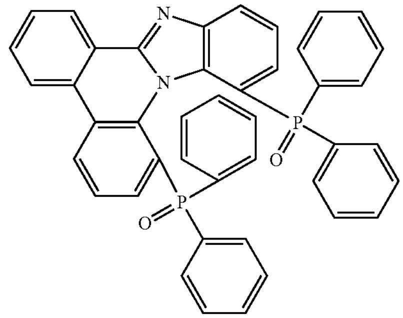
[Compound 2-33]
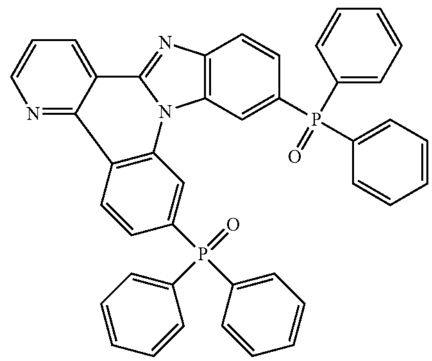
[Compound 2-34]
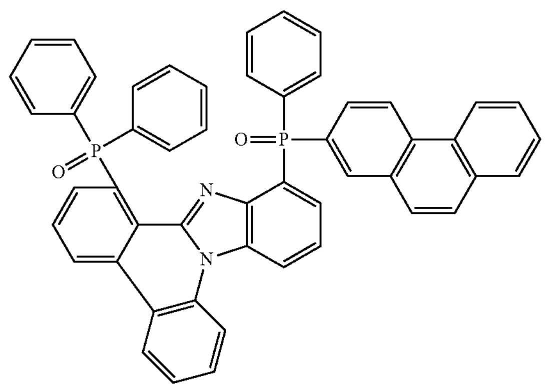
[Compound 2-35]
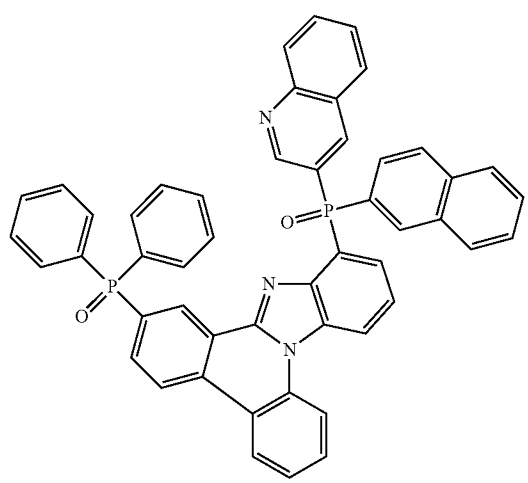

[Compound 2-36]
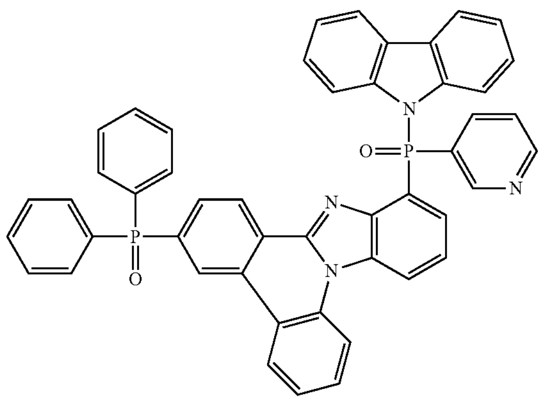
[Compound 2-37]
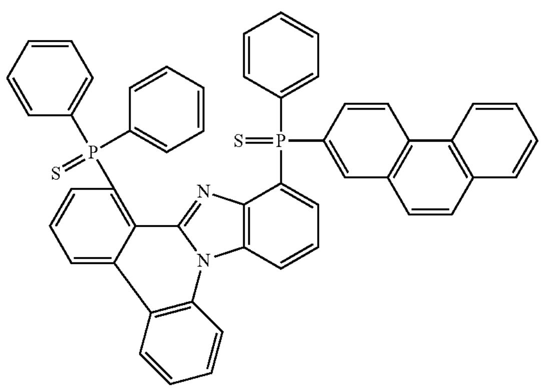
[Compound 2-38]
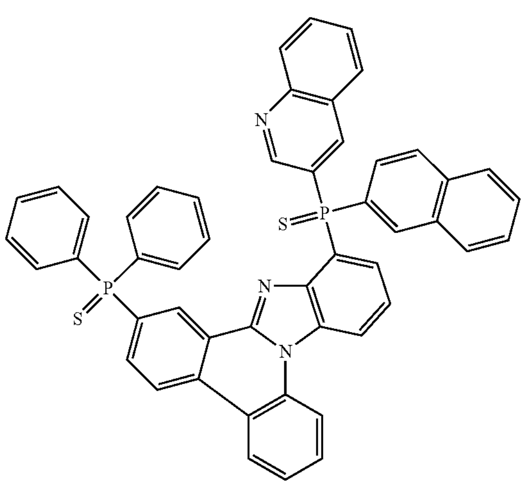
[Compound 2-39]
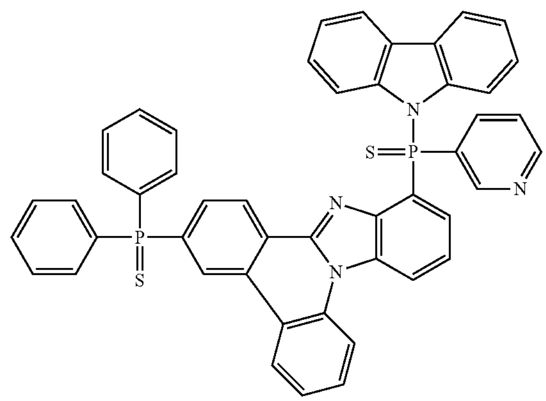
[Compound 2-40]
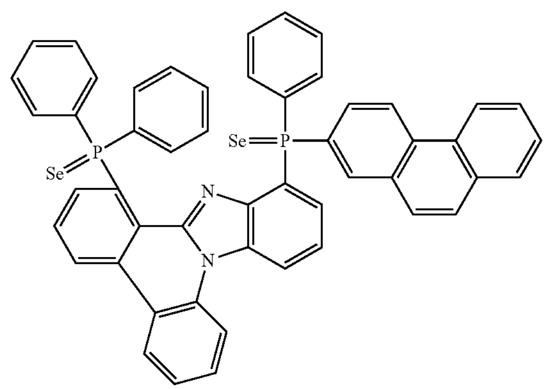
[Compound 2-41]
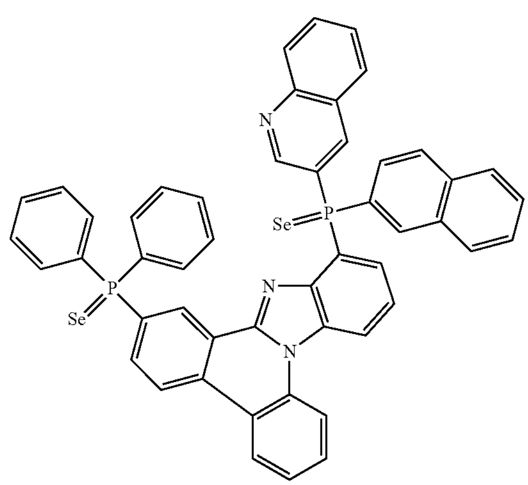

-continued
[Compound 2-42]
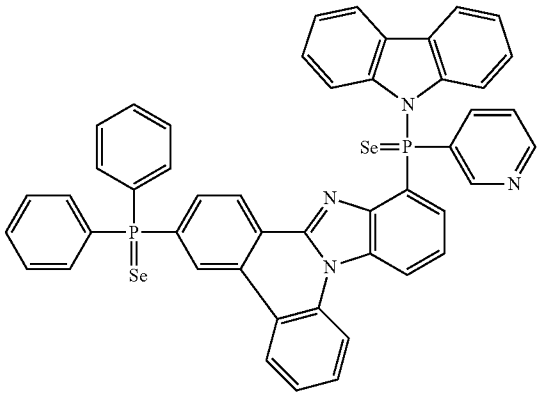
[Compound 2-43]
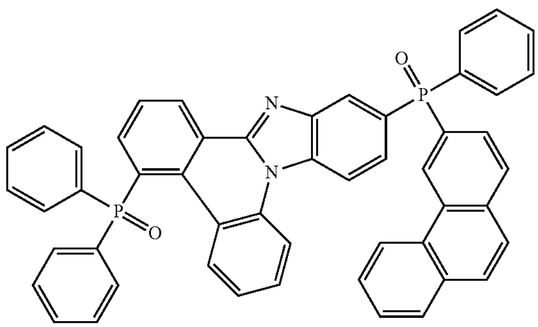
[Compound 2-44]
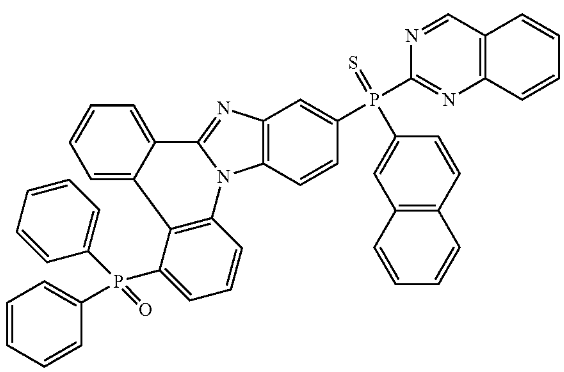
[Compound 2-45]
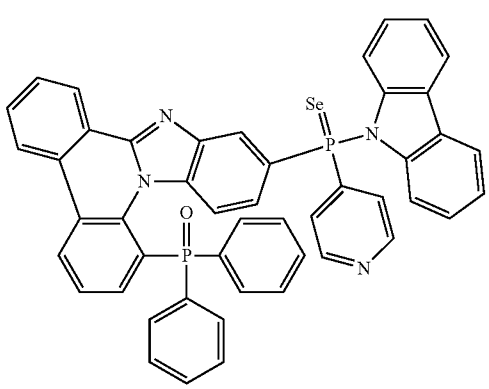
-continued
[Compound 2-46]
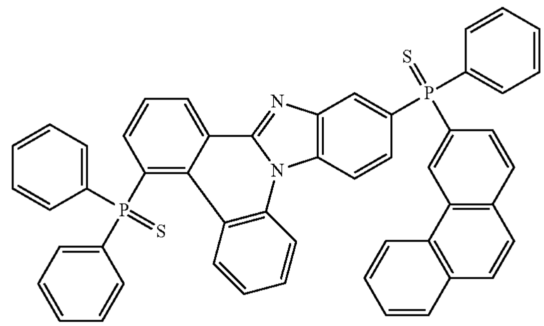
[Compound 2-47]
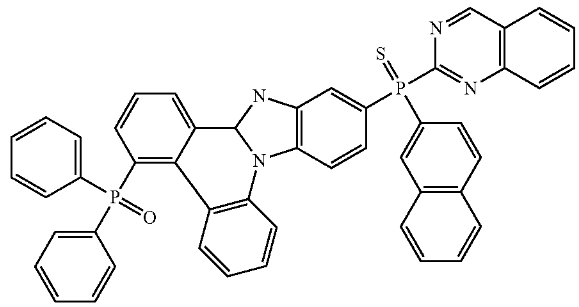
[Compound 2-48]
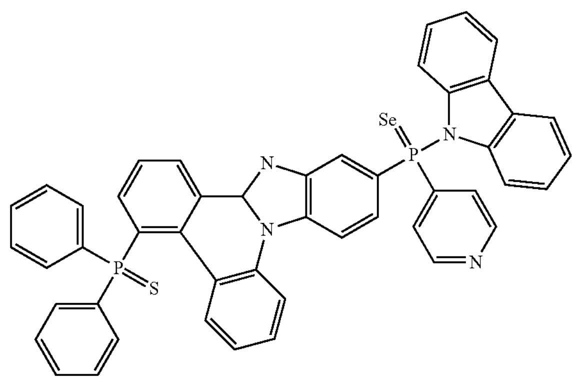
[Compound 2-49]
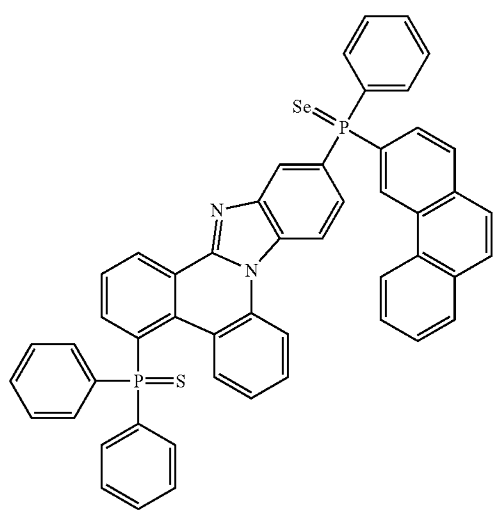

-continued
[Compound 2-50]
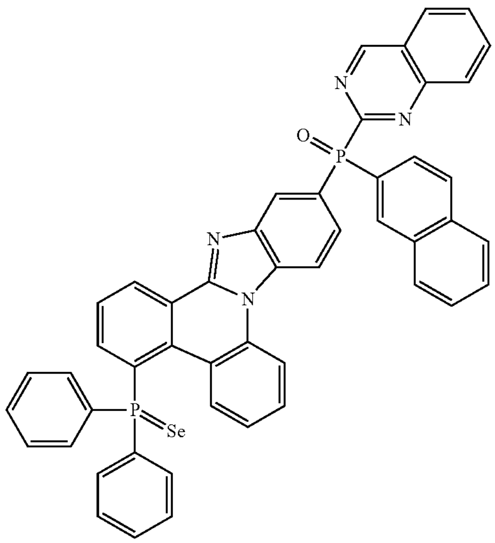
[Compound 2-51]
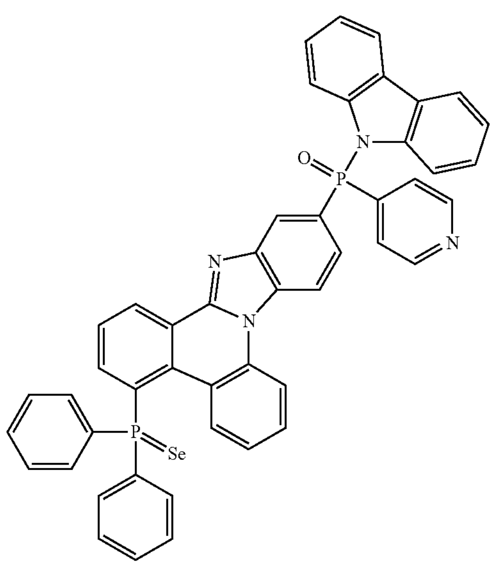
According to an exemplary embodiment of the present invention, the compound of Chemical Formula 1 may be any one selected from the following Compounds 3-1 to 3-15. However, the compound of Chemical Formula 1 is not limited to the following compounds.
[Compound 3-1]
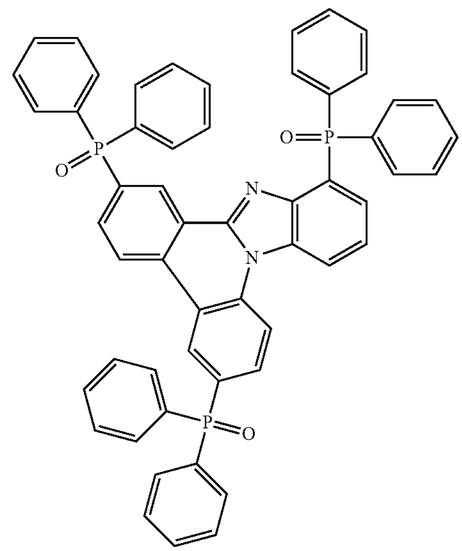
[Compound 3-2]
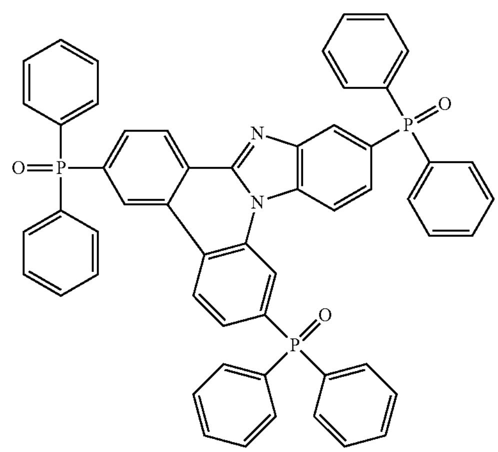
[Compound 3-3]
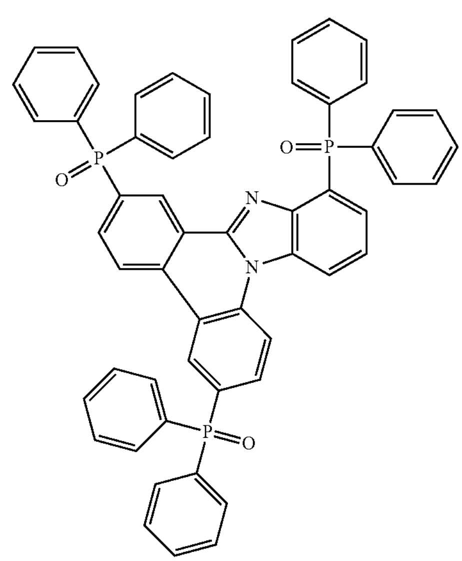

-continued
[Compound 3-4]
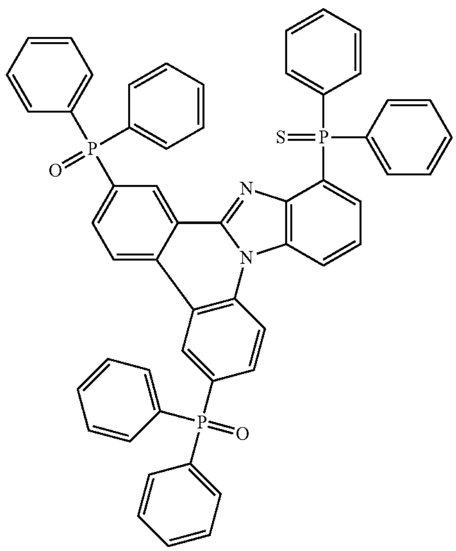
[Compound 3-5]
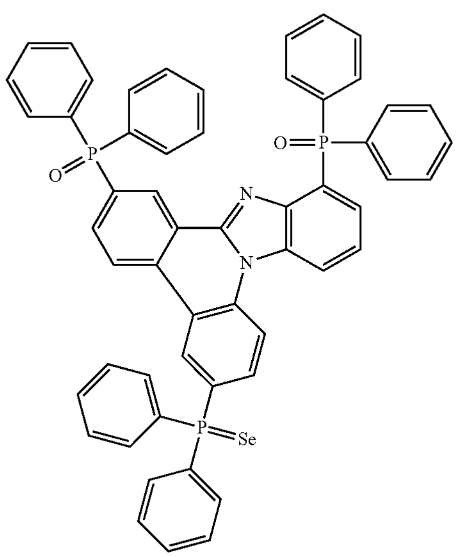
[Compound 3-6]
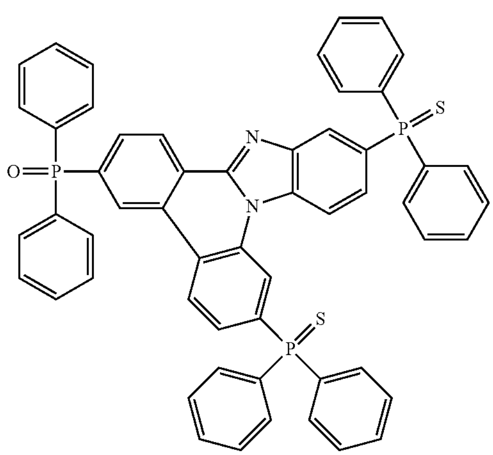
-continued
[Compound 3-7]
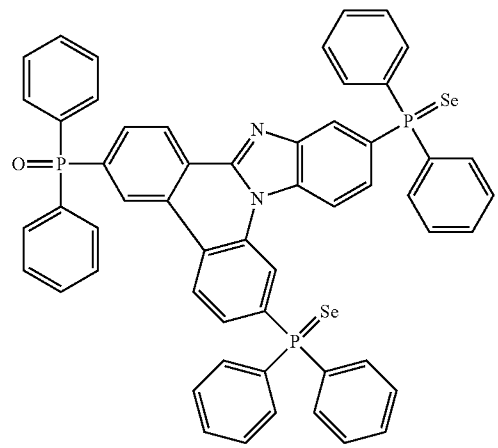
[Compound 3-8]
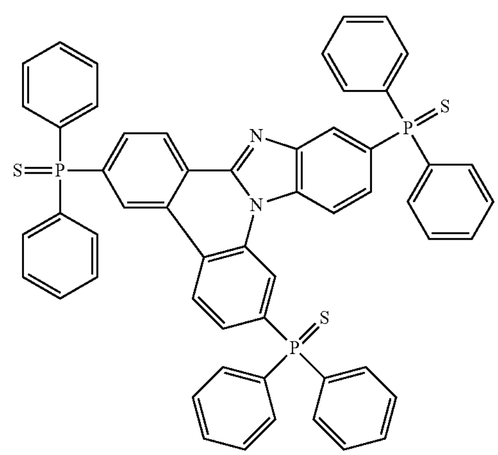
[Compound 3-9]
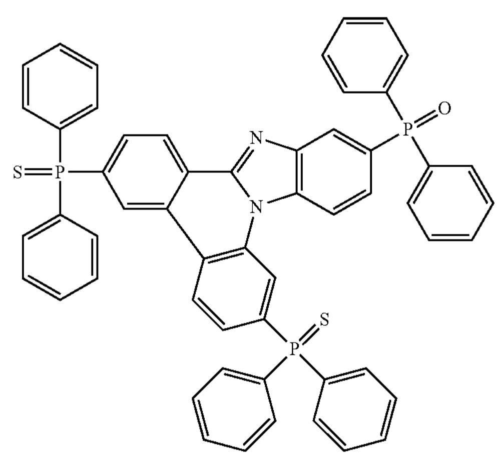

-continued
[Compound 3-10]
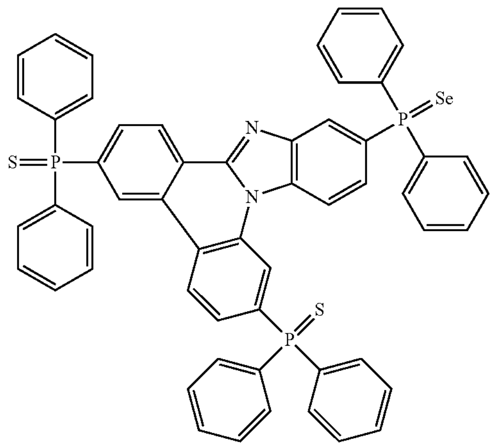
[Compound 3-11]
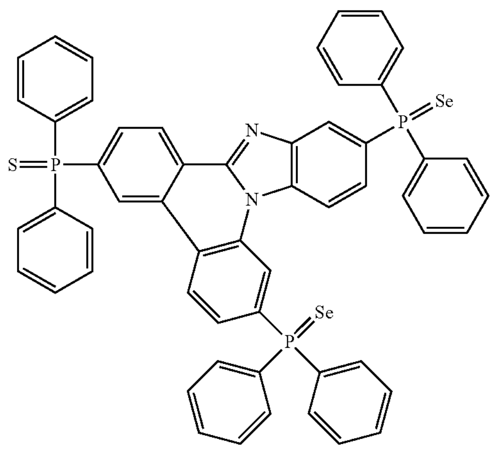
[Compound 3-12]
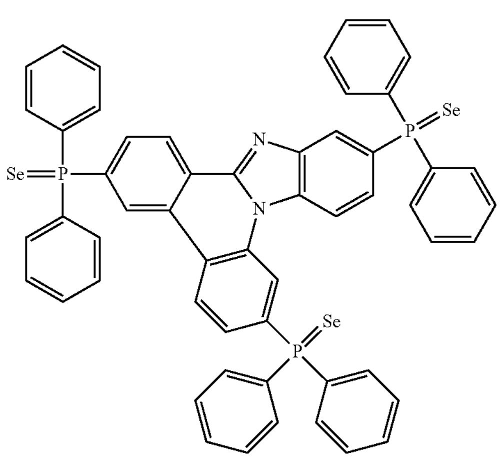
-continued
[Compound 3-13]
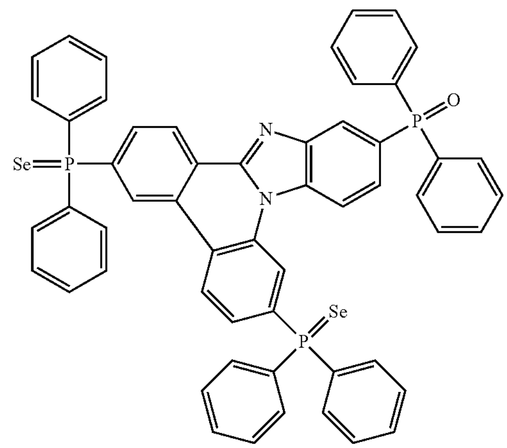
[Compound 3-14]
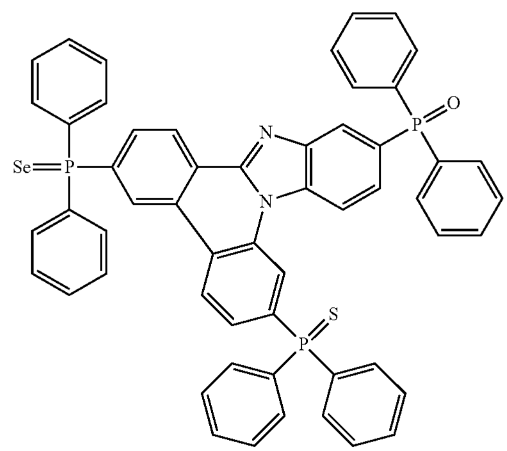
[Compound 3-15]
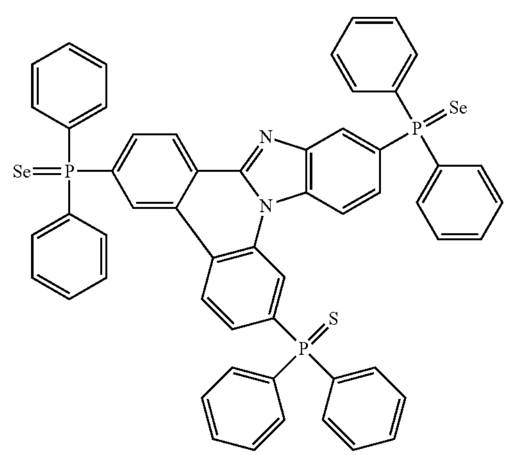
According to an exemplary embodiment of the present invention, the compound of Chemical Formula 1 may be any one selected from the following Compounds 4-1 to 4-42. However, the compound of Chemical Formula 1 is not limited to the following compounds.

-continued
[Compound 4-1]
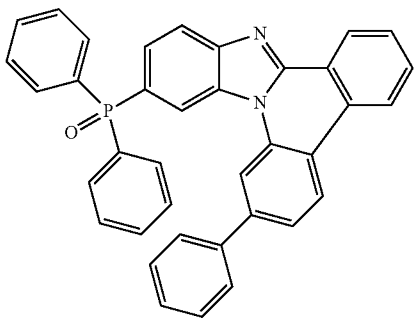
[Compound 4-2]
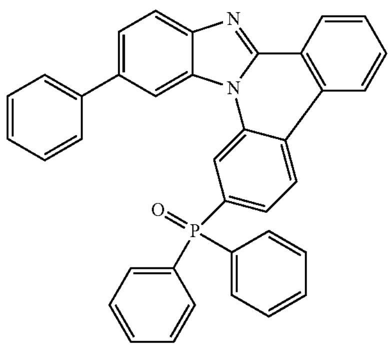
[Compound 4-3]
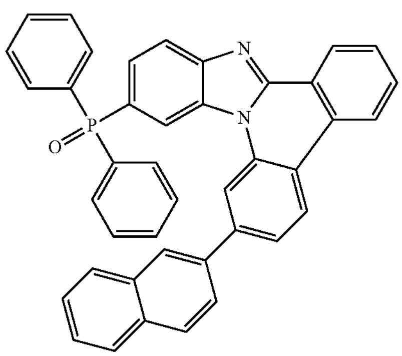
[Compound 4-4]
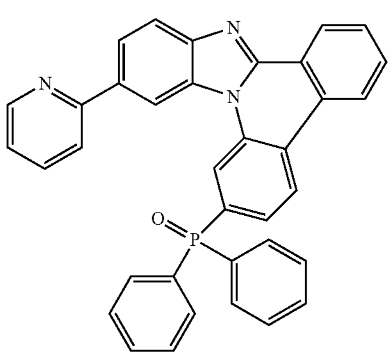
[Compound 4-5]
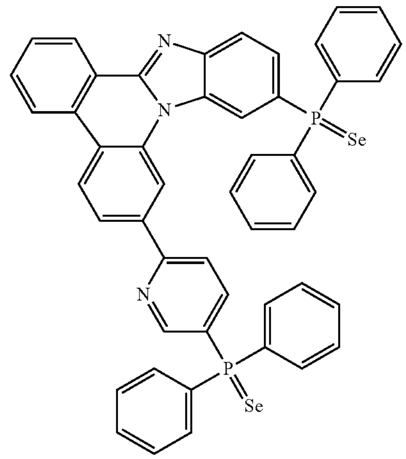
[Compound 4-6]
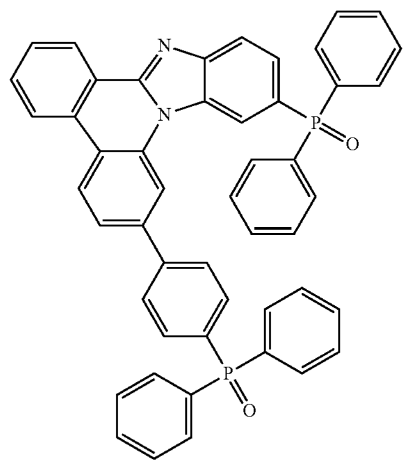
[Compound 4-7]
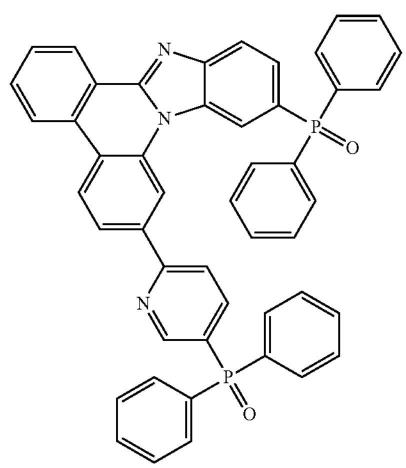

[Compound 4-8]
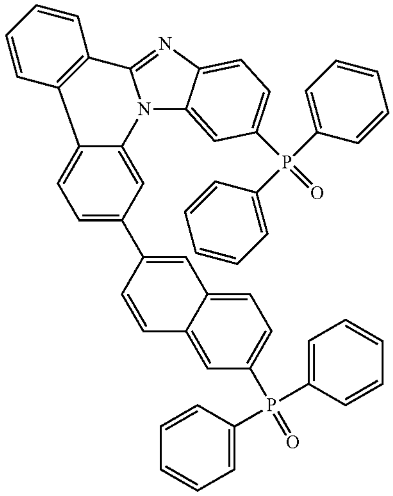
[Compound 4-9]
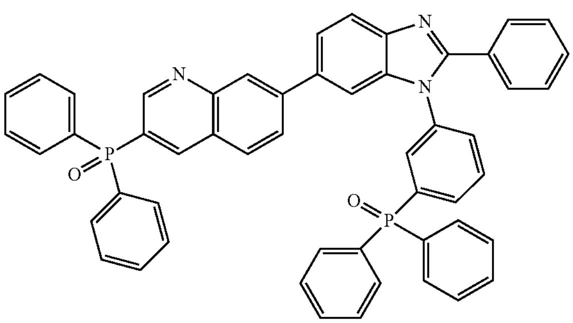
[Compound 4-10]
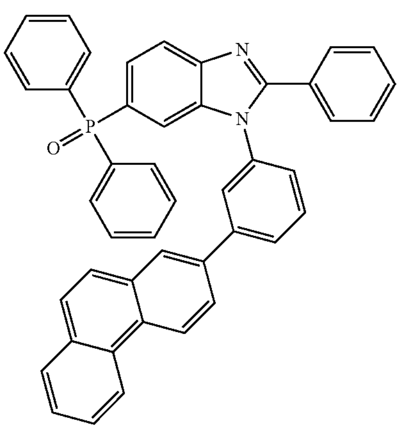
[Compound 4-11]
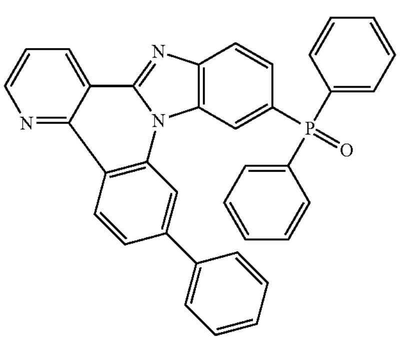
[Compound 4-12]
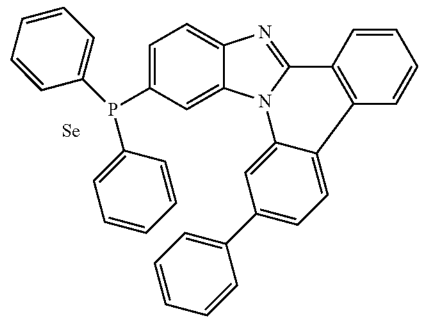
[Compound 4-13]
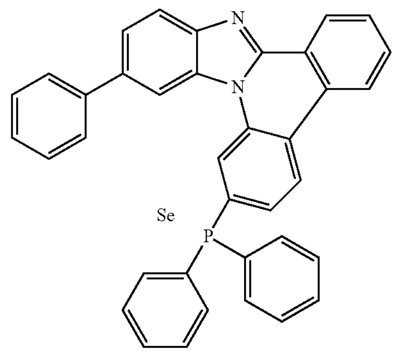
[Compound 4-14]
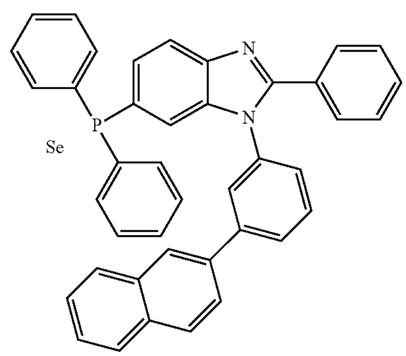
[Compound 4-15]
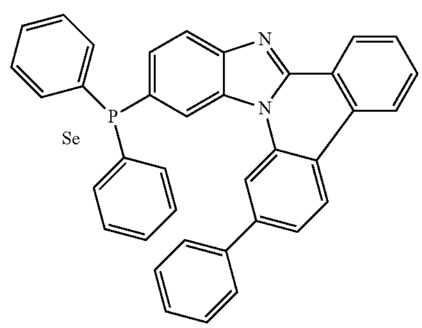

-continued
[Compound 4-16]
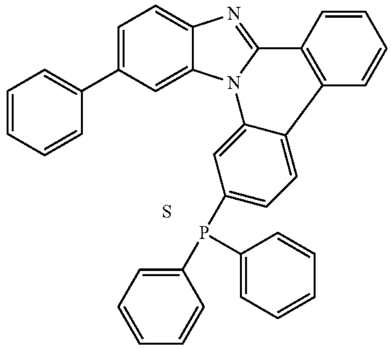
[Compound 4-17]
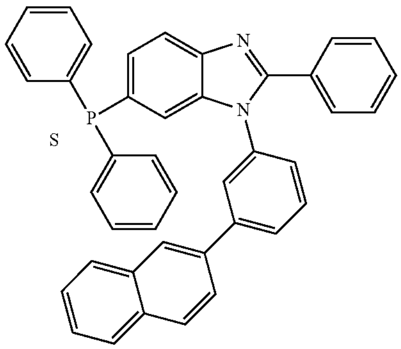
[Compound 4-18]
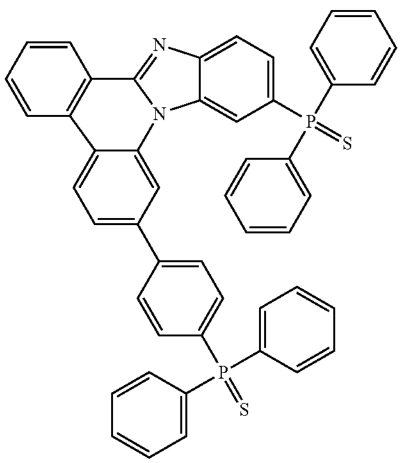
[Compound 4-19]
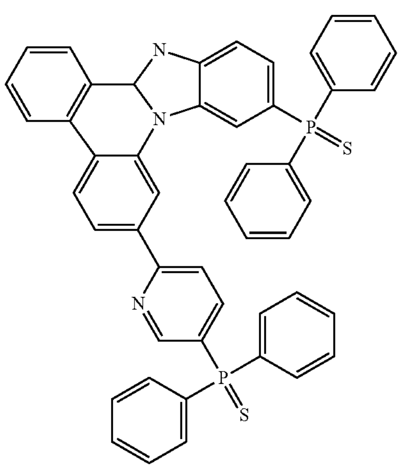
-continued
[Compound 4-20]
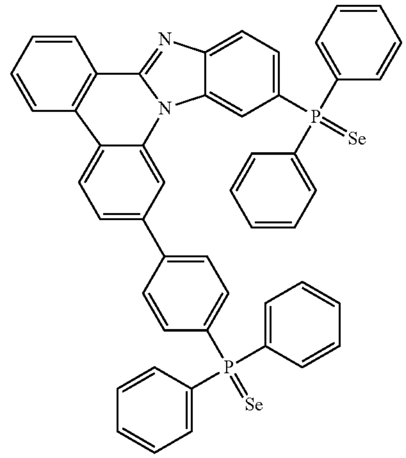
[Compound 4-21]
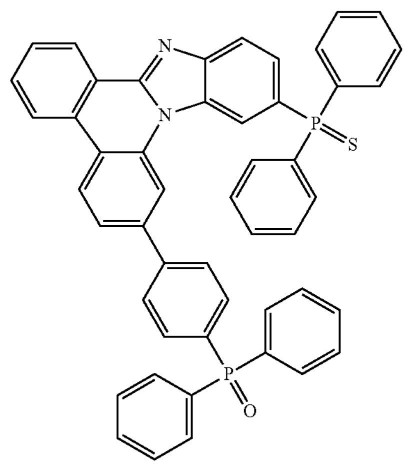
[Compound 4-22]
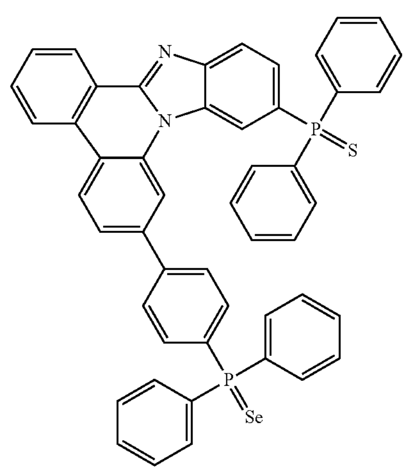

-continued
[Compound 4-23]
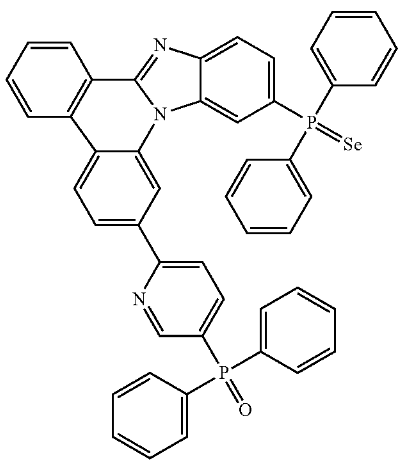
[Compound 4-24]
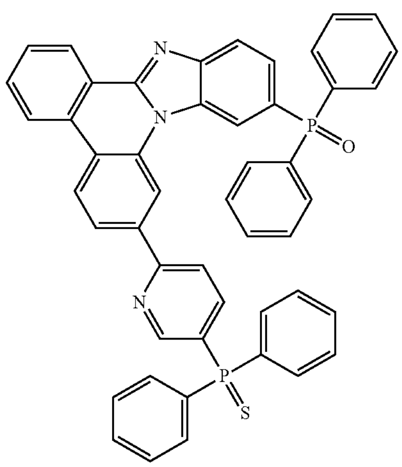
[Compound 4-25]
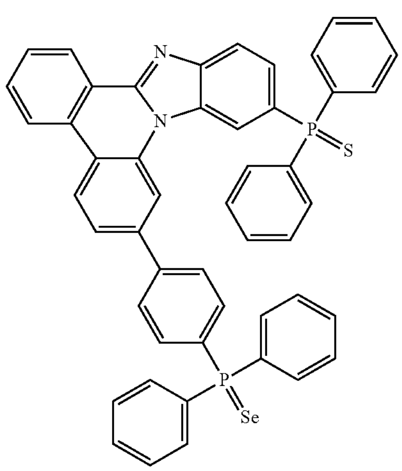
-continued
[Compound 4-26]
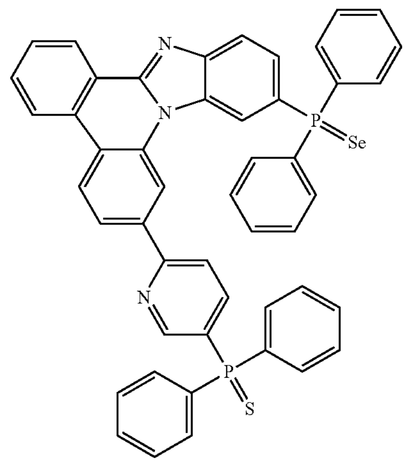
[Compound 4-27]
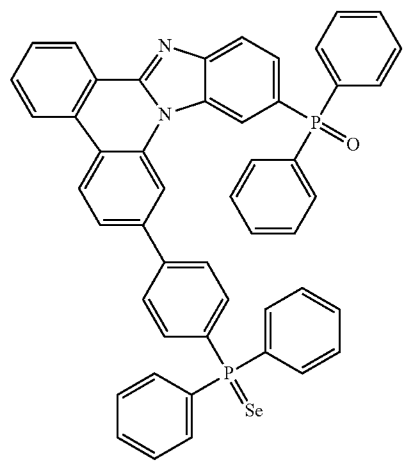
[Compound 4-28]
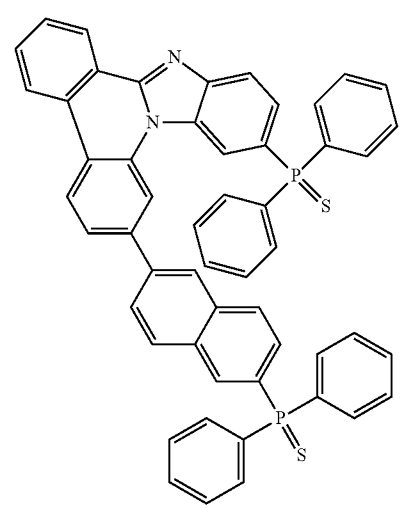

-continued
[Compound 4-29]
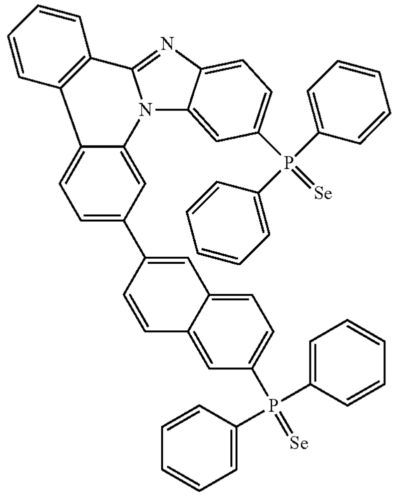
[Compound 4-30]
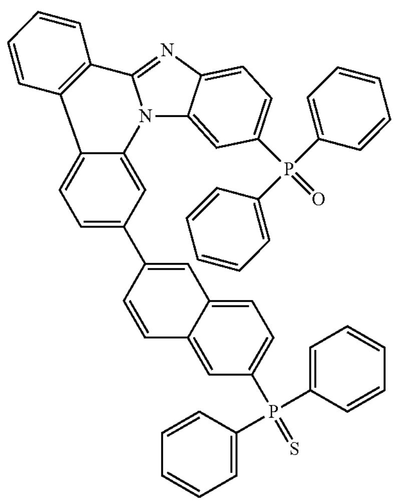
[Compound 4-31]
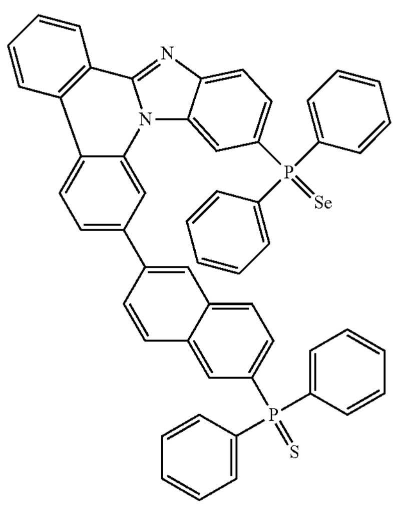
-continued
[Compound 4-32]
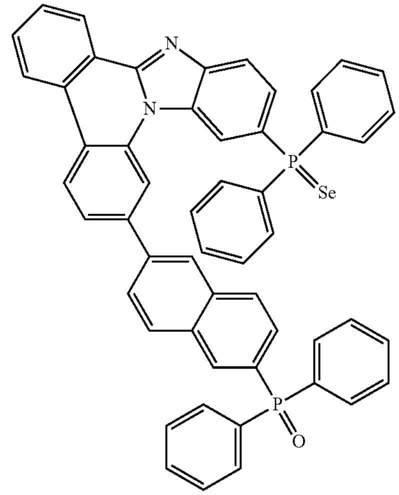
[Compound 4-33]
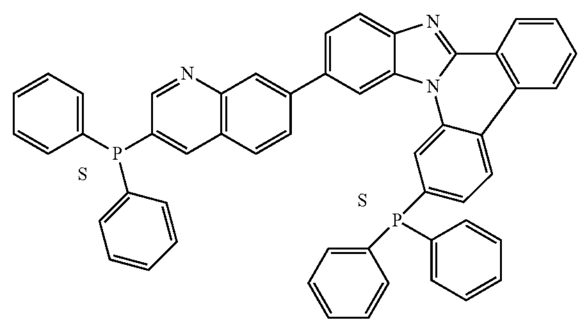
[Compound 4-34]
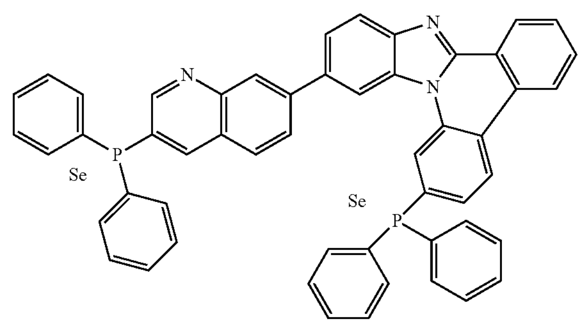
[Compound 4-35]
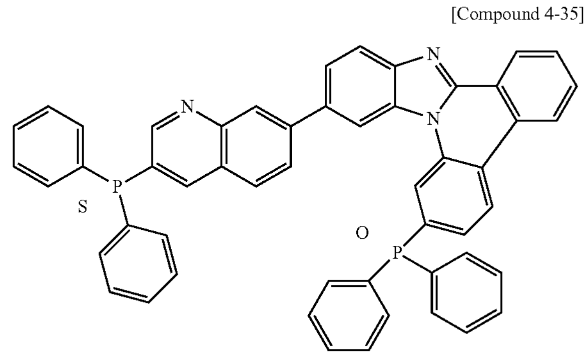

-continued
[Compound 4-36]
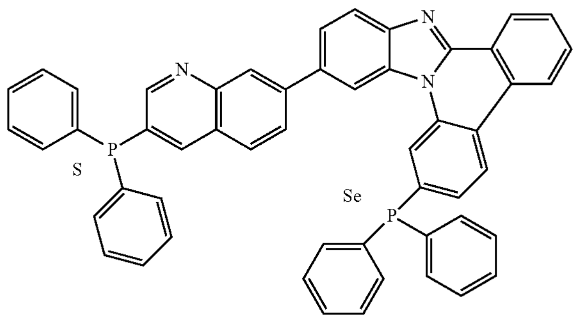
[Compound 4-37]
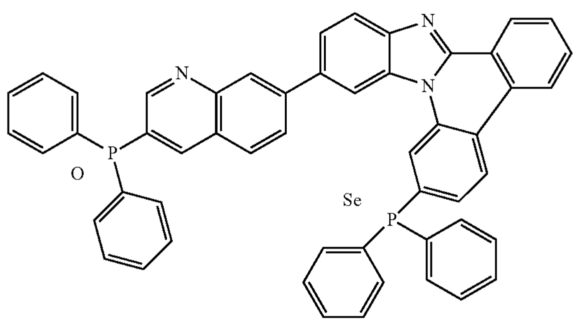
[Compound 4-38]
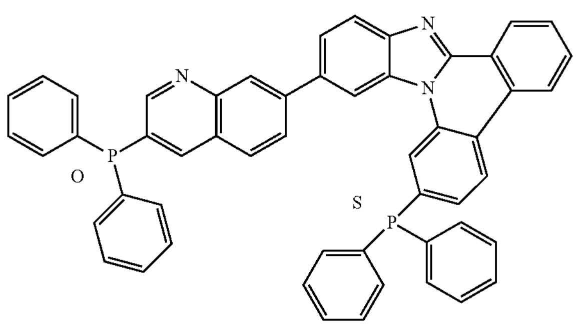
[Compound 4-39]
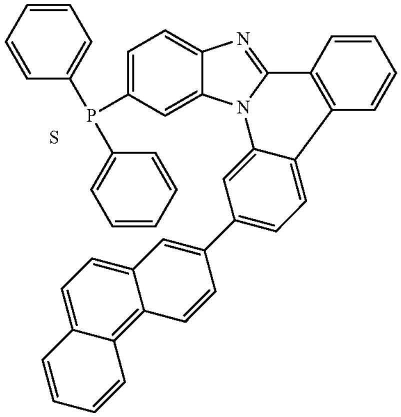
-continued
[Compound 4-40]
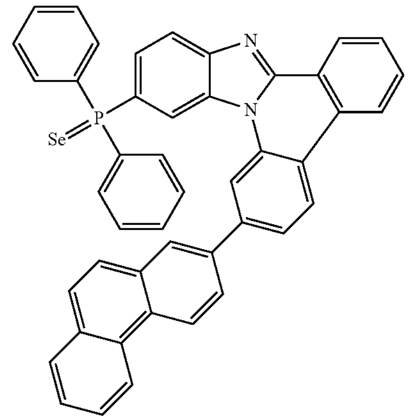
[Compound 4-41]
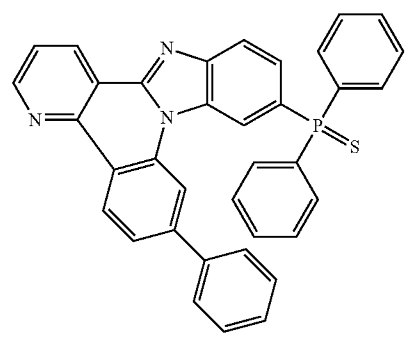
[Compound 4-42]
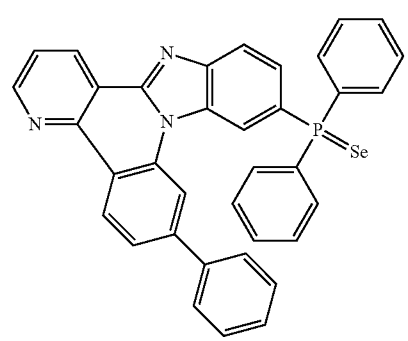
According to an exemplary embodiment of the present invention, the compound of Chemical Formula 1 may be any one selected from the following Compounds 5-1 to 5-16. However, the compound of Chemical Formula 1 is not limited to the following compounds.

-continued
[Compound 5-1]
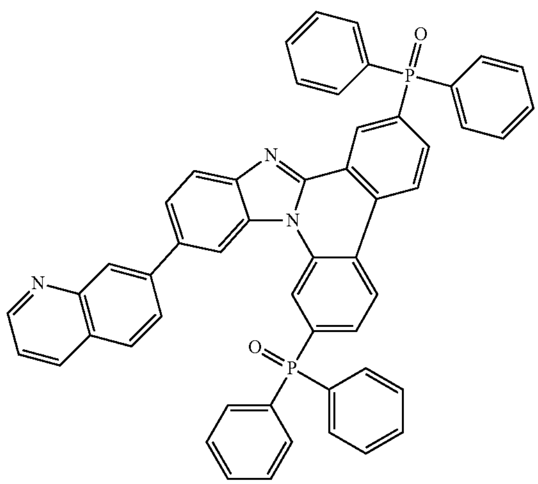
[Compound 5-2]
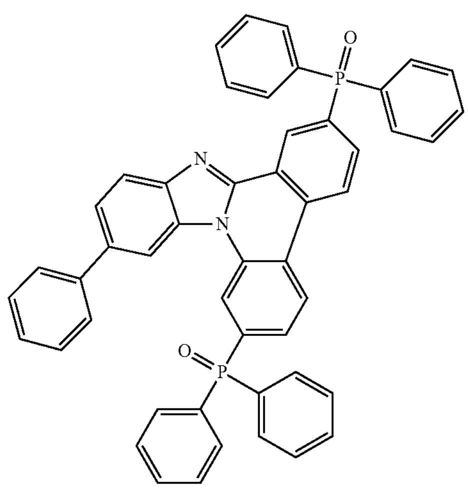
[Compound 5-3]
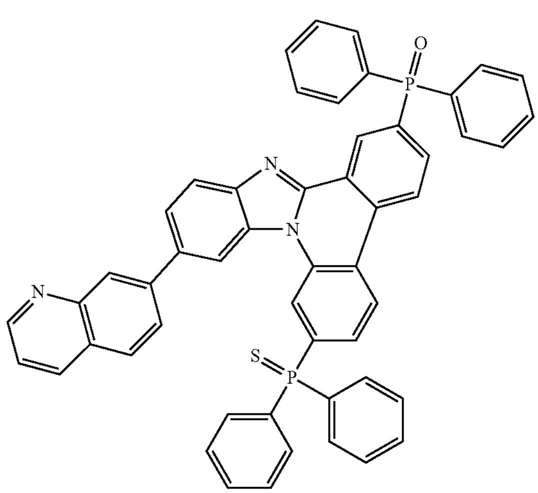
[Compound 5-4]
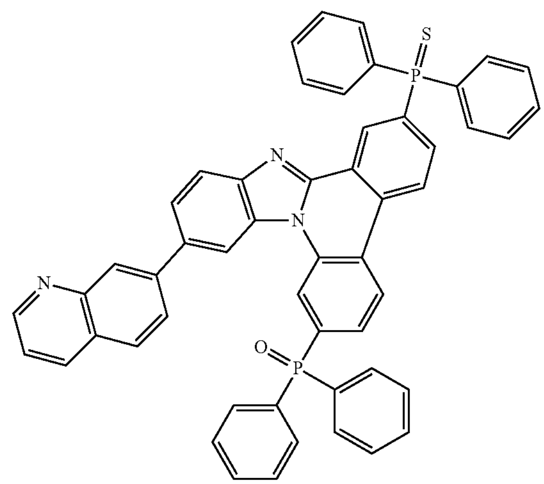
[Compound 5-5]
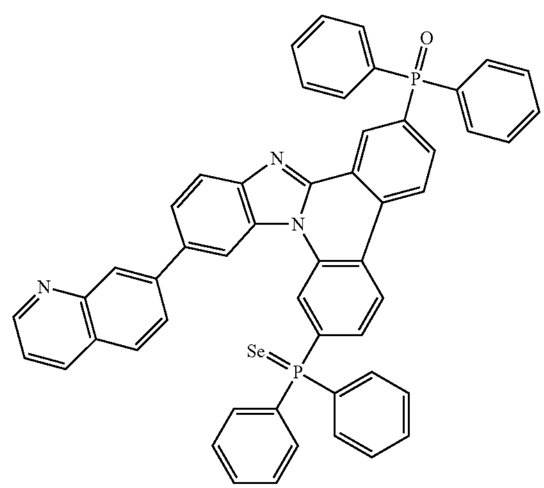
[Compound 5-6]
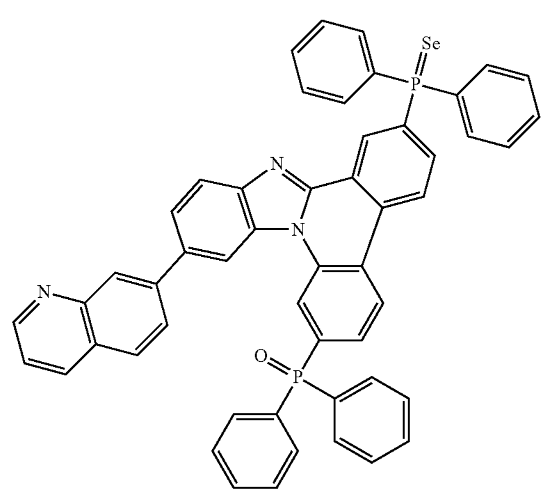

-continued
[Compound 5-7]
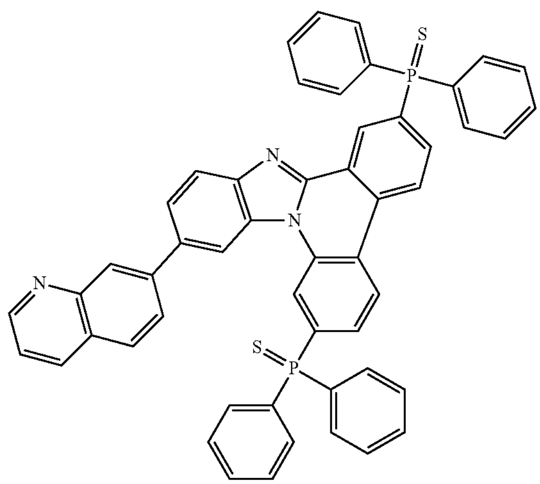
[Compound 5-8]
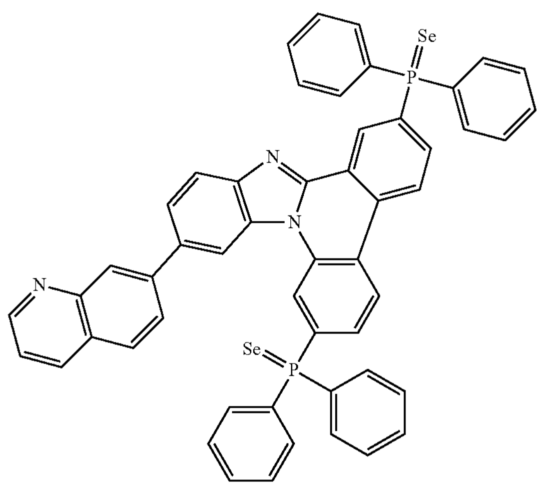
[Compound 5-9]
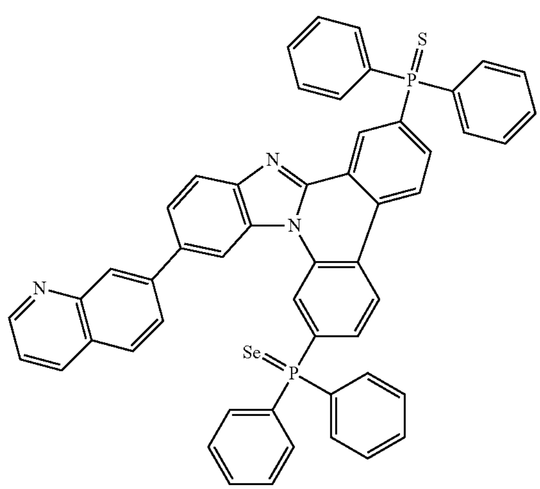
-continued
[Compound 5-10]
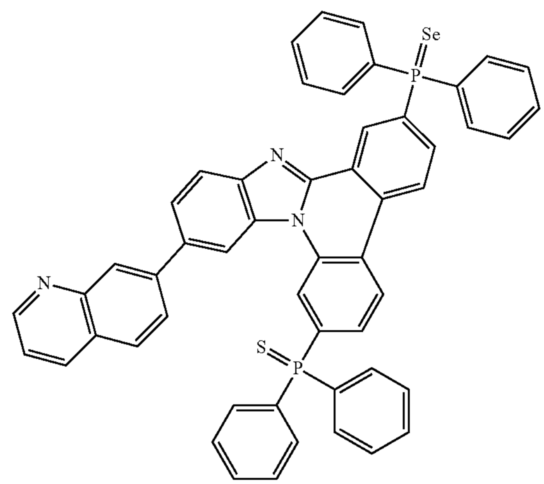
[Compound 5-11]
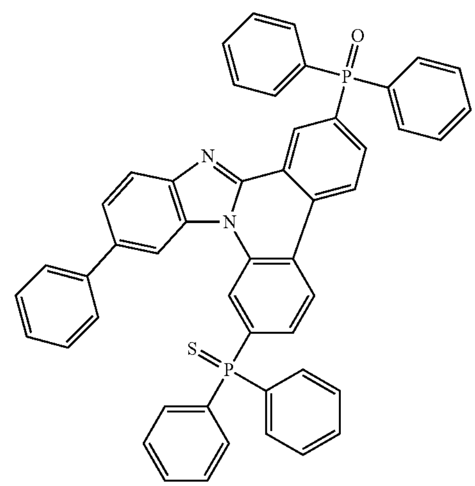
[Compound 5-12]
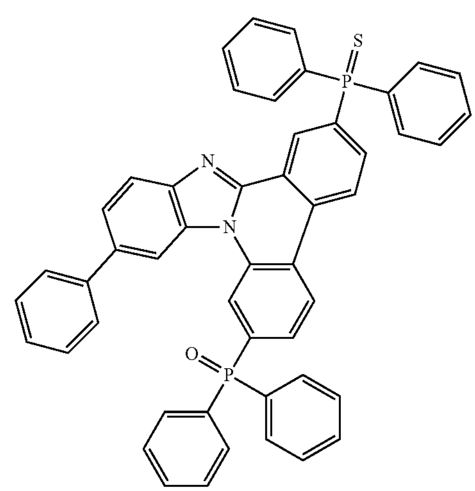

-continued
[Compound 5-13]
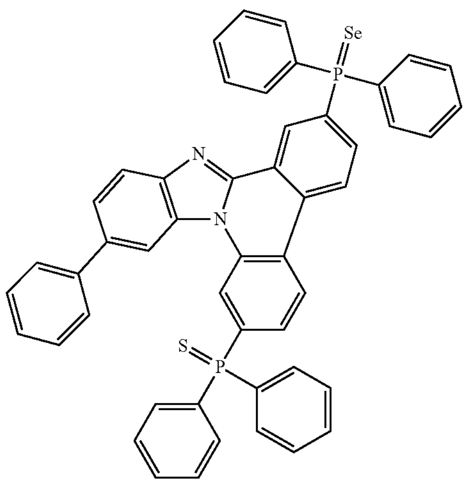
[Compound 5-14]
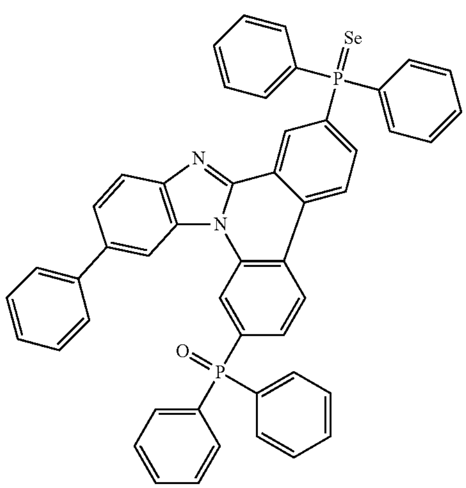
[Compound 5-15]
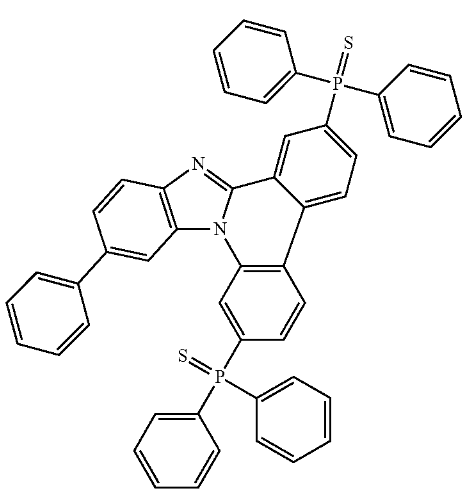
-continued
[Compound 5-16]
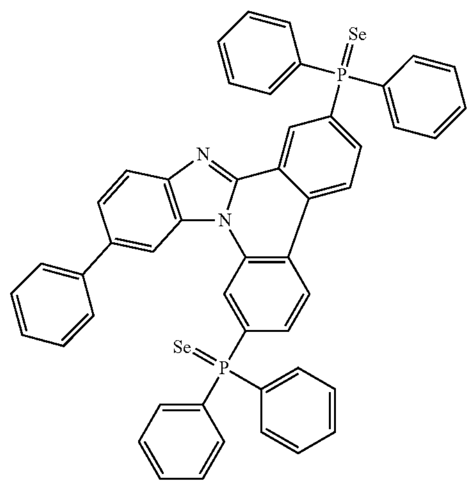
According to an exemplary embodiment of the present invention, the compound of Chemical Formula 1 may be any one selected from the following Compounds 6-1 to 6-53. However, the compound of Chemical Formula 1 is not limited to the following compounds.
[Compound 6-1]
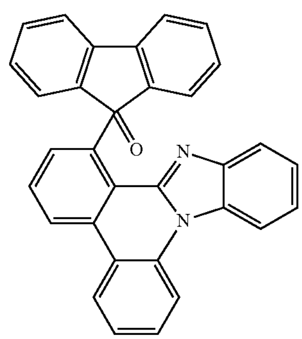
[Compound 6-2]
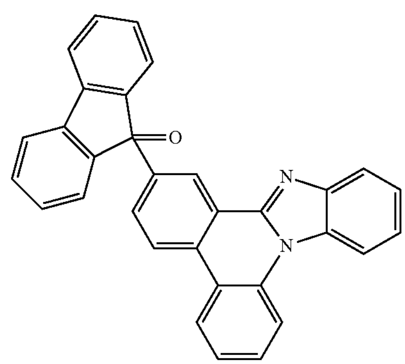
[Compound 6-3]
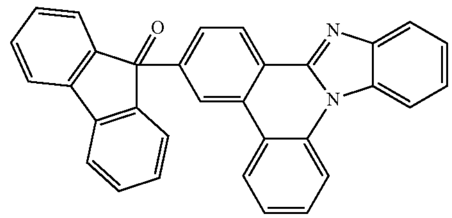

-continued
[Compound 6-4]
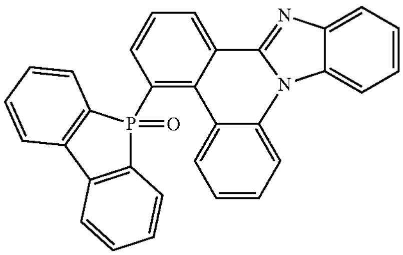
[Compound 6-5]
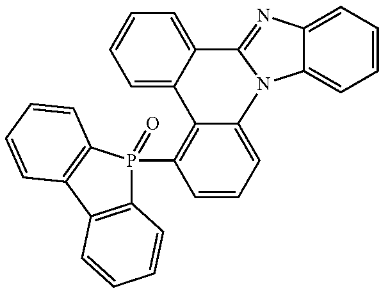
[Compound 6-6]
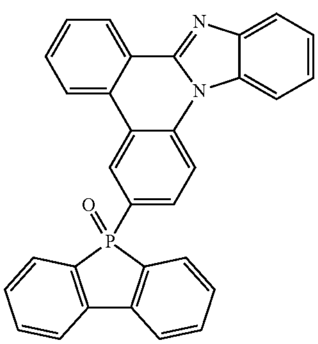
[Compound 6-7]
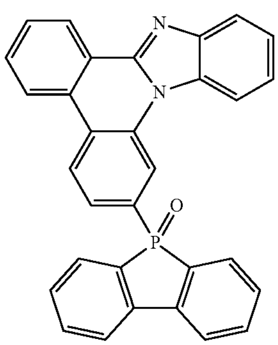
[Compound 6-8]
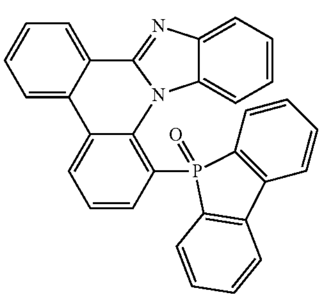
-continued
[Compound 6-9]
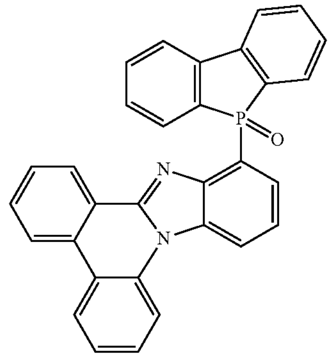
[Compound 6-10]
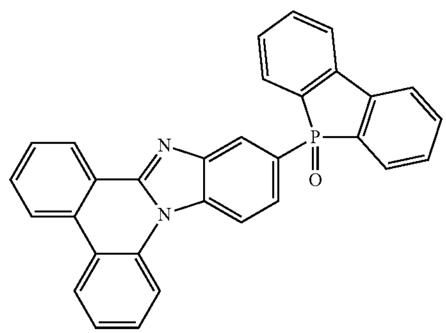
[Compound 6-11]
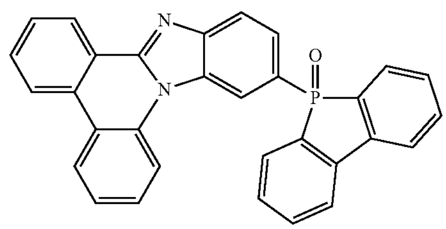
[Compound 6-12]
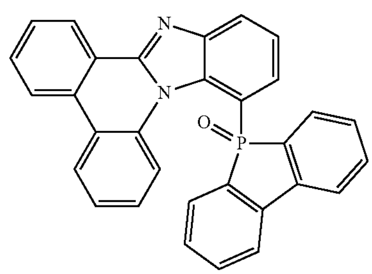
[Compound 6-13]
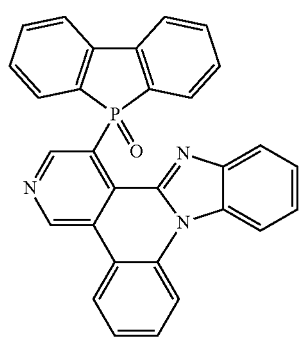

[Compound 6-14]
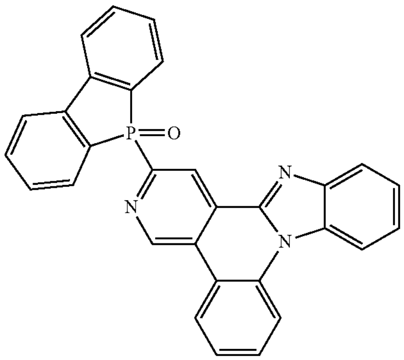
[Compound 6-15]
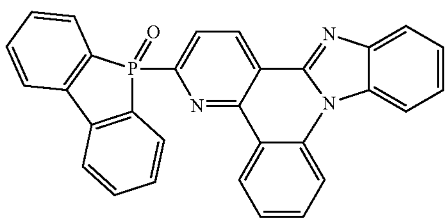
[Compound 6-16]
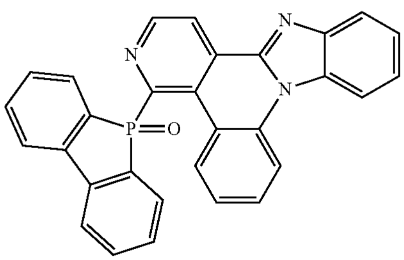
[Compound 6-17]
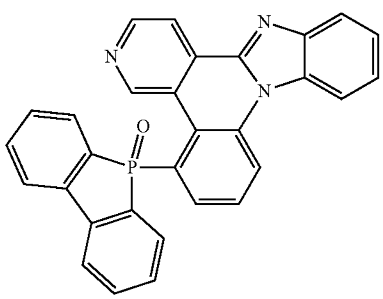
[Compound 6-18]
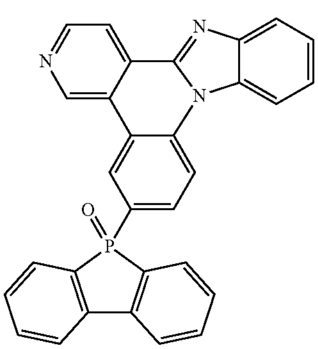
[Compound 6-19]
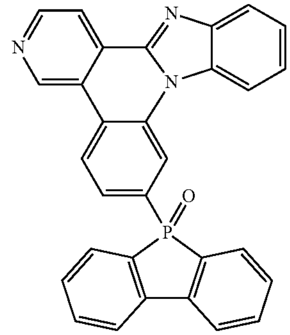
[Compound 6-20]
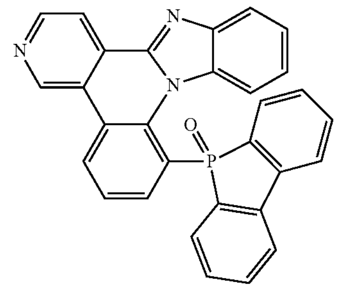
[Compound 6-21]
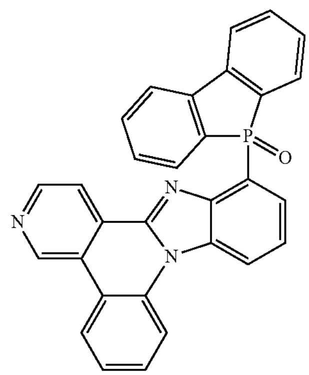
[Compound 6-22]
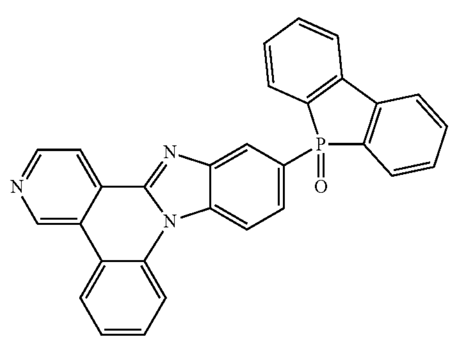
[Compound 6-23]
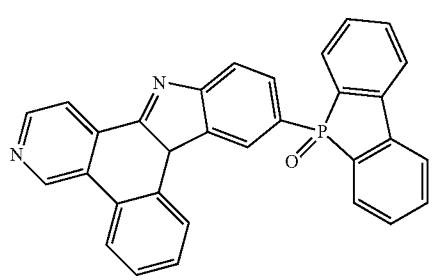

[Compound 6-24]
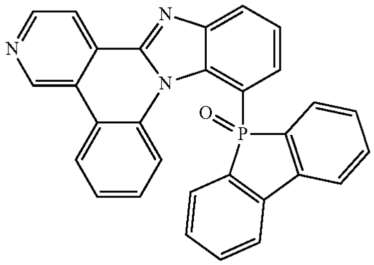
[Compound 6-25]
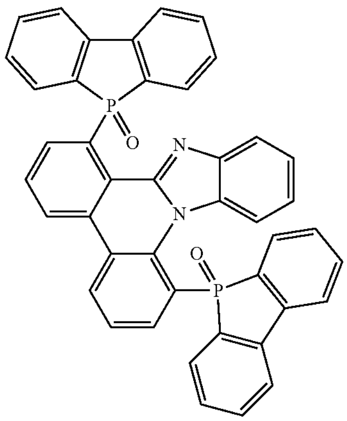
[Compound 6-26]
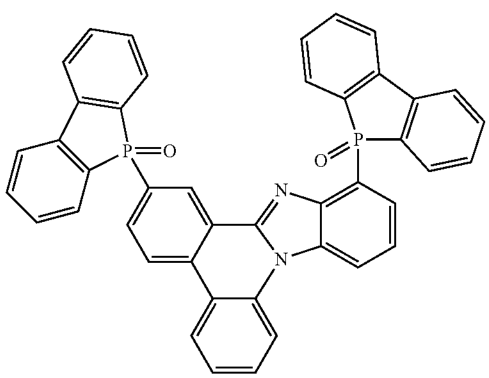
[Compound 6-27]
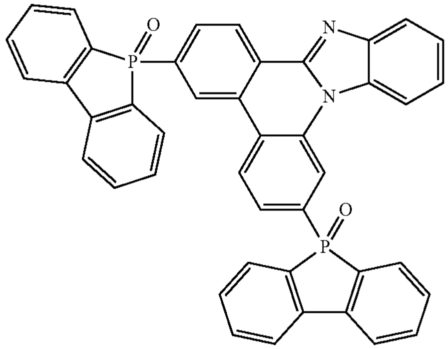
[Compound 6-28]
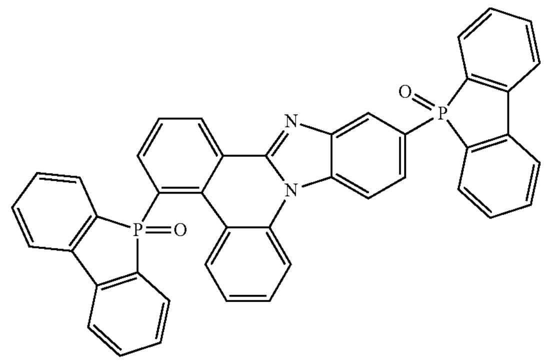
[Compound 6-29]
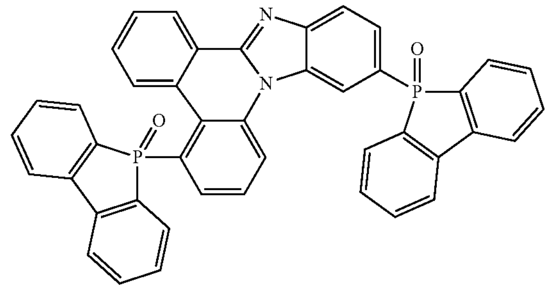
[Compound 6-30]
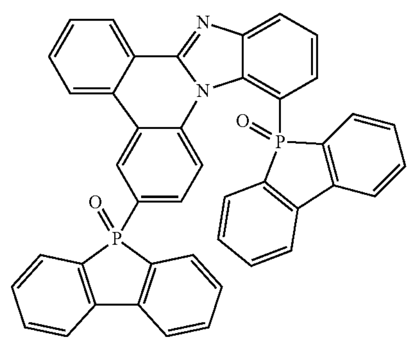
[Compound 6-31]
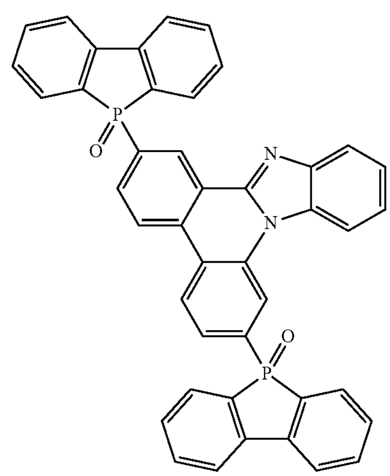

-continued
[Compound 6-32]
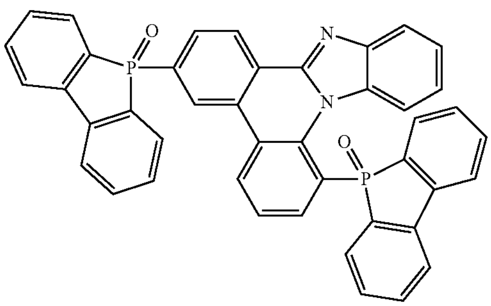
[Compound 6-33]
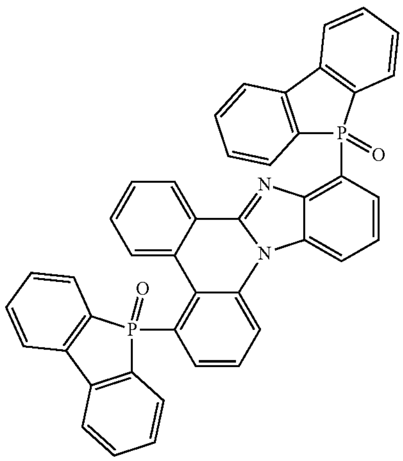
[Compound 6-34]
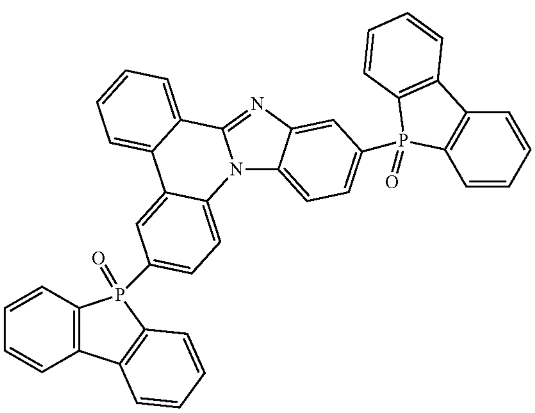
[Compound 6-35]
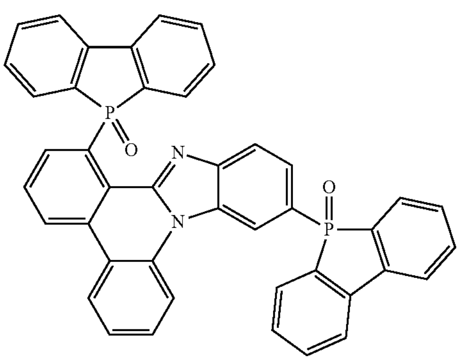
-continued
[Compound 6-36]
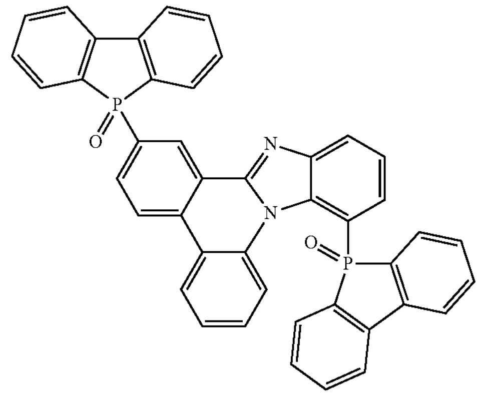
[Compound 6-37]
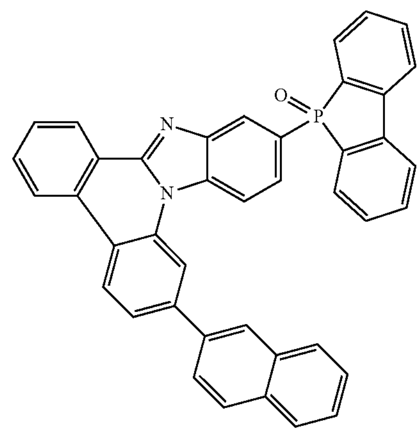
[Compound 6-38]
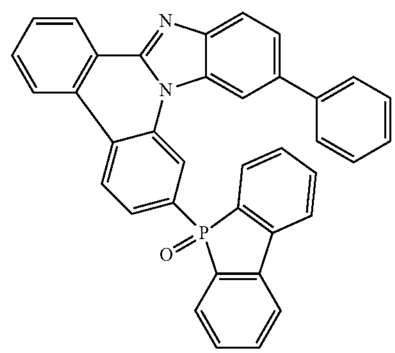
[Compound 6-39]
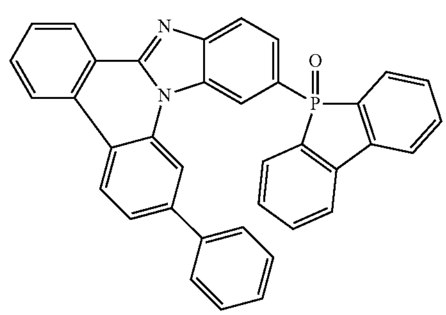

[Compound 6-40]
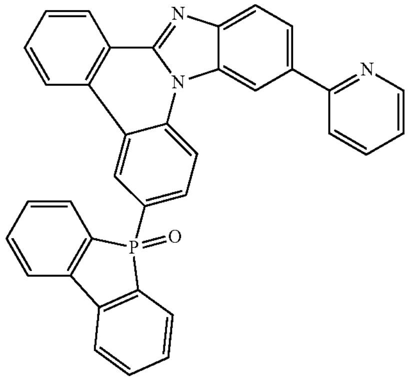
[Compound 6-41]
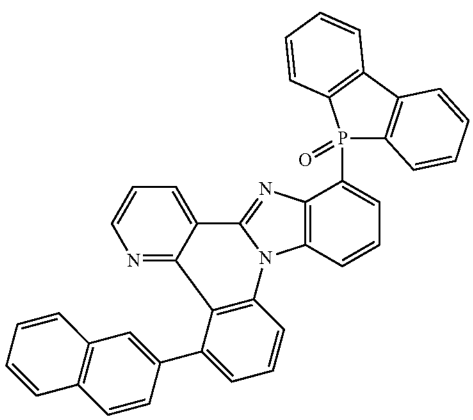
[Compound 6-42]
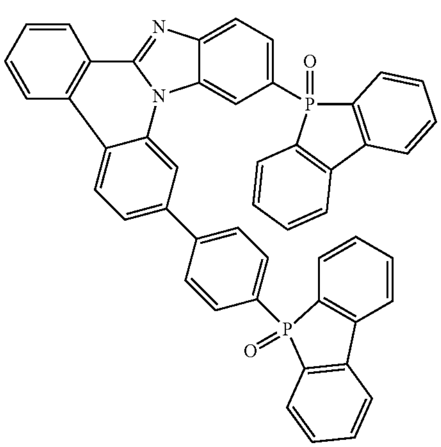
[Compound 6-43]
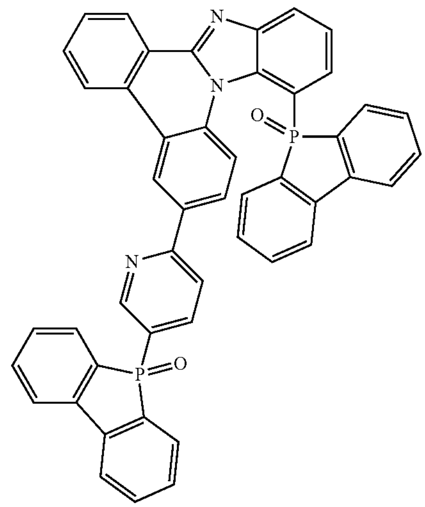
[Compound 6-44]
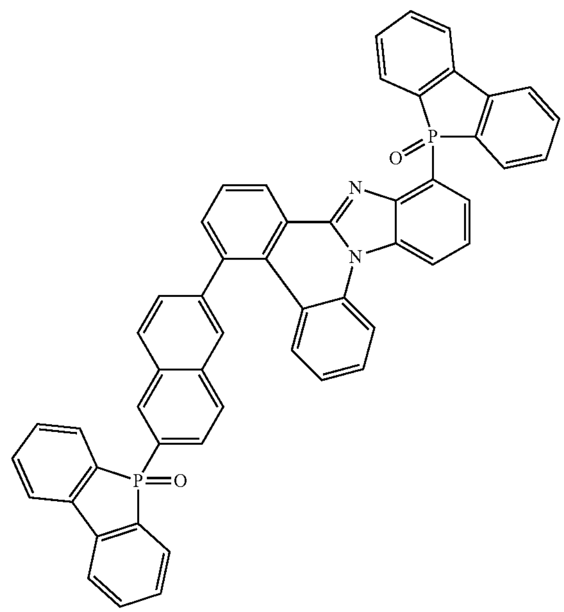
[Compound 6-45]
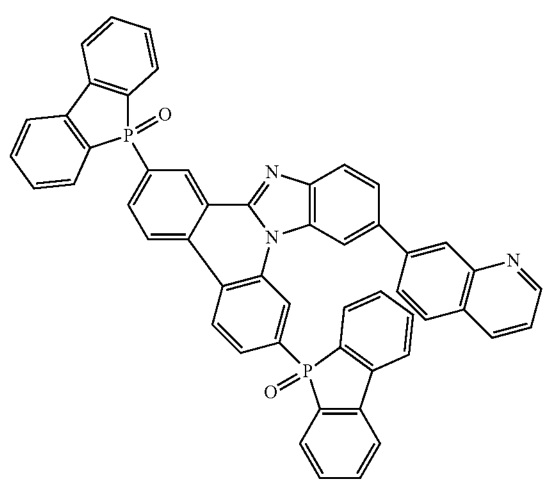

-continued
[Compound 6-46]
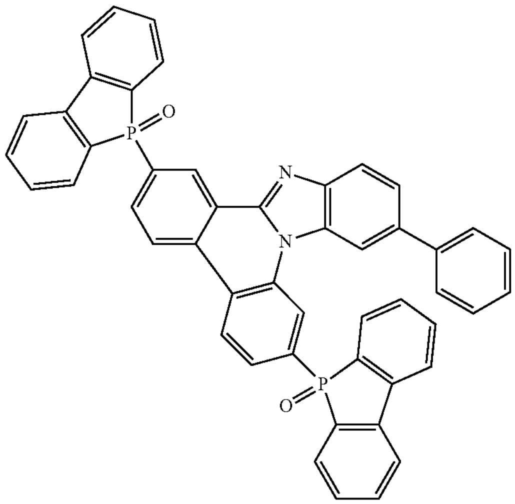
[Compound 6-47]
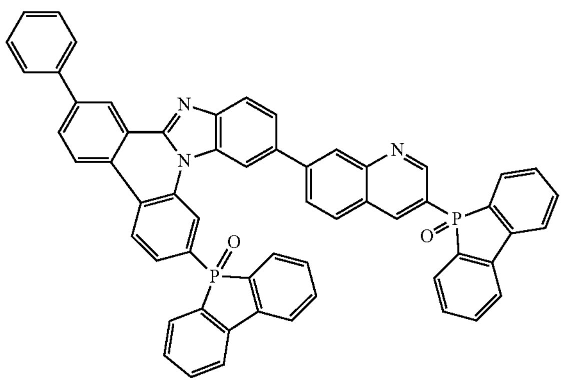
[Compound 6-48]
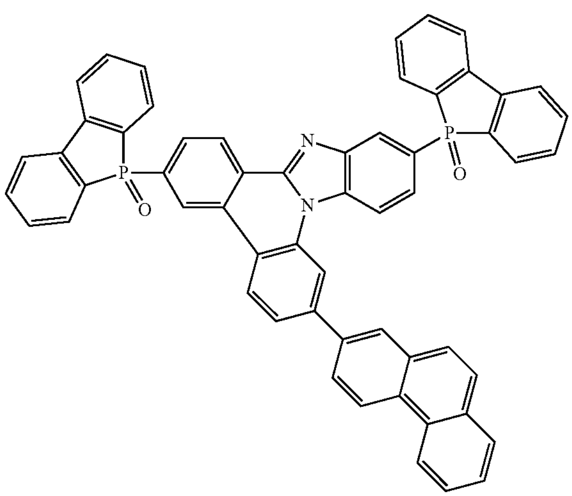
-continued
[Compound 6-49]
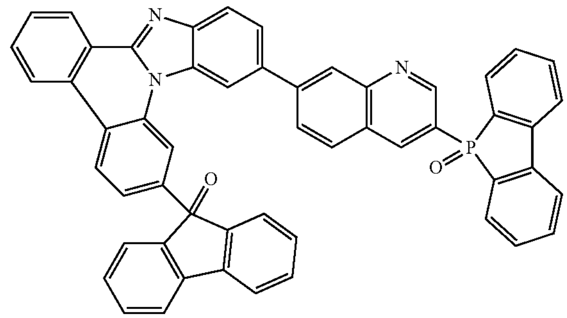
[Compound 6-50]
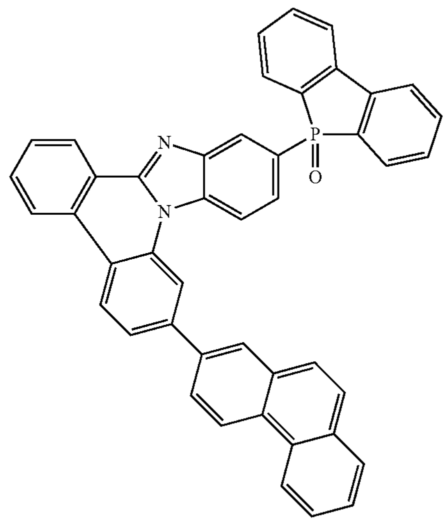
[Compound 6-51]
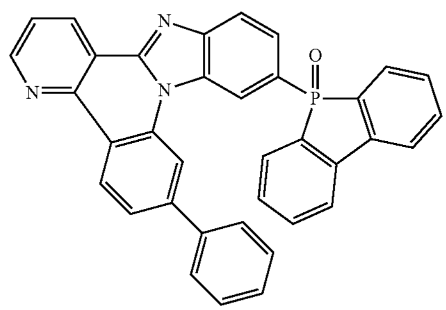
[Compound 6-52]
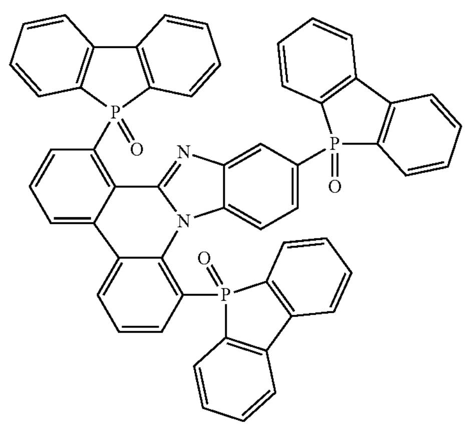

-continued
[Compound 6-53]
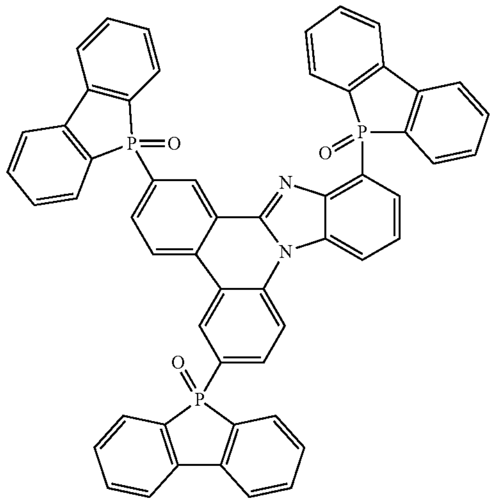
According to an exemplary embodiment of the present invention, the compound of Chemical Formula 1 may be any one selected from the following Compounds 7-1 to 7-255. However, the compound of Chemical Formula 1 is not limited to the following compounds.
[Compound 7-1]
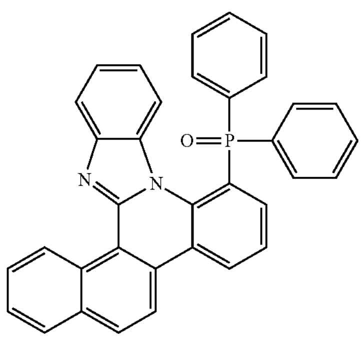
[Compound 7-2]
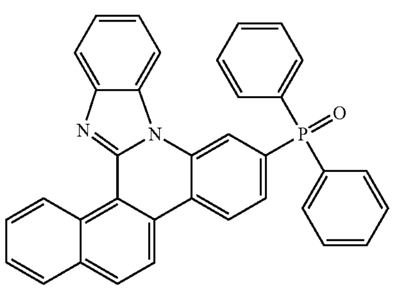
-continued
[Compound 7-3]
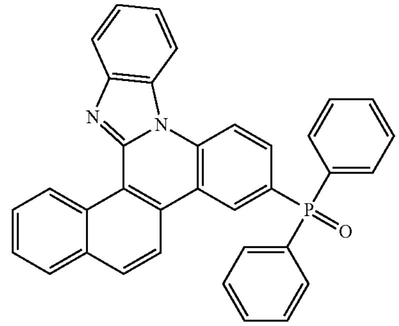
[Compound 7-4]
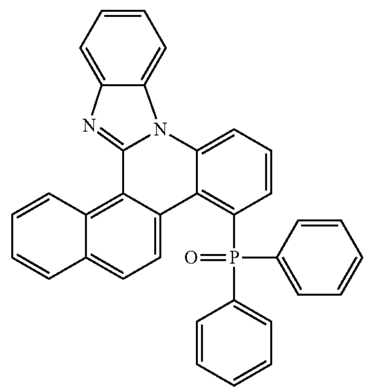
[Compound 7-5]
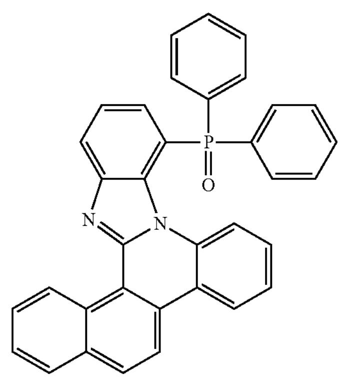
[Compound 7-6]
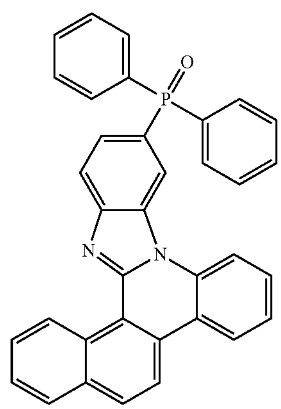

-continued
[Compound 7-7]
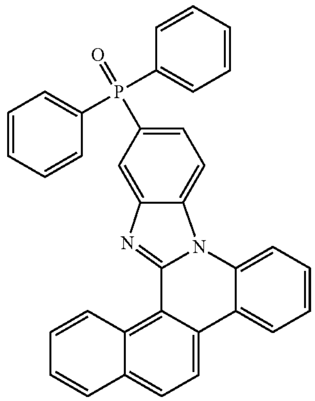
[Compound 7-8]
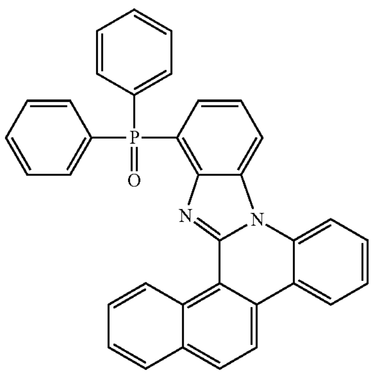
[Compound 7-9]
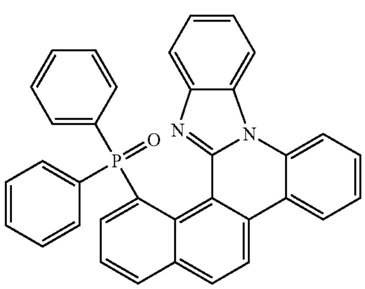
[Compound 7-10]
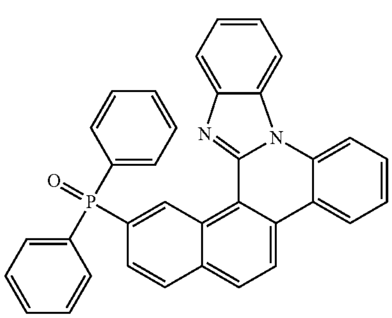
-continued
[Compound 7-11]
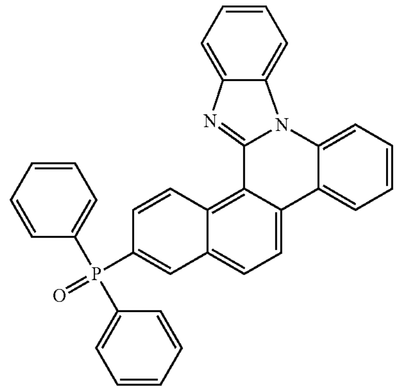
[Compound 7-12]
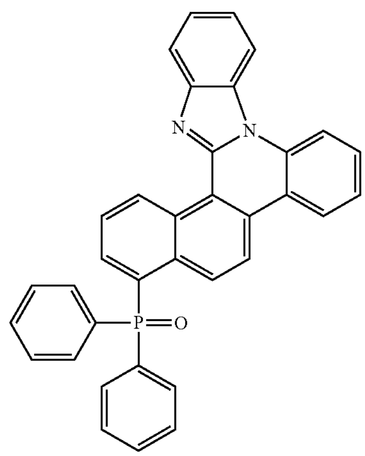
[Compound 7-13]
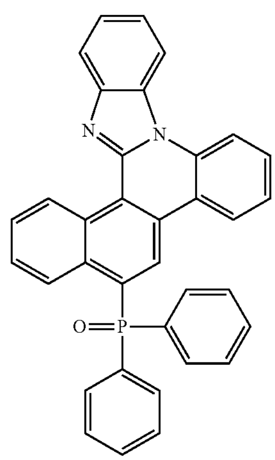

-continued
[Compound 7-14]
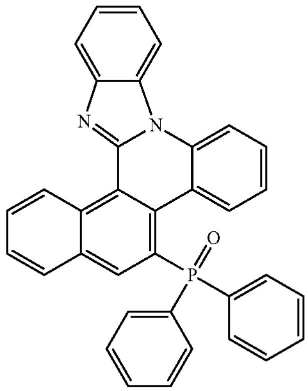
[Compound 7-15]
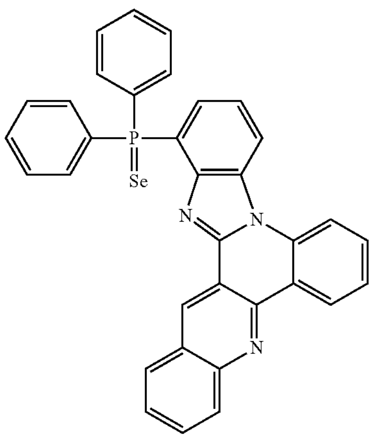
[Compound 7-16]
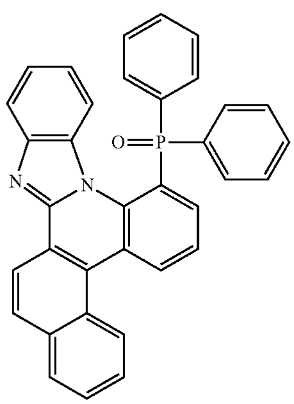
[Compound 7-17]
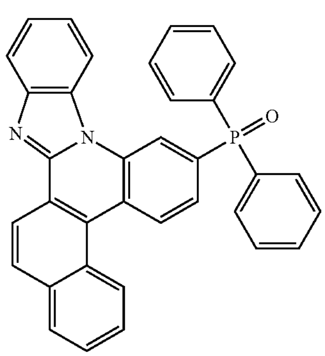
-continued
[Compound 7-18]
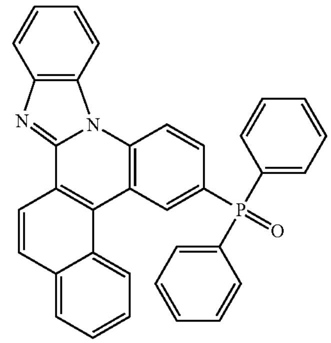
[Compound 7-19]
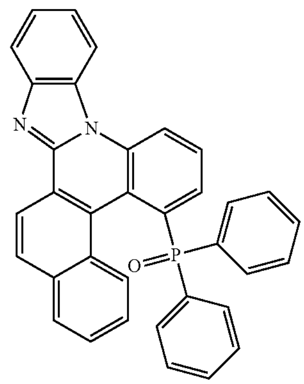
[Compound 7-20]
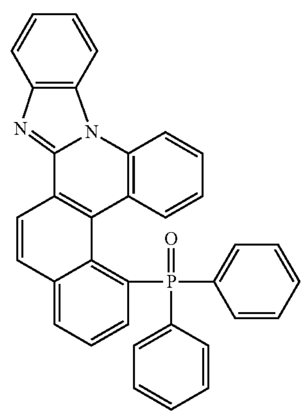
[Compound 7-21]
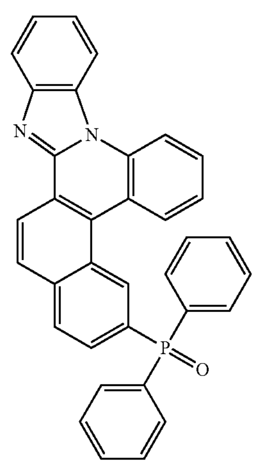

[Compound 7-22]
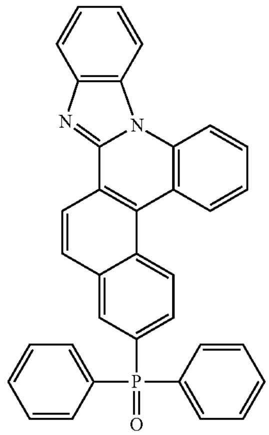
[Compound 7-23]
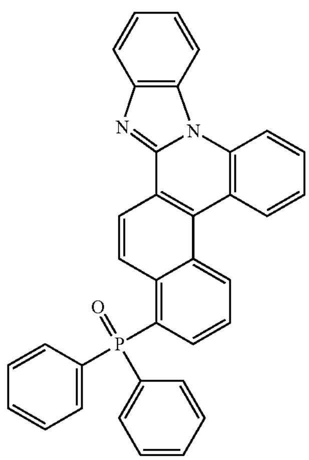
[Compound 7-24]
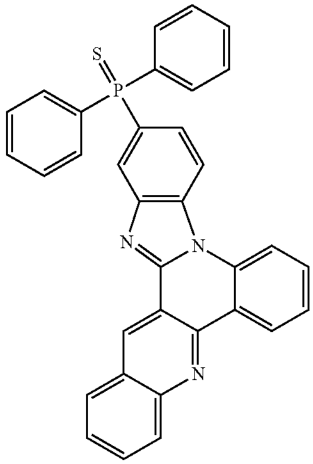
[Compound 7-25]
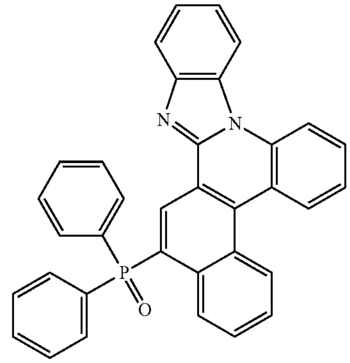
[Compound 7-26]
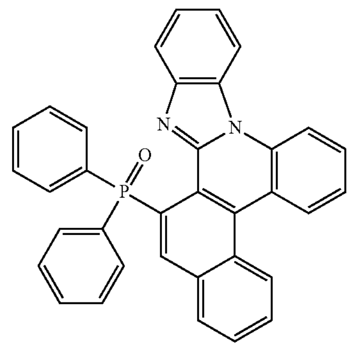
[Compound 7-27]
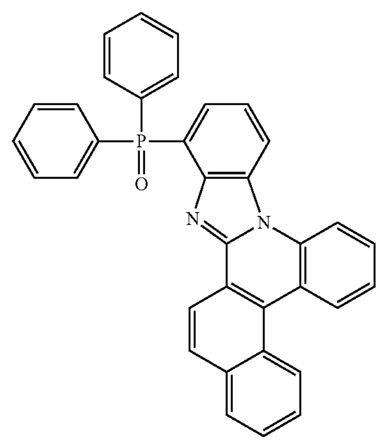
[Compound 7-28]
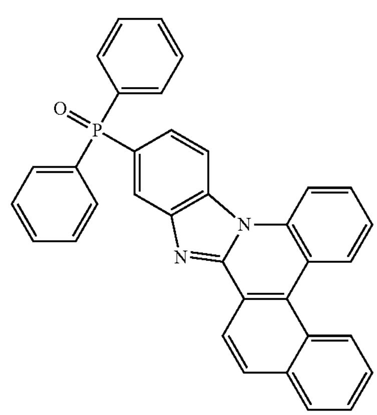

-continued
[Compound 7-29]
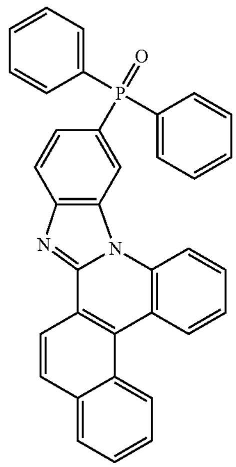
[Compound 7-30]
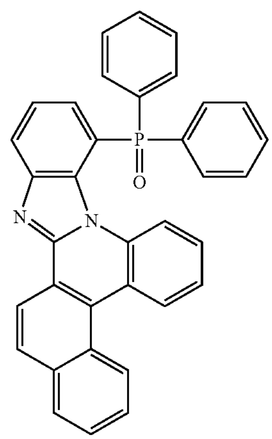
[Compound 7-31]
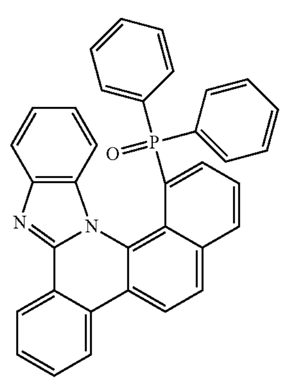
-continued
[Compound 7-32]
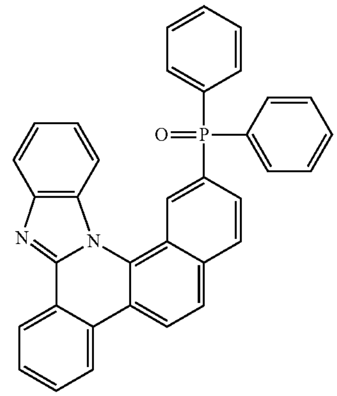
[Compound 7-33]
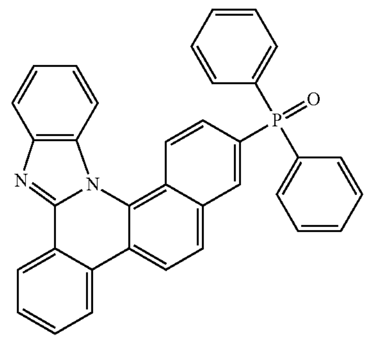
[Compound 7-34]
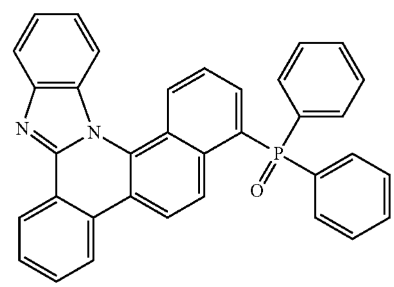
[Compound 7-35]
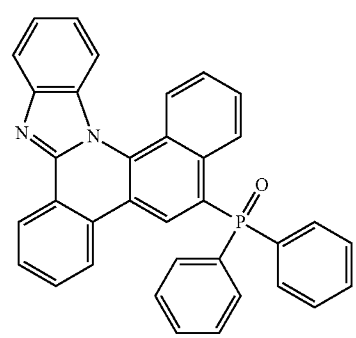

-continued
[Compound 7-36]
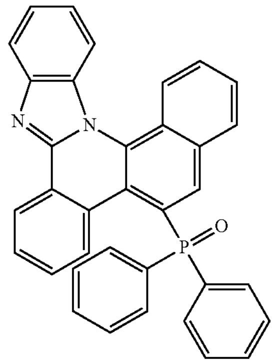
[Compound 7-37]
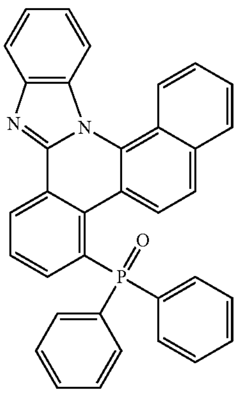
[Compound 7-38]
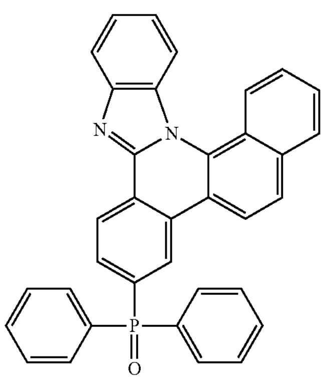
[Compound 7-39]
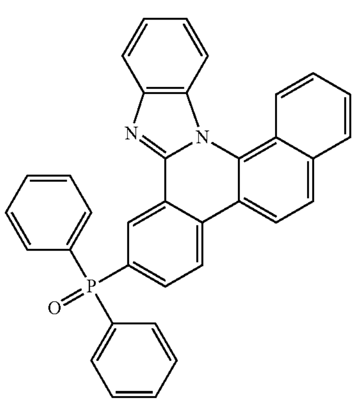
-continued
[Compound 7-40]
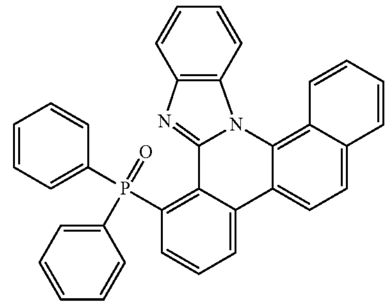
[Compound 7-41]
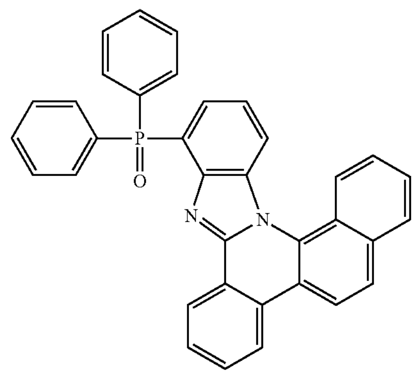
[Compound 7-42]
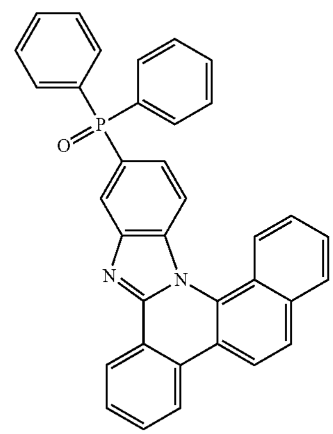
[Compound 7-43]
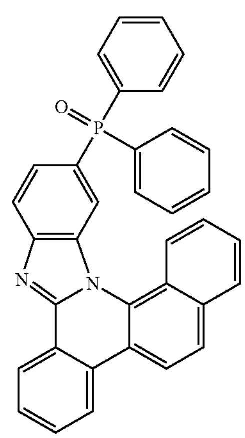

[Compound 7-44]
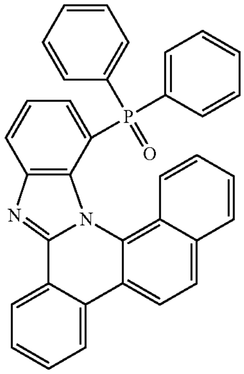
[Compound 7-45]
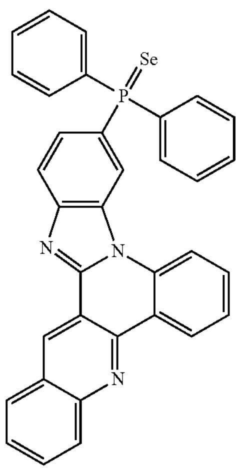
[Compound 7-46]
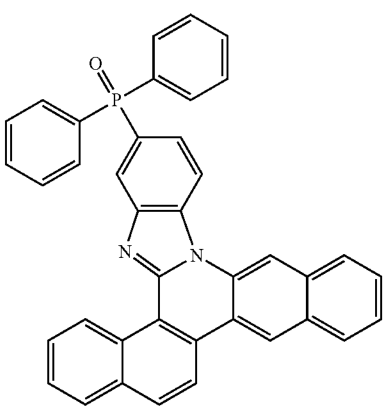
[Compound 7-47]
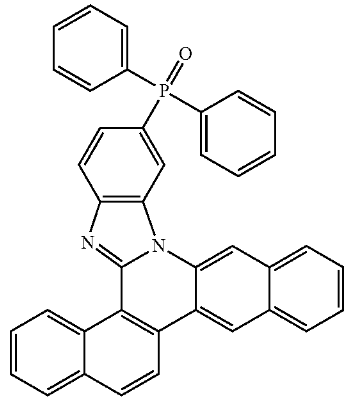
[Compound 7-48]
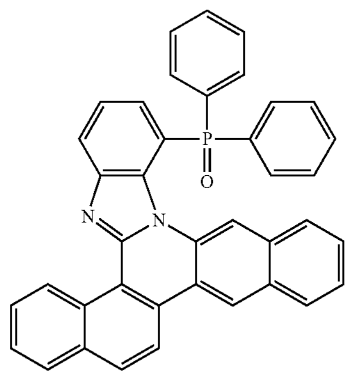
[Compound 7-49]
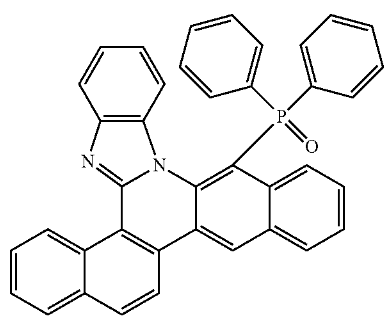
[Compound 7-50]
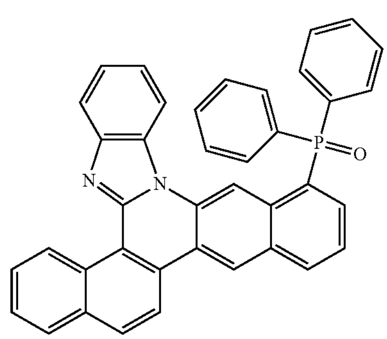

[Compound 7-51]
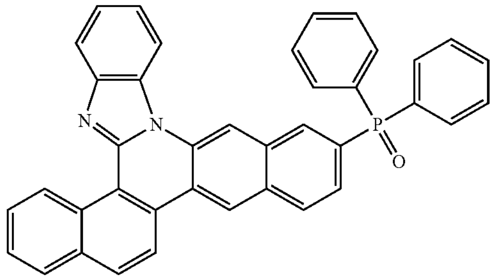
[Compound 7-52]
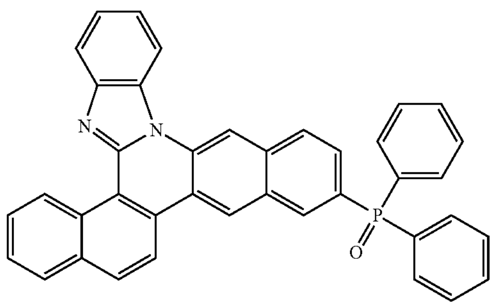
[Compound 7-53]
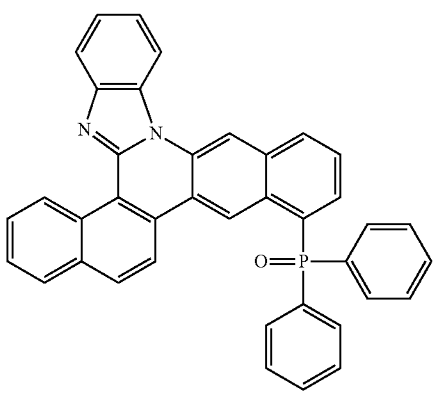
[Compound 7-54]
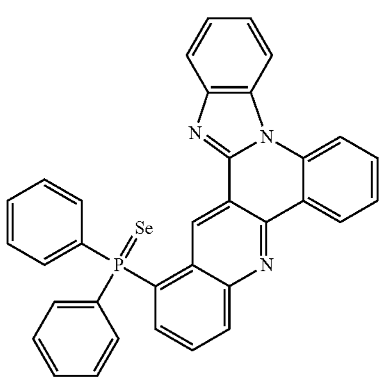
[Compound 7-55]
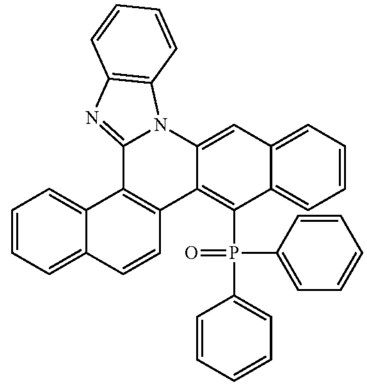
[Compound 7-56]
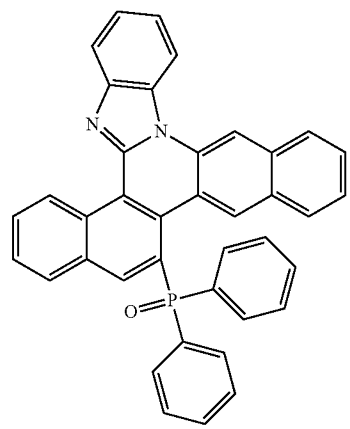
[Compound 7-57]
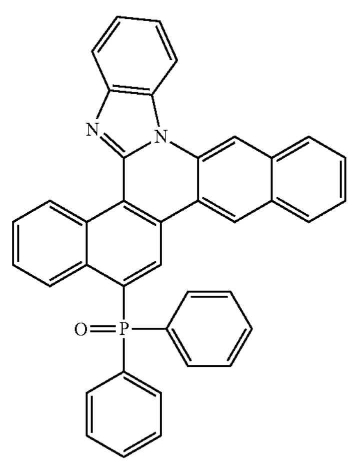

-continued
[Compound 7-58]
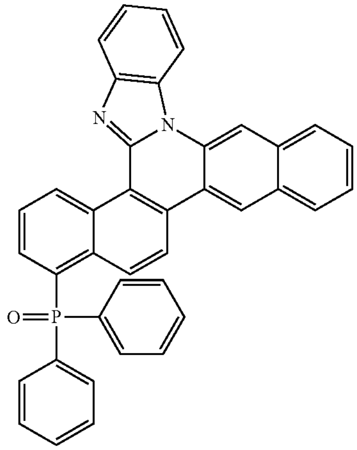
[Compound 7-59]
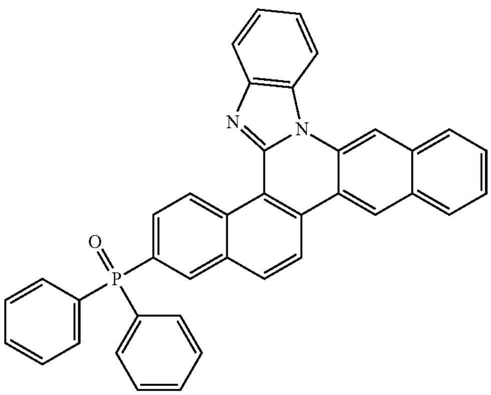
[Compound 7-60]
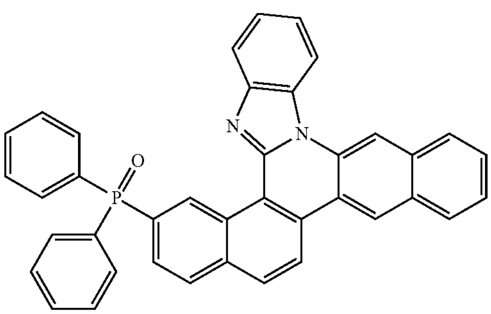
[Compound 7-61]
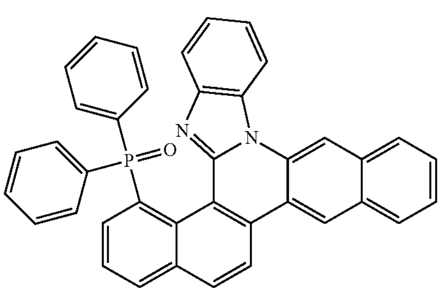
-continued
[Compound 7-62]
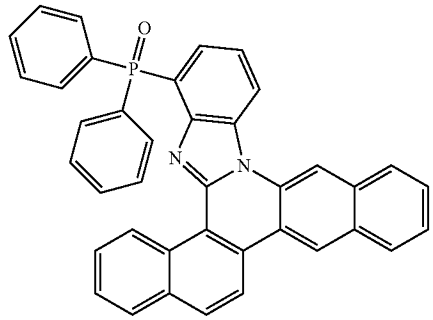
[Compound 7-63]
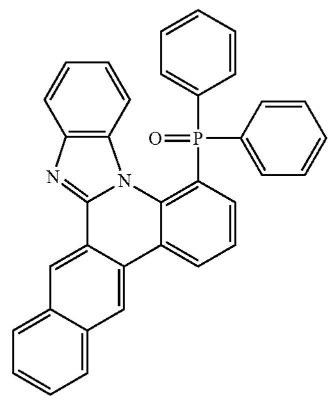
[Compound 7-64]
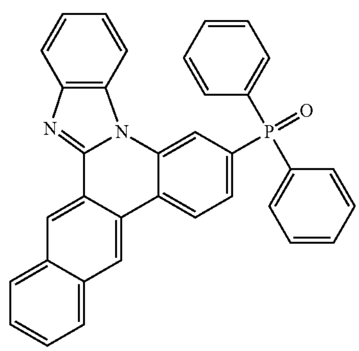
[Compound 7-65]
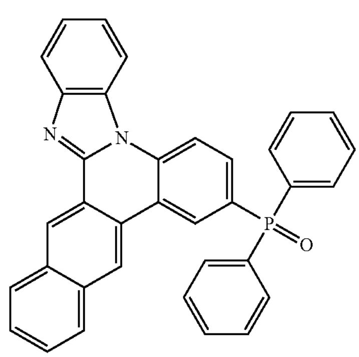

-continued
[Compound 7-66]
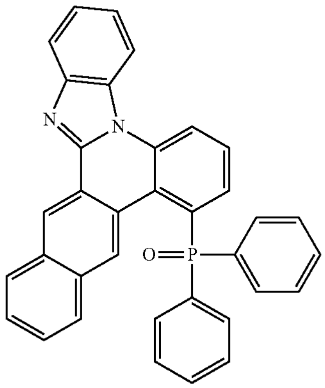
[Compound 7-67]
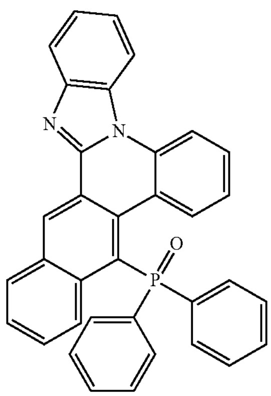
[Compound 7-68]
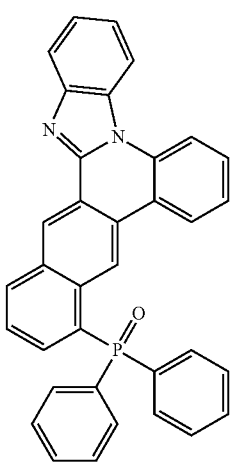
-continued
[Compound 7-69]
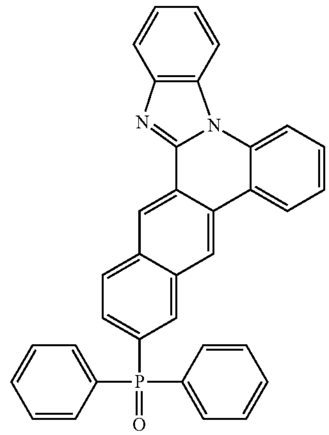
[Compound 7-70]
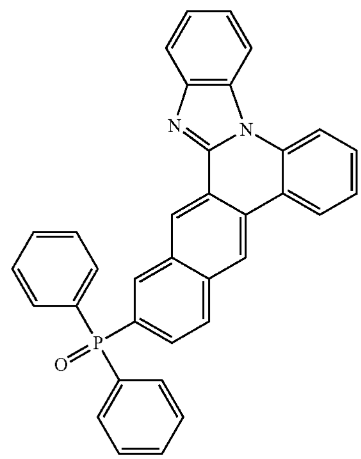
[Compound 7-71]
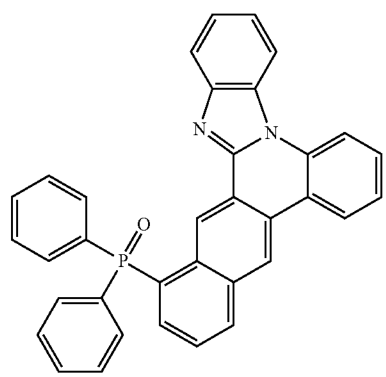
[Compound 7-72]
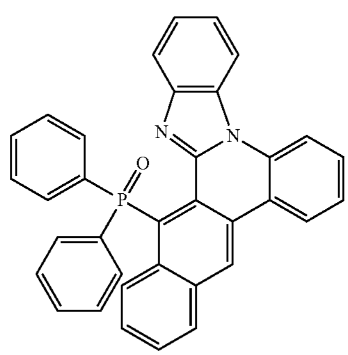

[Compound 7-73]
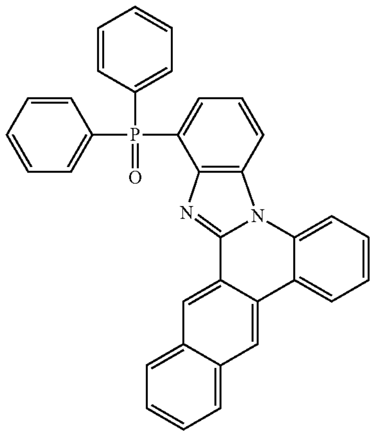
[Compound 7-74]
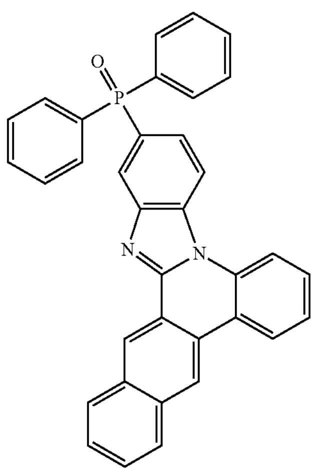
[Compound 7-75]
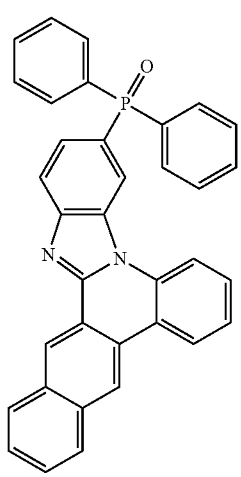
[Compound 7-76]
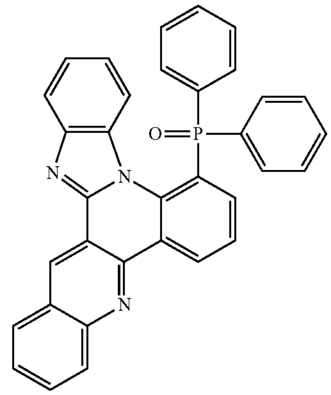
[Compound 7-77]
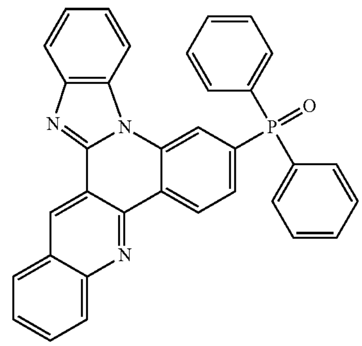
[Compound 7-78]
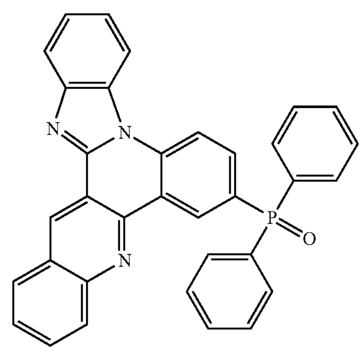
[Compound 7-79]
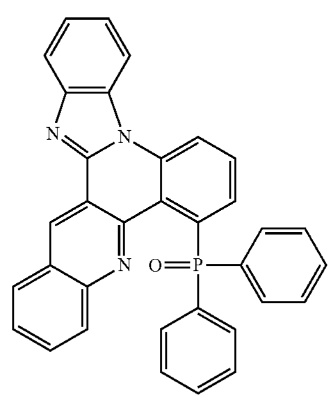

[Compound 7-80]
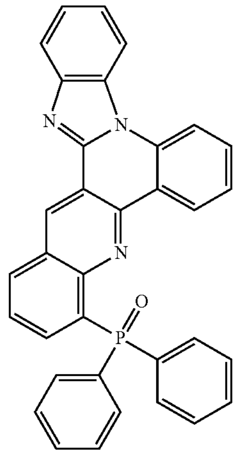
[Compound 7-81]
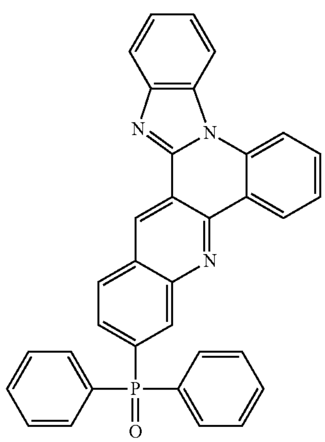
[Compound 7-82]
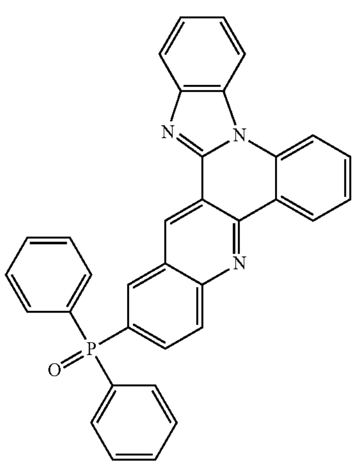
[Compound 7-83]
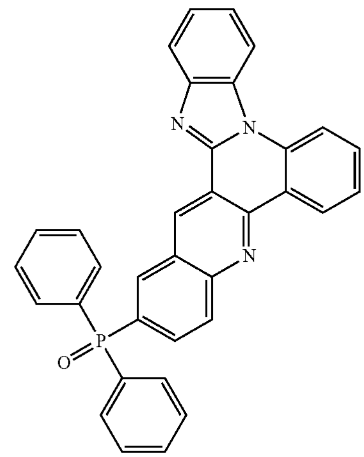
[Compound 7-84]
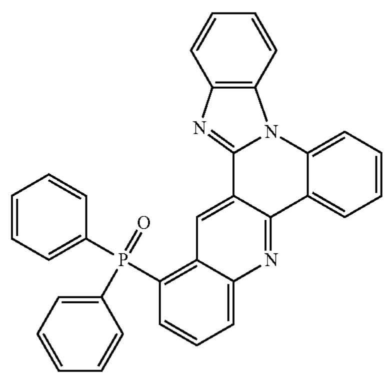
[Compound 7-85]
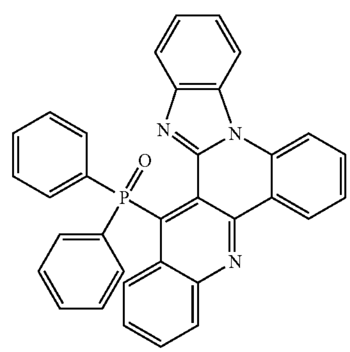
[Compound 7-86]
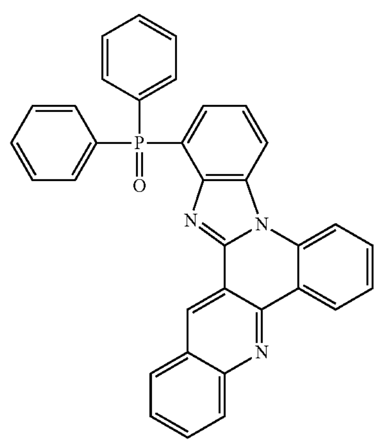

-continued
[Compound 7-87]
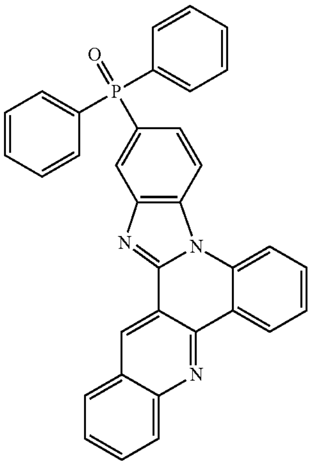
[Compound 7-88]
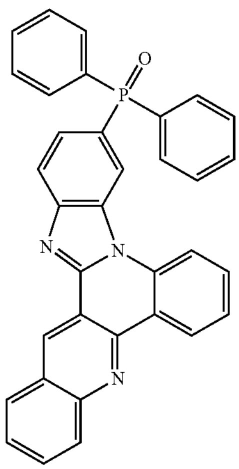
[Compound 7-89]
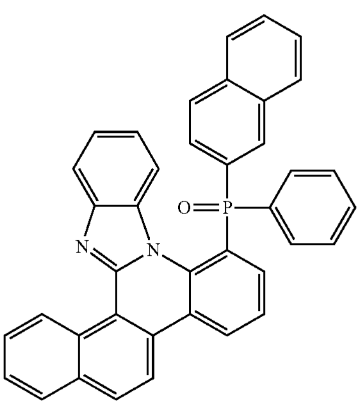
-continued
[Compound 7-90]
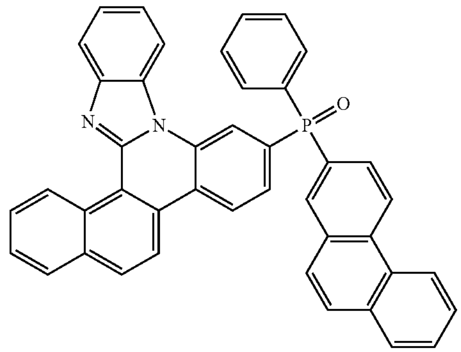
[Compound 7-91]
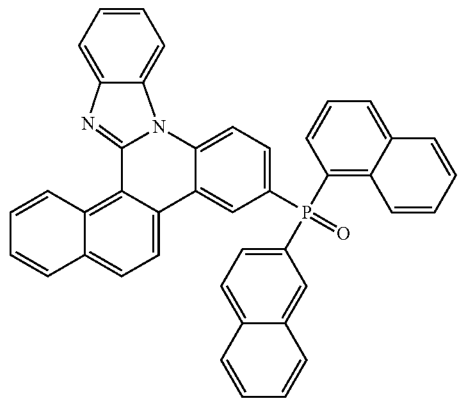
[Compound 7-92]
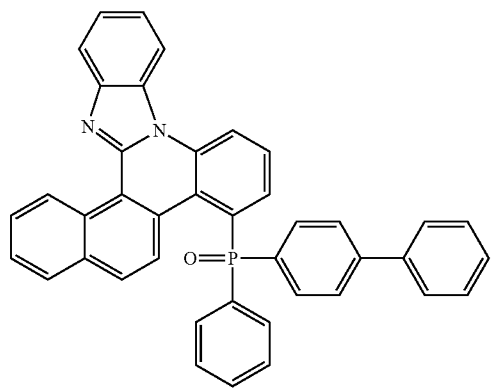
[Compound 7-93]
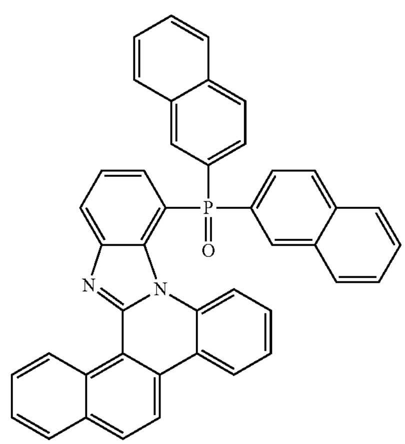

[Compound 7-94]
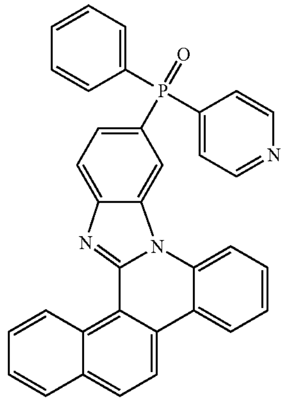
[Compound 7-95]
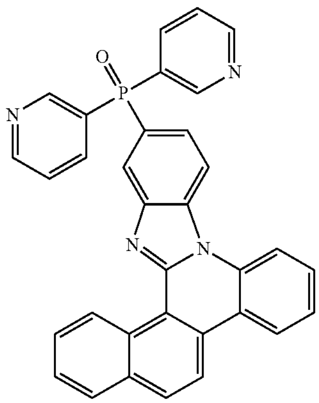
[Compound 7-96]
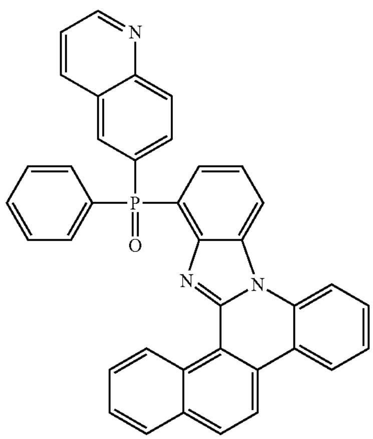
[Compound 7-97]
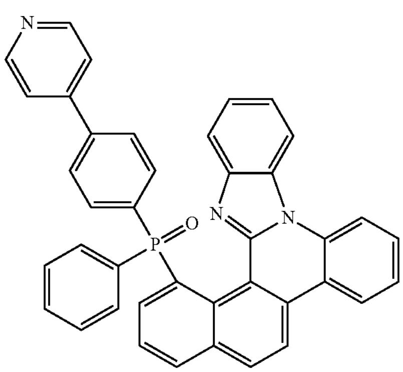
[Compound 7-98]
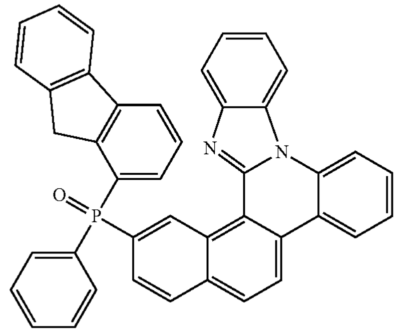
[Compound 7-99]
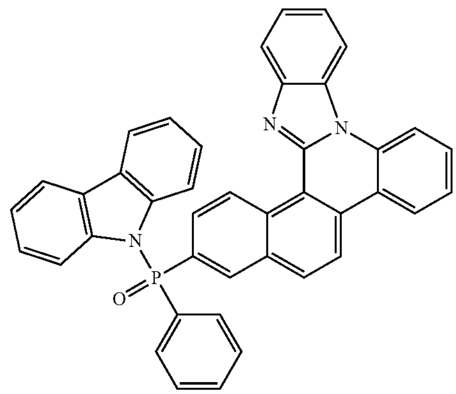
[Compound 7-100]
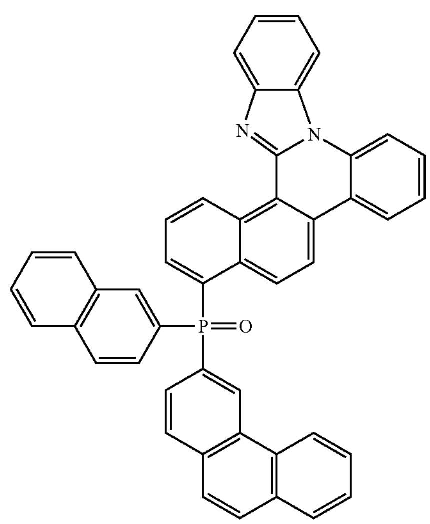

-continued
[Compound 7-101]
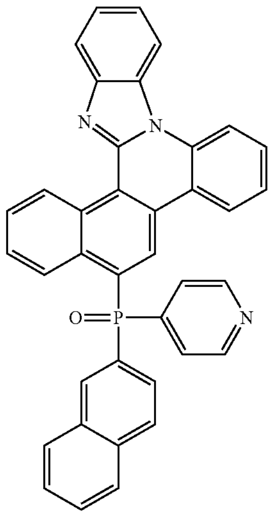
[Compound 7-102]
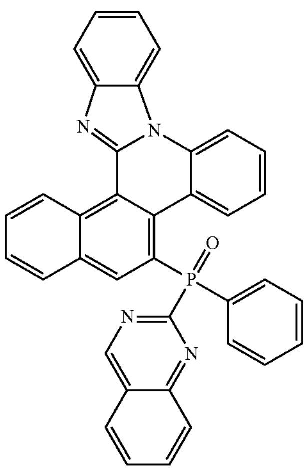
[Compound 7-103]
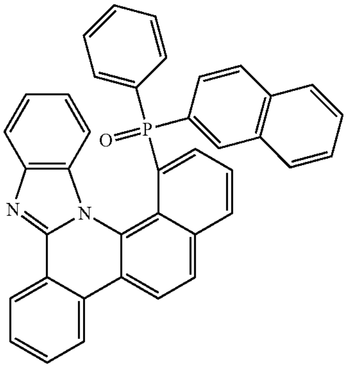
-continued
[Compound 7-104]
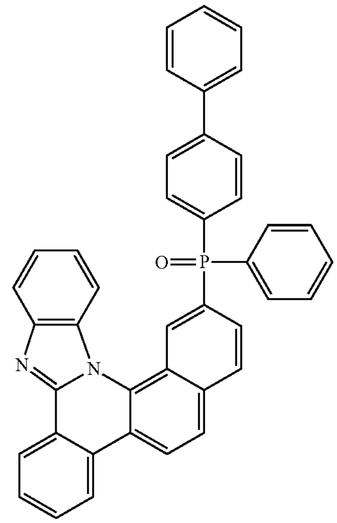
[Compound 7-105]
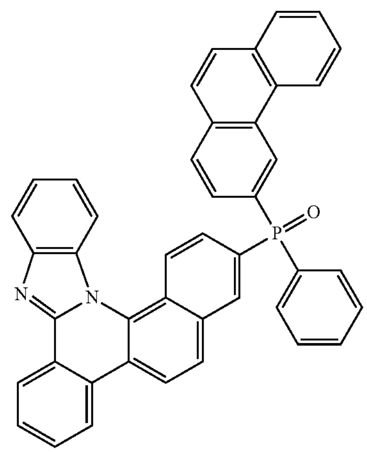
[Compound 7-106]
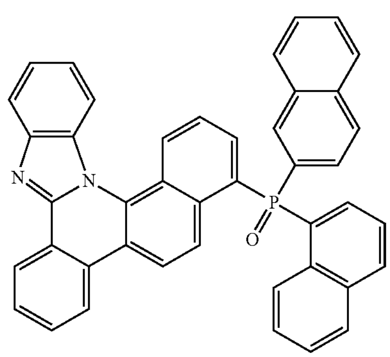

[Compound 7-107]
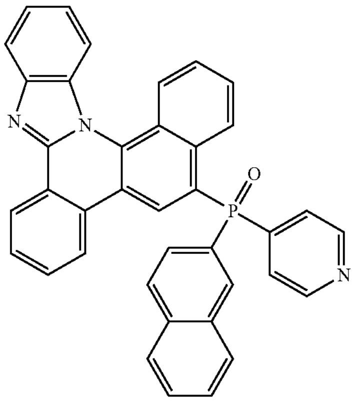
[Compound 7-108]
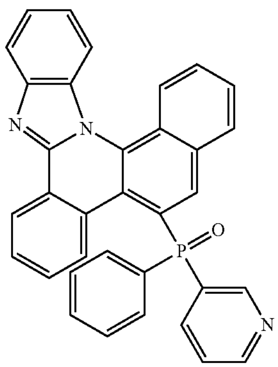
[Compound 7-109]
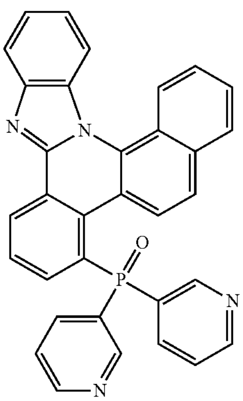
[Compound 7-110]
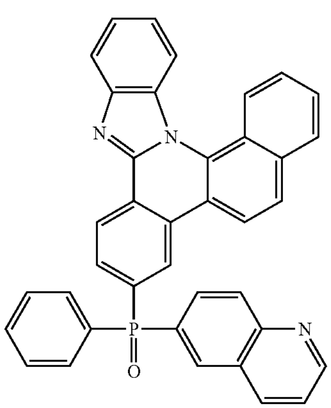
[Compound 7-111]
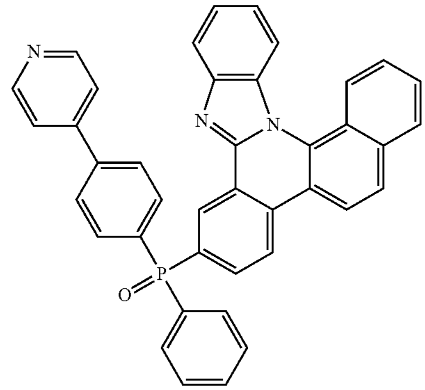
[Compound 7-112]
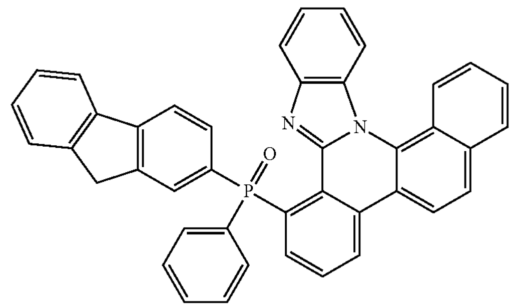
[Compound 7-113]
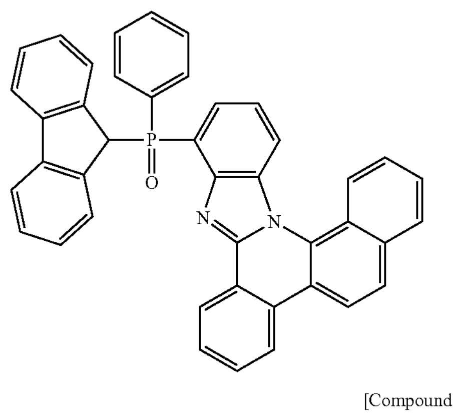
[Compound 7-114]
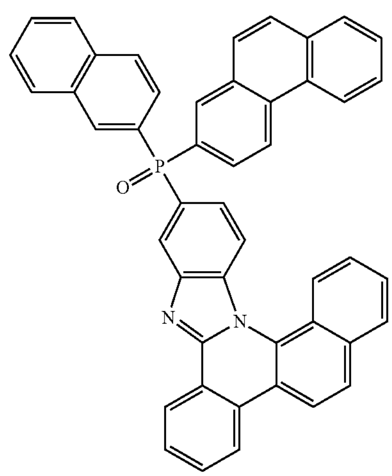

-continued
[Compound 7-115]
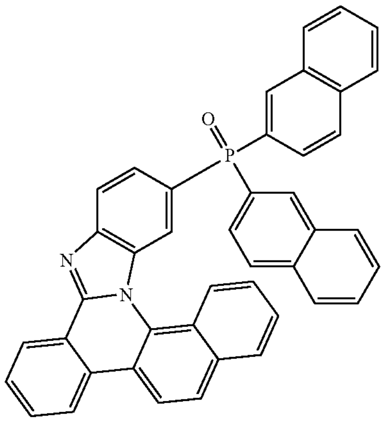
[Compound 7-116]
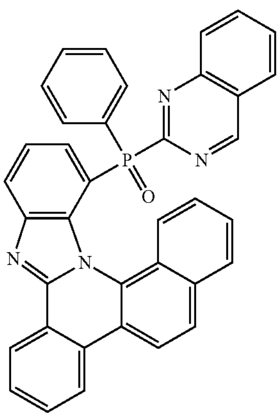
[Compound 7-117]
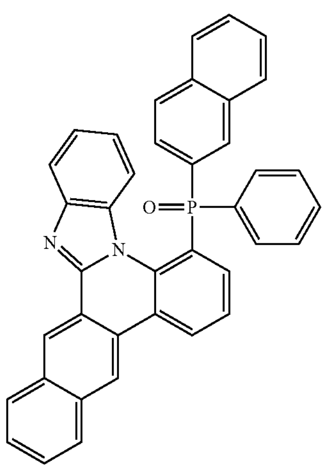
-continued
[Compound 7-118]
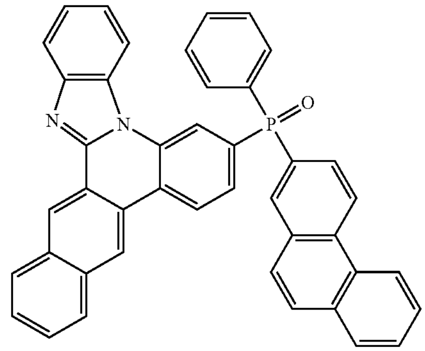
[Compound 7-119]
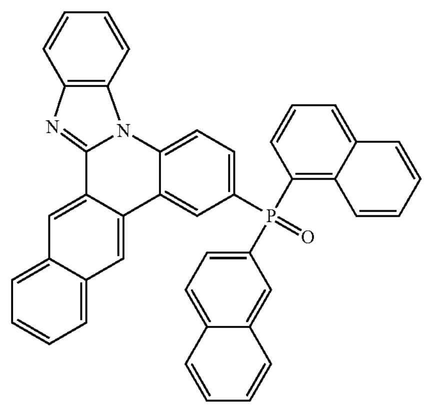
[Compound 7-120]
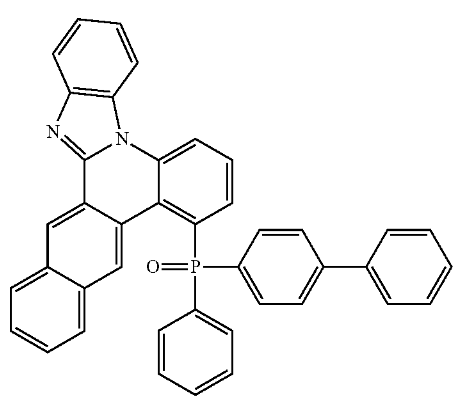

-continued
[Compound 7-121]
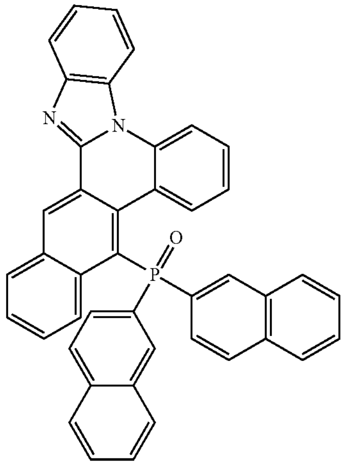
[Compound 7-122]
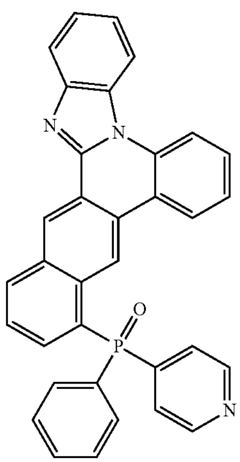
[Compound 7-123]
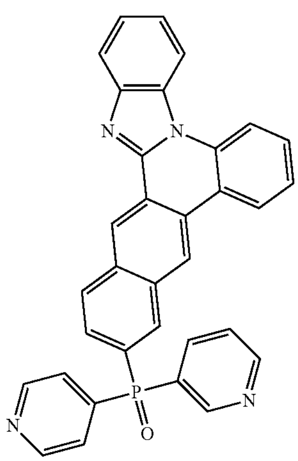
-continued
[Compound 7-124]
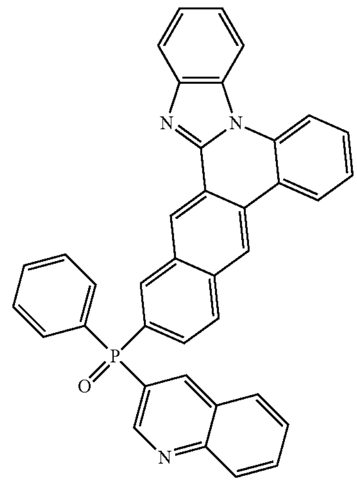
[Compound 7-125]
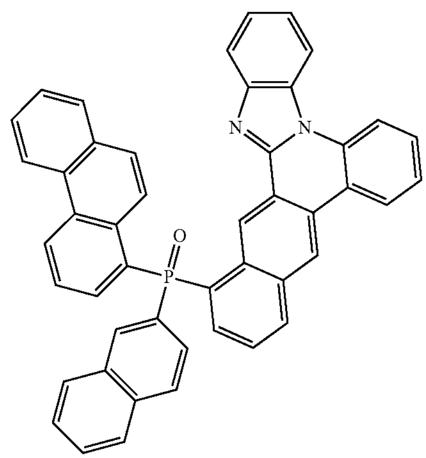
[Compound 7-126]
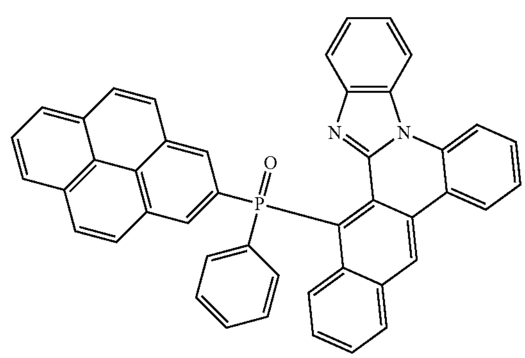

[Compound 7-127]
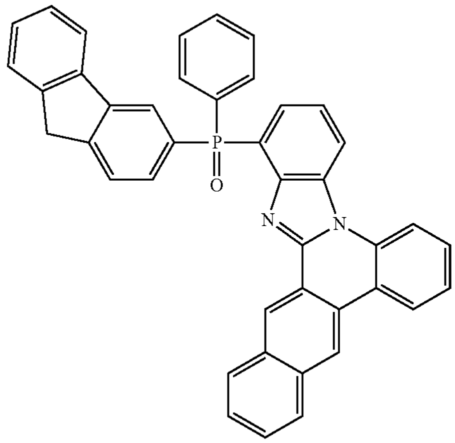
[Compound 7-128]
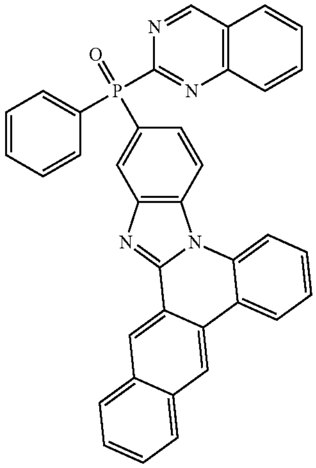
[Compound 7-129]
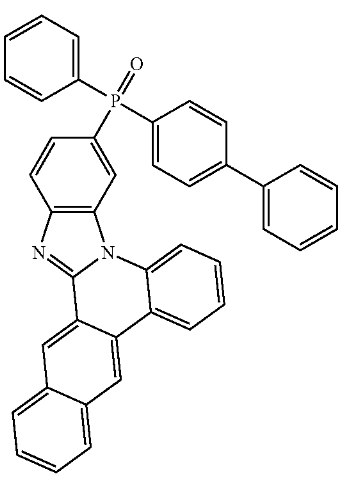
[Compound 7-130]
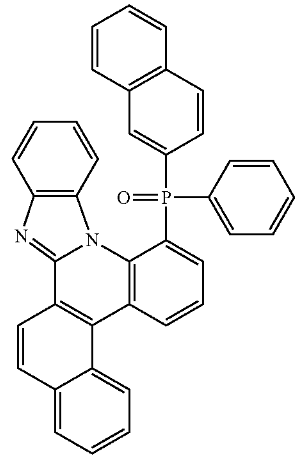
[Compound 7-131]
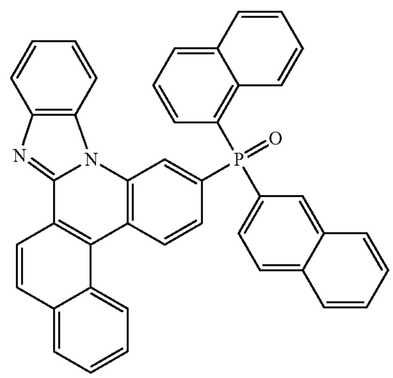
[Compound 7-132]
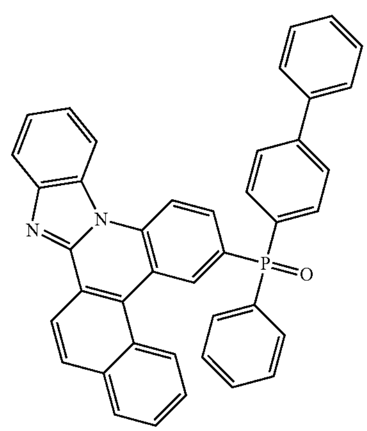

[Compound 7-133]
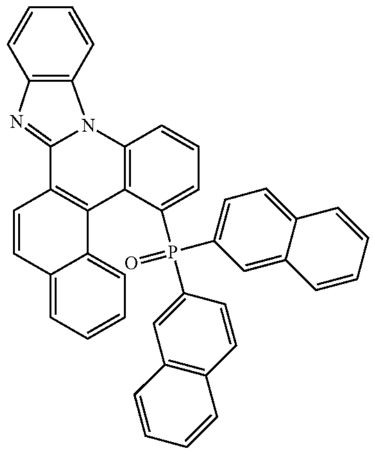
[Compound 7-134]
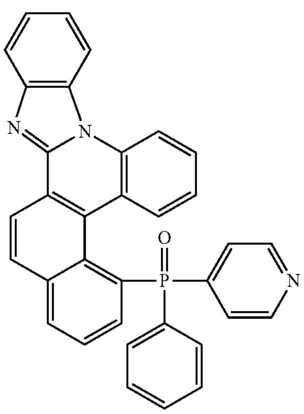
[Compound 7-135]
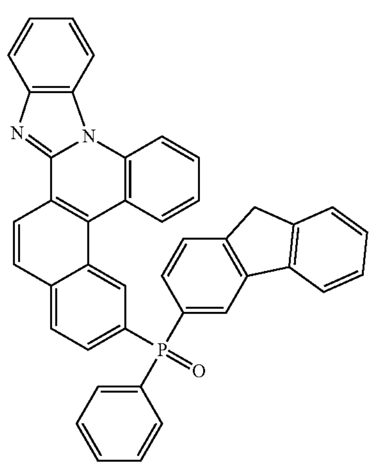
[Compound 7-136]
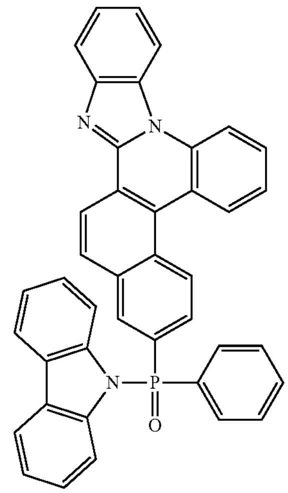
[Compound 7-137]
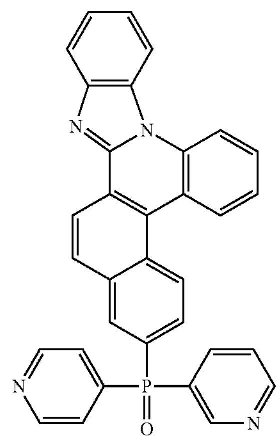
[Compound 7-138]
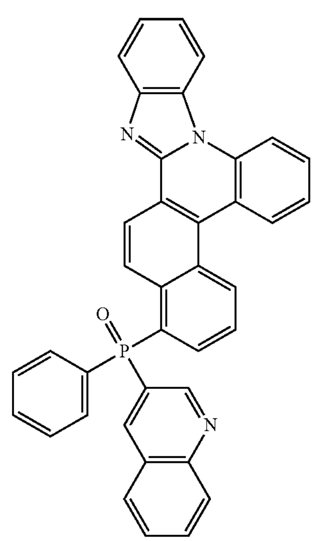

-continued
[Compound 7-139]
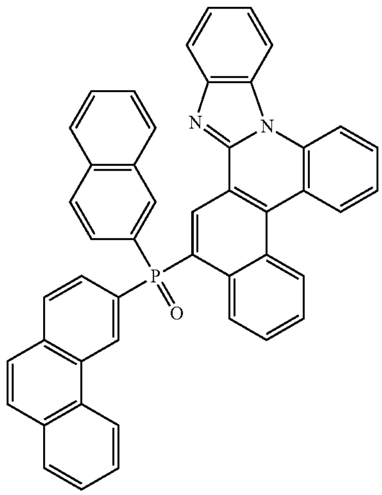
[Compound 7-140]
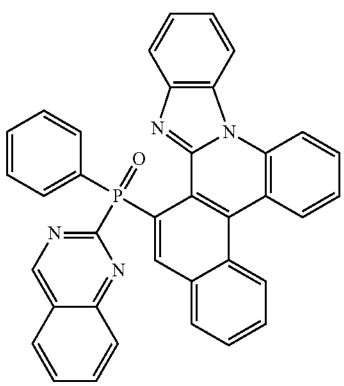
[Compound 7-141]
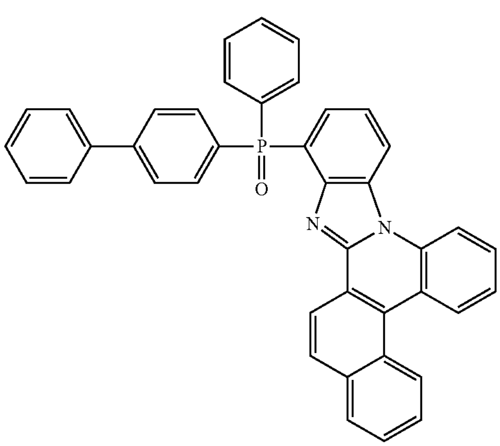
-continued
[Compound 7-142]
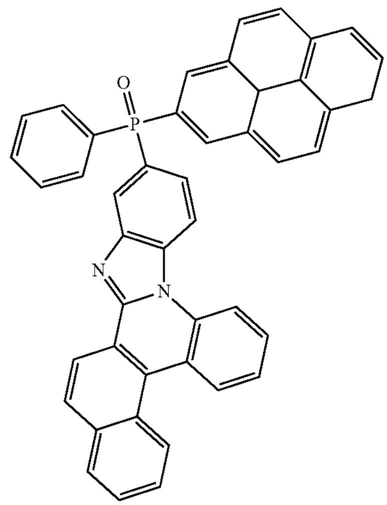
[Compound 7-143]
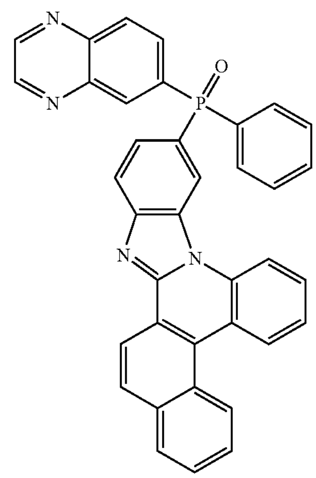
[Compound 7-144]
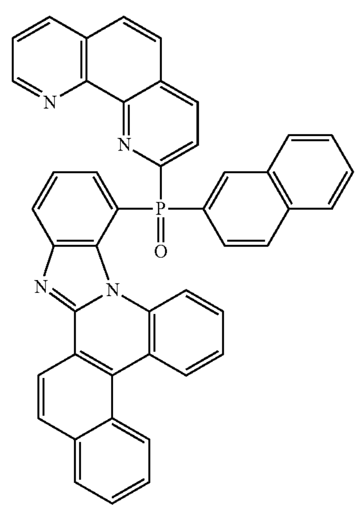

[Compound 7-145]
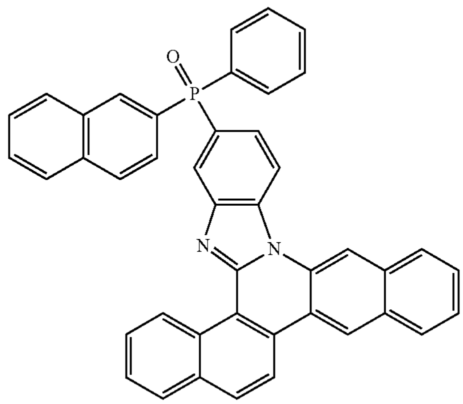
[Compound 7-146]
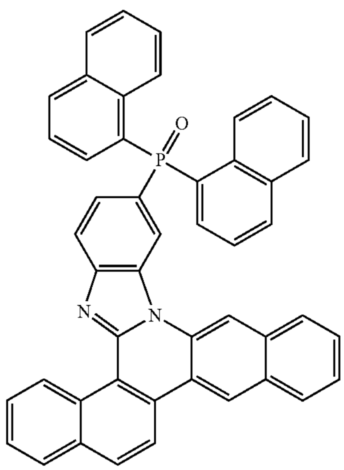
[Compound 7-147]
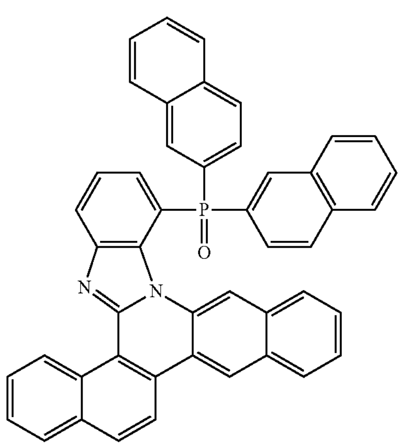
[Compound 7-148]
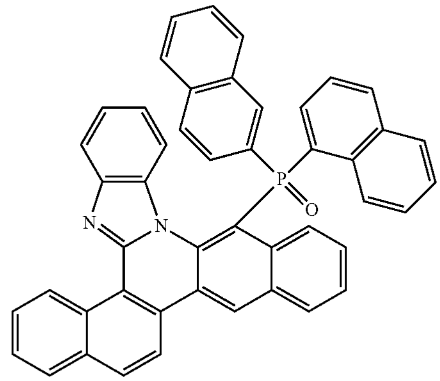
[Compound 7-149]
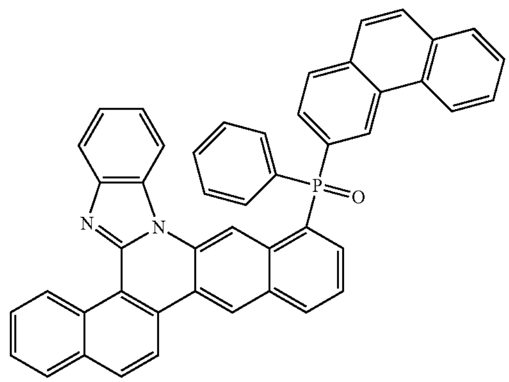
[Compound 7-150]
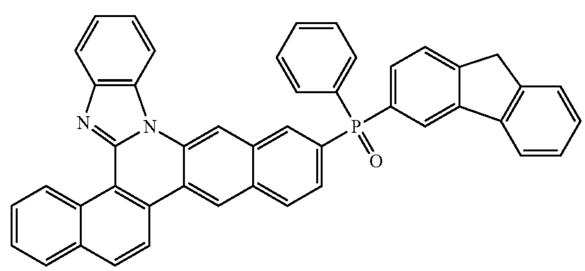
[Compound 7-151]
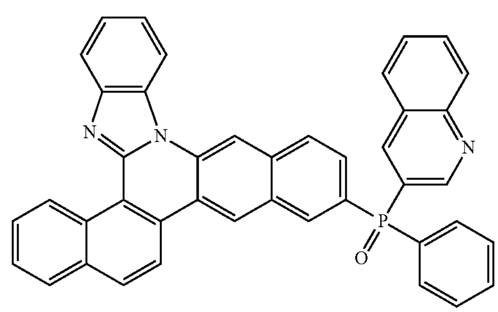

-continued
[Compound 7-152]
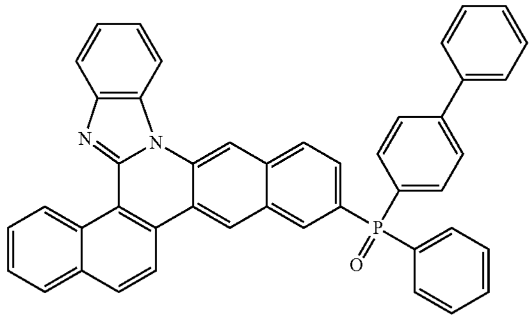
[Compound 7-153]
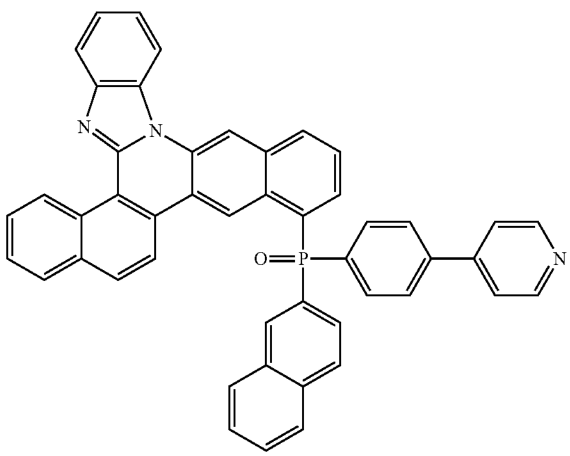
[Compound 7-154]
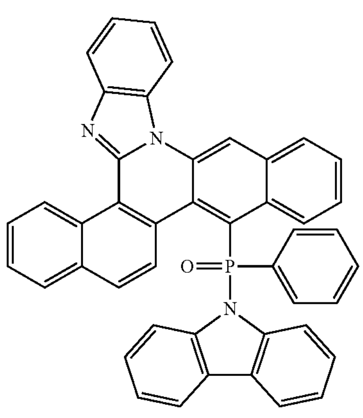
-continued
[Compound 7-155]
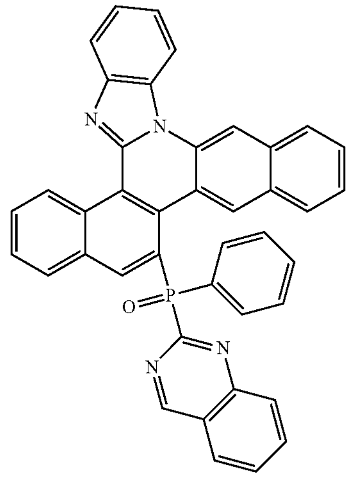
[Compound 7-156]
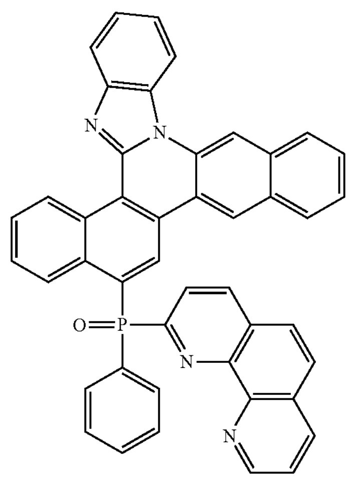
[Compound 7-157]
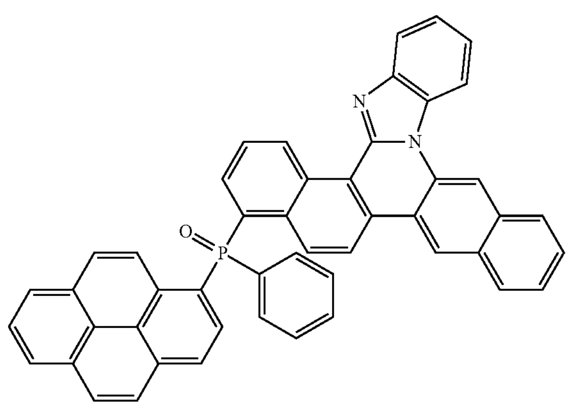

-continued
[Compound 7-158]
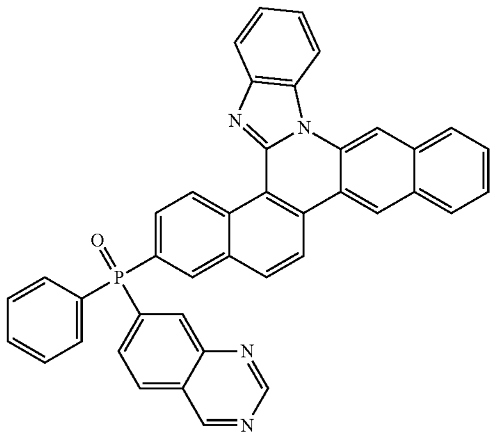
[Compound 7-159]
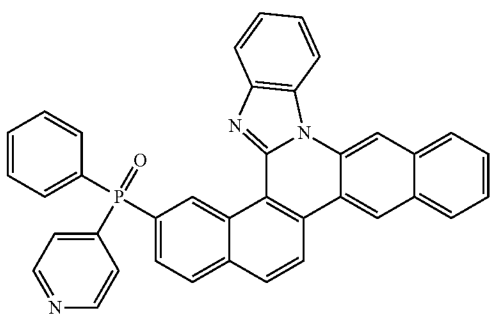
[Compound 7-160]
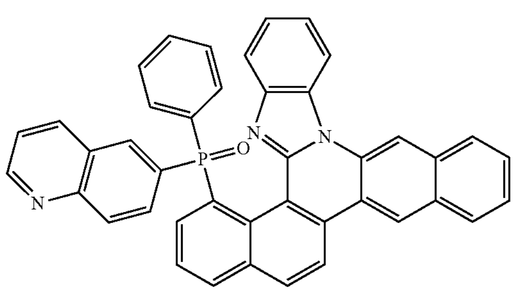
[Compound 7-161]
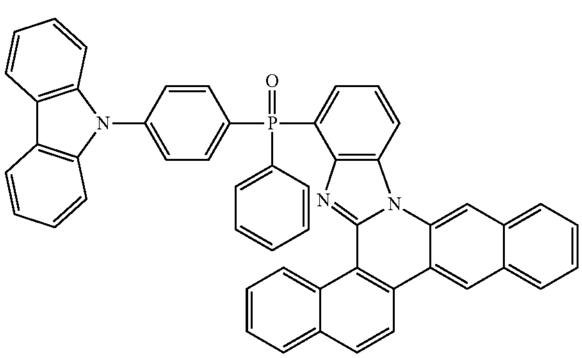
-continued
[Compound 7-162]
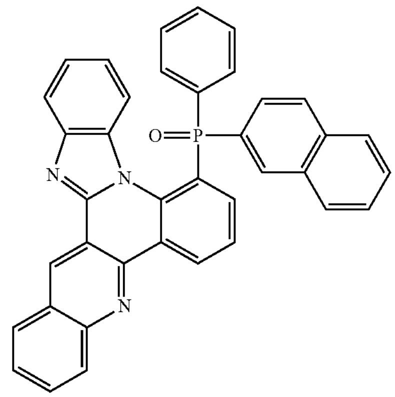
[Compound 7-163]
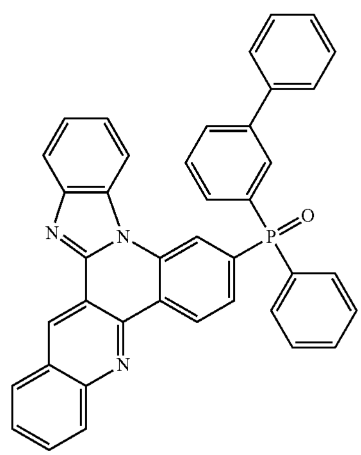
[Compound 7-164]
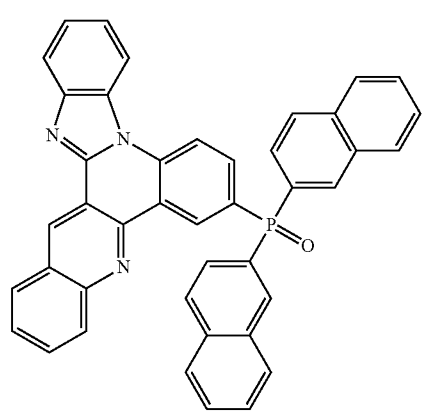

-continued
[Compound 7-165]
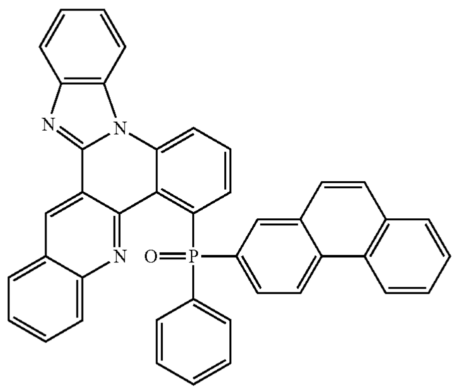
[Compound 7-166]
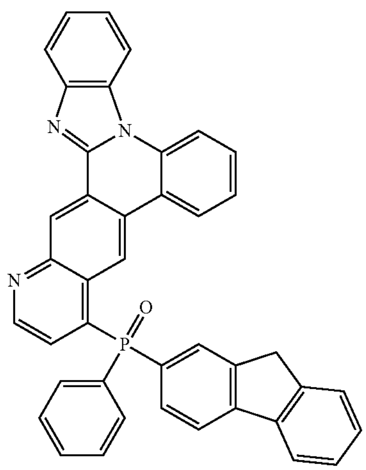
[Compound 7-167]
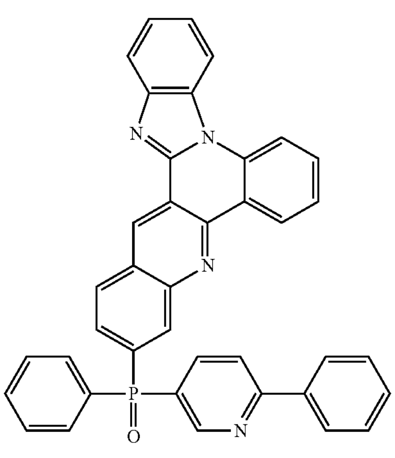
-continued
[Compound 7-168]
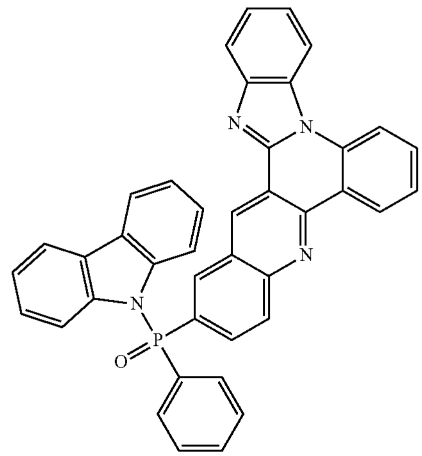
[Compound 7-169]
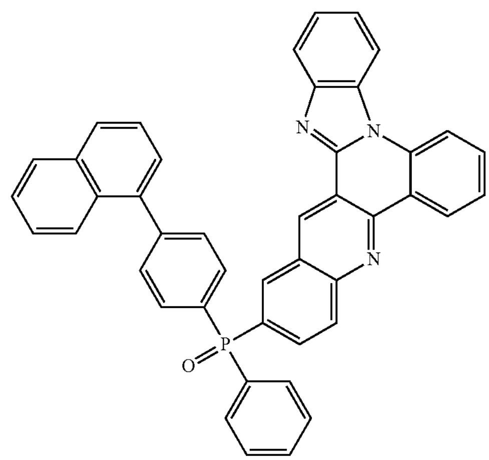
[Compound 7-170]
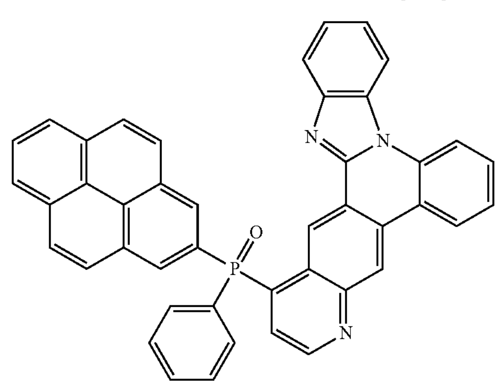

[Compound 7-171]
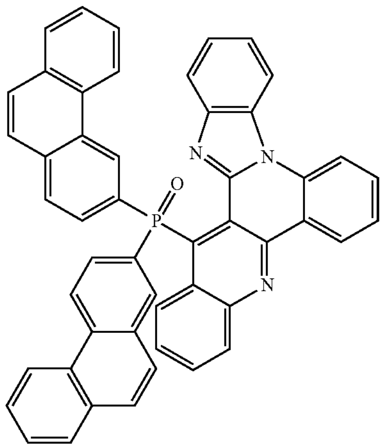
[Compound 7-172]
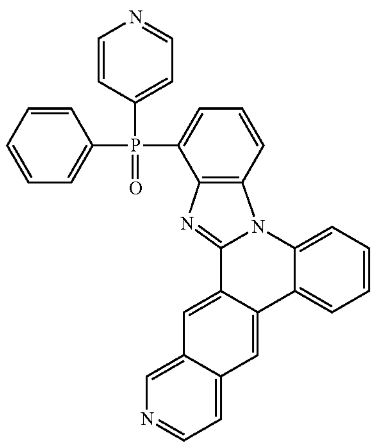
[Compound 7-173]
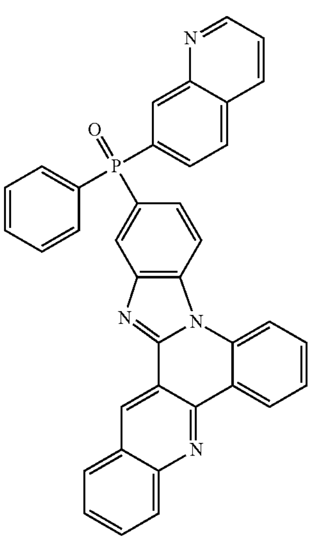
[Compound 7-174]
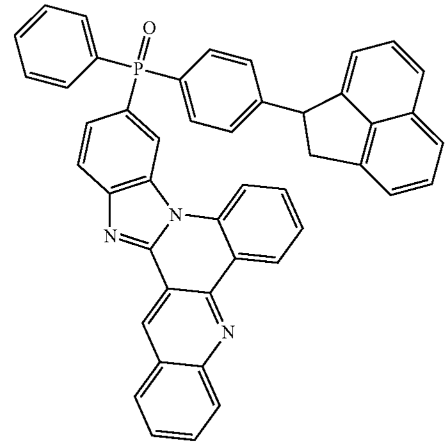
[Compound 7-175]
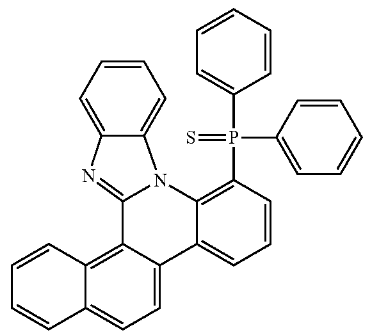
[Compound 7-176]
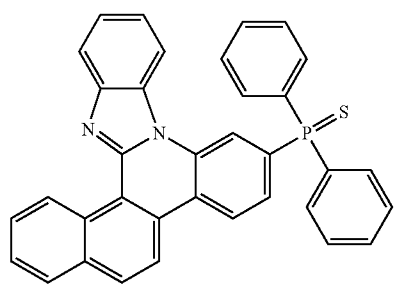
[Compound 7-177]
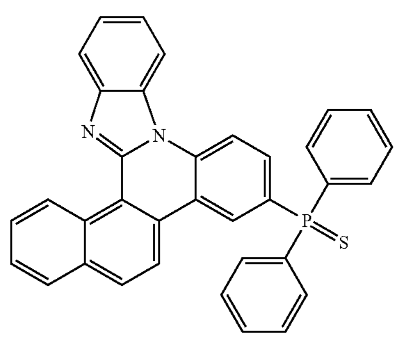

[Compound 7-178]
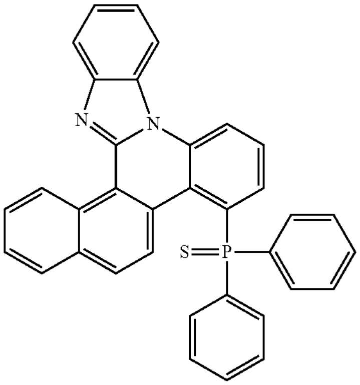
[Compound 7-179]
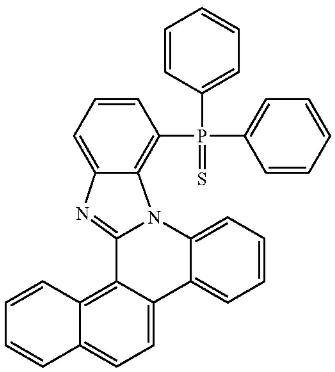
[Compound 7-180]
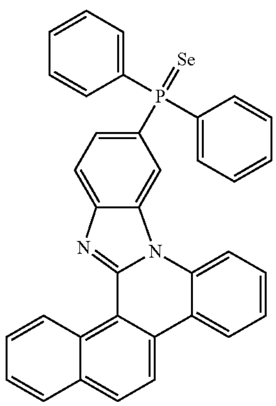
[Compound 7-181]
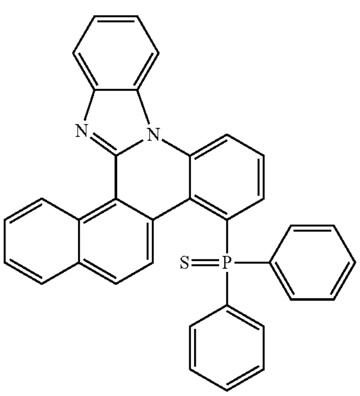
[Compound 7-182]
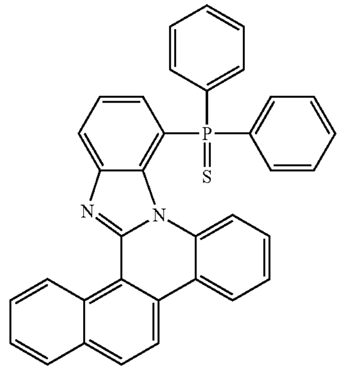
[Compound 7-183]
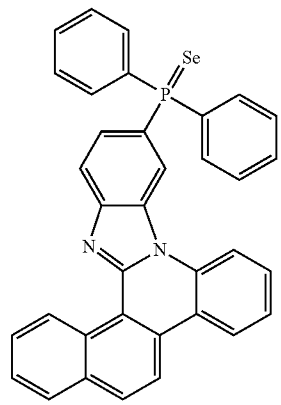
[Compound 7-184]
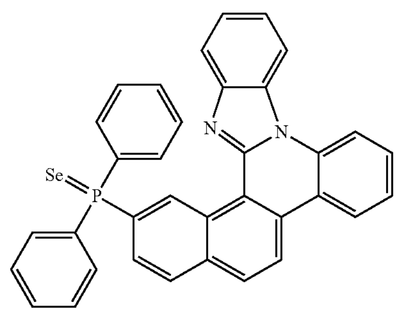
[Compound 7-185]
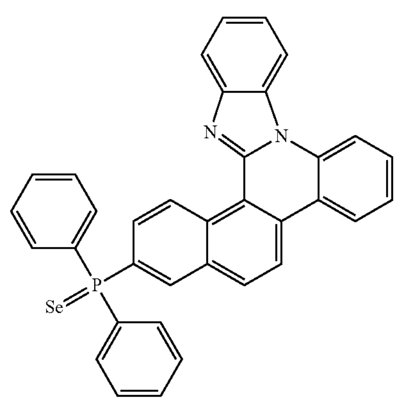

-continued
[Compound 7-186]
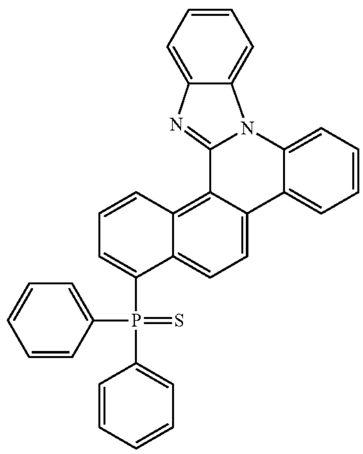
[Compound 7-187]
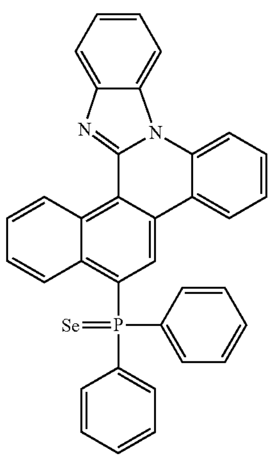
[Compound 7-188]
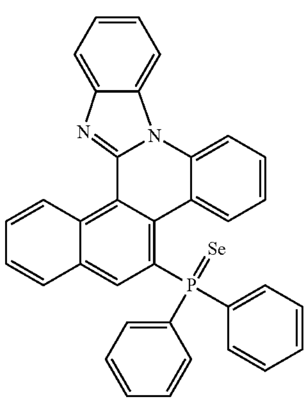
-continued
[Compound 7-189]
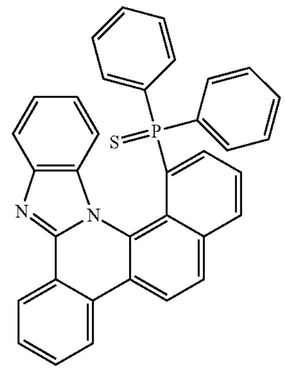
[Compound 7-190]
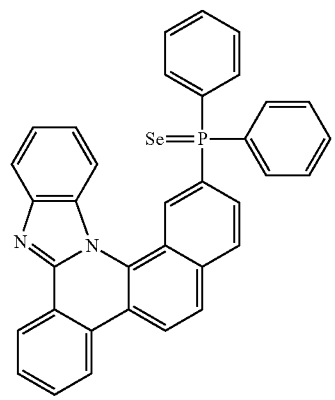
[Compound 7-191]
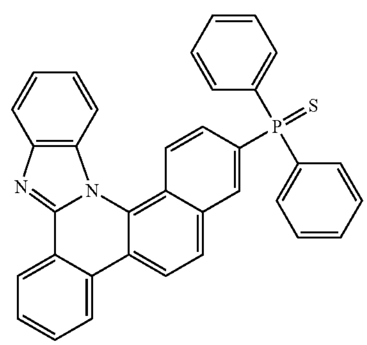
[Compound 7-192]
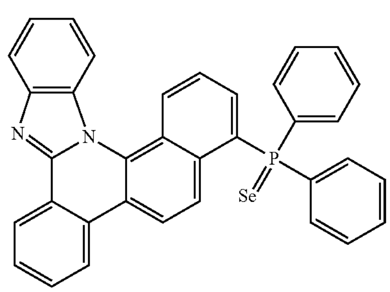

-continued
[Compound 7-193]
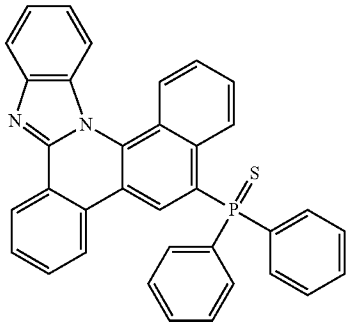
[Compound 7-194]
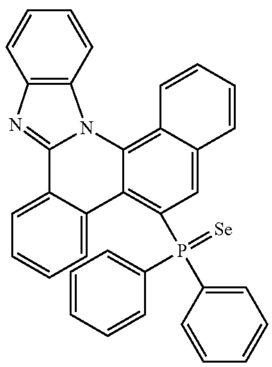
[Compound 7-195]
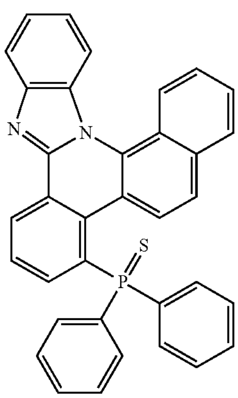
[Compound 7-196]
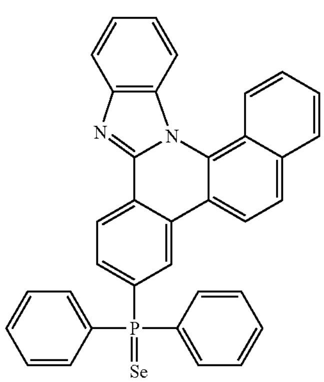
-continued
[Compound 7-197]
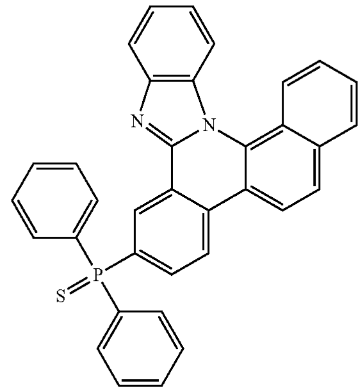
[Compound 7-198]
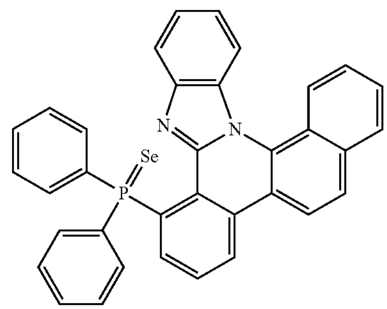
[Compound 7-199]
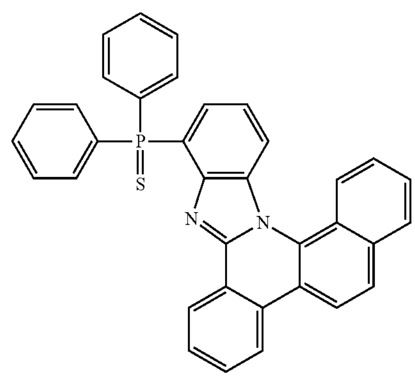
[Compound 7-200]
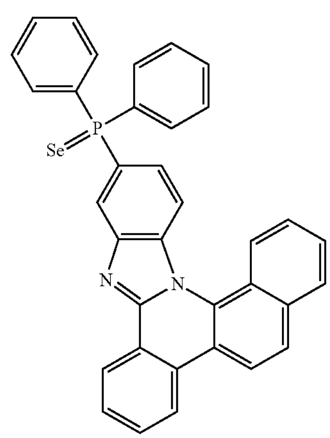

-continued
[Compound 7-201]
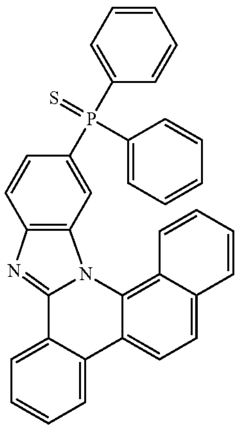
[Compound 7-202]
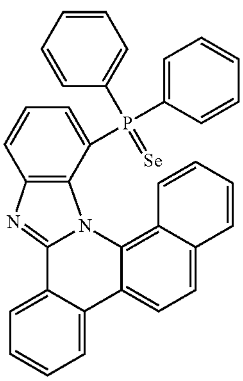
[Compound 7-203]
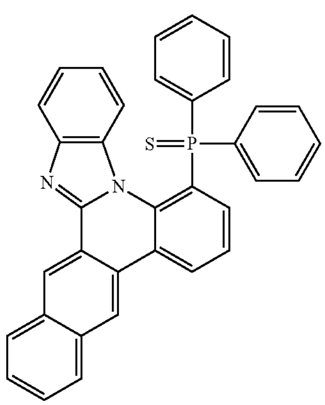
[Compound 7-204]
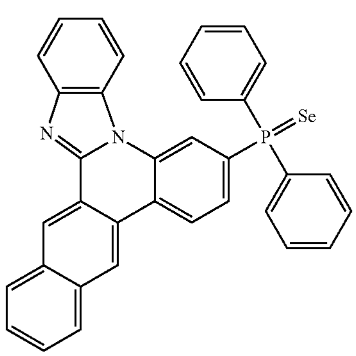
-continued
[Compound 7-205]
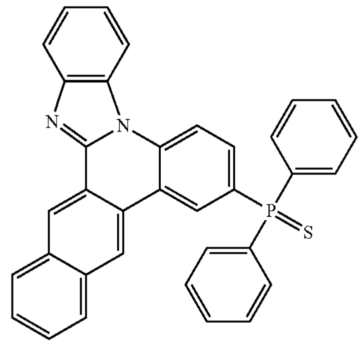
[Compound 7-206]
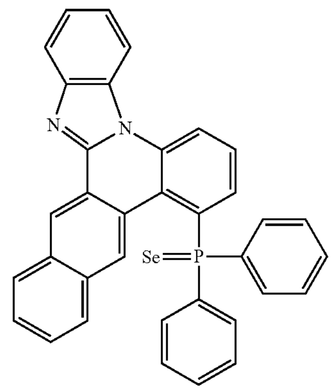
[Compound 7-207]
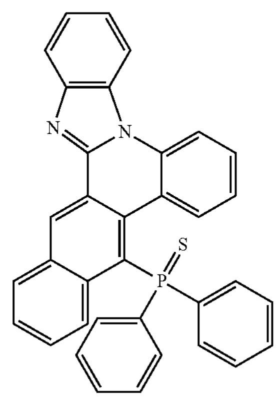
[Compound 7-208]
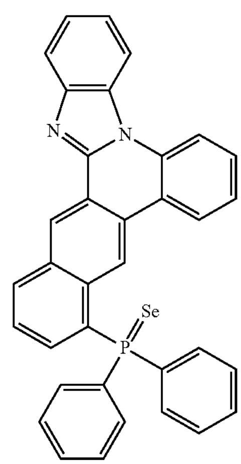

-continued
[Compound 7-209]
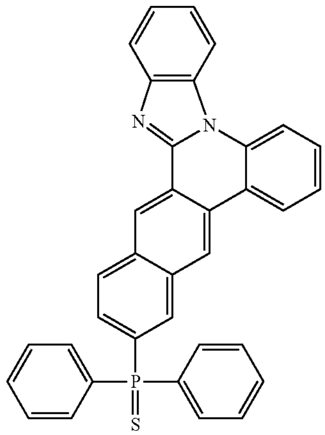
[Compound 7-210]
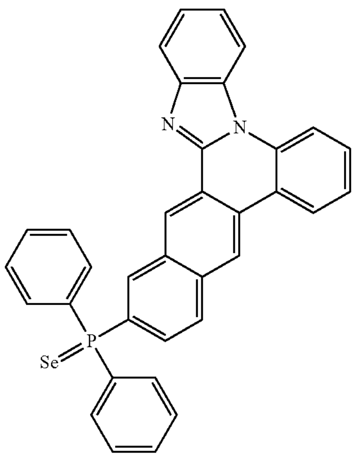
[Compound 7-211]
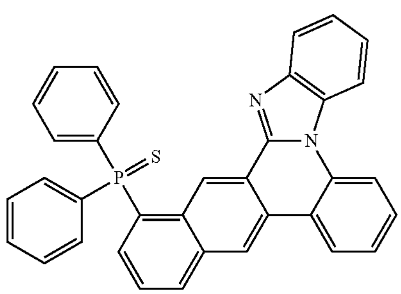
[Compound 7-212]
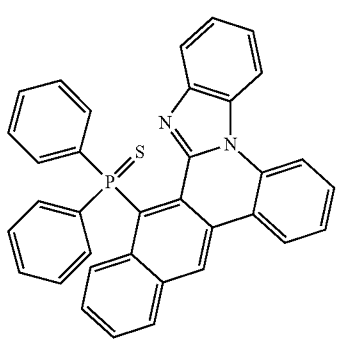
-continued
[Compound 7-213]
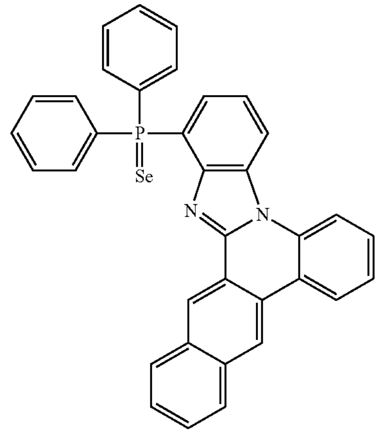
[Compound 7-214]
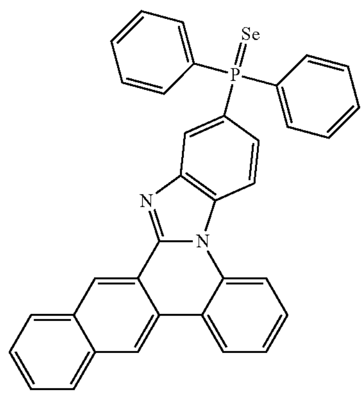
[Compound 7-215]
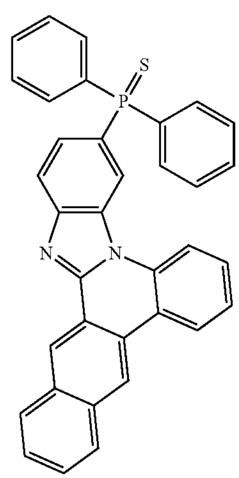

-continued
[Compound 7-216]
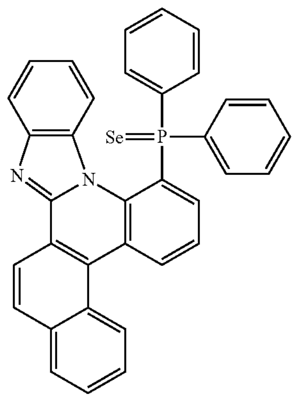
[Compound 7-217]
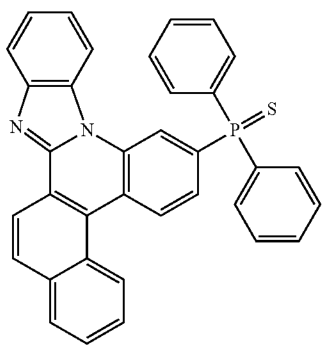
[Compound 7-218]
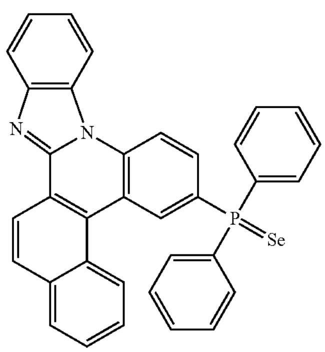
[Compound 7-219]
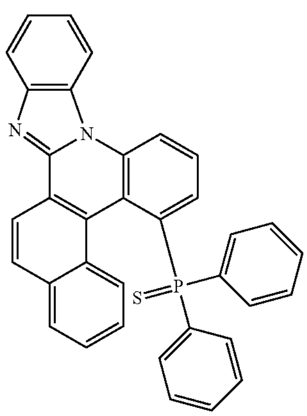
-continued
[Compound 7-220]
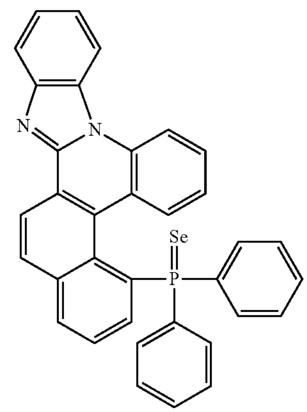
[Compound 7-221]
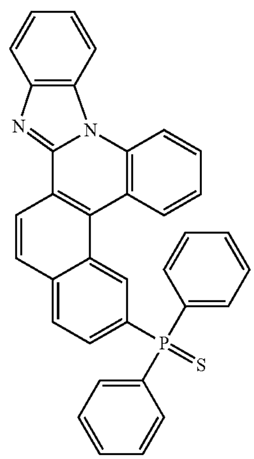
[Compound 7-222]
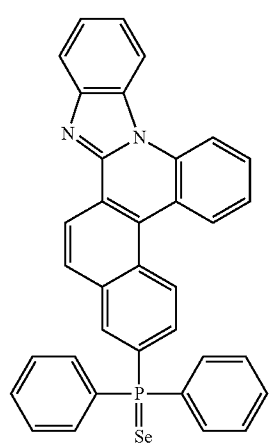

-continued
[Compound 7-223]
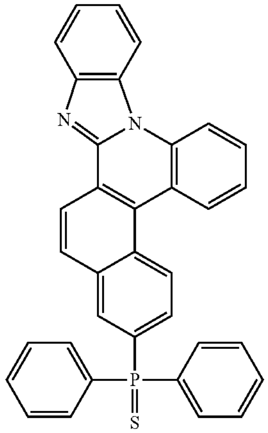
[Compound 7-224]
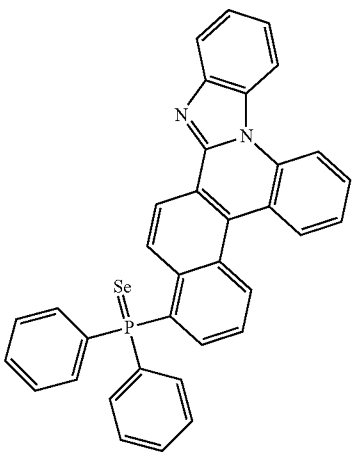
[Compound 7-225]
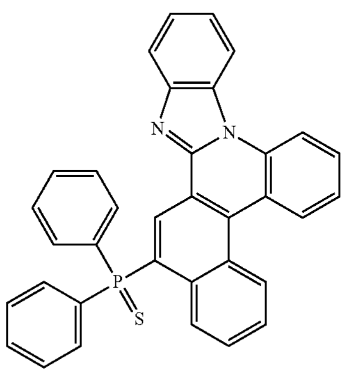
[Compound 7-226]
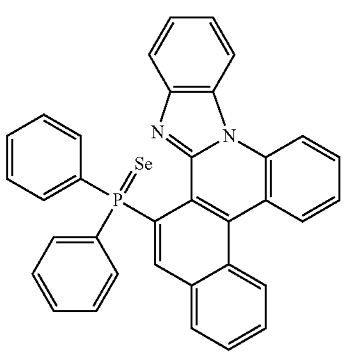
-continued
[Compound 7-227]
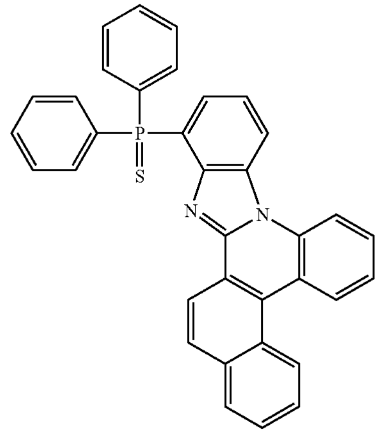
[Compound 7-228]
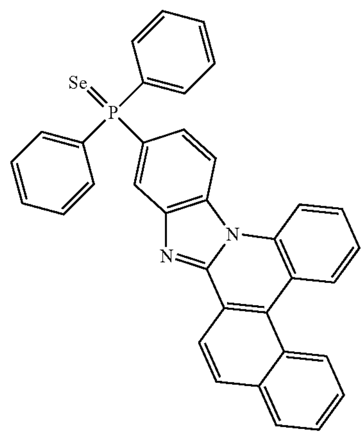
[Compound 7-229]
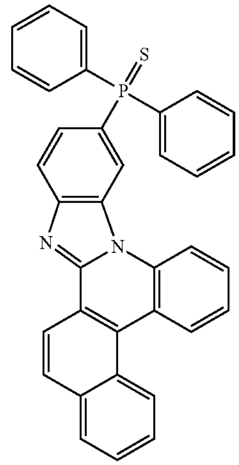

-continued
[Compound 7-230]
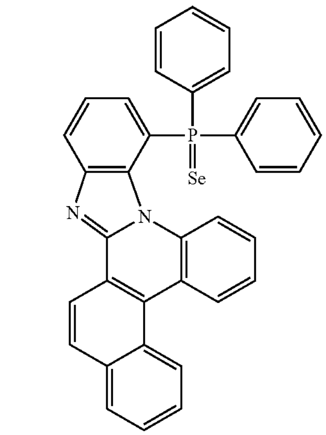
[Compound 7-231]
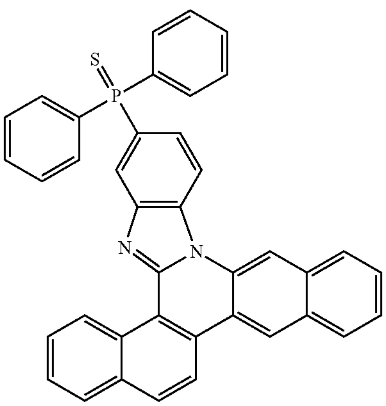
[Compound 7-232]
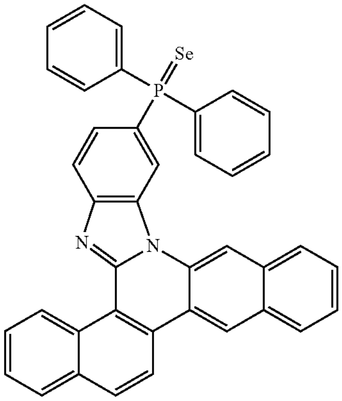
-continued
[Compound 7-233]
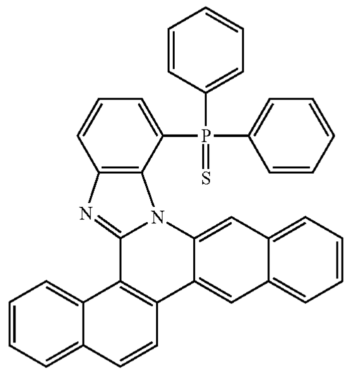
[Compound 7-234]
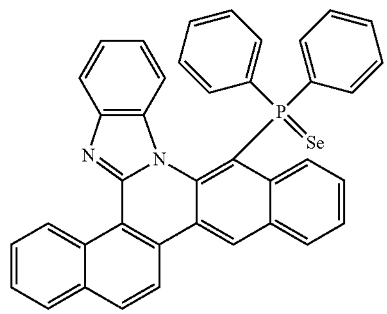
[Compound 7-235]
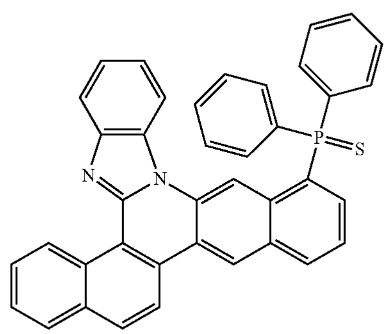
[Compound 7-236]
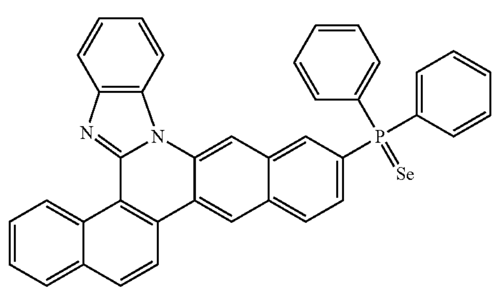

-continued
[Compound 7-237]
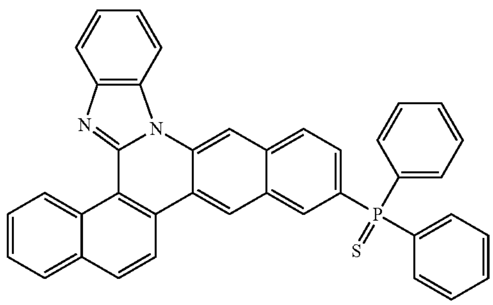
[Compound 7-238]
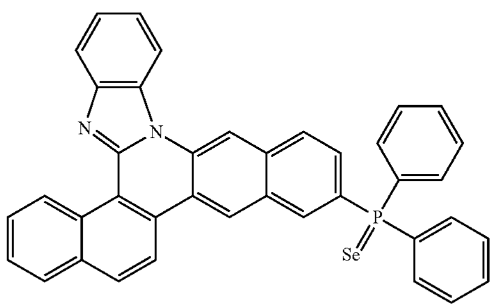
[Compound 7-239]
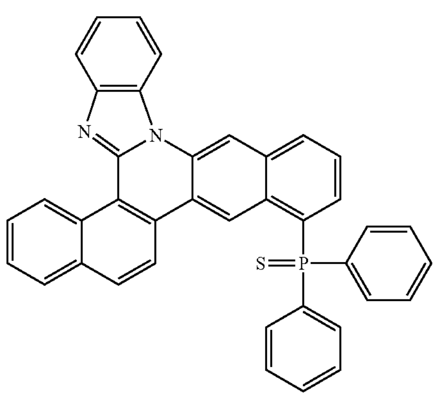
[Compound 7-240]
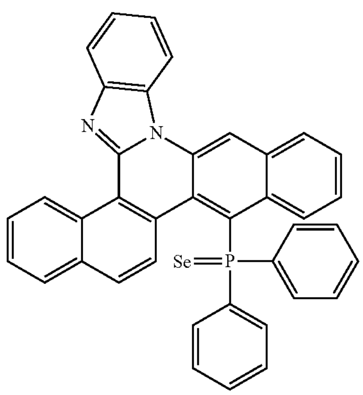
-continued
[Compound 7-241]
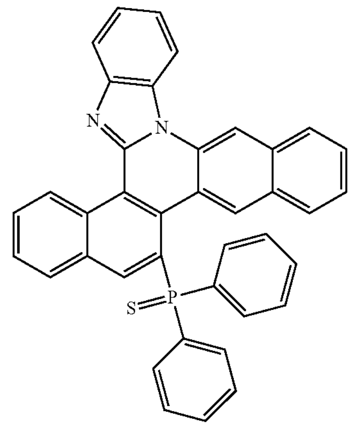
[Compound 7-242]
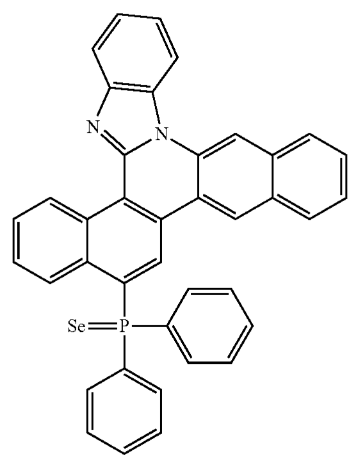
[Compound 7-243]
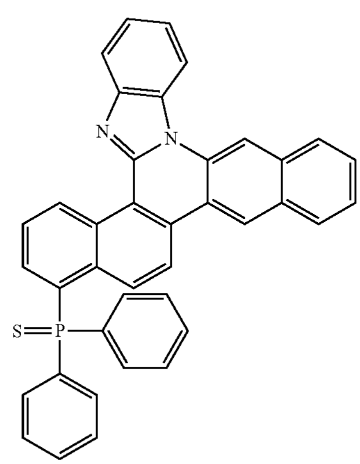

-continued
[Compound 7-244]
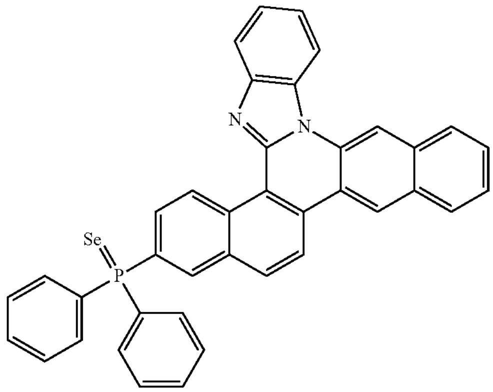
[Compound 7-245]
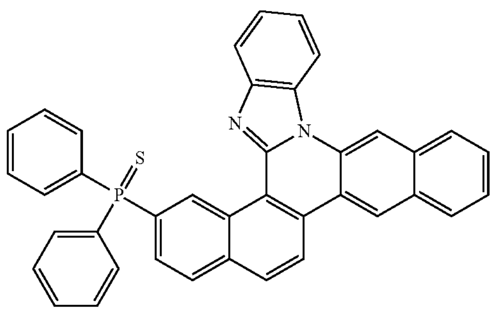
[Compound 7-246]
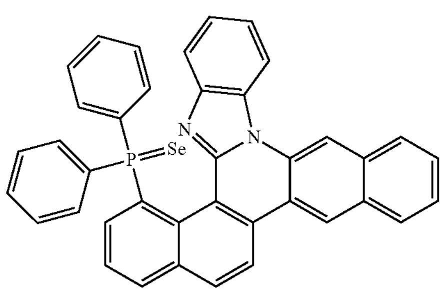
[Compound 7-247]
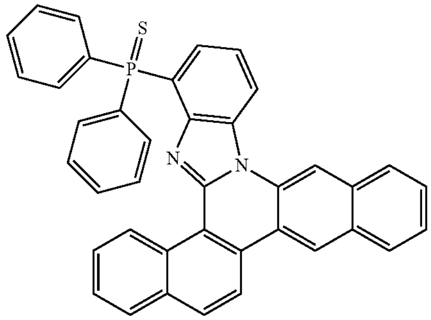
-continued
[Compound 7-248]
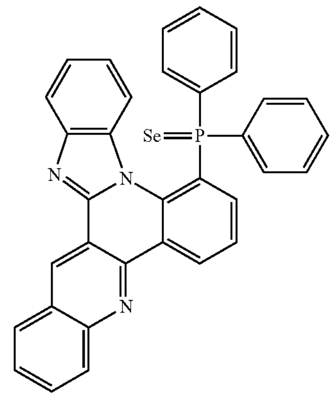
[Compound 7-249]
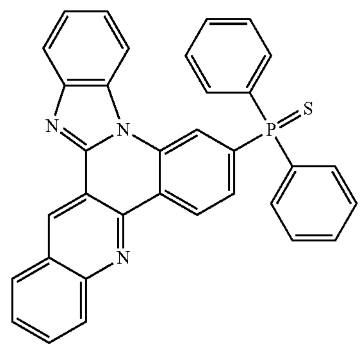
[Compound 7-250]
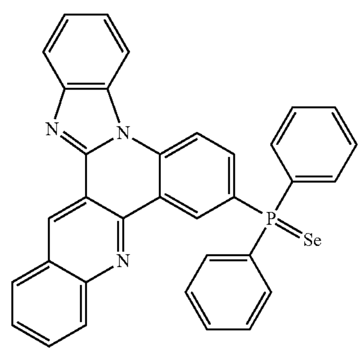
[Compound 7-251]
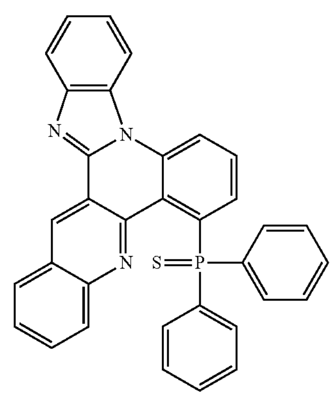

-continued
[Compound 7-252]
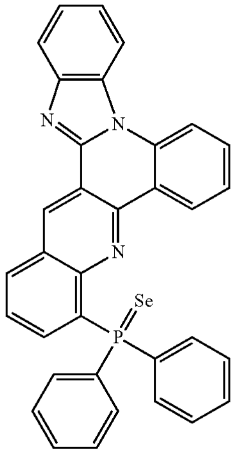
[Compound 7-253]
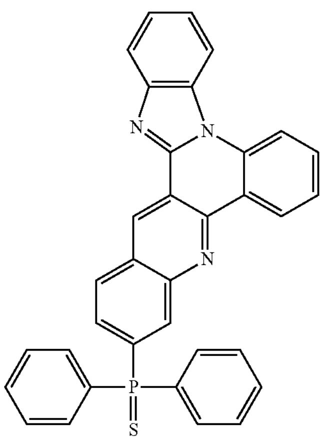
[Compound 7-254]
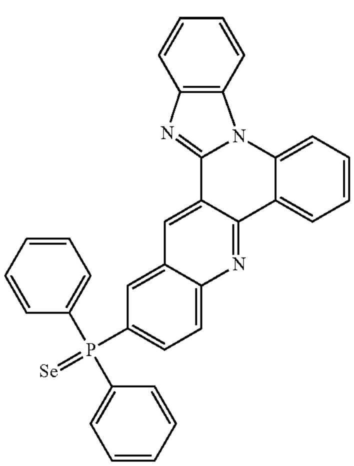
-continued
[Compound 7-255]
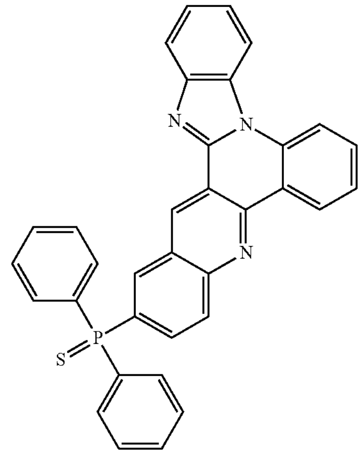
According to an exemplary embodiment of the present invention, the compound of Chemical Formula 1 may be any one selected from the following Compounds 8-1 to 8-75. However, the compound of Chemical Formula 1 is not limited to the following compounds.
[Compound 8-1]
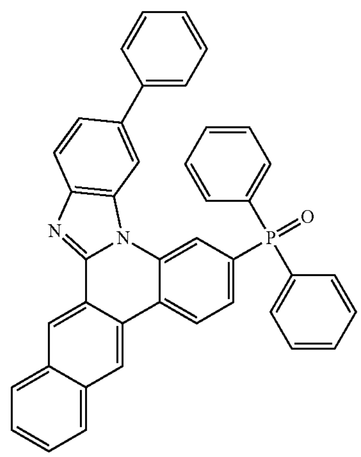
[Compound 8-2]
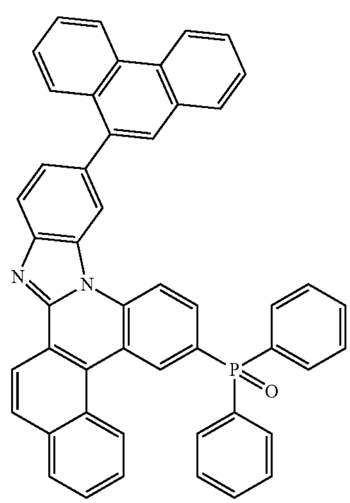

-continued
[Compound 8-3]
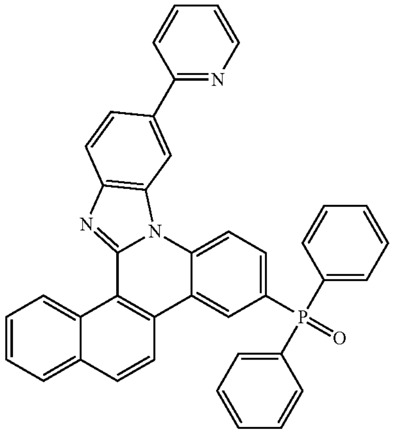
[Compound 8-4]
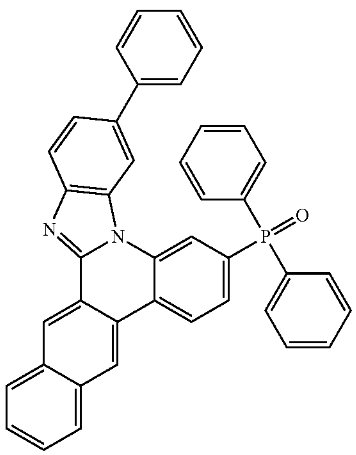
[Compound 8-5]
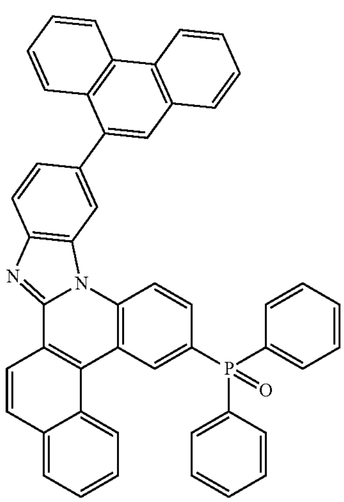
-continued
[Compound 8-6]
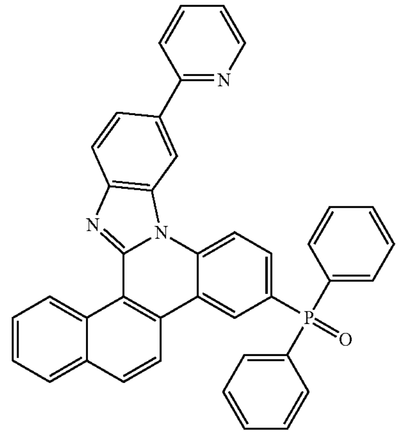
[Compound 8-7]
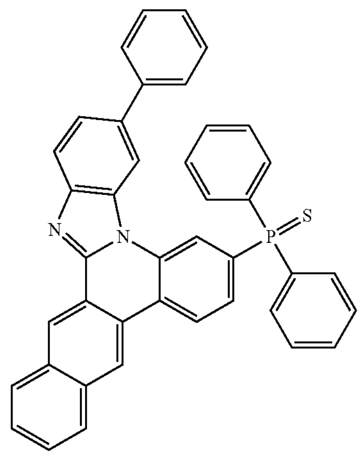
[Compound 8-8]
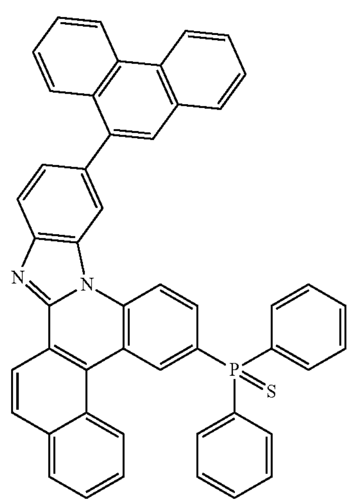

-continued
[Compound 8-9]
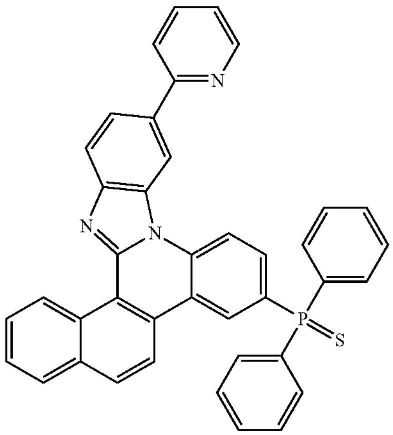
[Compound 8-10]
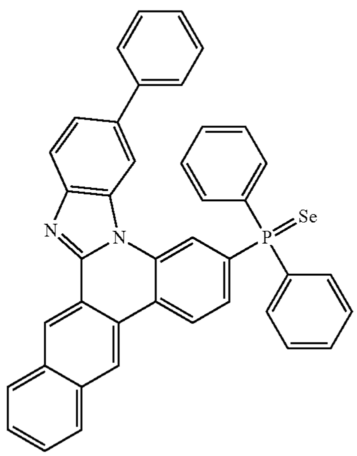
[Compound 8-11]
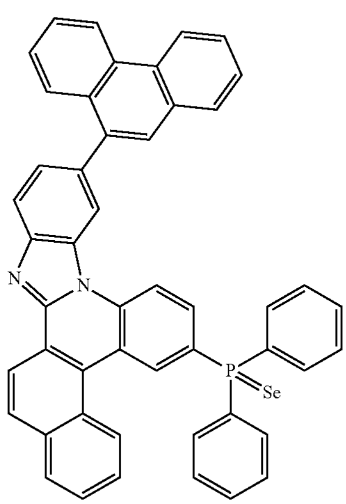
-continued
[Compound 8-12]
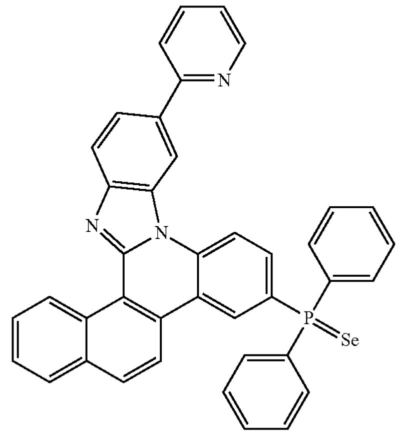
[Compound 8-13]
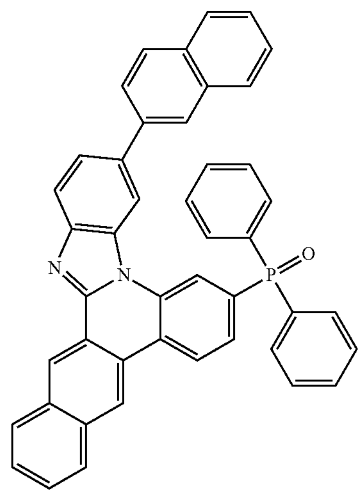
[Compound 8-14]
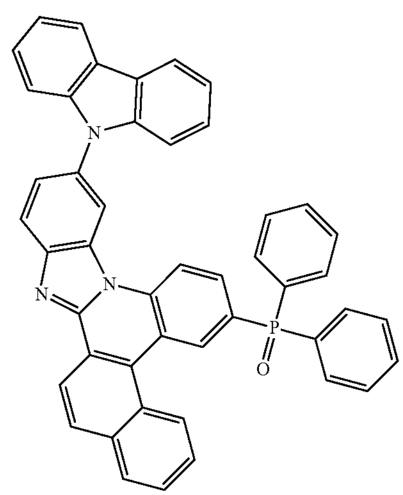

-continued
[Compound 8-15]
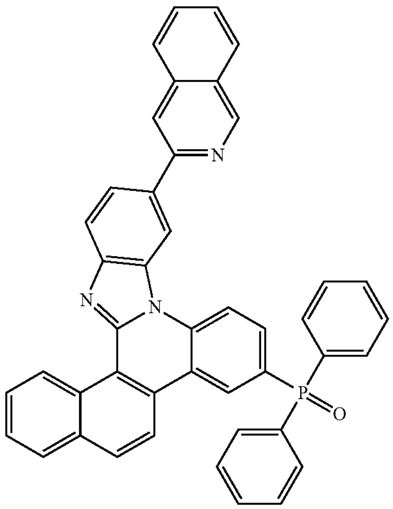
[Compound 8-16]
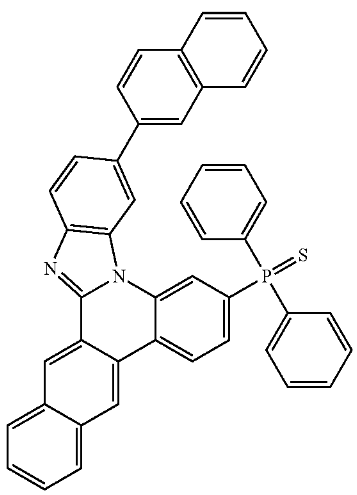
[Compound 8-17]
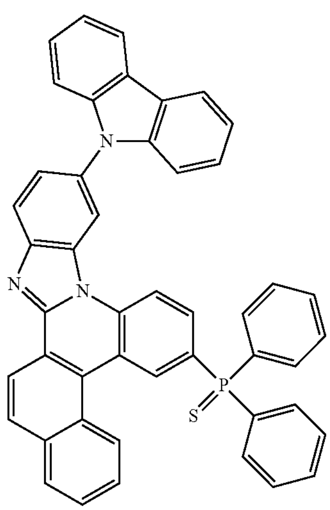
-continued
[Compound 8-18]
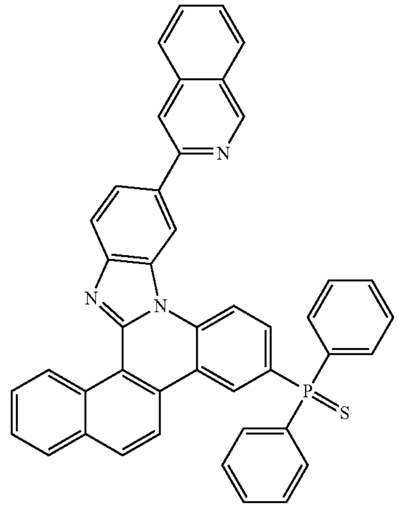
[Compound 8-19]
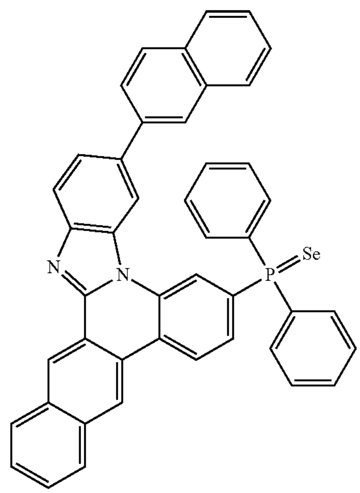
[Compound 8-20]
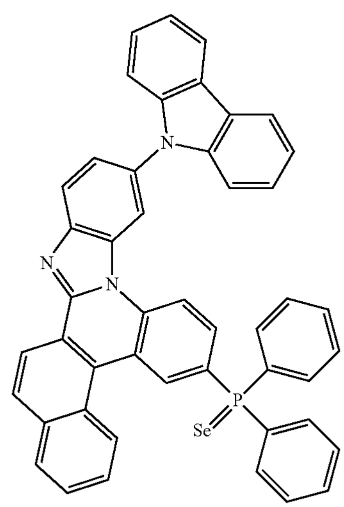

-continued
[Compound 8-21]
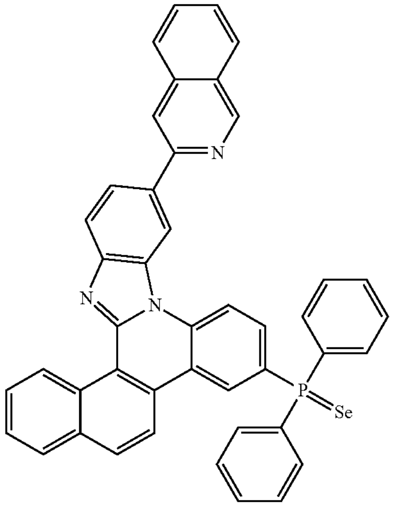
[Compound 8-22]
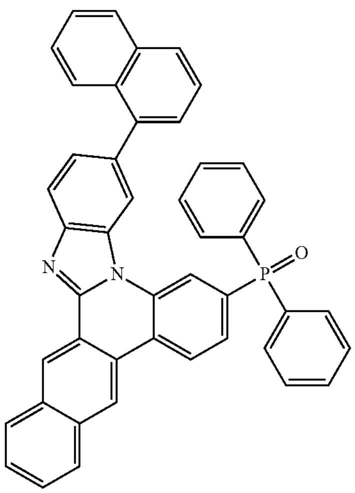
[Compound 8-23]
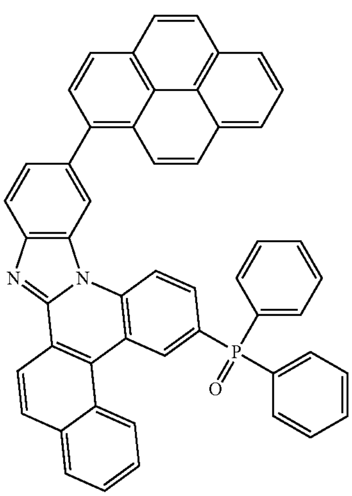
-continued
[Compound 8-24]
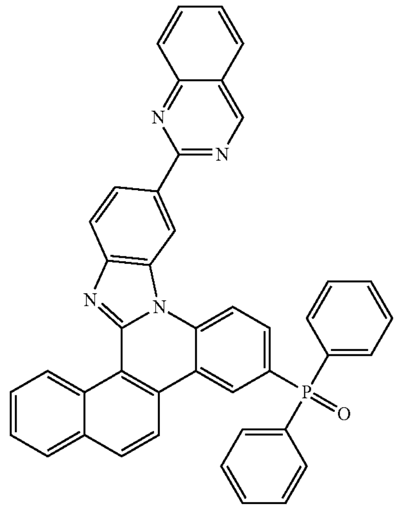
[Compound 8-25]
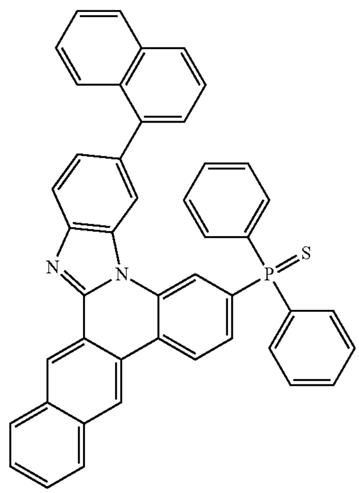
[Compound 8-26]
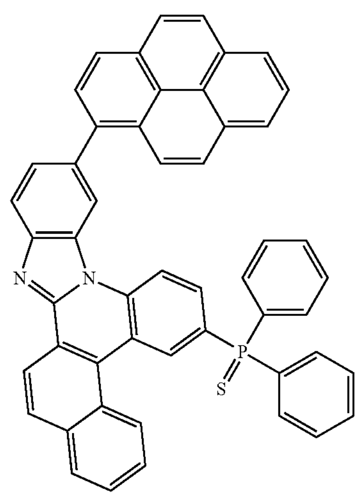

[Compound 8-27]
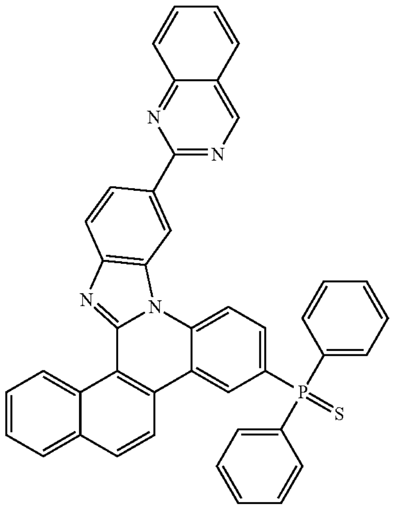
[Compound 8-28]
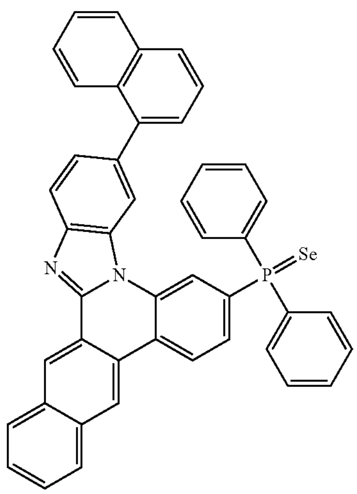
[Compound 8-29]
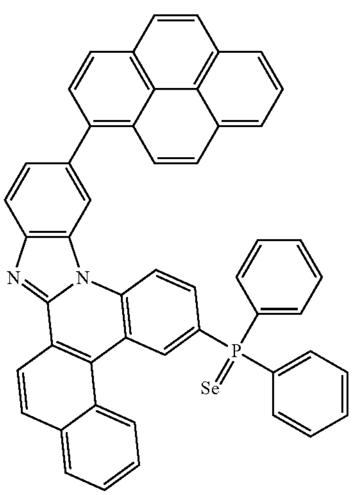
[Compound 8-30]
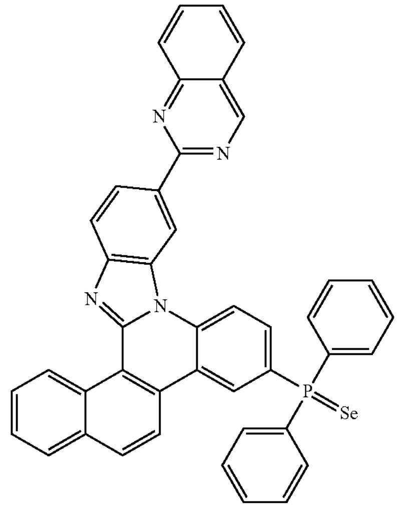
[Compound 8-31]
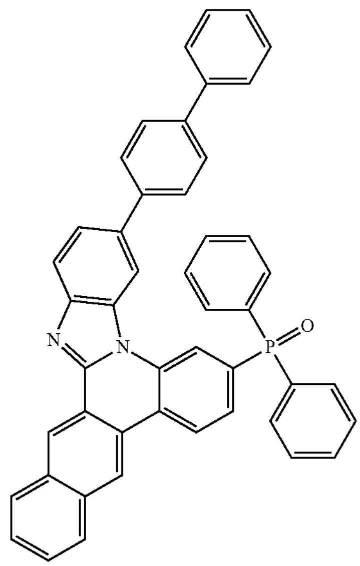
[Compound 8-32]
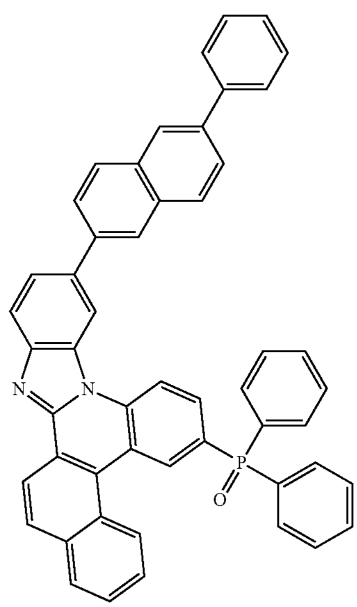

-continued
[Compound 8-33]
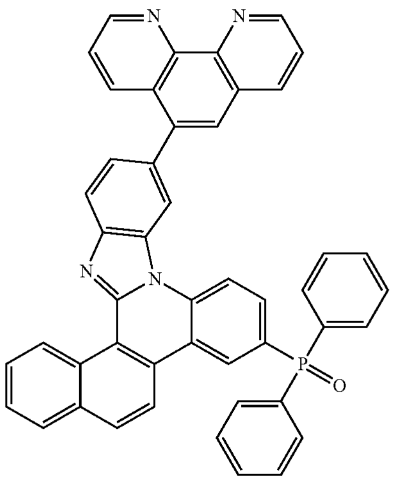
[Compound 8-34]
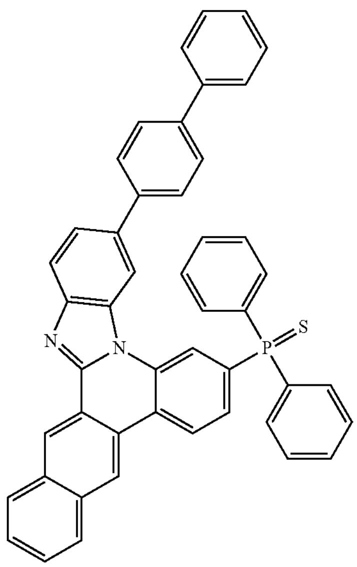
[Compound 8-35]
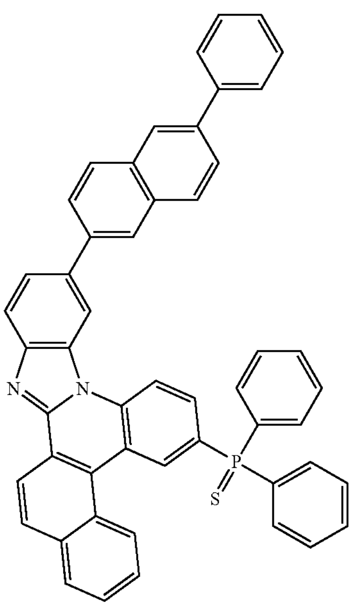
-continued
[Compound 8-36]
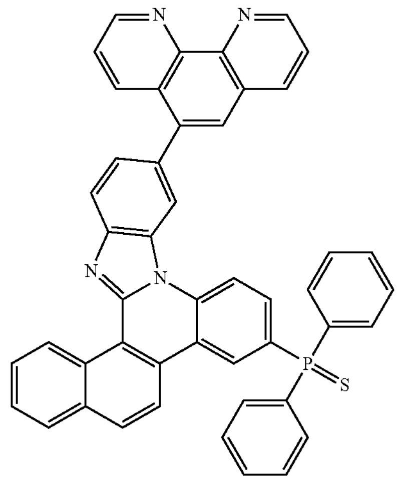
[Compound 8-37]
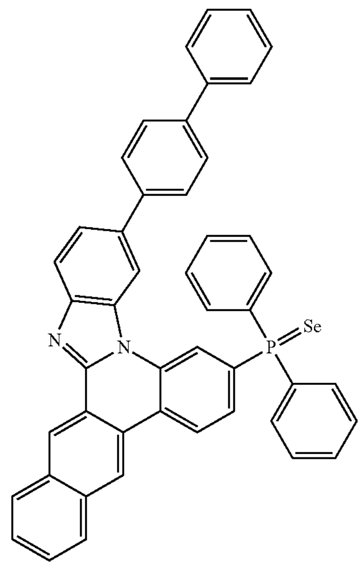
[Compound 8-38]
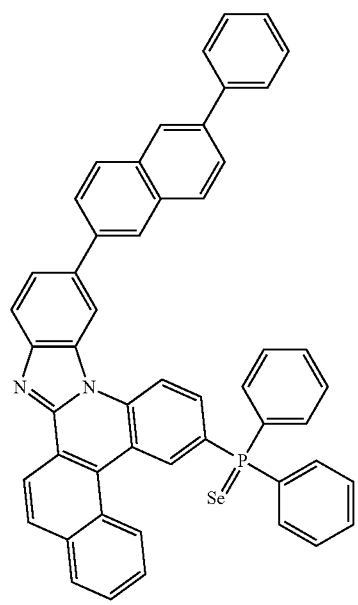

-continued
[Compound 8-39]
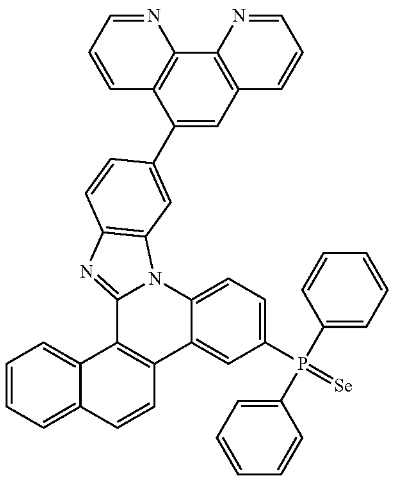
[Compound 8-40]
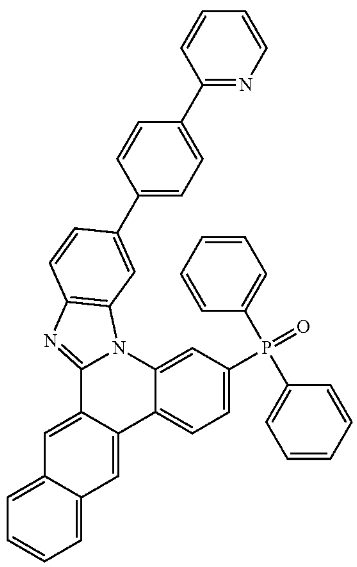
[Compound 8-41]
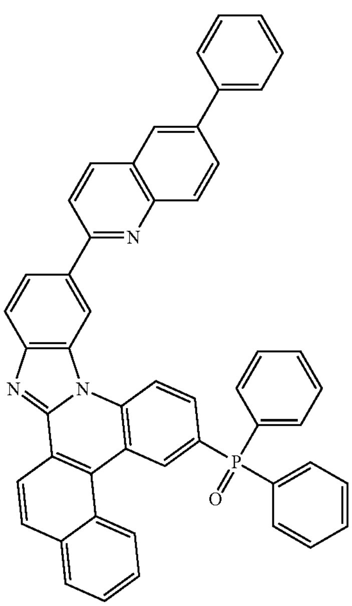
-continued
[Compound 8-42]
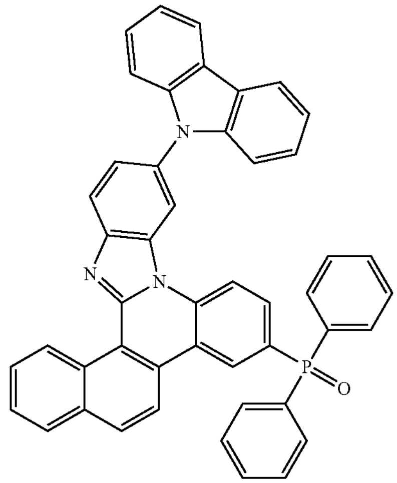
[Compound 8-43]
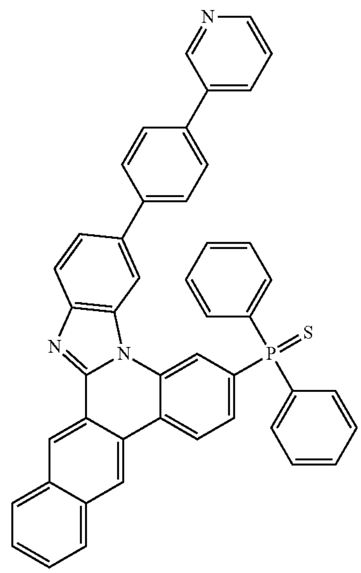
[Compound 8-44]
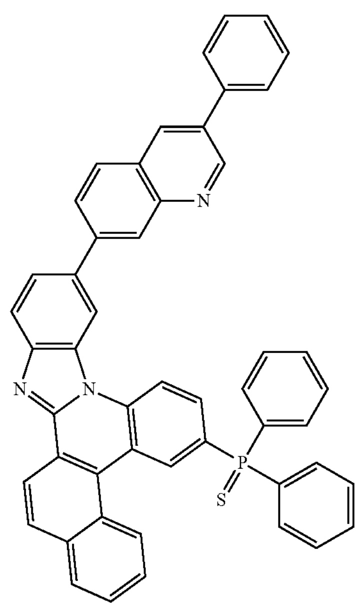

[Compound 8-45]
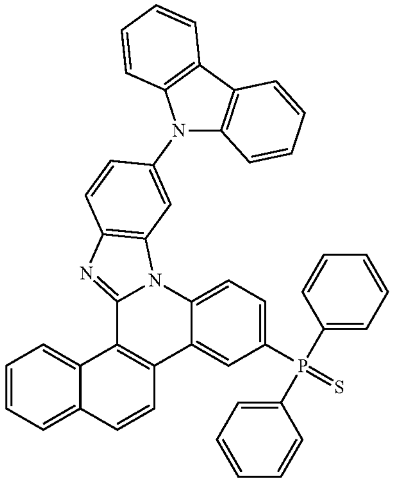
[Compound 8-46]
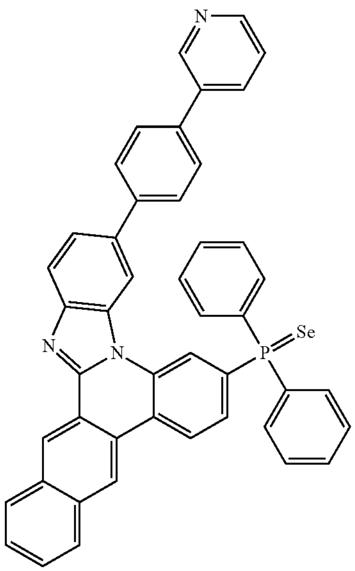
[Compound 8-47]
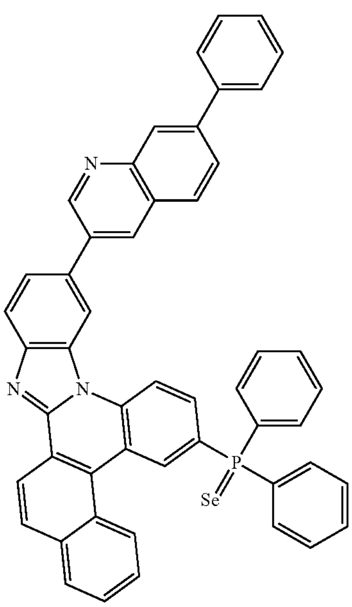
[Compound 8-48]
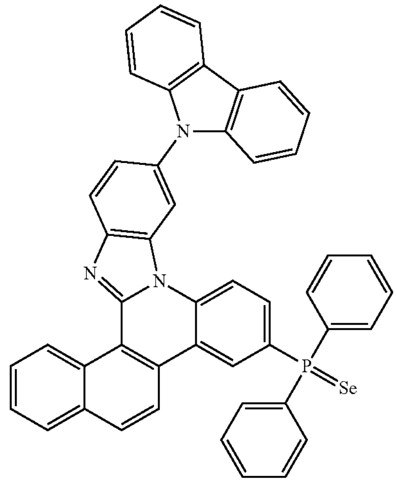
[Compound 8-49]
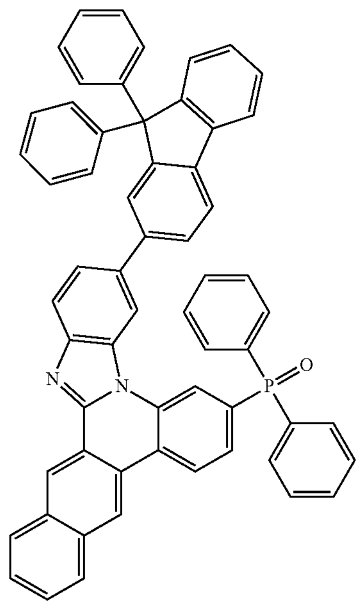
[Compound 8-50]
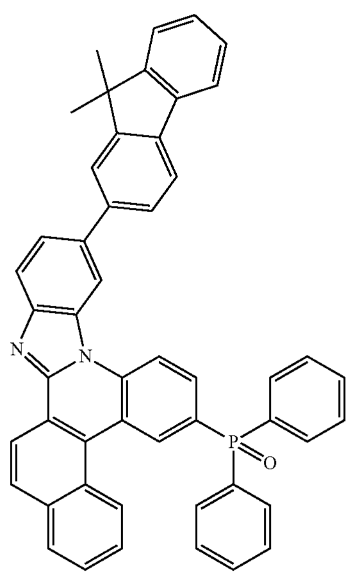

[Compound 8-51]
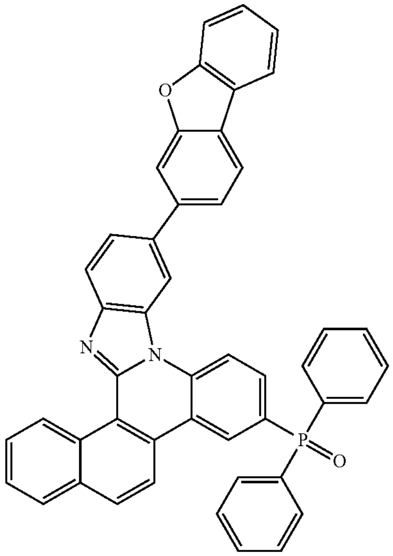
[Compound 8-52]
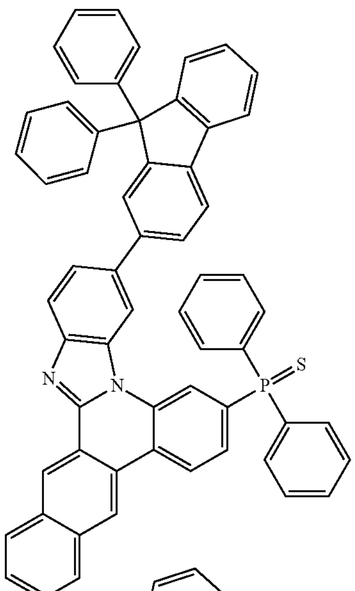
[Compound 8-53]
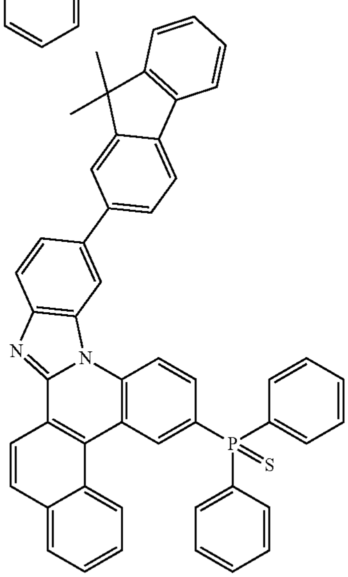
[Compound 8-54]
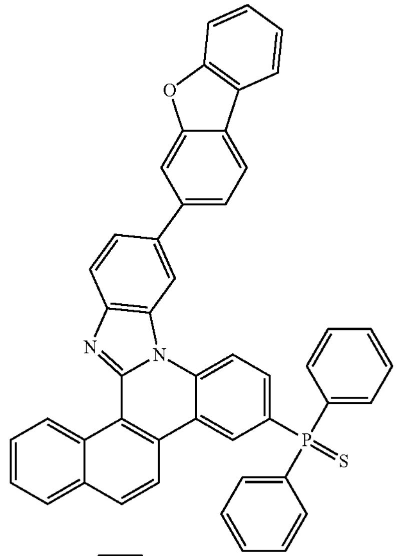
[Compound 8-55]
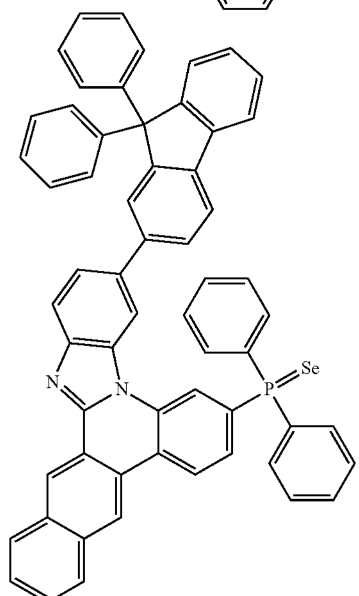
[Compound 8-56]
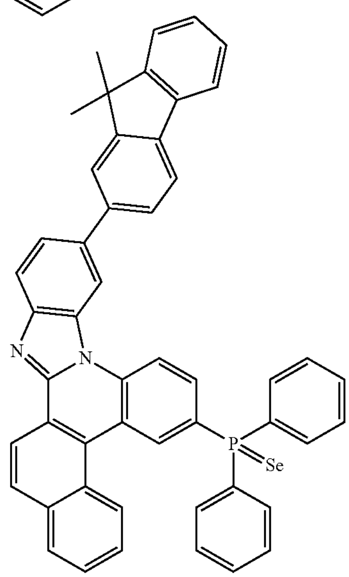

[Compound 8-57]
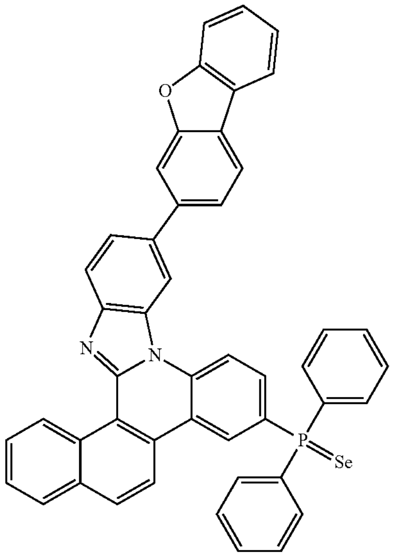
[Compound 8-58]
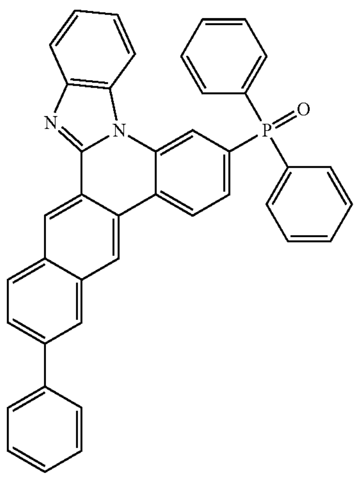
[Compound 8-59]
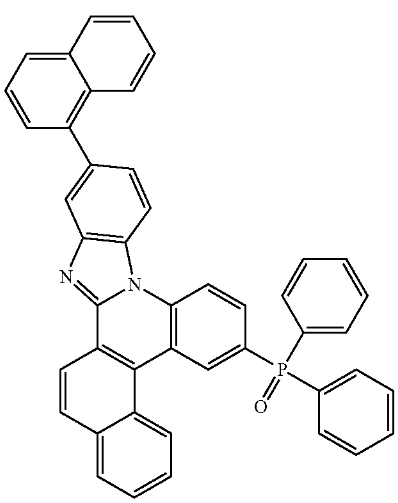
[Compound 8-60]
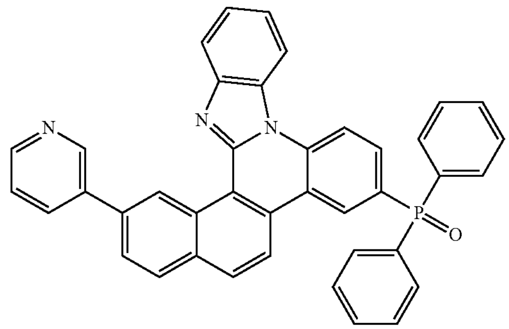
[Compound 8-61]
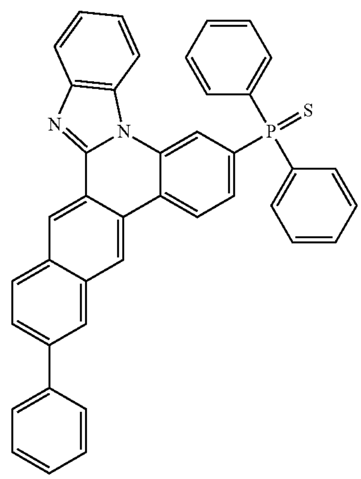
[Compound 8-62]
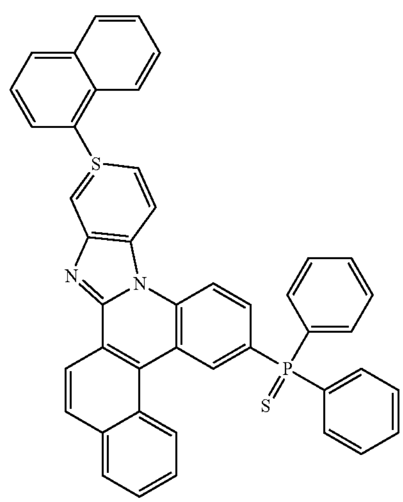

[Compound 8-63]
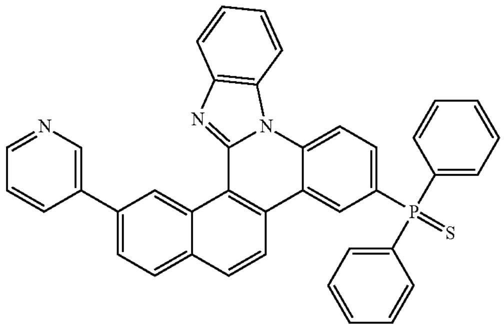
[Compouind 8-64]
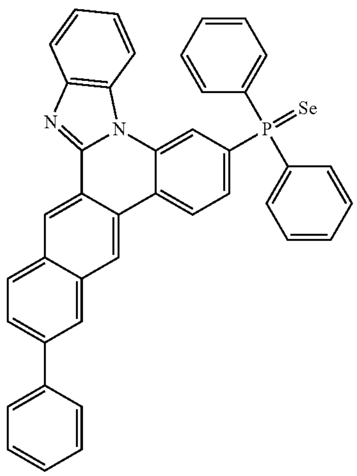
[Compouind 8-65]
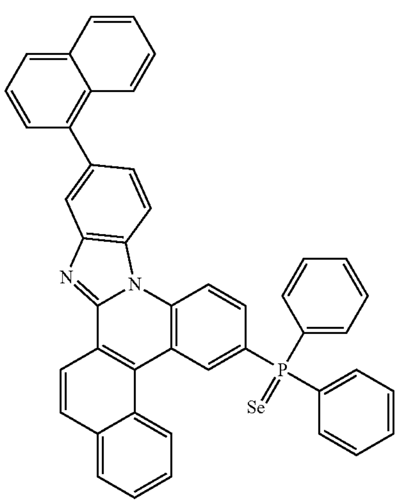
[Compouind 8-66]
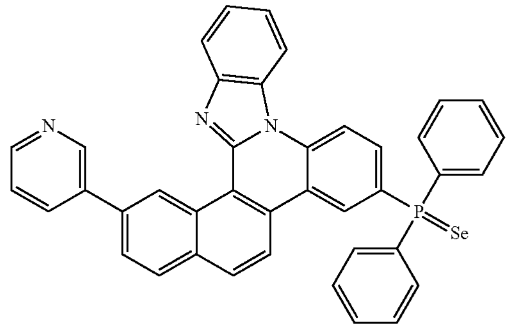
[Compound 8-67]
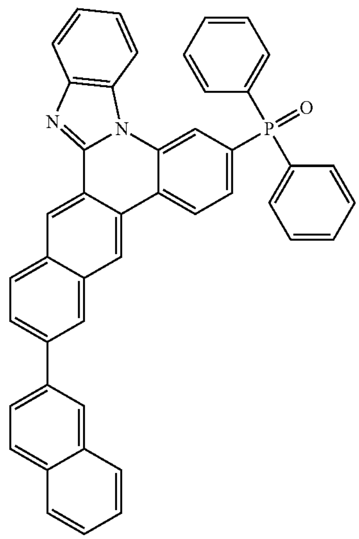
[Compound 8-68]
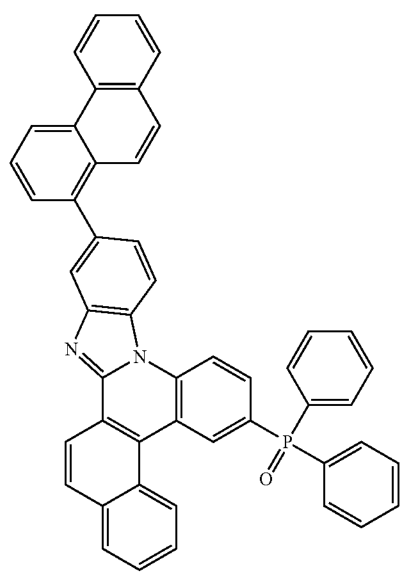

[Compound 8-69]
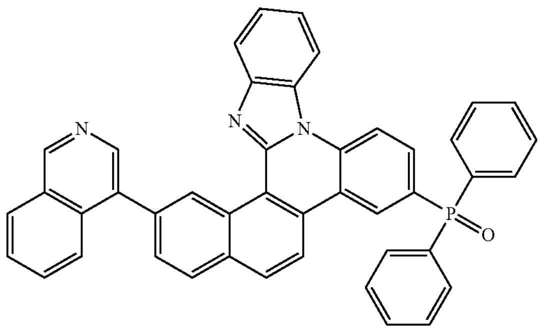
[Compound 8-70]
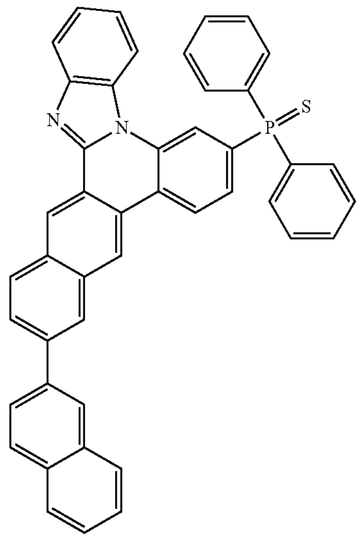
[Compound 8-71]
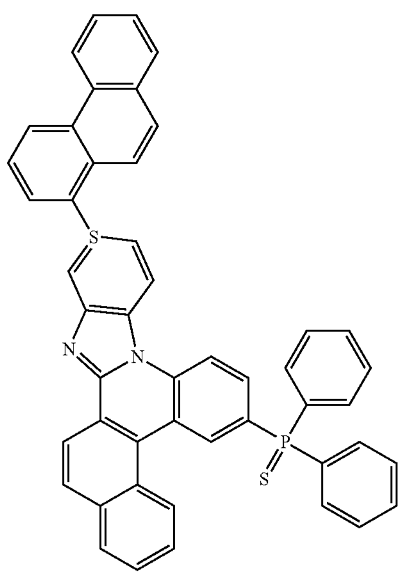
[Compound 8-72]
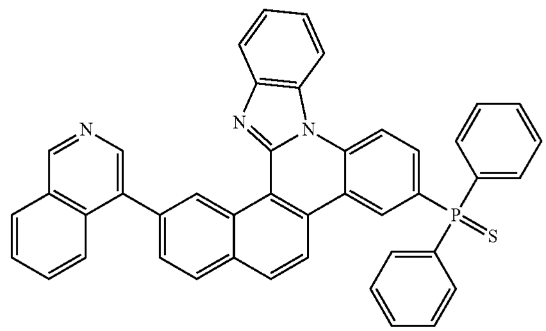
[Compound 8-73]
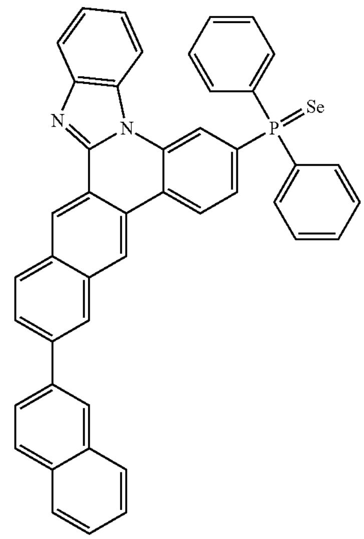
[Compound 8-74]
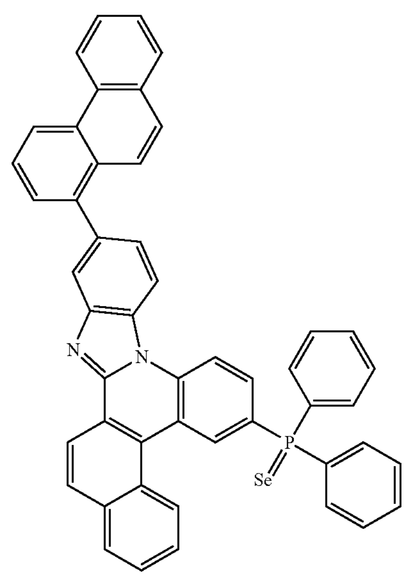

-continued
[Compound 8-75]
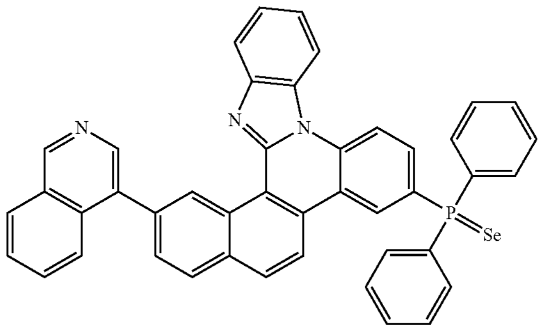
According to an exemplary embodiment of the present invention, the compound of Chemical Formula 1 may be any one selected from the following Compounds 9-1 to 9-36. However, the compound of Chemical Formula 1 is not limited to the following compounds.
[Compound 9-1]
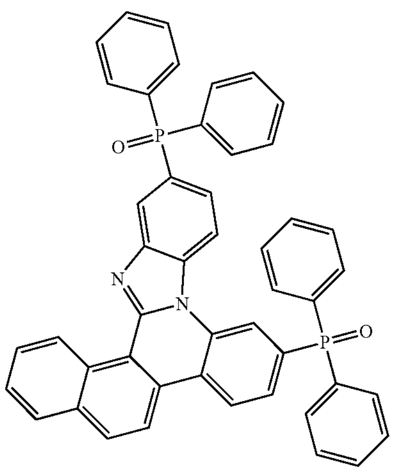
[Compound 9-2]
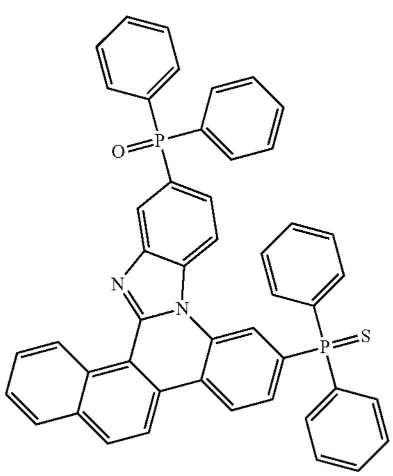
-continued
[Compound 9-3]
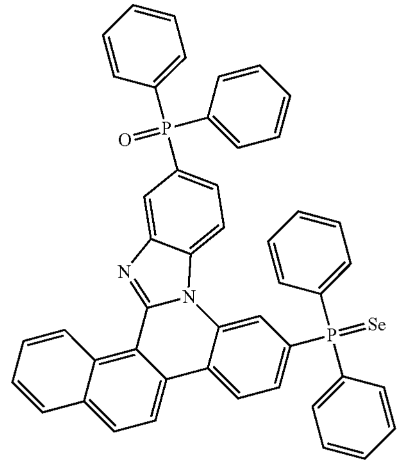
[Compound 9-4]
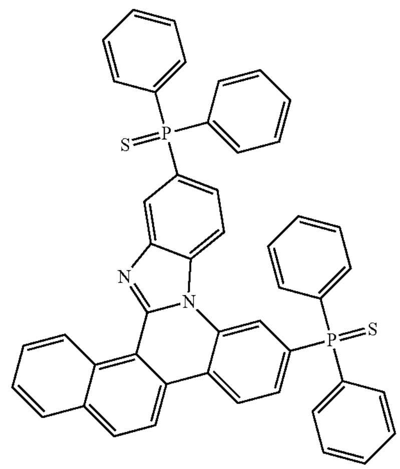
[Compound 9-5]
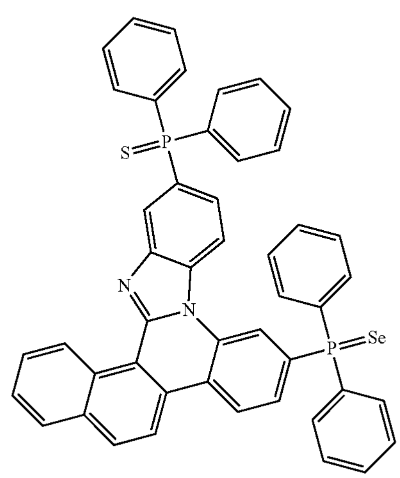

-continued
[Compound 9-6]
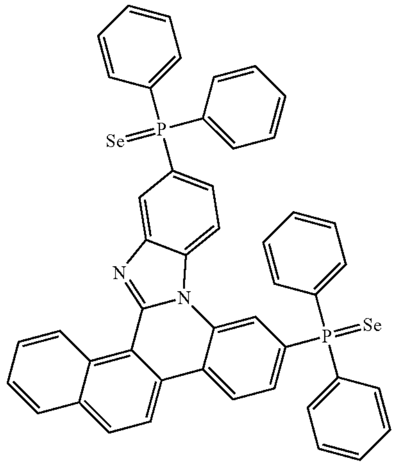
[Compound 9-7]
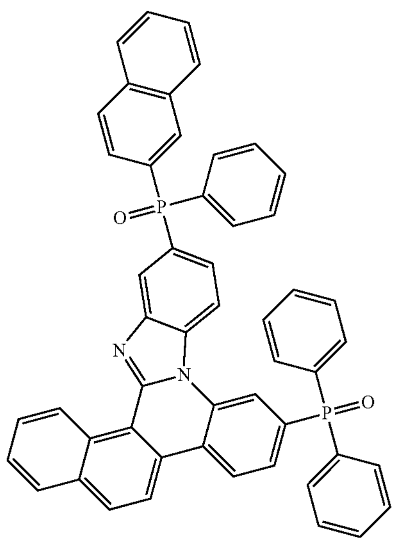
[Compound 9-8]
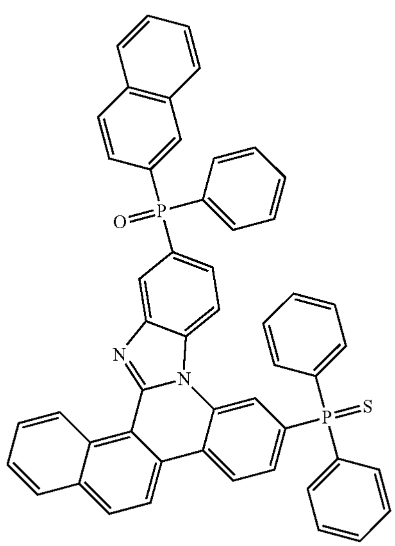
-continued
[Compound 9-9]
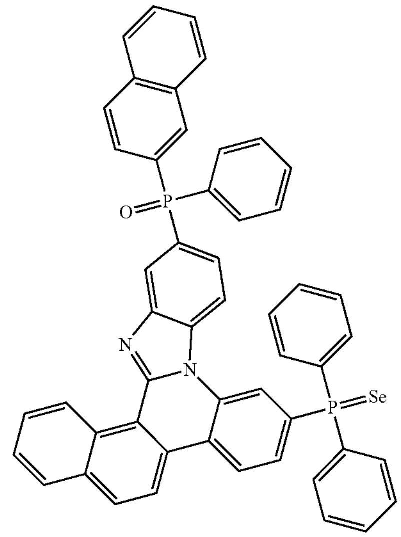
[Compound 9-10]
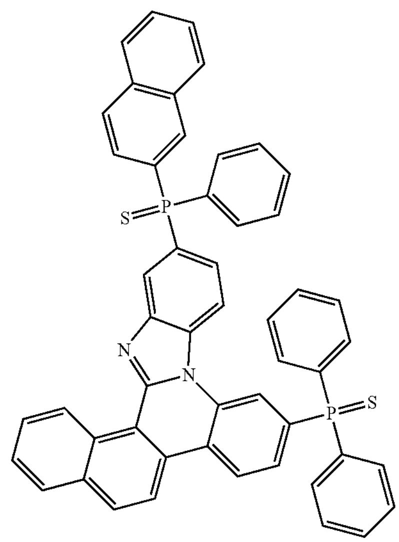
[Compound 9-11]
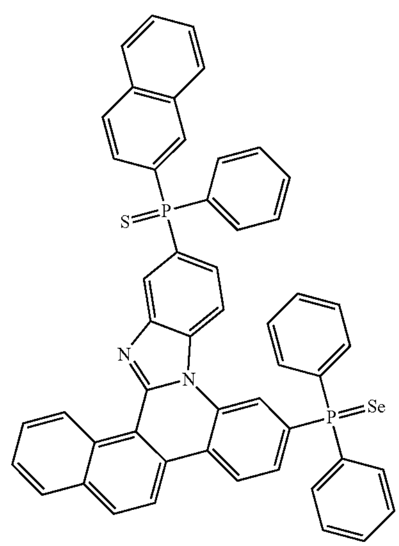

-continued
[Compound 9-12]
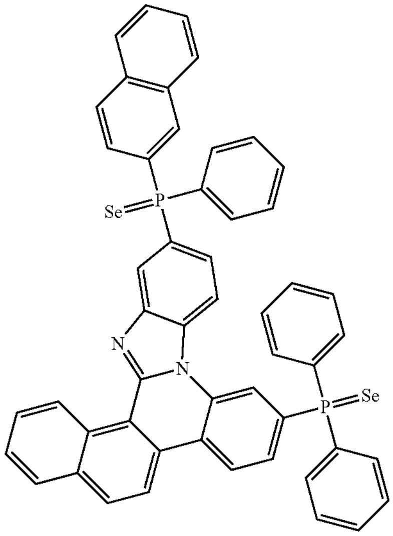
[Compound 9-13]
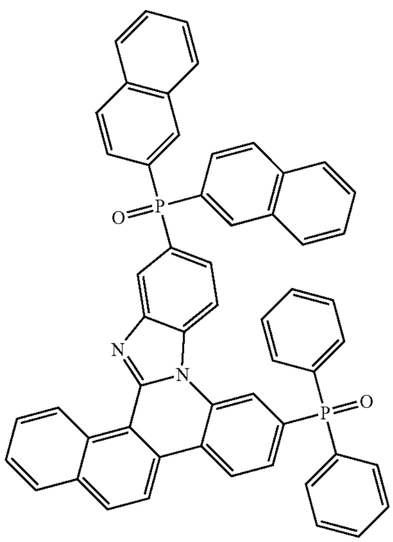
[Compound 9-14]
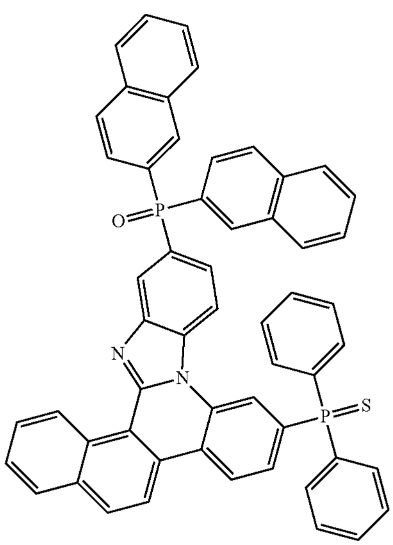
-continued
[Compound 9-15]
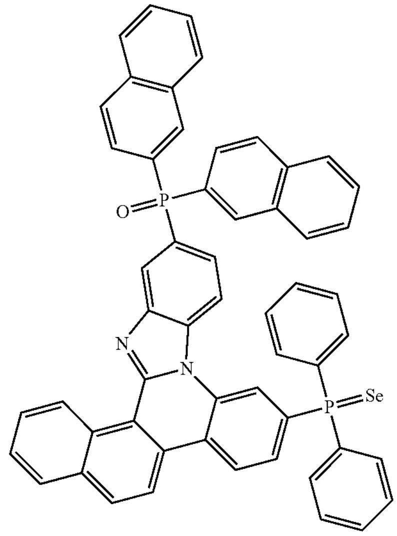
[Compound 9-16]
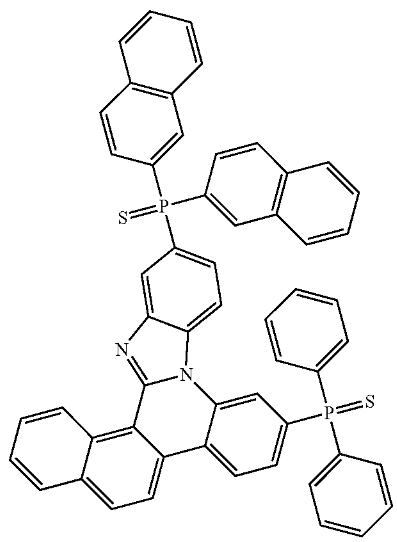
[Compound 9-17]
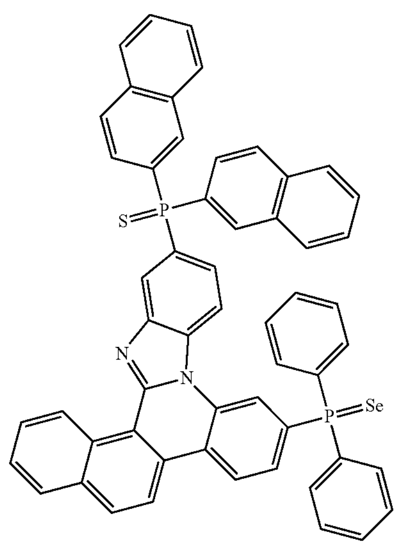

-continued
[Compound 9-18]
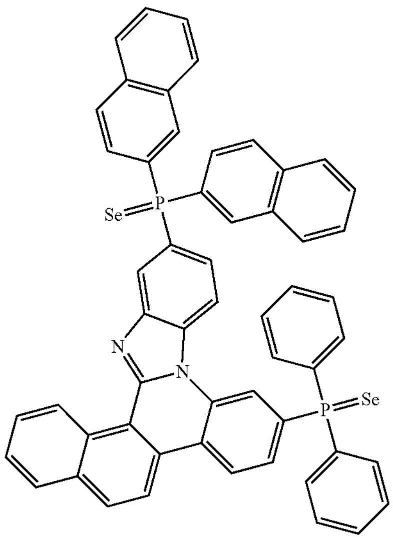
[Compound 9-19]
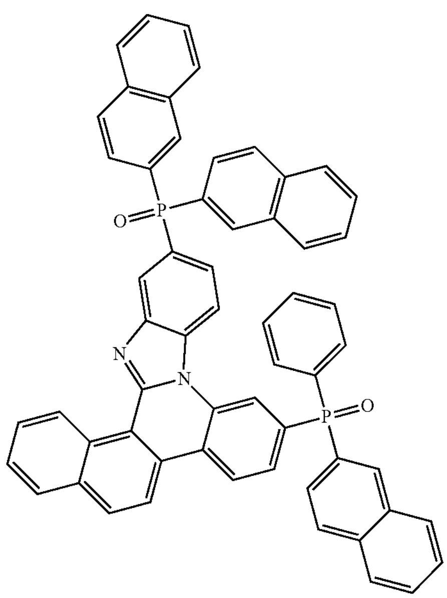
-continued
[Compound 9-20]
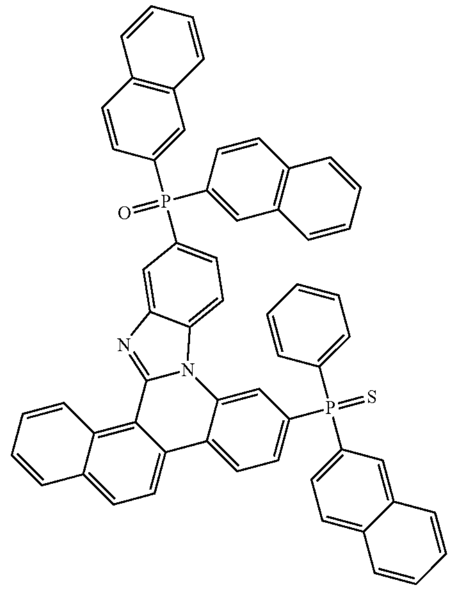
[Compound 9-21]
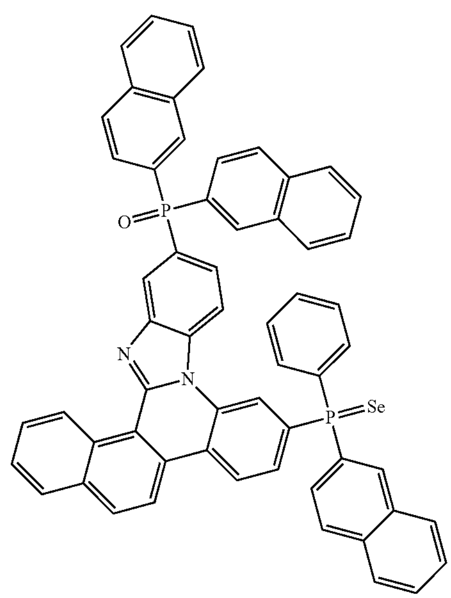

[Compound 9-22]
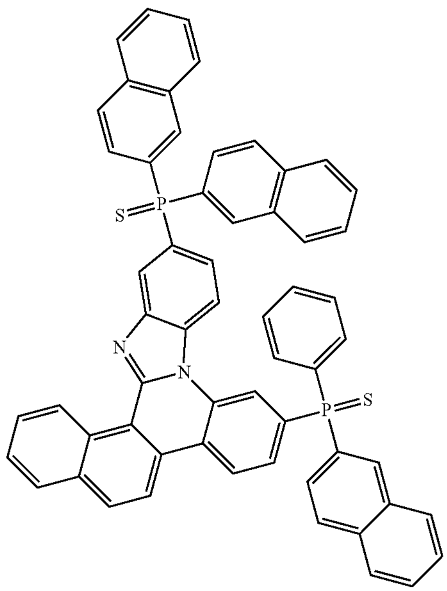
[Compound 9-23]
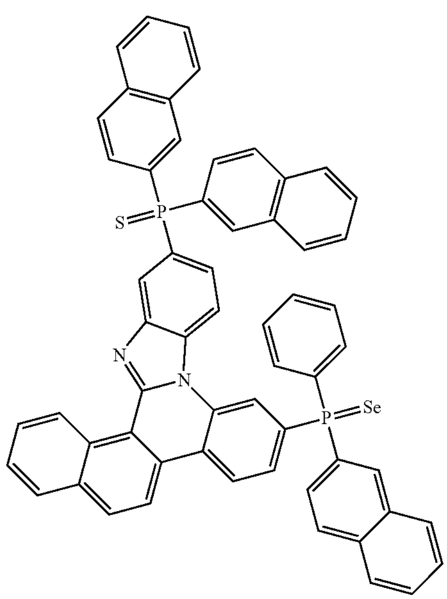
[Compound 9-24]
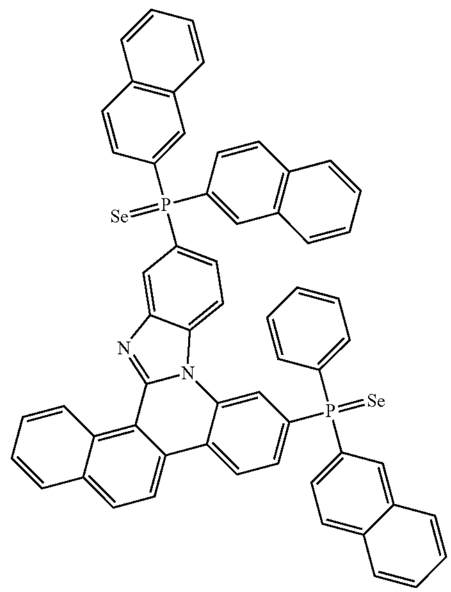
[Compound 9-25]
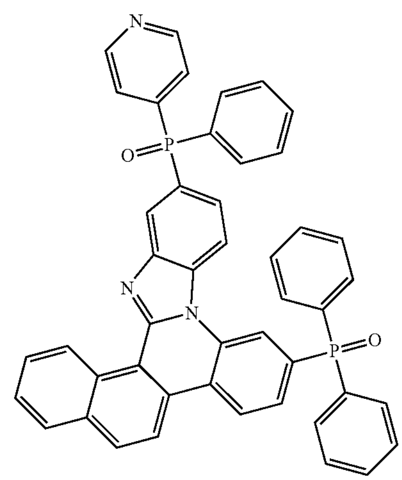
[Compound 9-26]
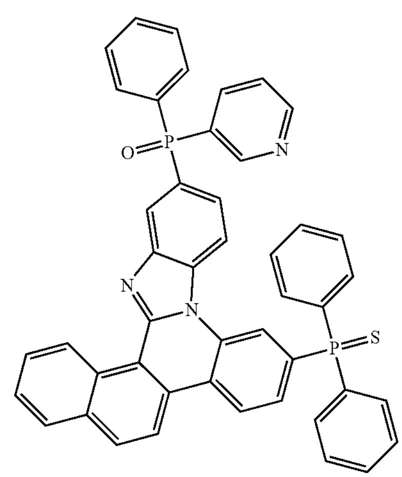

-continued
[Compound 9-27]
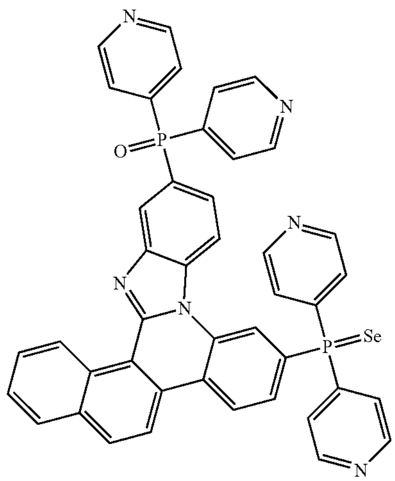
[Compound 9-28]
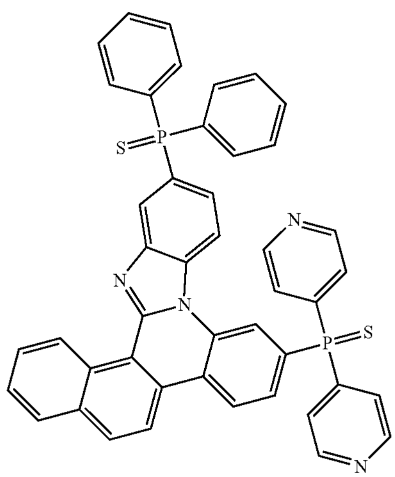
[Compound 9-29]
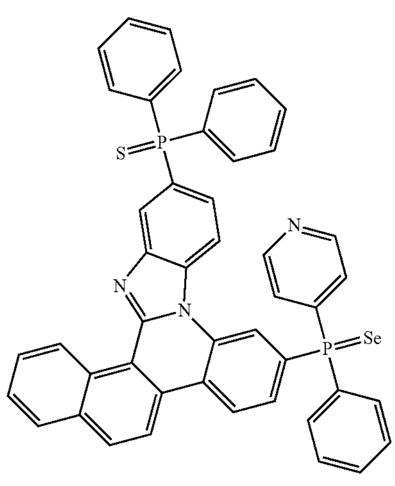
-continued
[Compound 9-30]
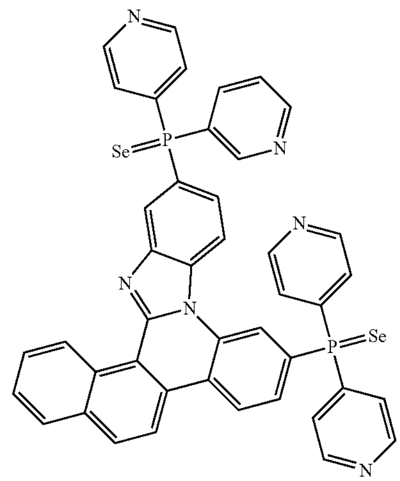
[Compound 9-31]
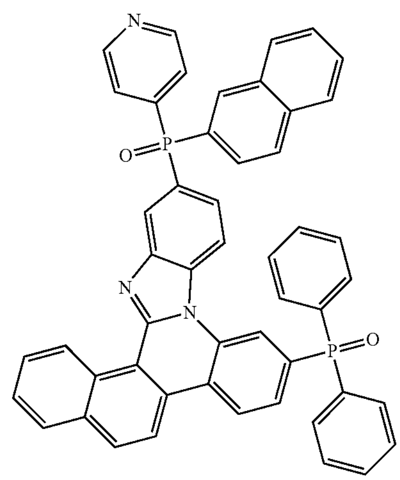
[Compound 9-32]
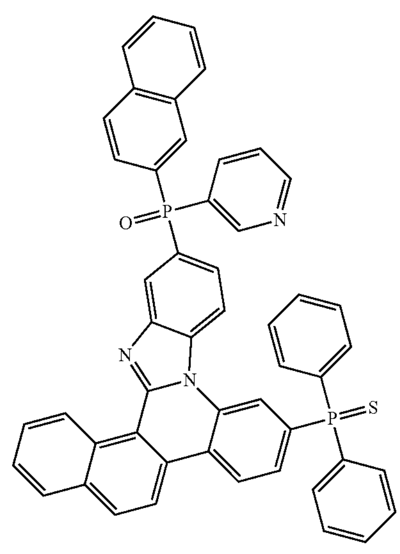

-continued
[Compound 9-33]
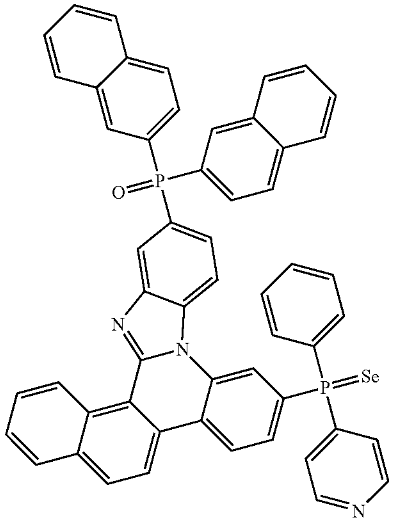
[Compound 9-34]
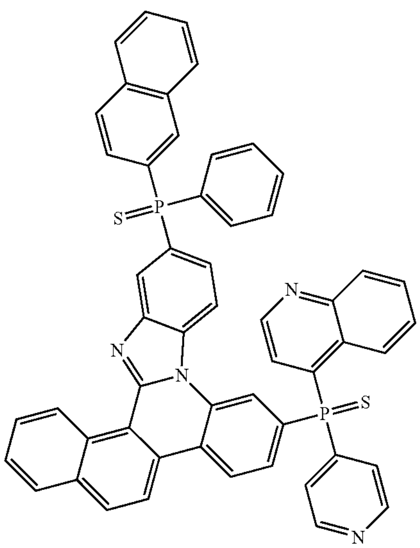
[Compound 9-35]
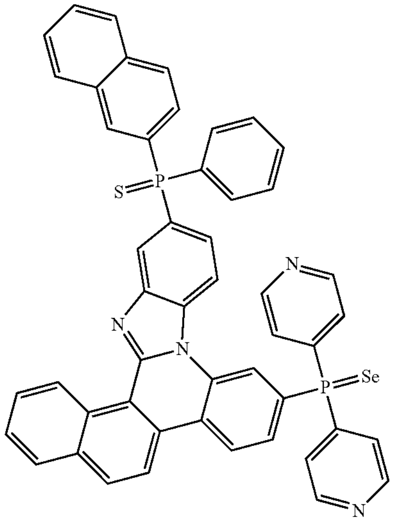
-continued
[Compound 9-36]
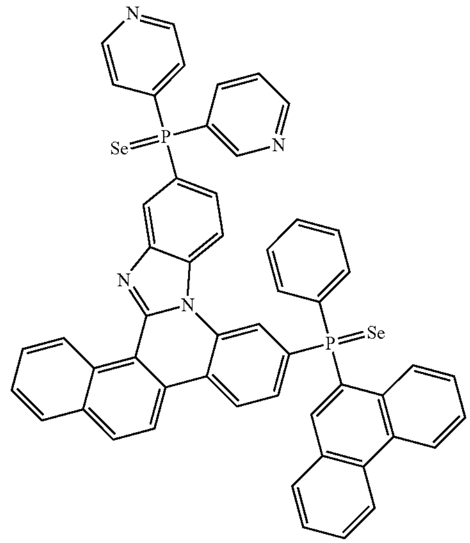
According to an exemplary embodiment of the present invention, the compound of Chemical Formula 1 may be any one selected from the following Compounds 10-1 to 10-32. However, the compound of Chemical Formula 1 is not limited to the following compounds.
[Compound 10-1]
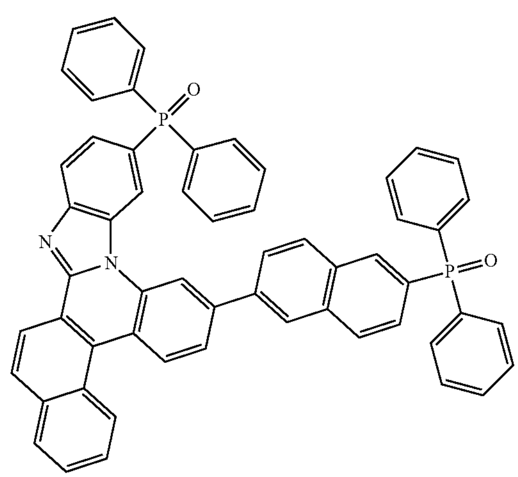

[Compound 10-2]
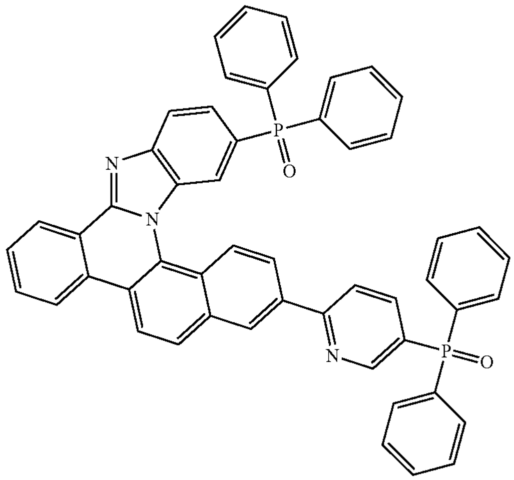
[Compound 10-3]
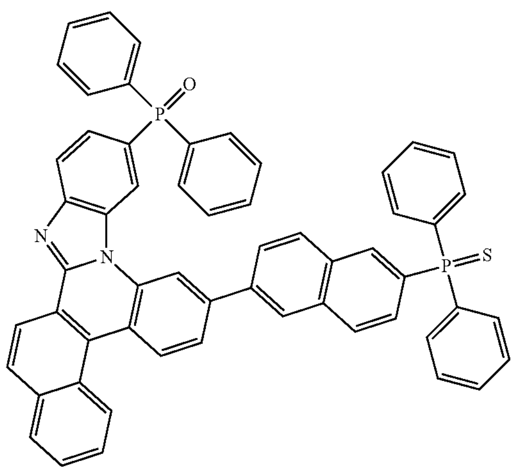
[Compound 10-4]
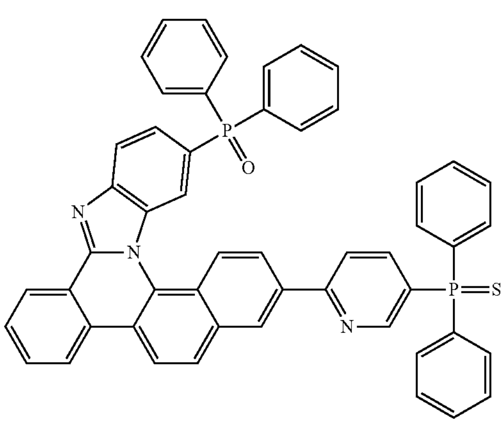
[Compound 10-5]
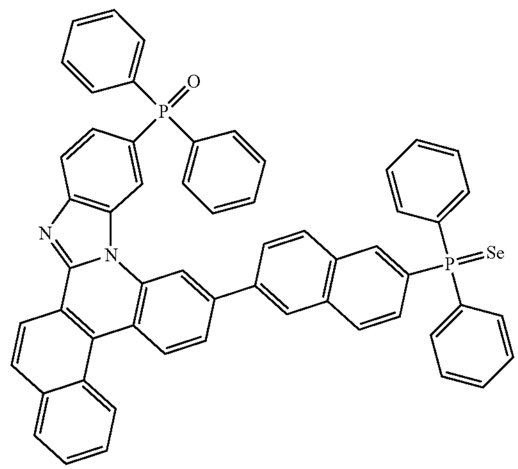
[Compound 10-6]
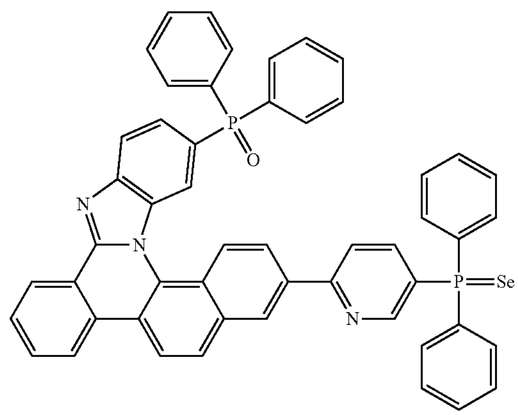
[Compound 10-7]
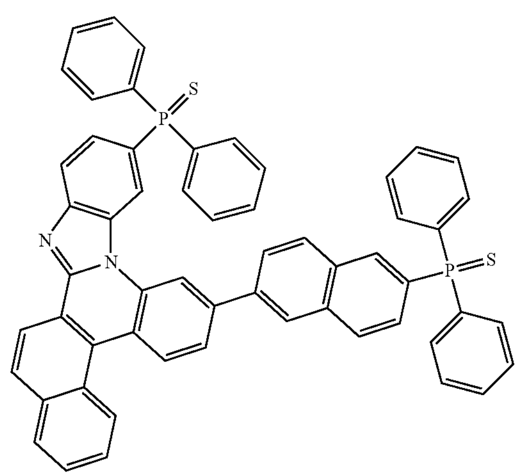

-continued
[Compound 10-8]
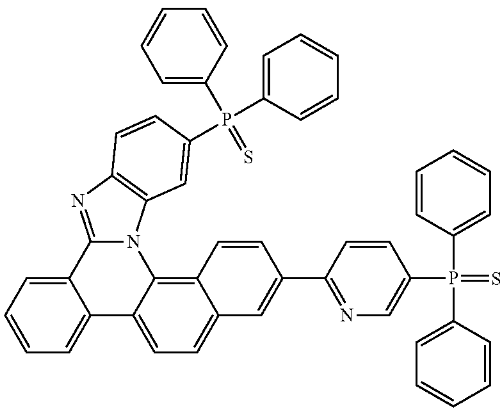
[Compound 10-9]
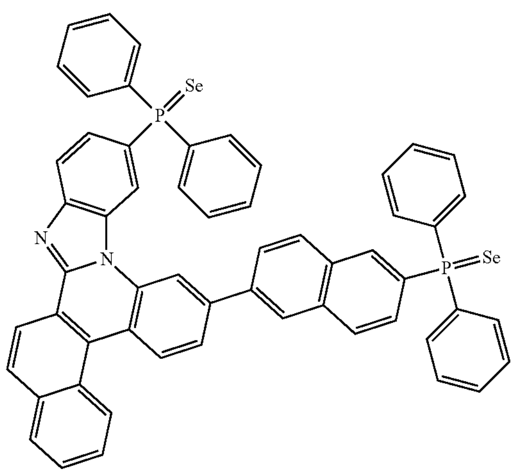
[Compound 10-10]
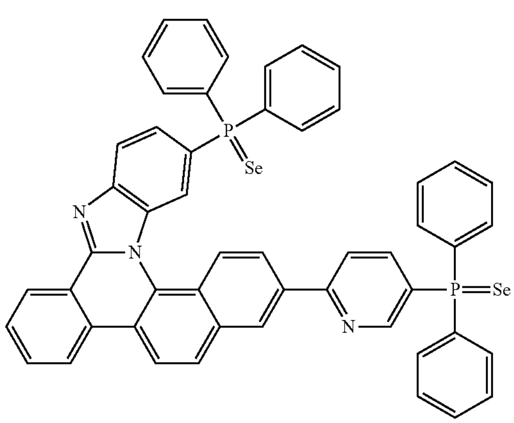
-continued
[Compound 10-11]
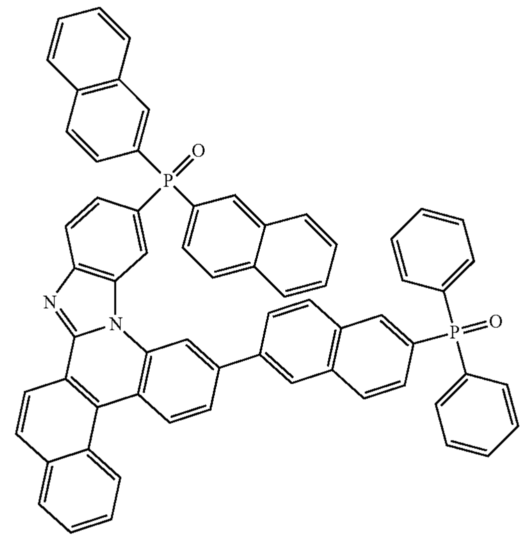
[Compound 10-12]
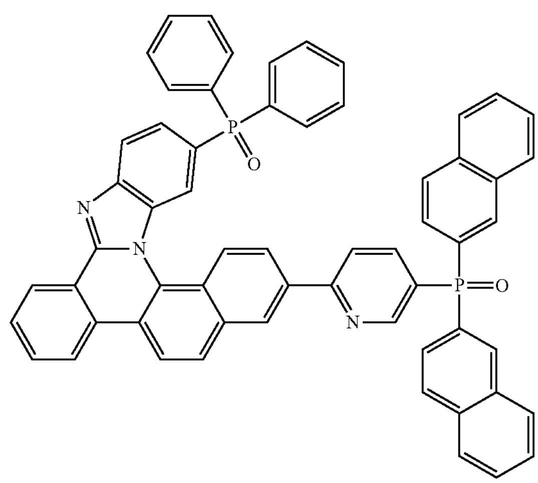
[Compound 10-13]
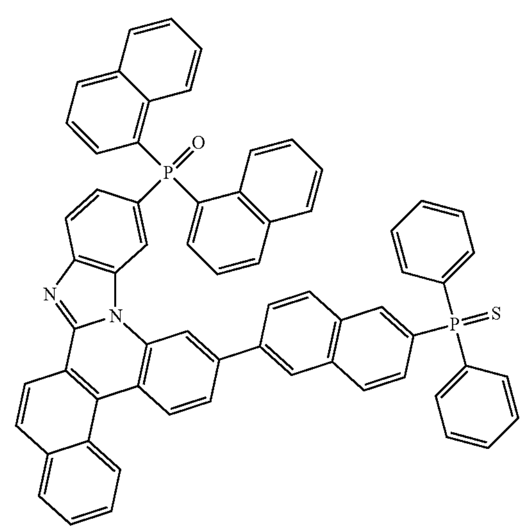

-continued
[Compound 10-14]
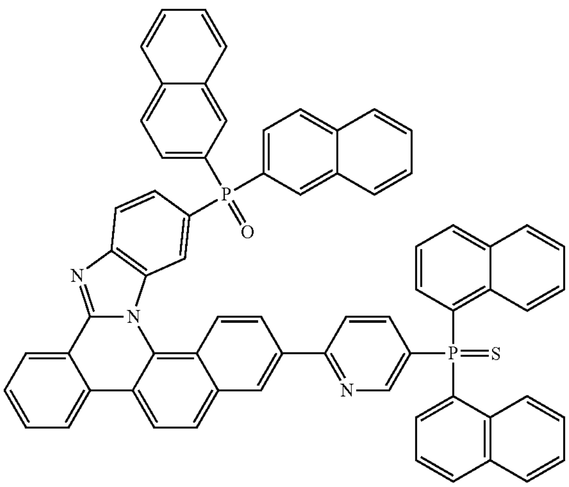
[Compound 10-15]
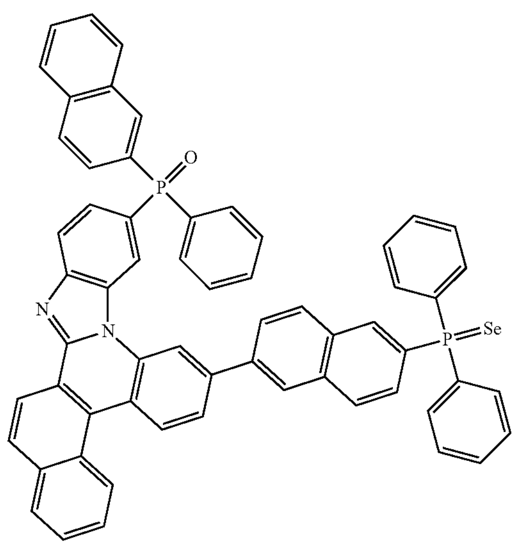
[Compound 10-16]
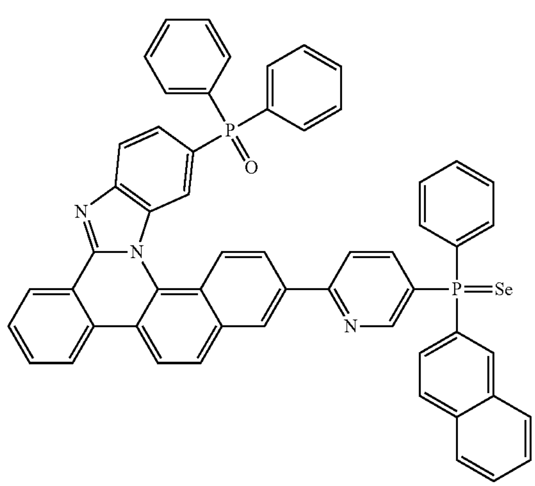
-continued
[Compound 10-17]
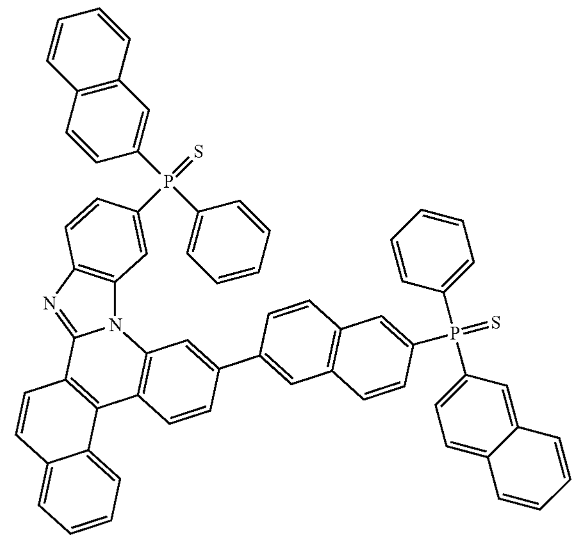
[Compound 10-18]
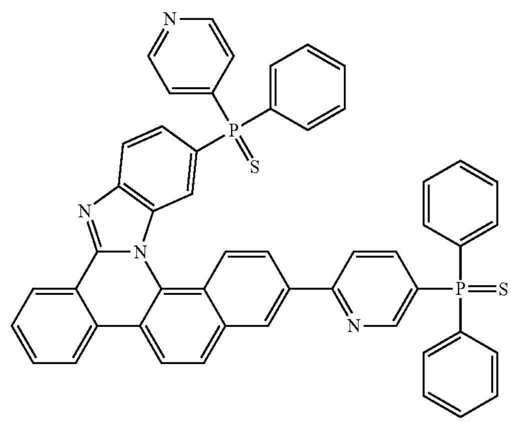
[Compound 10-19]
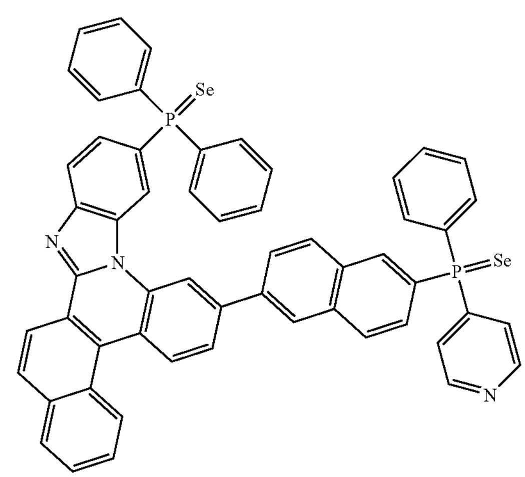

-continued
[Compound 10-20]
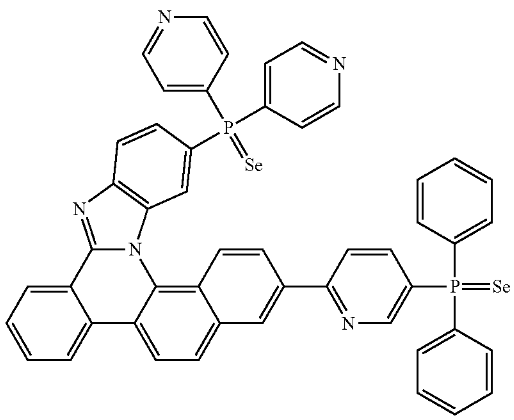
[Compound 10-21]
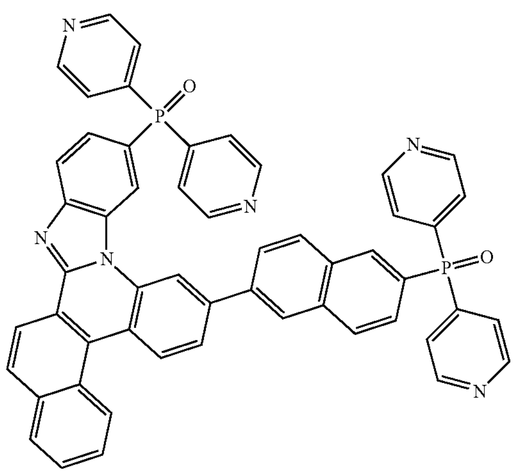
[Compound 10-22]
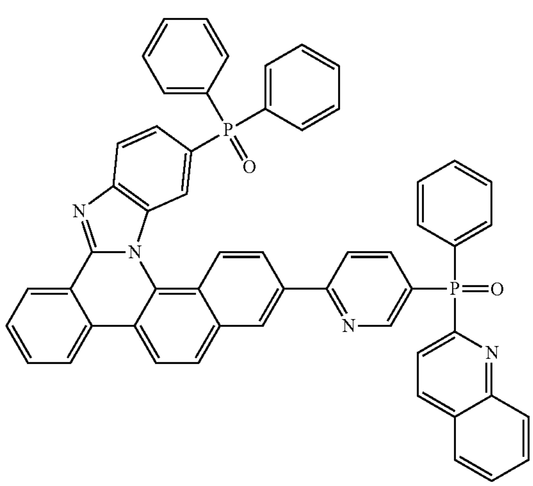
-continued
[Compound 10-23]
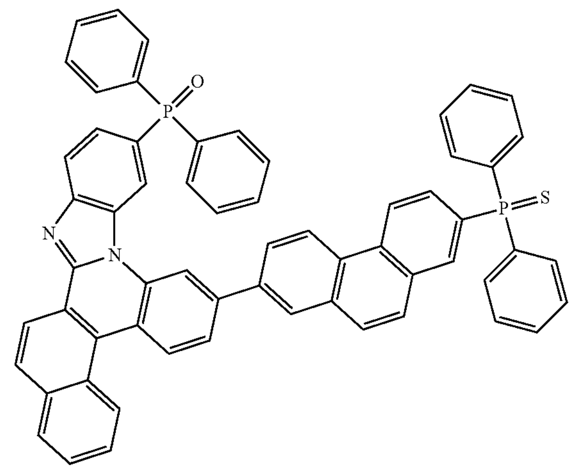
[Compound 10-24]
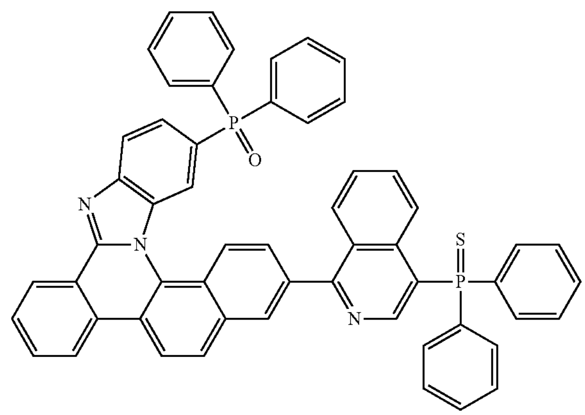
[Compound 10-25]
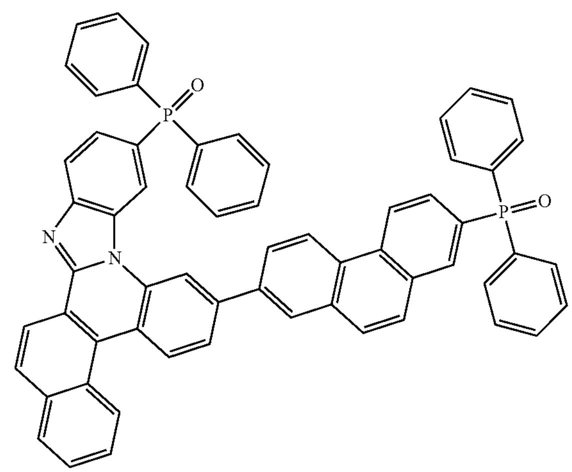

-continued
[Compound 10-26]
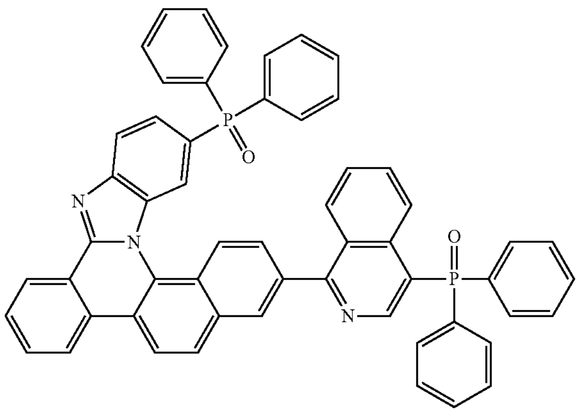
[Compound 10-27]
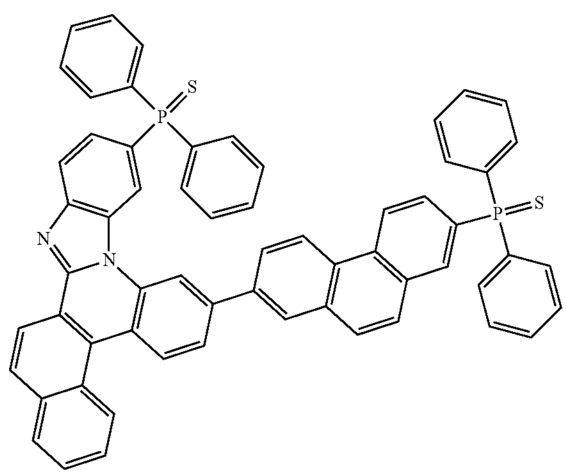
[Compound 10-28]
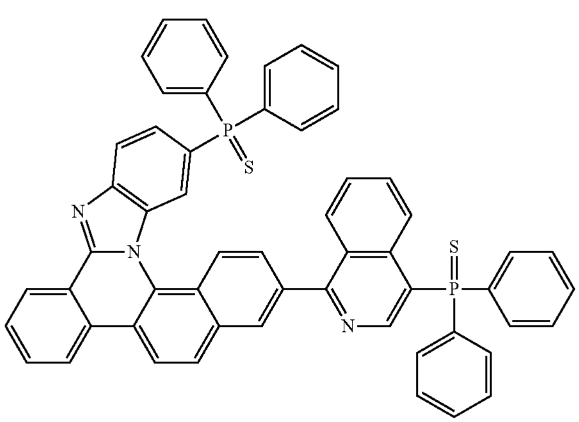
-continued
[Compound 10-29]
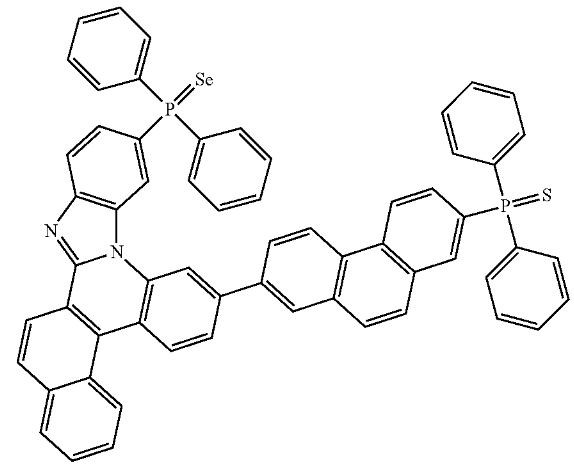
[Compound 10-30]
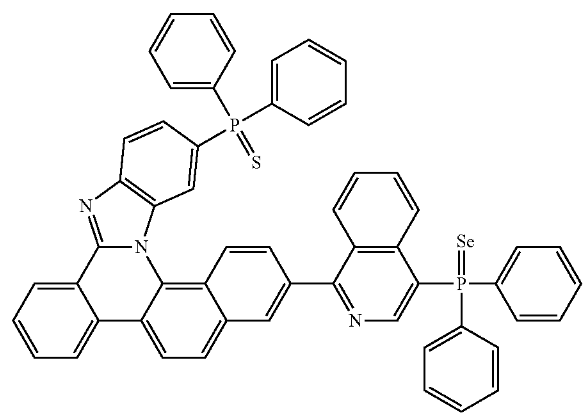
[Compound 10-31]
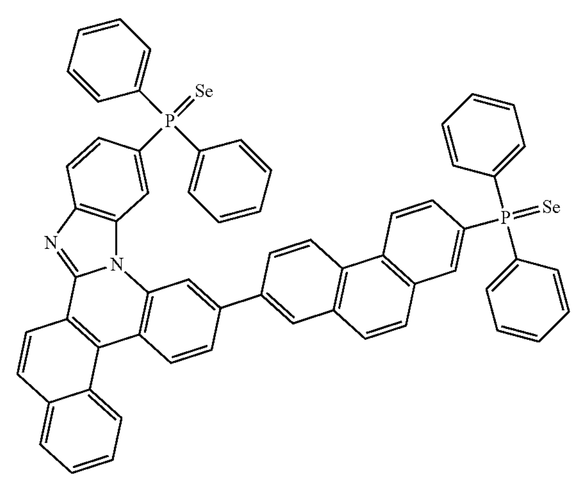

-continued
[Compound 10-32]
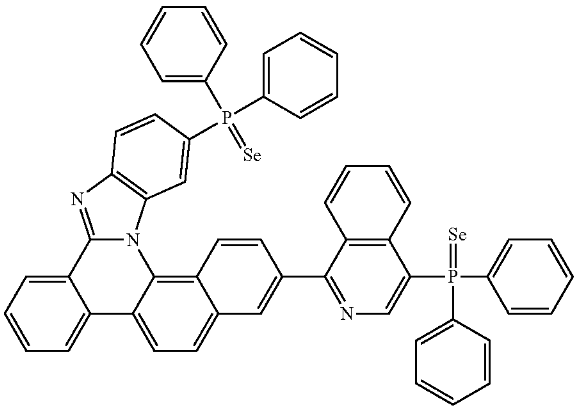
According to an exemplary embodiment of the present invention, the compound of Chemical Formula 1 may be any one selected from the following Compounds 11-1 to 11-15. However, the compound of Chemical Formula 1 is not limited to the following compounds.
[Compound 11-1]
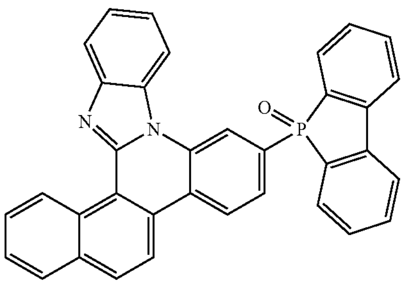
[Compound 11-2]
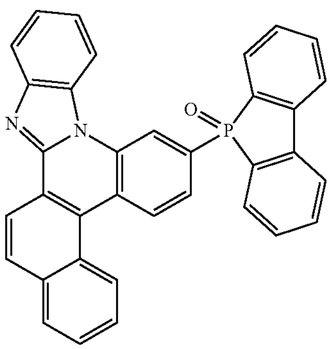
[Compound 11-3]
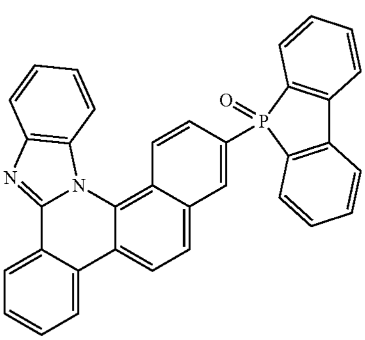
-continued
[Compound 11-4]
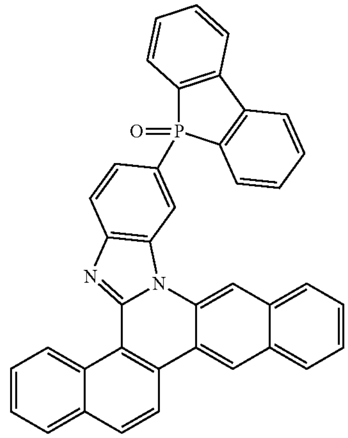
[Compound 11-5]
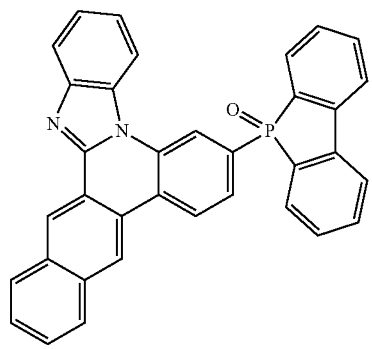
[Compound 11-6]
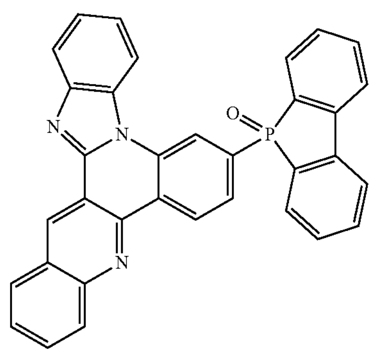
[Compound 11-7]
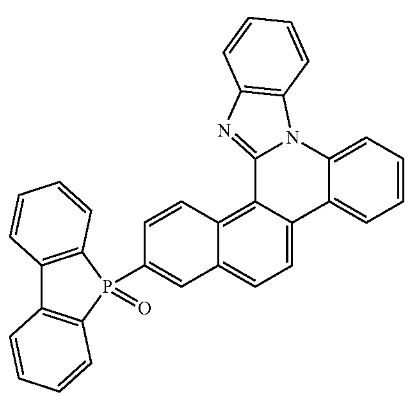

-continued
[Compound 11-8]
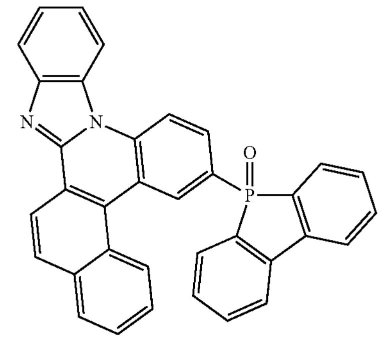
[Compound 11-9]
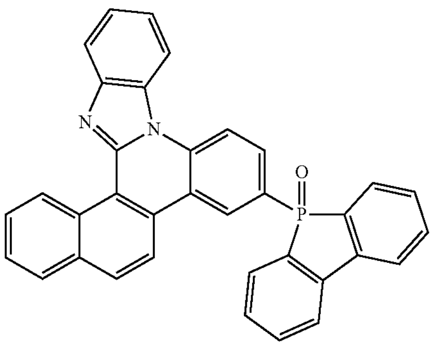
[Compound 11-10]
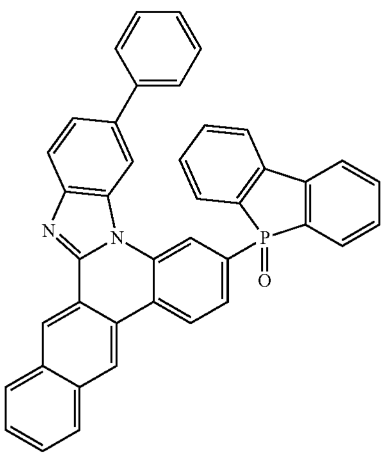
[Compound 11-11]
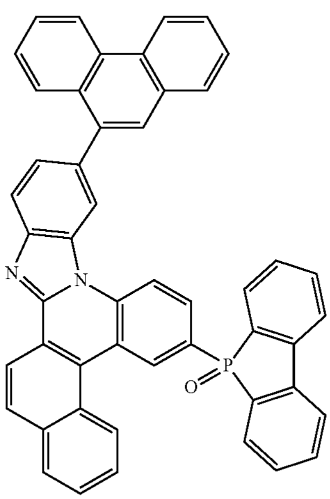
-continued
[Compound 11-12]
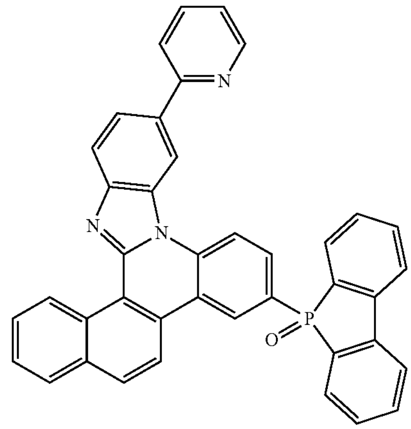
[Compound 11-13]
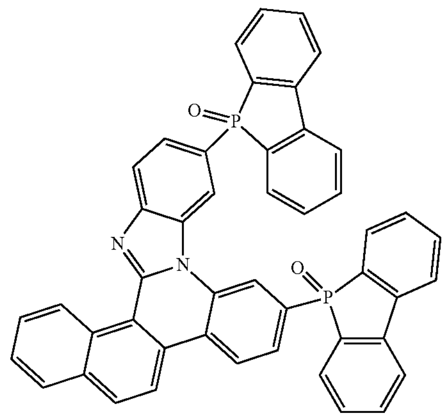
[Compound 11-14]
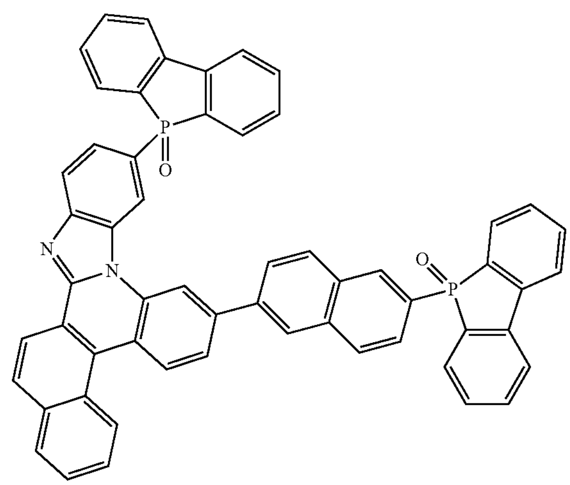

-continued
[Compound 11-15]
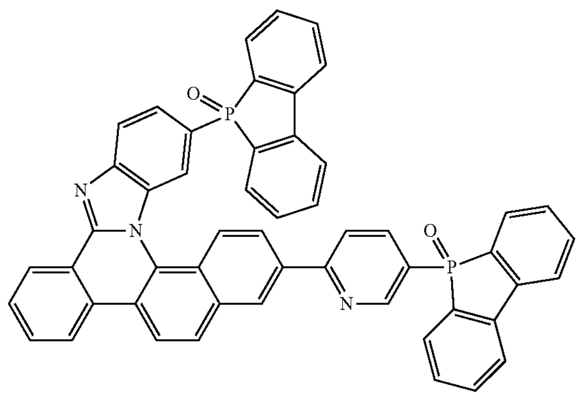
The compound represented by Chemical Formula 1 may be prepared based on the Preparation Examples to be described below. According to an exemplary embodiment, the compound may be prepared by the method such as the following Reaction Formulae 1 to 6.
[Reaction Formula 1]
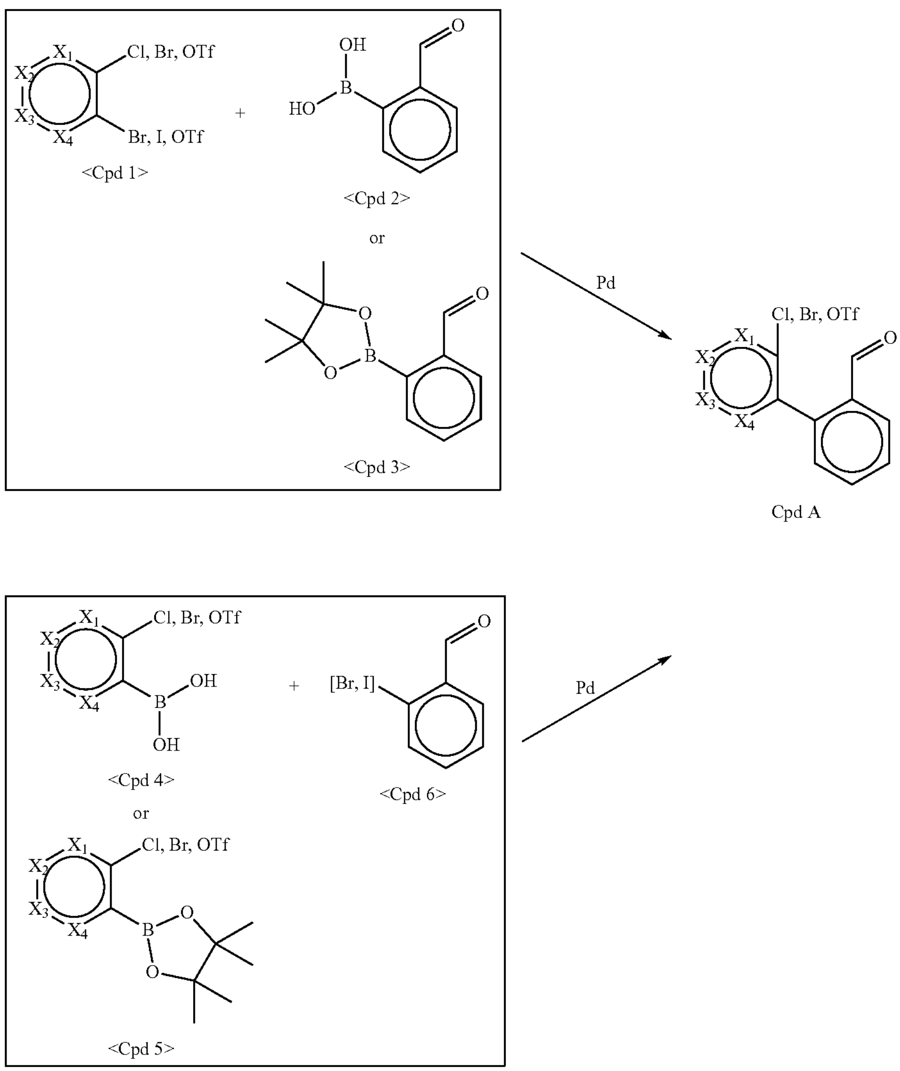

-continued
[Reaction Formula 2]
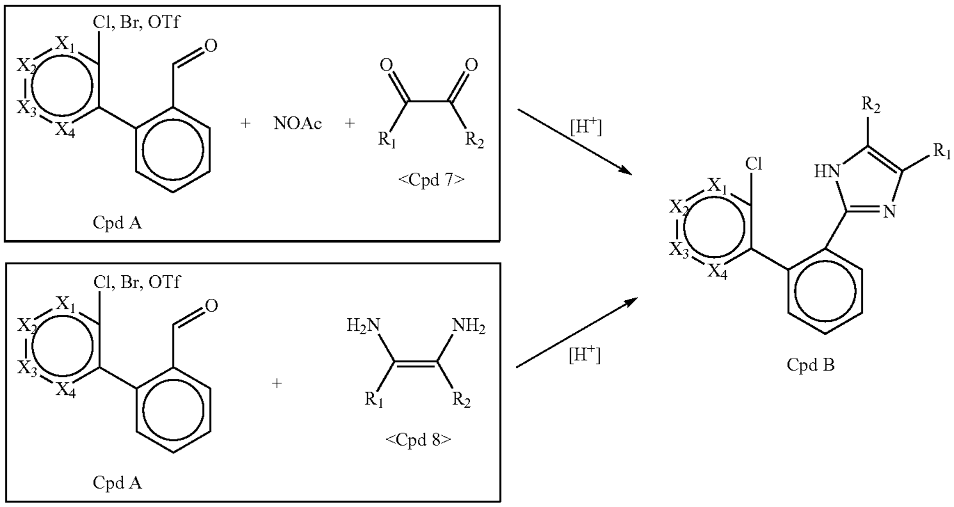
[Reaction Formula 3]
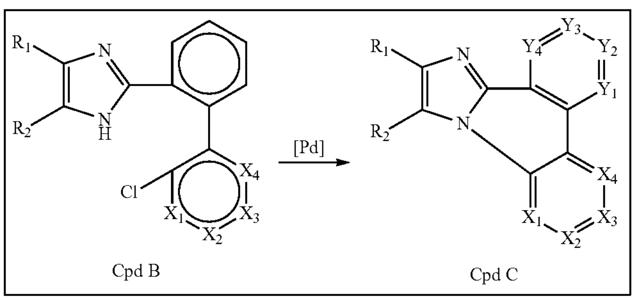
[Reaction Formula 4]
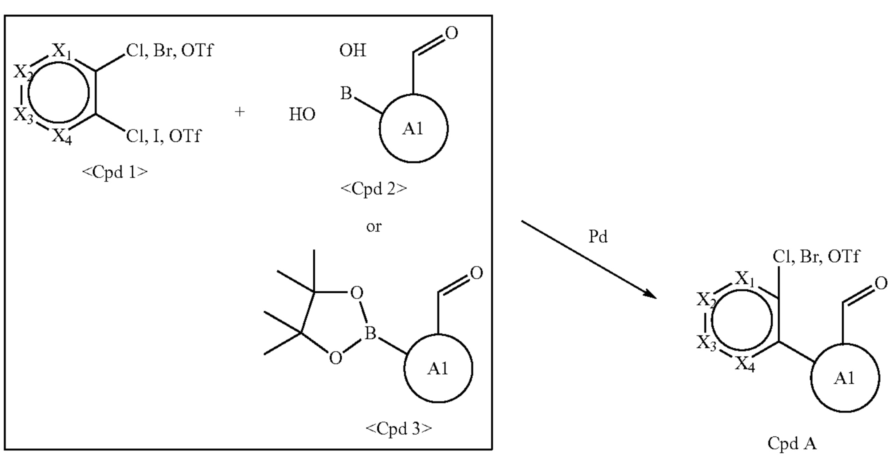

-continued

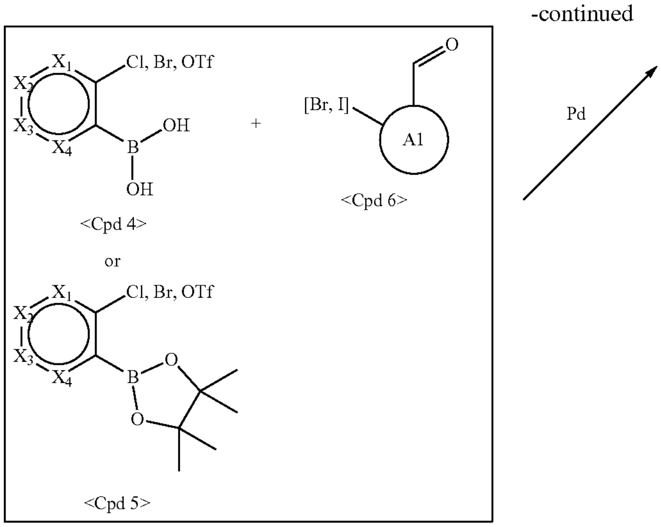

[Reaction Formula 5]

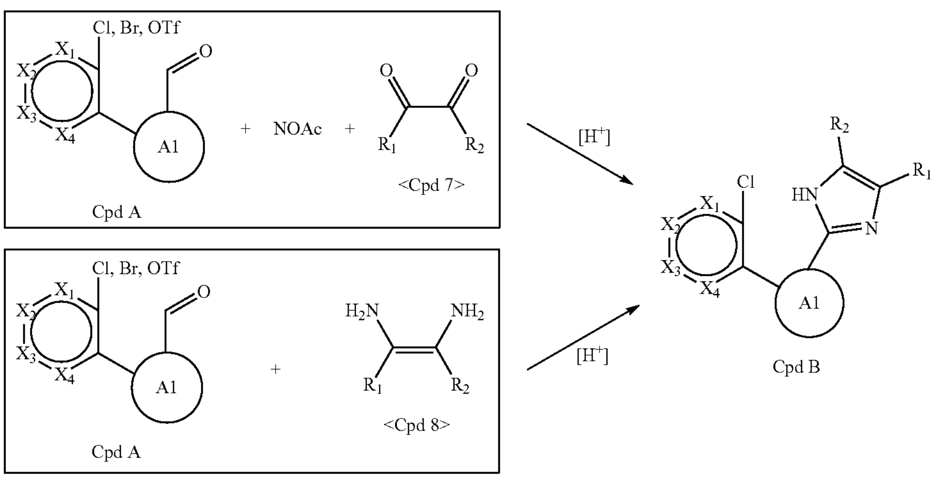

[Reaction Formula 6]

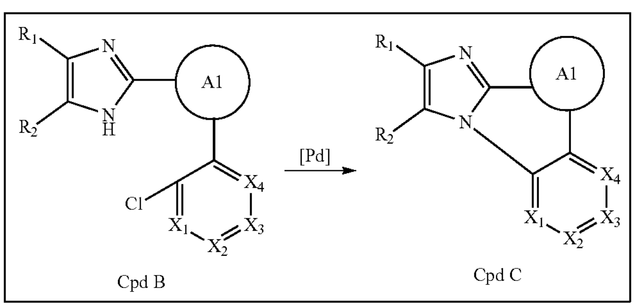

In Reaction Formulae 1 to 3, the definitions of X1 to X4 are the same as those in Chemical Formula 1, A1 represents a ring, and R1 and R2 combine with each other to form a substituted or unsubstituted ring.

Specifically, a compound represented by Cpd A may be prepared via the Suzuki coupling reaction from 1) Compound Cpd 1, in which halogen is substituted, and boronic acid Cpd 2 or boron ester Cpd 3, in which a formyl group is substituted, under a Pd catalyst. Further, a compound represented by Cpd A may be prepared via the Suzuki Coupling reaction from boronic acid Cpd 4 or boron ester Cpd 5, in which halogen is substituted, and Compound Cpd 6, in which a formyl group is substituted, under the Pd catalyst. The preparation method as described above may be represented by Reaction Formula 1.

In addition, a compound represented by Cpd B may be prepared via an acid catalyst by mixing the compound represented by Cpd B, Cpd A in which a halogen group and a formyl group are substituted, a diketo derivative (Cpd 7) having R1 and R2 substituents, and ammonium acetate to prepare an imidazole group. Furthermore, an imidazole group may be prepared via an acid catalyst by mixing Cpd A in which a halogen group and a formyl group are substituted, and a diamine derivative (Cpd 8) having R1 and R2 substituents.

Further, for the compound represented by Cpd C, Cpd C (Chemical Formula 1) may be prepared via the cyclization reaction in the molecule from Cpd B, in which a halogen group and an imidazole group are substituted, using the Pd catalyst.

In the reaction formulae, X is halogen, and may be positioned at any one of R1 to R12 of Chemical Formula 1 as in Reaction Formula 1. Halogenated cyclic imidazole (1 eq) is dissolved in a solvent in which dioxane and DMAC are mixed at a ratio of x:y (dioxane:DMAC), and the resulting solution is put into a round bottom flask, and then stirred. Subsequently, a base and a nickel (Ni) catalyst are sequentially added thereto, and then the resulting mixture is refluxed. When the solution boils, the solution is dissolved in a solvent of diaryl (Ar—HAr/HAr=Har) phosphine oxide, and then the resulting solution is slowly poured into the flask, and then the solution may be refluxed and reacted until the starting cyclic imidazole material disappears, thereby preparing a compound represented by Chemical Formula 1.

Further, the present specification provides an organic light emitting device including the compound represented by Chemical Formula 1.

An exemplary embodiment of the present specification provides an organic light emitting device including: a first electrode; a second electrode provided to face the first electrode; and one or more organic material layers provided between the first electrode and the second electrode, in which one or more layers of the organic material layers include the compound of Chemical Formula 1.

The organic material layer of the organic light emitting device of the present specification may also be composed of a single-layered structure, but may be composed of a multi-layered structure in which two or more organic material layers are stacked. For example, the organic light emitting device of the present invention may have a structure including a hole injection layer, a hole transporting layer, a light emitting layer, an electron transporting layer, an electron injection layer, and the like as organic material layers. However, the structure of the organic light emitting device is not limited thereto, and may include a fewer number of organic layers.

In an exemplary embodiment of the present specification, the organic material layer includes a hole injection layer, a hole transporting layer, or a layer which simultaneously injects and transports holes, and the hole injection layer, the hole transporting layer, or the layer which simultaneously injects and transports holes includes the compound of Chemical Formula 1.

In another exemplary embodiment, the organic material layer includes a light emitting layer, and the light emitting layer includes the compound of Chemical Formula 1.

In an exemplary embodiment of the present specification, the organic material layer includes an electron transporting layer or an electron injection layer, and the electron transporting layer or the electron injection layer includes the compound of Chemical Formula 1.

In an exemplary embodiment of the present specification, the electron transporting layer, the electron injection layer, or the layer which simultaneously transports and injects electrons includes the compound of Chemical Formula 1.

In another exemplary embodiment, the organic material layer includes a light emitting layer and an electron transporting layer, and the electron transporting layer includes the compound of Chemical Formula 1.

In still another exemplary embodiment, the organic light emitting device may be an organic light emitting device having a structure (normal type) in which a positive electrode, one or more organic material layers, and a negative electrode are sequentially stacked on a substrate.

In yet another exemplary embodiment, the organic light emitting device may be an organic light emitting device having a reverse-direction structure (inverted type) in which a negative electrode, one or more organic material layers, and a positive electrode are sequentially stacked on a substrate.

For example, the structure of the organic light emitting device according to an exemplary embodiment of the present specification is illustrated in FIGS. 1 and 2.

FIG. 1 illustrates an example of an organic light emitting device composed of a substrate 1, a positive electrode 2, a light emitting layer 3, and a negative electrode 4. In the structure, the compound may be included in the light emitting layer.

FIG. 2 illustrates an example of an organic light emitting device composed of a substrate 1, a positive electrode 2, a hole injection layer 5, a hole transporting layer 6, a light emitting layer 7, an electron transporting layer 8, and a negative electrode 4. In the structure, the compound may be included in one or more layers of the hole injection layer, the hole transporting layer, the light emitting layer, and the electron transporting layer.

The organic light emitting device of the present specification may be manufactured by the materials and methods known in the art, except that one or more layers of the organic material layers include the compound of the present specification, that is, the compound of Chemical Formula 1.

When the organic light emitting device includes a plurality of organic material layers, the organic material layers may be formed of the same material or different materials.

The organic light emitting device of the present specification may be manufactured by the materials and methods known in the art, except that one or more layers of the organic material layers include the compound of Chemical Formula 1, that is, the compound represented by Chemical Formula 1.

For example, the organic light emitting device of the present specification may be manufactured by sequentially stacking a first electrode, an organic material layer, and a second electrode on a substrate. In this case, the organic light emitting device may be manufactured by depositing a metal or a metal oxide having conductivity, or an alloy thereof on a substrate to form a positive electrode, forming an organic material layer including a hole injection layer, a hole transporting layer, a light emitting layer, and an electron transporting layer thereon, and then depositing a material, which may be used as a negative electrode, thereon, by using a physical vapor deposition (PVD) method such as sputtering or e-beam evaporation. In addition to the method as described above, an organic light emitting device may be made by sequentially depositing a negative electrode material, an organic material layer, and a positive electrode material on a substrate.

Further, the compound of Chemical Formula 1 may be formed as an organic material layer by not only a vacuum deposition method, but also a solution application method when an organic light emitting device is manufactured. Here, the solution application method means spin coating, dip coating, doctor blading, inkjet printing, screen printing, a spray method, roll coating, and the like, but is not limited thereto.

In addition to the method as described above, an organic light emitting device may also be made by sequentially depositing a negative electrode material, an organic material layer, and a positive electrode material on a substrate (International Publication No. 2003/012890). However, the manufacturing method is not limited thereto.

In an exemplary embodiment of the present specification, the first electrode is a positive electrode, and the second electrode is a negative electrode.

In another exemplary embodiment, the first electrode is a negative electrode, and the second electrode is a positive electrode.

As the positive electrode material, a material having a large work function is usually preferred so as to smoothly inject holes into an organic material layer. Specific examples of the positive electrode material which may be used in the present invention include: a metal, such as vanadium, chromium, copper, zinc, and gold, or alloys thereof; a metal oxide, such as zinc oxide, indium oxide, indium tin oxide (ITO), and indium zinc oxide (IZO); a combination of metal and oxide, such as ZnO:Al or $SnO_2$:Sb; an electrically conductive polymer, such as poly(3-methylthiophene), poly [3,4-(ethylene-1,2-dioxy)thiophene] (PEDOT), polypyrrole, and polyaniline, and the like, but are not limited thereto.

As the negative electrode material, a material having a small work function is usually preferred so as to smoothly inject electrons into an organic material layer. Specific examples of the negative electrode material include: a metal, such as magnesium, calcium, sodium, potassium, titanium, indium, yttrium, lithium, gadolinium, aluminum, silver, tin, and lead, or alloys thereof; a multi-layered structural material, such as LiF/Al or $LiO_2$/Al, and the like, but are not limited thereto.

The hole injection material is a layer which injects holes from an electrode, and is preferably a compound which has a capability of transporting holes and thus has an effect of injecting holes at a positive electrode and an excellent effect of injecting holes for a light emitting layer or a light emitting material, prevents excitons produced from the light emitting layer from moving to an electron injection layer or an electron injection material, and is also excellent in the ability to form a thin film. It is preferred that the highest occupied molecular orbital (HOMO) of the hole injection material is between the work function of the positive electrode material and the HOMO of a peripheral organic material layer. Specific examples of the hole injection material include metal porphyrin, oligothiophene, an arylamine-based organic material, a hexanitrile hexaazatriphenylene-based organic material, a quinacridone-based organic material, a perylene-based organic material, anthraquinone, a polyaniline and polythiophene-based electrically conductive polymer, and the like, but are not limited thereto.

The hole transporting layer is a layer which receives holes from a hole injection layer and transports holes to a light emitting layer, and a hole transporting material is suitably a material which may receive holes from a positive electrode or a hole injection layer to transfer holes to a light emitting layer, and has a large mobility for the holes. Specific examples thereof include an arylamine-based organic material, an electrically conductive polymer, a block copolymer in which a conjugate portion and a non-conjugate portion are present together, and the like, but are not limited thereto.

The light emitting material is a material which may receive holes and electrons from a hole transporting layer and an electron transporting layer, respectively, and combine the holes and the electrons to emit light in a visible ray region, and is preferably a material having good quantum efficiency to fluorescence or phosphorescence. Specific examples thereof include: a 8-hydroxy-quinoline aluminum complex ($Alq_3$); a carbazole-based compound; a dimerized styryl compound; BAlq; a 10-hydroxybenzoquinoline-metal compound; a benzoxazole, benzthiazole and benzimidazole-based compound; a poly(p-phenylenevinylene (PPV)-based polymer; a spiro compound; polyfluorene, lubrene, and the like, but are not limited thereto.

The light emitting layer may include a host material and a dopant material. Examples of the host material include a condensed aromatic ring derivative, or a hetero ring-containing compound, and the like. Specifically, examples of the condensed aromatic ring derivative include an anthracene derivative, a pyrene derivative, a naphthalene derivative, a pentacene derivative, a phenanthrene compound, a fluoranthene compound, and the like, and examples of the hetero ring-containing compound include a carbazole derivative, a dibenzofuran derivative, a ladder-type furan compound, a pyrimidine derivative, and the like, but the examples thereof are not limited thereto.

Examples of the dopant material include an aromatic amine derivative, a styrylamine compound, a boron complex, a fluoranthene compound, a metal complex, and the like.

Specifically, the aromatic amine derivative is a condensed aromatic ring derivative having a substituted or unsubstituted arylamino group, and examples thereof include a pyrene, an anthracene, a chrysene, a periflanthene, and the like, which have an arylamino group, and the styrylamine compound is a compound in which a substituted or unsubstituted arylamine is substituted with at least one arylvinyl group, and one or two or more substituents selected from the group consisting of an aryl group, a silyl group, an alkyl group, a cycloalkyl group, and an arylamino group are substituted or unsubstituted. Specific examples thereof include styrylamine, styryldiamine, styryltriamine, styryltetramine, and the like, but are not limited thereto. Further, examples of the metal complex include an iridium complex, a platinum complex, and the like, but are not limited thereto.

The electron transporting material is a material which receives electrons from an electron injection layer and transports the electrons to a light emitting layer, and an electron transporting material is a material which may inject electrons well from a negative electrode and may transfer the electrons to a light emitting layer, and is suitably a material which has large mobility for the electrons. Specific examples thereof include: an Al complex of 8-hydroxyquinoline; a complex including $Alq_3$; an organic radical compound; a hydroxyflavone-metal complex, and the like, but are not limited thereto. The electron transporting layer may be used with any desired cathode material, as used according to the related art. In particular, appropriate examples of the cathode material are a typical material which has a low work function, followed by an aluminum layer or a silver layer. Specific examples thereof include cesium, barium, calcium, ytterbium, and samarium, in each case followed by an aluminum layer or a silver layer.

The electron injection layer is a layer which injects electrons from an electrode, and is preferably a compound which has a capability of transporting electrons, has an effect of injecting electrons from a negative electrode and an excellent effect of injecting electrons into a light emitting layer or a light emitting material, prevents excitons produced from the light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone and derivatives thereof, a metal complex compound, a nitrogen-containing 5-membered ring derivative, and the like, but are not limited thereto.

Examples of the metal complex compound include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris(2-methyl-8-hydroxyquinolinato) aluminum, tris(8-hydroxyquinolinato) gallium, bis(10-hydroxybenzo[h]quinolinato) beryllium, bis(10-hydroxybenzo[h]quinolinato) zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato) gallium, and the like, but are not limited thereto.

The organic light emitting device according to the present specification may be a top emission type, a bottom emission type, or a dual emission type according to the material to be used.

In an exemplary embodiment of the present specification, the compound of Chemical Formula 1 may be included in an organic solar cell or an organic transistor in addition to an organic light emitting device.

MODE FOR INVENTION

The preparation of the compound represented by Chemical Formula 1 and the organic light emitting device including the same will be specifically described in the following Examples. However, the following Examples are provided for exemplifying the present specification, and the scope of the present specification is not limited thereby.

PREPARATION EXAMPLES

<Preparation Example 1> Synthesis of the Following Compound 1-1

[Compound 1-1]

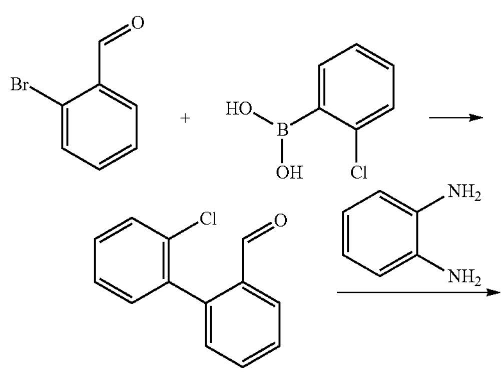

[Structural Formula 1-1A]

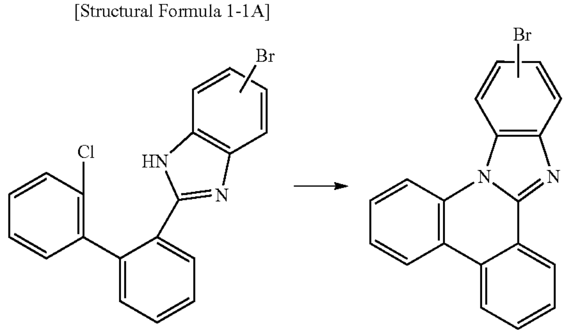

[Structural Formula 1-1B-1] [Structural Formula 1-1C]

-continued

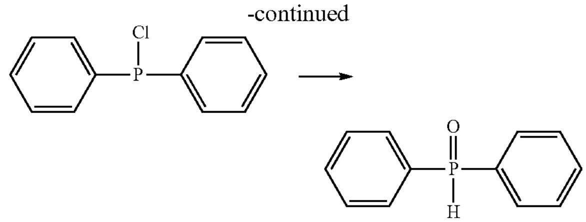

[Structural Formula 1-1D]

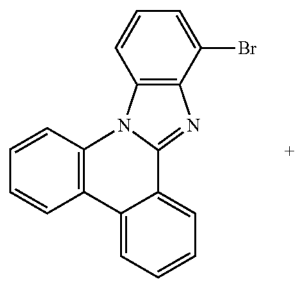

[Structural Formula 1-1C-1]

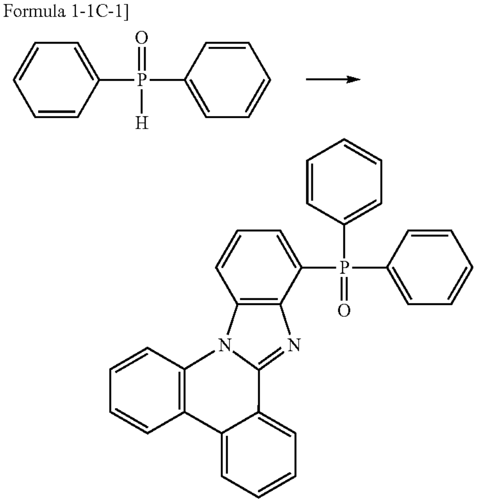

Preparation of Structural Formula 1-1A 2-bromobenzaldehyde (20.0 g, 108.1 mmol) and 2-chlorophenylboronic acid (18.6 g, 118.9 mmol) were dissolved in tetrahydrofuran (150 mL), and then the resulting solution was heated, 150 mL of a 2 M potassium carbonate aqueous solution was added thereto, Pd(PPh3)4 (6.2 g, 5.4 mmol) was put thereinto, and the mixture was stirred for 12 hours. After the mixture was cooled to normal temperature, the aqueous layer was removed, and the solvent of the organic layer was removed to obtain Structural Formula 1-1A (22.5 g, yield 96%) of a brown color oil.

MS: $[M+H]^+=217$

Preparation of Structural Formula 1-1B-1

Structural Formula 1-1A (22.5 g, 103.8 mmol) and 3-bromo-1,2-diaminobenzene (21.4 g, 114.2 mmol) were dissolved in ethanol (200 mL), and then a solution of $Na_2S_2O_5$ (21.7 g, 114.2 mmol) dissolved in water (300 mL) was added thereto, and then there resulting mixture was stirred while being heated for 6 hours. After the mixture was cooled to normal temperature, water (300 mL) was added thereto, and then the produced solid was filtered to obtain Structural Formula 1-1B-1 (33.8 g, yield 85%).

MS: $[M+H]^+=383$

Preparation of Structural Formula 1-1C-1

Structural Formula 1-1B-1 (33.8 g, 88.3 mmol) and NaOtBu (8.5 g, 88.3 mmol) were dissolved in dimethyl acetate (250 mL), and then the resulting solution was heated. After being stirred for 3 hours, the solution was cooled to normal temperature, and then ethanol was added thereto, and then the produced solid was filtered. A bromine compound, which was substituted at Nos. 4 and 7 positions of cyclic imidazole, was purified with column chromatography to obtain Structural Formula 1-1C-1 (29.1 g, yield 95%) in which bromine was substituted at No. 4 position.

MS: $[M+H]^{+}=347$

Preparation of Structural Formula 1-1D

Chlorodiphenylphosphane (40 g, 181.3 mmol) was dissolved in a mixed solvent (400 mL) of dioxane and water, and then the resulting solution was heated. After the solution was stirred for 9 hours, the solution was cooled to normal temperature, and then subjected to extraction to obtain an organic layer, and the organic layer was subjected to recrystallization to obtain Structural Formula 1-1D (33.4 g, yield 91%).

MS: $[M+H]^{+}=203$

Preparation of Compound 1-1

After Structural Formula 1-1C-1 (29.1 g, 83.8 mmol) was dissolved in tetrahydrofuran (200 mL), the resulting solution was heated, and then a solution of cesium carbonate (81.9 g, 251.4 mmol) dissolved in water (100 mL) was added thereto, and then [Ni(dppp)$Cl_2$](2.3 g, 4.2 mmol) was added thereto. When the solution boiled, Structural Formula 1-1D (33.9 g, 167.6 mmol) was added thereto, the resulting mixture was stirred for 8 hours, and then cooled to normal temperature, and then the produced solid was filtered to obtain Compound 1-1 (31.9 g, yield 88%).

MS: $[M+H]^{+}=469$

<Preparation Example 2> Synthesis of the Following Compound 1-2

[Compound 1-2]

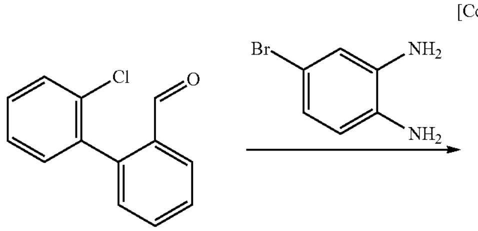

[Structural Formula 1-1A]

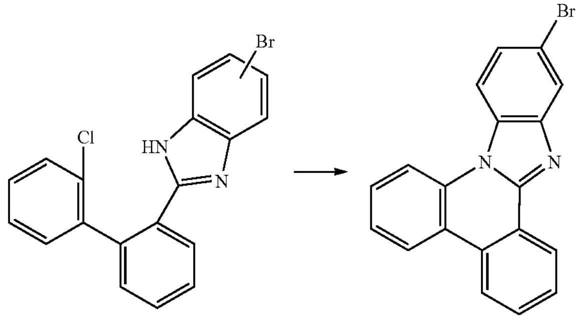

[Structural Formula 1-1B-2]

[Structural Formula 1-1C-2]

-continued

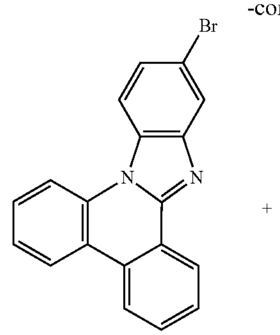

[Structural Formula 1-1C-2]

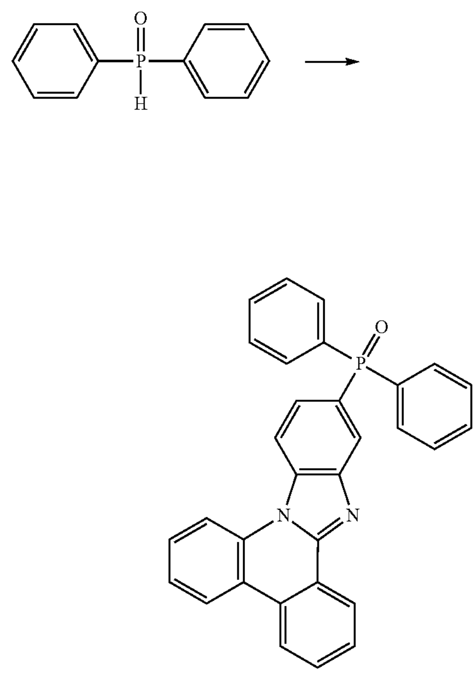

Preparation of Structural Formula 1-1B-2

Structural Formula 1-1B-2 was obtained in the same manner as in the preparation method of Structural Formula 1-1B-1, except that 4-bromo-1,2-diaminobenzene was used instead of 3-bromo-1,2-diaminobenzene.

MS: $[M+H]^{+}=383$

Preparation of Structural Formula 1-1C-2

Structural Formula 1-1C-2 was obtained in the same manner as in the preparation method of Structural Formula 1-1C-1, except that Structural Formula 1-1B-2 was used instead of Structural Formula 1-1B-1.

MS: $[M+H]^{+}=347$

Preparation of Compound 1-2

Compound 1-2 was obtained in the same manner as in the preparation method of Compound 1-1, except that Structural Formula 1-1C-2 was used instead of Structural Formula 1-1C-1.

MS: $[M+H]^+$=469

<Preparation Example 3> Synthesis of the Following Compound 1-3

[Compound 1-3]

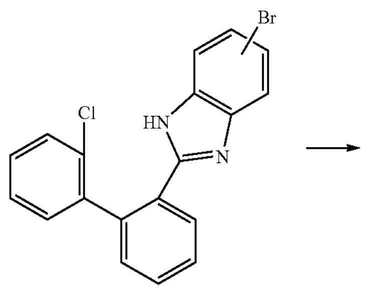

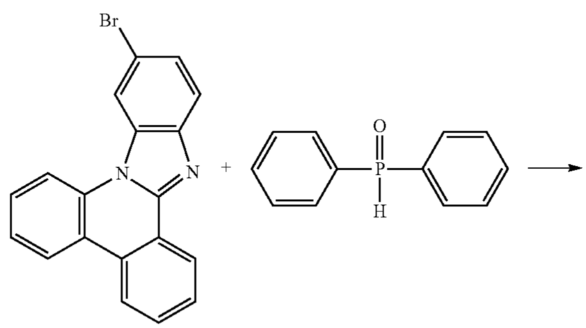

[Structural Formula 1-1B-2]

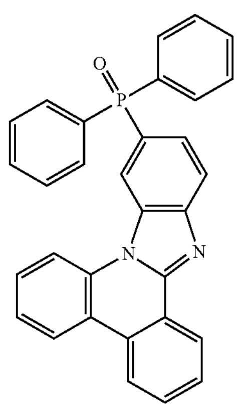

[Structural Formula 1-1C-3]

Preparation of Structural Formula 1-1C-3

Preparation was performed in the same manner as in the preparation method of Structural Formula 1-1C-2, and the resulting product was purified with column chromatography to obtain Structural Formula 1-1C-3 in which bromine was substituted at No. 6 position of cyclic imidazole.

MS: $[M+H]^+$=347

Preparation of Compound 1-3

Compound 1-3 was obtained in the same manner as in the preparation method of Compound 1-1, except that Structural Formula 1-1C-3 was used instead of Structural Formula 1-1C-1.

MS: $[M+H]^+$=469

<Preparation Example 4> Synthesis of the Following Compound 1-4

[Compound 1-4]

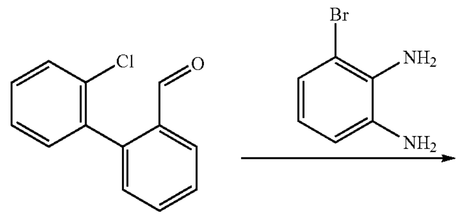

[Structural Formula 1-1A]

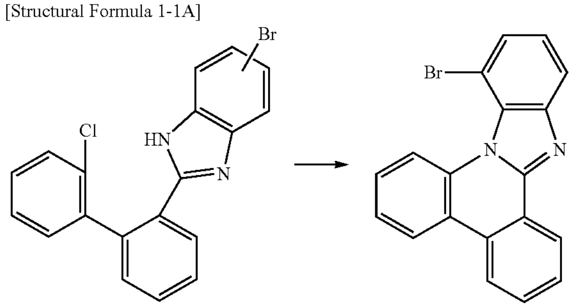

[Structural Formula 1-1B-1] [Structural Formula 1-1C-4]

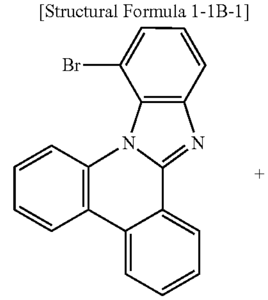

[Structural Formula 1-1C-4]

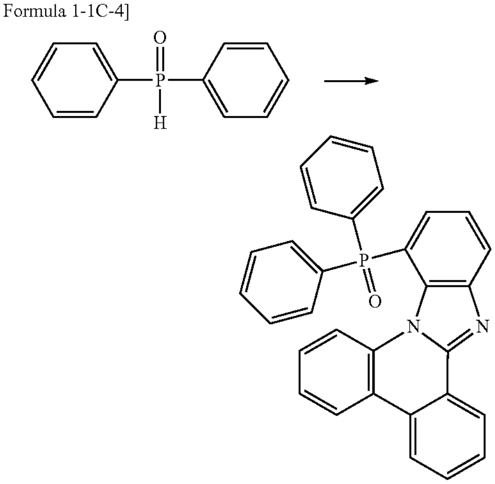

Preparation of Structural Formula 1-1C-4

Preparation was performed in the same manner as in the preparation method of Structural Formula 1-1C-1, and the resulting product was purified with column chromatography to obtain Structural Formula 1-1C-4 in which bromine was substituted at No. 7 position of cyclic imidazole.

MS: [M+H]+=347

Preparation of Compound 1-4

Compound 1-4 was obtained in the same manner as in the preparation method of Compound 1-1, except that Structural Formula 1-1C-4 was used instead of Structural Formula 1-1C-1.

MS: [M+H]+=469

<Preparation Example 5> Synthesis of the Following Compound 1-5

[Compound 1-5]

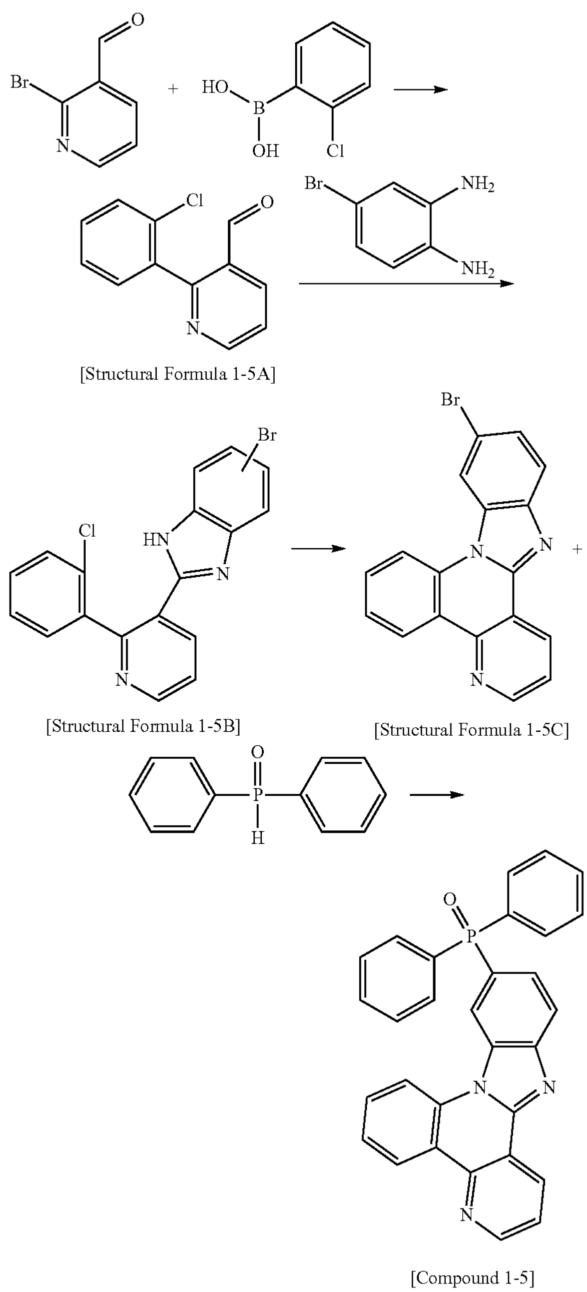

Preparation of Structural Formula 1-5A

Structural Formula 1-5A was obtained in the same manner as in the preparation method of Structural Formula 1-1A, except that 2-bromo nicotinaldehyde was used instead of 2-bromo benzaldehyde.

MS: [M+H]+=218

Preparation of Structural Formula 1-5B

Structural Formula 1-5B was obtained in the same manner as in the preparation method of Structural Formula 1-1B, except that Structural Formula 1-5A was used instead of Structural Formula 1-1A.

MS: [M+H]+=384

Preparation of Structural Formula 1-5C

Structural Formula 1-5C was obtained in the same manner as in the preparation method of Structural Formula 1-1C, except that Structural Formula 1-5B was used instead of Structural Formula 1-1B.

MS: [M+H]+=348

Preparation of Compound 1-5

Compound 1-5 was obtained in the same manner as in the preparation method of Compound 1-1, except that Structural Formula 1-5C was used instead of Structural Formula 1-1C.

MS: [M+H]+=470

<Preparation Example 6> Synthesis of the Following Compound 1-6

[Compound 1-6]

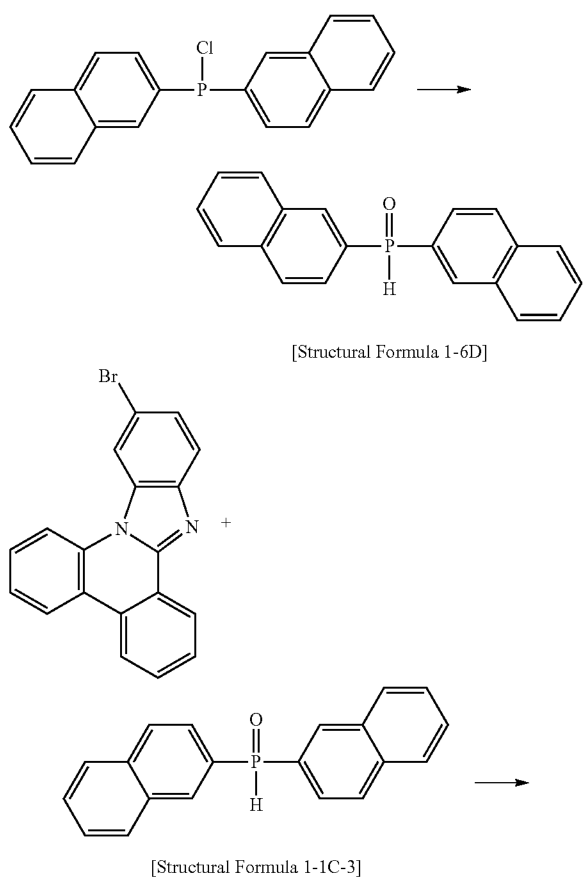

-continued

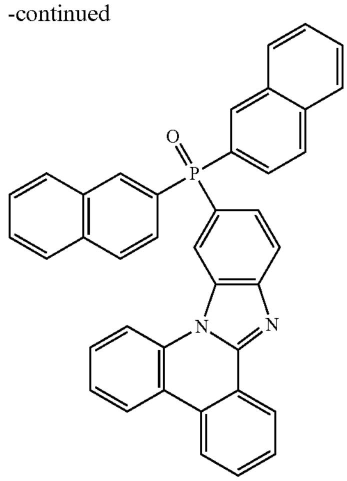

[Structural Formula 1-6D]

Preparation of Structural Formula 1-6D

Structural Formula 1-6D was obtained in the same manner as in the preparation method of Structural Formula 1-1D, except that chloro-2-dinaphthalenyl phosphane was used instead of chlorodiphenylphosphane.

MS: $[M+H]^+$=303

Preparation of Compound 1-6

Compound 1-6 was obtained in the same manner as in the preparation method of Compound 1-3, except that Structural Formula 1-6D was used instead of Structural Formula 1-1D.

MS: $[M+H]^+$=569

<Preparation Example 7> Synthesis of the Following Compound 1-7

[Compound 1-7]

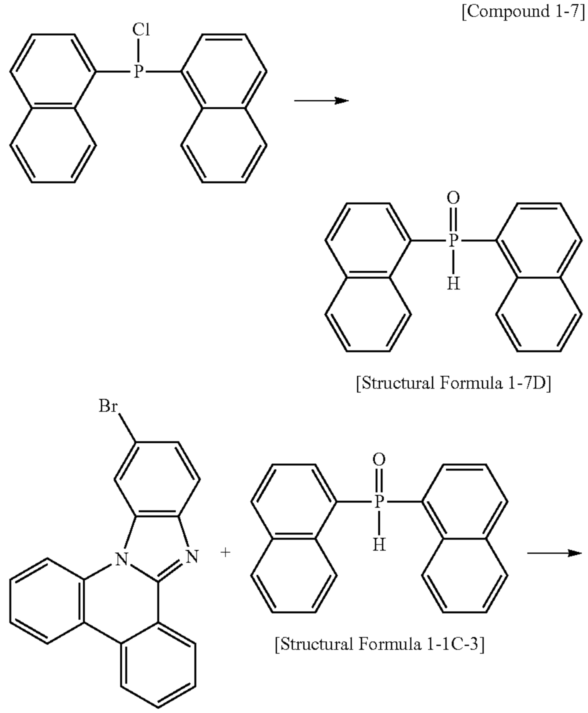

[Structural Formula 1-7D]

[Structural Formula 1-1C-3]

-continued

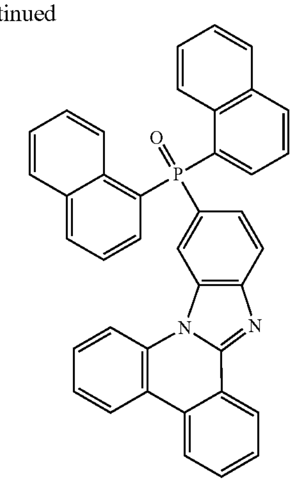

[Structural Formula 1-7D]

Preparation of Structural Formula 1-7D Structural Formula 1-7D was obtained in the same manner as in the preparation method of Structural Formula 1-1D, except that chloro-1-dinaphthalenyl phosphane was used instead of chlorodiphenylphosphane.

MS: $[M+H]^+$=303

Preparation of Compound 1-7

Compound 1-7 was obtained in the same manner as in the preparation method of Compound 1-3, except that Structural Formula 1-7D was used instead of Structural Formula 1-1D.

<Preparation Example 8> Synthesis of the Following Compound 1-8

[Compound 1-8]

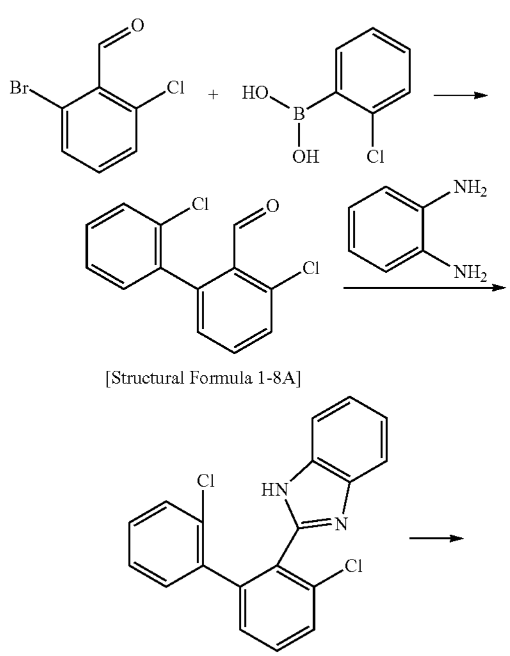

[Structural Formula 1-8A]

[Structural Formula 1-8B]

-continued

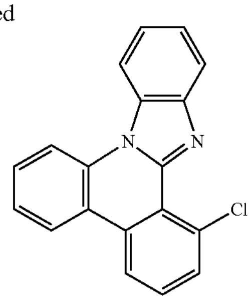

[Structural Formula 1-8C]

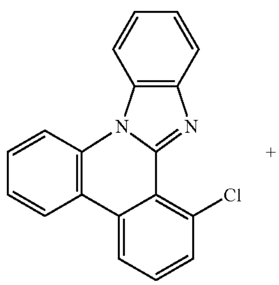

[Structural Formula 1-8C]

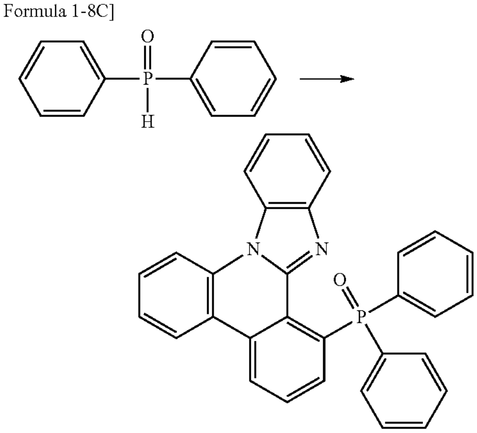

[Structural Formula 1-1D]

Preparation of Structural Formula 1-8A

Structural Formula 1-8A was obtained in the same manner as in the preparation method of Structural Formula 1-1A, except that 2-bromo-6-chlorobenzaldehyde was used instead of 2-bromobenzaldehyde.

MS: $[M+H]^+$=219

Preparation of Structural Formula 1-8B

Structural Formula 1-8B was obtained in the same manner as in the preparation method of Structural Formula 1-1B-1, except that Structural Formula 1-8A was used instead of Structural Formula 1-1A.

MS: $[M+H]^+$=339

Preparation of Structural Formula 1-8C

Structural Formula 1-8C was obtained in the same manner as in the preparation method of Structural Formula 1-1C, except that Structural Formula 1-8B was used instead of Structural Formula 1-1B-1.

MS: $[M+H]^+$=303

Preparation of Compound 1-8

Compound 1-8 was obtained in the same manner as in the preparation method of Compound 1-1, except that Structural Formula 1-8C was used instead of Structural Formula 1-1C.

MS: $[M+H]^+$=469

<Preparation Example 9> Synthesis of the Following

[Compound 1-9]

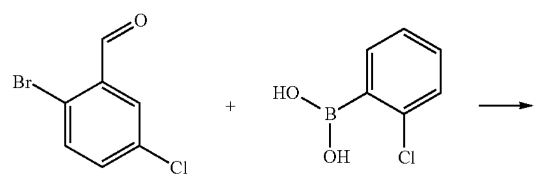

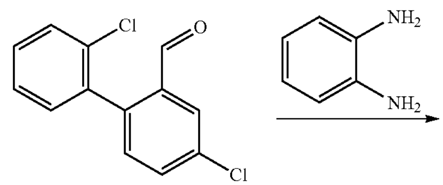

[Structural Formula 1-9A]

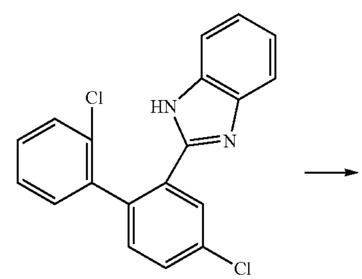

[Structural Formula 1-9B]

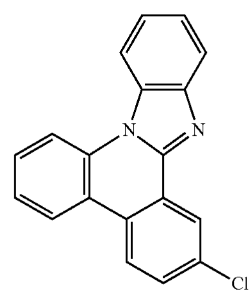

[Structural Formula 1-9C]

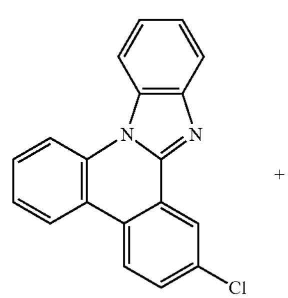

[Structural Formula 1-9C]

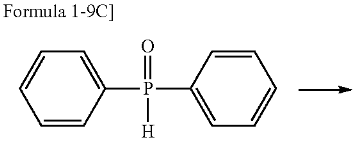

-continued

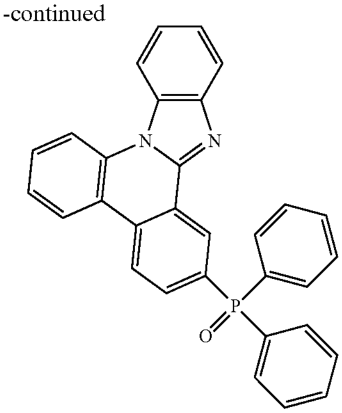

[Structural Formula 1-1D]

Preparation of Structural Formula 1-9A

Structural Formula 1-9A was obtained in the same manner as in the preparation method of Structural Formula 1-1A, except that 2-bromo-5-chlorobenzaldehyde was used instead of 2-bromobenzaldehyde.

MS: $[M+H]^+$=219

Preparation of Structural Formula 1-9B

Structural Formula 1-9B was obtained in the same manner as in the preparation method of Structural Formula 1-1B-1, except that Structural Formula 1-9A was used instead of Structural Formula 1-1A.

MS: $[M+H]^+$=339

Preparation of Structural Formula 1-9C

Structural Formula 1-9C was obtained in the same manner as in the preparation of Structural Formula 1-1C, except that Structural Formula 1-9B was used instead of Structural Formula 1-1B-1.

MS: $[M+H]^+$=303

Preparation of Compound 1-9

Compound 1-9 was obtained in the same manner as in the preparation method of Compound 1-1, except that Structural Formula 1-9C was used instead of Structural Formula 1-1C.

MS: $[M+H]^+$=469

<Preparation Example 10> Synthesis of the Following Compound 1-10

[Compound 1-10]

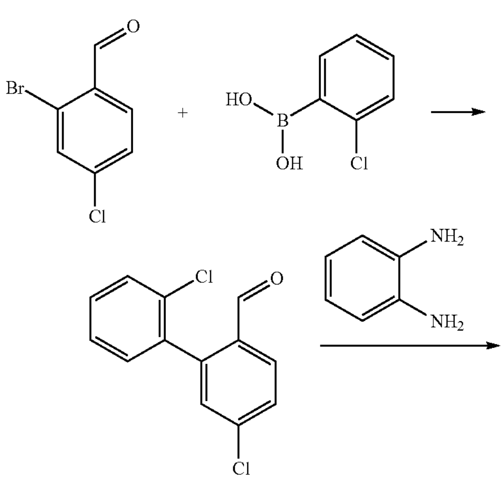

[Structural Formula 1-10A]

-continued

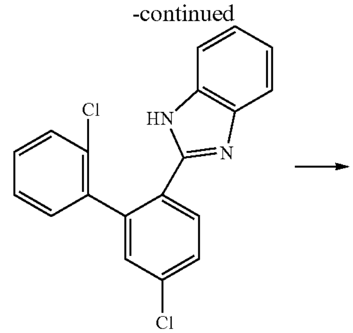

[Structural Formula 1-10B]

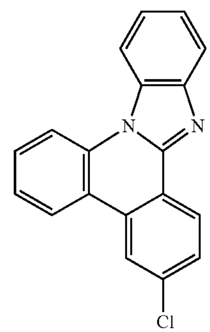

[Structural Formula 1-10C]

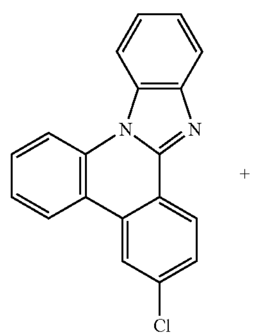

[Structural Formula 1-10C]

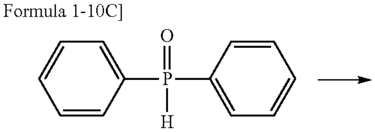

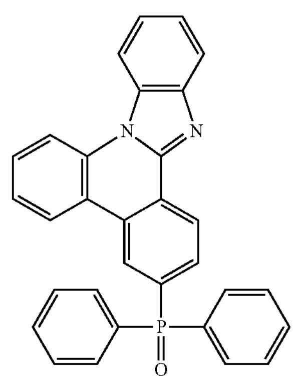

[Structural Formula 1-10D]

Preparation of Structural Formula 1-10A

Structural Formula 1-10A was obtained in the same manner as in the preparation method of Structural Formula 1-1A, except that 2-bromo-4-chlorobenzaldehyde was used instead of 2-bromobenzaldehyde.

MS: $[M+H]^+$=219

Preparation of Structural Formula 1-10B

Structural Formula 1-10B was obtained in the same manner as in the preparation method of Structural Formula 1-1B-1, except that Structural Formula 1-10A was used instead of Structural Formula 1-1A.

MS: $[M+H]^+$=339

Preparation of Structural Formula 1-10C

Structural Formula 1-10C was obtained in the same manner as in the preparation method of Structural Formula 1-1C, except that Structural Formula 1-10B was used instead of Structural Formula 1-1B-1.

MS: $[M+H]^+$=303

Preparation of Structural Compound 1-10

Compound 1-10 was obtained in the same manner as in the preparation method of Compound 1-1, except that Structural Formula 1-10C was used instead of Structural Formula 1-1C.

MS: $[M+H]^+$=469

<Preparation Example 11> Synthesis of the Following Compound 1-11

[Compound 1-11]

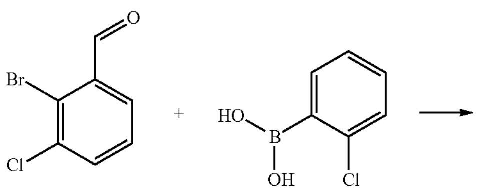

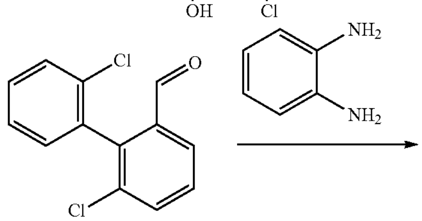

[Structural Formula 1-11A]

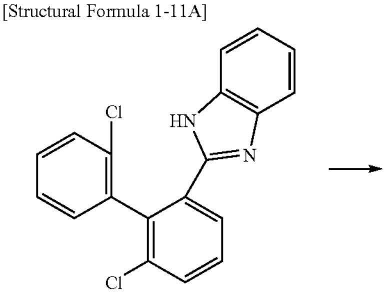

[Structural Formula 1-11B]

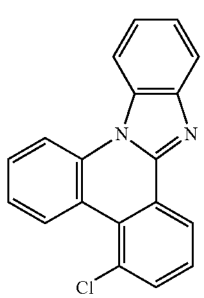

[Structural Formula 1-11C]

-continued

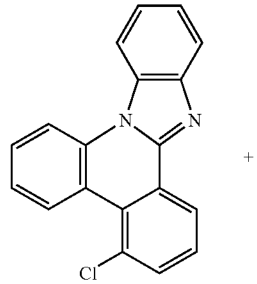

[Structural Formula 1-11C]

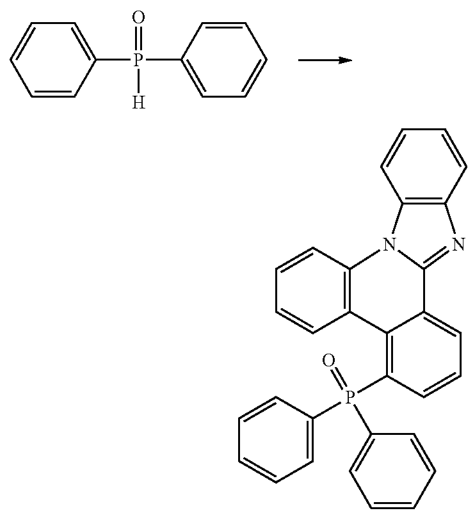

[Structural Formula 1-1D]

Preparation of Structural Formula 1-11A

Structural Formula 1-11A was obtained in the same manner as in the preparation method of Structural Formula 1-1A, except that 2-bromo-3-chlorobenzaldehyde was used instead of 2-bromobenzaldehyde.

MS: $[M+H]^+$=219

Preparation of Structural Formula 1-11B

Structural Formula 1-11B was obtained in the same manner as in the preparation method of Structural Formula 1-1B-1, except that Structural Formula 1-11A was used instead of Structural Formula 1-1A.

MS: $[M+H]^+$=339

Preparation of Structural Formula 1-11C

Structural Formula 1-11C was obtained in the same manner as in the preparation method of Structural Formula 1-1C, except that Structural Formula 1-11B was used instead of Structural Formula 1-1B-1.

MS: $[M+H]^+$=303

Preparation of Compound 1-11

Compound 1-11 was obtained in the same manner as in the preparation method of Compound 1-1, except that Structural Formula 1-11C was used instead of Structural Formula 1-1C.

MS: [M+H]+=469

<Preparation Example 12> Synthesis of the Following Compound 1-12

[Compound 1-12]

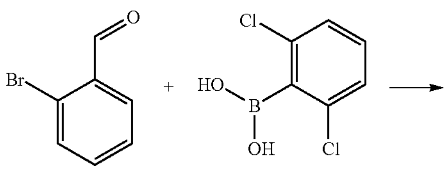

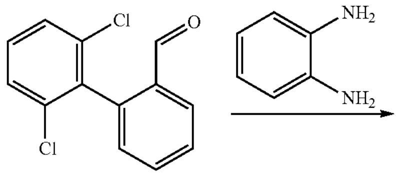

[Structural Formula 1-12A]

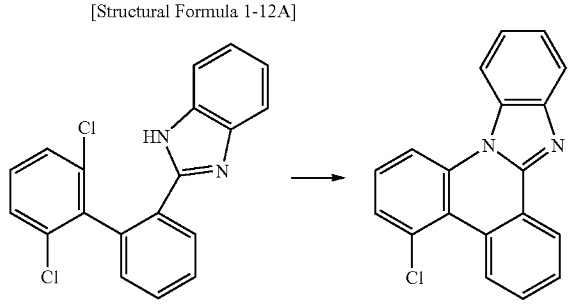

[Structural Formula 1-12B] [Structural Formula 1-12C]

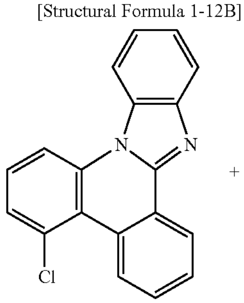

[Structural Formula 1-12C]

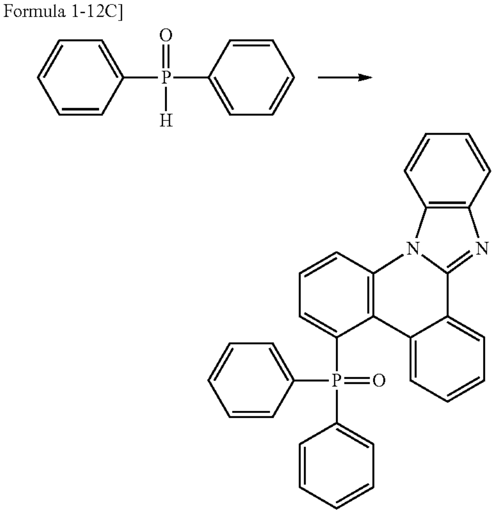

[Structural Formula 1-1D]

Preparation of Structural Formula 1-12A

Structural Formula 1-12A was obtained in the same manner as in the preparation method of Structural Formula 1-1A, except that 2,6-dichloro phenylboronic acid was used instead of 2-chloro phenylboronic acid.

MS: [M+H]+=251

Preparation of Structural Formula 1-12B

Structural Formula 1-12B was obtained in the same manner as in the preparation method of Structural Formula 1-1B-1, except that Structural Formula 1-12A and 1,2-diaminobenzene were used instead of Structural Formula 1-1A and 3-bromo-1,2-diaminobenzene, respectively.

MS: [M+H]+=339

Preparation of Structural Formula 1-12C

Structural Formula 1-12C was obtained in the same manner as in the preparation method of Structural Formula 1-1C, except that Structural Formula 1-12B was used instead of Structural Formula 1-1B-1.

MS: [M+H]+=303

Preparation of Compound 1-12

Compound 1-12 was obtained in the same manner as in the preparation method of Compound 1-1, except that Structural Formula 1-12C was used instead of Structural Formula 1-1C.

MS: [M+H]+=469

<Preparation Example 13> Synthesis of the Following Compound 1-13

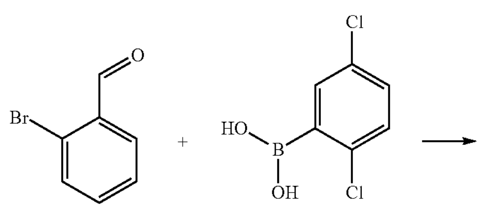

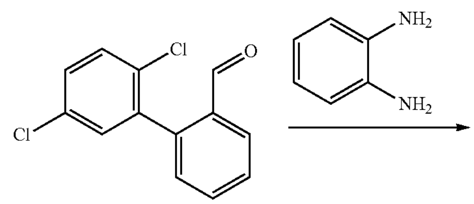

[Structural Formula 1-13A]

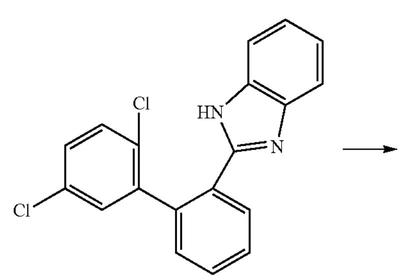

[Structural Formula 1-13B]

-continued

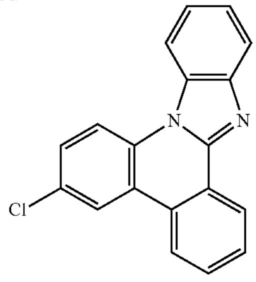

[Structural Formula 1-13C]

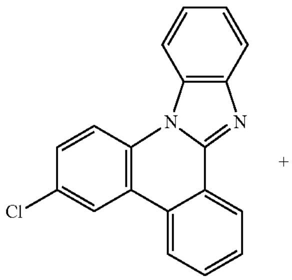

[Structural Formula 1-13C]

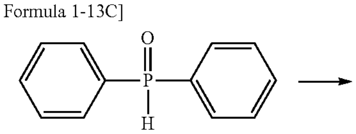

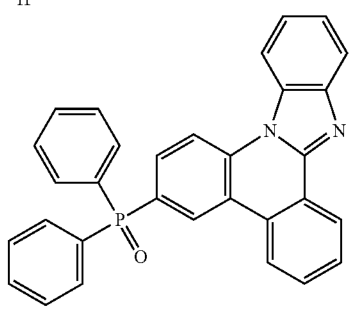

[Structural Formula 1-1D]

Preparation of Structural Formula 1-13A

Structural Formula 1-13A was obtained in the same manner as in the preparation method of Structural Formula 1-1A, except that 2,5-dichloro phenylboronic acid was used instead of 2-chloro phenylboronic acid.

MS: $[M+H]^+=251$

Preparation of Structural Formula 1-13B

Structural Formula 1-13B was obtained in the same manner as in the preparation method of Structural Formula 1-1B-1, except that Structural Formula 1-13A was used instead of Structural Formula 1-1A.

MS: $[M+H]^+=339$

Preparation of Structural Formula 1-13C

Structural Formula 1-13C was obtained in the same manner as in the preparation method of Structural Formula 1-1C, except that Structural Formula 1-13B was used instead of Structural Formula 1-1B-1.

MS: $[M+H]^+=303$

Preparation of Compound 1-13

Compound 1-13 was obtained in the same manner as in the preparation method of Compound 1-1, except that Structural Formula 1-13C was used instead of Structural Formula 1-1C.

MS: $[M+H]^+=469$

<Preparation Example 14> Synthesis of the Following Compound 1-14

[Compound 1-14]

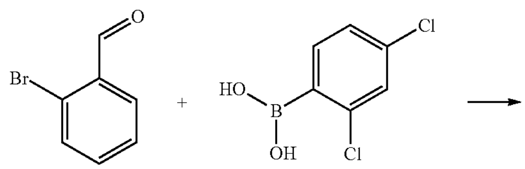

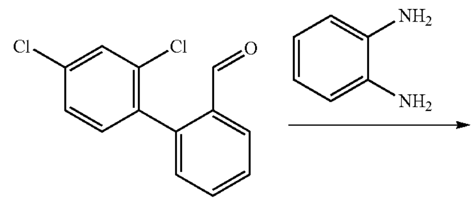

[Structural Formula 1-14A]

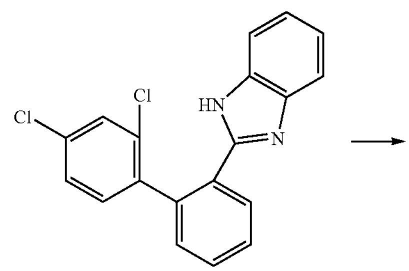

[Structural Formula 1-14B]

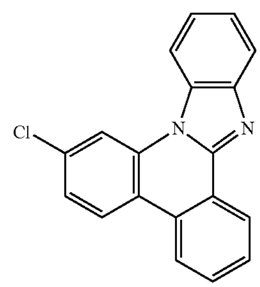

[Structural Formula 1-14C]

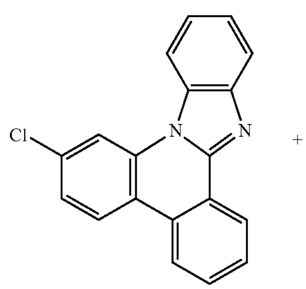

[Structural Formula 1-14C]

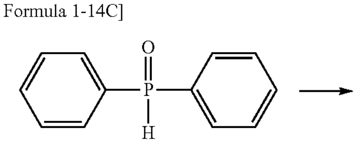

-continued

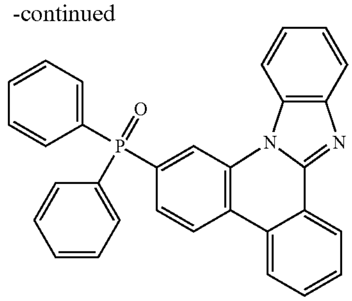

[Structural Formula 1-1D]

Preparation of Structural Formula 1-14A

Structural Formula 1-14A was obtained in the same manner as in the preparation method of Structural Formula 1-1A, except that 2,4-dichloro phenylboronic acid was used instead of 2-chloro phenylboronic acid.

MS: $[M+H]^+=251$

Preparation of Structural Formula 1-14B

Structural Formula 1-14B was obtained in the same manner as in the preparation method of Structural Formula 1-1B-1, except that Structural Formula 1-14A and 1,2-diaminobenzene were used instead of Structural Formula 1-1A and 3-bromo-1,2-diaminobenzene, respectively.

MS: $[M+H]^+=339$

Preparation of Structural Formula 1-14C

Structural Formula 1-14C was obtained in the same manner as in the preparation method of Structural Formula 1-1C, except that Structural Formula 1-14B was used instead of Structural Formula 1-1B-1.

MS: $[M+H]^+=303$

Preparation of Compound 1-14

Compound 1-14 was obtained in the same manner as in the preparation method of Compound 1-1, except that Structural Formula 1-14C was used instead of Structural Formula 1-1C. MS: $[M+H]^+=469$

<Preparation Example 15> Synthesis of the Following Compound 1-15

[Compound 1-15]

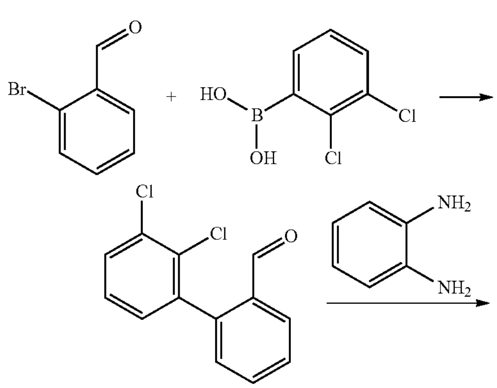

[Structural Formula 1-15A]

-continued

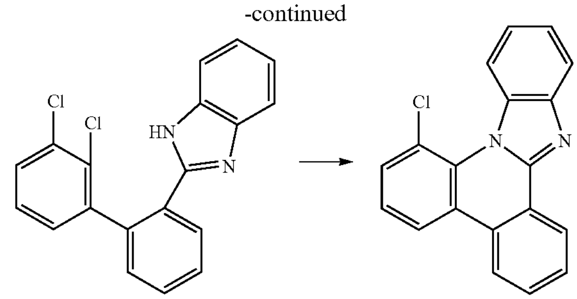

[Structural Formula 1-15B] [Structural Formula 1-15C]

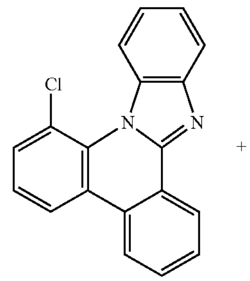

[Structural Formula 1-15C]

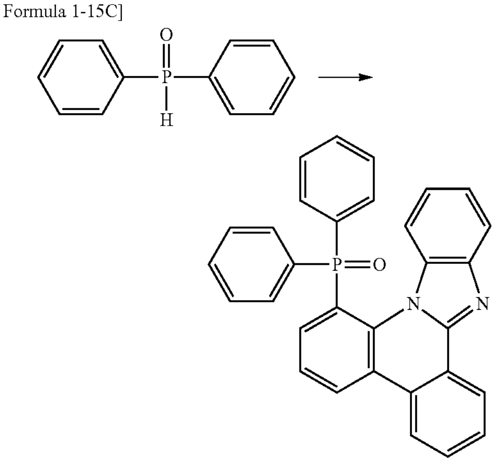

[Structural Formula 1-1D]

Preparation of Structural Formula 1-15A

Structural Formula 1-15A was obtained in the same manner as in the preparation method of Structural Formula 1-1A, except that 2,3-dichloro phenylboronic acid was used instead of 2-chloro phenylboronic acid.

MS: $[M+H]^+=251$

Preparation of Structural Formula 1-15B

Structural Formula 1-15B was obtained in the same manner as in the preparation method of Structural Formula 1-1B-1, except that Structural Formula 1-15A and 1,2-diaminobenzene were used instead of Structural Formula 1-1A and 3-bromo-1,2-diaminobenzene, respectively.

MS: $[M+H]^+=339$

Preparation of Structural Formula 1-15C

Compound 1-15C was obtained in the same manner as in the preparation method of Compound 1-1C, except that Structural Formula 1-15B was used instead of Structural Formula 1-1B-1.

MS: $[M+H]^+=303$

Preparation of Compound 1-15

Compound 1-15 was obtained in the same manner as in the preparation method of Compound 1-1, except that Structural Formula 1-15C was used instead of Structural Formula 1-1C.

MS: $[M+H]^+$=469

<Preparation Example 16> Synthesis of the Following Compound 1-16

[Compound 1-16]

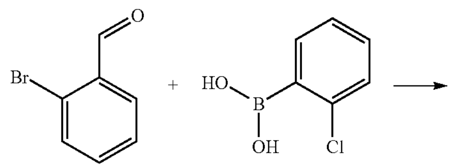

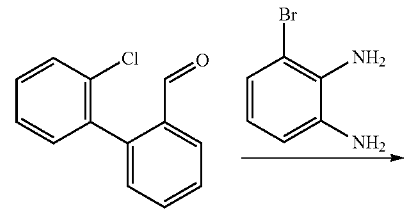

[Structural Formula 1-1A-1]

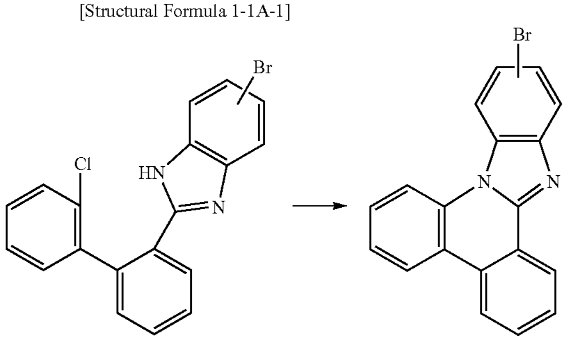

[Structural Formula 1-1B-1] [Structural Formula 1-1C]

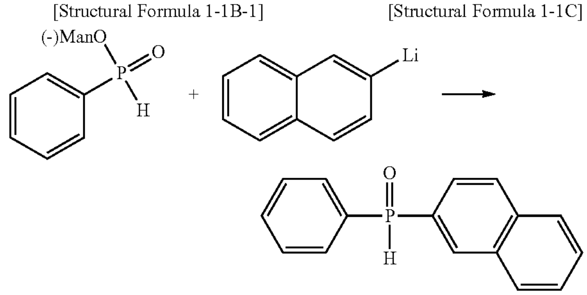

[Structural Formula 1-16D]

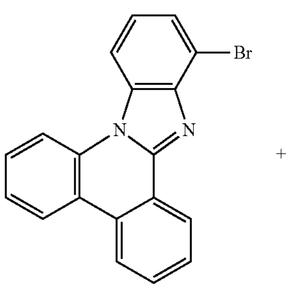

[Structural Formula 1-1C-1]

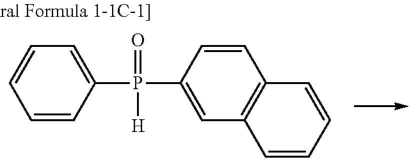

-continued

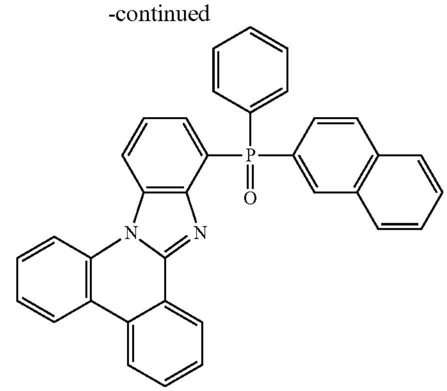

[Structural Formula 1-16D]

Preparation of Structural Formula 1-16D (−)-Menthyl phenylphosphinate (1 M in THF) was added to a solution (2.1 eq) of lithium naphthalene (1 M in $Et_2O$) at −80° C., and the resulting mixture was stirred under a $N_2$ gas flow for 30 minutes. The mixture was quenched with $NH_4Cl$, and then stirred for 30 minutes, the temperature was slowly increased to room temperature, and the material was filtered to obtain Structural Formula 1-16D (yield 99%).

Preparation of Compound 1-16

Compound 1-16 was obtained in the same manner as in the preparation method of Compound 1-1, except that Structural Formula 1-16D was used instead of Structural Formula 1-1D.

MS: $[M+H]^+$=519

<Preparation Example 17> Synthesis of the Following Compound 1-61

[Compound 1-61]

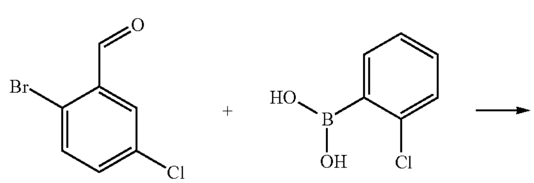

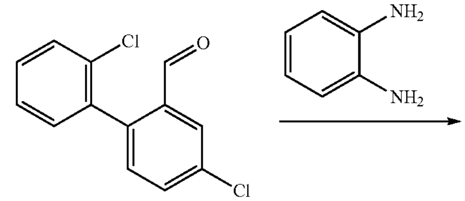

[Structural Formula 1-9A]

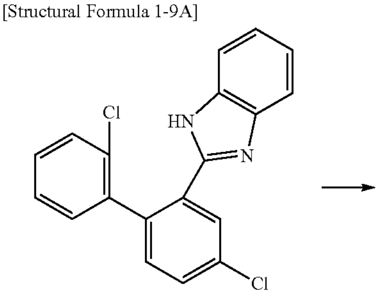

[Structural Formula 1-9B]

-continued

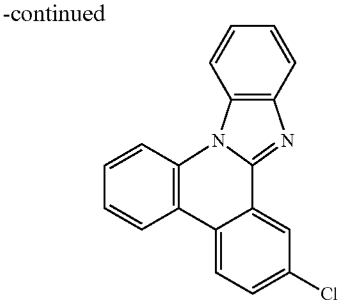

[Structural Formula 1-9C]

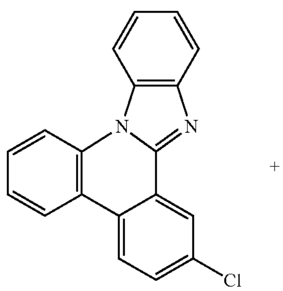

[Structural Formula 1-9C]

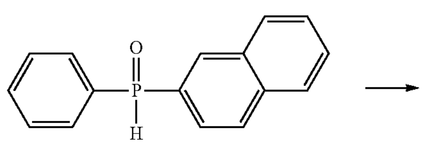

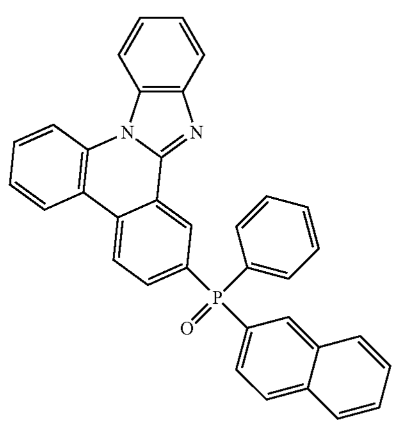

[Structural Formula 1-16D]

Preparation of Compound 1-61

Compound 1-61 was obtained in the same manner as in the preparation method of Compound 1-1, except that Structural Formula 1-9C and Structural Formula 1-16D were used instead of Structural Formula 1-1C and Structural Formula 1-1D, respectively.

MS: [M+H]+=519

<Preparation Example 18> Synthesis of the Following Compound 1-132

[Compound 1-132]

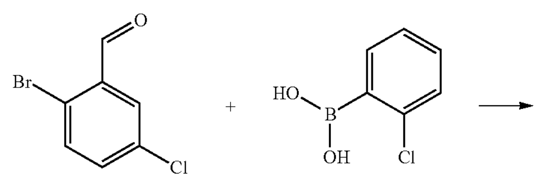

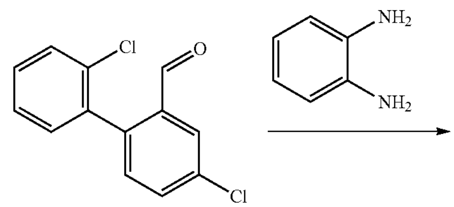

[Structural Formula 1-9A]

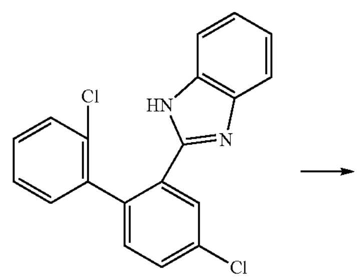

[Structural Formula 1-9B]

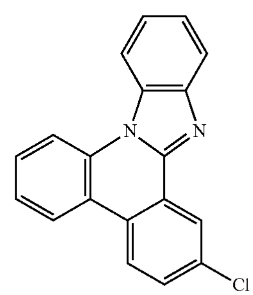

[Structural Formula 1-9C]

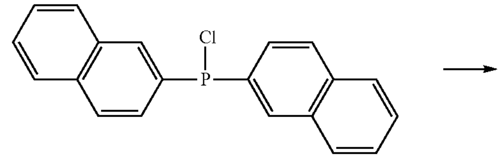

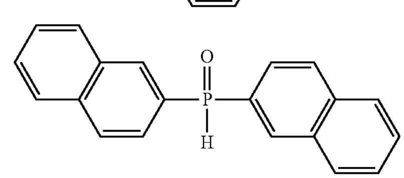

[Structural Formula 1-18D]

-continued

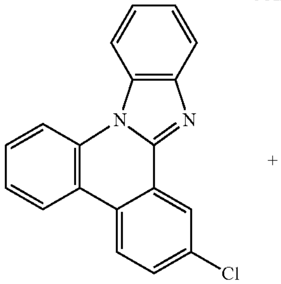

[Structural Formula 1-9C]

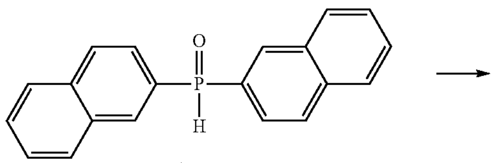

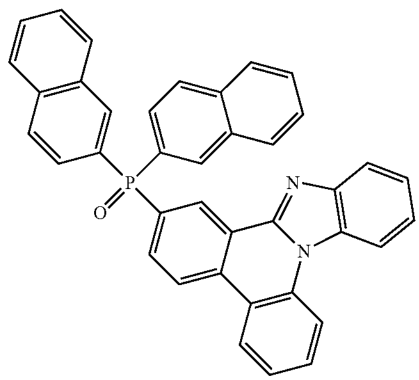

[Structural Formula 1-18D]

Preparation of Compound 1-132

Compound 1-132 was obtained in the same manner as in the preparation method of Compound 1-1, except that Structural Formula 1-9C and Structural Formula 1-18D were used instead of Structural Formula 1-1C and Structural Formula 1-1D, respectively.

MS: [M+H]+=569

<Preparation Example 19> Synthesis of the Following Compound 1-133

[Compound 1-133]

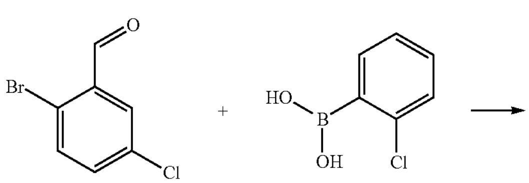

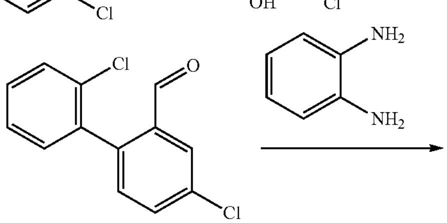

[Structural Formula 1-9A]

-continued

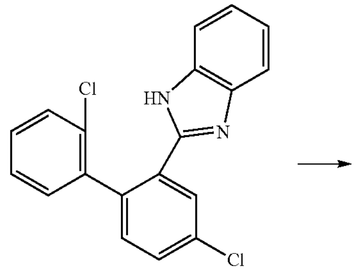

[Structural Formula 1-9B]

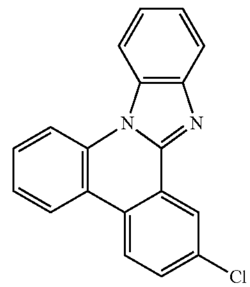

[Structural Formula 1-9C]

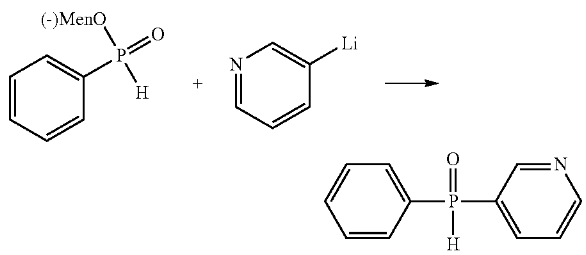

[Structural Formula 1-19D]

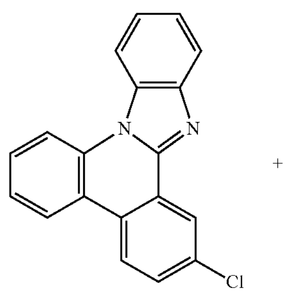

[Structural Formula 1-9C]

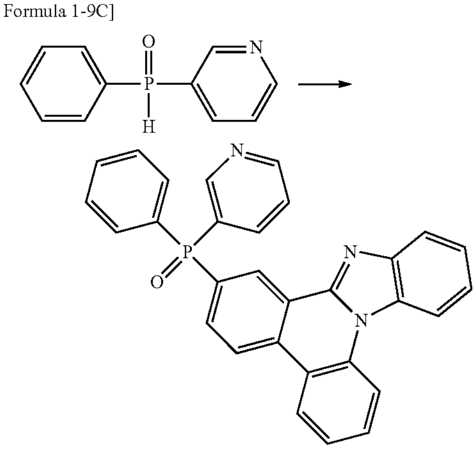

[Structural Formula 1-19D]

Preparation of Compound 1-133

Compound 1-133 was obtained in the same manner as in the preparation method of Compound 1-1, except that Structural Formula 1-9C and Structural Formula 1-19D were used instead of Structural Formula 1-1C and Structural Formula 1-1D, respectively.

MS: [M+H]+=470

<Preparation Example 20> Synthesis of the Following Compound 4-3

[Compound 4-3]

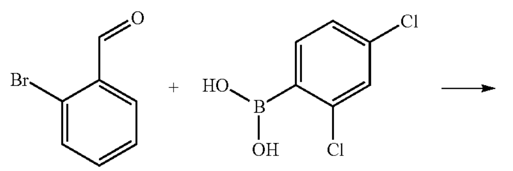

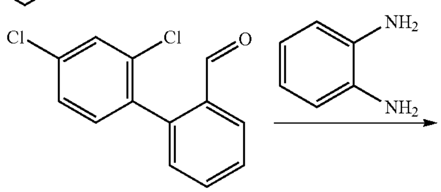

[Structural Formula 1-14A]

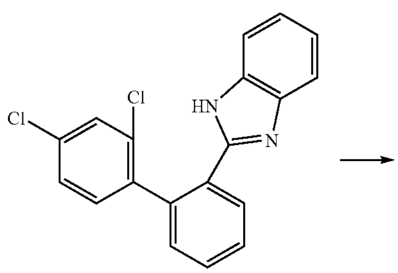

[Structural Formula 1-14B]

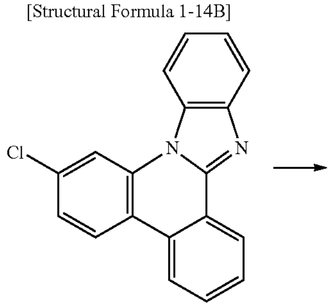

[Structural Formula 1-14C]

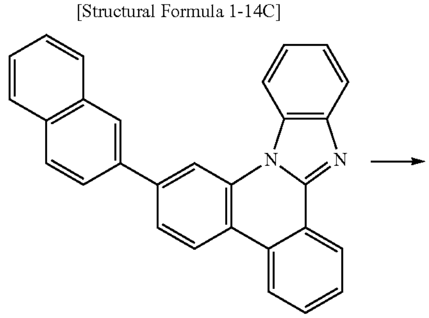

[Structural Formula 1-20E]

-continued

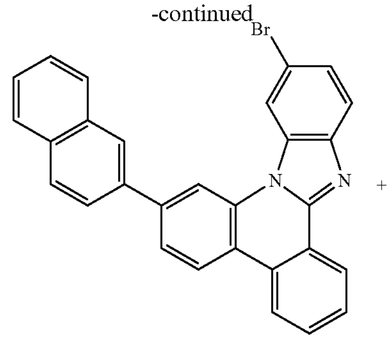

[Structural Formula 1-20F]

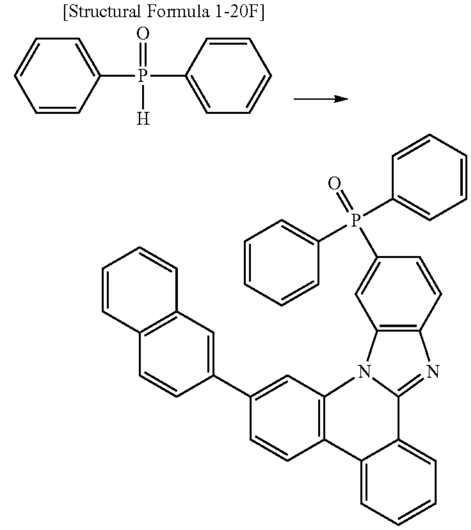

[Structural Formula 1-1D]

Preparation of Structural Formula 1-20E

Structural Formula 1-14C (20 g, 66.06 mmol) and 2-naphthalenyl boronic acid (12.6 g, 72.66 mmol) were put into 200 mL of tetrahydrofuran, and then potassium phosphate (28.04 g, 132.12 mmol) dissolved in 100 mL of water was added thereto, and the resulting mixture was refluxed. Next, tetrakis(triphenylphosphine)palladium(0) and a catalyst of $Pd(PPh_3)_4$) (2.29 g, 1.98 mmol) were added thereto, the resulting mixture was stirred for 8 hours, and then the temperature was slowly increased to room temperature, and the material was filtered to obtain Structural Formula 1-20E (23 g, yield 88%).

MS: [M+H]+=395

Preparation of Structural Formula 1-20F

Structural Formula 1-20E (23 g, 58.31 mmol) and N-bromosuccinimide (31.13 g, 174.92 mmol) were added to 500 mL of tetrahydrofuran, and then a catalytic amount of HBr was added dropwise thereto, and the resulting mixture was refluxed. After the mixture was stirred for 6 hours, the temperature was slowly cooled to room temperature, and the product was filtered to obtain Structural Formula 1-20F (25 g, yield 91%).

MS: [M+H]+=473

Preparation of Compound 4-3

Compound 4-3 was obtained in the same manner as in the preparation method of Compound 1-1, except that Structural Formula 1-20F was used instead of Structural Formula 1-1C.

MS: [M+H]+=595

<Preparation Example 21> Synthesis of Compound 7-2

[Compound 7-2]

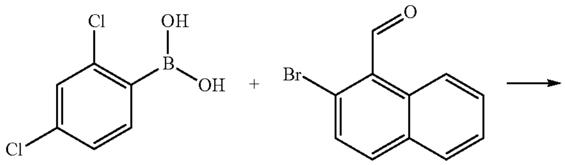

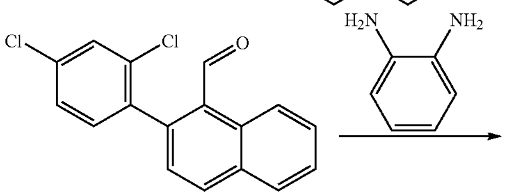

[Structural Formula 7-2A]

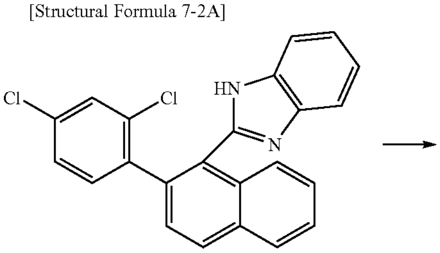

[Structural Formula 7-2B]

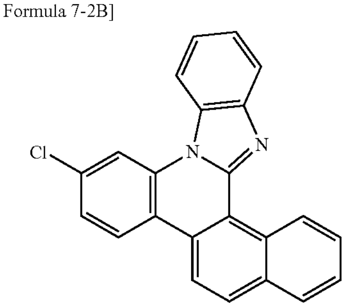

[Structural Formula 7-2C]

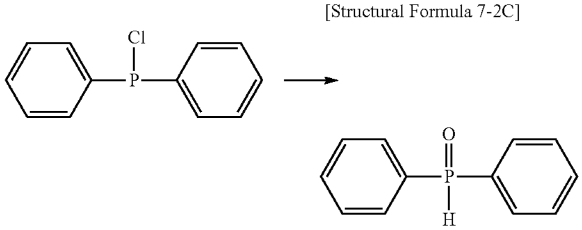

[Structural Formula 1-1D]

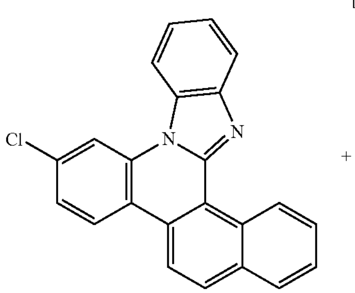

[Structural Formula 7-2C]

-continued

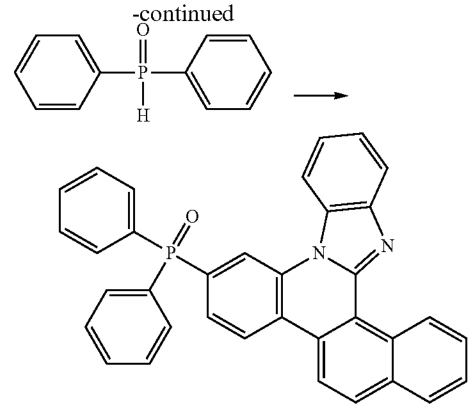

[Structural Formula 1-1D]

Preparation of Structural Formula 7-2A 2,4-dichlorophenylboronic acid (18.3 g, 95.8 mmol) and 2-bromo-1-naphthaldehyde (20.5 g, 87.2 mmol) were completely dissolved in tetrahydrofuran (THF) (300 mL), and then a 2 M potassium carbonate aqueous solution (180 mL) was added thereto, tetrakis(triphenylphosphino)palladium Pd(PPh3)4 (2.0 g, 2 mol %) was put thereinto, and then the mixture was stirred and refluxed for 5 hours. The mixture was cooled to normal temperature, the aqueous layer was removed, and the organic layer was dried over anhydrous magnesium sulfate (MgSO4), and then filtered. The filtrate was concentrated under reduced pressure, and subjected to column chromatographic purification at a ratio of tetrahydrofuran:hexane=1:10 to prepare Structural Formula 7-2A (21.0 g, 80%).

MS: [M+H]+=301

Preparation of Structural Formula 7-2B

Compound 7-2A (26.2 g, 87.0 mmol) and diaminobenzene (9.4 g, 87.0 mmol) were suspended in dioxane (1,4-dioxane) (200 mL) and acetic acid (AcOH) (20 mL). The obtained mixture was stirred and refluxed for about 6 hours, and cooled to normal temperature. The mixture was diluted with water (100 mL), and then the produced solid was filtered, and washed with water and ethyl ether to prepare Structural Formula 7-2B (19.3 g, 57%).

MS: [M+H]+=389

Preparation of Structural Formula 7-2C

Compound 7-2B (1.99 g, 5.10 mmol), sodium-tertiary-butoxide (NaOt-Bu) (0.58 g, 6.01 mmol), and Pd[P(t-Bu)3]2 (51 mg, 2 mol %) were suspended in toluene (50 mL). The obtained mixture was stirred and refluxed for about 6 hours, and cooled to normal temperature. Distilled water was added to the reaction solution, the reaction was terminated, the organic layer was extracted, dried over anhydrous magnesium sulfate, and then filtered. The filtrate was concentrated under reduced pressure and subjected to column chromatographic purification at a ratio of tetrahydrofuran:hexane hexane=1:5 to prepare Structural Formula 7-2C (0.756 g, 42%).

MS: [M+H]+=353

Preparation of Compound 7-2

Structural Formula 7-2C (15 g, 42.51 mmol) and Structural Formula 1-1D (17.17 g, 85.02 mmol) were suspended in dioxane (1,4-dioxane) (150 ml) and dimethyl acetamide (DMAC) (30 mL). The mixture was stirred and refluxed for about 12 hours, and cooled to normal temperature. The mixture was diluted with water (150 mL), and then the produced solid was filtered and washed with ethanol and ethyl acetate to prepare Compound 7-2 (18 g, 82%).

MS: [M+H]+=519

<Preparation Example 22> Synthesis of Compound 7-17

[Compound 7-17]

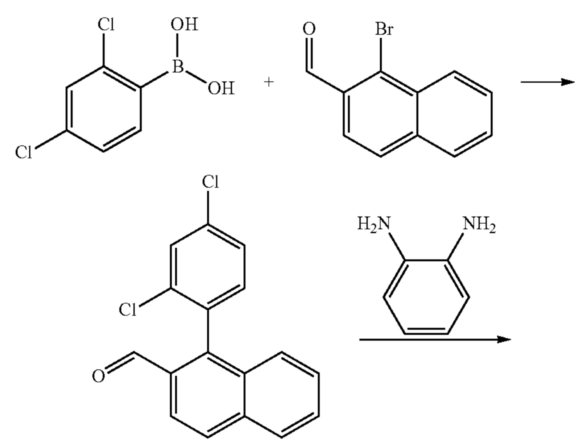

[Structural Formula 7-17A]

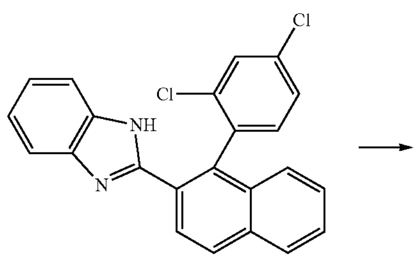

[Structural Formula 7-17B]

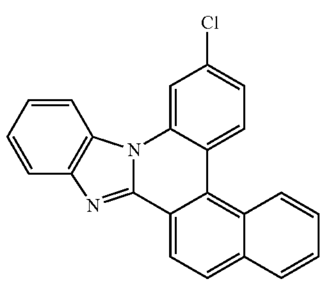

[Structural Formula 7-17C]

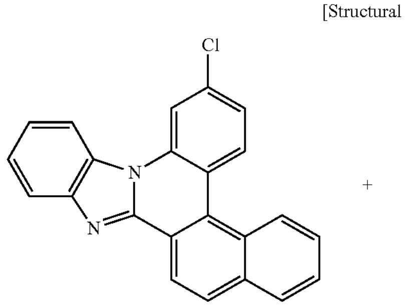

[Structural Formula 7-17C]

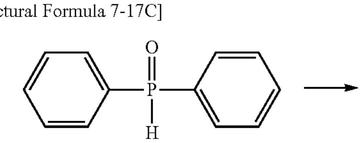

-continued

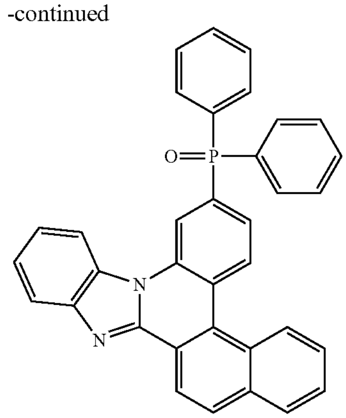

[Structural Formula 1-1D]

Preparation of Structural Formula 7-17A

Structural Formula 7-17A was obtained in the same manner as in the preparation method of Structural Formula 7-2A, except that 1-bromo-2-naphthaldehyde was used instead of 2-bromo-1-naphthaldehyde.

MS: [M+H]+=301

Preparation of Structural Formula 7-17B

Structural Formula 7-17B was obtained in the same manner as in the preparation method of Structural Formula 7-2B, except that Structural Formula 7-17A was used instead of Structural Formula 7-2A.

MS: [M+H]+=389

Preparation of Structural Formula 7-17C

Structural Formula 7-17C was obtained in the same manner as in the preparation method of Structural Formula 7-2C, except that Structural Formula 7-17B was used instead of Structural Formula 7-2B.

MS: [M+H]+=353

Preparation of Compound 7-17

Compound 7-17 was obtained in the same manner as in the preparation method of Compound 7-2, except that Structural Formula 7-17C was used instead of Structural Formula 7-2C.

MS: [M+H]+=519

<Preparation Example 23> Synthesis of Compound 7-33

[Compound 7-33]

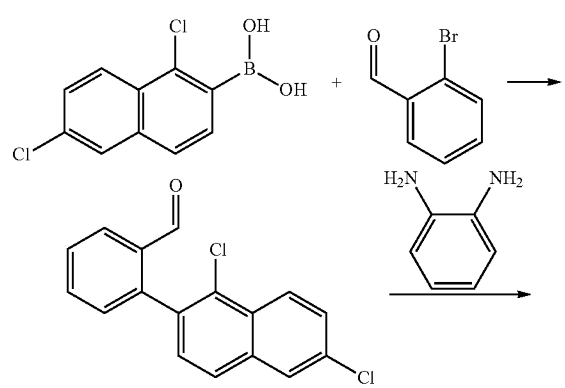

[Structural Formula 7-33A]

-continued

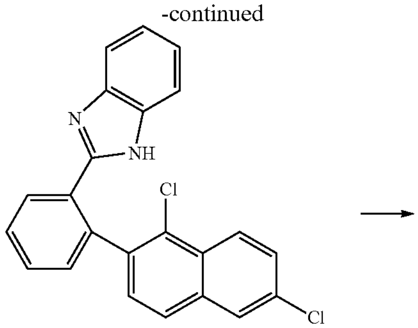

[Structural Formula 7-33B]

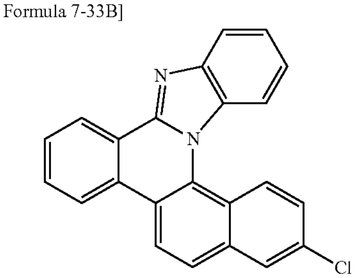

[Structural Formula 7-33C]

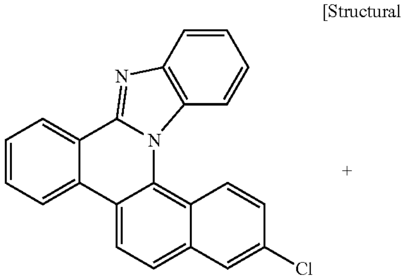

[Structural Formula 7-33C]

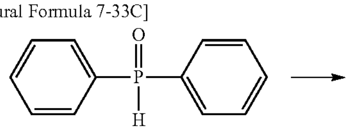

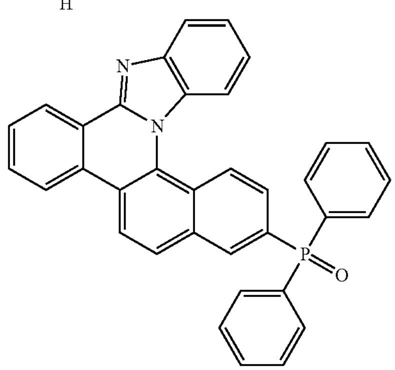

[Structural Formula 1-1D]

Preparation of Structural Formula 7-33A

Structural Formula 7-33A was obtained in the same manner as in the preparation method of Structural Formula 7-2A, except that 1,6-dichloro-2-naphthalenyl boronic acid and 2-bromobenzaldehyde were used instead of 2,4-dichlorophenylboronic acid and 2-bromo-1-naphthaldehyde, respectively.

MS: [M+H]+=301

Preparation of Structural Formula 7-33B

Structural Formula 7-33B was obtained in the same manner as in the preparation method of Structural Formula 7-2B, except that Structural Formula 7-33A was used instead of Structural Formula 7-2A.

MS: [M+H]+=389

Preparation of Structural Formula 7-33C

Structural Formula 7-33C was obtained in the same manner as in the preparation method of Structural Formula 7-2C, except that Structural Formula 7-33B was used instead of Structural Formula 7-2B.

MS: [M+H]+=353

Preparation of Compound 7-33

Compound 7-33 was obtained in the same manner as in the preparation method of Compound 7-2, except that Structural Formula 7-33C was used instead of Structural Formula 7-2C.

MS: [M+H]+=519

<Preparation Example 24> Synthesis of Compound 7-64

[Compound 7-64]

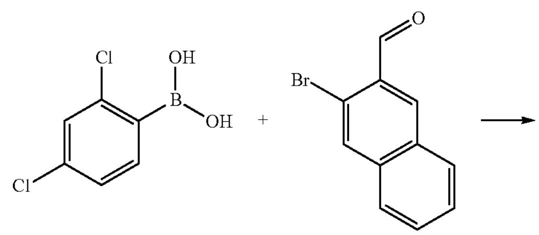

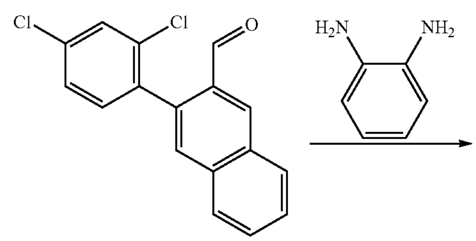

[Structural Formula 7-64A]

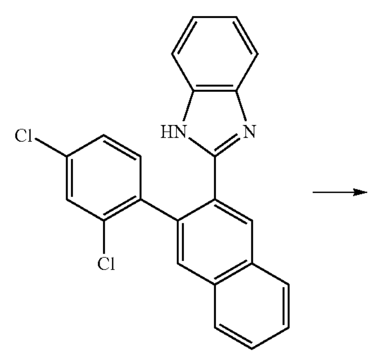

[Structural Formula 7-64B]

-continued

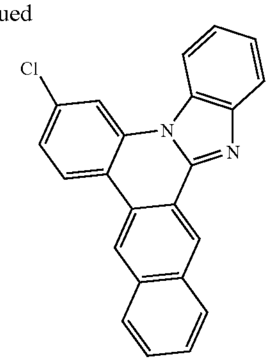

[Structural Formula 7-64C]

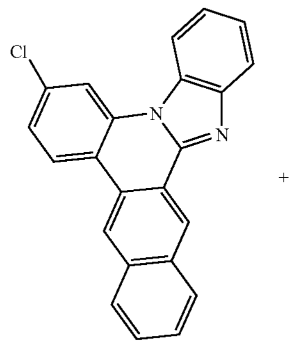

[Structural Formula 7-64C]

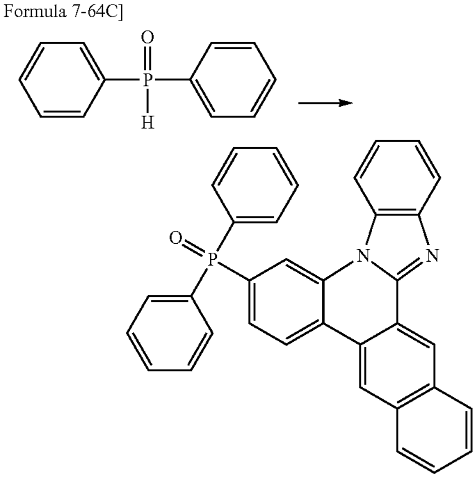

[Structural Formula 1-1D]

Preparation of Structural Formula 7-64A

Structural Formula 7-64A was obtained in the same manner as in the preparation method of Structural Formula 7-2A, except that 3-bromo-2-naphthaldehyde was used instead of 2-bromo-1-naphthaldehyde.

MS: [M+H]+=301

Preparation of Structural Formula 7-64B

Structural Formula 7-64B was obtained in the same manner as in the preparation method of Structural Formula 7-2B, except that Structural Formula 7-64A was used instead of Structural Formula 7-2A.

MS: [M+H]+=389

Preparation of Structural Formula 7-64C

Structural Formula 7-64C was obtained in the same manner as in the preparation method of Structural Formula 7-2C, except that Structural Formula 7-64B was used instead of Structural Formula 7-2B.

MS: [M+H]+=353

Preparation of Compound 7-64

Compound 7-64 was obtained in the same manner as in the preparation method of Compound 7-2, except that Structural Formula 7-64C was used instead of Structural Formula 7-2C.

MS: [M+H]+=519

<Preparation Example 25> Synthesis of Compound 7-77

[Compound 7-77]

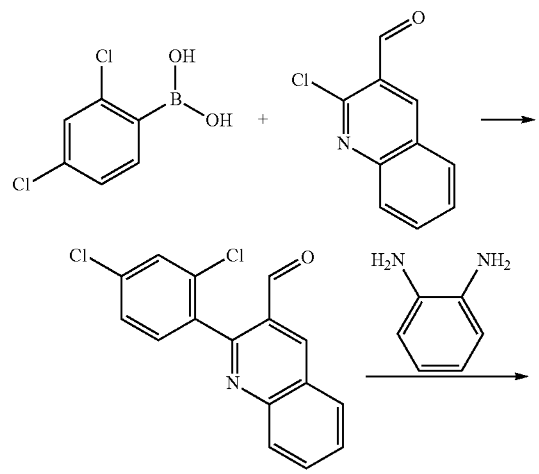

[Structural Formula 7-77A]

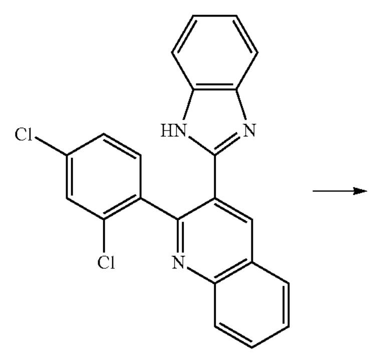

[Structural Formula 7-77B]

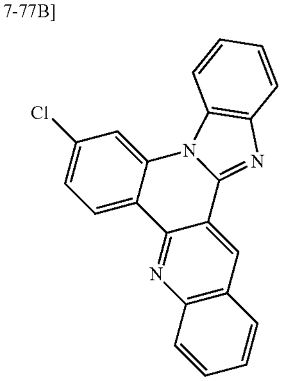

[Structural Formula 7-77C]

-continued

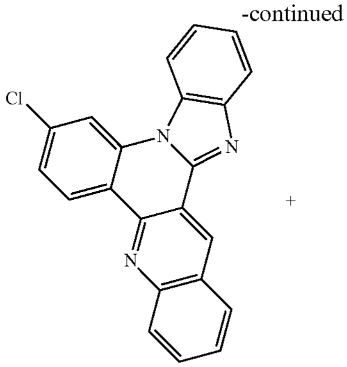

[Structural Formula 7-77C]

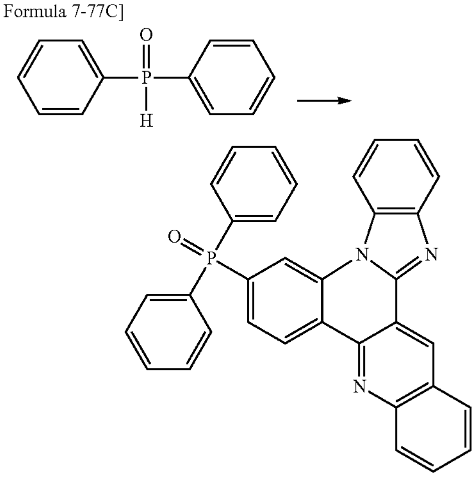

[Structural Formula 1-1D]

Preparation of Compound 7-78

Compound 7-77 was obtained in the same manner as in the preparation method of Compound 7-2, except that Structural Formula 7-77C was used instead of Structural Formula 7-2C.

MS: [M+H]+=520

<Preparation Example 26> Synthesis of Compound 7-3

[Compound 7-3]

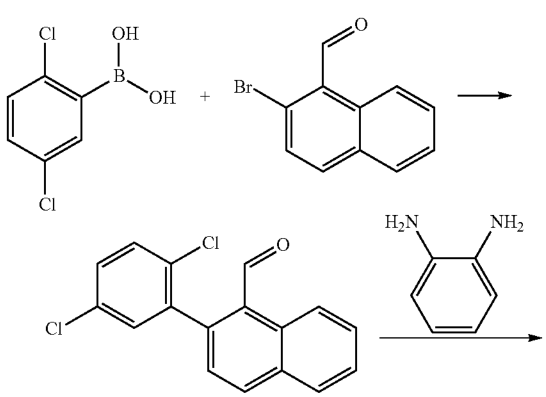

[Structural Formula 7-3A]

-continued

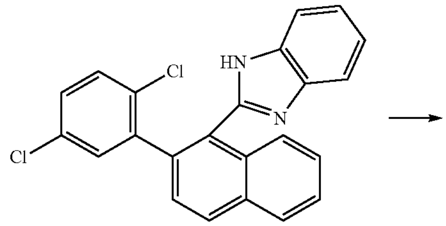

[Structural Formula 7-3B]

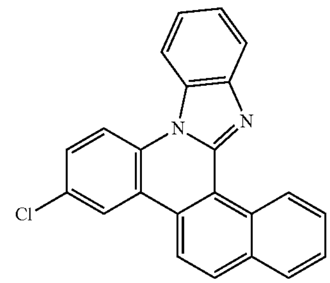

[Structural Formula 7-3C]

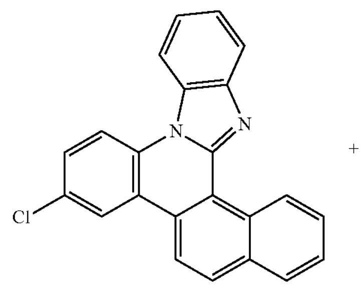

[Structural Formula 7-3C]

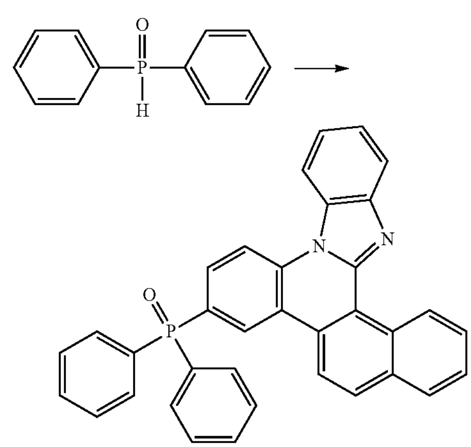

[Structural Formula 1-1D]

Preparation of Compound 7-3

Compound 7-3 was obtained in the same manner as in the preparation method of Compound 7-2, except that Structural Formula 7-3C was used instead of Structural Formula 7-2C.

MS: [M+H]+=519

<Preparation Example 27> Synthesis of Compound 7-18

[Compound 7-18]

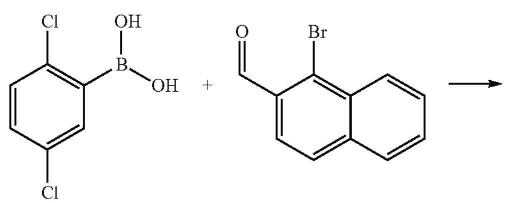

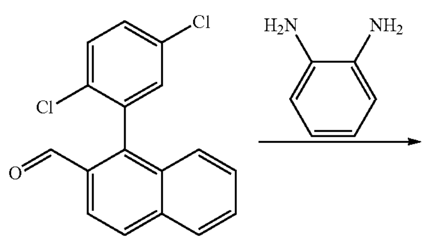

[Structural Formula 7-18A]

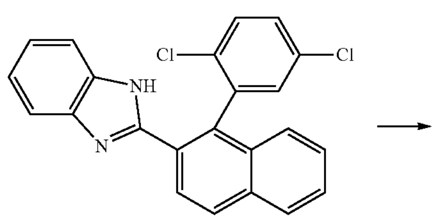

[Structural Formula 7-18B]

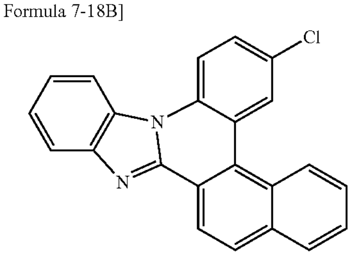

[Structural Formula 7-18C]

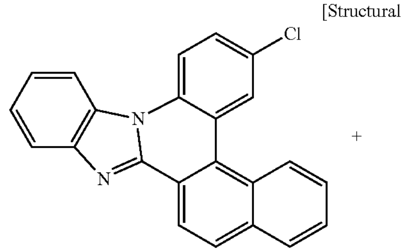

[Structural Formula 7-18C]

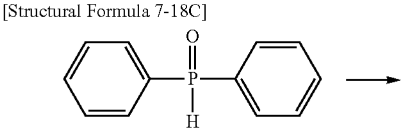

-continued

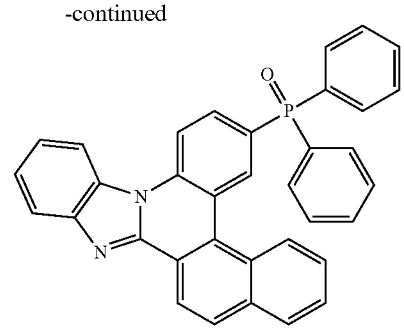

[Structural Formula 1-1D]

Preparation of Compound 7-18

Compound 7-18 was obtained in the same manner as in the preparation method of Compound 7-2, except that Structural Formula 7-18C was used instead of Structural Formula 7-2C.

MS: [M+H]+=519

<Preparation Example 28> Synthesis of Compound 7-4

[Compound 7-4]

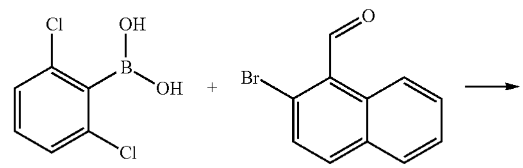

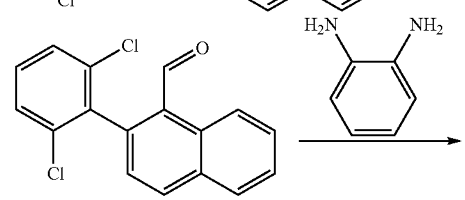

[Structural Formula 7-4A]

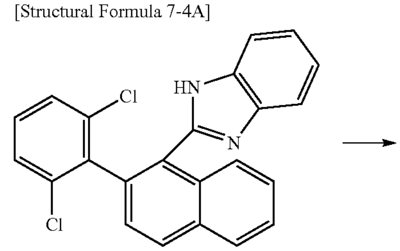

[Structural Formula 7-4B]

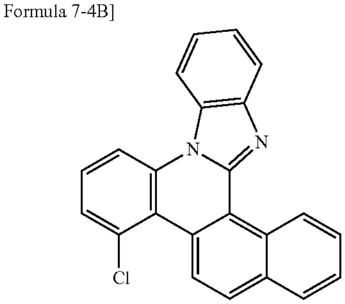

[Structural Formula 7-4C]

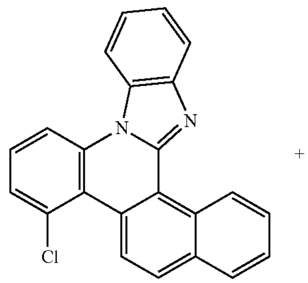

[Structural Formula 7-4C]

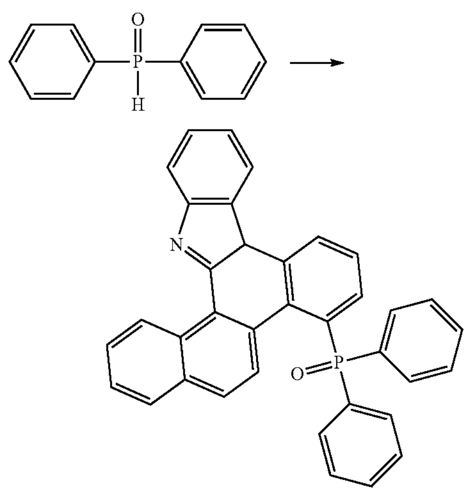

[Structural Formula 1-1D]

Preparation of Compound 7-4

Compound 7-4 was obtained in the same manner as in the preparation method of Compound 7-2, except that Structural Formula 7-4C was used instead of Structural Formula 7-2C.

MS: [M+H]+=519

<Preparation Example 29> Synthesis of Compound 7-10

[Compound 7-10]

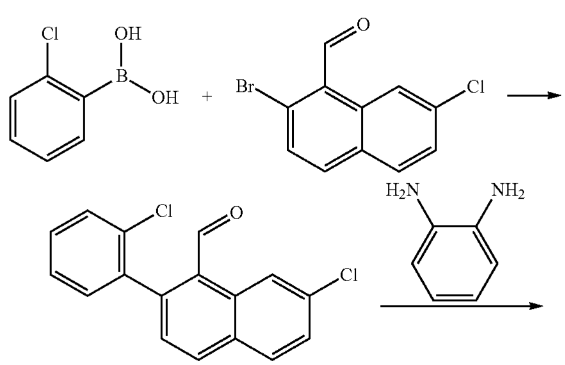

[Structural Formula 7-10A]

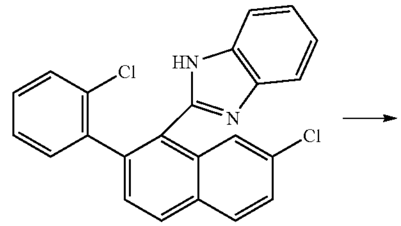

[Structural Formula 7-10B]

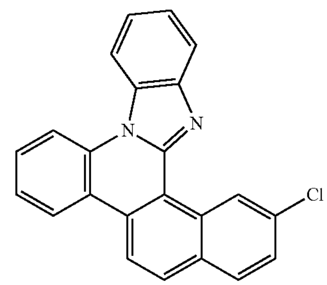

[Structural Formula 7-10C]

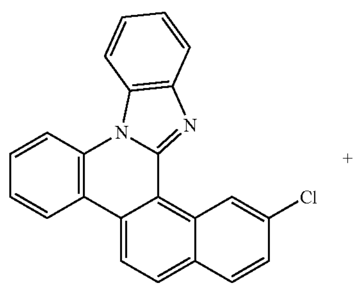

[Structural Formula 7-10C]

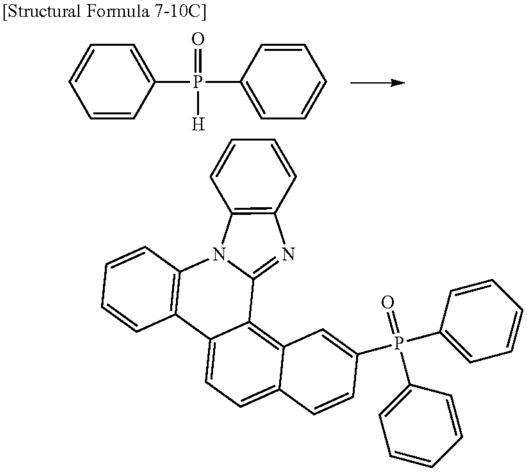

[Structural Formula 1-1D]

Preparation of Compound 7-10

Compound 7-10 was obtained in the same manner as in the preparation method of Compound 7-2, except that Structural Formula 7-10C was used instead of Structural Formula 7-2C.

MS: [M+H]+=519

<Preparation Example 30> Synthesis of Compound 7-11

[Compound 7-11]

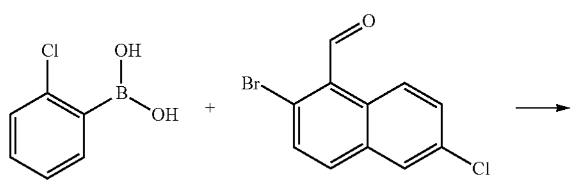

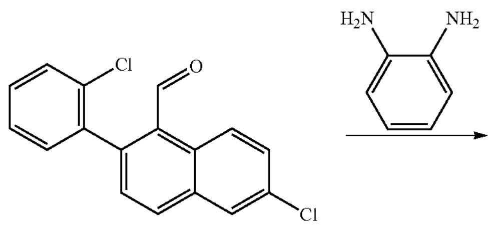

[Structural Formula 7-11A]

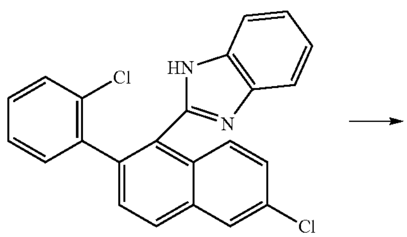

[Structural Formula 7-11B]

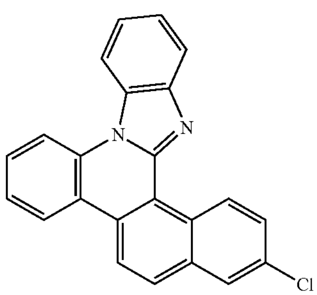

[Structural Formula 7-11C]

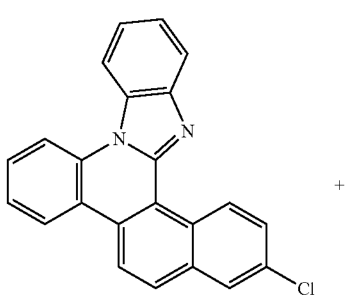

[Structural Formula 7-11C]

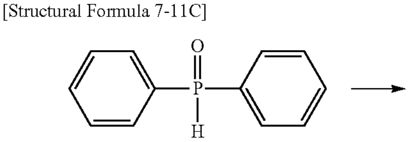

-continued

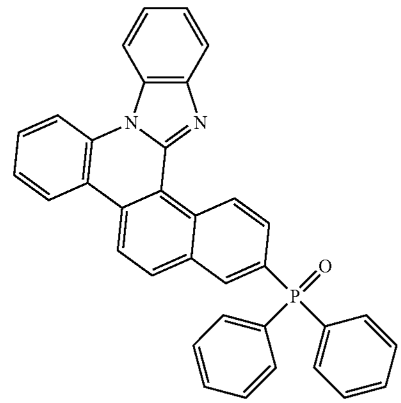

[Structural Formula 1-1D]

Preparation of Compound 7-11

Compound 7-11 was obtained in the same manner as in the preparation method of Compound 7-2, except that Structural Formula 7-11C was used instead of Structural Formula 7-2C.

MS: [M+H]+=519

<Preparation Example 31> Synthesis of Compound 7-21

[Compound 7-21]

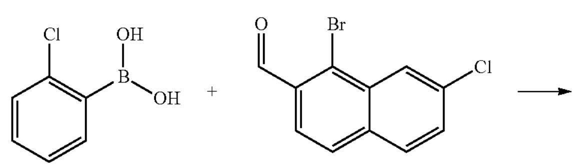

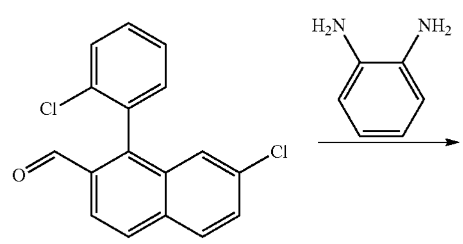

[Structural Formula 7-12A]

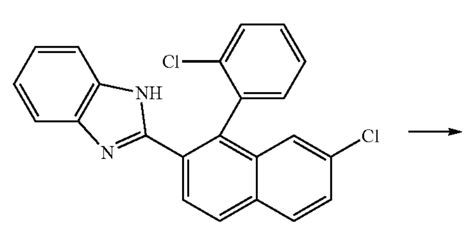

[Structural Formula 7-21B]

-continued

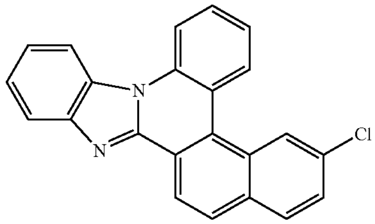

[Structural Formula 7-21C]

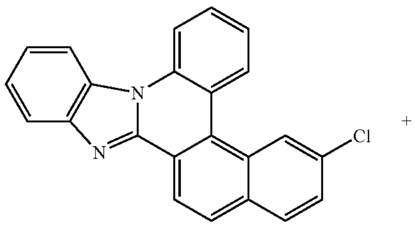

[Structural Formula 7-21C]

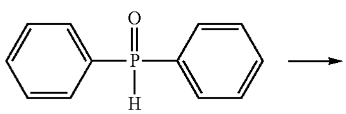

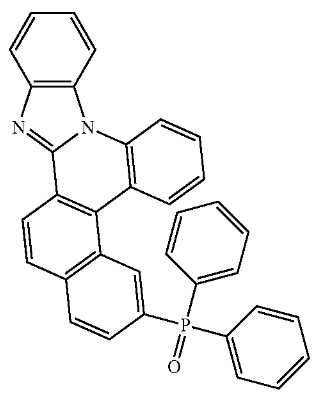

[Structural Formula 1-1D]

Preparation of Compound 7-21

Compound 7-21 was obtained in the same manner as in the preparation method of Compound 7-2, except that Structural Formula 7-21C was used instead of Structural Formula 7-2C.

MS: [M+H]+=519

<Preparation Example 32> Synthesis of Compound 7-34

[Compound 7-34]

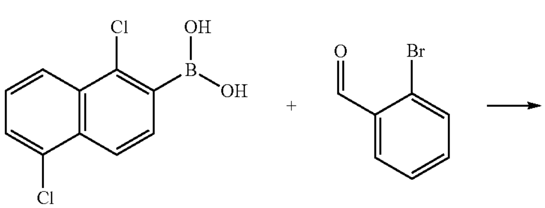

-continued

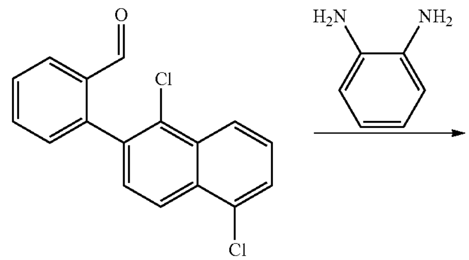

[Structural Formula 7-34A]

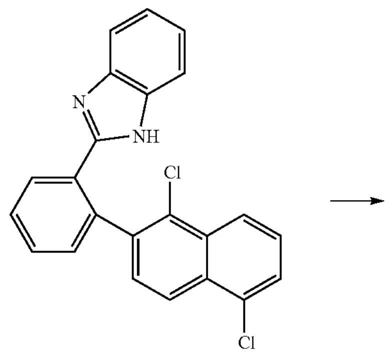

[Structural Formula 7-34B]

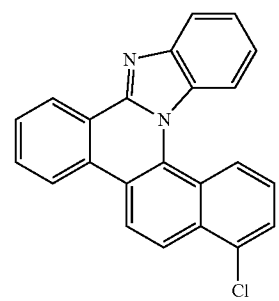

[Structural Formula 7-34C]

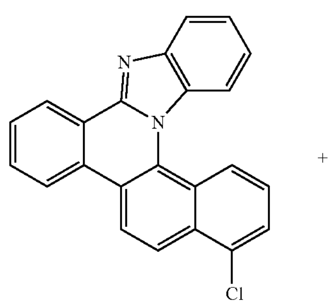

[Structural Formula 7-34C]

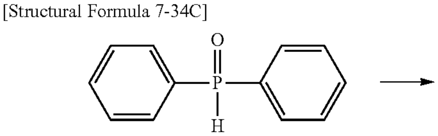

-continued

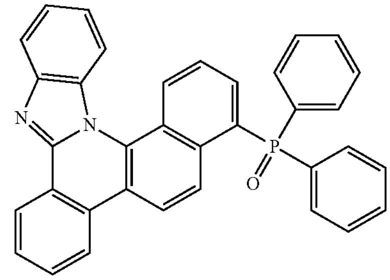

[Structural Formula 1-1D]

Preparation of Compound 7-34

Compound 7-34 was obtained in the same manner as in the preparation method of Compound 7-2, except that Structural Formula 7-34C was used instead of Structural Formula 7-2C.

MS: [M+H]+=519

<Preparation Example 33> Synthesis of Compound 7-37

[Compound 7-37]

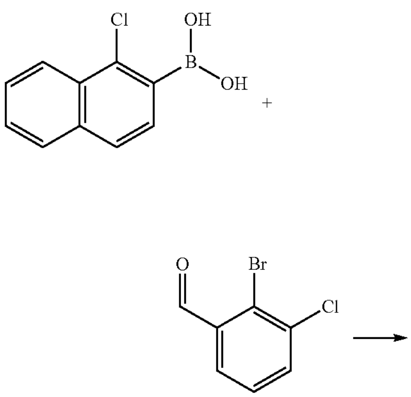

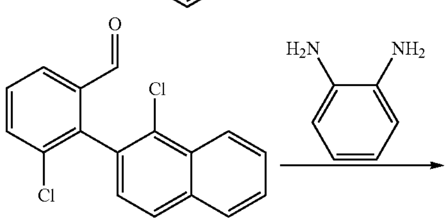

[Structural Formula 7-37A]

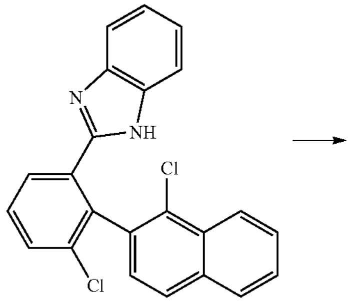

[Structural Formula 7-37B]

-continued

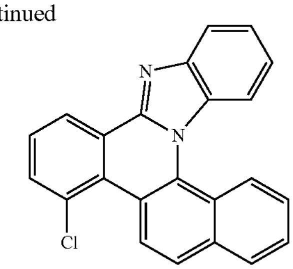

[Structural Formula 7-37C]

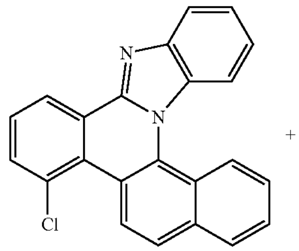

[Structural Formula 7-37C]

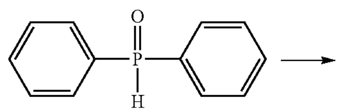

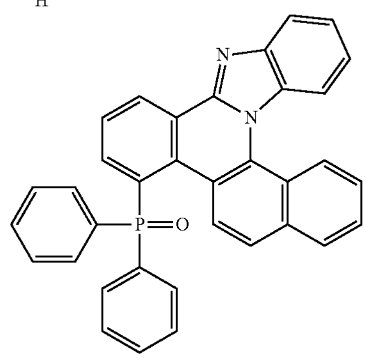

[Structural Formula 1-1D]

Preparation of Compound 7-37

Compound 7-37 was obtained in the same manner as in the preparation method of Compound 7-2, except that Structural Formula 7-37C was used instead of Structural Formula 7-2C.

MS: [M+H]+=519

<Preparation Example 34> Synthesis of Compound 7-51

[Compound 7-51]

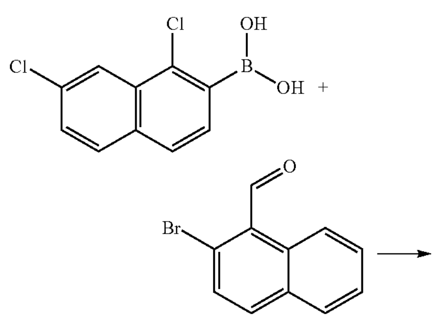

-continued

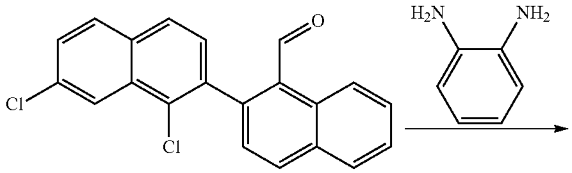

[Structural Formula 7-51A]

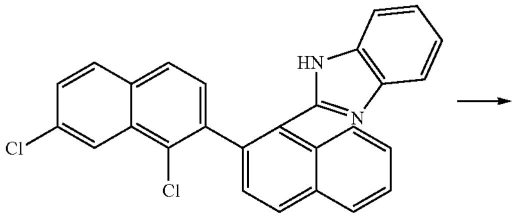

[Structural Formula 7-51B]

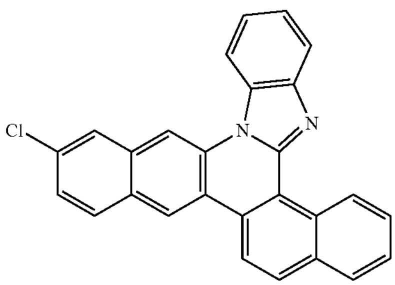

[Structural Formula 7-51C]

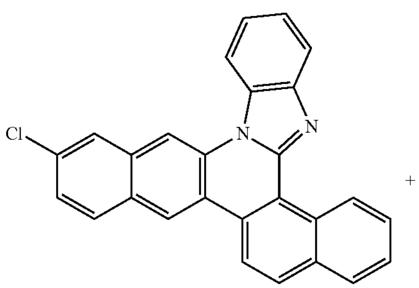

[Structural Formula 7-51C]

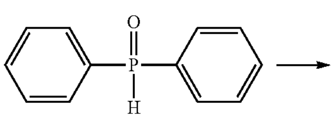

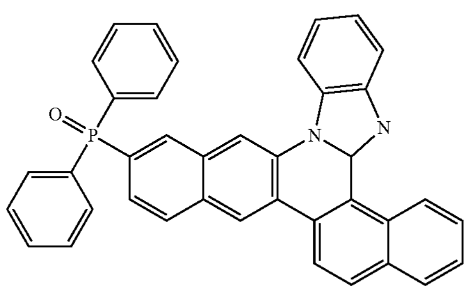

[Structural Formula 1-1D]

Preparation of Compound 7-51

Compound 7-51 was obtained in the same manner as in the preparation method of Compound 7-2, except that Structural Formula 7-51C was used instead of Structural Formula 7-2C.

MS: [M+H]+=569

<Preparation Example 35> Synthesis of Compound 7-52

[Compound 7-52]

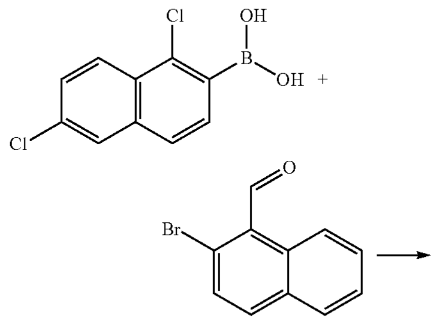

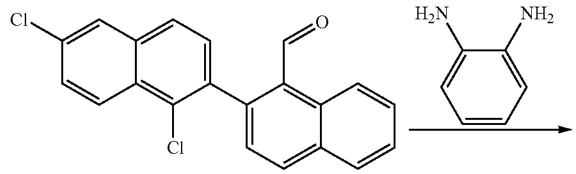

[Structural Formula 7-52A]

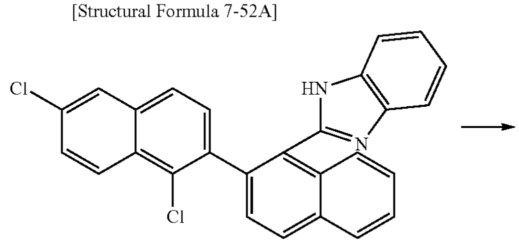

[Structural Formula 7-52B]

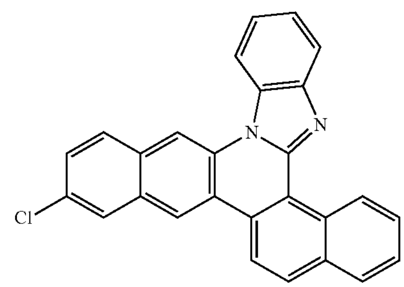

[Structural Formula 7-52C]

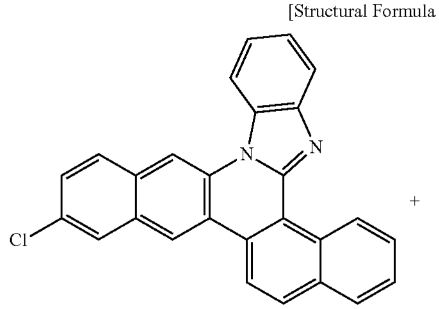

[Structural Formula 7-52C]

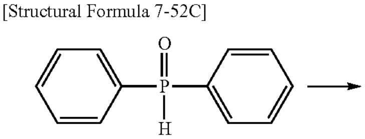

-continued

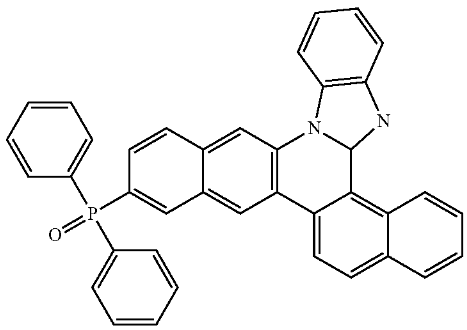

[Structural Formula 1-1D]

Preparation of Compound 7-52

Compound 7-52 was obtained in the same manner as in the preparation method of Compound 7-2, except that Structural Formula 7-52C was used instead of Structural Formula 7-2C.

MS: [M+H]+=569

<Preparation Example 36> Synthesis of Compound 7-90

[Compound 7-90]

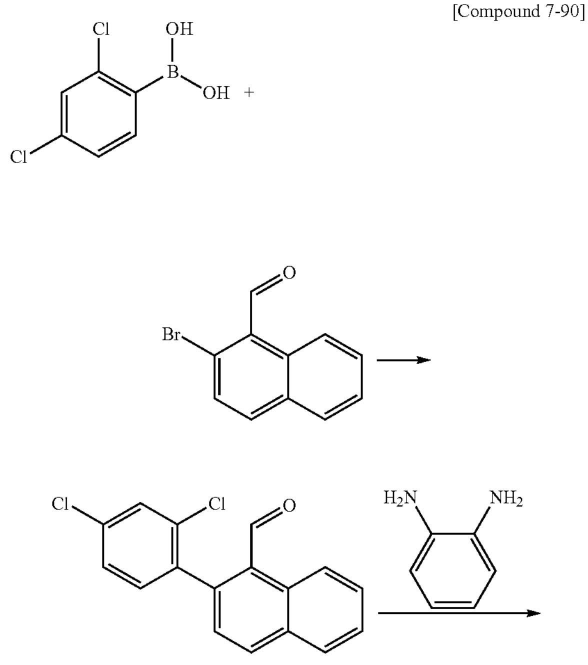

[Structural Formula 7-90A]

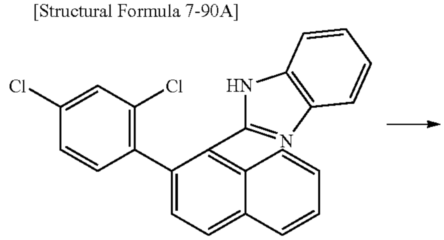

[Structural Formula 7-90B]

-continued

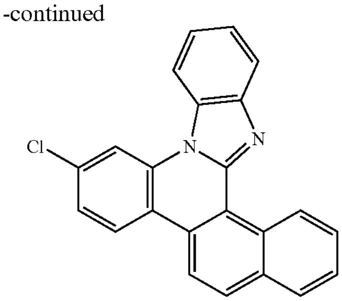

[Structural Formula 7-90C]

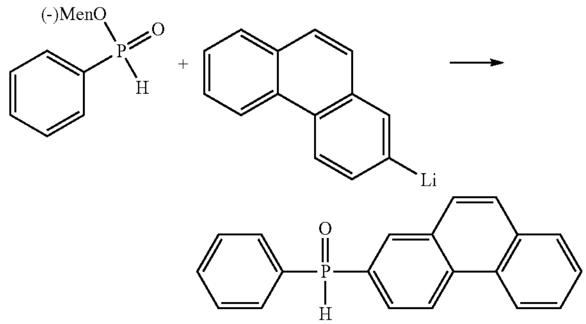

[Structural Formula 1-20D]

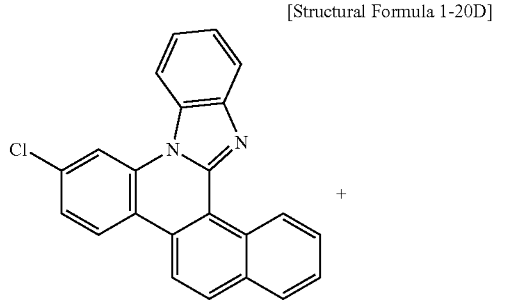

[Structural Formula 7-90C]

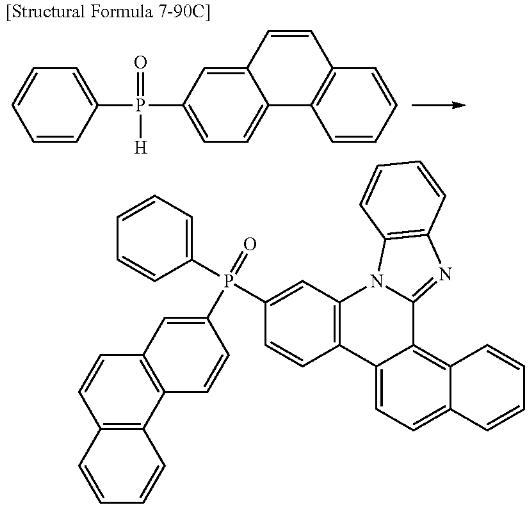

[Structural Formula 1-20D]

Preparation of Structural Formula 1-20D (−)-Menthyl phenylphosphinate (1 M in THF) was added to a solution (2.1 eq) of lithium phenanthrene (1 M in $Et_2O$) at −80° C., and the resulting mixture was stirred under a $N_2$ gas flow for 30 minutes. The mixture was quenched with $NH_4Cl$, and then stirred for 30 minutes, the temperature was slowly increased to room temperature, and the material was filtered to obtain Structural Formula 1-20D (yield 99%).

MS: [M+H]+=303

Preparation of Compound 7-90

Compound 7-90 was obtained in the same manner as in the preparation method of Compound 7-2, except that Structural Formula 1-20D was used instead of Structural Formula 1-1D.

MS: [M+H]+=619

<Preparation Example 37> Preparation of Compound 7-118

[Compound 7-118]

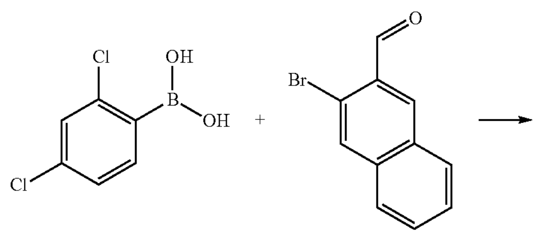

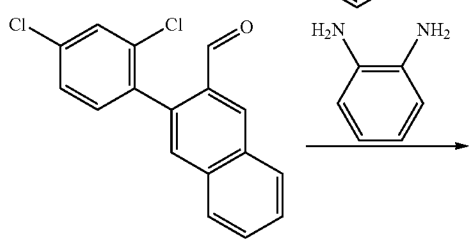

[Structural Formula 7-118A]

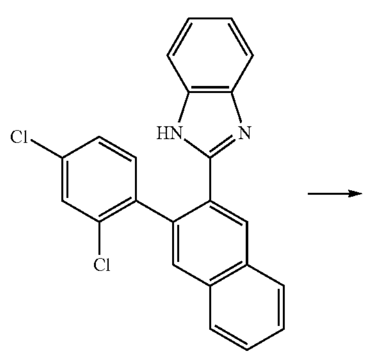

[Structural Formula 7-118B]

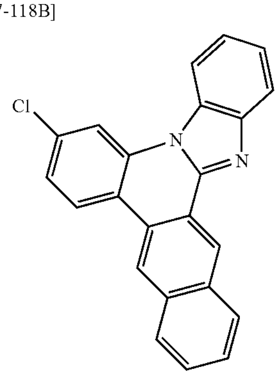

[Structural Formula 7-118C]

-continued

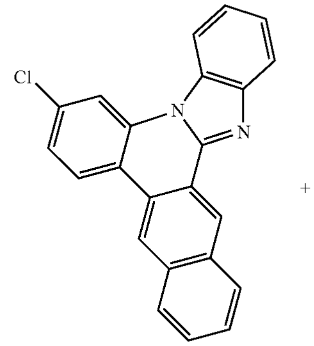

[Structural Formula 7-118C]

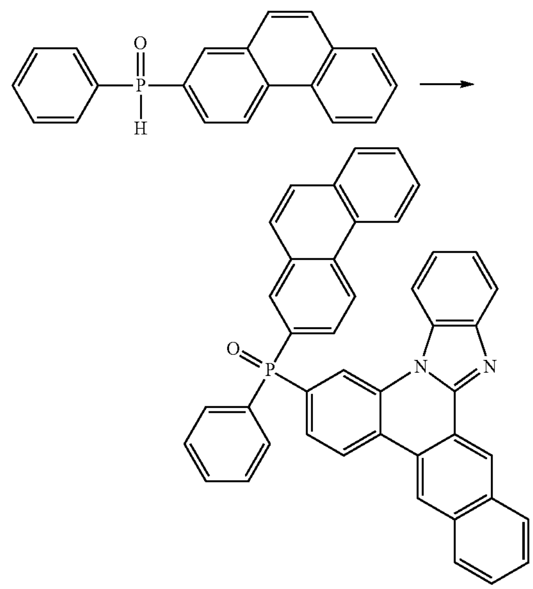

[Structural Formula 1-20D]

Preparation of Compound 7-118

Compound 7-118 was obtained in the same manner as in the preparation method of Compound 7-2, except that Structural Formula 7-118C and Structural Formula 1-20D were used instead of Structural Formula 7-2C and Structural Formula 1-1D, respectively.

MS: [M+H]+=619

<Preparation Example 38> Synthesis of Compound 7-132

[Compound 7-132]

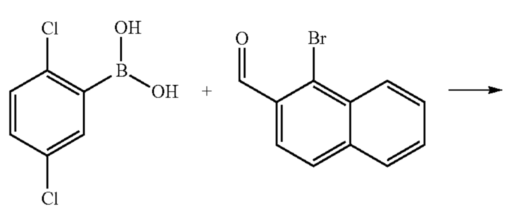

-continued

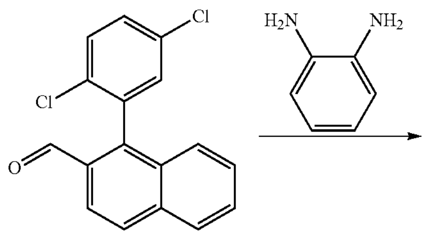

[Structural Formula 7-132A]

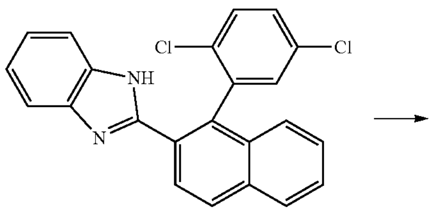

[Structural Formula 7-132B]

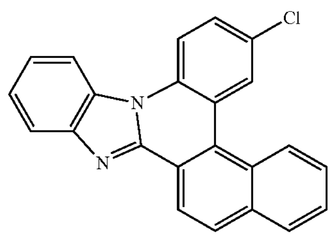

[Structural Formula 7-132C]

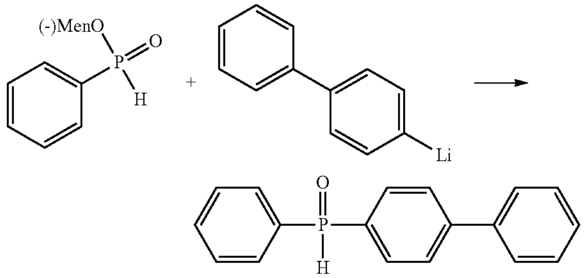

[Structural Formula 1-21D]

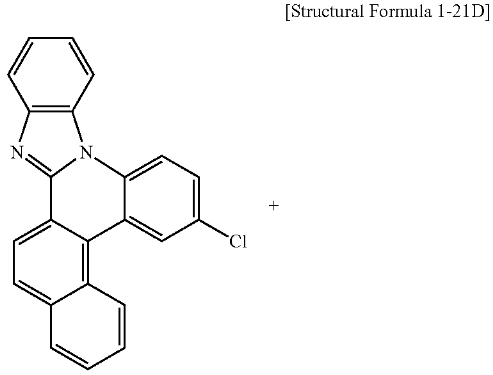

[Structural Formula 7-132C]

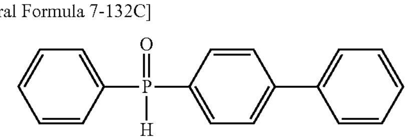

-continued

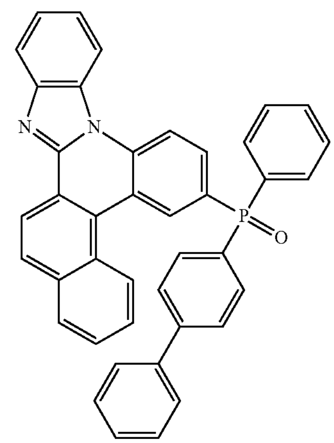

[Structural Formula 1-21D]

Preparation of Structural Formula 1-21D (−)-Menthyl phenylphosphinate (1 M in THF) was added to a solution (2.1 eq) of biphenyl lithium (1 M in $Et_2O$) at −80° C., and the resulting mixture was stirred under a $N_2$ gas flow for 30 minutes. The mixture was quenched with $NH_4Cl$, and then stirred for 30 minutes, the temperature was slowly increased to room temperature, and the material was filtered to obtain Structural Formula 1-21D (yield 99%).

MS: [M+H]+=279

Preparation of Compound 7-132

Compound 7-132 was obtained in the same manner as in the preparation method of Compound 7-2, except that Structural Formula 7-132C and Structural Formula 1-21D were used instead of Structural Formula 7-2C and Structural Formula 1-1D, respectively.

MS: $[M+H]^+$=595

<Preparation Example 39> Synthesis of Compound 7-176

[Compound 7-176]

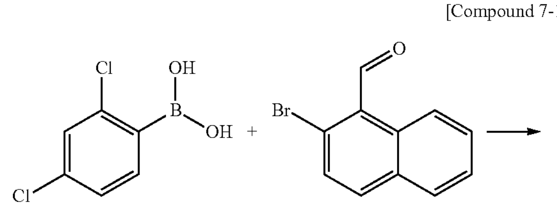

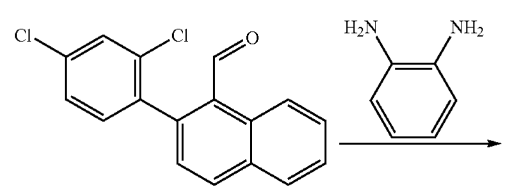

[Structural Formula 7-176A]

-continued

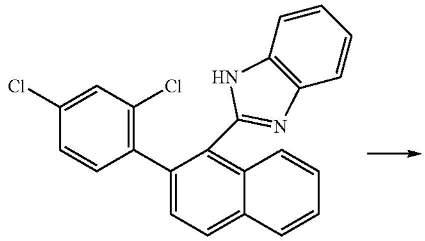

[Structural Formula 7-176B]

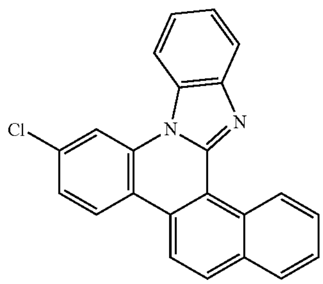

[Structural Formula 7-176C]

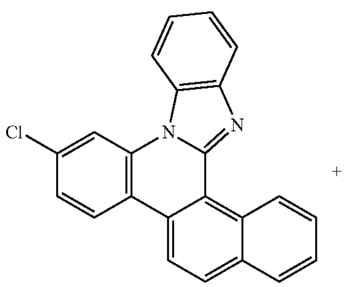

[Structural Formula 7-176C]

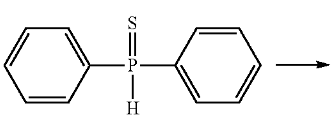

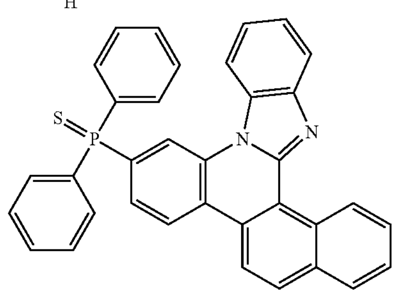

[Structural Formula 7-1D]

Preparation of Compound 7-176

Compound 7-176 was obtained in the same manner as in the preparation method of Compound 7-2, except that Structural Formula 7-176C and Structural Formula 7-1D were used instead of Structural Formula 7-2C and Structural Formula 1-1D, respectively.

MS: [M+H]+=535

<Preparation Example 40> Synthesis of Compound 7-218

[Compound 7-218]

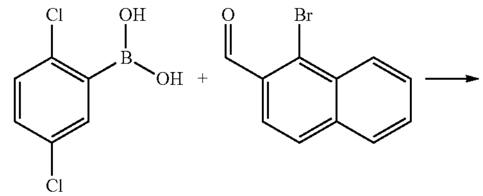

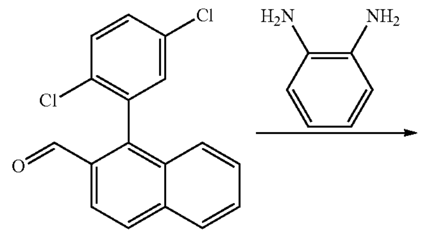

[Structural Formula 7-218A]

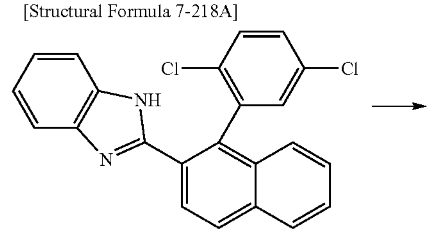

[Structural Formula 7-218B]

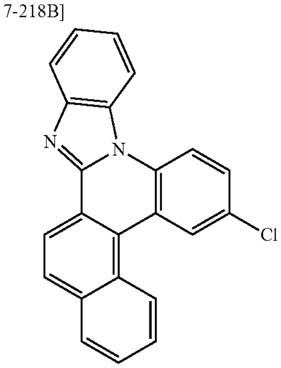

[Structural Formula 7-218C]

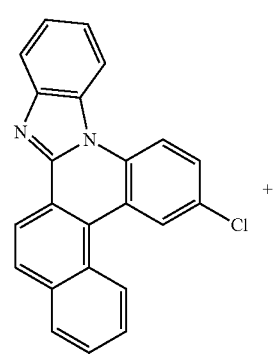

[Structural Formula 7-218C]

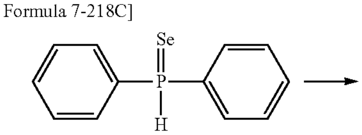

-continued

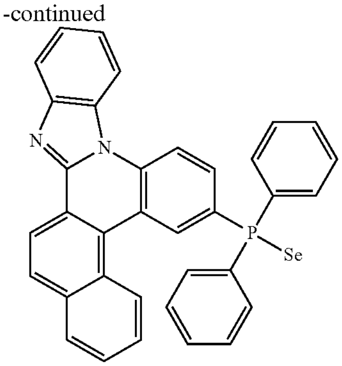

[Structural Formula 7-2D]

Preparation of Compound 7-218

Compound 7-218 was obtained in the same manner as in the preparation method of Compound 7-2, except that Structural Formula 7-218C and Structural Formula 7-2D were used instead of Structural Formula 7-2C and Structural Formula 1-1D, respectively.

MS: $[M+H]^+=583$

EXPERIMENTAL EXAMPLES

Example 1

A glass substrate (Corning 7059 glass) thinly coated with indium tin oxide (ITO) to have a thickness of 1,000 Å was put into distilled water in which a dispersing agent was dissolved, and ultrasonically washed. A product manufactured by the Fischer Co., was used as the detergent, and distilled water twice filtered using a filter manufactured by Millipore Co., was used as the distilled water. After the ITO was washed for 30 minutes, ultrasonic washing was conducted repeatedly twice using distilled water for 10 minutes. After the washing using distilled water was completed, ultrasonic washing was conducted using isopropyl alcohol, acetone, and methanol solvents in this order, and drying was conducted. Hexanitrile hexaazatriphenylene was thermally vacuum deposited to have a thickness of 500 Å on a transparent ITO electrode thus prepared, thereby forming a hole injection layer. NPB (400 Å), which is a material transporting holes, was vacuum deposited thereon, and then a host H1 compound and a dopant Dl compound were vacuum deposited to have a thickness of 300 Å as a light emitting layer. Next, Compound 1-1 synthesized in Preparation Example 1 and LiQ were thermally vacuum deposited together (200 Å) as an electron injection layer and an electron transporting layer, respectively. Lithium quinolate (LiQ) and aluminum were sequentially deposited on the electron transporting layer to have a thickness of 12 Å and a thickness of 2,000 Å, respectively, to form a negative electrode, thereby manufacturing an organic light emitting device.

E1 was used as a comparative example of the electron transporting layer. In the aforementioned procedure, the deposition rate of the organic material, lithium quinolate, and aluminum were maintained at 1 Å/sec, 0.2 Å/sec, and 3 to 7 Å/sec, respectively.

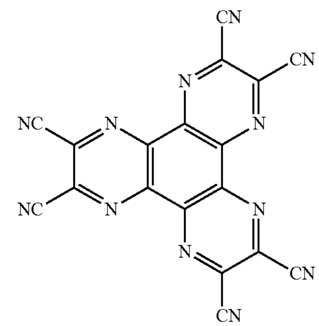

[Hexanitrile hexaazatriphenylene]

[NPB]

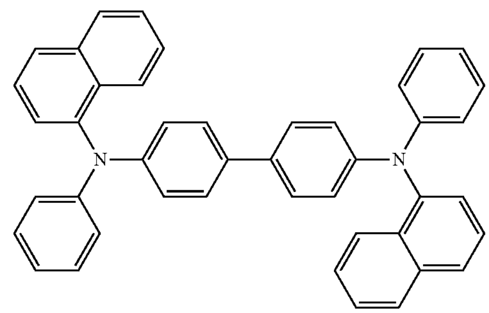

[H1]

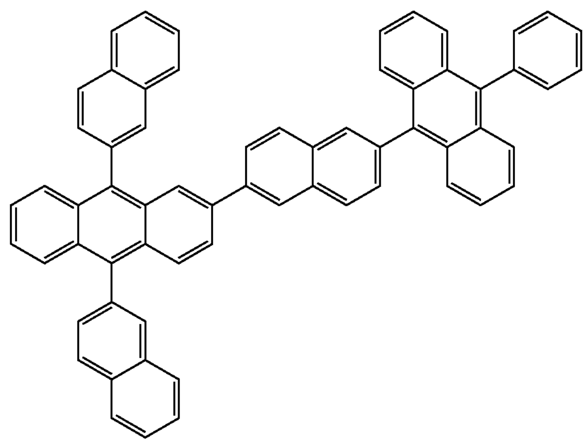

[H2]

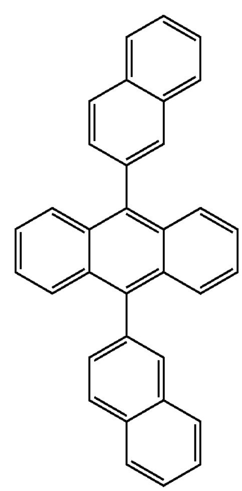

-continued

[D1]

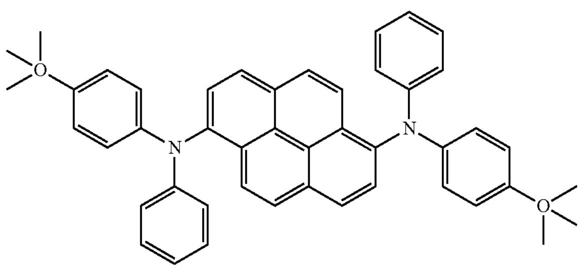

[D2]

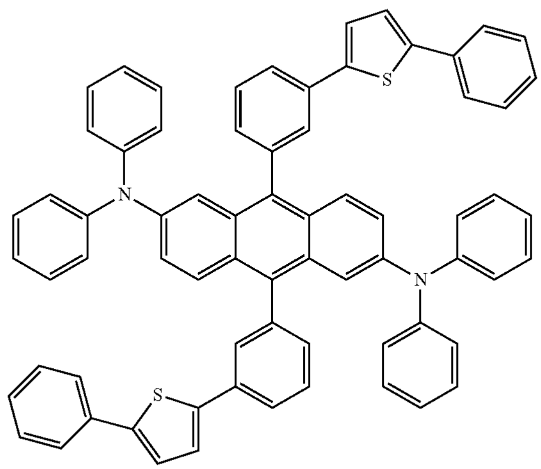

[E1]

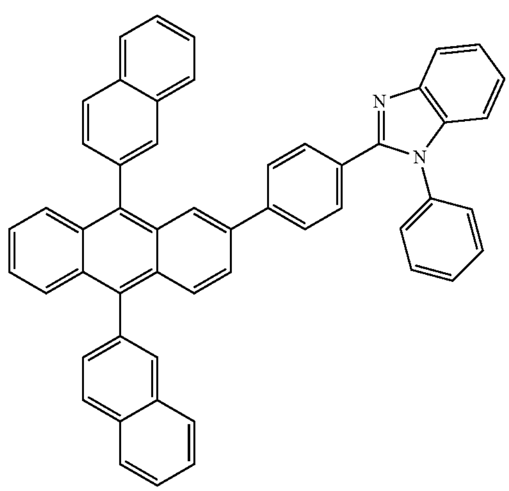

[Alq3]

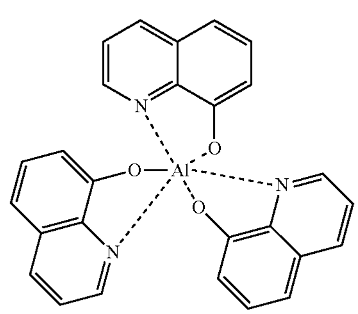

Example 2

An experiment was performed in the same manner as in Example 1, except that as the electron transporting layer, Compound 1-2 was used instead of Compound 1-1.

Example 3

An experiment was performed in the same manner as in Example 1, except that as the electron transporting layer, Compound 1-3 was used instead of Compound 1-1.

Example 4

An experiment was performed in the same manner as in Example 1, except that as the electron transporting layer, Compound 1-4 was used instead of Compound 1-1.

Example 5

An experiment was performed in the same manner as in Example 1, except that as the electron transporting layer, Compound 1-5 was used instead of Compound 1-1.

Example 6

An experiment was performed in the same manner as in Example 1, except that as the electron transporting layer, Compound 1-6 was used instead of Compound 1-1.

Example 7

An experiment was performed in the same manner as in Example 1, except that as the electron transporting layer, Compound 1-7 was used instead of Compound 1-1.

Example 8

An experiment was performed in the same manner as in Example 1, except that as the electron transporting layer, Compound 1-8 was used instead of Compound 1-3.

Example 9

An experiment was performed in the same manner as in Example 1, except that as the electron transporting layer, Compound 1-9 was used instead of Compound 1-.

Example 10

An experiment was performed in the same manner as in Example 1, except that as the electron transporting layer, Compound 1-10 was used instead of Compound 1-1.

Example 11

An experiment was performed in the same manner as in Example 1, except that as the electron transporting layer, Compound 1-11 was used instead of Compound 1-1.

Example 12

An experiment was performed in the same manner as in Example 1, except that as the electron transporting layer, Compound 1-12 was used instead of Compound 1-1.

Example 13

An experiment was performed in the same manner as in Example 1, except that as the electron transporting layer, Compound 1-13 was used instead of Compound 1-1.

Example 14

An experiment was performed in the same manner as in Example 1, except that as the electron transporting layer, Compound 1-14 was used instead of Compound 1-1.

Example 15

An experiment was performed in the same manner as in Example 1, except that as the electron transporting layer, Compound 1-15 was used instead of Compound 1-1.

Example 16

An experiment was performed in the same manner as in Example 1, except that as the electron transporting layer, Compound 1-16 was used instead of Compound 1-1.

Example 17

An experiment was performed in the same manner as in Example 1, except that as the electron transporting layer, Compound 1-61 was used instead of Compound 1-1.

Example 18

An experiment was performed in the same manner as in Example 1, except that as the electron transporting layer, Compound 1-132 was used instead of Compound 1-1.

Example 19

An experiment was performed in the same manner as in Example 1, except that as the electron transporting layer, Compound 1-133 was used instead of Compound 1-1.

Example 20

An experiment was performed in the same manner as in Example 1, except that as the electron transporting layer, Compound 4-3 was used instead of Compound 1-1.

Comparative Example 1

An experiment was performed in the same manner as in Example 1, except that as the electron transporting layer, Compound E1 was used instead of Compound 1-1.

Comparative Example 2

An experiment was performed in the same manner as in Example 1, except that as the electron transporting layer, Compound E2 was used instead of Compound 1-1.

[E2]

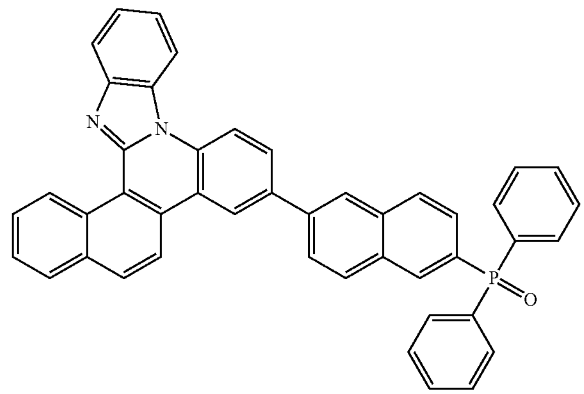

The results in which an organic light emitting device manufactured by using each compound as an electron transporting layer material as in the Examples was experimented are shown in Table 1.

TABLE 1

| Experimental Example 5 mA/cm$^2$ | ETL Material | Voltage (V) | Efficiency (Cd/A) | (Td5)Lifespan (Td5) (hr) |
|---|---|---|---|---|
| Comparative Example 1 | E1 | 3.98 | 5.51 | 28.1 |
| Comparative Example 2 | E2 | 4.75 | 4.72 | 26.9 |
| Example 1 | Compound 1-1 | 4.11 | 5.51 | 29.4 |
| Example 2 | Compound 1-2 | 3.91 | 5.23 | 27.3 |
| Example 3 | Compound 1-3 | 4.23 | 5.34 | 29.2 |
| Example 4 | Compound 1-4 | 4.07 | 5.62 | 28.3 |
| Example 5 | Compound 1-5 | 4.27 | 5.52 | 27.1 |
| Example 6 | Compound 1-6 | 4.46 | 5.27 | 28.3 |
| Example 7 | Compound 1-7 | 3.99 | 5.57 | 29.9 |
| Example 8 | Compound 1-8 | 4.17 | 5.16 | 28.4 |
| Example 9 | Compound 1-9 | 4.22 | 6.39 | 32.6 |
| Example 10 | Compound 1-10 | 4.14 | 5.55 | 58.7 |
| Example 11 | Compound 1-11 | 3.97 | 5.46 | 29.9 |
| Example 12 | Compound 1-12 | 3.99 | 5.53 | 30.4 |
| Example 13 | Compound 1-13 | 4.14 | 5.51 | 28.2 |
| Example 14 | Compound 1-14 | 4.31 | 5.90 | 28.3 |
| Example 15 | Compound 1-15 | 3.77 | 5.14 | 31.2 |
| Example 16 | Compound 1-16 | 4.14 | 5.67 | 27.7 |
| Example 17 | Compound 1-61 | 3.87 | 5.56 | 31.7 |
| Example 18 | Compound 1-132 | 3.98 | 5.50 | 29.1 |
| Example 19 | Compound 1-133 | 4.13 | 5.13 | 39.24 |
| Example 20 | Compound 4-3 | 3.99 | 5.50 | 59.2 |

As in the results, the novel compound according to the present invention may be used as a material for an organic material layer of an organic electronic device including an organic light emitting device by introducing various substituents, and the like. The organic electronic device including the organic light emitting device using the compound represented by Chemical Formula 1 according to the present invention as a material for an organic material layer exhibits excellent driving voltage, lifespan, particularly efficiency characteristics compared to the existing materials and E1 and E2 in the Comparative Examples.

The invention claimed is:

1. A compound of Chemical Formula 1:

[Chemical Formula 1]

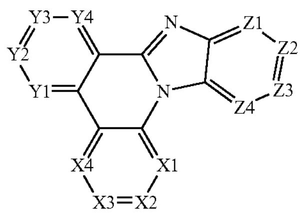

wherein:

X1 is N or CR1; X2 is N or CR2; X3 is N or CR3; and X4 is N or CR4;

Y1 is N or CR5; Y2 is N or CR6; Y3 is N or CR7; and Y4 is N or CR8;

Z1 is N or CR9; Z2 is N or CR10; Z3 is N or CR11; and Z4 is N or CR12;

X1 to X4, Y1 to Y4, and Z1 to Z4 are not simultaneously N;

R1 to R12 are the same as or different from each other, and each independently is hydrogen, deuterium, a halogen group, a nitrile group, a nitro group, a hydroxy group, a carbonyl group, an ester group, an imide group, an amino group, a substituted or unsubstituted silyl group, a substituted or unsubstituted boron group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted aralkyl group, a substituted or unsubstituted aralkenyl group, a substituted or unsubstituted alkylaryl group, a substituted or unsubstituted alkylamine group, a substituted or unsubstituted aralkylamine group, a substituted or unsubstituted heteroarylamine group, a substituted or unsubstituted arylamine group, a substituted or unsubstituted arylphosphine group, a substituted or unsubstituted aryl group, or a substituted or unsubstituted hetero-cyclic group, or two or more adjacent R1 to R5 groups or R7 to R12 groups optionally combine with each other to form a substituted or unsubstituted 6-membered ring;

at least one of a substituent of a ring formed by combining two or more adjacent groups of R1 to R12, and a group of R1 to R12, which does not form a ring, is

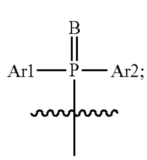

B is O, S, or Se; and

Ar1 and Ar2 are the same as or different from each other, and are each independently a substituted or unsubstituted aryl group, or a substituted or unsubstituted hetero-cyclic group, or combine with each other to form a substituted or unsubstituted ring, with the proviso that:

at least one of X1 to X4, Y1 to Y4, and Z1 to Z4 is N; or

Ar1 and Ar2 combine with each other to form a ring; or

Chemical Formula 1 is the following Chemical Formula 3 or 4:

[Chemical Formula 3]

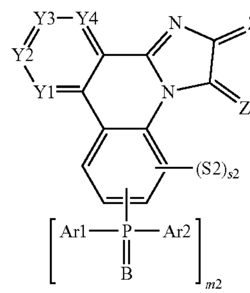

[Chemical Formula 4]

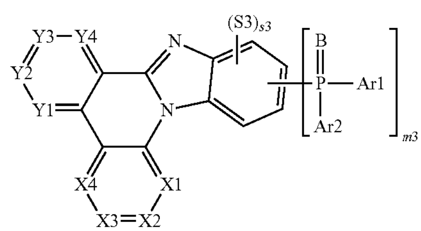

wherein in Chemical Formulae 3 and 4:

X1 is N or CR1; X2 is N or CR2; X3 is N or CR3; and X4 is N or CR4;

Y1 is N or CR5; Y2 is N or CR6; Y3 is N or CR7; and Y4 is N or CR8;

Z1 is N or CR9; Z2 is N or CR10; Z3 is N or CR11; and Z4 is N or CR12;

R1 to R12, S2 and S3 are the same as or different from each other, and are each independently hydrogen, deuterium, a halogen group, a nitrile group, a nitro group, a hydroxy group, a carbonyl group, an ester group, an imide group, an amino group, a substituted or unsubstituted silyl group, a substituted or unsubstituted boron group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted aralkyl group, a substituted or unsubstituted aralkenyl group, a substituted or unsubstituted alkylaryl group, a substituted or unsubstituted alkylamine group, a substituted or unsubstituted aralkylamine group, a substituted or unsubstituted heteroarylamine group, a substituted or unsubstituted arylamine group, a substituted or unsubstituted arylphosphine group, a substituted or unsubstituted phosphine oxide group, a substituted or unsubstituted aryl group, or a substituted or unsubstituted hetero-cyclic group, or two or more adjacent groups optionally combine with each other to form a substituted or unsubstituted ring;

m2 and m3 are the same as or different from each other, and are each independently an integer of 1 to 4;

s2 and s3 are the same as or different from each other, and are each independently an integer of 0 to 3;

m2+s2≤4;

m3+s3≤4; and when m2, m3, s2 and s3 are each 2 or more, the structures in the parenthesis are the same as or different from each other.

2. The compound of claim 1, wherein Ar1 and Ar2 are the same as or different from each other, and are each independently a substituted or unsubstituted monocyclic to tricyclic aryl group.

3. An organic light emitting device, comprising:

a first electrode;

a second electrode provided to face the first electrode; and one or more organic material layers provided between the first electrode and the second electrode, wherein one or more layers of the organic material layers comprise the compound of claim 1.

4. The organic light emitting device of claim 3, wherein the organic material layer comprising the compound is an electron injection layer, an electron transporting layer, or a layer which simultaneously injects and transports electrons.

5. The organic light emitting device of claim 3, wherein the organic material layer comprising the compound is a light emitting layer.

6. A compound of Chemical Formula 1:

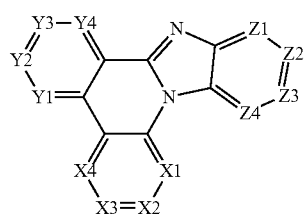

wherein:

X1 is N or CR1, X2 is N or CR2, X3 is N or CR3, and X4 is N or CR4,

Y1 is N or CR5, Y2 is N or CR6, Y3 is N or CR7, and Y4 is N or CR8,

Z1 is N or CR9, Z2 is N or CR10, Z3 is N or CR11, and Z4 is N or CR12,

X1 to X4, Y1 to Y4, and Z1 to Z4 are not simultaneously N,

R1 to R12 are the same as or different from each other, and are each independently is hydrogen, deuterium, a halogen group, a nitrile group, a nitro group, a hydroxy group, a carbonyl group, an ester group, an imide group, an amino group, a substituted or unsubstituted silyl group, a substituted or unsubstituted boron group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted aralkyl group, a substituted or unsubstituted aralkenyl group, a substituted or unsubstituted alkylaryl group, a substituted or unsubstituted alkylamine group, a substituted or unsubstituted aralkylamine group, a substituted or unsubstituted heteroarylamine group, a substituted or unsubstituted arylamine group, a substituted or unsubstituted arylphosphine group, a substituted or unsubstituted phosphine oxide group, a substituted or unsubstituted aryl group, or a substituted or unsubstituted hetero-cyclic group, or two or more adjacent groups optionally combine with each other to form a substituted or unsubstituted ring;

at least two or more of a substituent of a ring formed by combining two or more adjacent groups of R1 to R12 and a group of R1 to R12, which does not form a ring, are

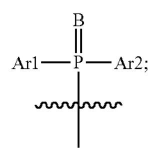

B is O, S, or Se; and

Ar1 and Ar2 are the same as or different from each other, and are each independently is a substituted or unsubstituted aryl group or a substituted or unsubstituted heterocyclic group, or combine with each other to form a substituted or unsubstituted ring.

7. The compound of claim 6, wherein at least one of R1 to R4 is

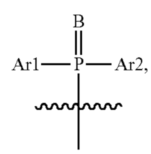

at least one of R5 to R8 is

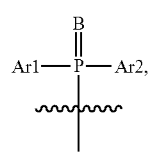

and at least one of R9 to R12 is

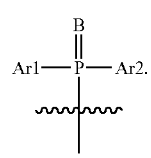

8. The compound of claim 6, wherein at least two of a substituent of a ring formed by combining two or more adjacent groups among R1 to R12 and a group of R1 to R12, which does not form a ring, are

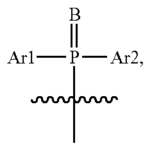

and at least one of a substituent of a ring formed by combining two or more adjacent groups among R1 to R12 and groups which are not

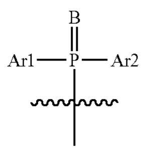

in a group of R1 to R12, which does not form a ring, is a substituted or unsubstituted aryl group or a substituted or unsubstituted hetero-cyclic group.

9. A compound of any one of the following Chemical Formulae 12 to 26:

[Chemical Formula 12]

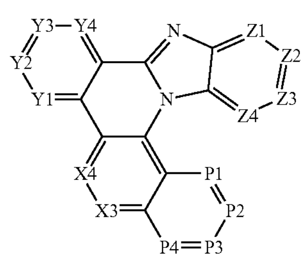

[Chemical Formula 13]

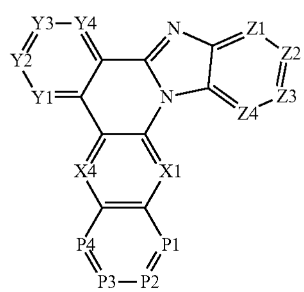

[Chemical Formula 14]

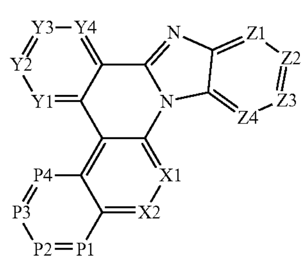

[Chemical Formula 15]

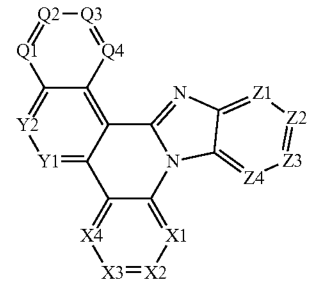

[Chemical Formula 16]

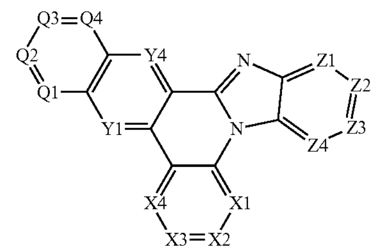

[Chemical Formula 17]

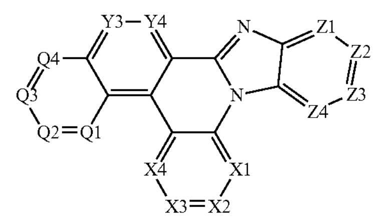

[Chemical Formula 18]

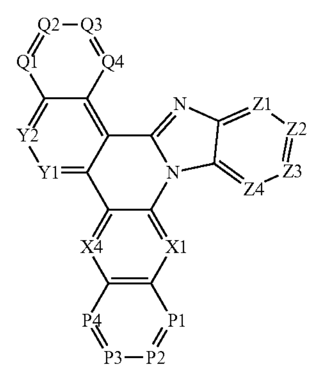

[Chemical Formula 19]

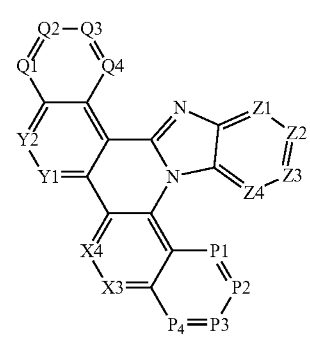

-continued

[Chemical Formula 20]

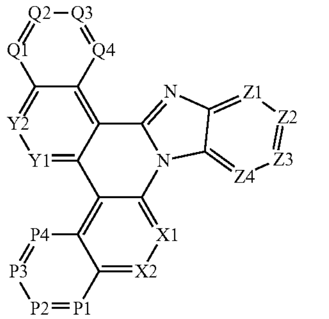

[Chemical Formula 21]

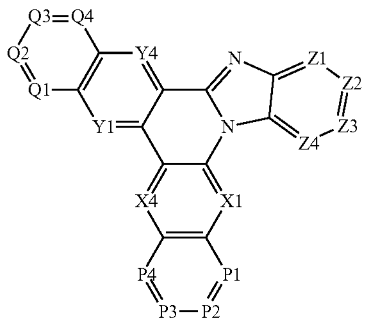

[Chemical Formula 22]

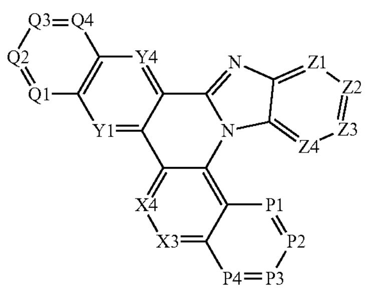

[Chemical Formula 23]

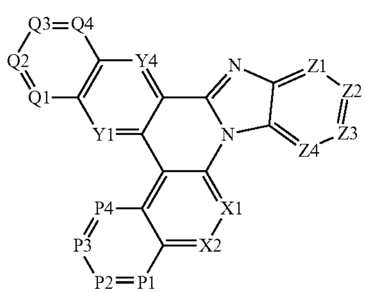

[Chemical Formula 24]

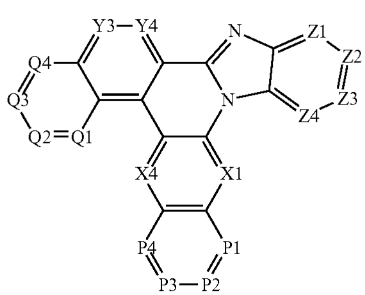

-continued

[Chemical Formula 25]

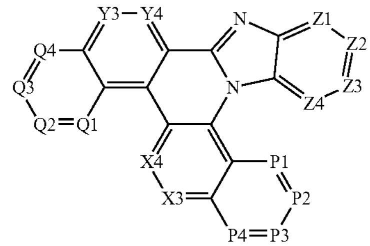

[Chemical Formula 26]

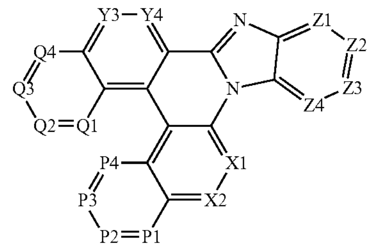

wherein:

X1 is N or CR1, X2 is N or CR2, X3 is N or CR3, and X4 is N or CR4;

Y1 is N or CR5, Y2 is N or CR6, Y3 is N or CR7, and Y4 is N or CR8;

Z1 is N or CR9, Z2 is N or CR10, Z3 is N or CR11, and Z4 is N or CR12;

P1 is N or CR13, P2 is N or CR14, P3 is N or CR15, and P4 is N or CR16;

Q1 is N or CR17, Q2 is N or CR18, Q3 is N or CR19, and Q4 is N or CR20;

R1 to R20 are the same as or different from each other, and are each independently hydrogen, deuterium, a halogen group, a nitrile group, a nitro group, a hydroxy group, a carbonyl group, an ester group, an imide group, an amino group, a substituted or unsubstituted silyl group, a substituted or unsubstituted boron group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted aralkyl group, a substituted or unsubstituted aralkenyl group, a substituted or unsubstituted alkylaryl group, a substituted or unsubstituted alkylamine group, a substituted or unsubstituted aralkylamine group, a substituted or unsubstituted heteroarylamine group, a substituted or unsubstituted arylamine group; a substituted or unsubstituted arylphosphine group; a substituted or unsubstituted phosphine oxide group, a substituted or unsubstituted aryl group, or a substituted or unsubstituted hetero-cyclic group, or optionally combine with an adjacent group to form a substituted or unsubstituted ring;

at least one of R1 to R20 is

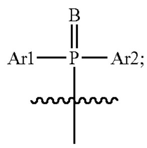

B is O, S, or Se; and

Ar1 and Ar2 are the same as or different from each other, and are each independently a substituted or unsubstituted aryl group or a substituted or unsubstituted hetero-cyclic group, or combine with each other to form a substituted or unsubstituted ring.

10. A heterocyclic compound selected from among the following compounds:

[Compound 1-1]

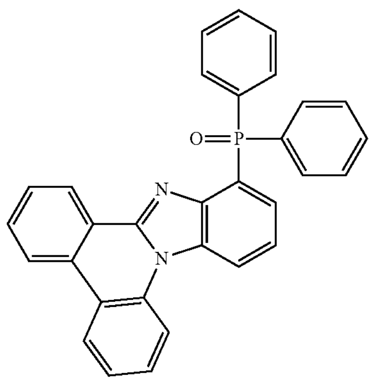

[Compound 1-2]

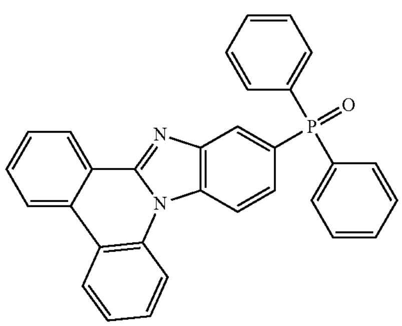

[Compound 1-3]

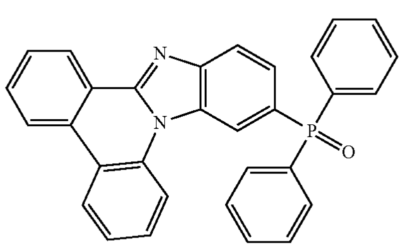

-continued

[Compound 1-4]

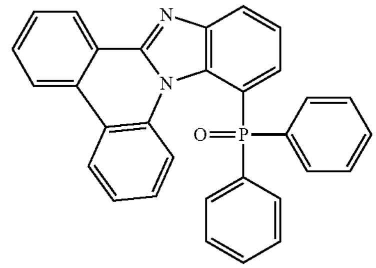

[Compound 1-5]

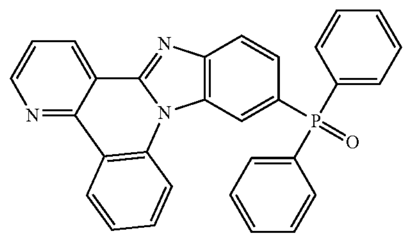

[Compound 1-6]

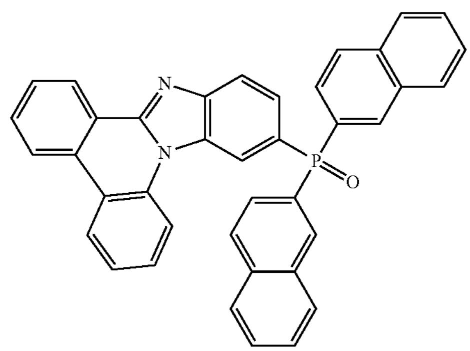

[Compound 1-7]

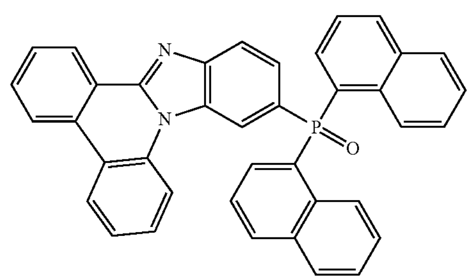

[Compound 1-12]

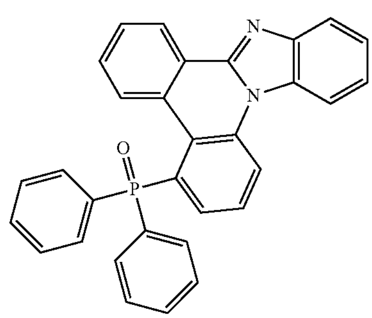

[Compound 1-13]
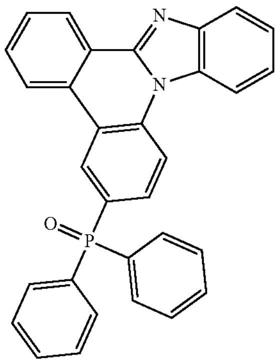
[Compound 1-14]
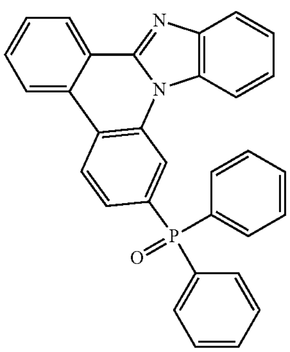
[Compound 1-15]
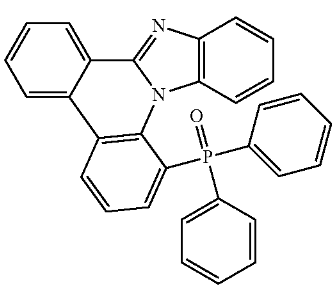
[Compound 1-16]
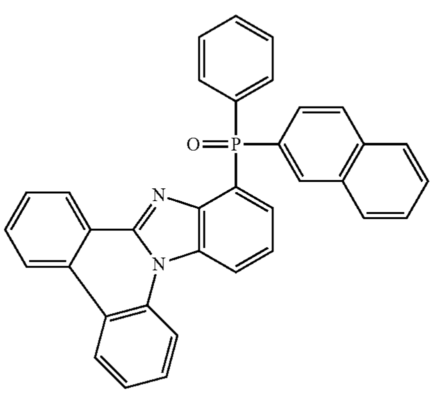
[Compound 1-17]
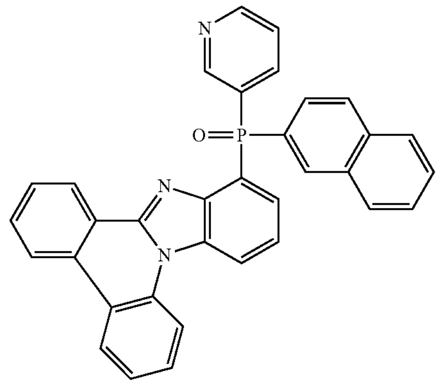
[Compound 1-18]
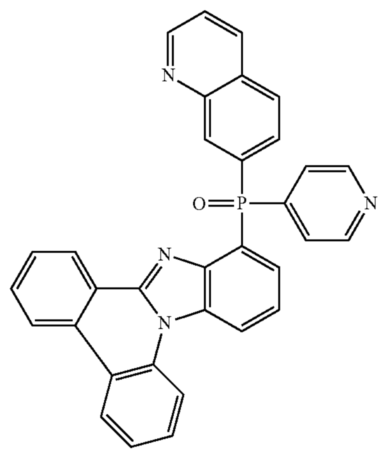
[Compound 1-19]
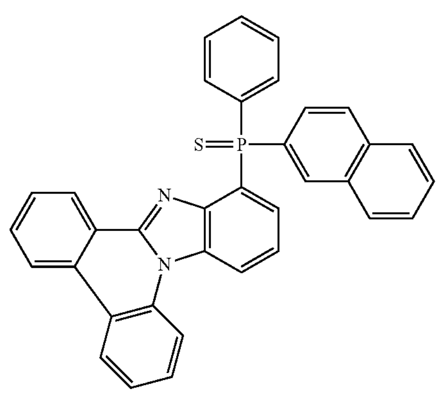

-continued
[Compound 1-20]
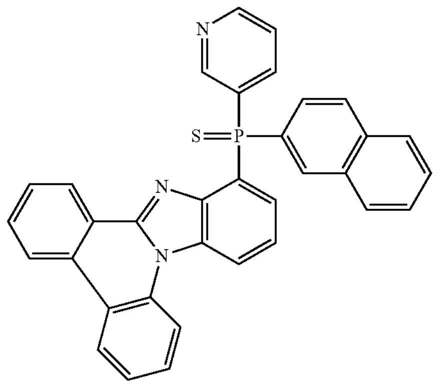
[Compound 1-21]
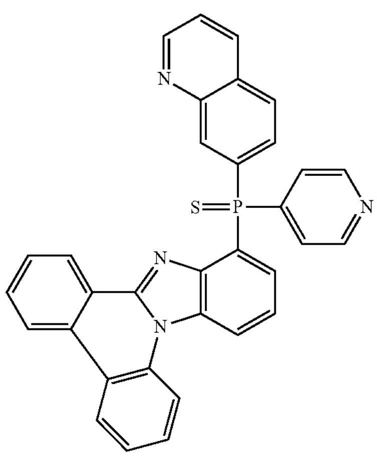
[Compound 1-22]
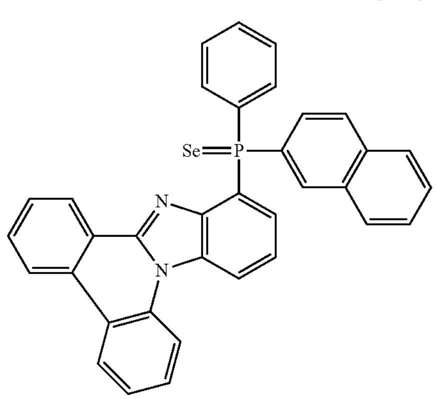
-continued
[Compound 1-23]
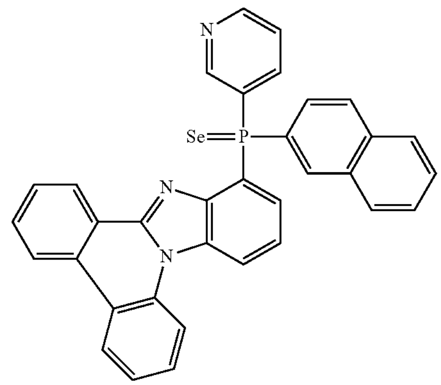
[Compound 1-24]
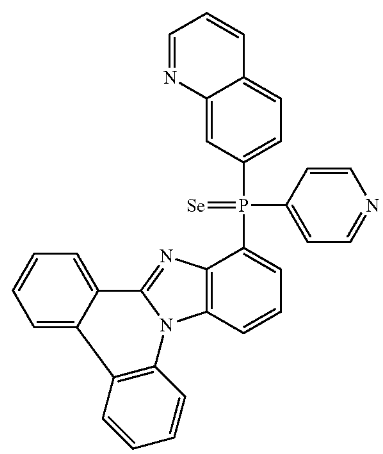
[Compound 1-25]
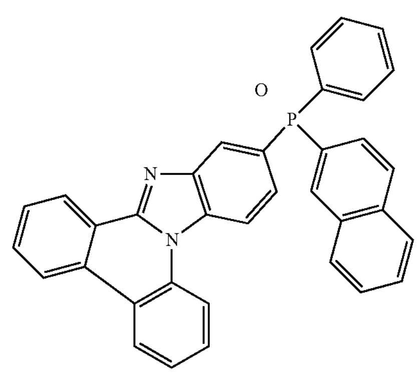
[Compound 1-26]
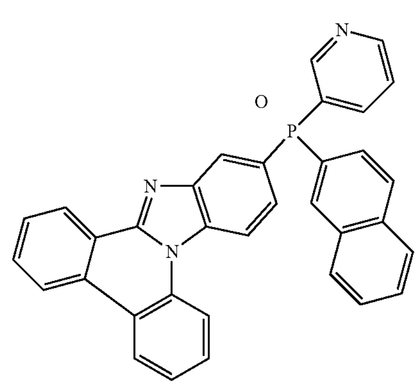

-continued
[Compound 1-27]
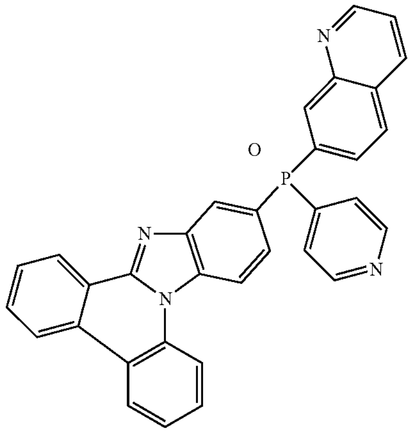
[Compound 1-28]
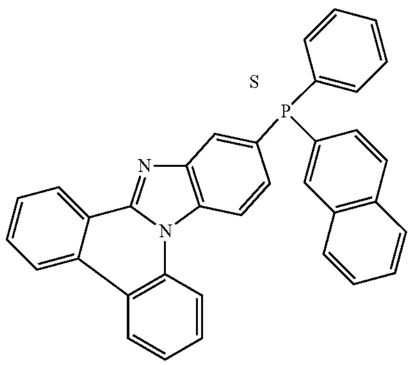
[Compound 1-29]
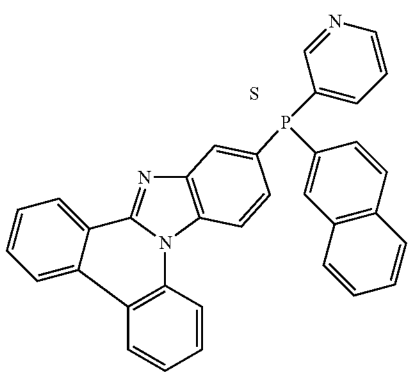
[Compound 1-30]
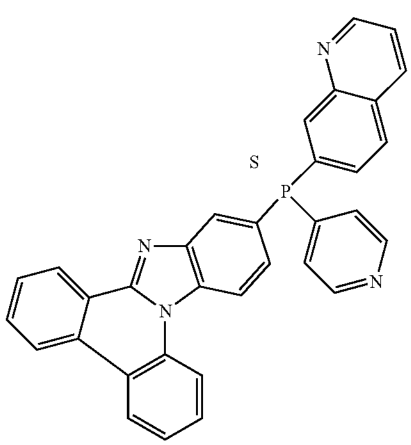
-continued
[Compound 1-31]
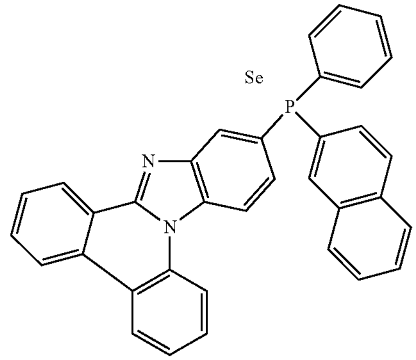
[Compound 1-32]
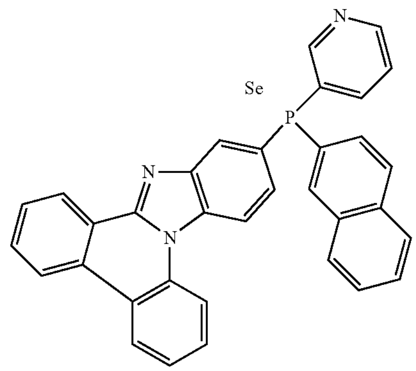
[Compound 1-33]
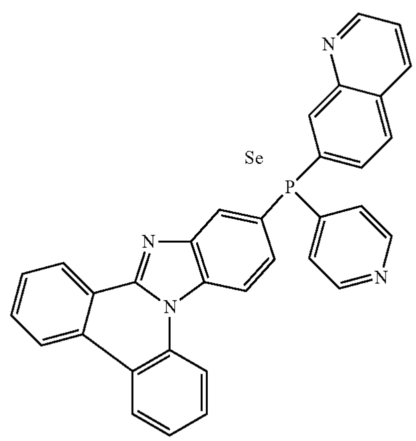
[Compound 1-34]
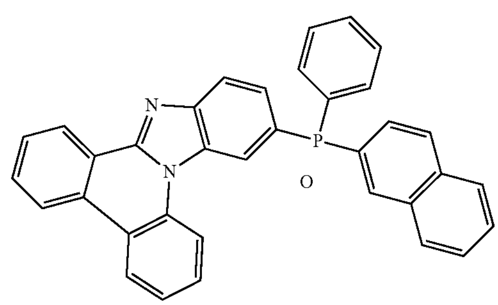

-continued
[Compound 1-35]
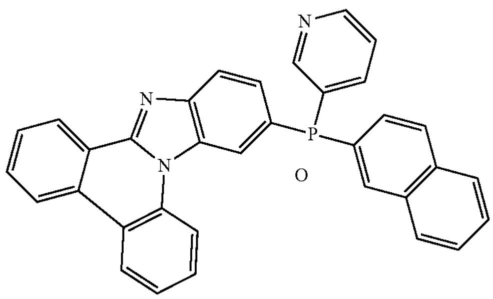
[Compound 1-36]
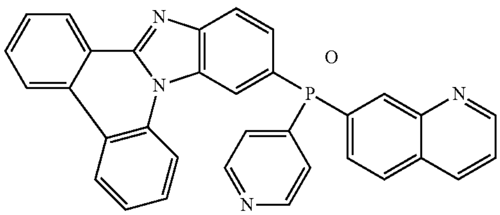
[Compound 1-37]
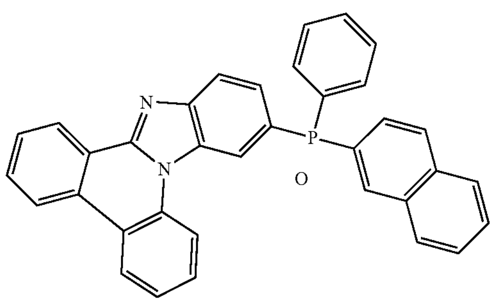
[Compound 1-38]
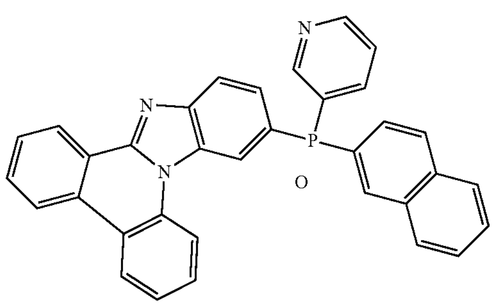
[Compound 1-39]
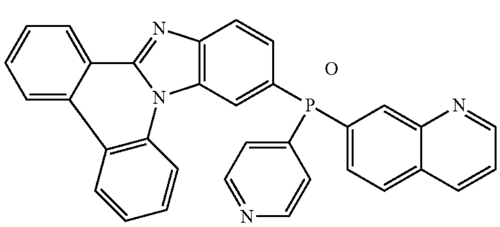
-continued
[Compound 1-40]
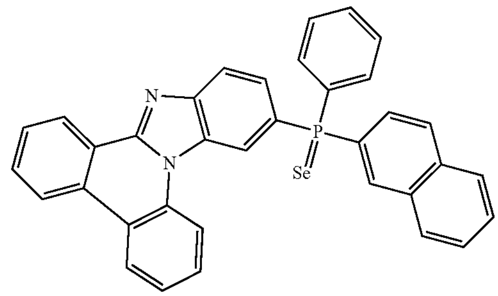
[Compound 1-41]
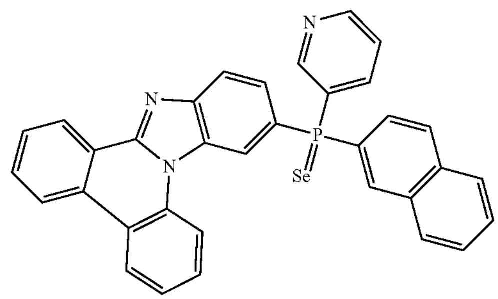
[Compound 1-42]
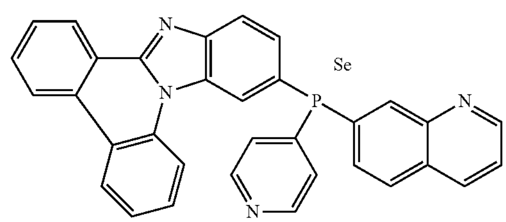
[Compound 1-43]
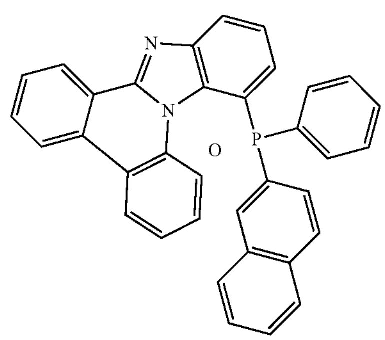
[Compound 1-44]
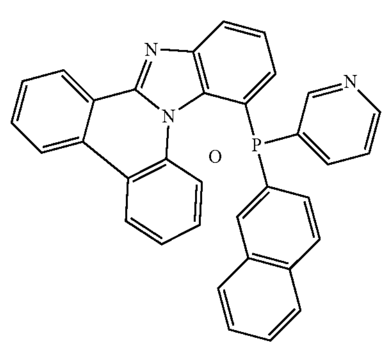

-continued
[Compound 1-45]
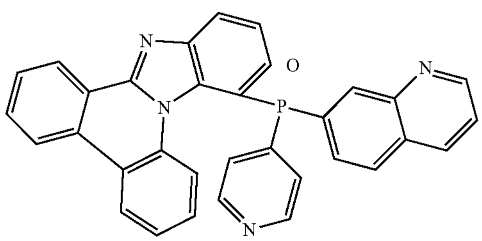
[Compound 1-46]
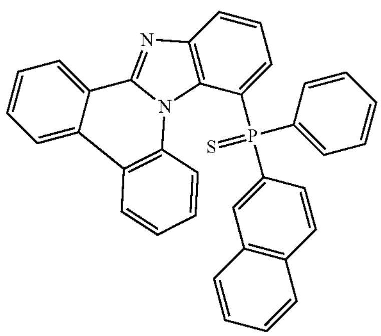
[Compound 1-47]
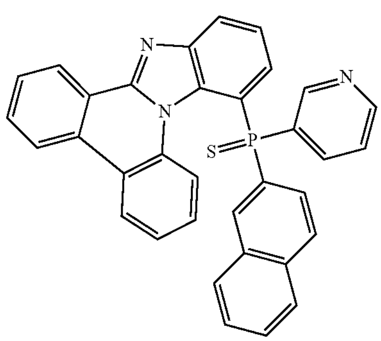
[Compound 1-48]
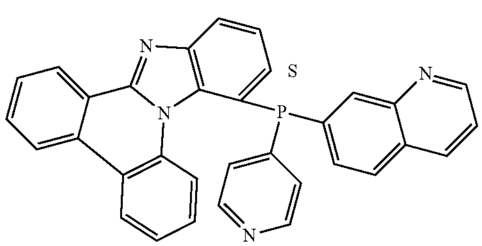
[Compound 1-49]
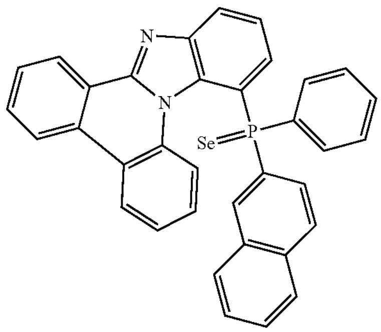
-continued
[Compound 1-50]
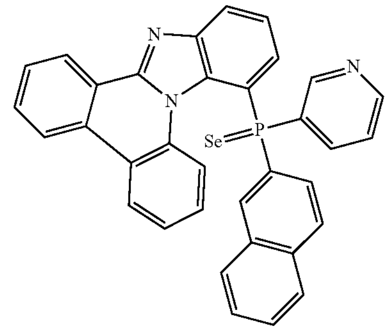
[Compound 1-51]
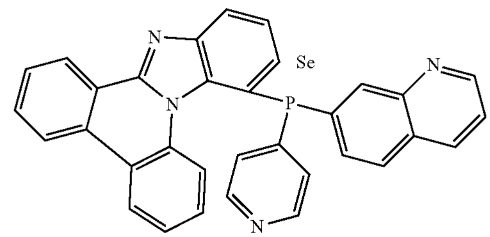
[Compound 1-52]
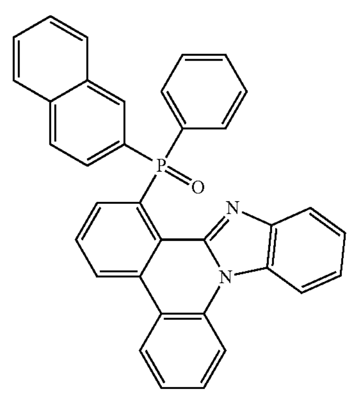
[Compound 1-53]
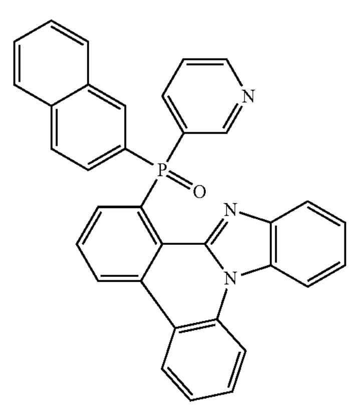

-continued
[Compound 1-54]
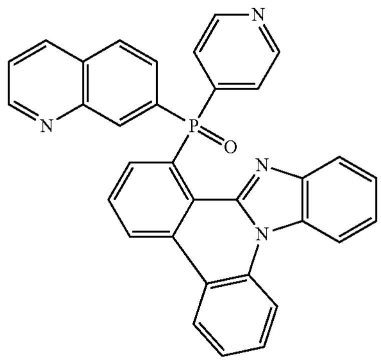
[Compound 1-56]
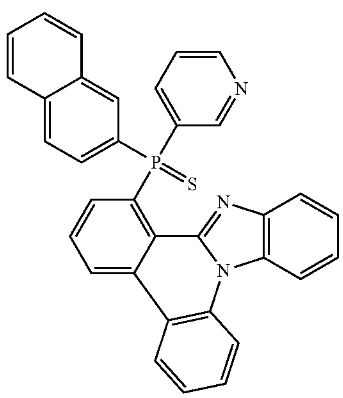
[Compound 1-57]
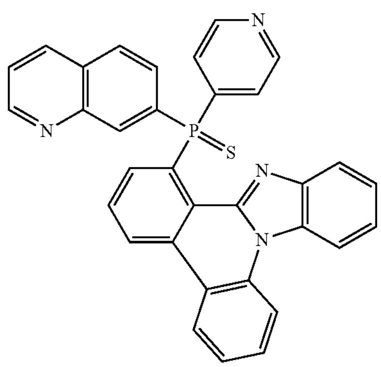
[Compound 1-58]
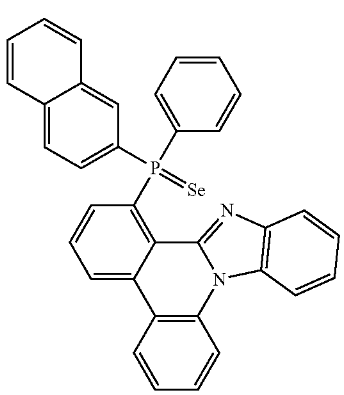
-continued
[Compound 1-59]
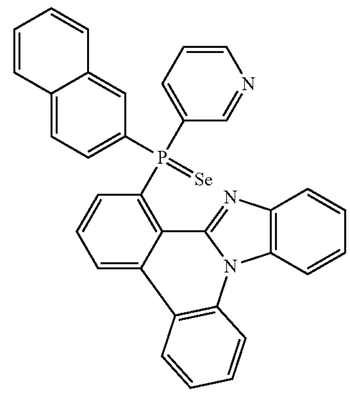
[Compound 1-60]
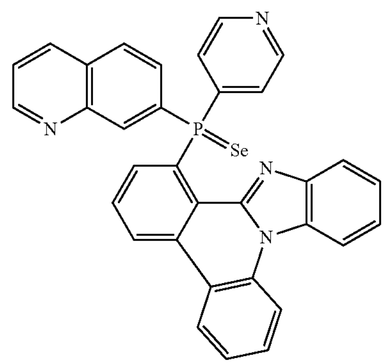
[Compound 1-62]
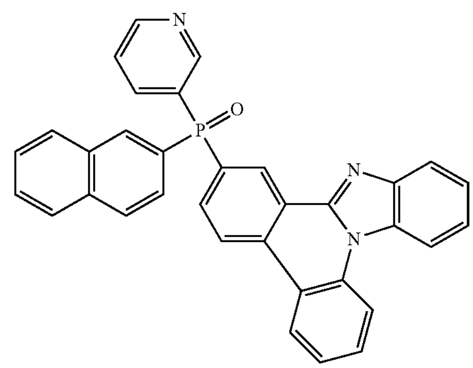
[Compound 1-63]
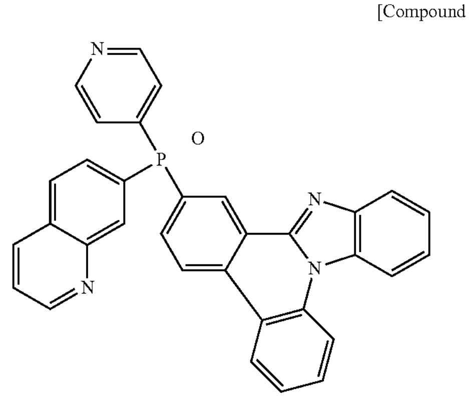

-continued
[Compound 1-65]
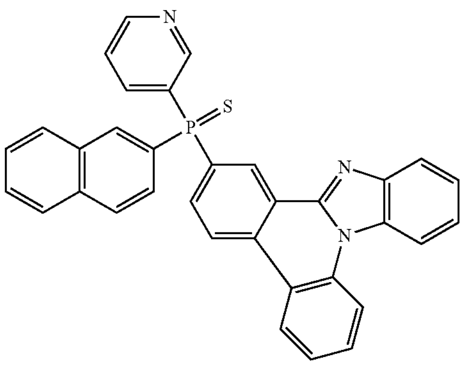
[Compound 1-66]
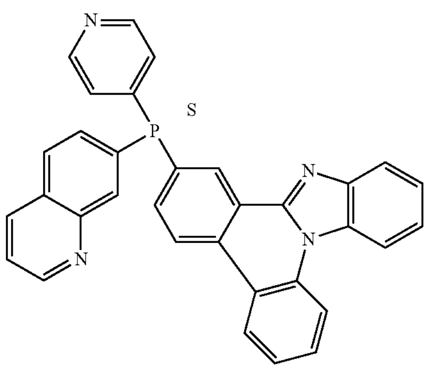
[Compound 1-67]
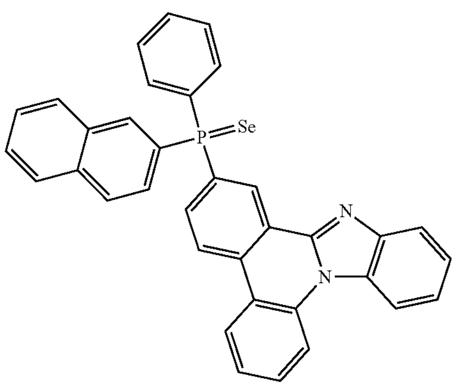
[Compound 1-68]
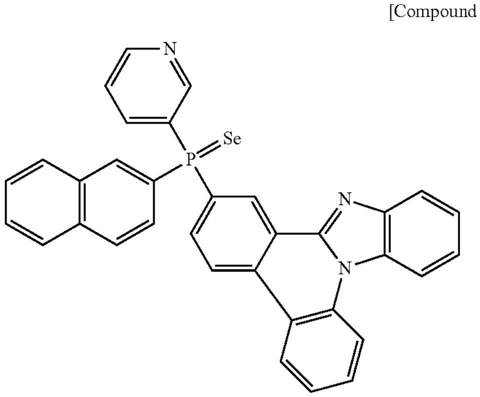
-continued
[Compound 1-69]
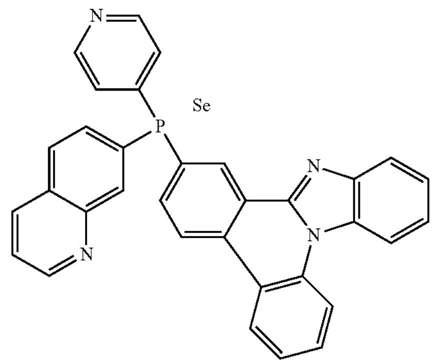
[Compound 1-72]
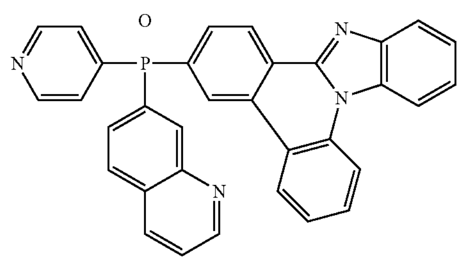
[Compound 1-71]
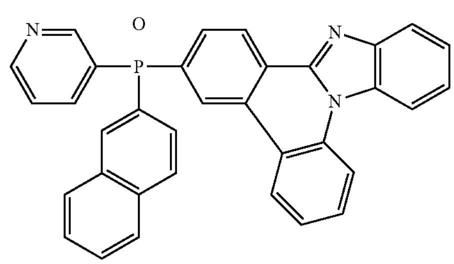
[Compound 1-75]
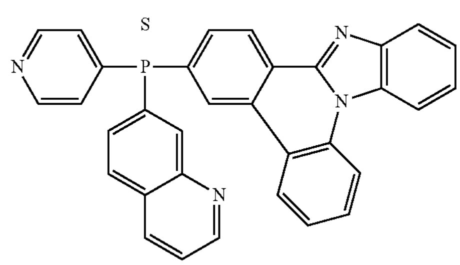
[Compound 1-76]
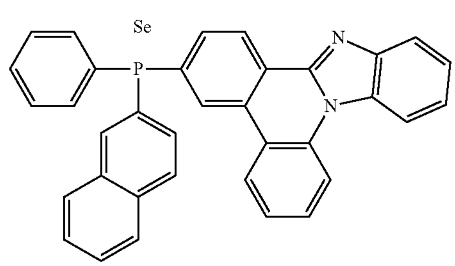

-continued
[Compound 1-77]
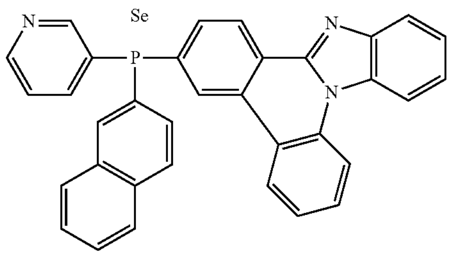
[Compound 1-78]
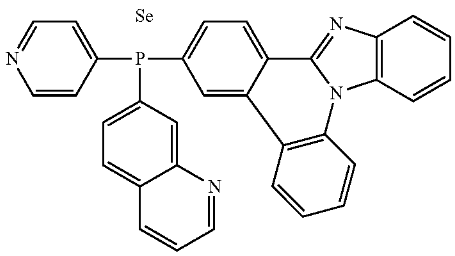
[Compound 1-79]
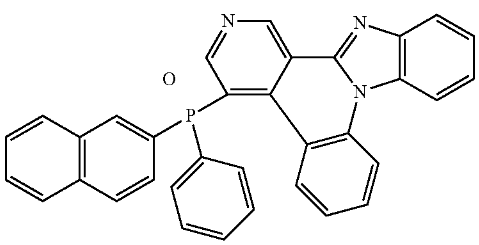
[Compound 1-80]
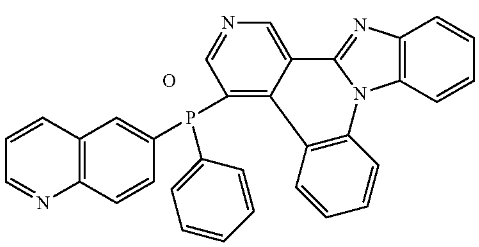
[Compound 1-81]
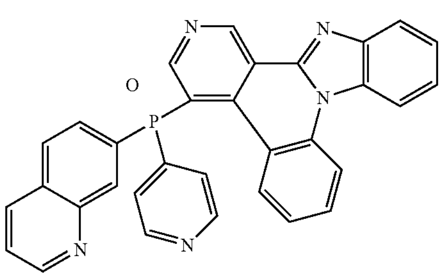
[Compound 1-82]
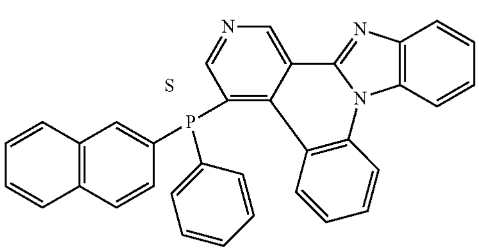
-continued
[Compound 1-83]
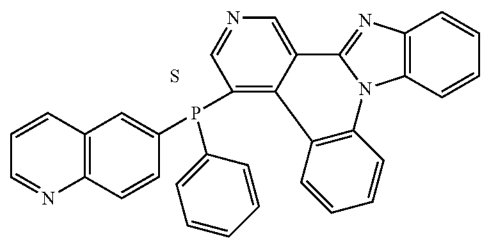
[Compound 1-84]
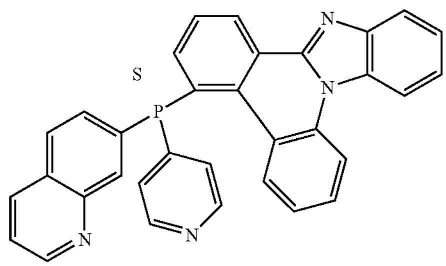
[Compound 1-85]
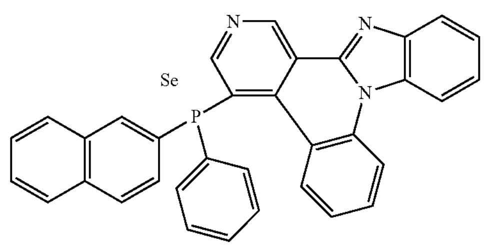
[Compound 1-86]
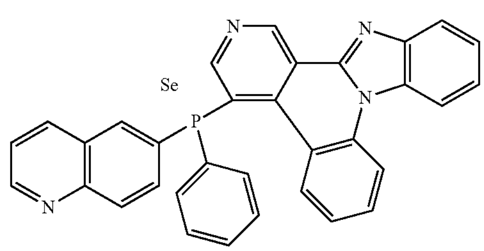
[Compound 1-87]
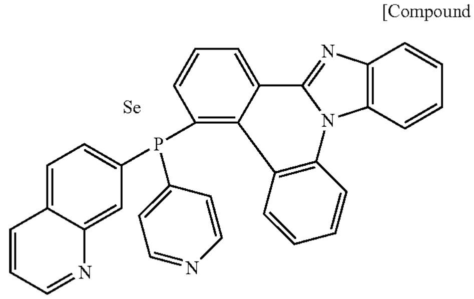

[Compound 1-88]
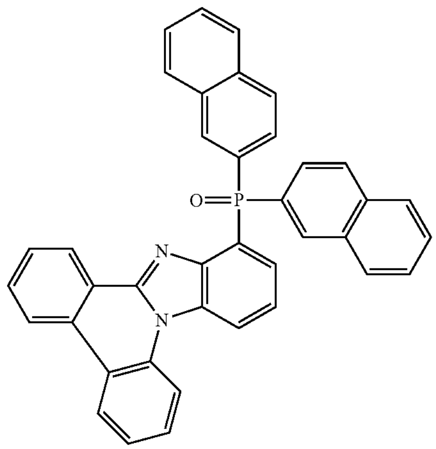
[Compound 1-89]
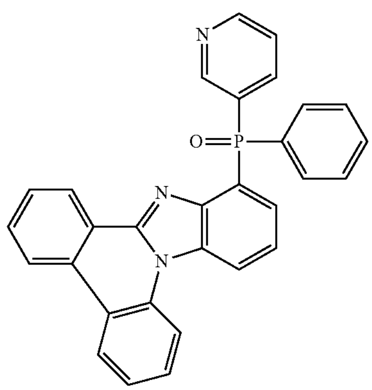
[Compound 1-90]
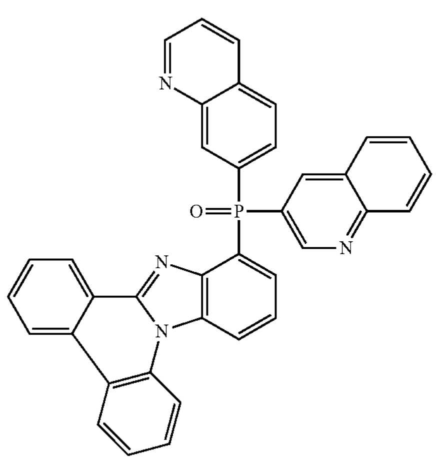
[Compound 1-91]
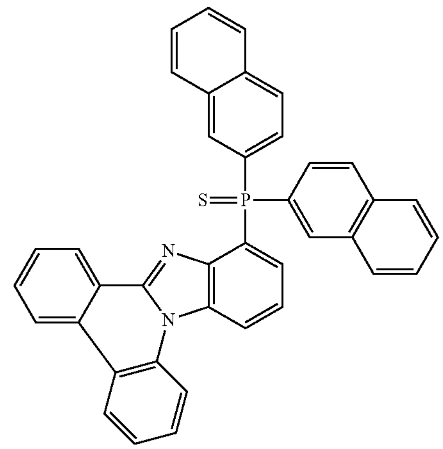
[Compound 1-92]
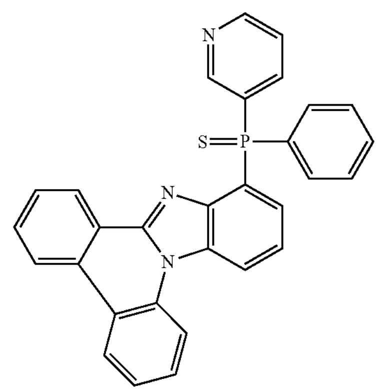
[Compound 1-93]
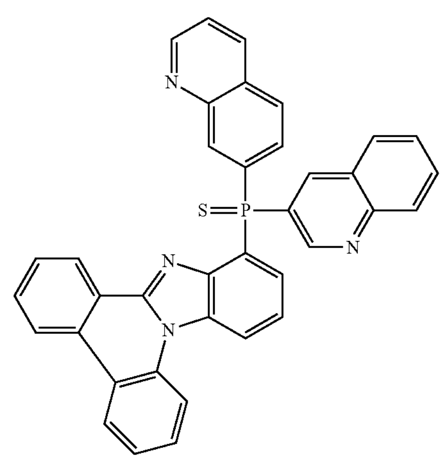

-continued
[Compound 1-94]
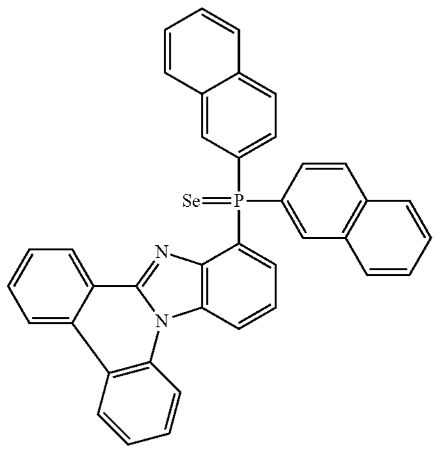
[Compound 1-95]
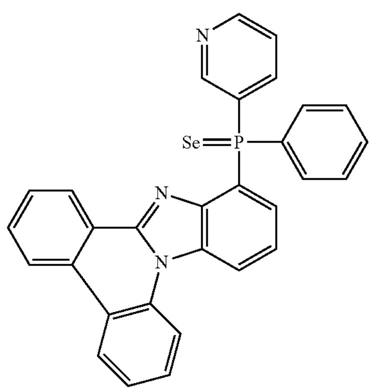
[Compound 1-96]
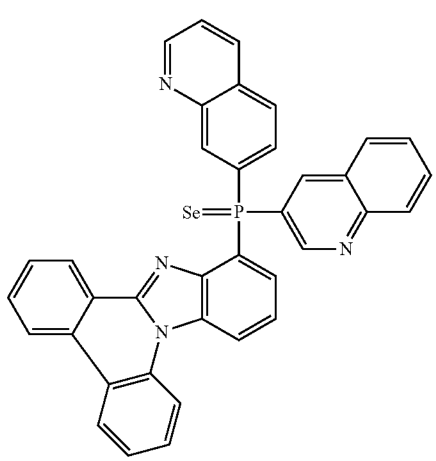
-continued
[Compound 1-97]
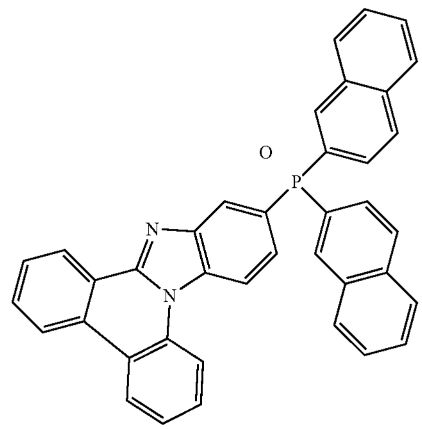
[Compound 1-98]
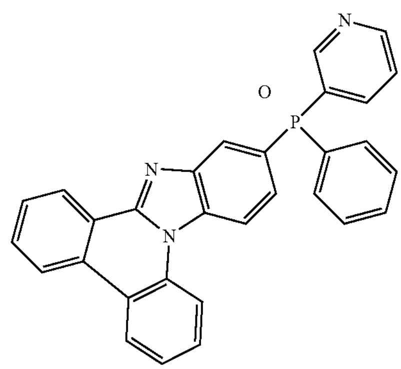
[Compound 1-99]
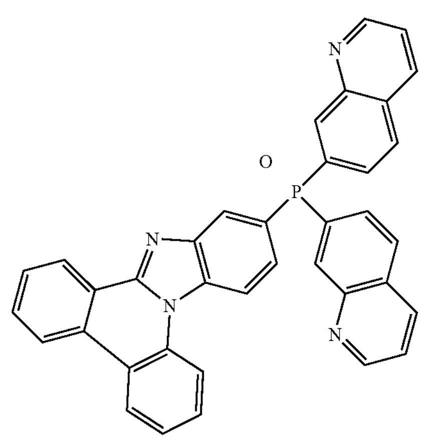

-continued
[Compound 1-100]
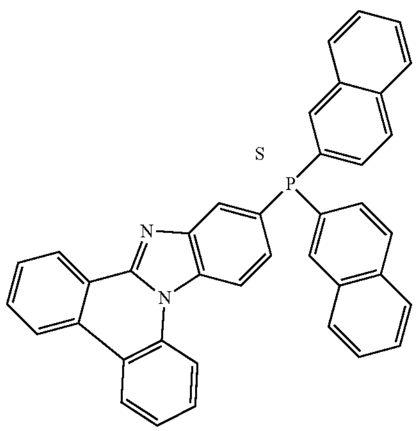
[Compound 101]
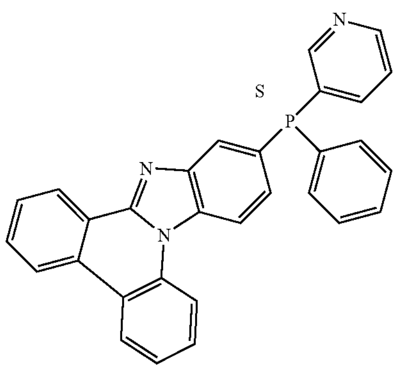
[Compound 102]
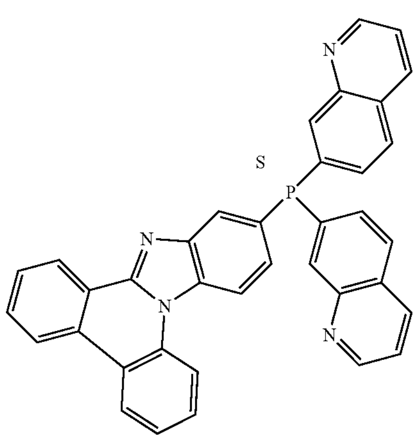
-continued
[Compound 103]
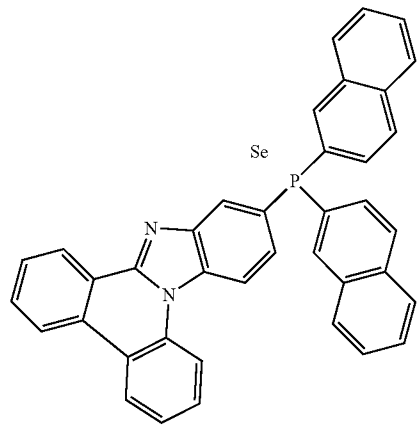
[Compound 1-104]
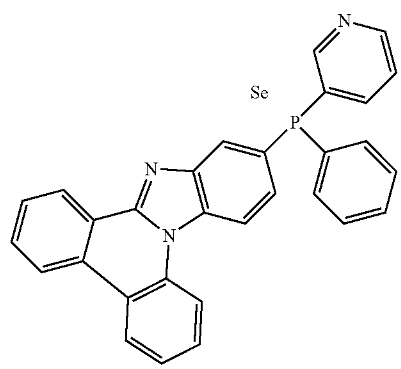
[Compound 1-105]
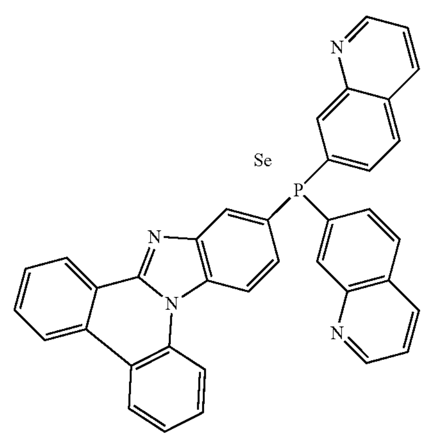
[Compound 1-106]
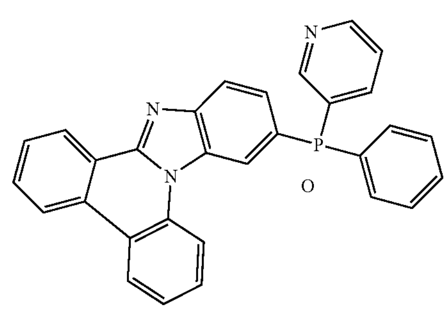

-continued
[Compound 1-107]
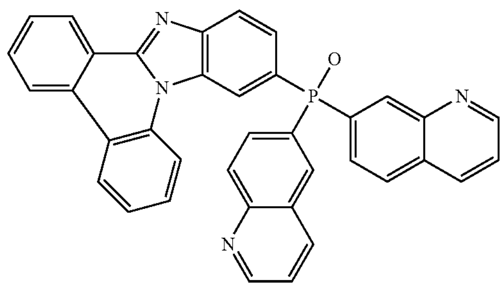
[Compound 1-108]
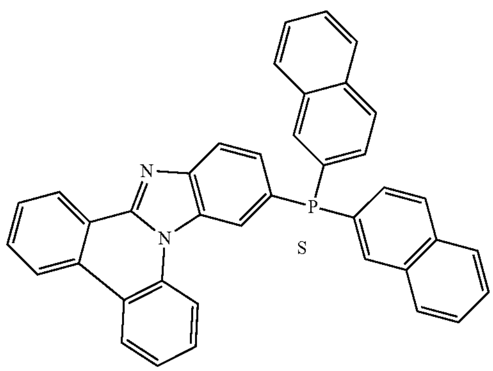
[Compound 1-109]
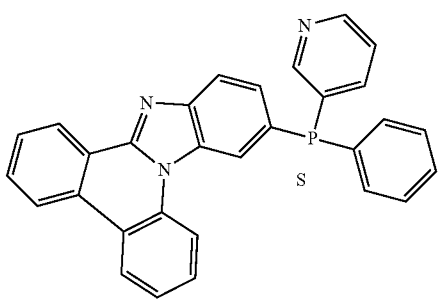
[Compound 1-110]
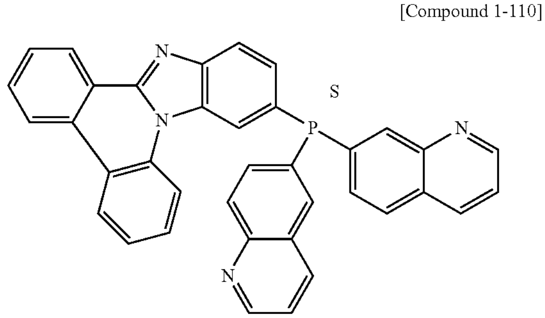
-continued
[Compound 1-111]
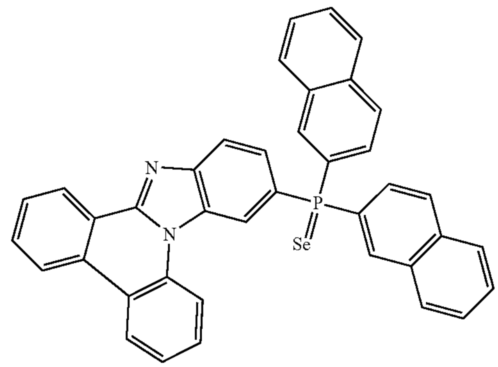
[Compound 1-112]
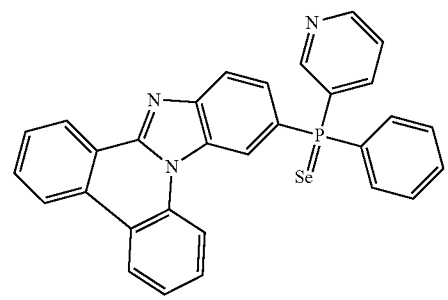
[Compound 1-113]
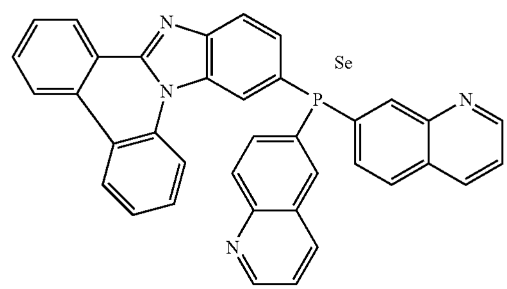
[Compound 1-114]
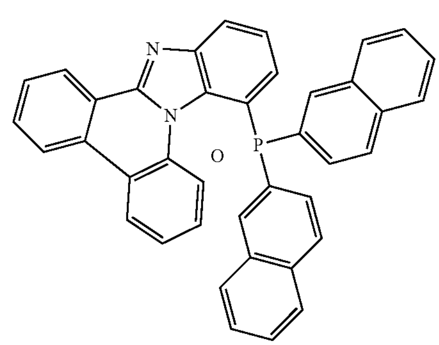
[Compound 1-115]
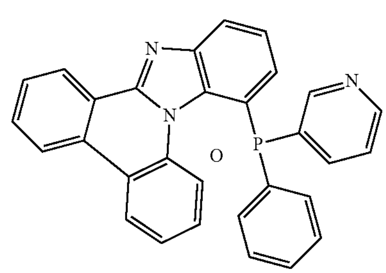

[Compound 1-116]
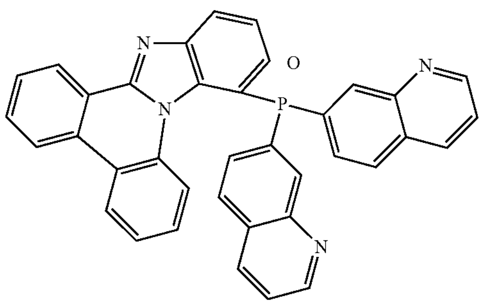
[Compound 1-117]
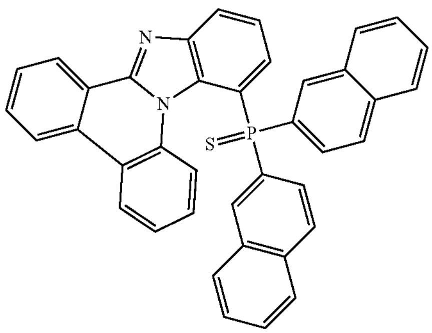
[Compound 1-118]
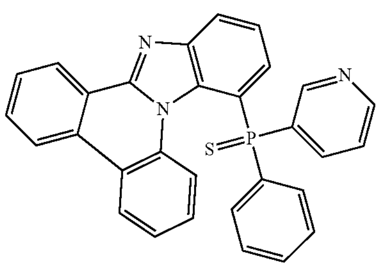
[Compound 1-119]
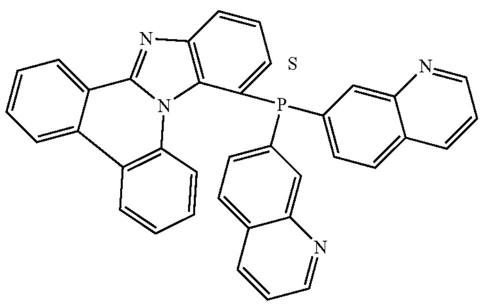
[Compound 1-120]
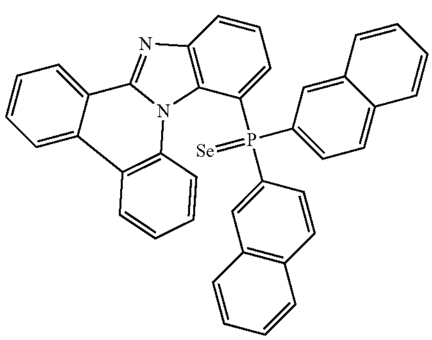
[Compound 1-121]
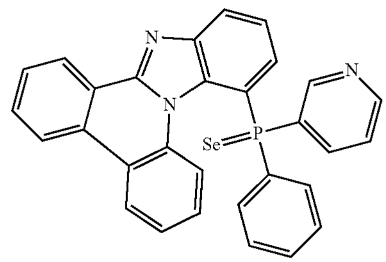
[Compound 1-122]
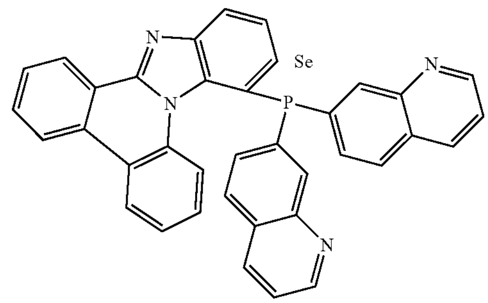
[Compound 1-123]
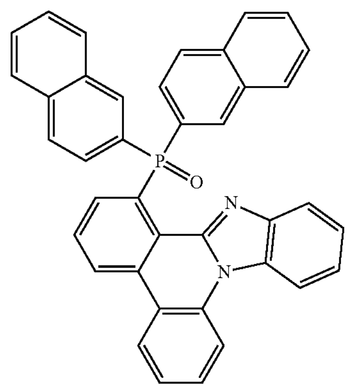
[Compound 1-124]
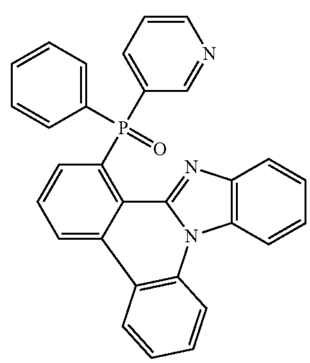

[Compound 1-125]
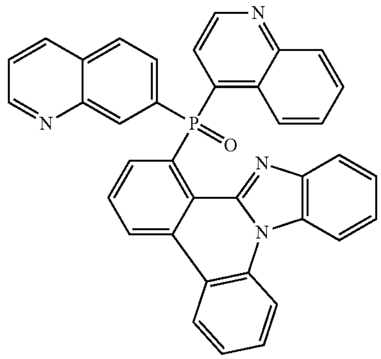
[Compound 1-126]
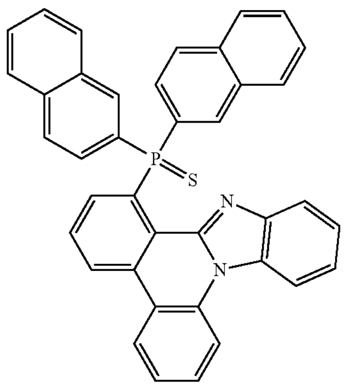
[Compound 1-127]
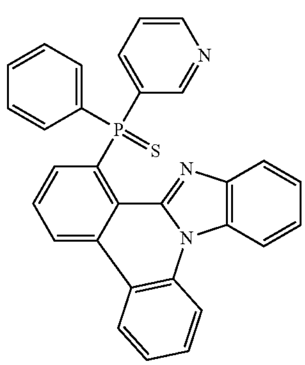
[Compound 1-128]
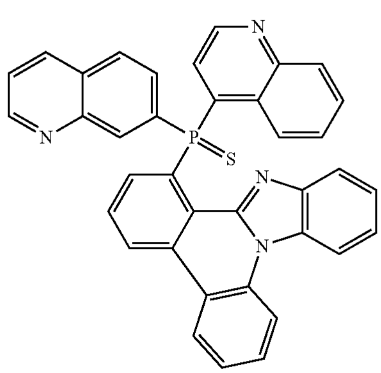
[Compound 1-129]
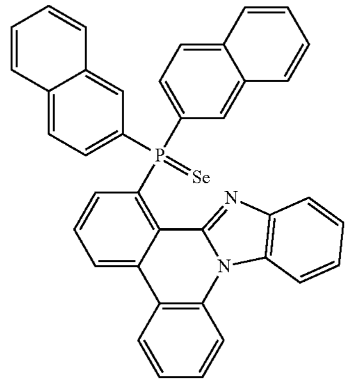
[Compound 1-130]
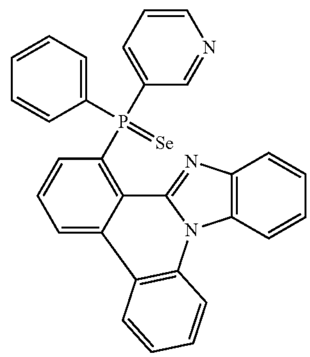
[Compound 1-131]
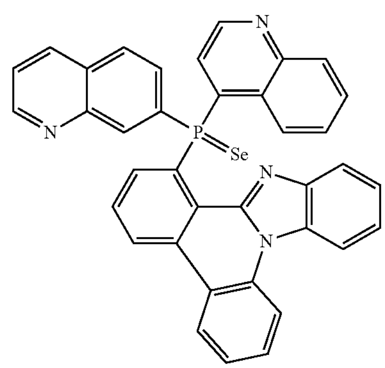
[Compound 1-132]
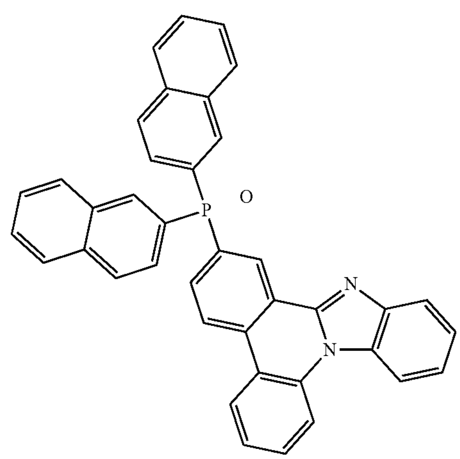

[Compound 1-133]
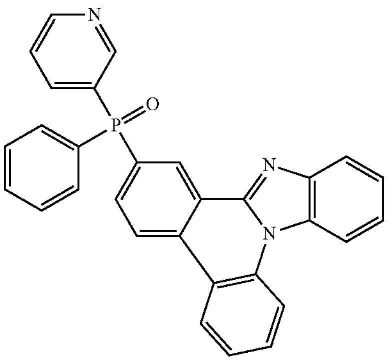
[Compound 1-134]
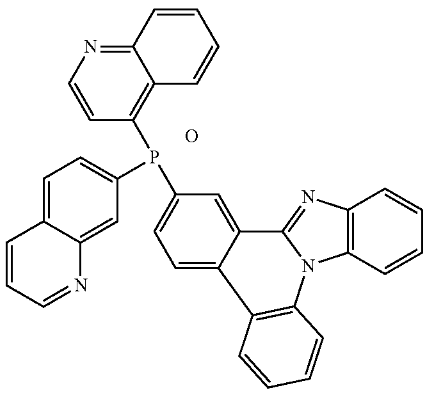
[Compound 1-135]
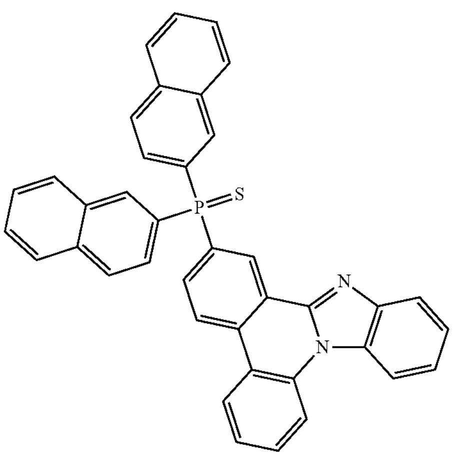
[Compound 1-136]
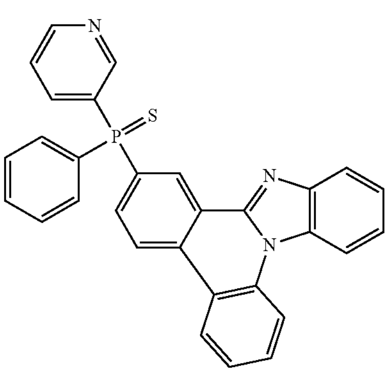
[Compound 1-137]
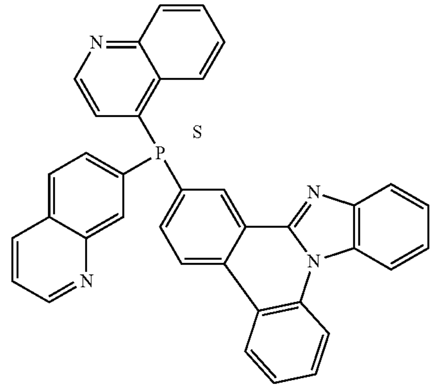
[Compound 1-138]
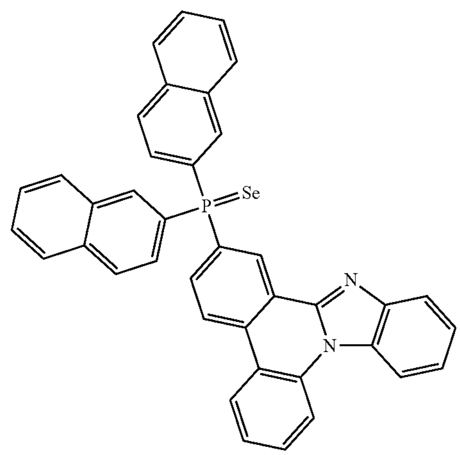
[Compound 1-139]
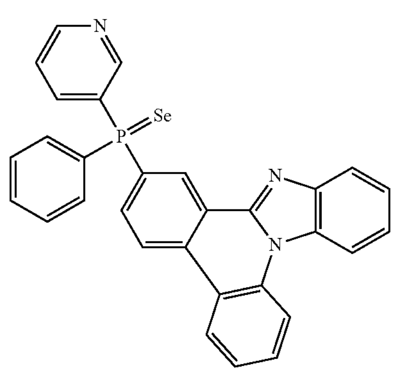

-continued
[Compound 1-140]
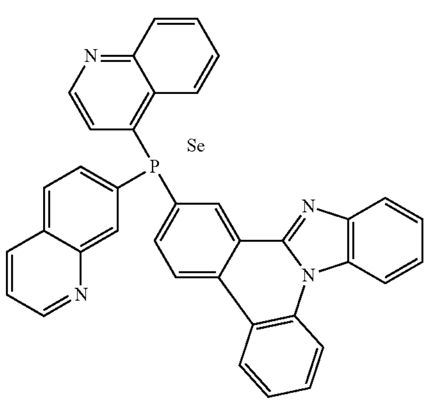
[Compound 1-141]
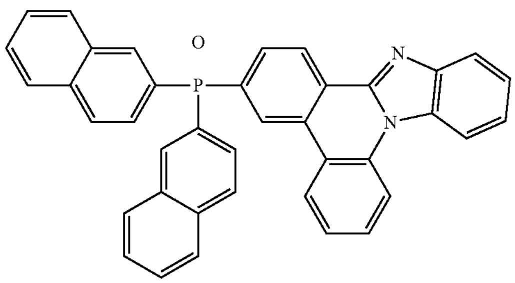
[Compound 1-142]
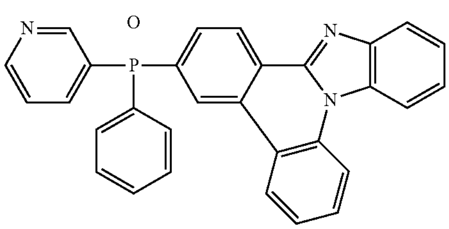
[Compound 1-143]
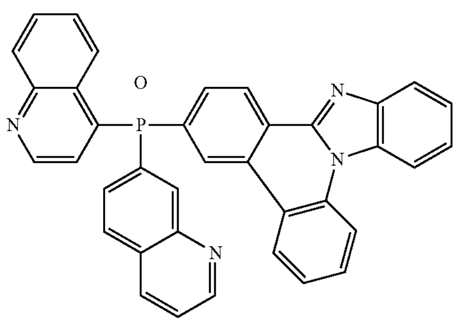
[Compound 1-144]
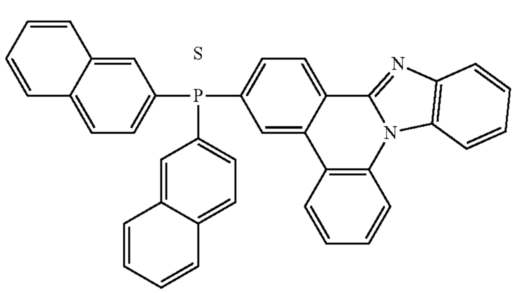
-continued
[Compound 1-145]
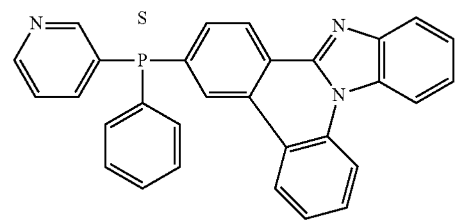
[Compound 1-146]
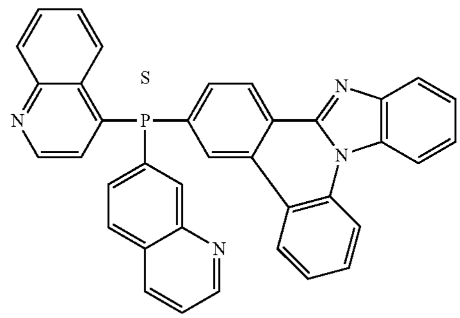
[Compound 1-147]
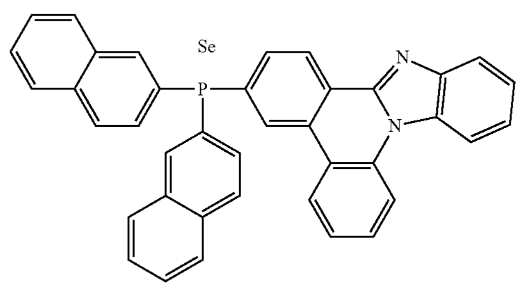
[Compound 1-148]
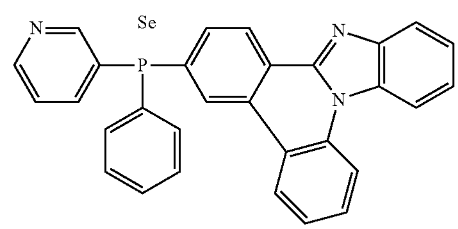
[Compound 1-149]
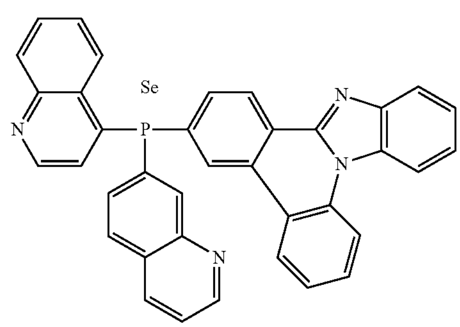

-continued
[Compound 1-150]
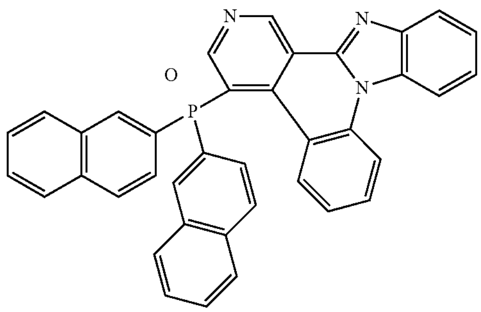
[Compound 1-151]
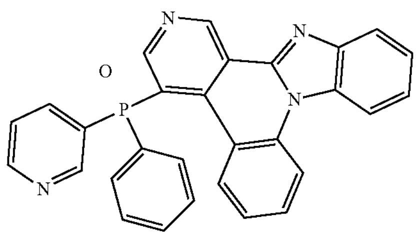
[Compound 1-152]
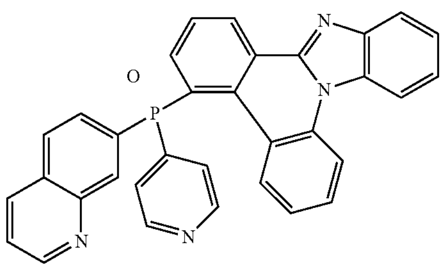
[Compound 1-153]
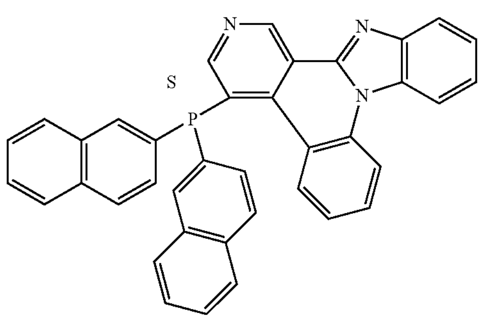
[Compound 1-154]
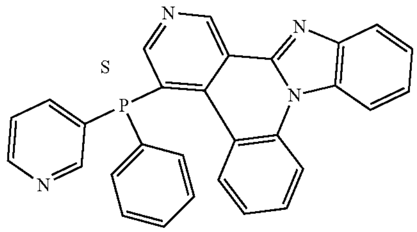
-continued
[Compound 1-155]
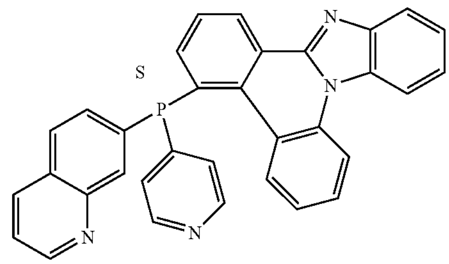
[Compound 1-156]
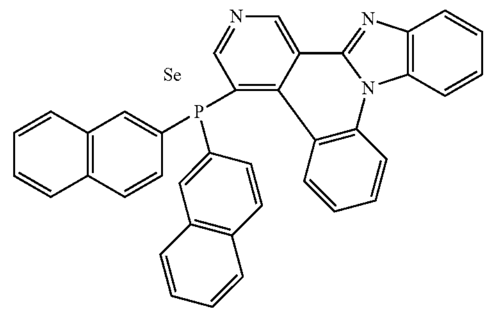
[Compound 1-157]
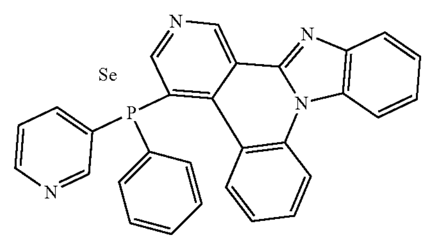
[Compound 1-158]
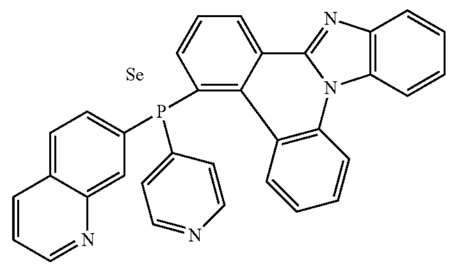
[Compound 1-159]
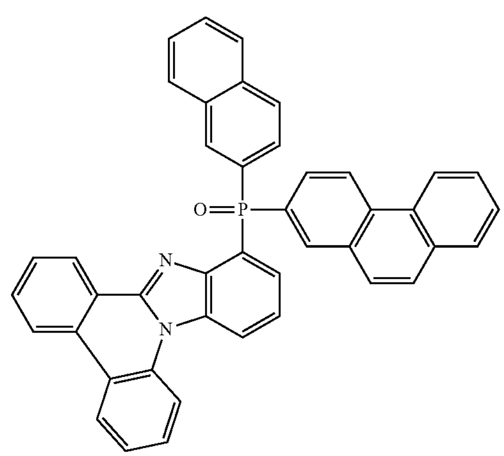

-continued
[Compound 1-160]
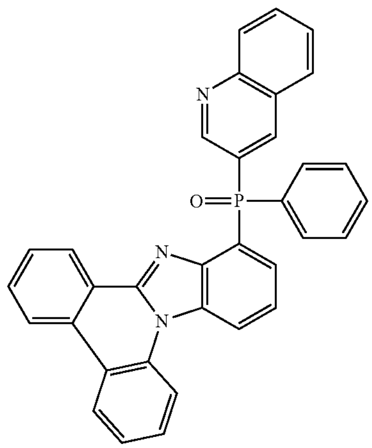
[Compound 1-161]
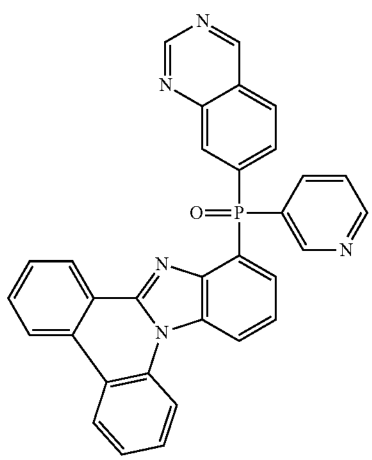
[Compound 1-162]
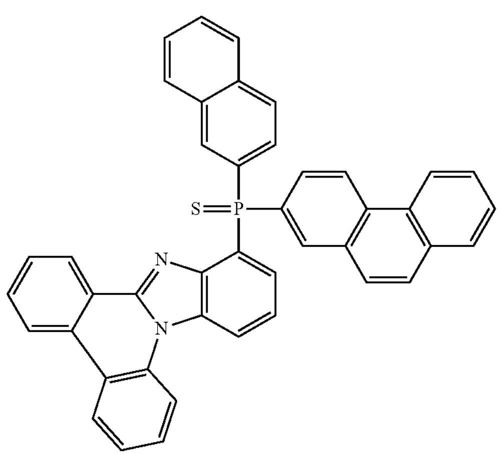
-continued
[Compound 1-163]
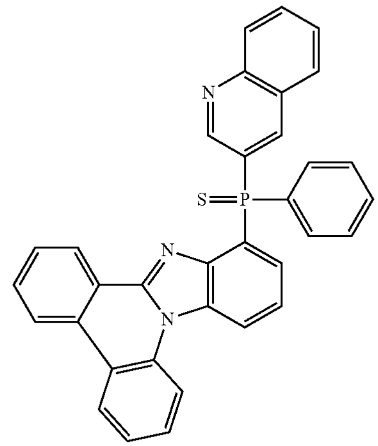
[Compound 1-164]
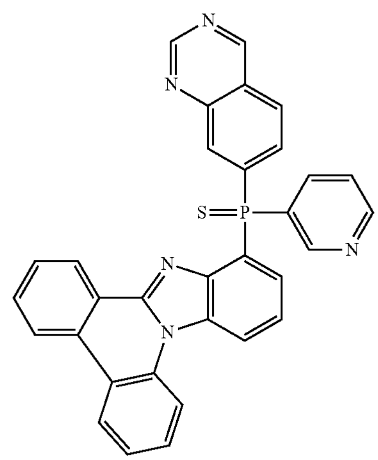
[Compound 1-165]
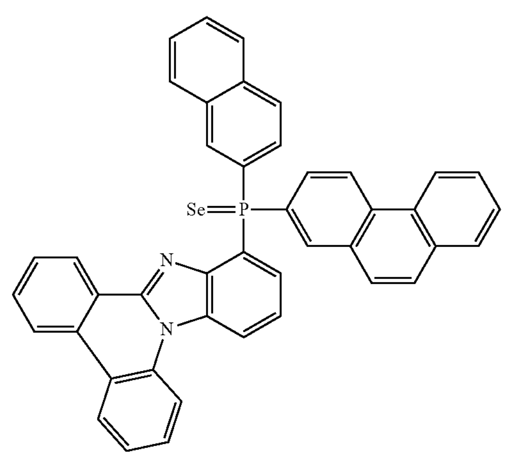

[Compound 1-166]
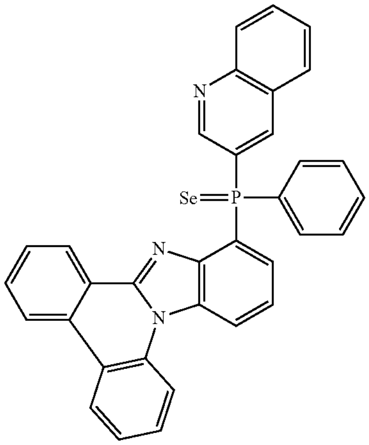
[Compound 1-167]
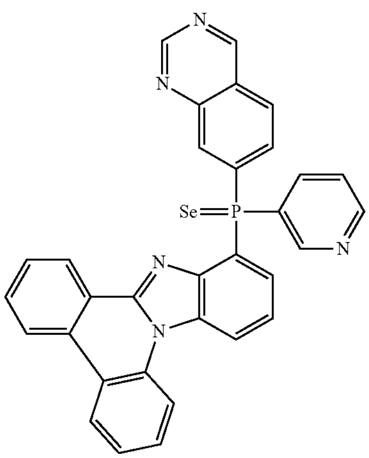
[Compound 1-168]
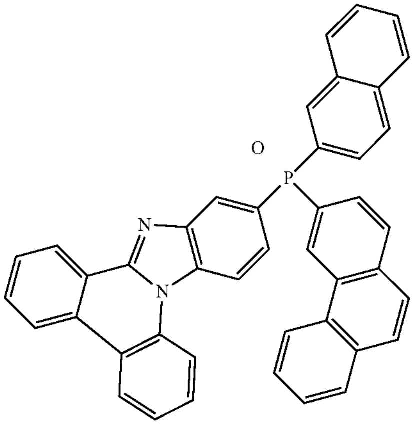
[Compound 1-169]
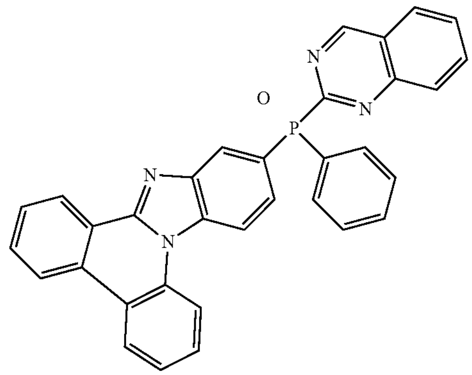
[Compound 1-170]
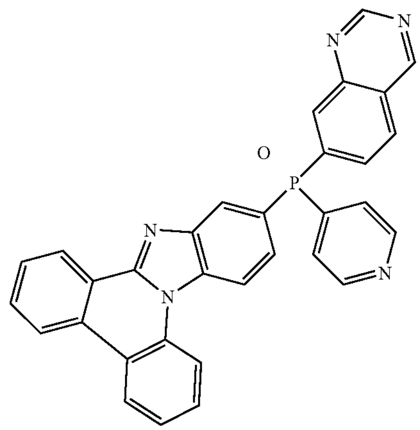
[Compound 1-171]
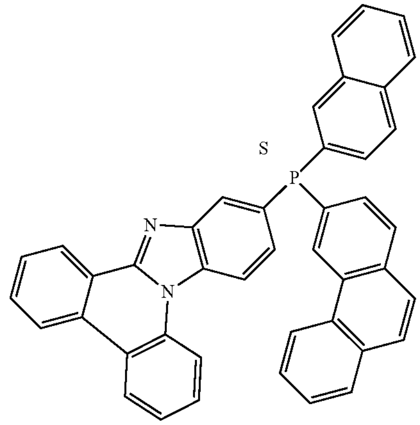

-continued
[Compound 1-172]
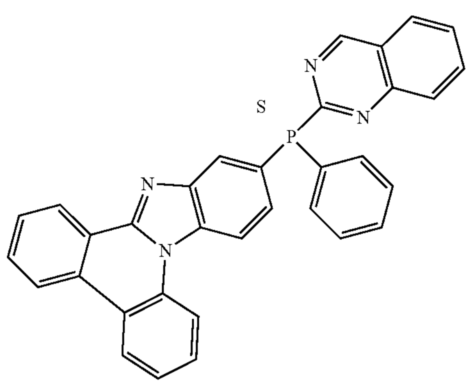
[Compound 1-173]
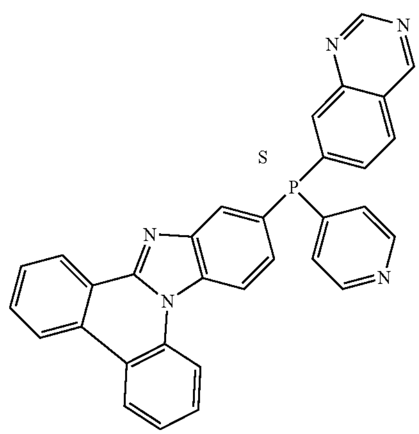
[Compound 1-174]
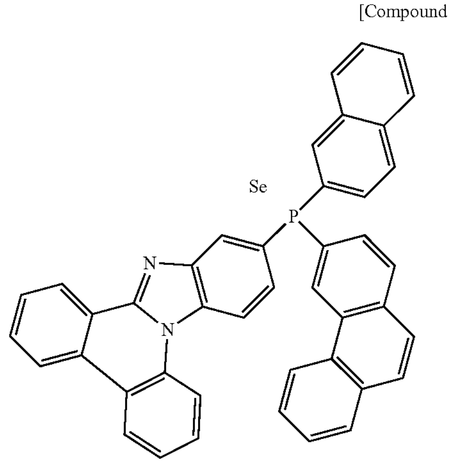
-continued
[Compound 1-175]
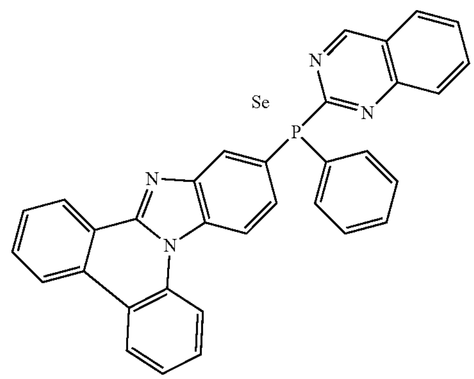
[Compound 1-176]
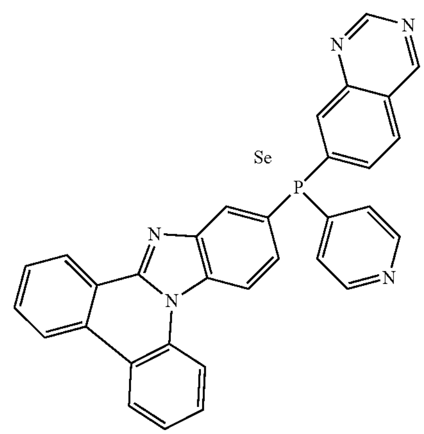
[Compound 1-177]
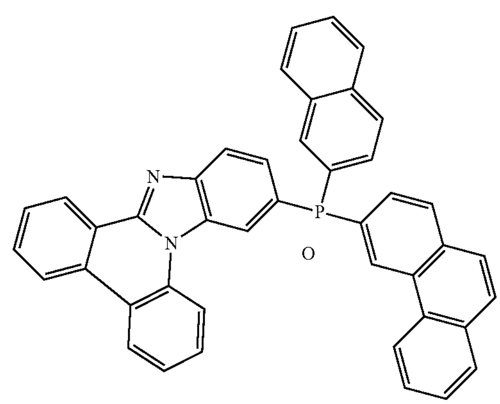
[Compound 1-178]
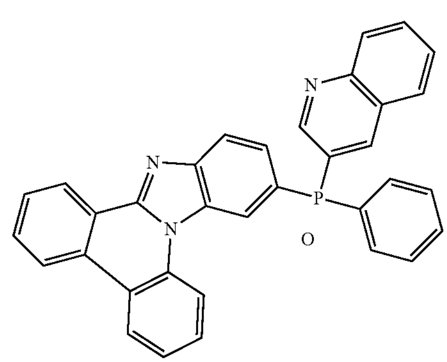

-continued
[Compound 1-179]
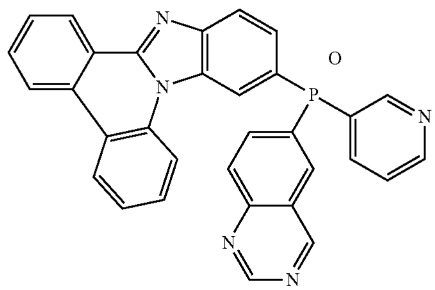
[Compound 1-180]
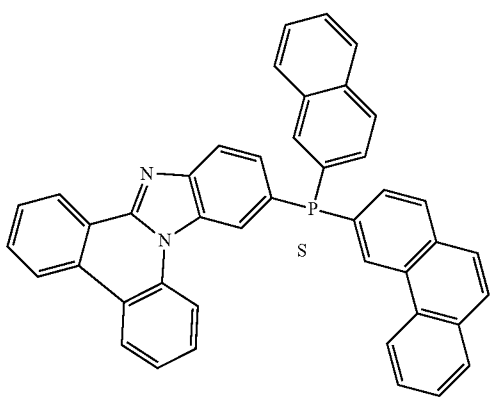
[Compound 1-181]
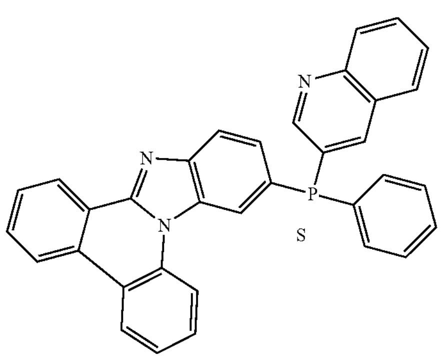
[Compound 1-182]
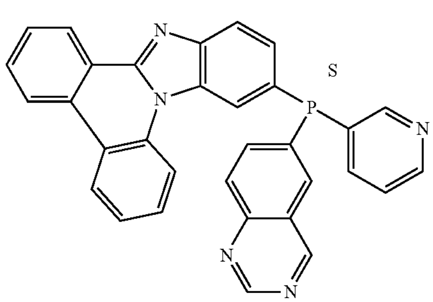
-continued
[Compound 1-183]
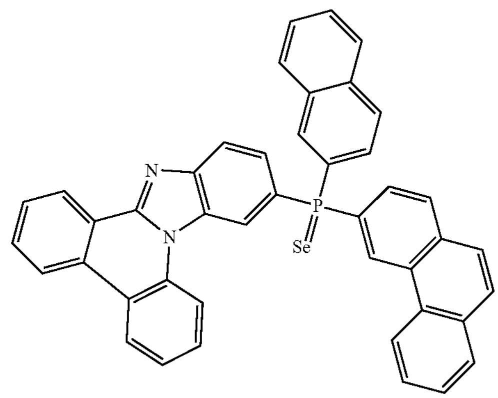
[Compound 1-184]
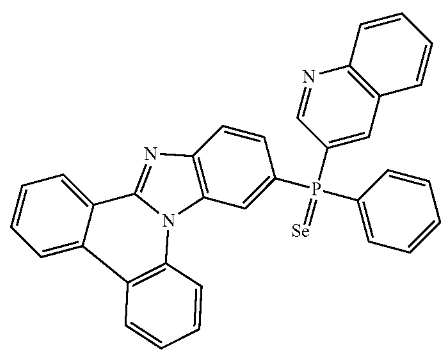
[Compound 1-185]
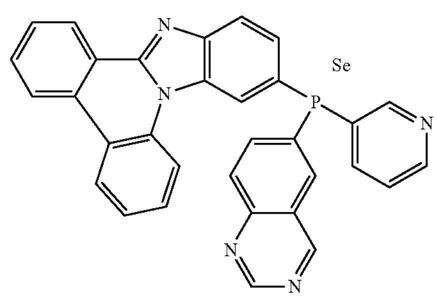
[Compound 1-186]
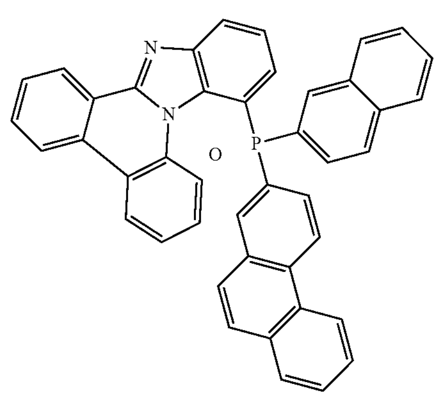

-continued
[Compound 1-187]
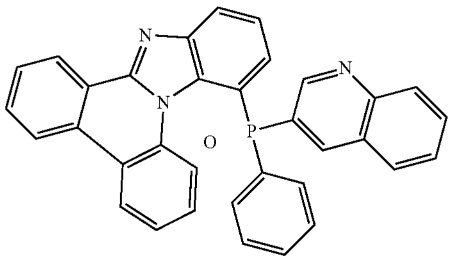
[Compound 1-188]
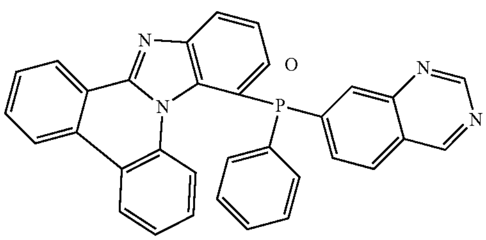
[Compound 1-189]
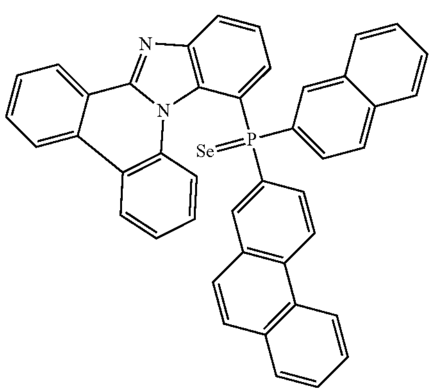
[Compound 1-190]
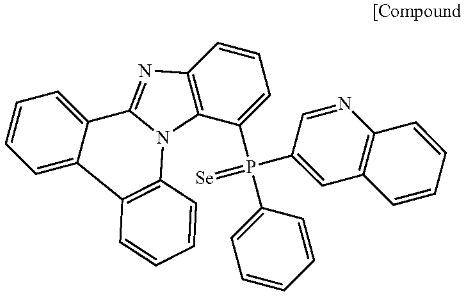
[Compound 1-191]
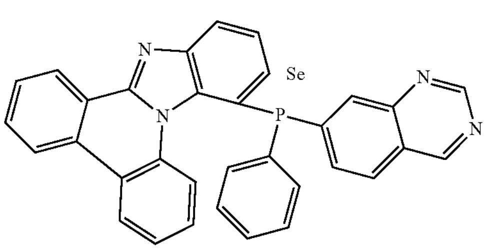
-continued
[Compound 1-192]
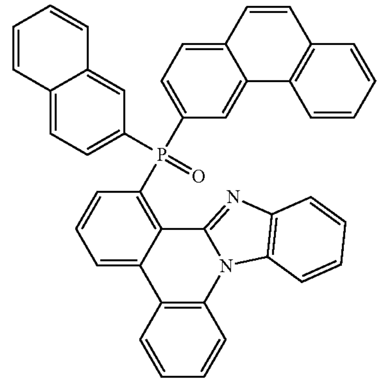
[Compound 1-193]
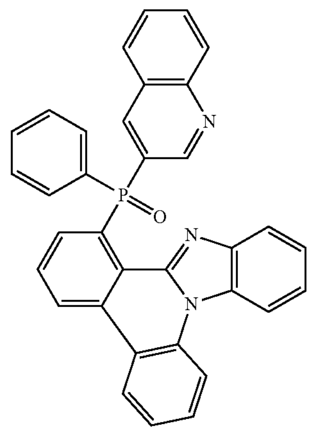
[Compound 1-194]
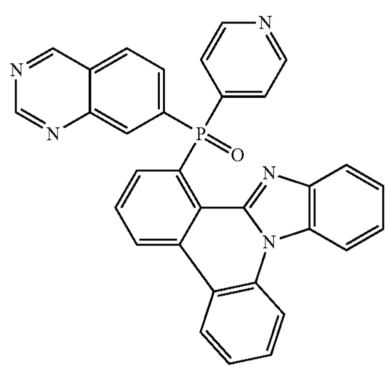
[Compound 1-195]
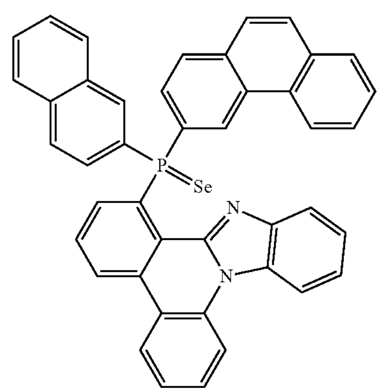

[Compound 1-196]
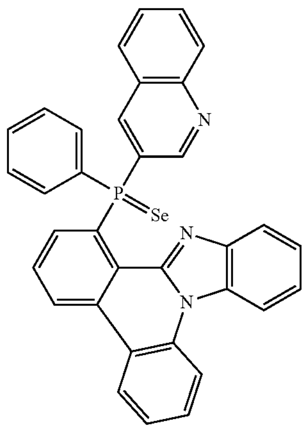
[Compound 1-197]
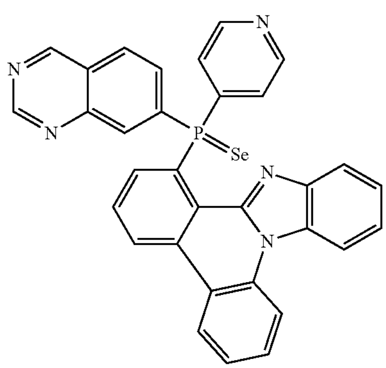
[Compound 1-198]
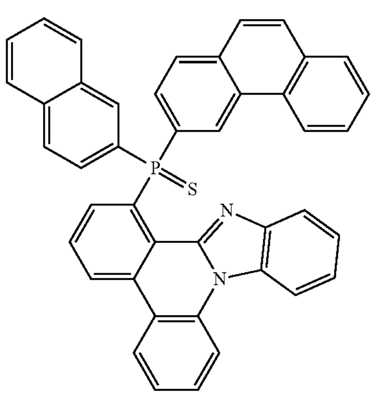
[Compound 1-199]
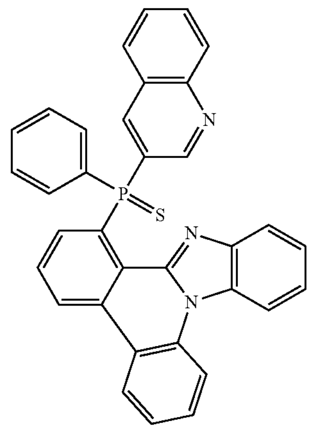
[Compound 1-200]
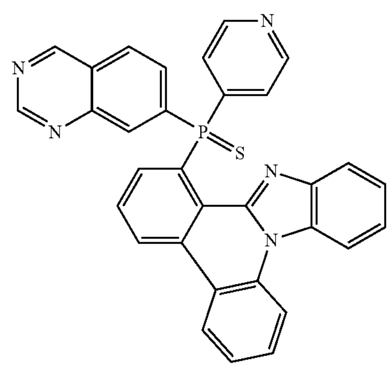
[Compound 1-201]
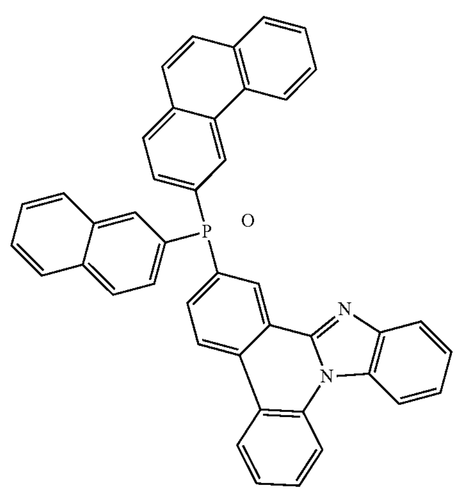

-continued
[Compound 1-202]
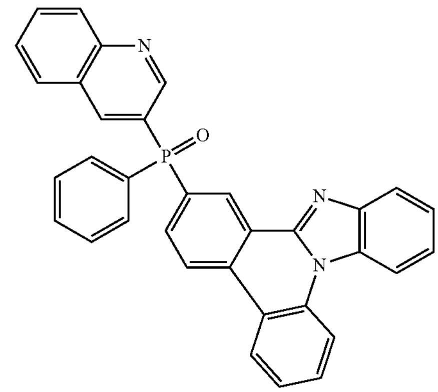
[Compound 1-203]
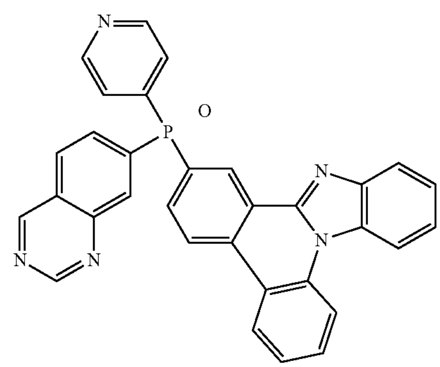
[Compound 1-204]
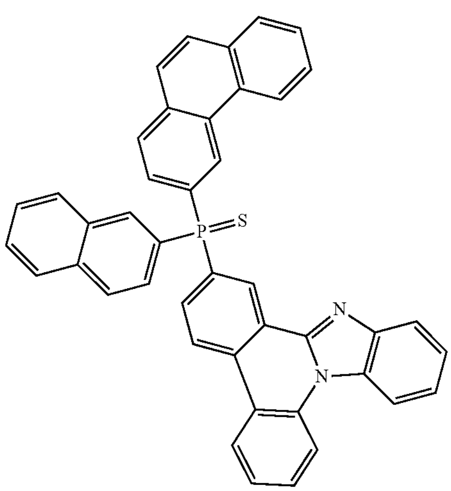
-continued
[Compound 1-205]
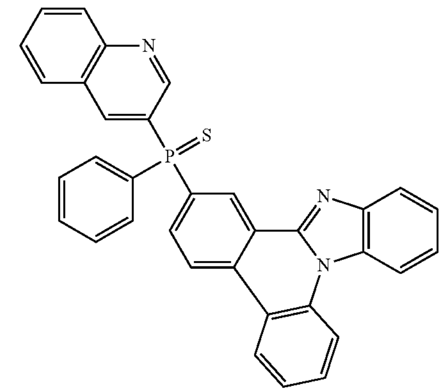
[Compound 1-206]
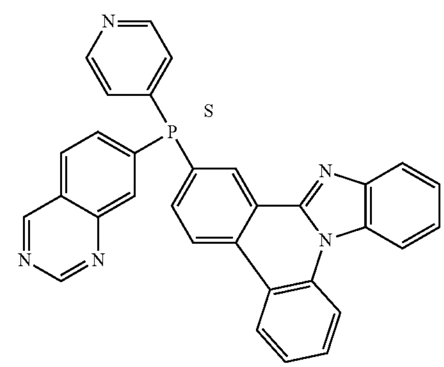
[Compound 1-207]
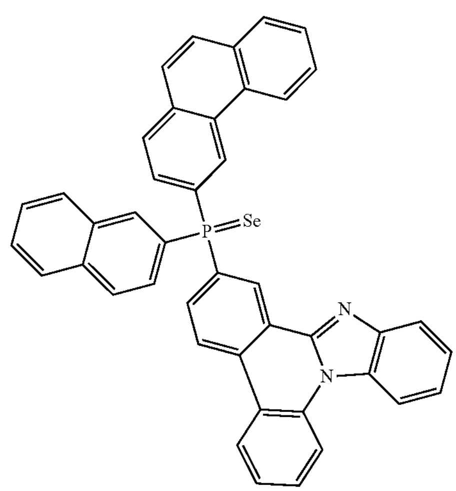

-continued
[Compound 1-208]
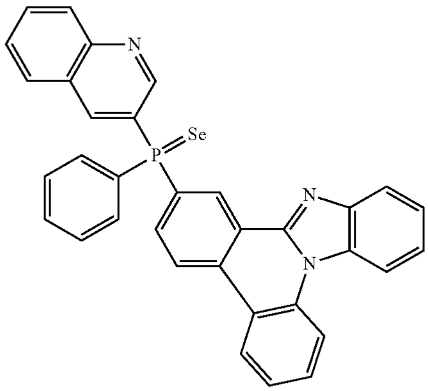
[Compound 1-209]
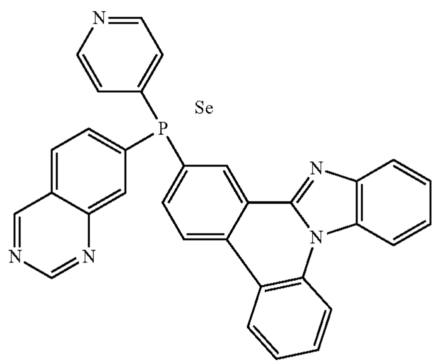
[Compound 1-210]
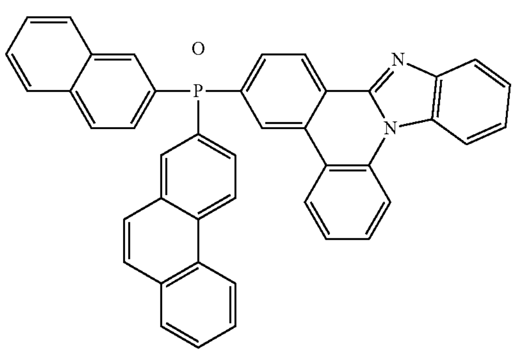
[Compound 1-211]
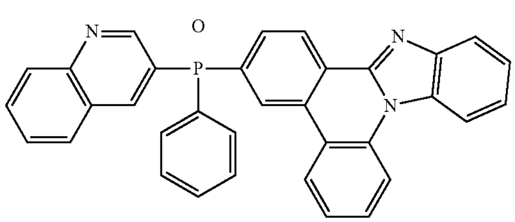
-continued
[Compound 1-212]
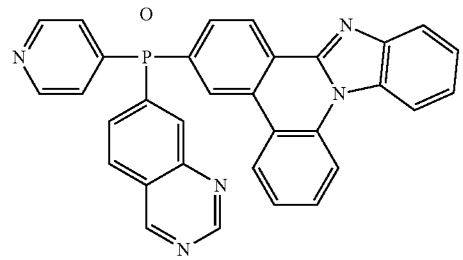
[Compound 1-213]
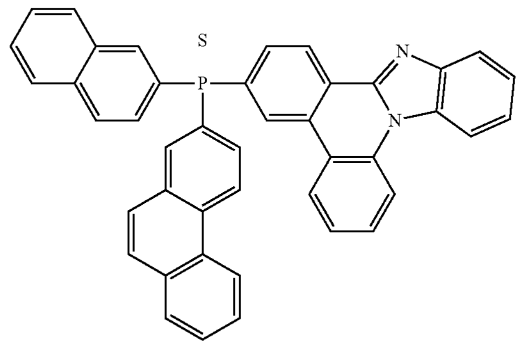
[Compound 1-214]
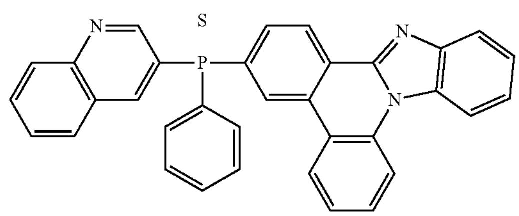
[Compound 1-215]
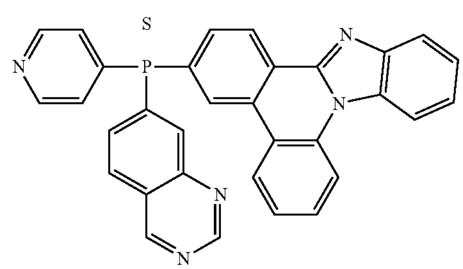
[Compound 1-216]
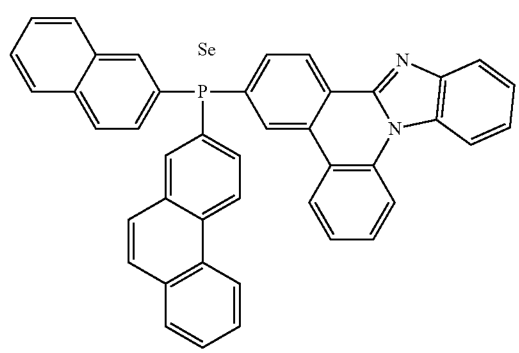

-continued
[Compound 1-217]
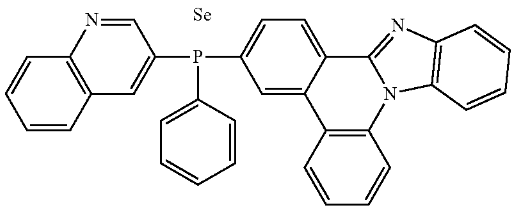
[Compound 1-218]
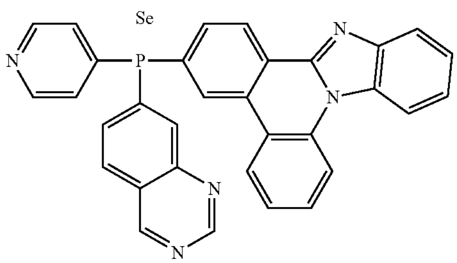
[Compound 1-219]
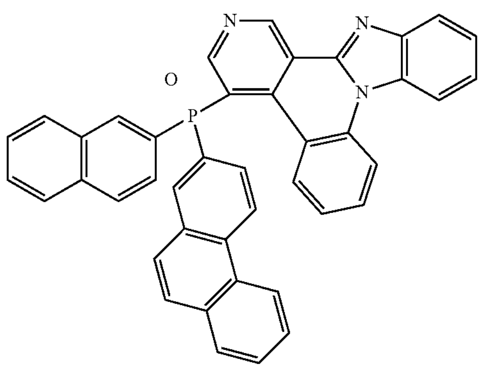
[Compound 1-220]
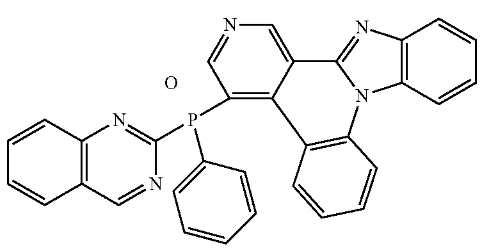
[Compound 1-221]
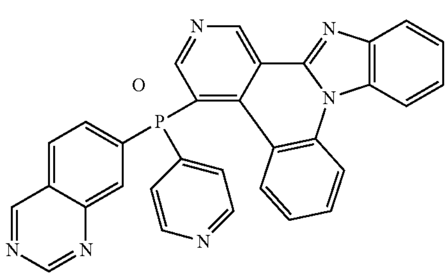
-continued
[Compound 1-222]
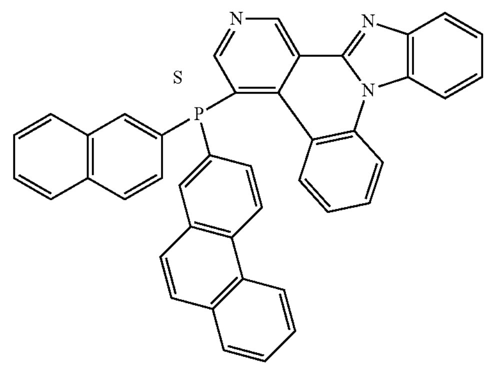
[Compound 1-223]
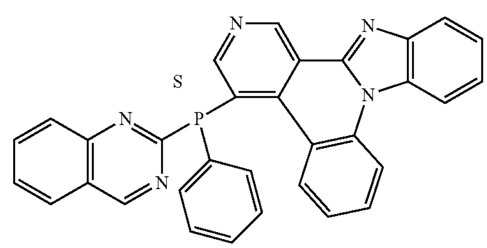
[Compound 1-224]
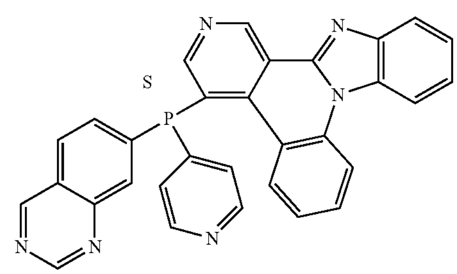
[Compound 1-225]
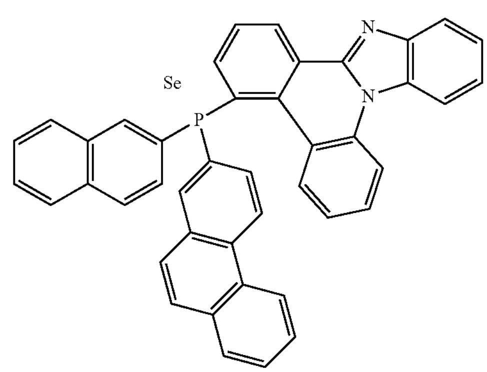
[Compound 1-226]
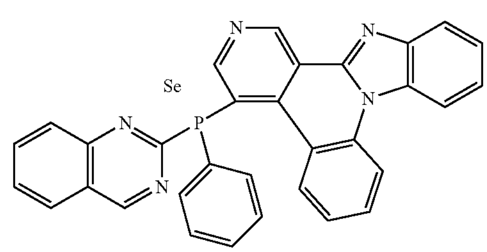

[Compound 1-227]
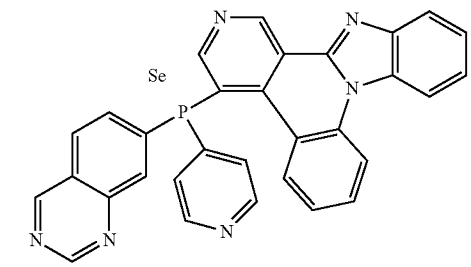
[Compound 1-228]
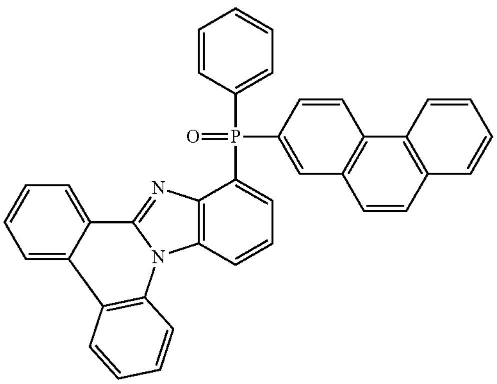
[Compound 1-229]
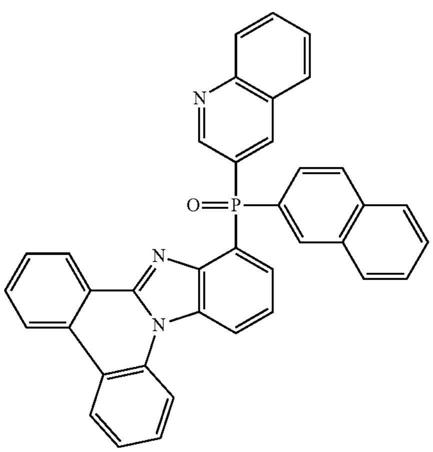
[Compound 1-230]
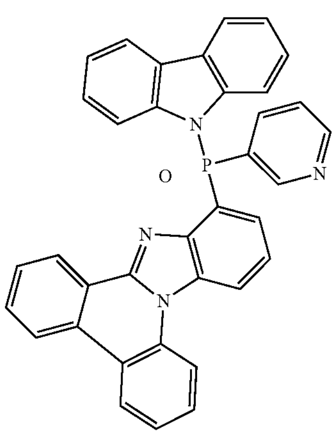
[Compound 1-231]
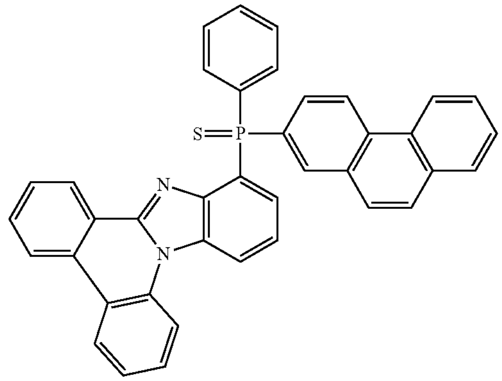
[Compound 1-232]
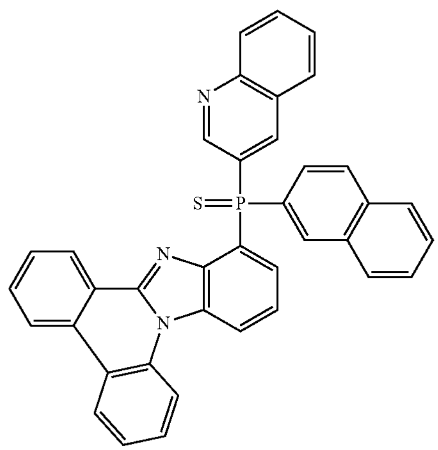
[Compound 1-233]
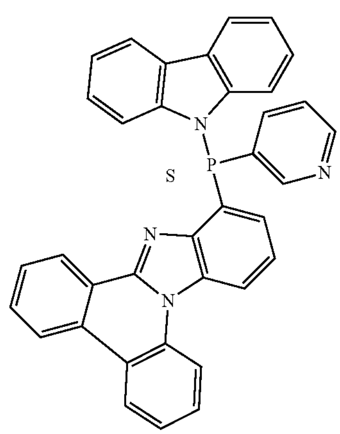

-continued
[Compound 1-234]
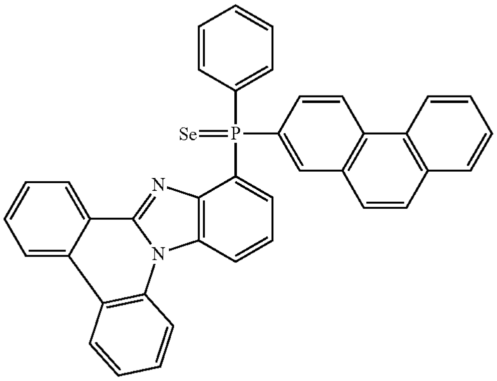
[Compound 1-235]
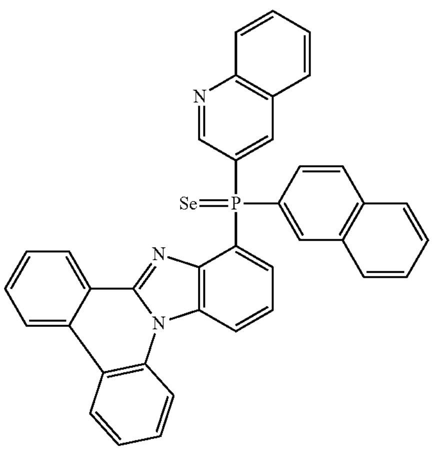
[Compound 1-236]
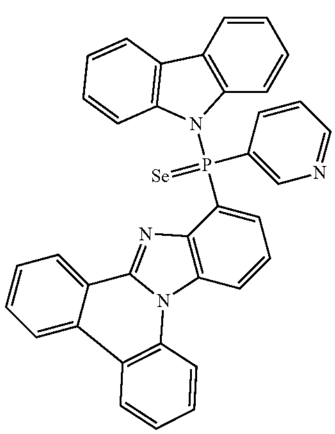
-continued
[Compound 1-237]
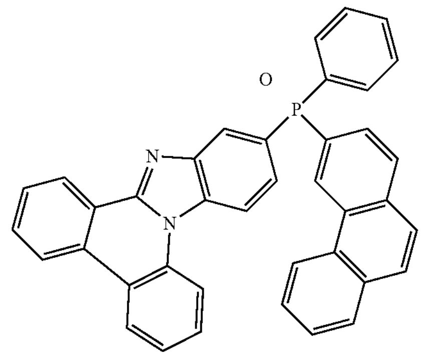
[Compound 1-238]
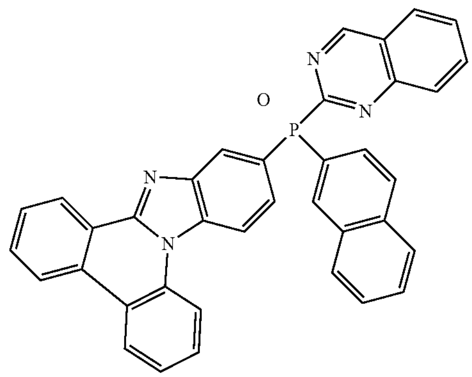
[Compound 1-239]
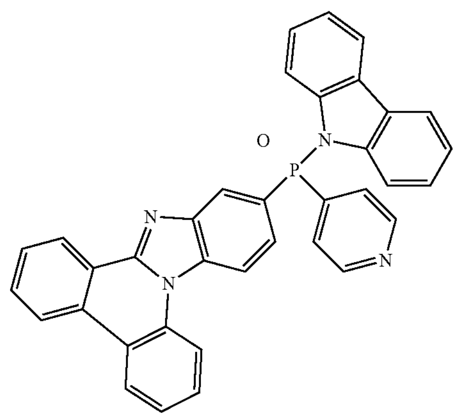
[Compound 1-240]
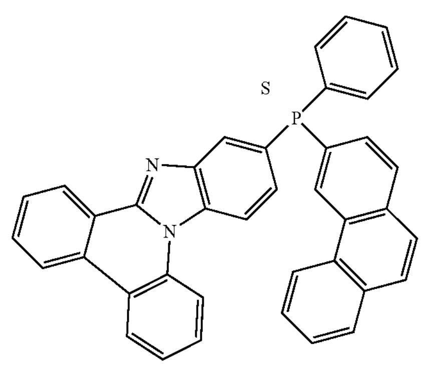

-continued
[Compound 1-241]
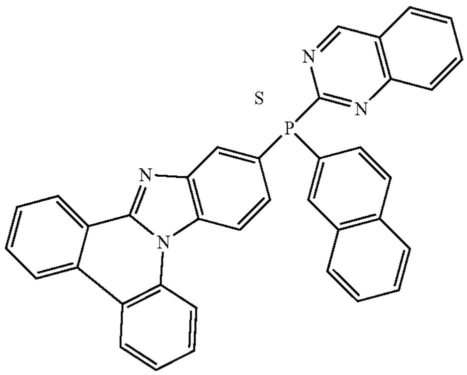
[Compound 1-242]
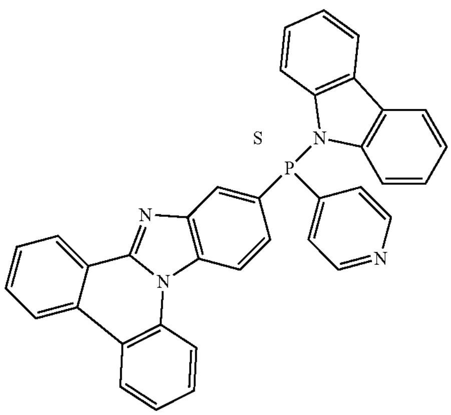
[Compound 1-243]
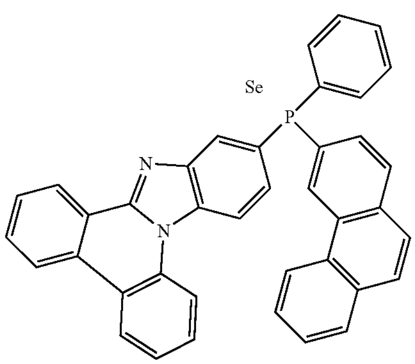
[Compound 1-244]
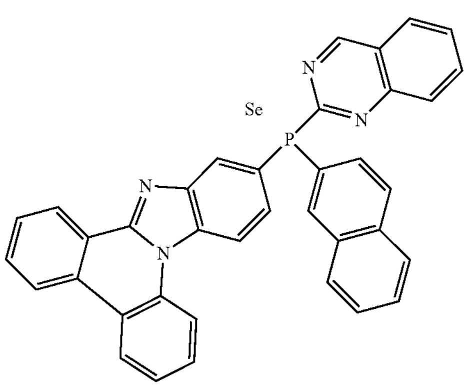
-continued
[Compound 1-245]
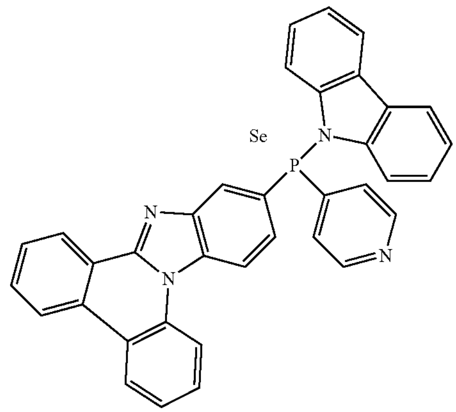
[Compound 1-246]
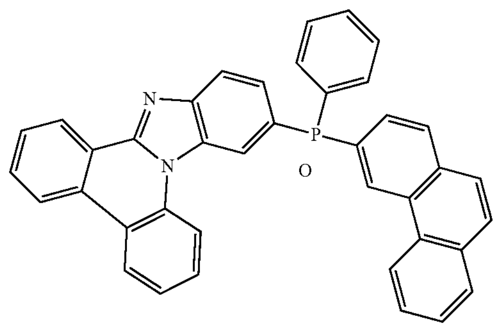
[Compound 1-247]
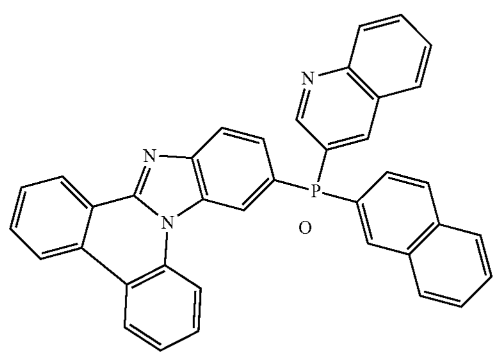
[Compound 1-248]
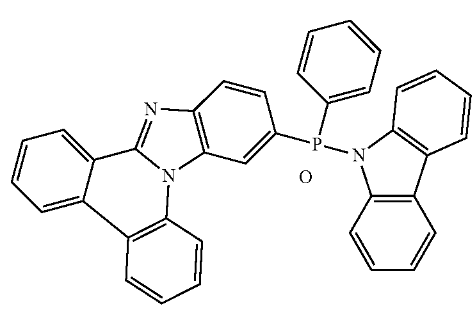

-continued
[Compound 1-249]
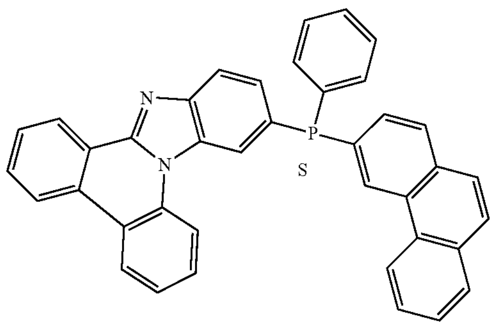
[Compound 1-250]
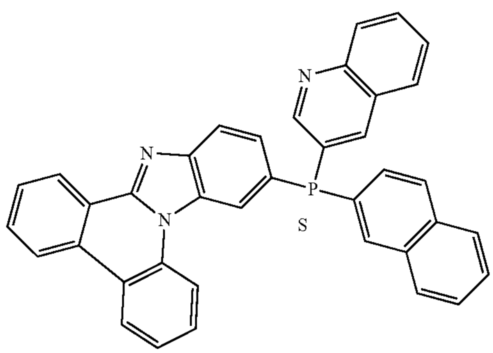
[Compound 1-251]
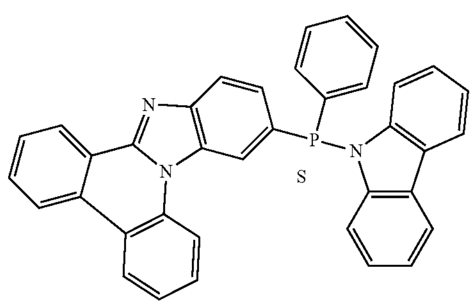
[Compound 1-252]
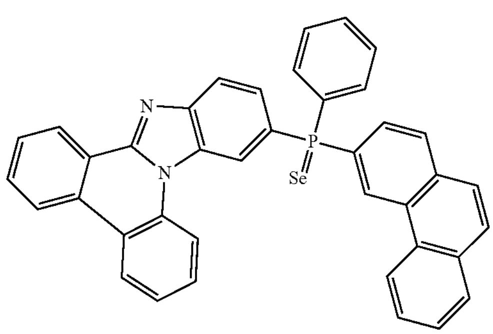
-continued
[Compound 1-253]
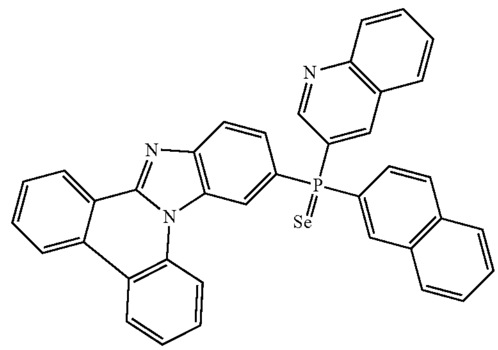
[Compound 1-254]
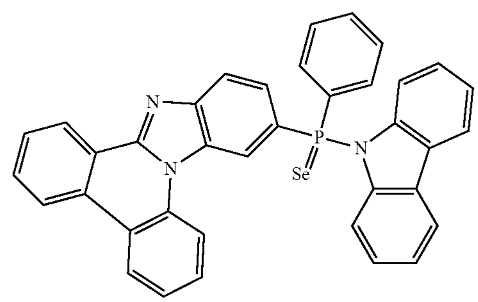
[Compound 1-255]
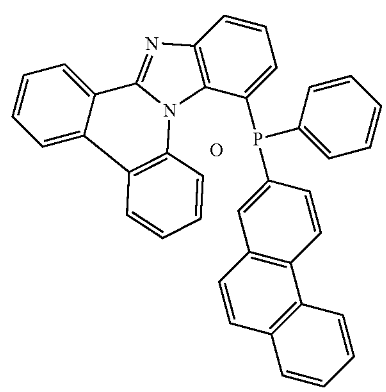
[Compound 1-256]
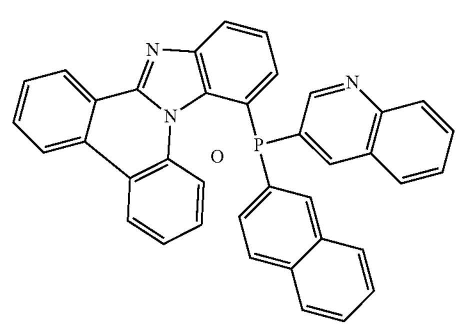

[Compound 1-257]
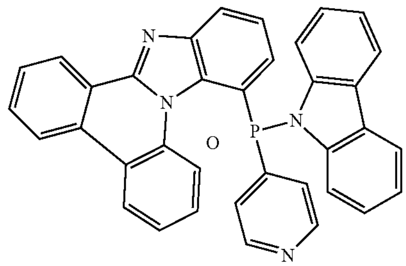
[Compound 1-258]
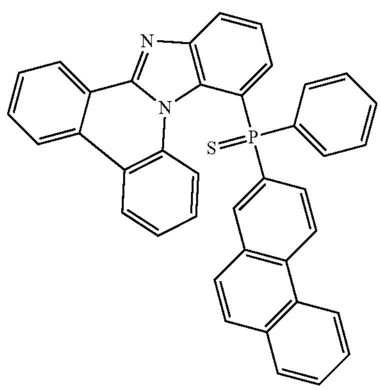
[Compound 1-259]
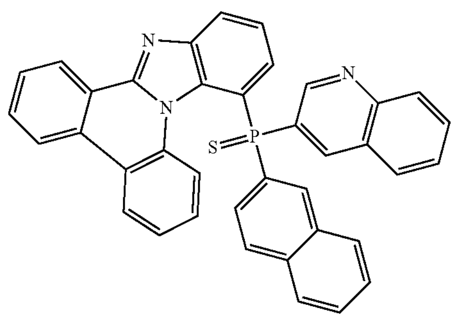
[Compound 1-260]
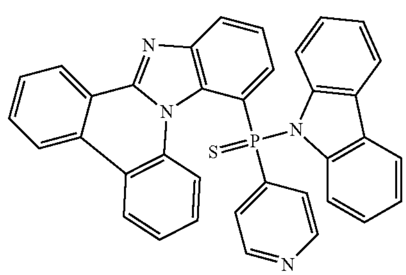
[Compound 1-261]
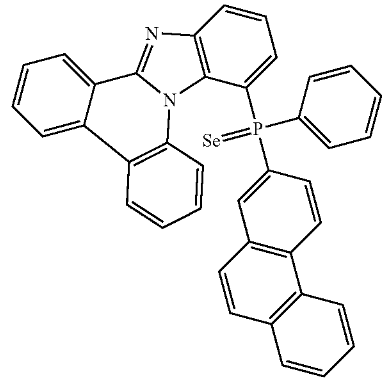
[Compound 1-262]
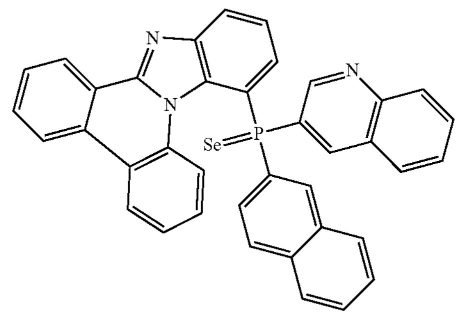
[Compound 1-263]
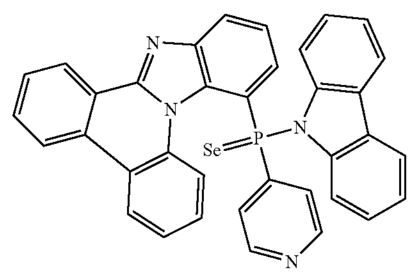
[Compound 1-264]
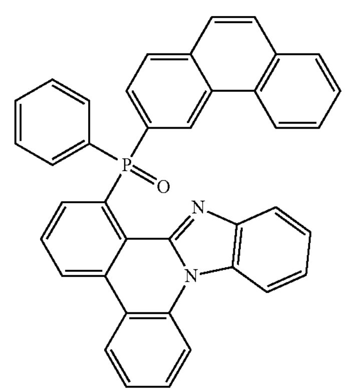

-continued
[Compound 1-265]
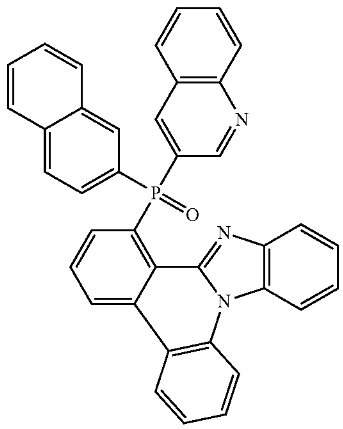
[Compound 1-266]
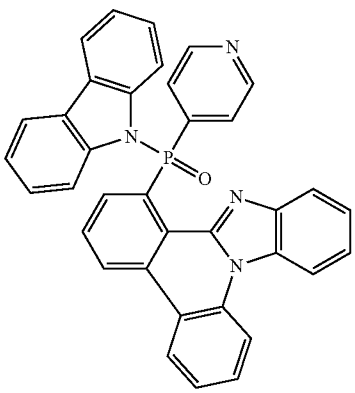
[Compound 1-267]
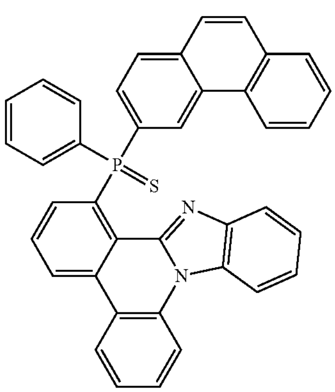
-continued
[Compound 1-268]
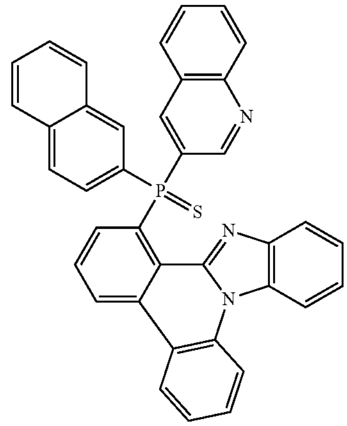
[Compound 1-269]
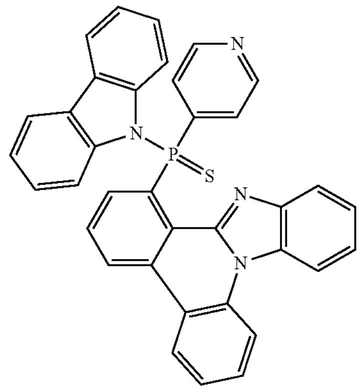
[Compound 1-270]
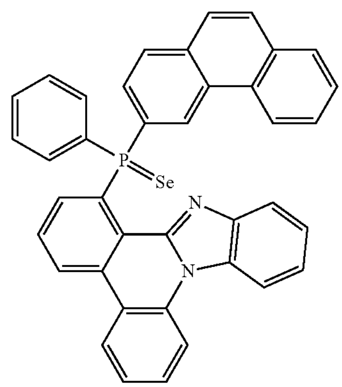
[Compound 1-271]
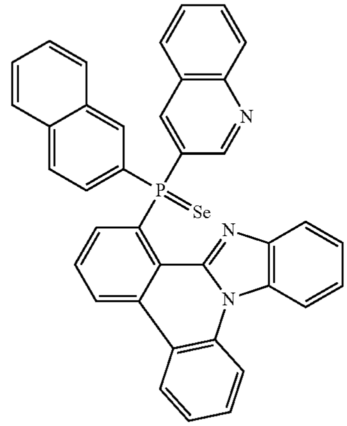

[Compound 1-272]
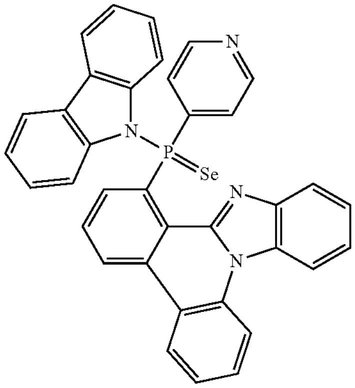
[Compound 1-273]
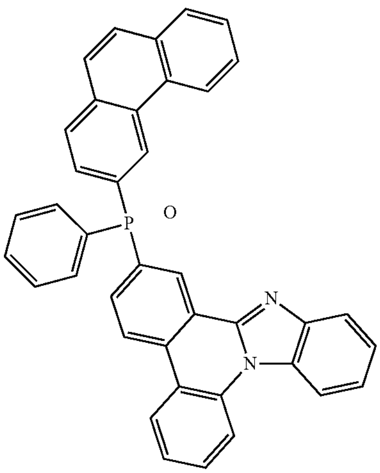
[Compound 1-274]
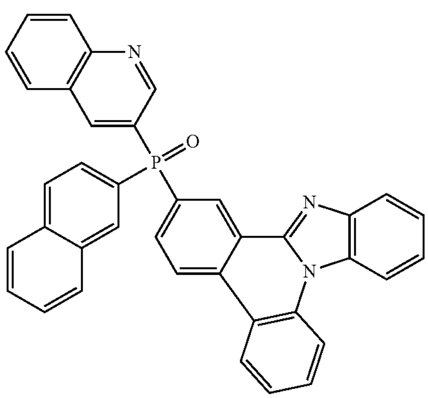
[Compound 1-275]
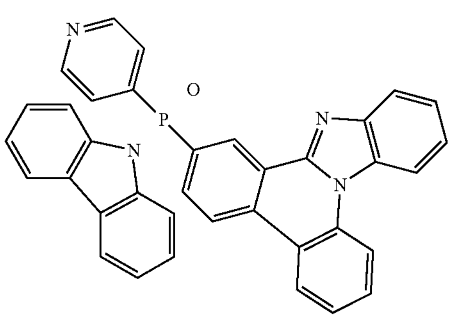
[Compound 1-276]
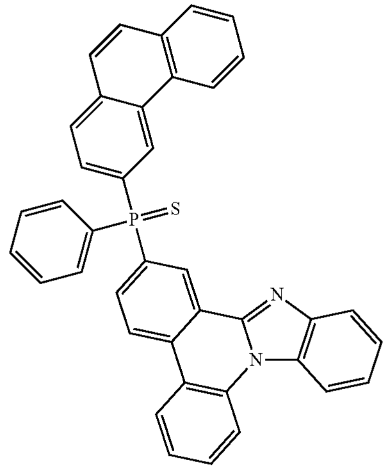
[Compound 1-277]
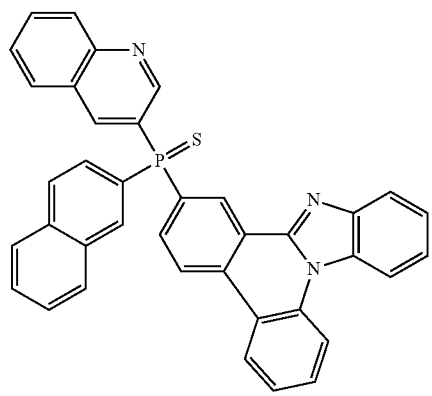
[Compound 1-278]
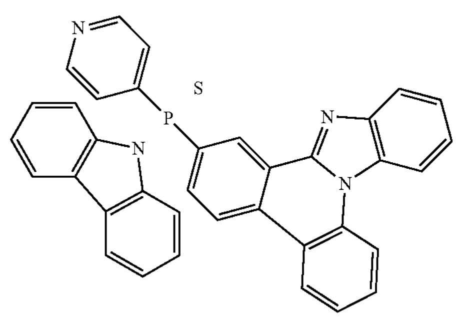

-continued
[Compound 1-279]
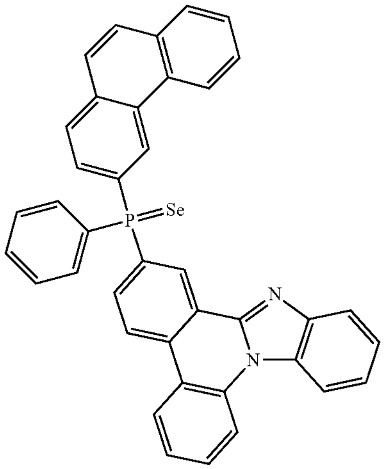
[Compound 1-280]
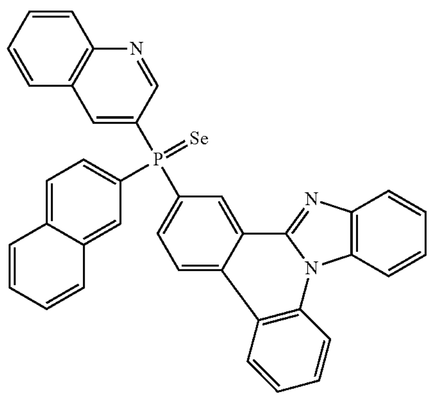
[Compound 1-281]
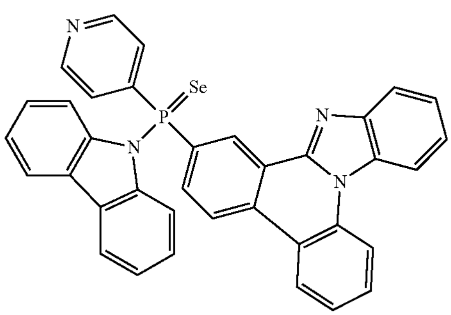
[Compound 1-282]
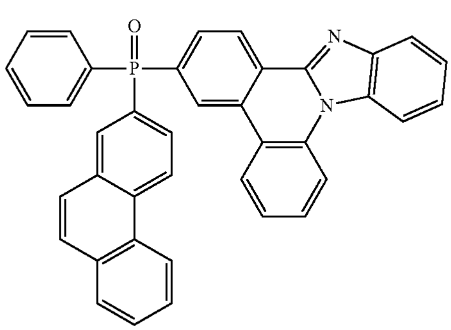
[Compound 1-283]
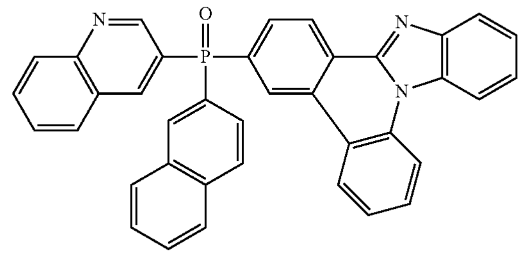
[Compound 1-284]
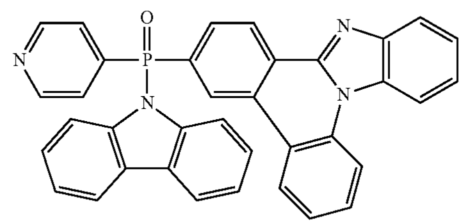
[Compound 1-285]
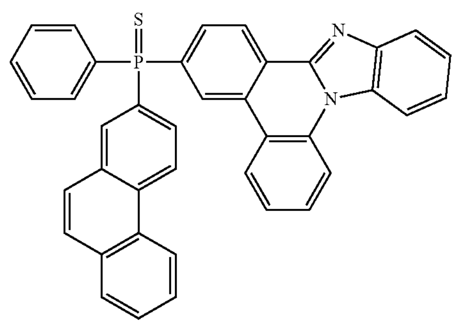
[Compound 1-286]
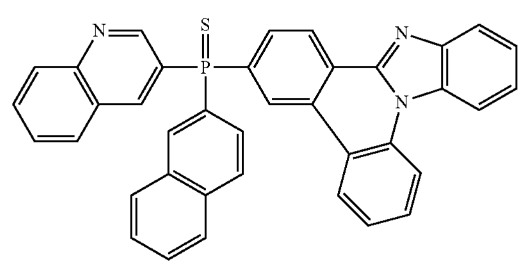
[Compound 1-287]
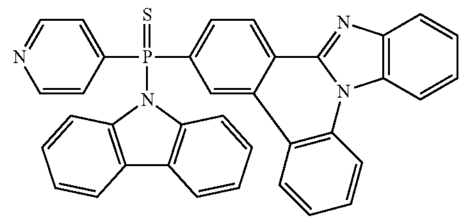

-continued
[Compound 1-288]
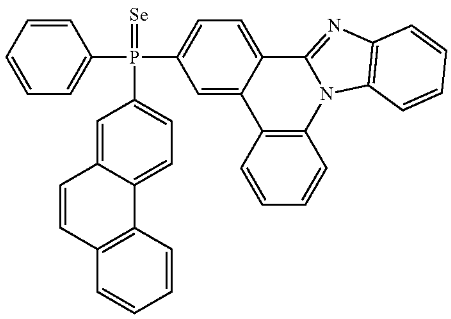
[Compound 1-289]
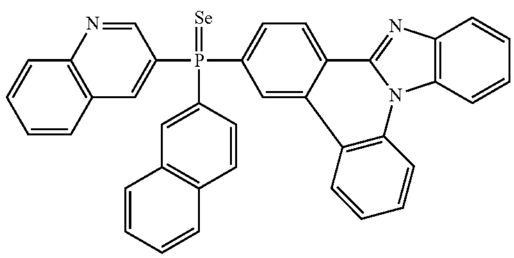
[Compound 1-290]
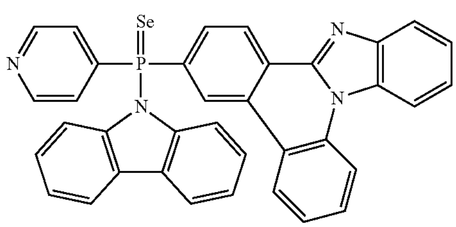
[Compound 1-291]
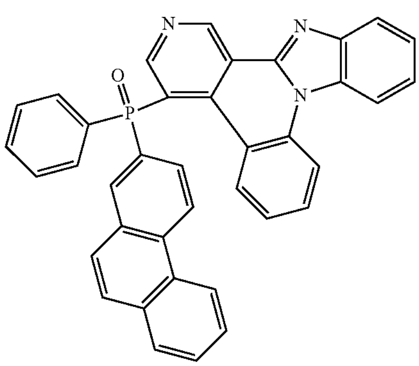
[Compound 1-292]
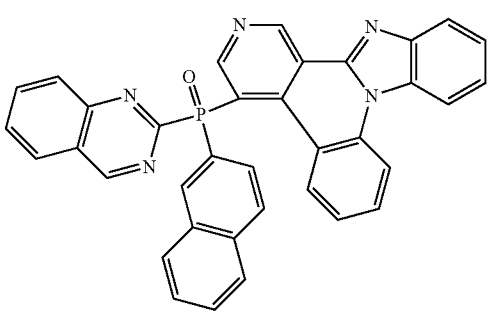
-continued
[Compound 1-293]
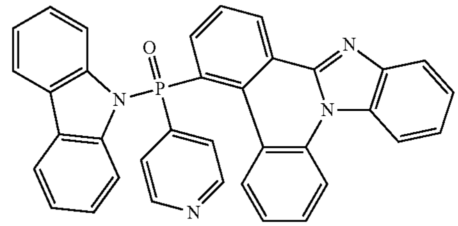
[Compound 1-294]
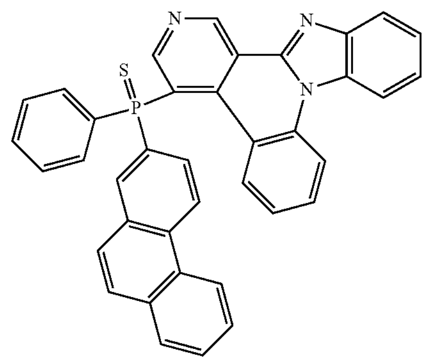
[Compound 1-295]
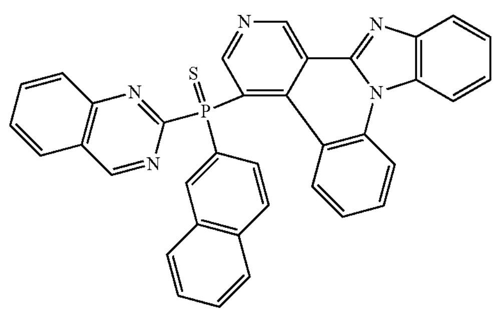
[Compound 1-296]
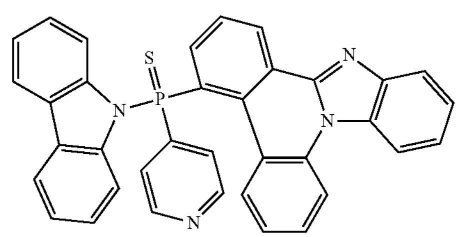
[Compound 1-297]
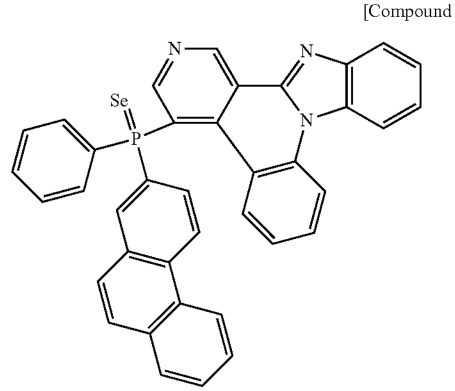

-continued
[Compound 1-298]
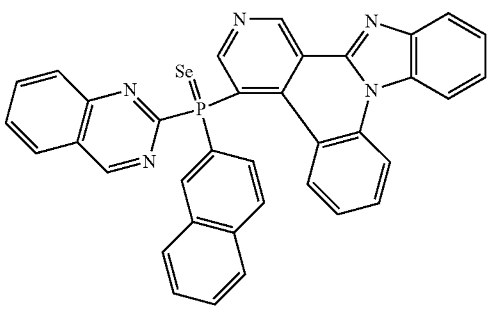
[Compound 1-299]
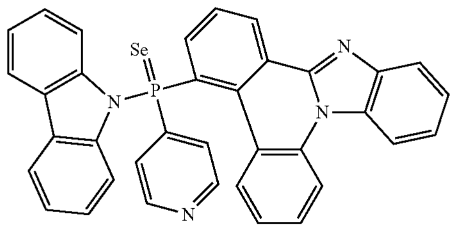
[Compound 2-1]
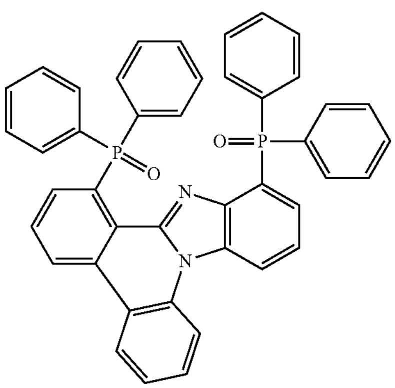
[Compound 2-2]
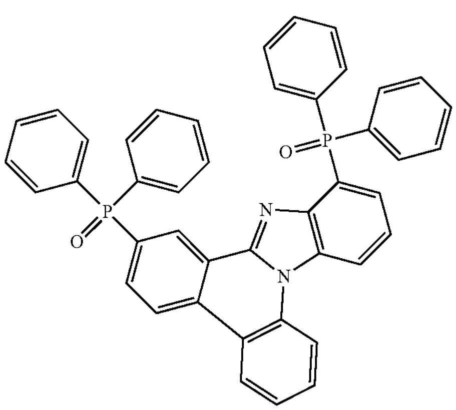
-continued
[Compound 2-3]
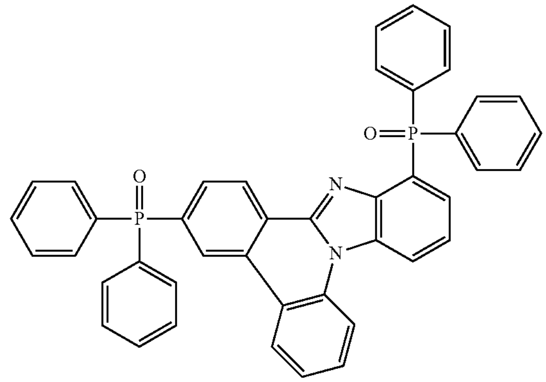
[Compound 2-4]
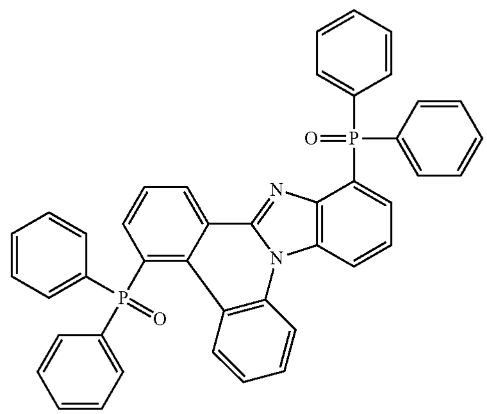
[Compound 2-5]
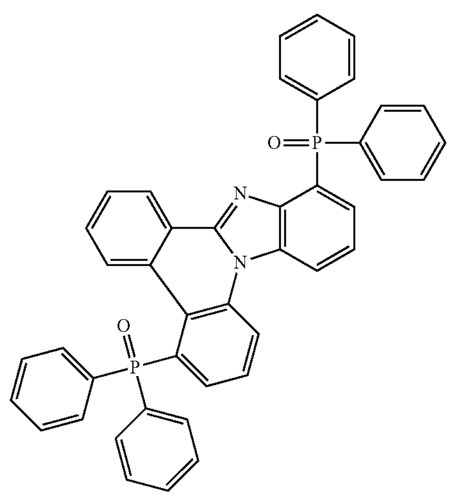

-continued
[Compound 2-6]
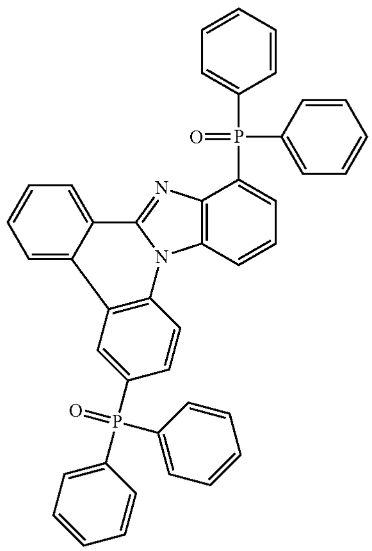
[Compound 2-7]
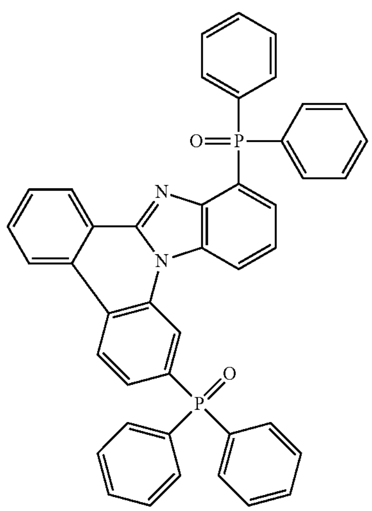
[Compound 2-8]
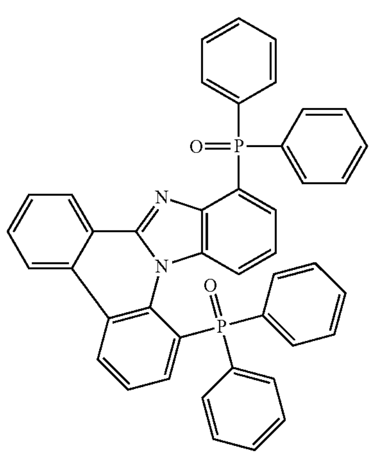
-continued
[Compound 2-9]
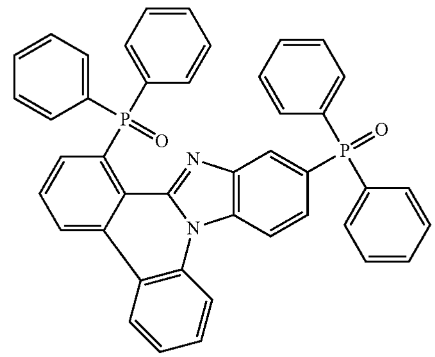
[Compound 2-10]
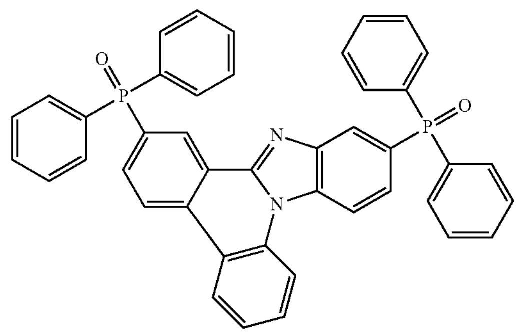
[Compound 2-11]
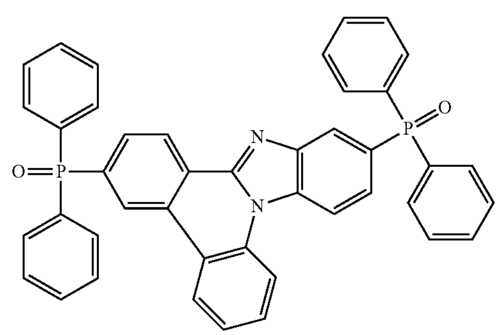
[Compound 2-12]
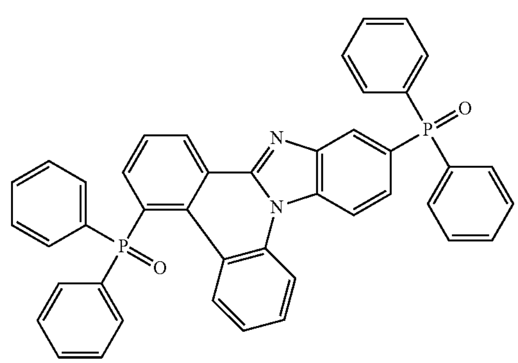

-continued
[Compound 2-13]
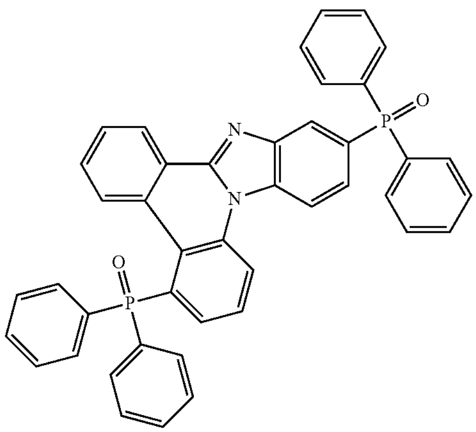
[Compound 2-14]
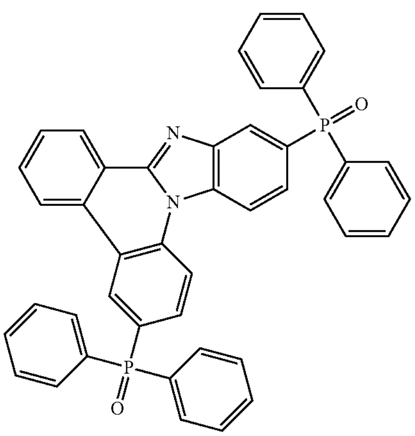
[Compound 2-15]
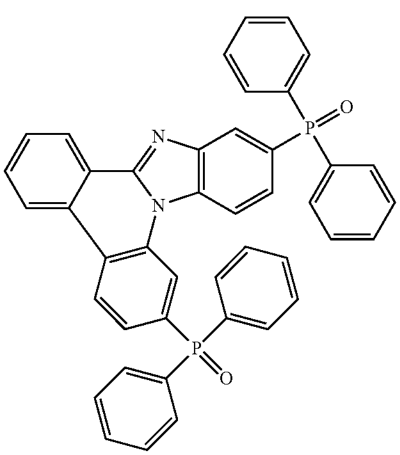
-continued
[Compound 2-16]
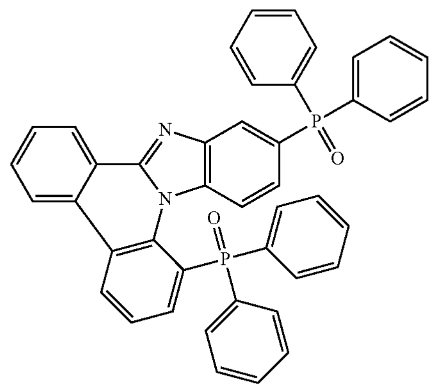
[Compound 2-17]
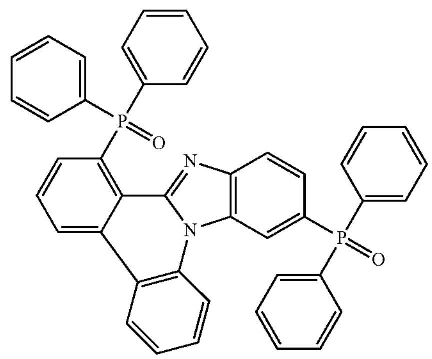
[Compound 2-18]
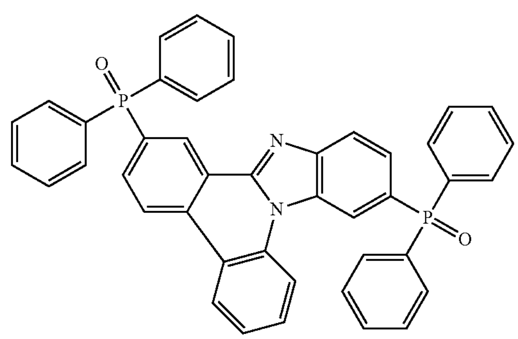
[Compound 2-19]
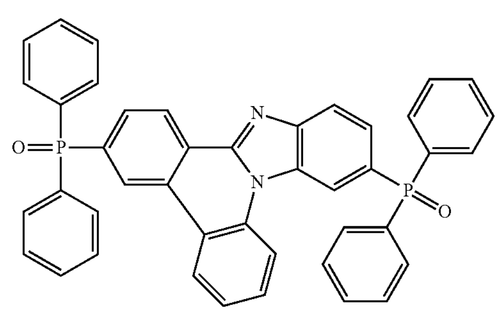

-continued
[Compound 2-20]
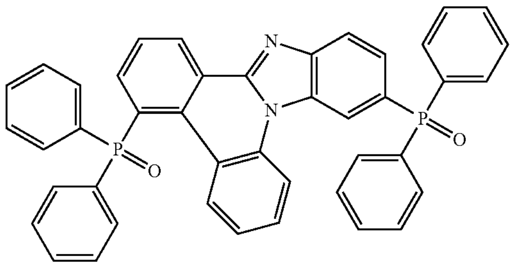
[Compound 2-21]
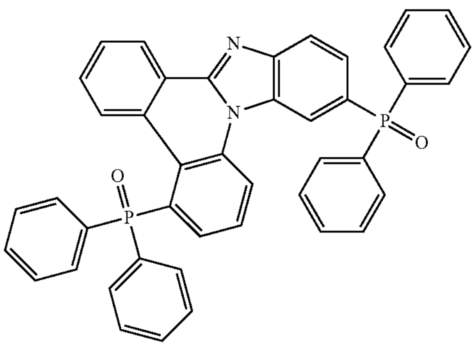
[Compound 2-22]
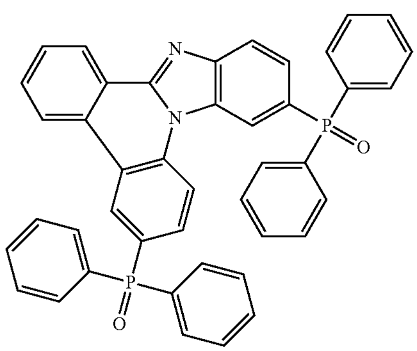
[Compound 2-23]
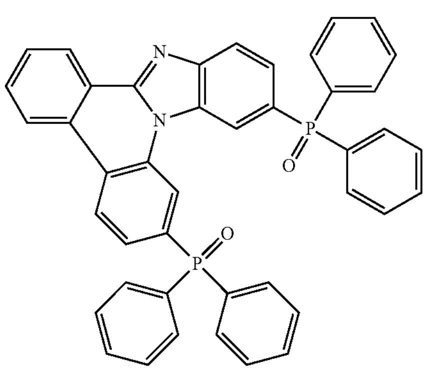
-continued
[Compound 2-24]
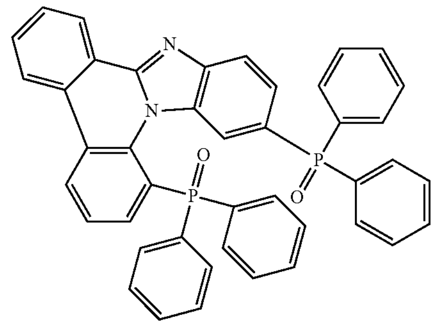
[Compound 2-25]
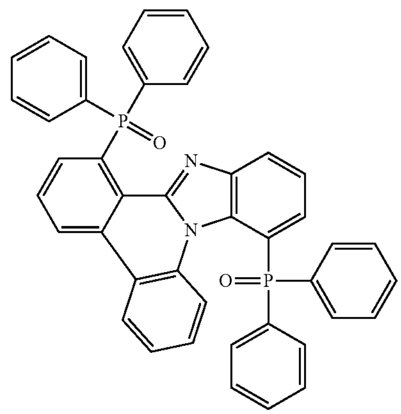
[Compound 2-26]
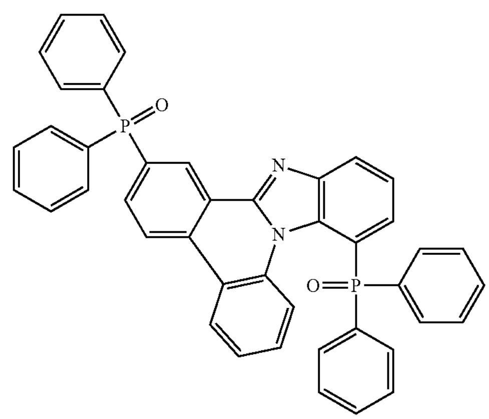
[Compound 2-27]
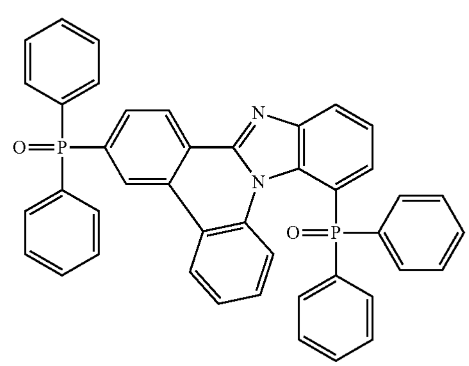

-continued
[Compound 2-28]
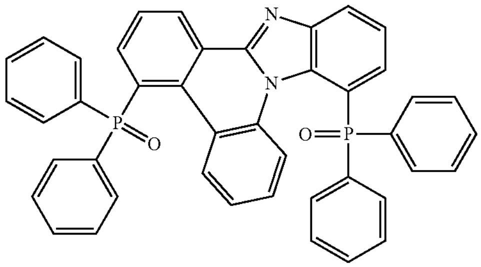
[Compound 2-29]
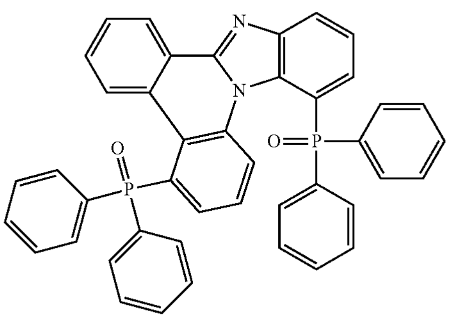
[Compound 2-30]
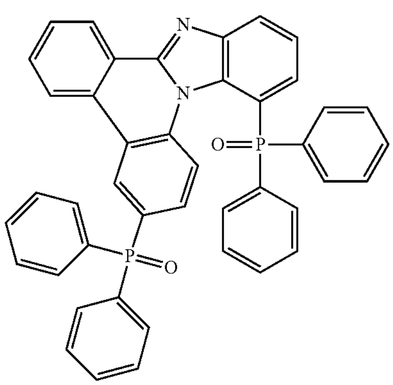
[Compound 2-31]
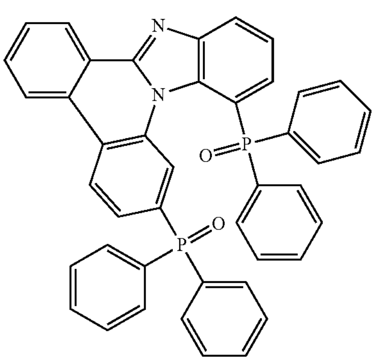
-continued
[Compound 2-32]
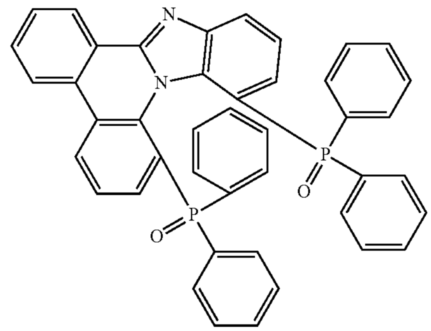
[Compound 2-33]
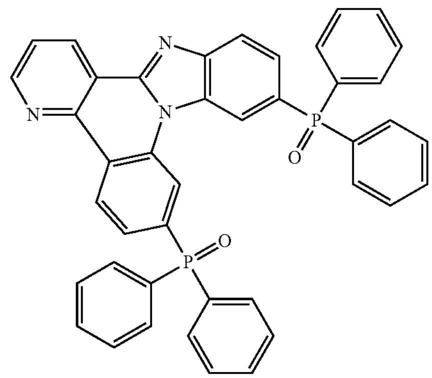
[Compound 2-34]
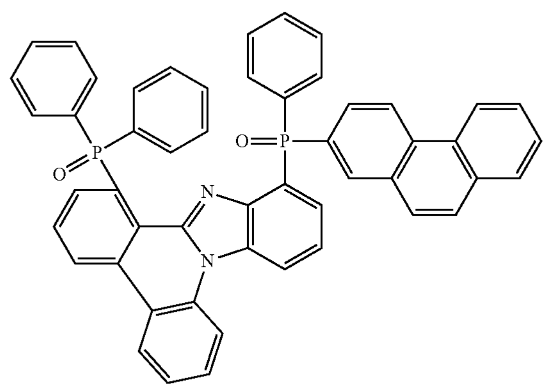
[Compound 2-35]
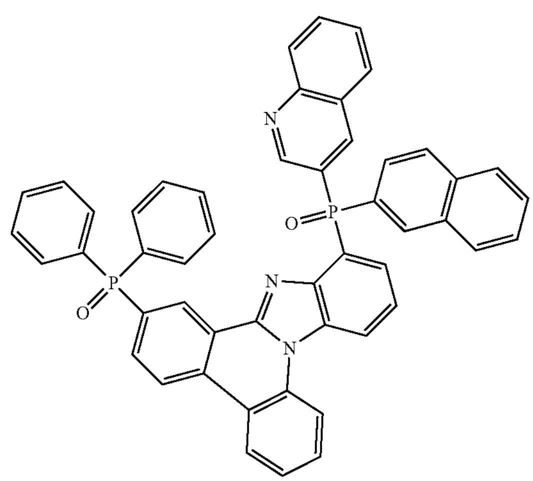

-continued
[Compound 2-36]
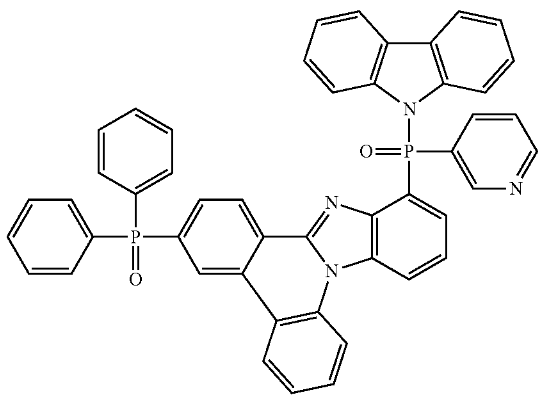
[Compound 2-37]
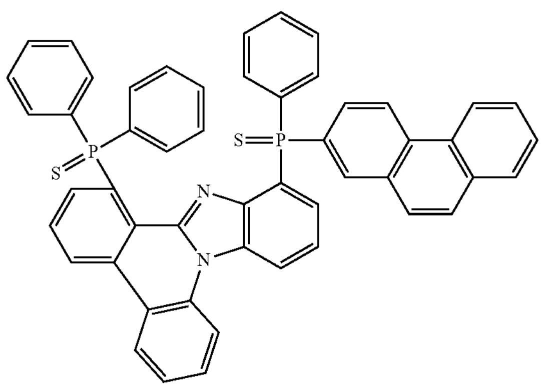
[Compound 2-38]
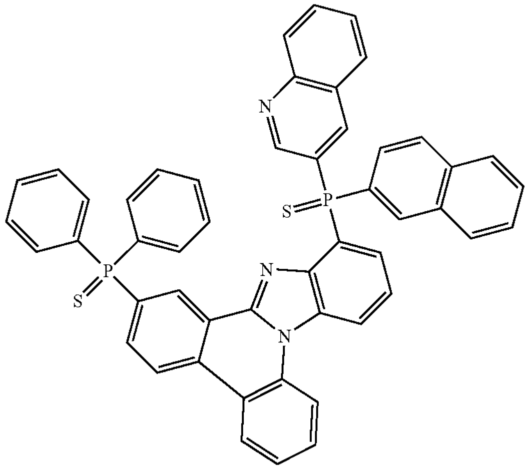
-continued
[Compound 2-39]
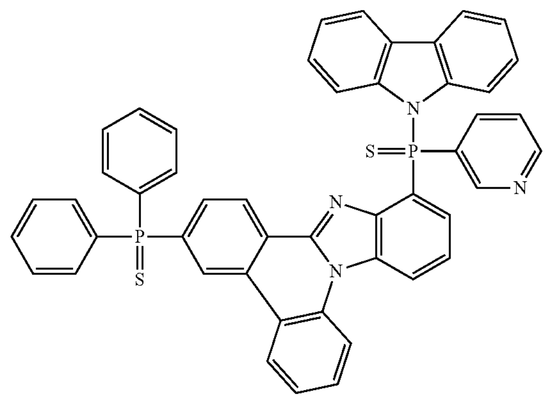
[Compound 2-40]
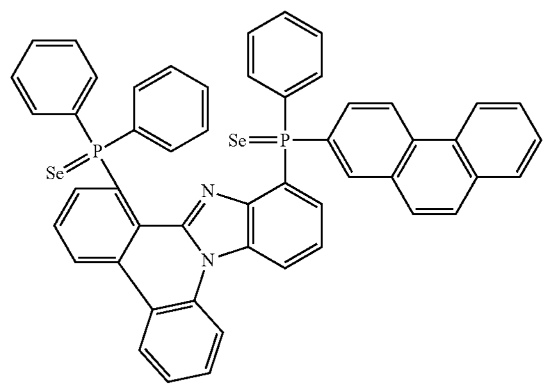
[Compound 2-41]
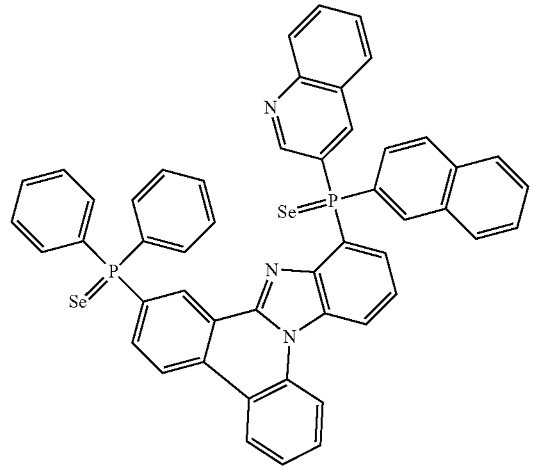

-continued
[Compound 2-42]
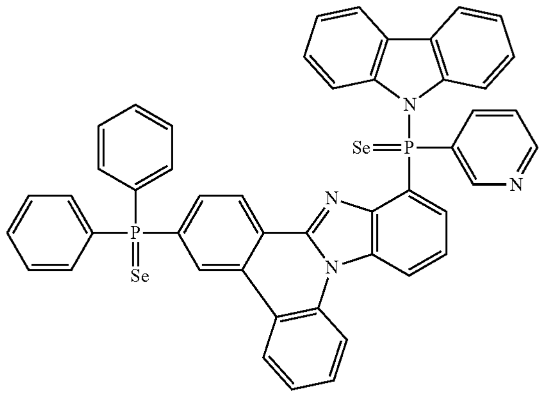
[Compound 2-43]
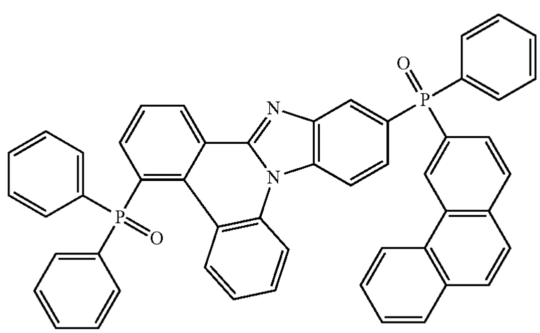
[Compound 2-44]
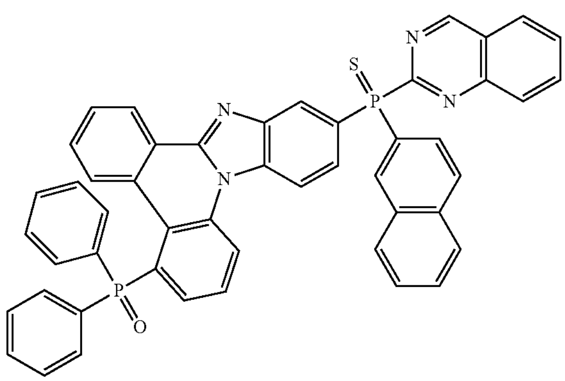
[Compound 2-45]
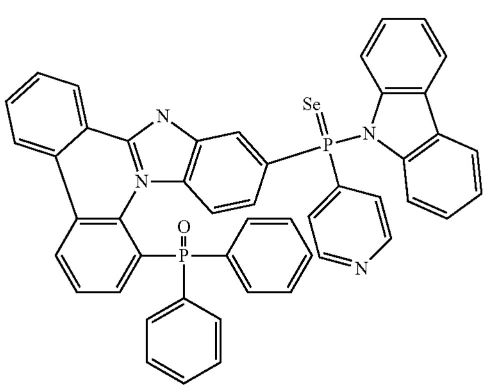
-continued
[Compound 2-46]
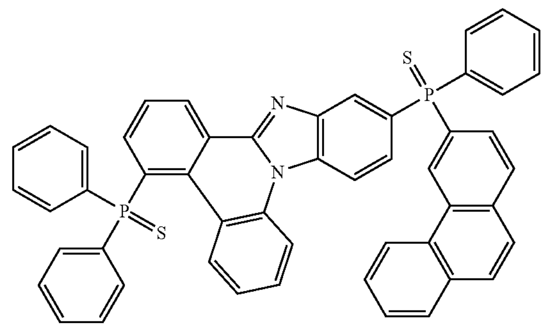
[Compound 2-47]
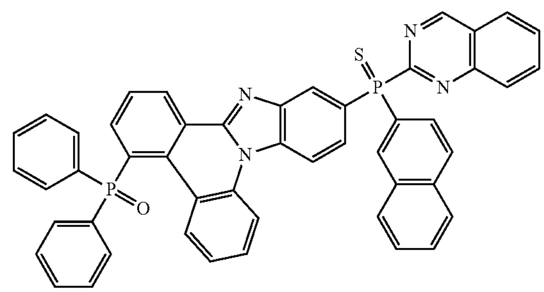
[Compound 2-48]
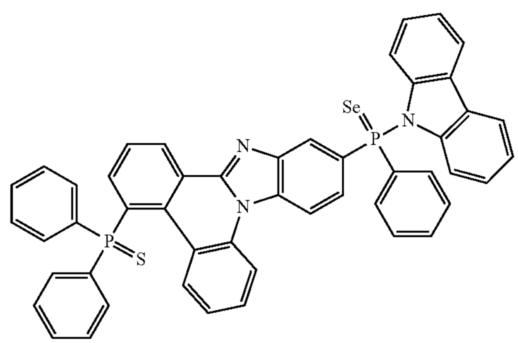
[Compound 2-49]
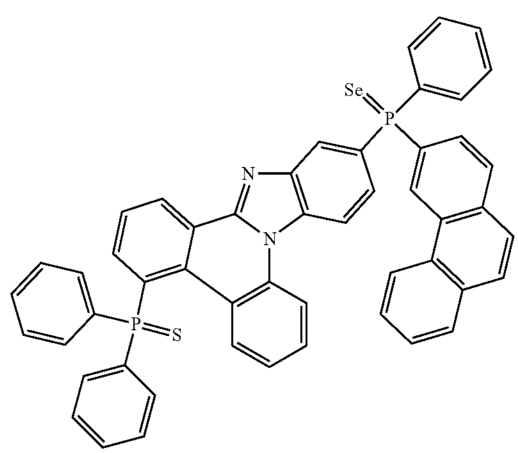

-continued
[Compound 2-50]
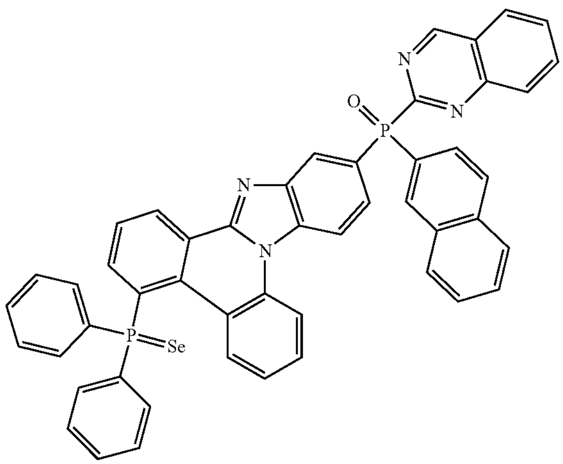
[Compound 2-51]
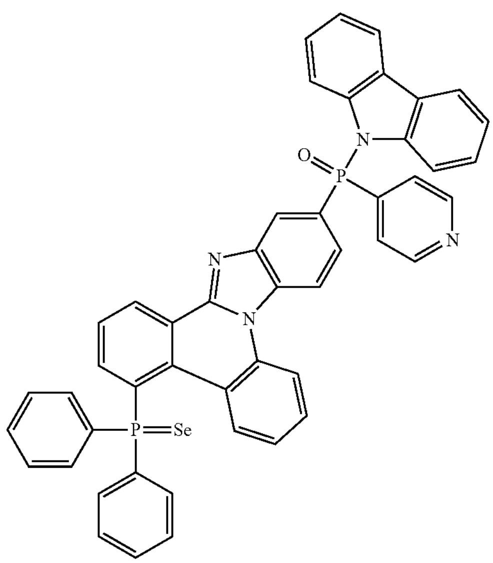
[Compound 3-1]
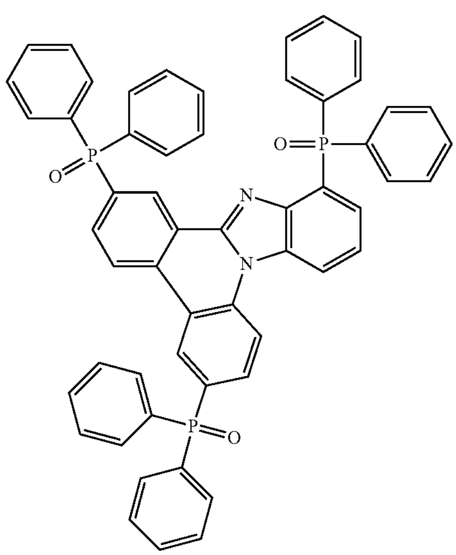
-continued
[Compound 3-2]
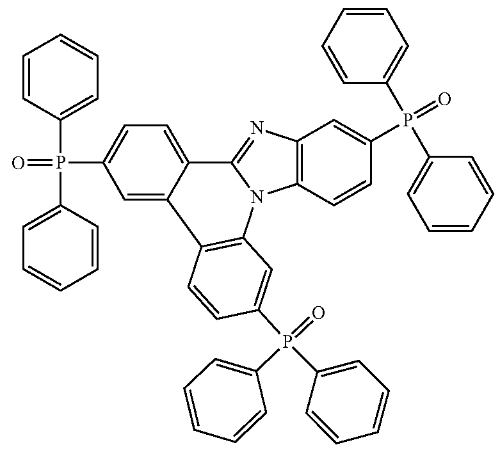
[Compound 3-3]
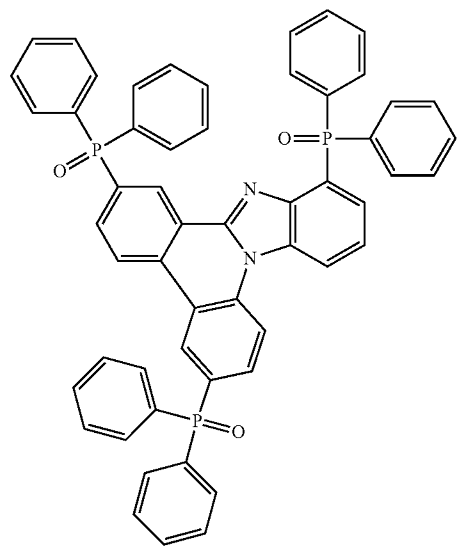
[Compound 3-4]
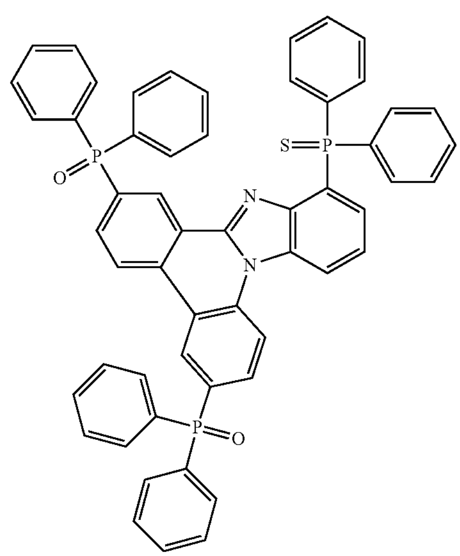

[Compound 3-5]
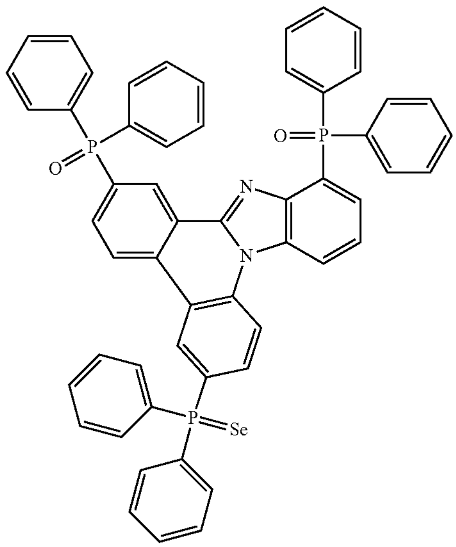
[Compound 3-6]
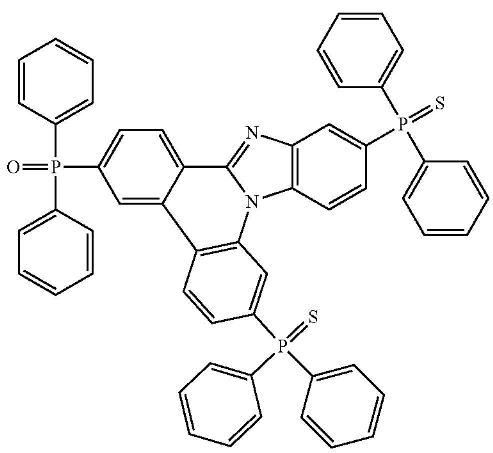
[Compound 3-7]
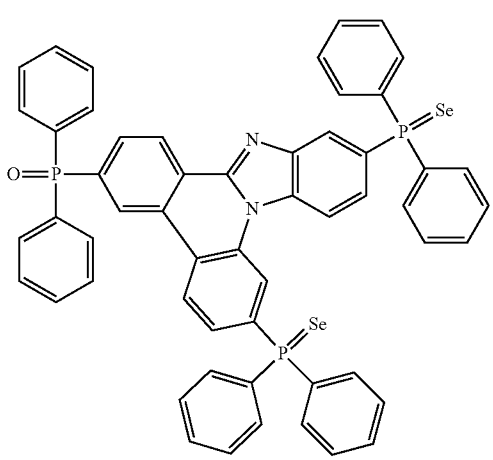
[Compoundn 3-8]
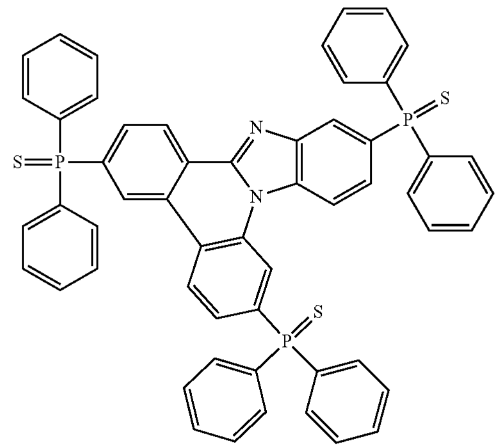
[Compound 3-9]
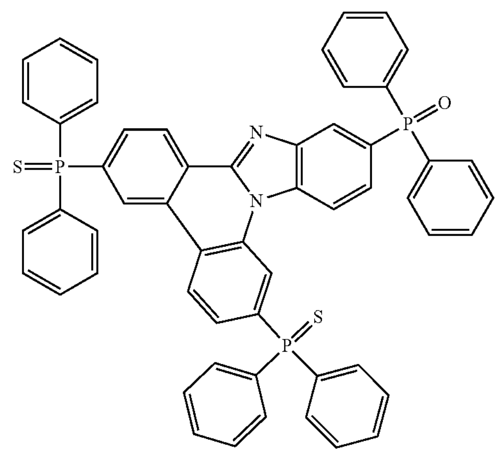
[Compound 3-10]
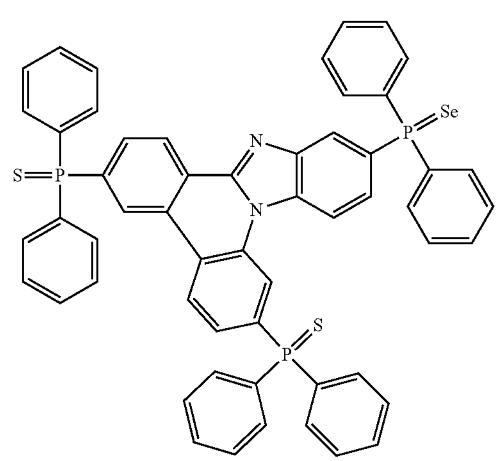

-continued
[Compound 3-11]
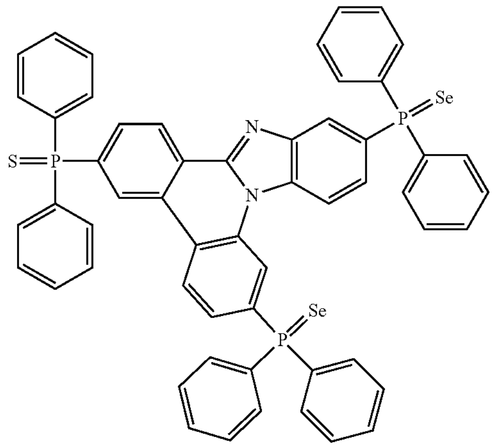
[Compound 3-12]
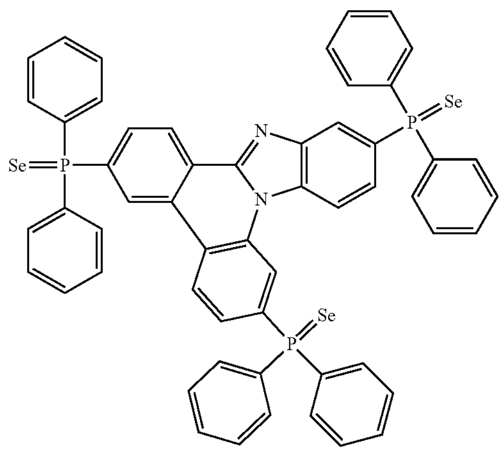
[Compound 3-13]
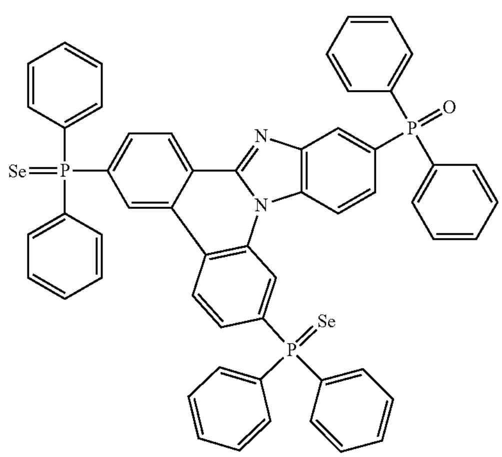
-continued
[Compound 3-14]
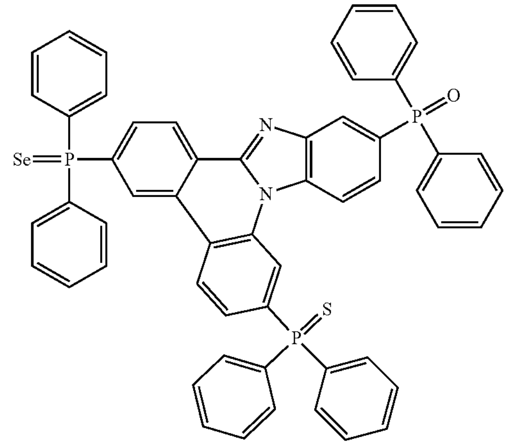
[Compound 3-15]
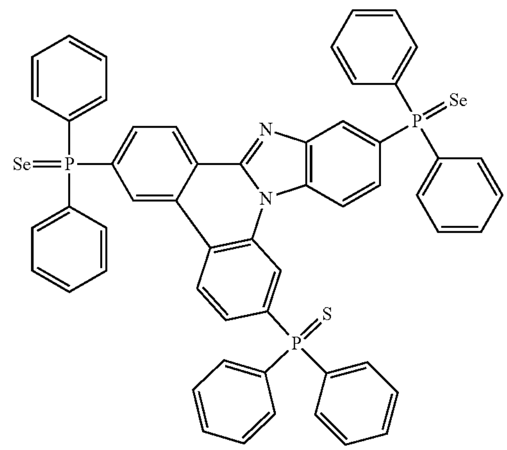
[Compound 4-1]
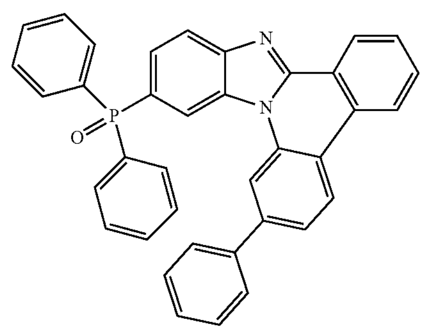
[Compound 4-2]
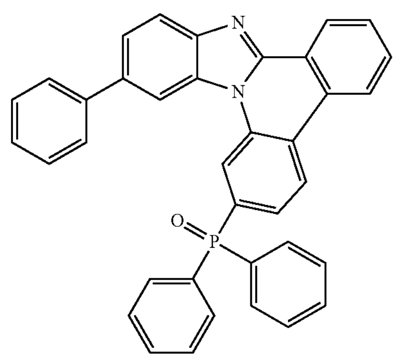

[Compound 4-3]
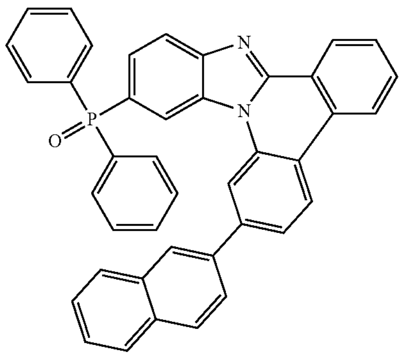
[Compound 4-4]
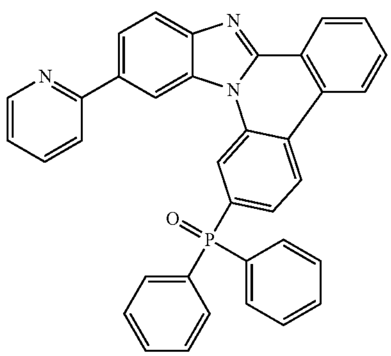
[Compound 4-5]
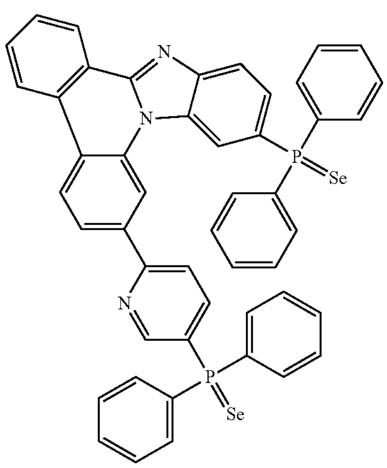
[Compound 4-6]
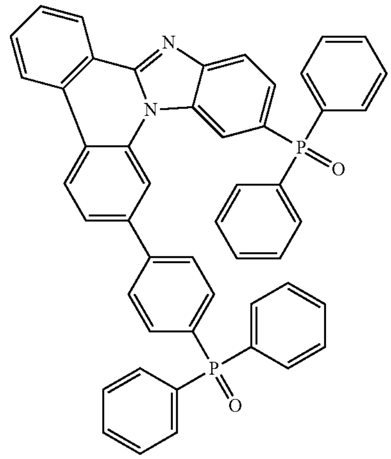
[Compound 4-7]
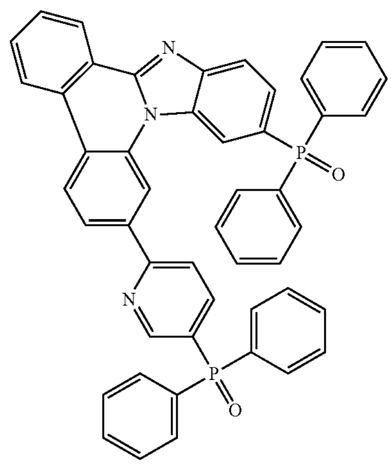
[Compound 4-8]
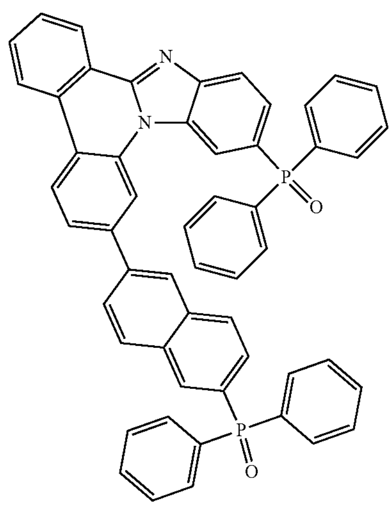

-continued
[Compound 4-9]
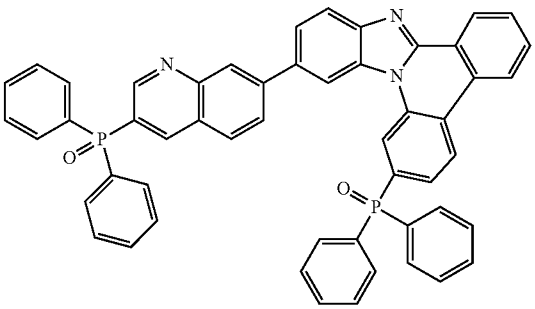
[Compound 4-10]
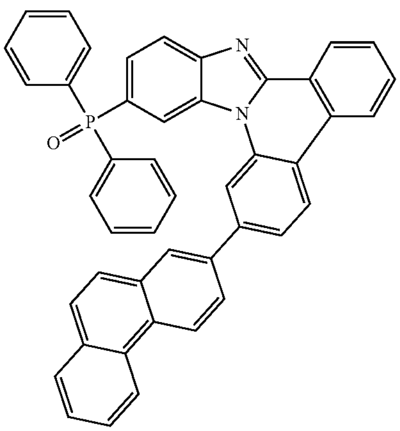
[Compound 4-11]
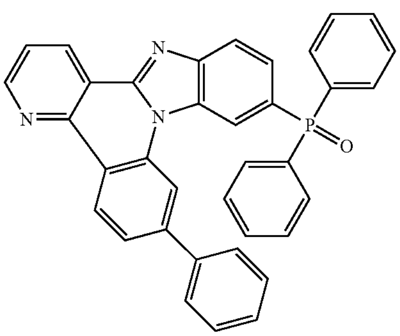
[Compound 4-12]
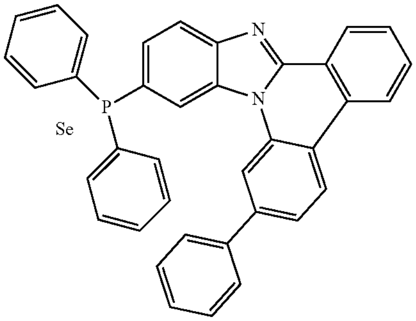
-continued
[Compound 4-13]
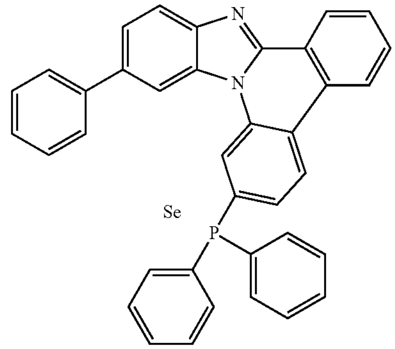
[Compound 4-14]
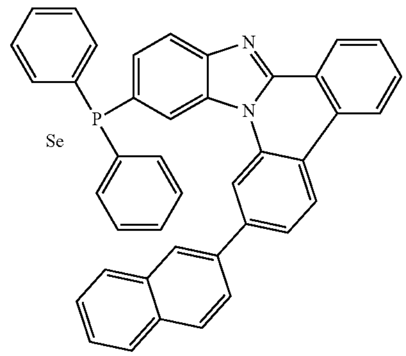
[Compound 4-15]
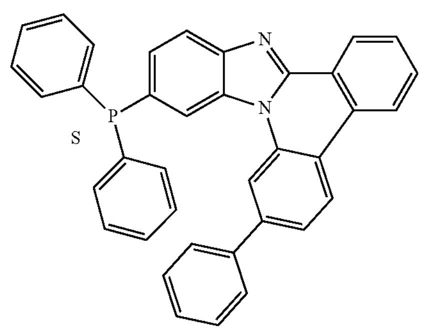
[Compound 4-16]
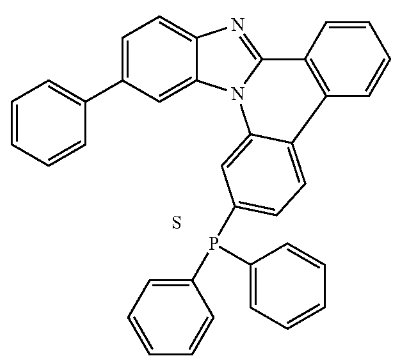

[Compound 4-17]
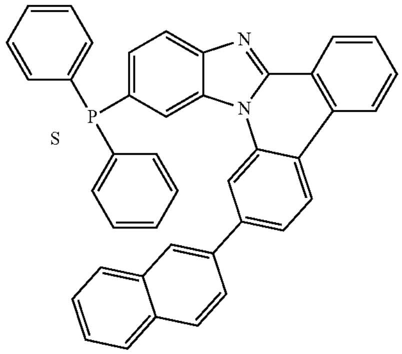
[Compound 4-18]
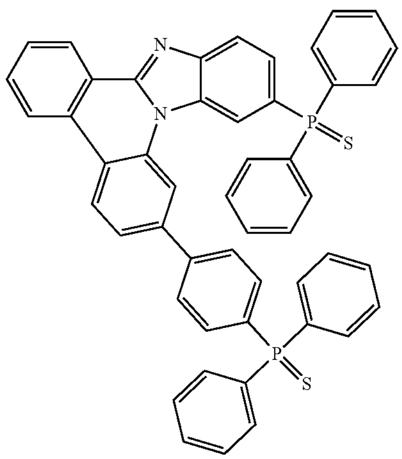
[Compound 4-19]
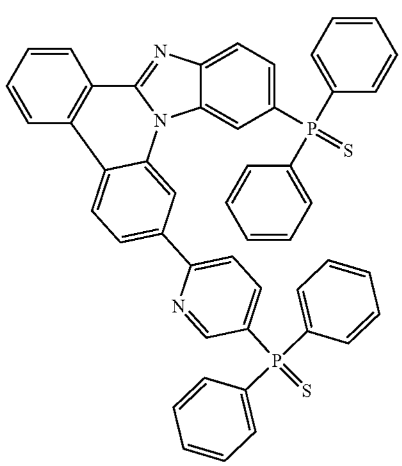
[Compound 4-20]
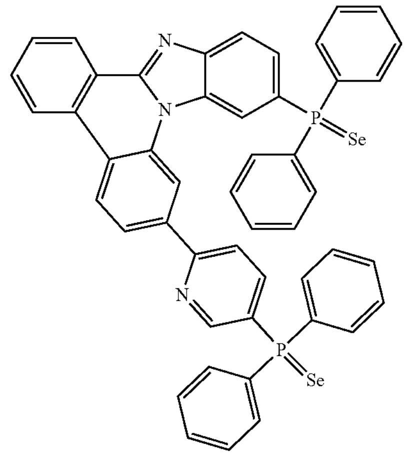
[Compound 4-21]
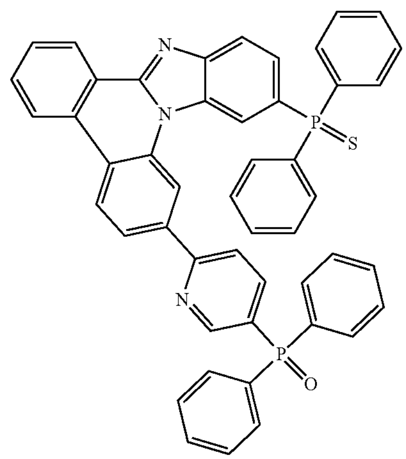
[Compound 4-22]
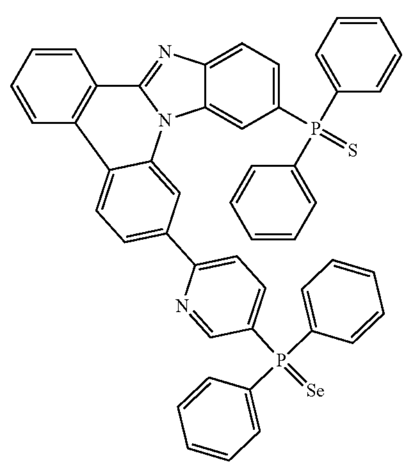

[Compound 4-23]
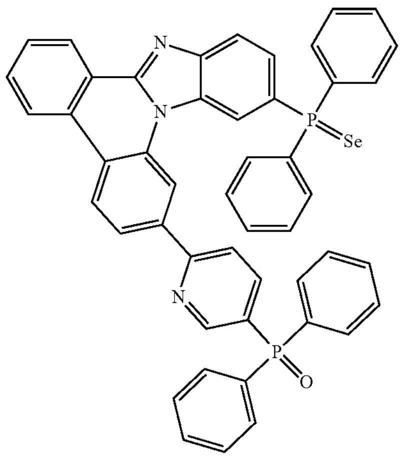
[Compound 4-24]
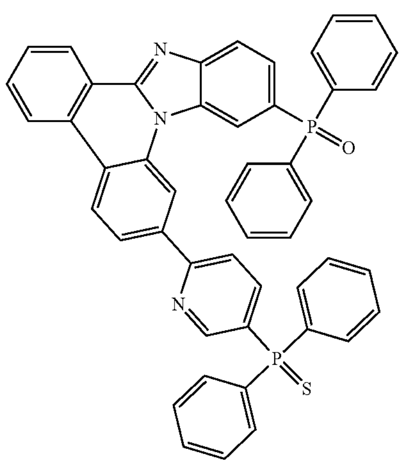
[Compound 4-25]
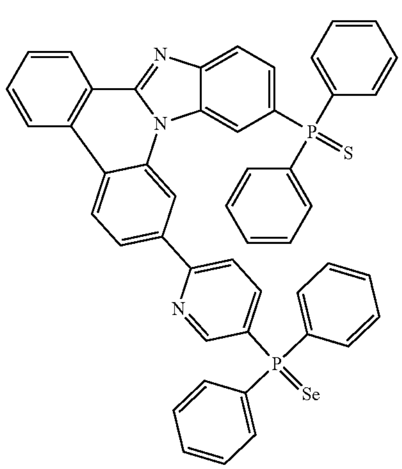
[Compound 4-26]
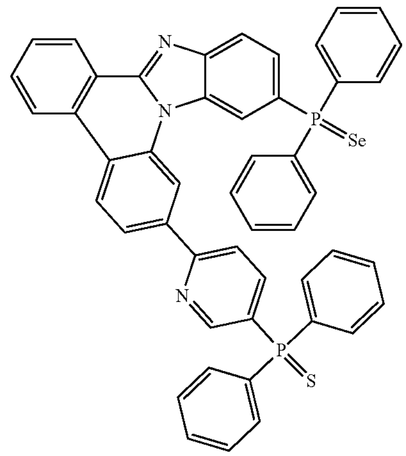
[Compound 4-27]
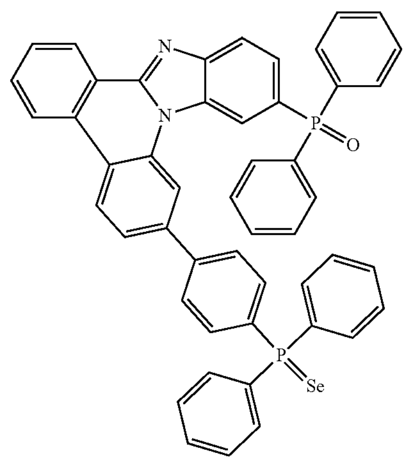
[compound 4-28]
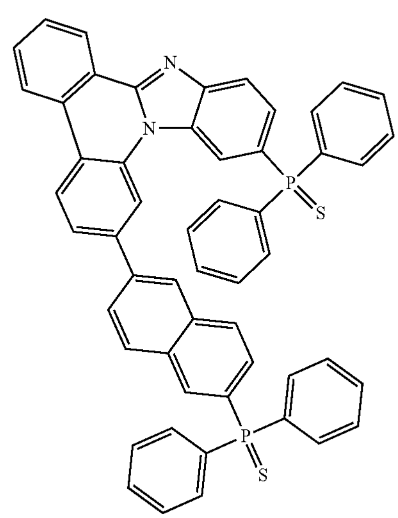

[Compound 4-29]
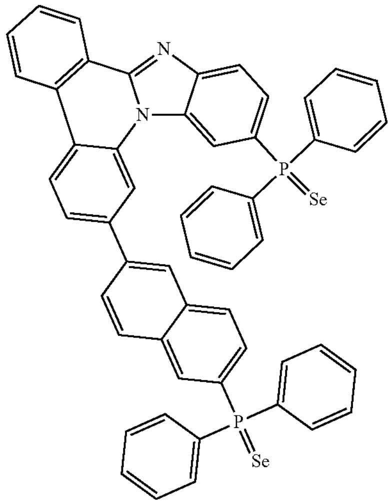
[Compound 4-30]
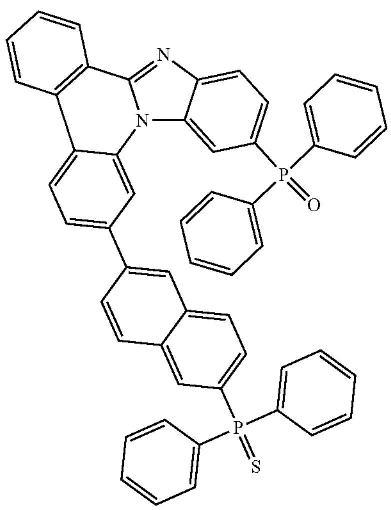
[Compound 4-31]
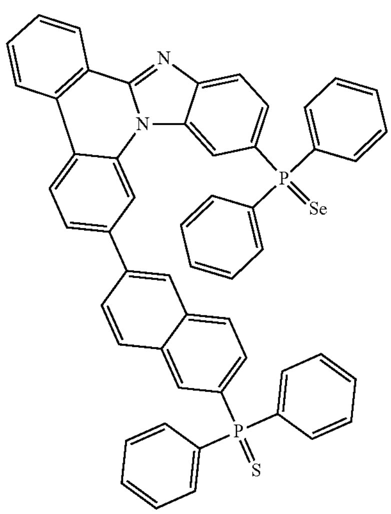
[Compound 4-32]
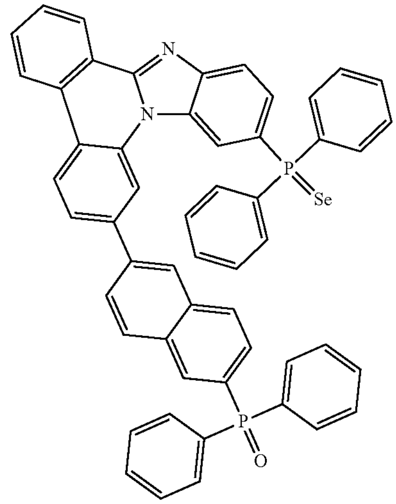
[Compound 4-33]
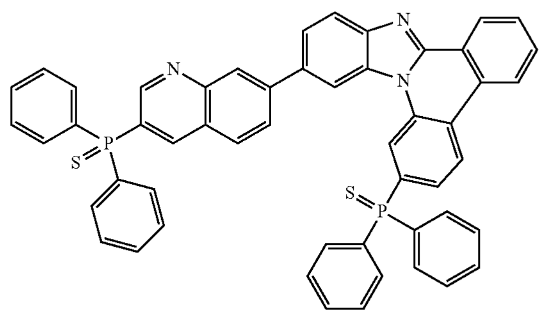
[Compound 4-34]
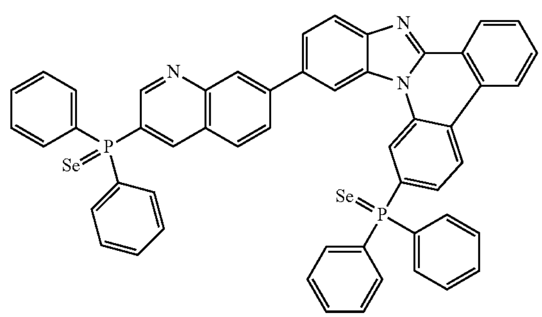
[Compound 4-35]
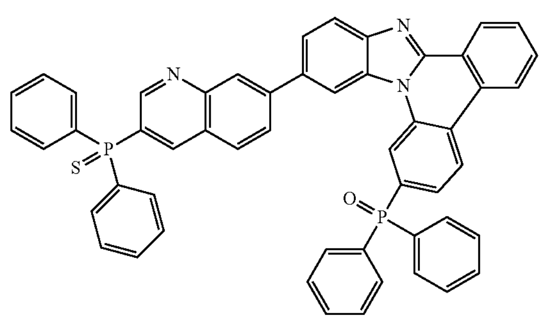

-continued
[Compound 4-36]
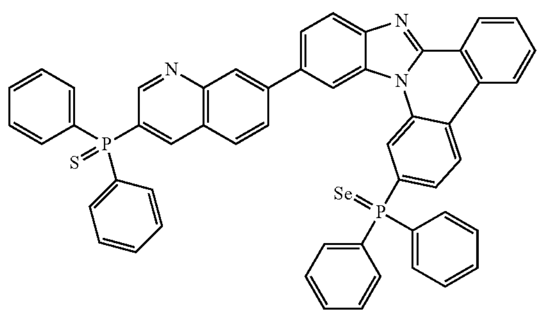
[Compound 4-37]
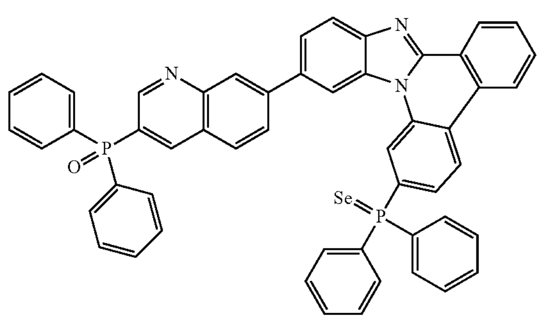
[Compound 4-38]
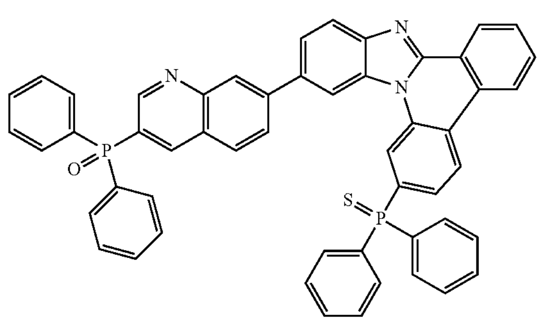
[Compound 4-39]
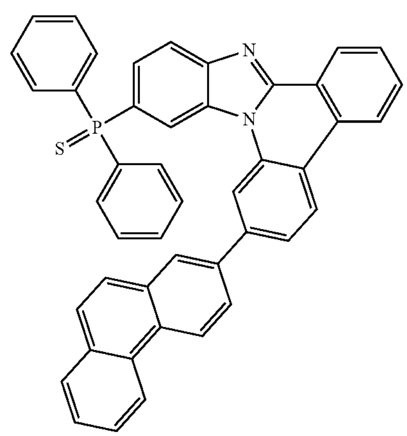
-continued
[Compound 4-40]
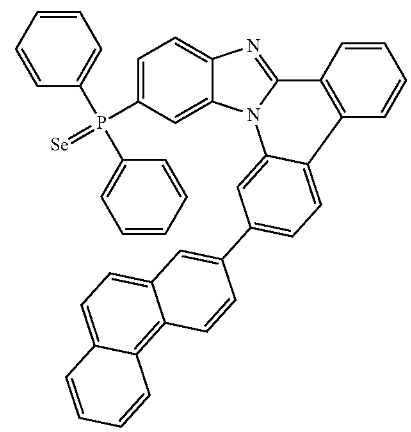
[Compound 4-41]
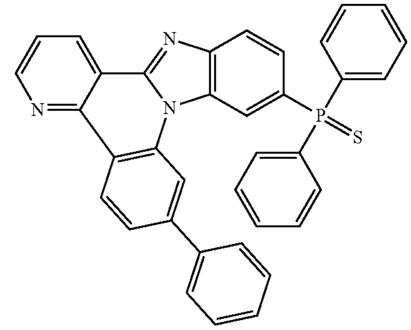
[Compound 4-42]
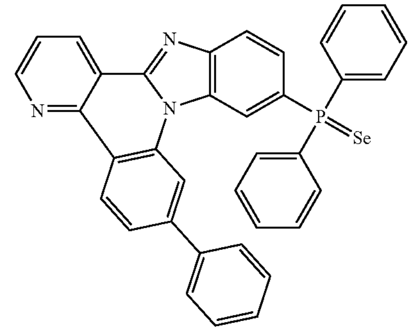

-continued
[Compound 5-1]
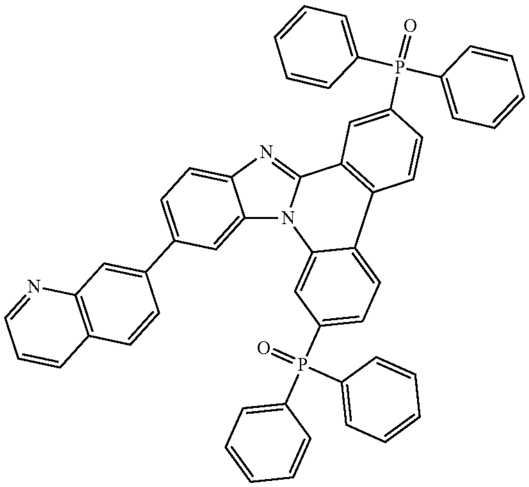
[Compound 5-2]
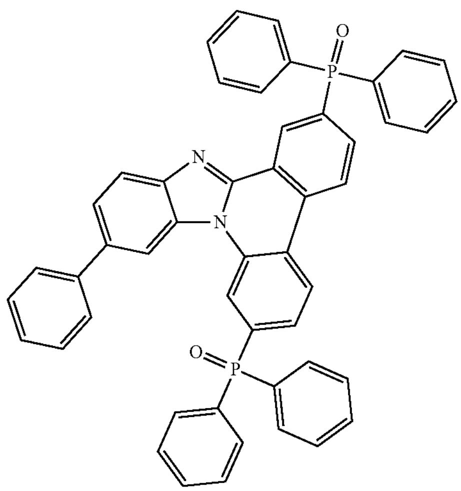
[Compound 5-3]
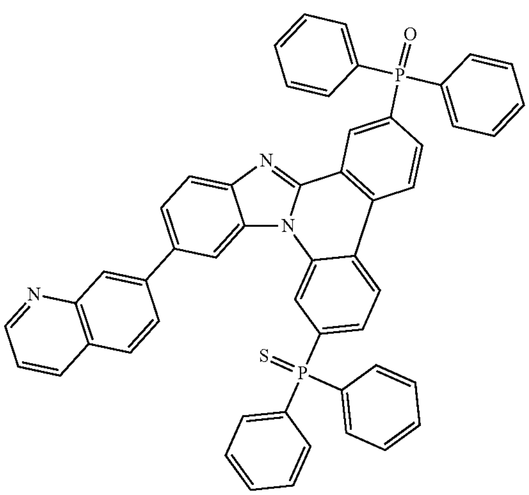
-continued
[Compound 5-4]
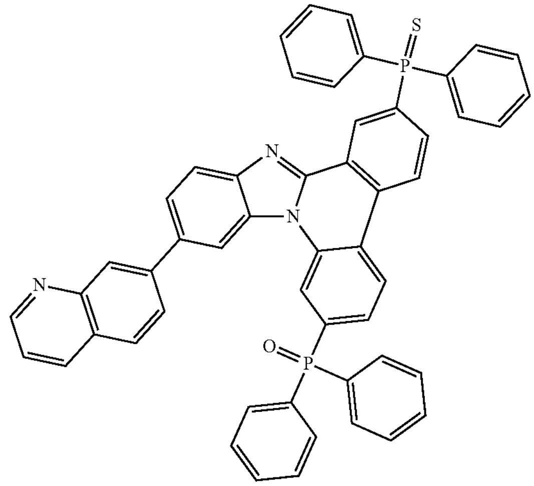
[Compound 5-5]
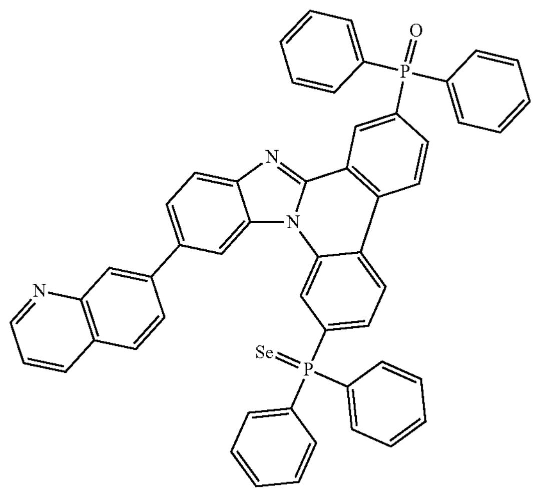
[Compound 5-6]
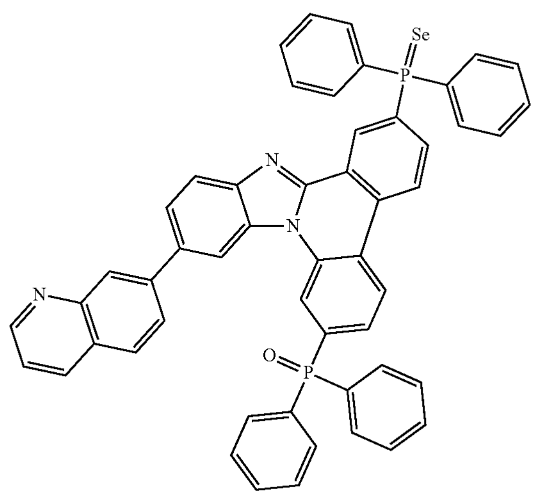

[Compound 5-7]
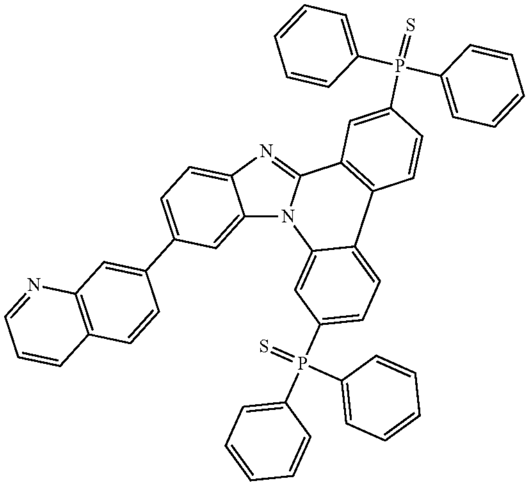
[Compound 5-8]
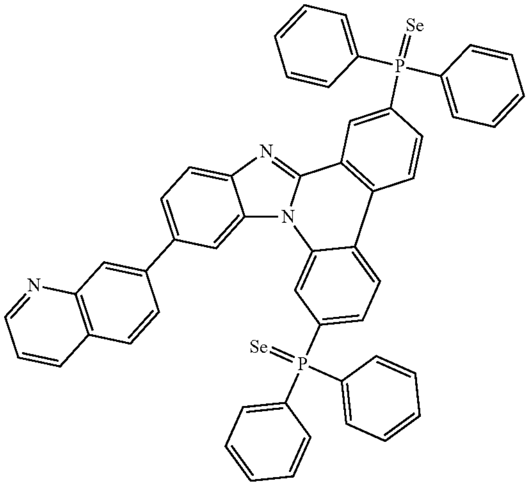
[Compound 5-9]
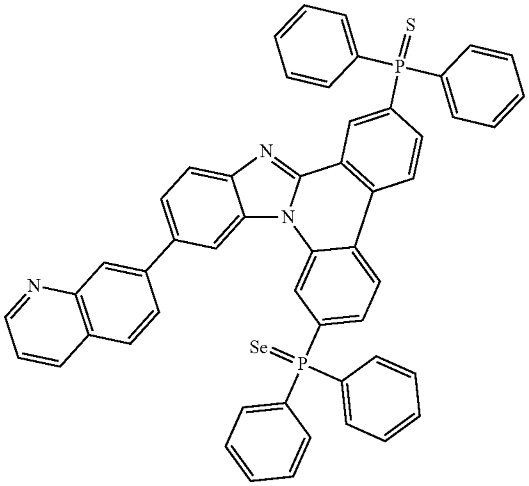
[Compound 5-10]
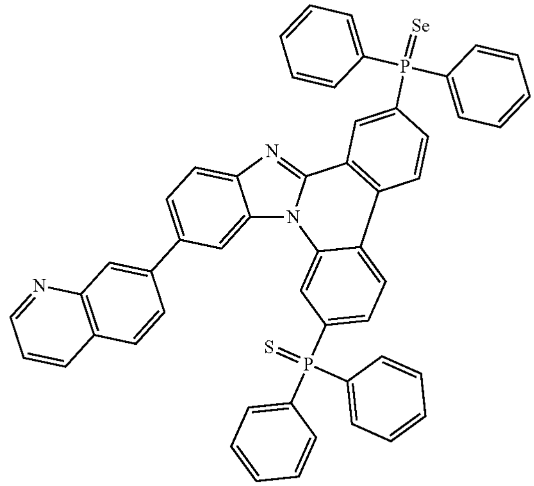
[Compound 5-11]
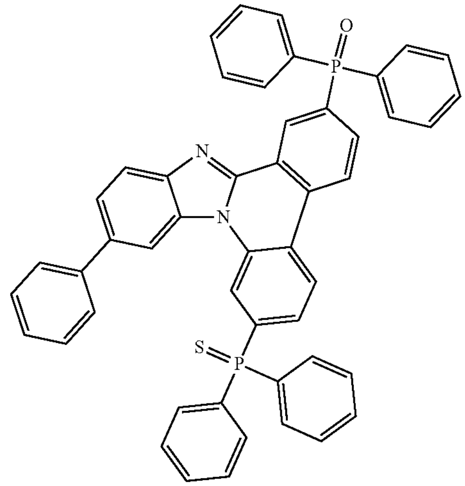
[Compound 5-12]
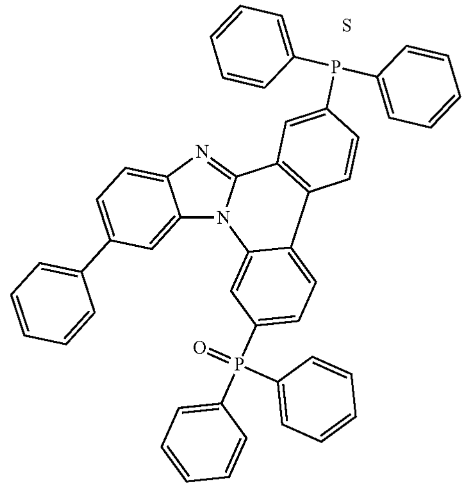

-continued
[Compound 5-13]
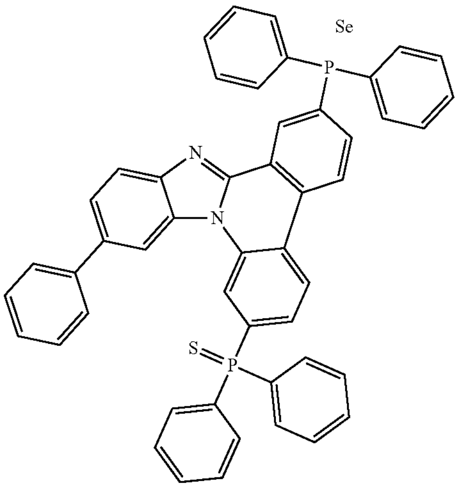
[Compound 5-14]
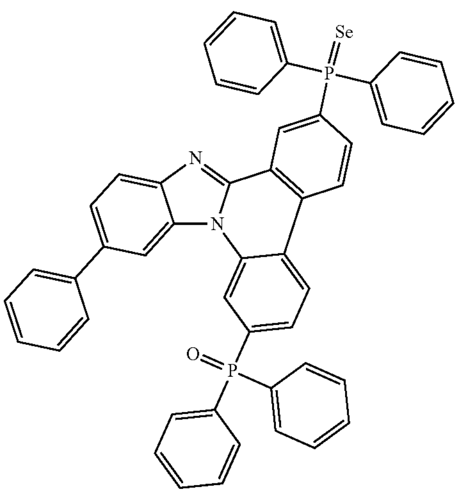
[Compound 5-15]
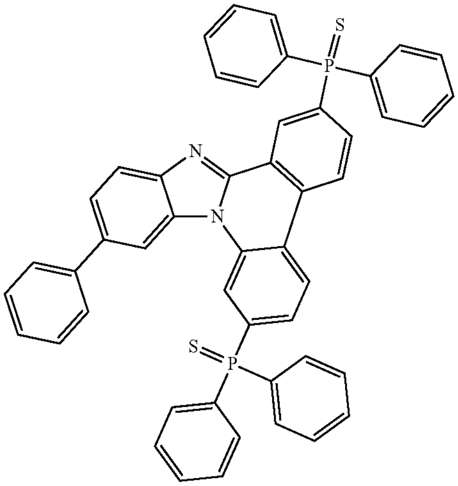
-continued
[Compound 5-16]
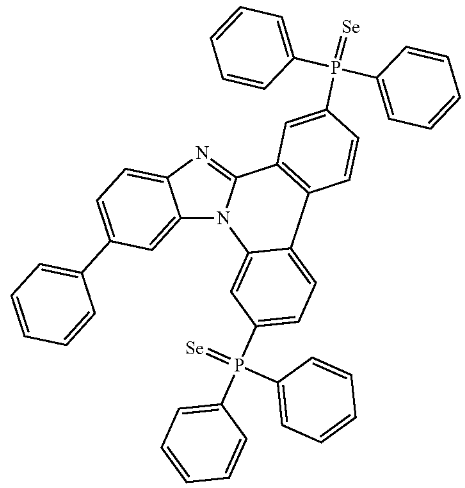
[Compound 6-1]
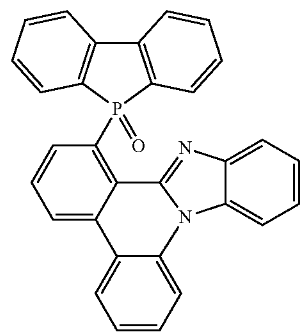
[Compound 6-2]
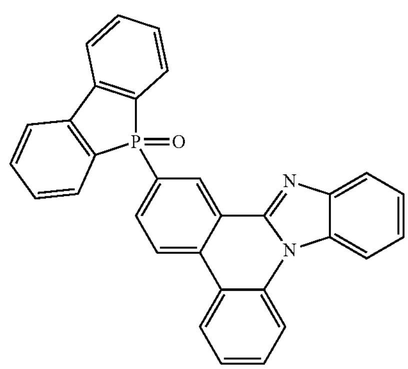
[Compound 6-3]
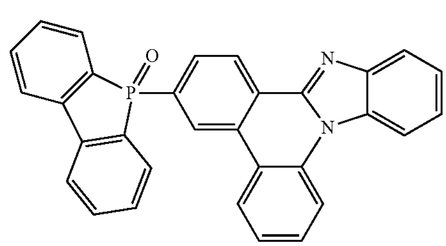

-continued
[Compound 6-4]
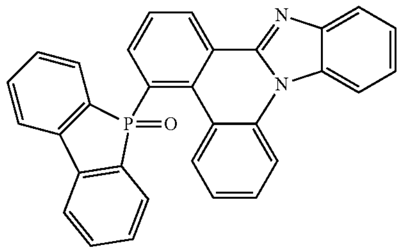
[Compound 6-5]
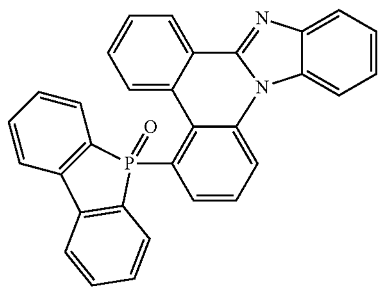
[Compound 6-6]
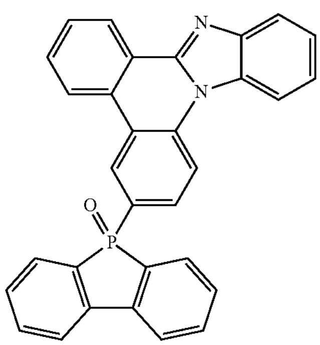
[Compound 6-7]
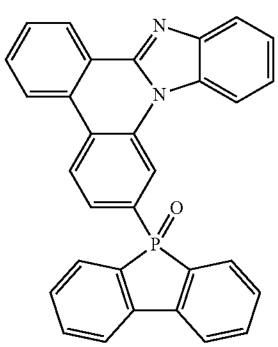
[Compound 6-8]
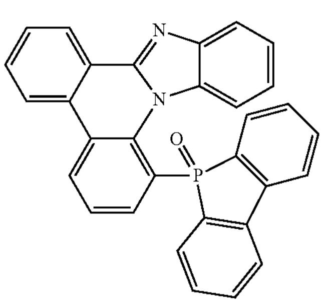
-continued
[Compound 6-9]
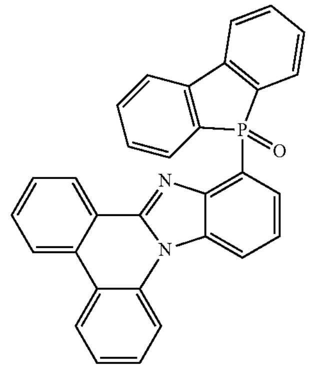
[Compound 6-10]
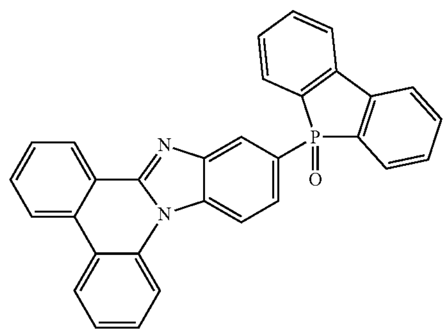
[Compound 6-11]
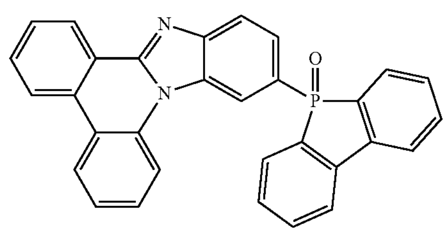
[Compound 6-12]
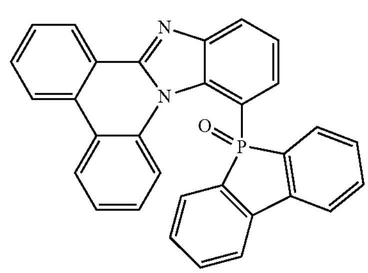
[Compound 6-13]
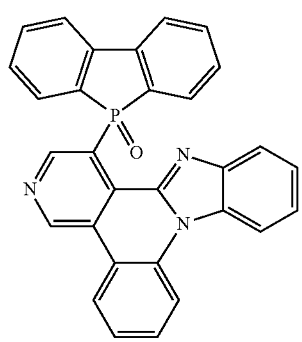

-continued
[Compound 6-14]
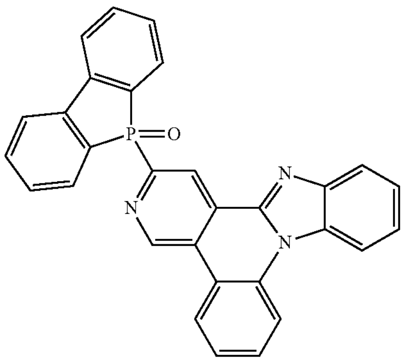
[Compound 6-15]
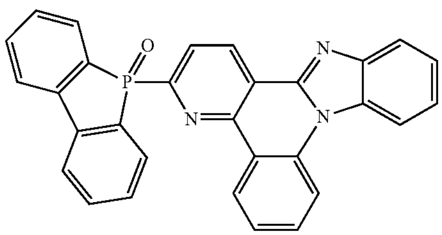
[Compound 6-16]
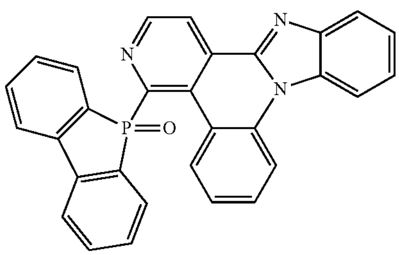
[Compound 6-17]
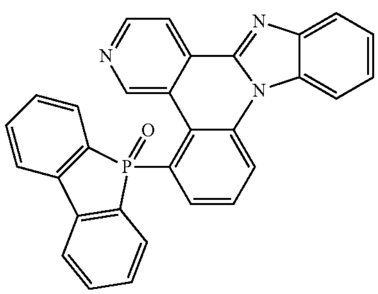
[Compound 6-18]
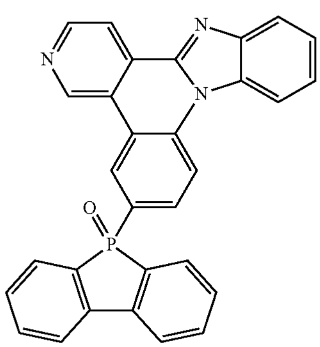
-continued
[Compound 6-19]
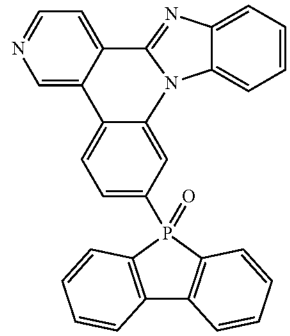
[Compound 6-20]
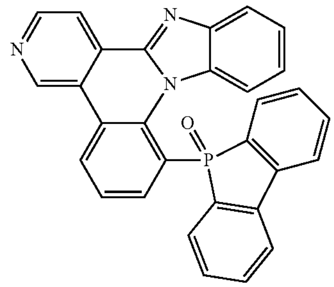
[Compound 6-21]
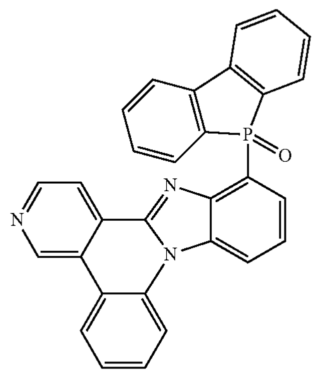
[Compound 6-22]
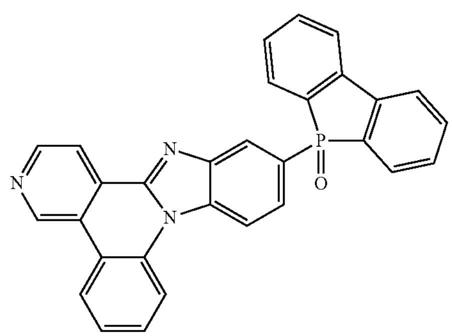
[Compound 6-23]
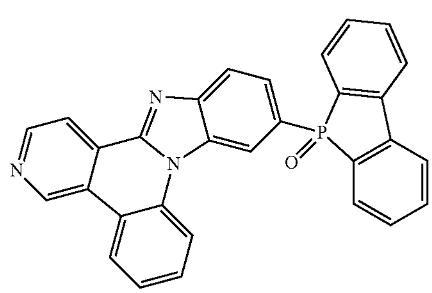

-continued
[Compound 6-24]
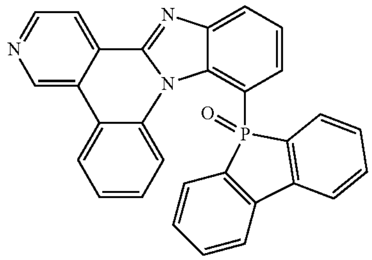
[Compound 6-25]
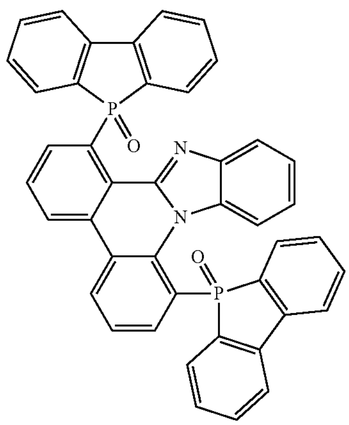
[Compound 6-26]
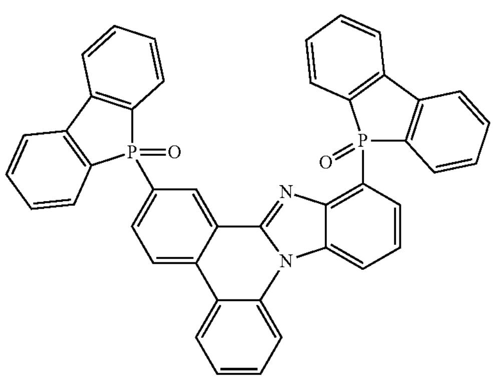
[Compound 6-27]
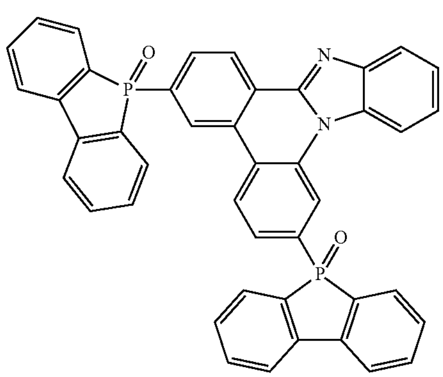
-continued
[Compound 6-28]
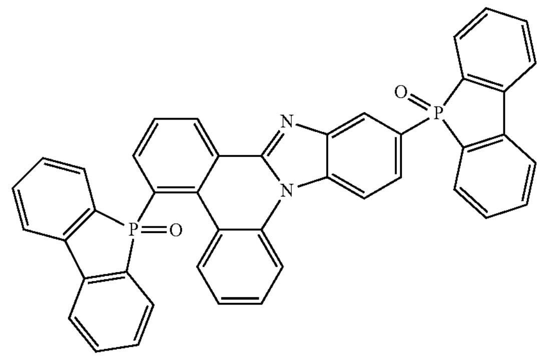
[Compound 6-29]
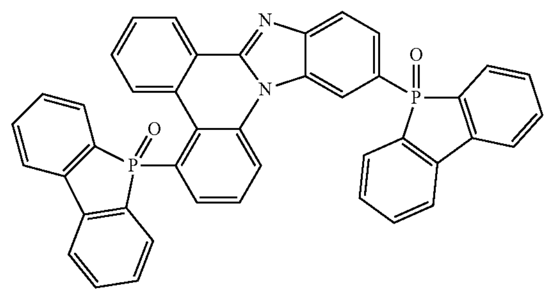
[Compound 6-30]
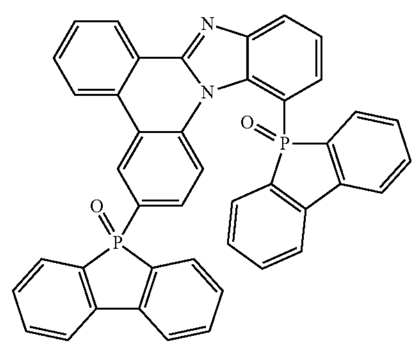
[Compound 6-31]
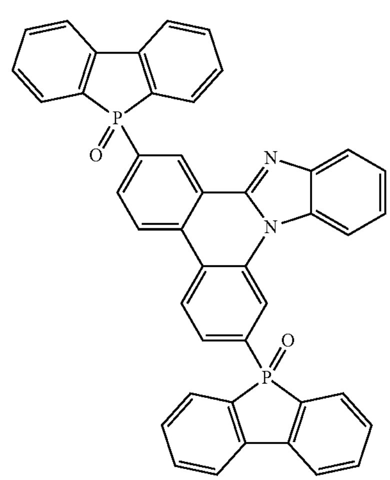

-continued
[Compound 6-32]
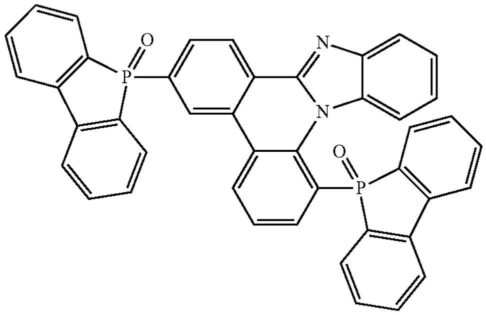
[Compound 6-33]
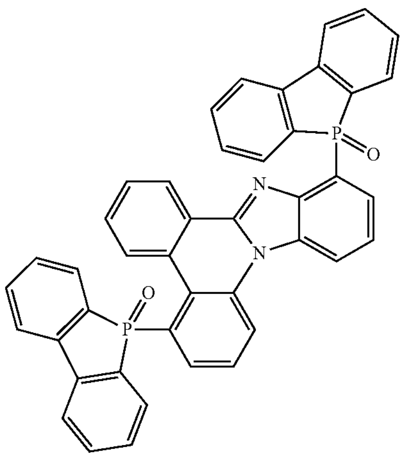
[Compound 6-34]
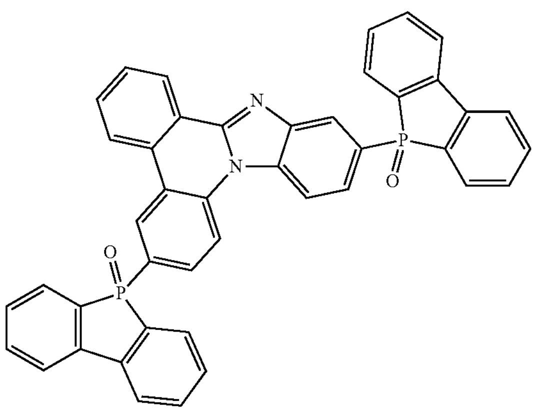
[Compound 6-35]
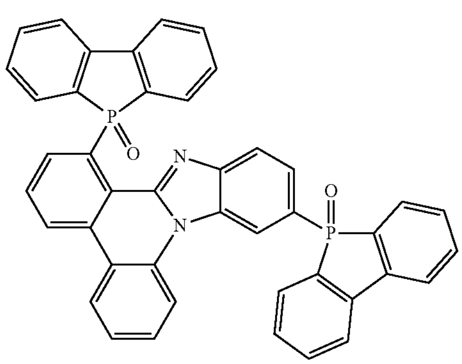
-continued
[Compound 6-36]
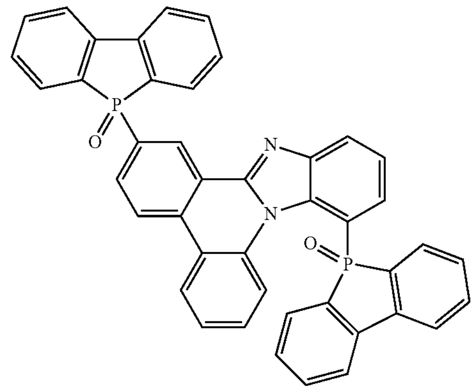
[Compound 6-37]
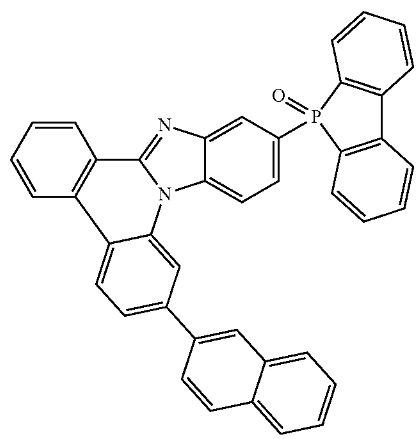
[Compound 6-38]
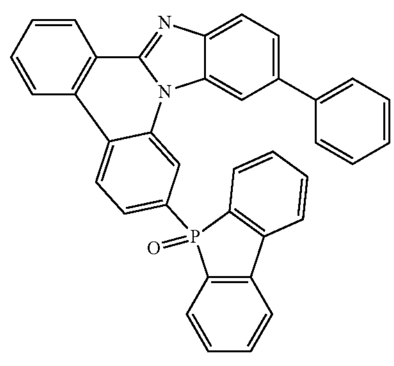
[Compound 6-39]
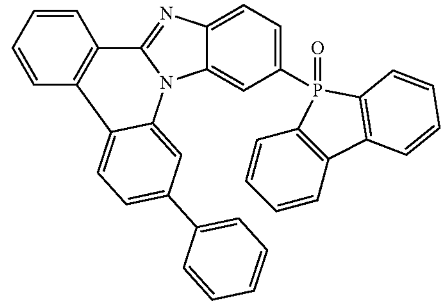

[Compound 6-40]
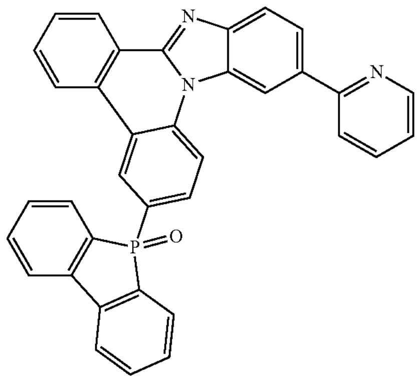
[Compound 6-41]
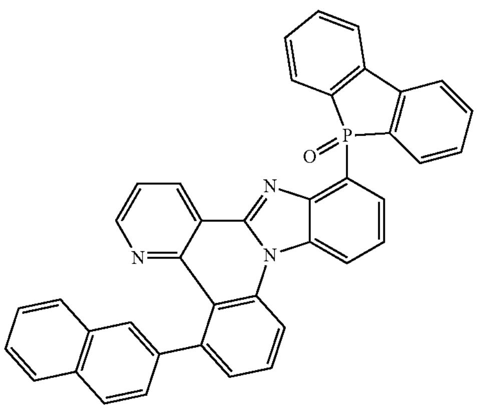
[Compound 6-42]
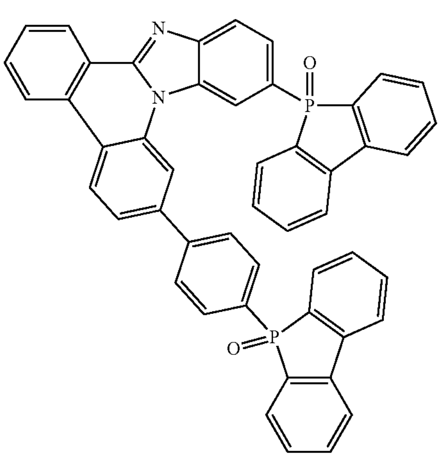
[Compound 6-43]
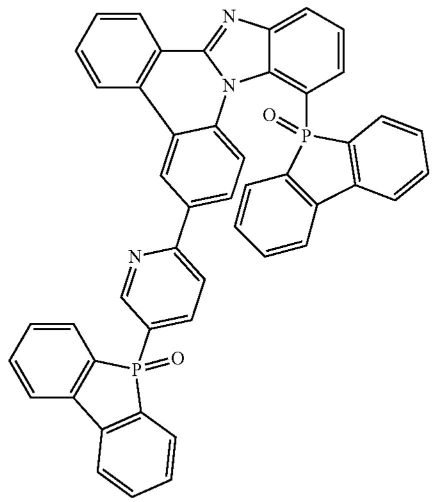
[Compound 6-44]
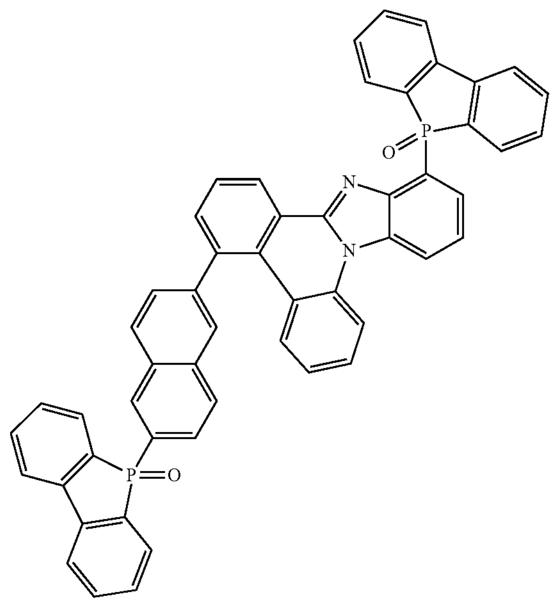
[Compound 6-45]
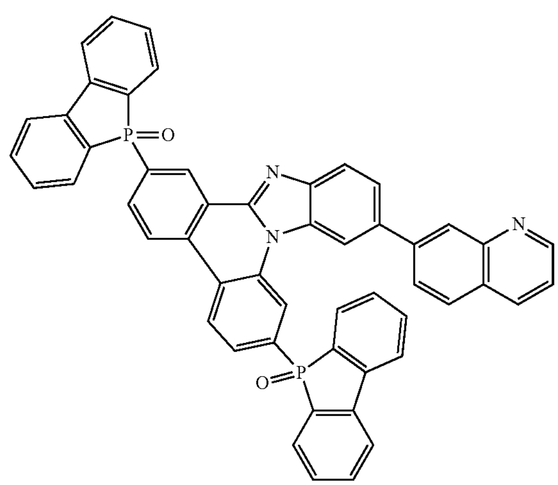

-continued
[Compound 6-46]
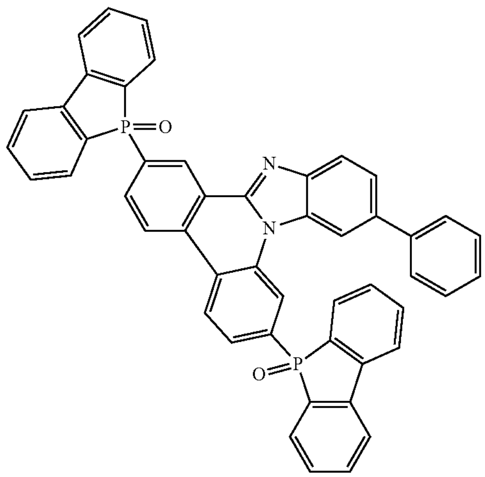
[Compound 6-47]
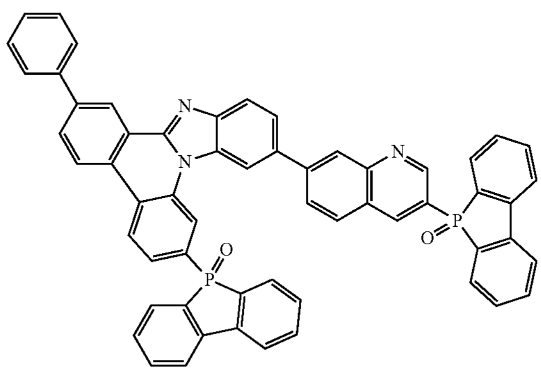
[Compound 6-48]
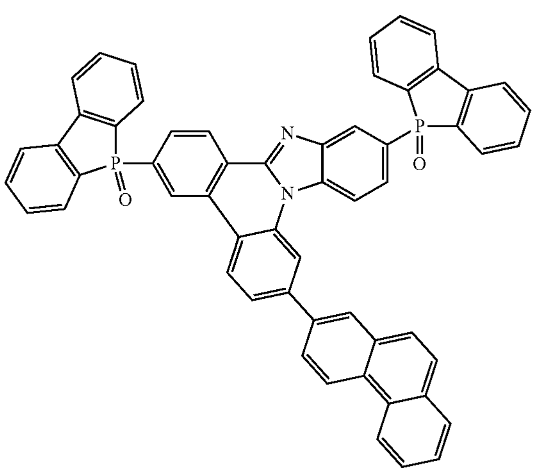
-continued
[Compound 6-49]
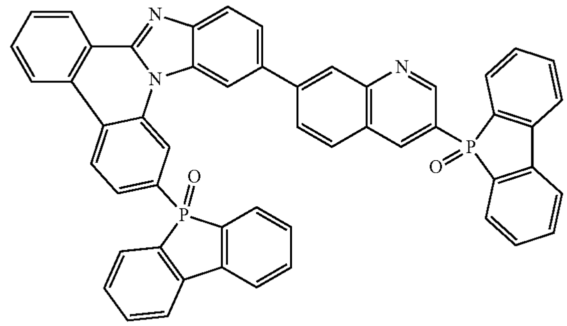
[Compound 6-50]
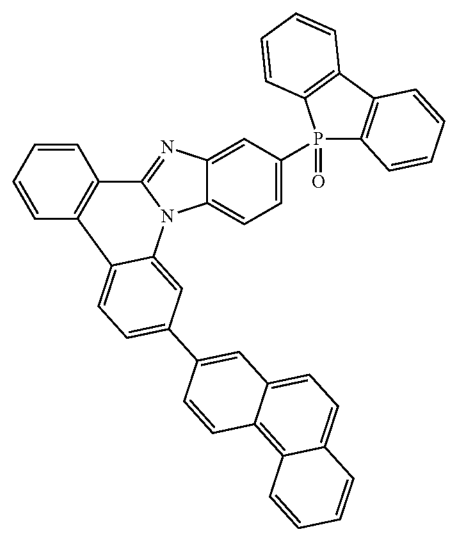
[Compound 6-51]
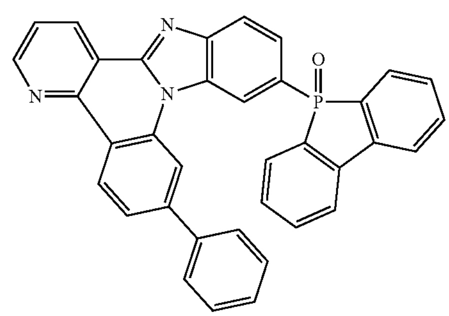

[Compound 6-52]
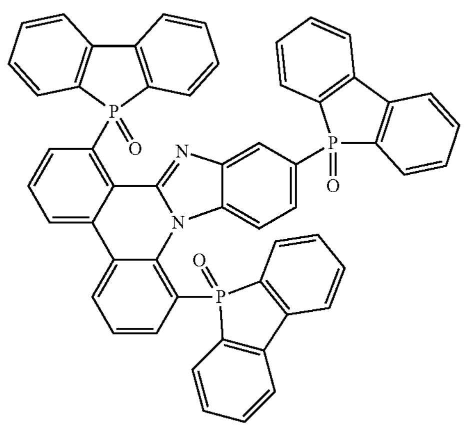
[Compound 6-53]
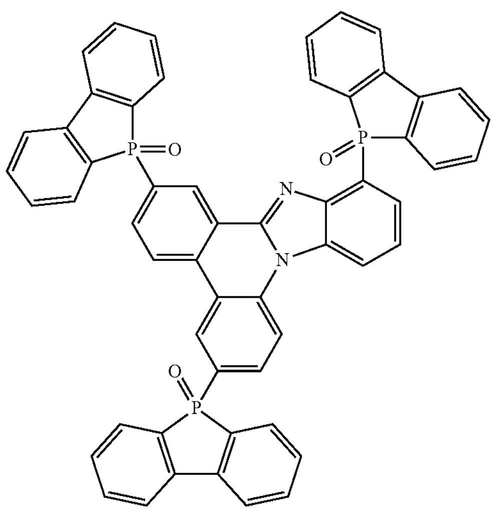
[Compound 7-1]
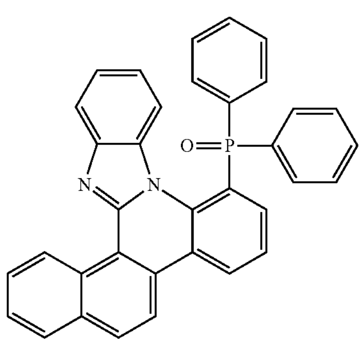
[Compound 7-2]
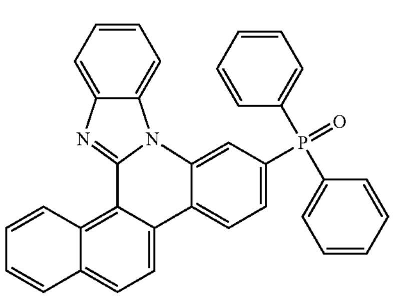
[Compound 7-3]
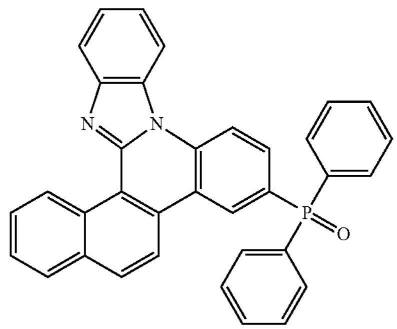
[Compound 7-4]
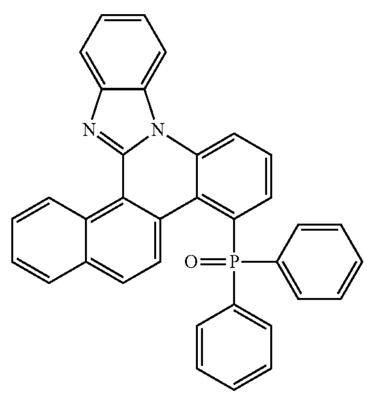
[Compound 7-5]
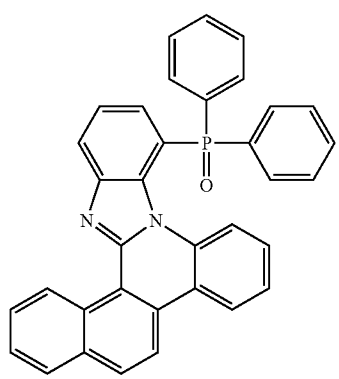
[Compound 7-6]
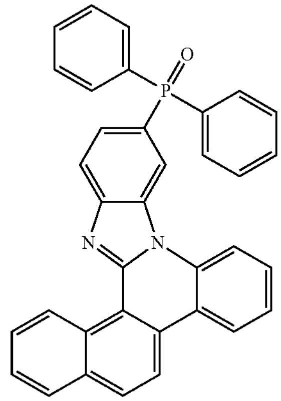

-continued
[Compound 7-7]
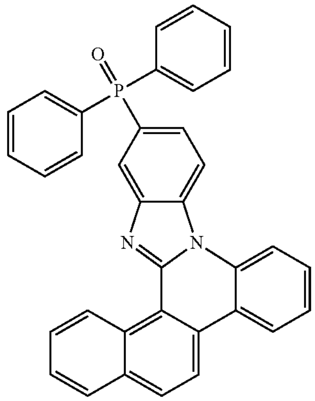
[Compound 7-8]
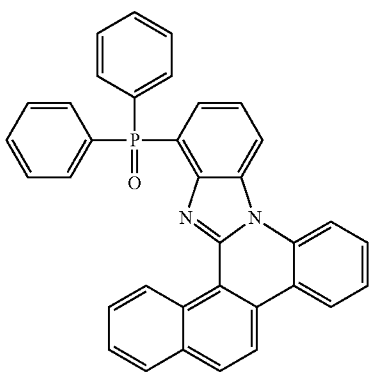
[Compound 7-9]
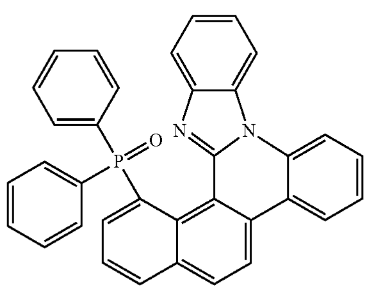
[Compound 7-10]
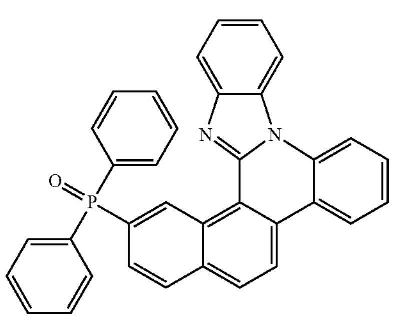
-continued
[Compound 7-11]
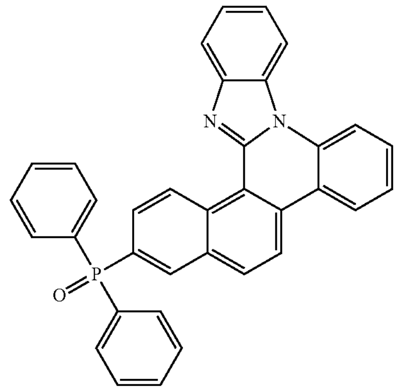
[Compound 7-12]
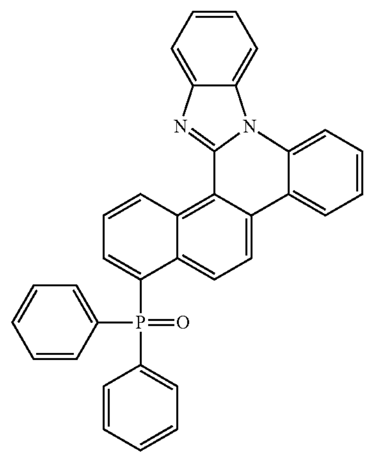
[Compound 7-13]
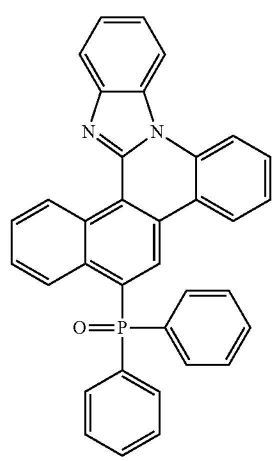

-continued
[Compound 7-14]
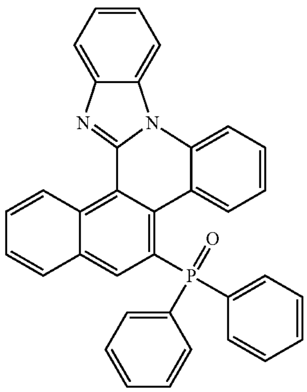
[Compound 7-15]
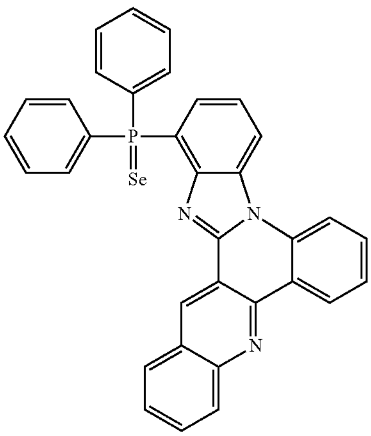
[Compound 7-16]
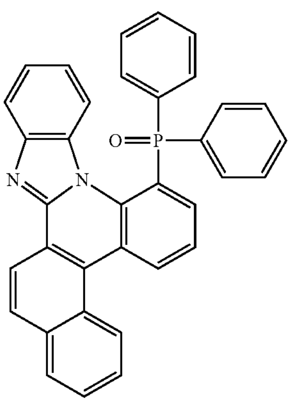
[Compound 7-17]
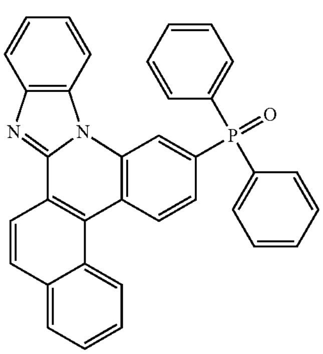
-continued
[Compound 7-18]
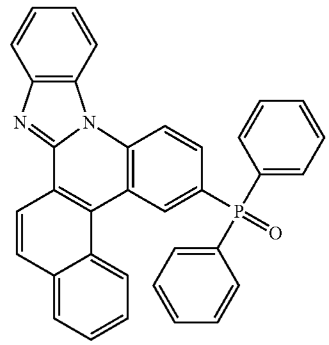
[Compound 7-19]
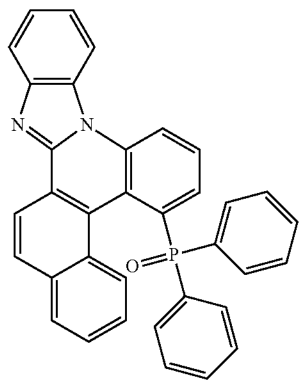
[Compound 7-20]
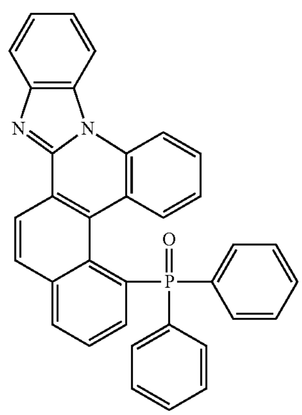
[Compound 7-21]
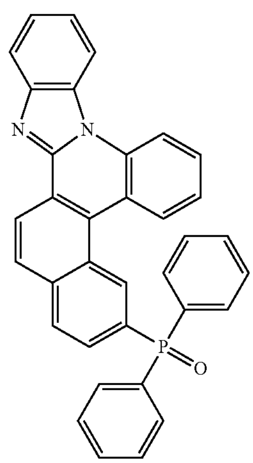

-continued
[Compound 7-22]
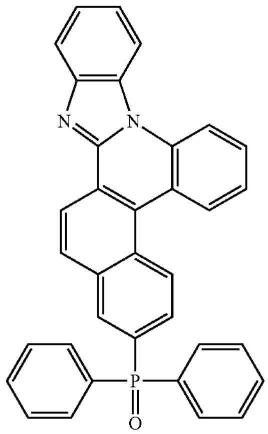
[Compound 7-23]
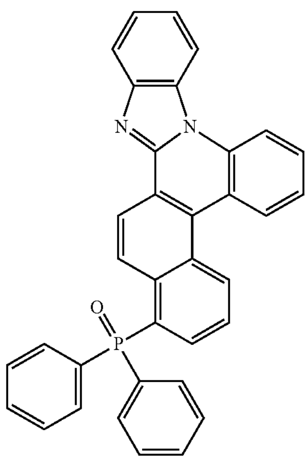
[Compound 7-24]
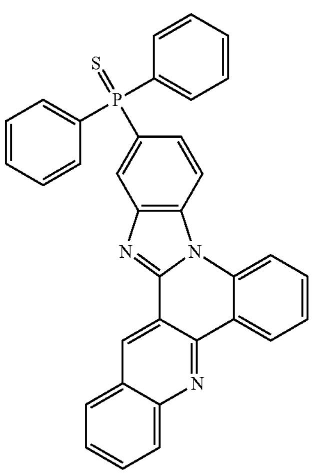
-continued
[Compound 7-25]
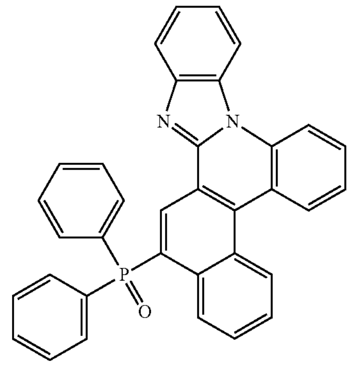
[Compound 7-26]
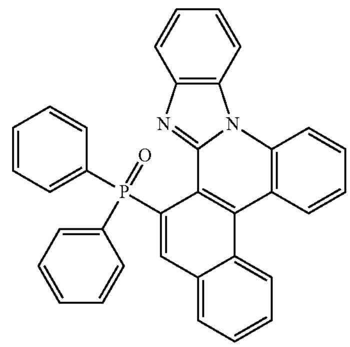
[Compound 7-27]
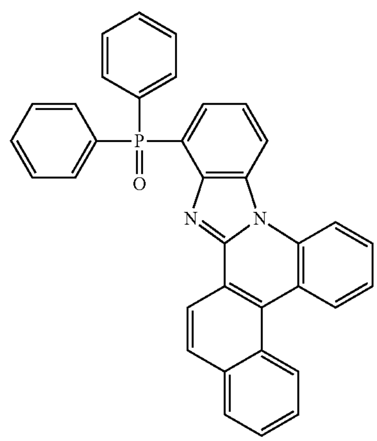
[Compound 7-28]
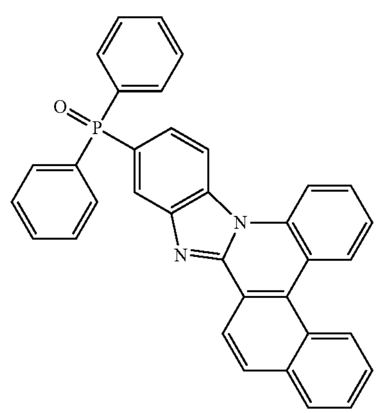

-continued
[Compound 7-29]
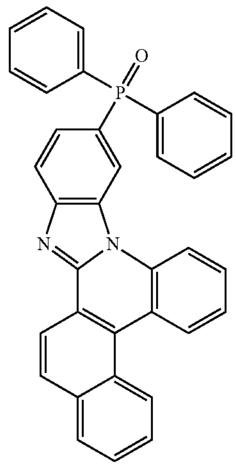
[Compound 7-30]
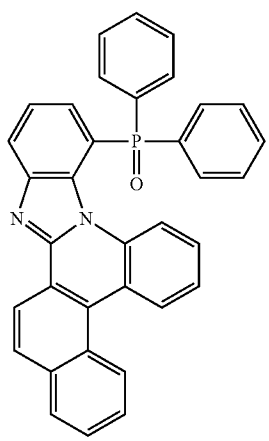
[Compound 7-31]
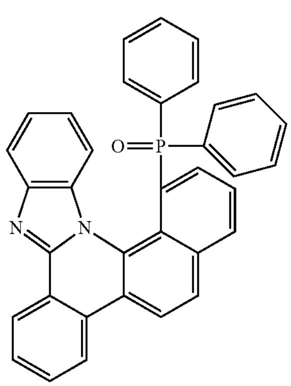
-continued
[Compound 7-32]
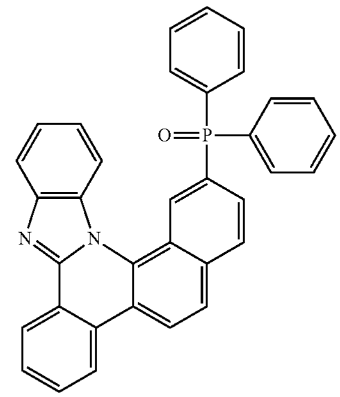
[Compound 7-33]
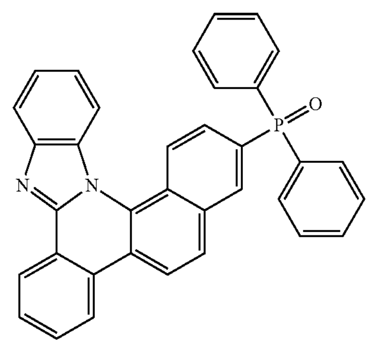
[Compound 7-34]
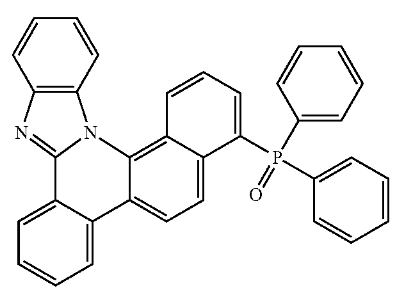
[Compound 7-35]
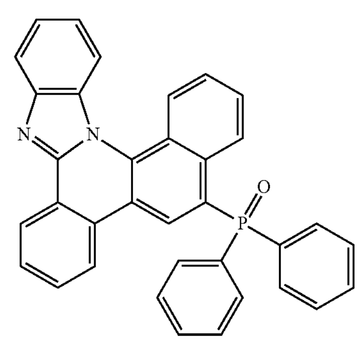

-continued
[Compound 7-36]
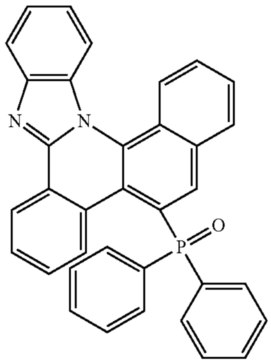
[Compound 7-37]
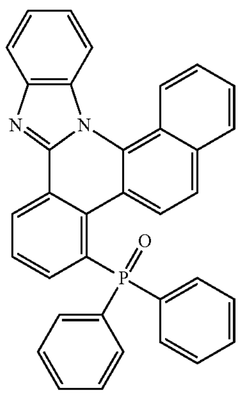
[Compound 7-38]
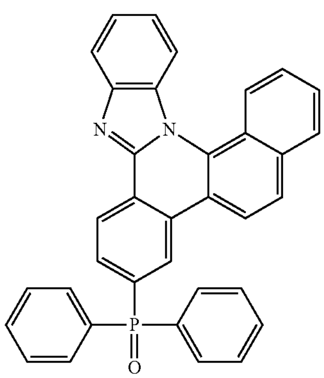
[Compound 7-39]
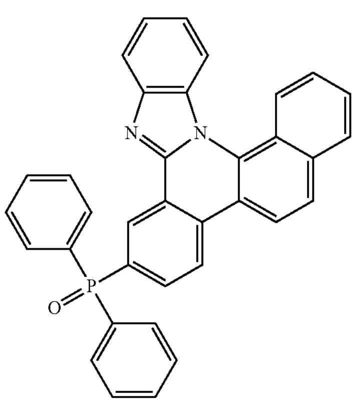
-continued
[Compound 7-40]
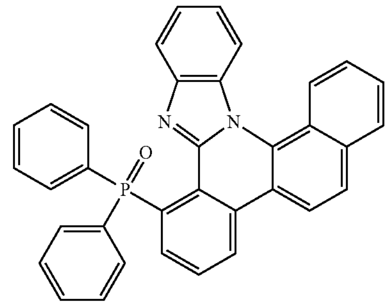
[Compound 7-41]
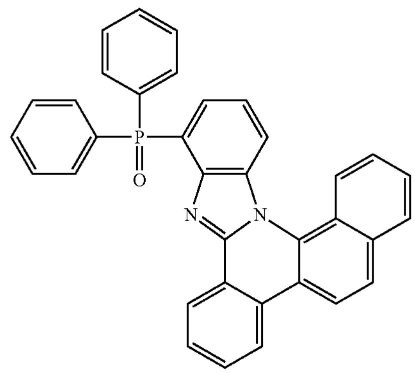
[Compound 7-42]
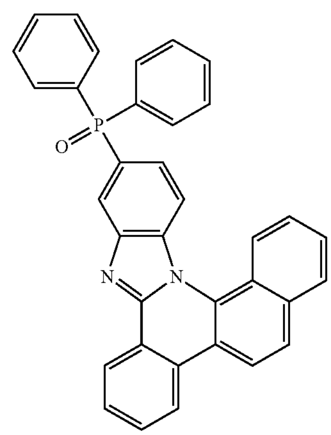
[Compound 7-43]
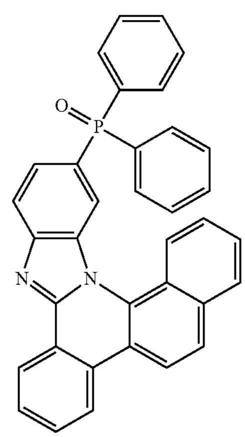

-continued
[Compound 7-44]
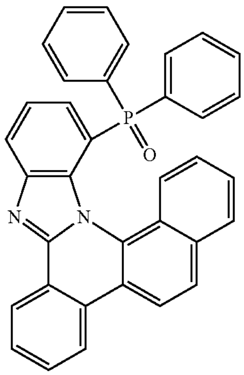
[Compound 7-45]
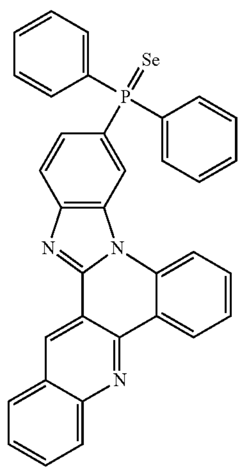
[Compound 7-46]
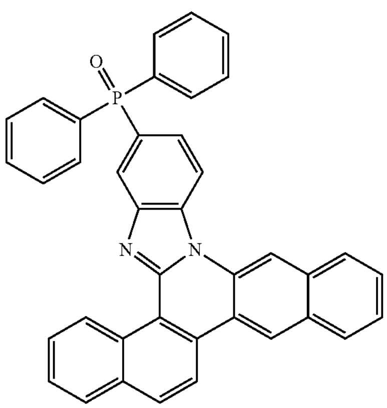
-continued
[Compound 7-47]
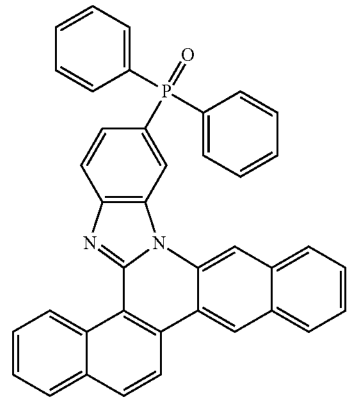
[Compound 7-48]
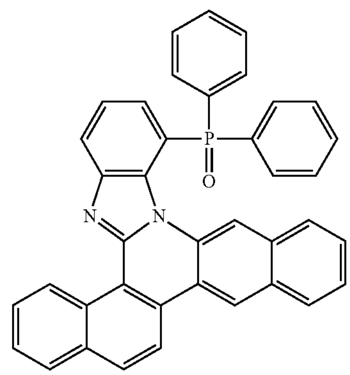
[Compound 7-49]
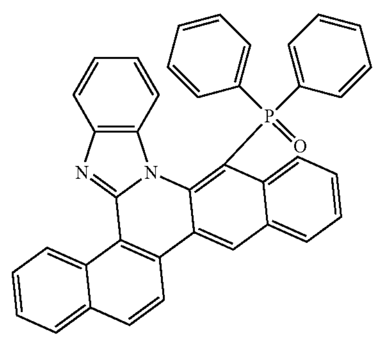
[Compound 7-50]
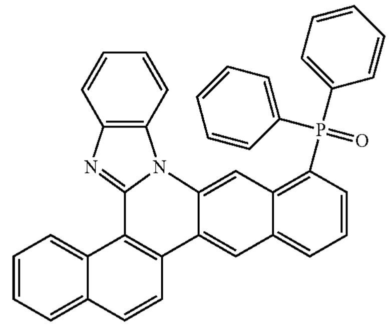

-continued
[Ccompound 7-51]
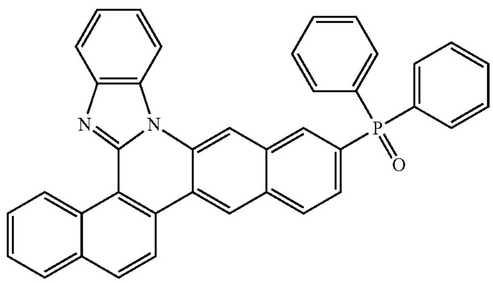
[Compound 7-52]
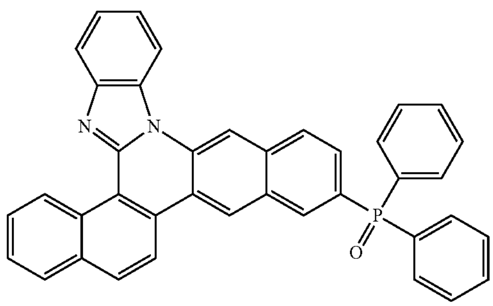
[Compound 7-53]
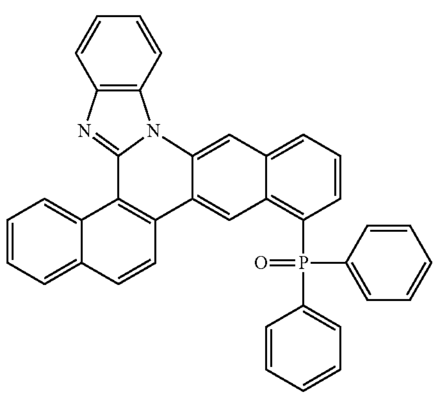
[Compound 7-54]
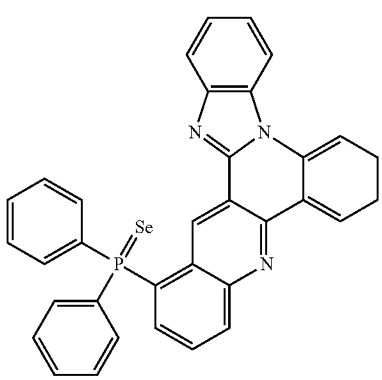
-continued
[Compound 7-55]
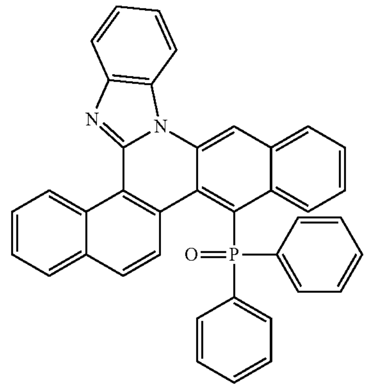
[Compound 7-56]
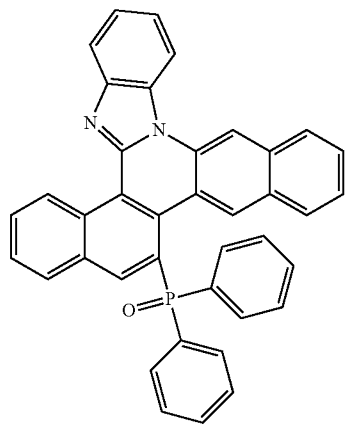
[Compound 7-57]
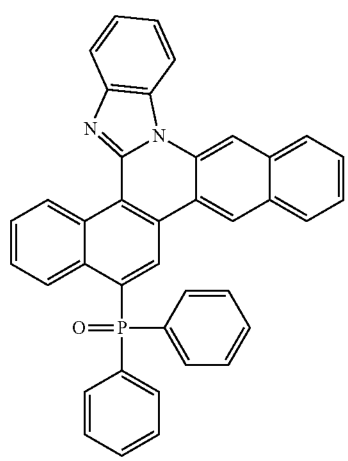

[compound 7-58]
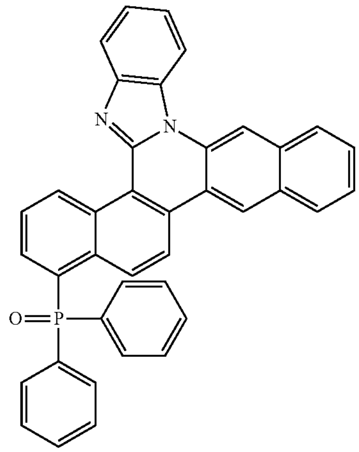
[Compound 7-59]
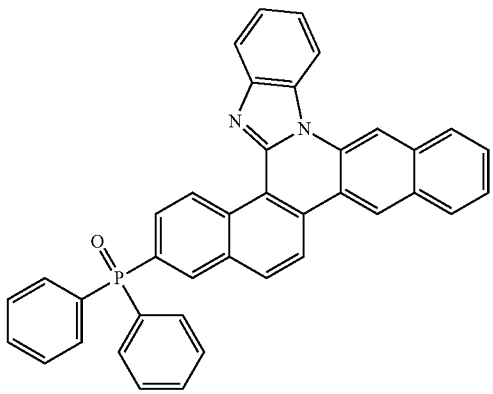
[Compound 7-60]
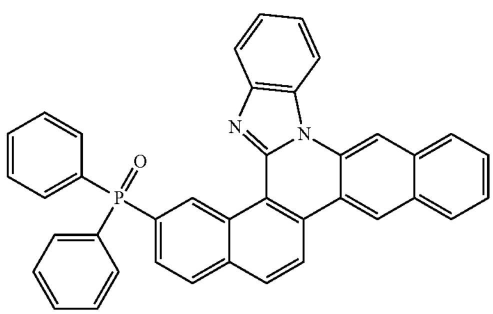
[Compound 7-61]
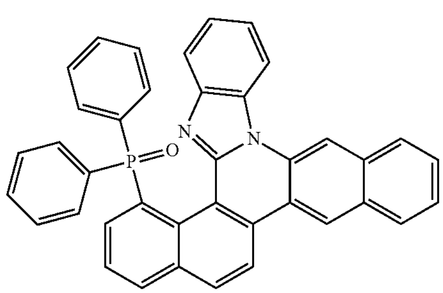
[Compound 7-62]
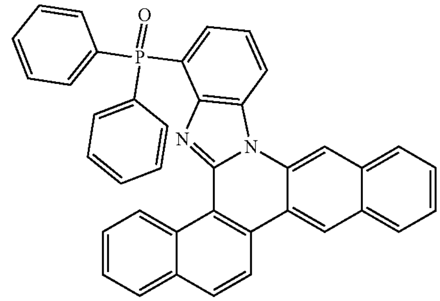
[Compound 7-63]
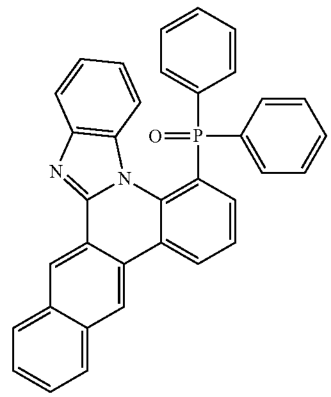
[Compound 7-64]
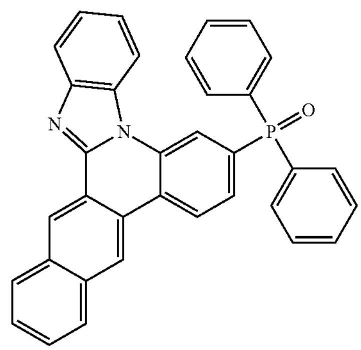
[Compound 7-65]
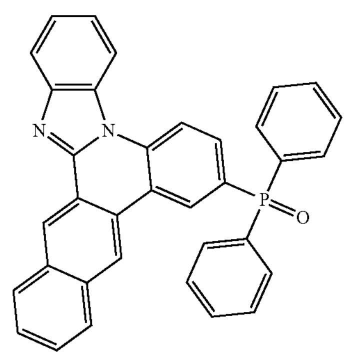

-continued
[Compound 7-66]
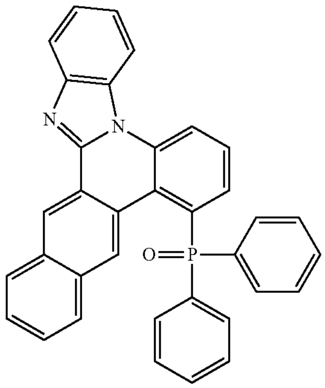
[Compound 7-67]
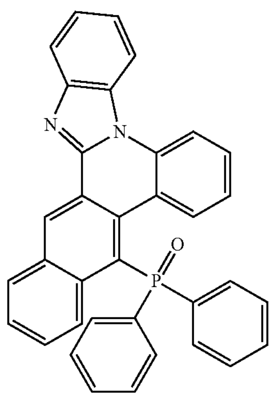
[Compound 7-68]
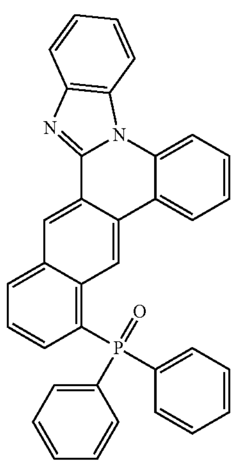
-continued
[Compound 7-69]
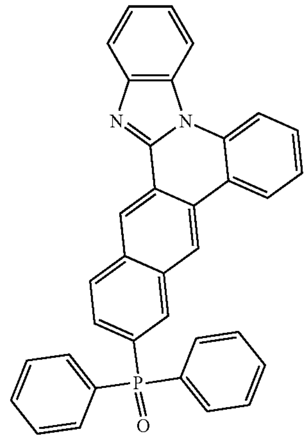
[Compound 7-70]
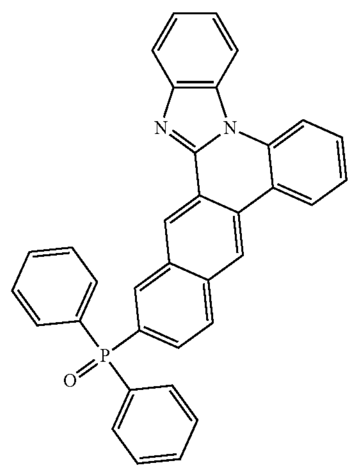
[Compound 7-71]
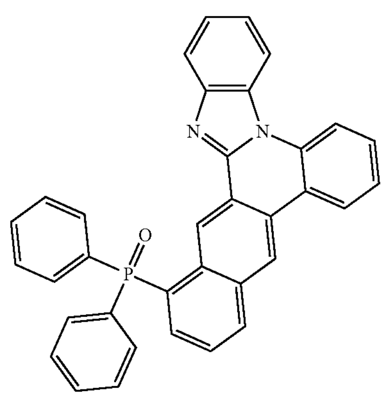

-continued
[Compound 7-72]
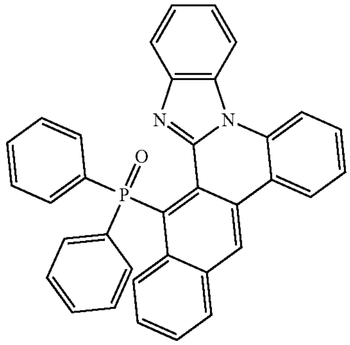
[Compound 7-73]
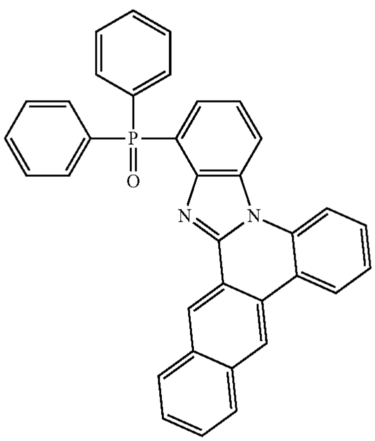
[Compound 7-74]
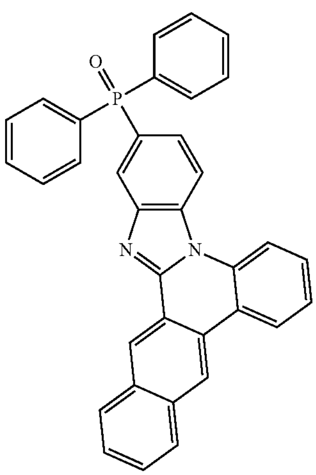
-continued
[Compound 7-75]
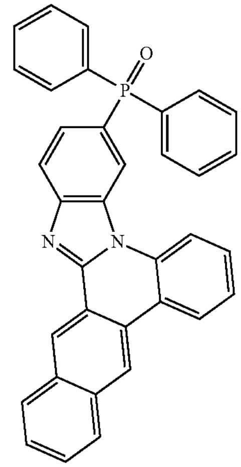
[Compound 7-76]
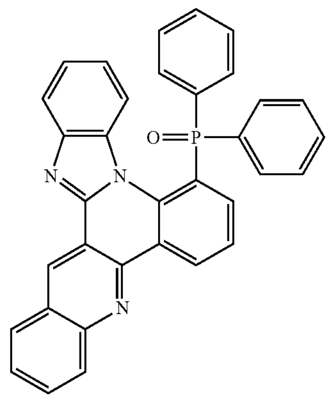
[Compound 7-77]
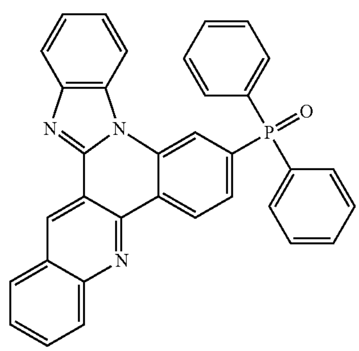
[Compound 7-78]
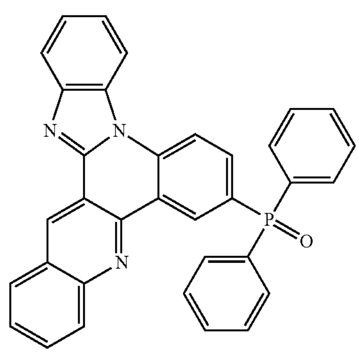

-continued
[Compound 7-79]
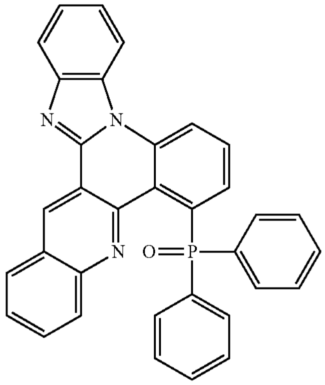
[Compound 7-80]
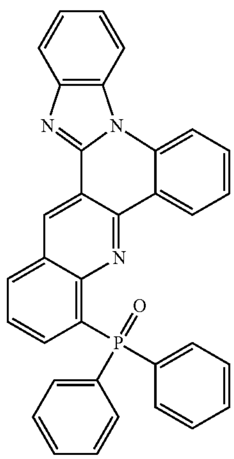
[Compound 7-81]
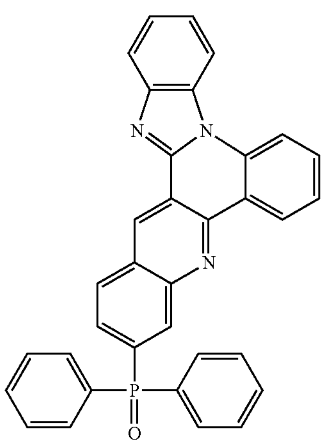
-continued
[Compound 7-82]
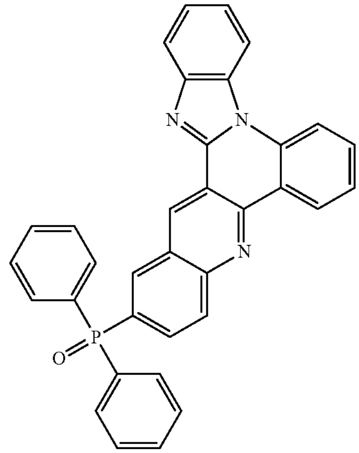
[Compound 7-83]
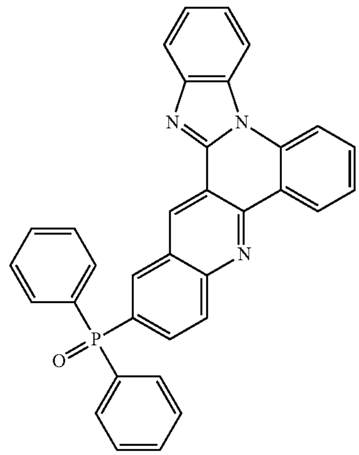
[Compound 7-84]
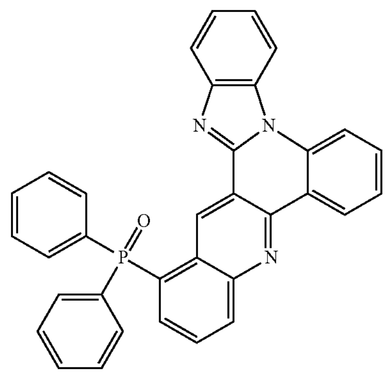
[Compound 7-85]
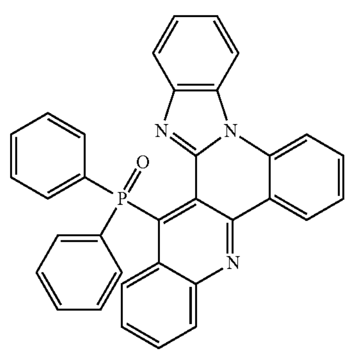

[Compound 7-86]
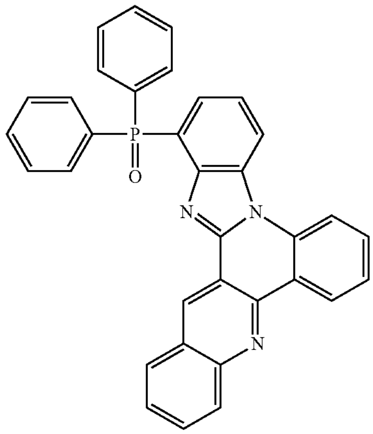
[Compound 7-87]
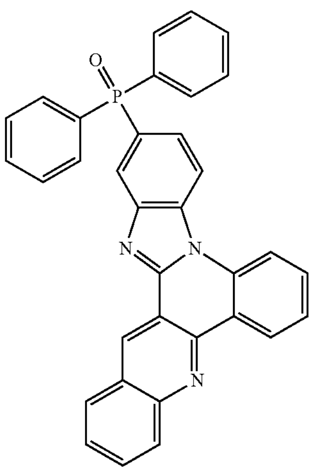
[Compound 7-88]
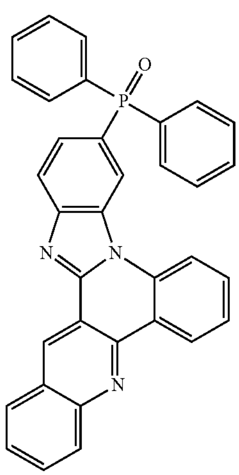
[Compound 7-89]
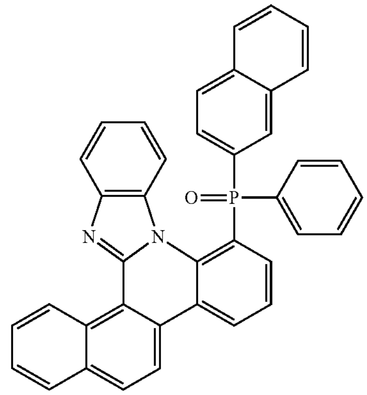
[Compound 7-90]
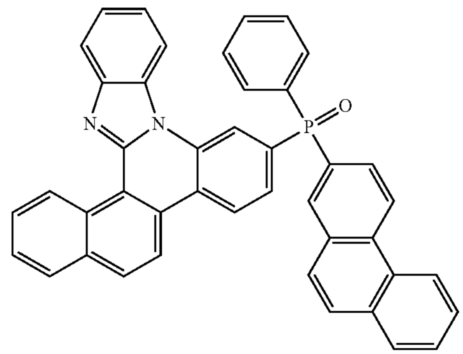
[Compound 7-91]
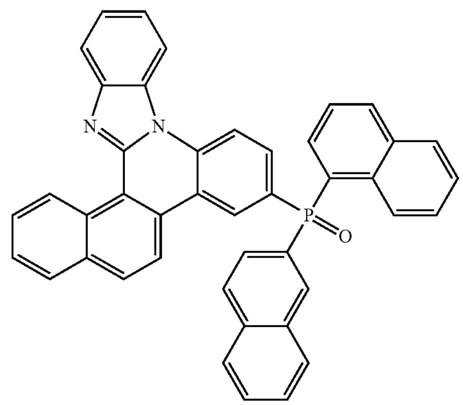
[Compound 7-92]
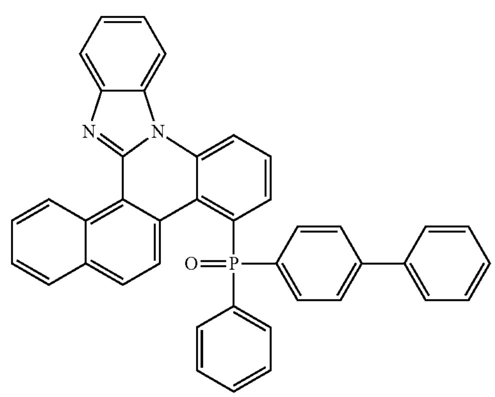

-continued
[Compound 7-93]
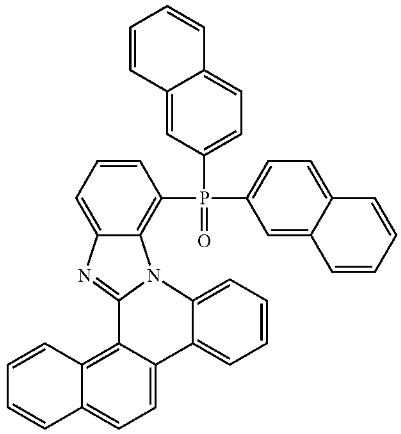
[Compound 7-94]
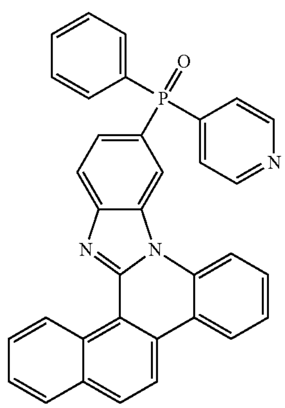
[Compound 7-95]
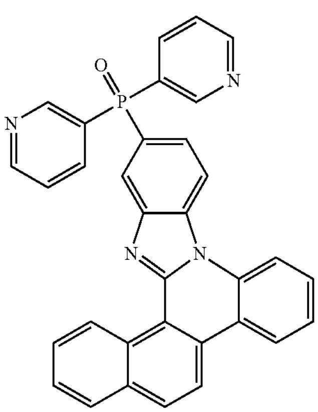
-continued
[Compound 7-96]
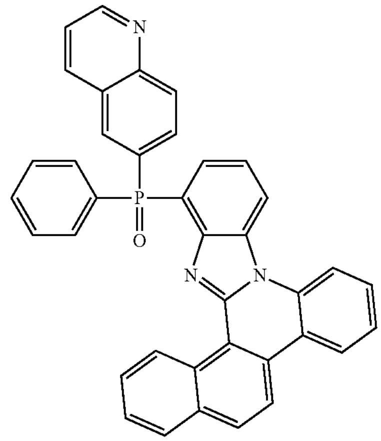
[Compound 7-97]
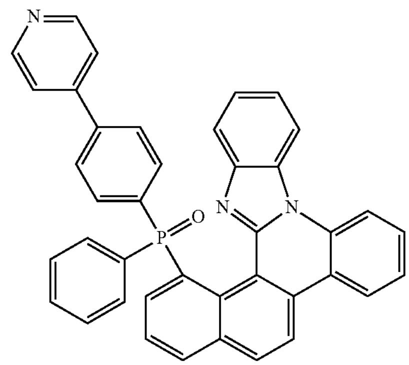
[Compound 7-98]
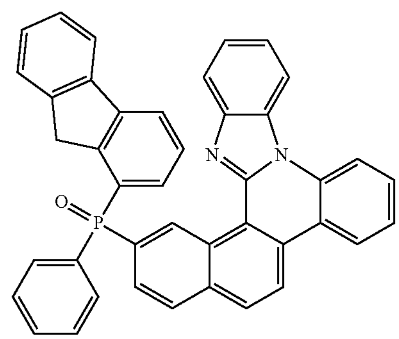
[Compound 7-99]
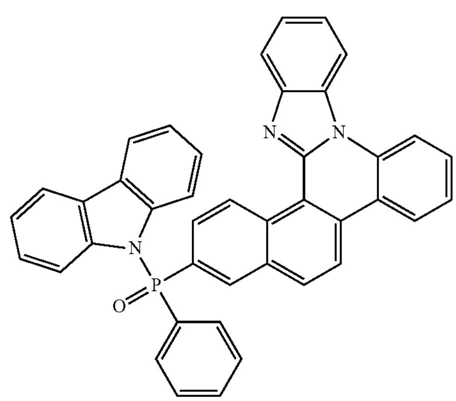

-continued
[Compound 7-100]
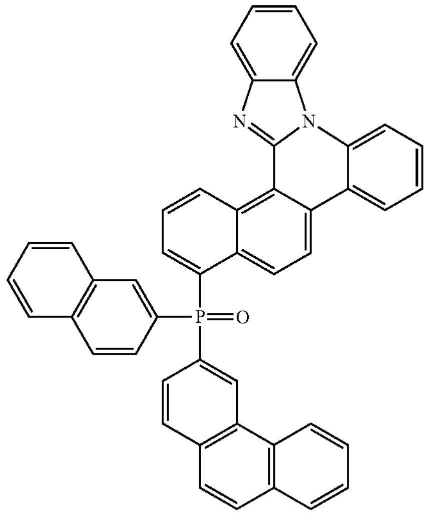
[Compound 7-101]
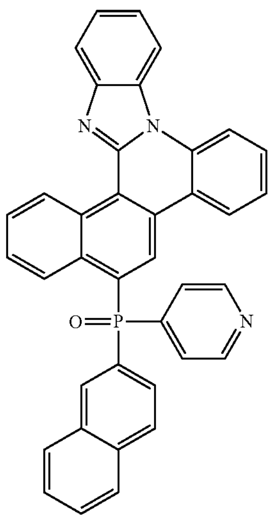
[Compound 7-102]
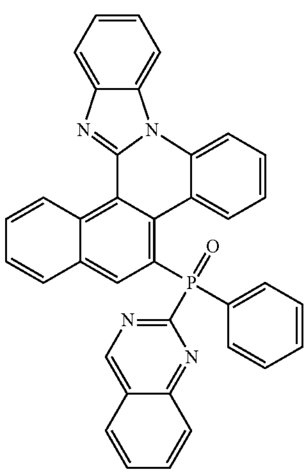
-continued
[Compound 7-103]
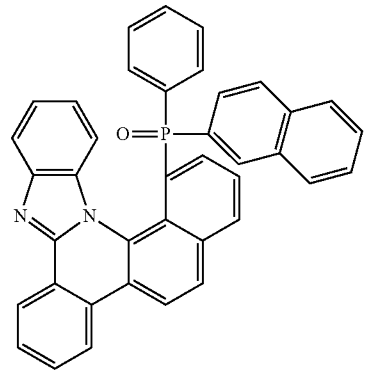
[Compound 7-104]
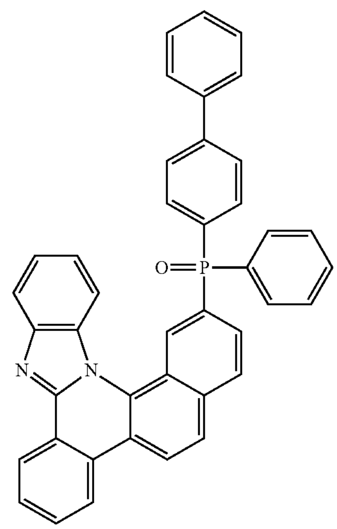
[Compound 7-105]
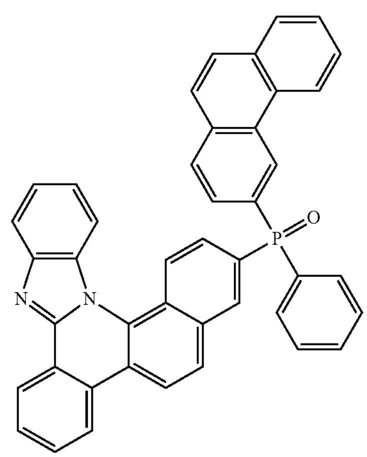

-continued
[Compound 7-106]
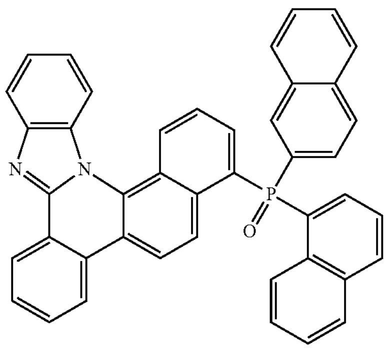
[Compound 7-107]
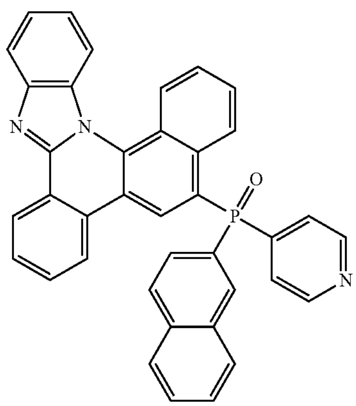
[Compound 7-108]
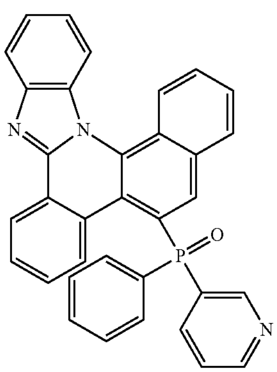
[Compound 7-109]
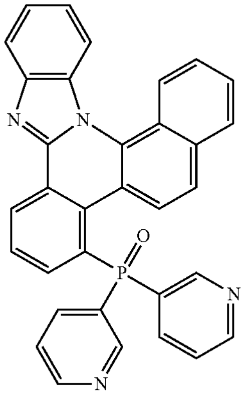
-continued
[Compound 7-110]
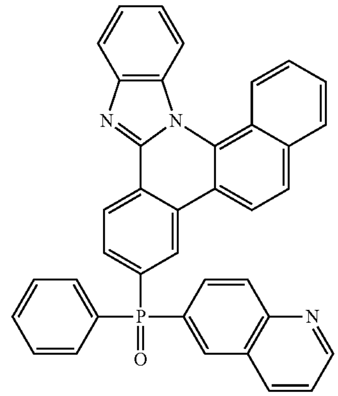
[Compound 7-111]
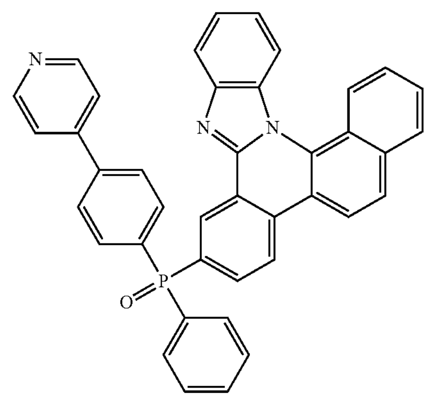
[Compound 7-112]
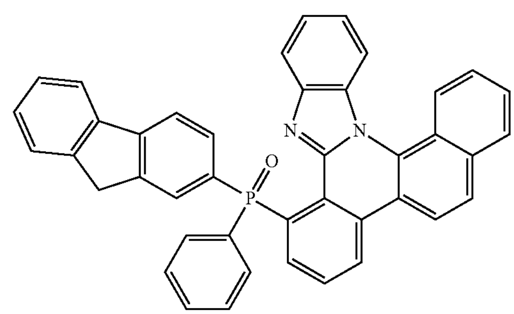
[Compound 7-113]
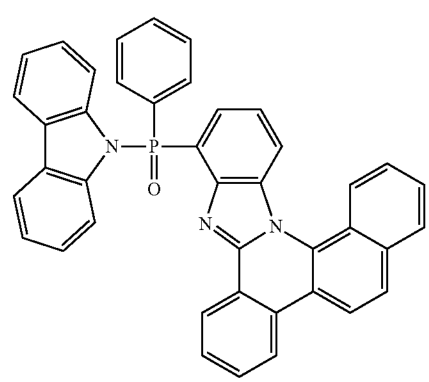

-continued
[Compound 7-114]
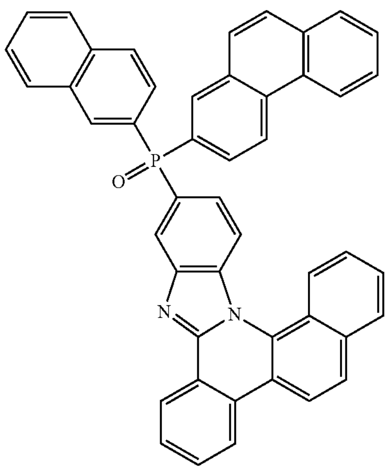
[Compound 7-115]
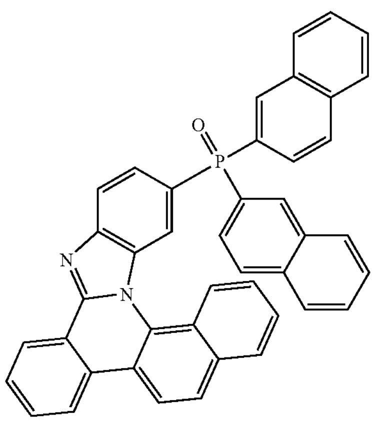
[Compound 7-116]
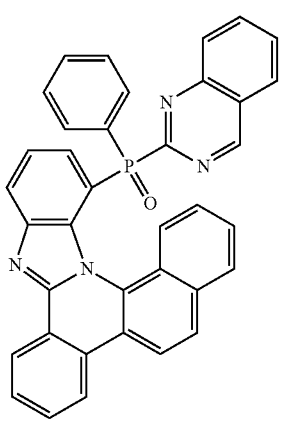
-continued
[Compound 7-117]
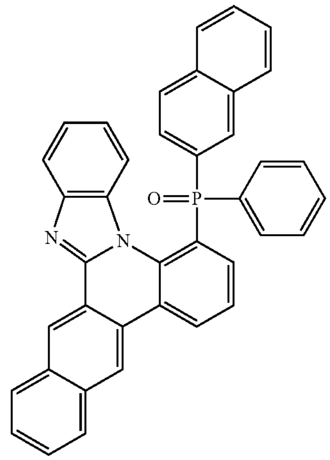
[Compound 7-118]
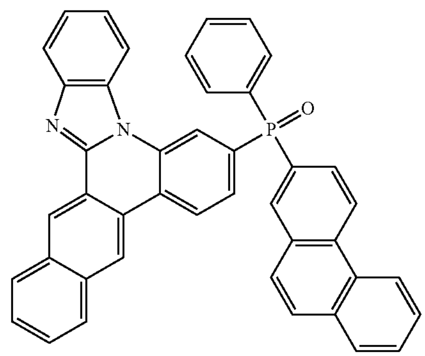
[Compound 7-119]
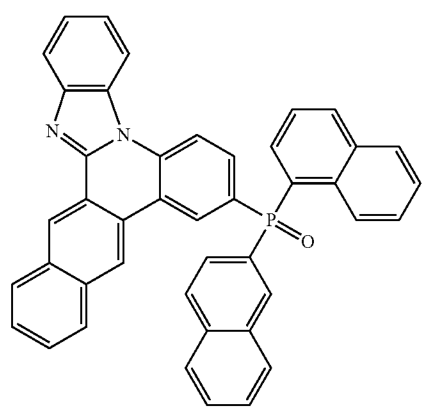

-continued
[Compound 7-120]
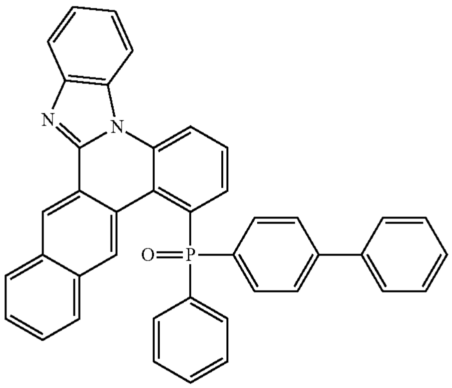
[Compound 7-121]
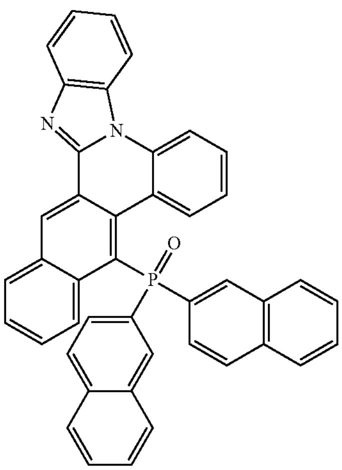
[Compound 7-122]
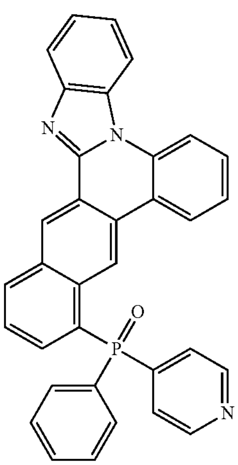
-continued
[Compound 7-123]
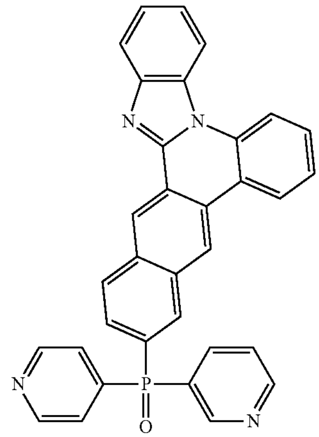
[Compound 7-124]
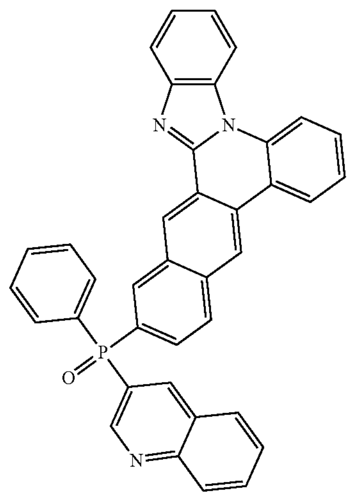
[Compound 7-125]
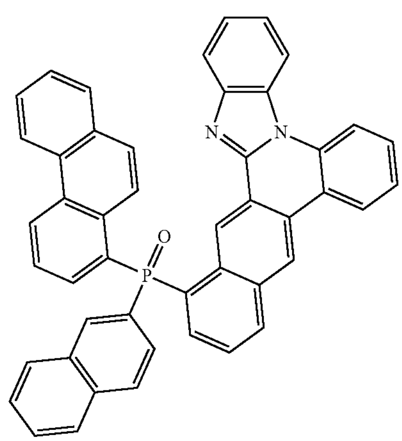

-continued
[Compound 7-126]
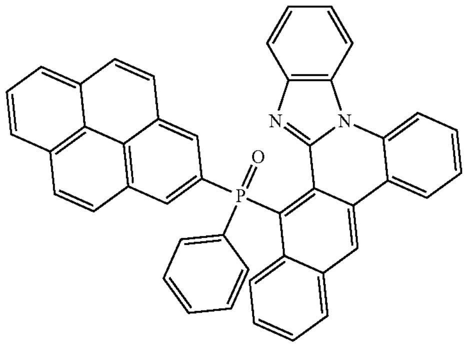
[Compound 7-127]
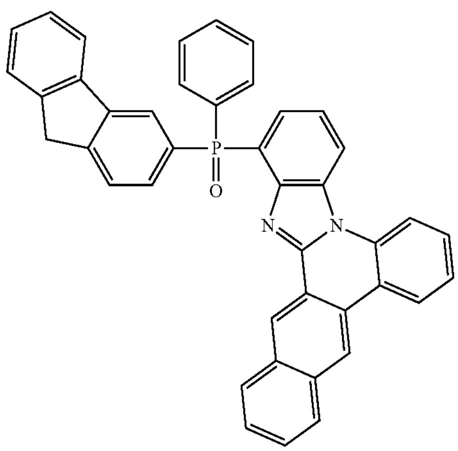
[Compound 7-128]
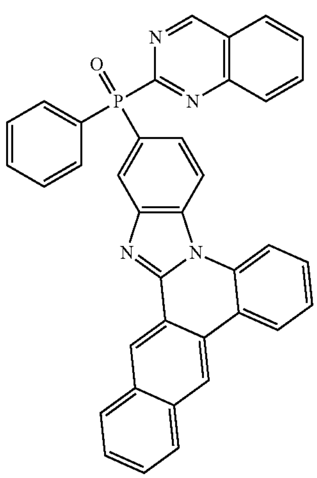
-continued
[Compound 7-129]
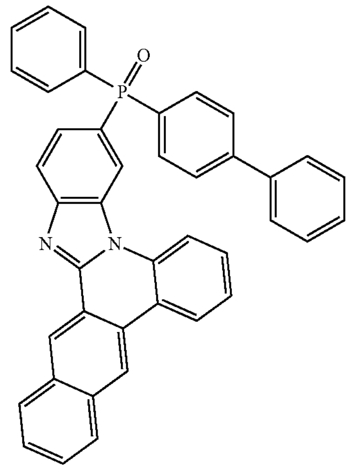
[Compound 7-130]
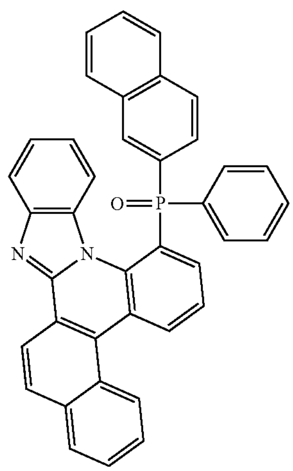
[Compound 7-131]
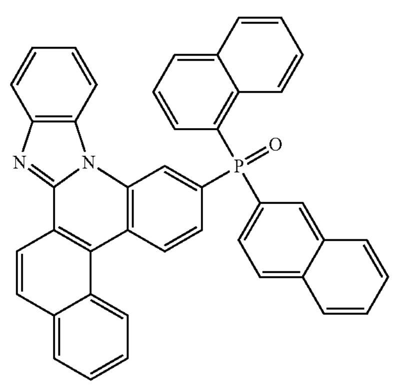

[Compound 7-132]
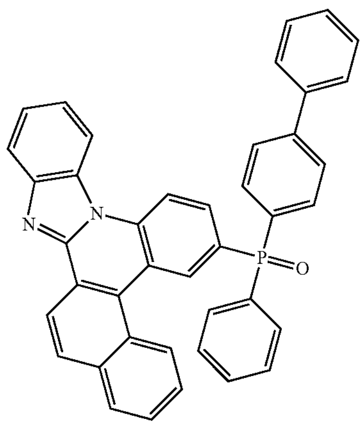
[Compound 7-133]
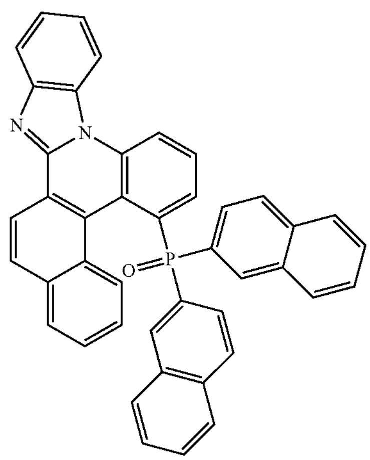
[Compound 7-134]
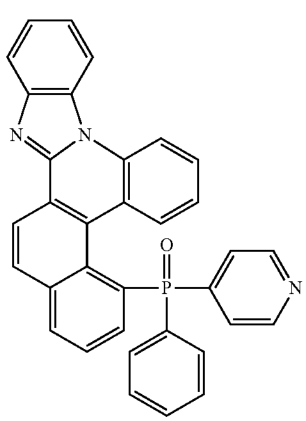
[Compound 7-135]
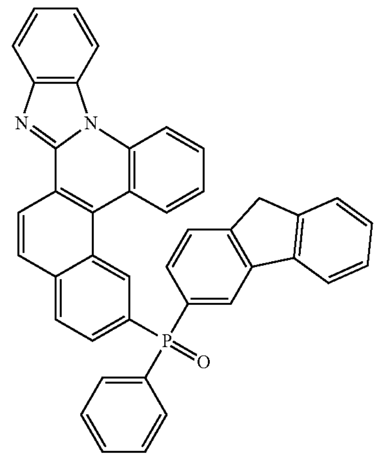
[Compound 7-136]
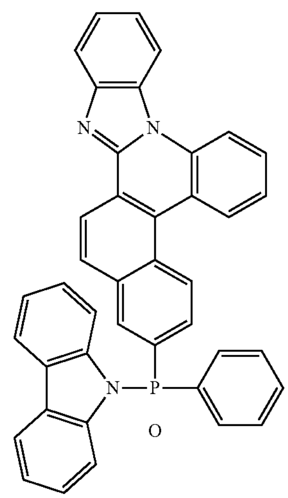
[Compound 7-137]
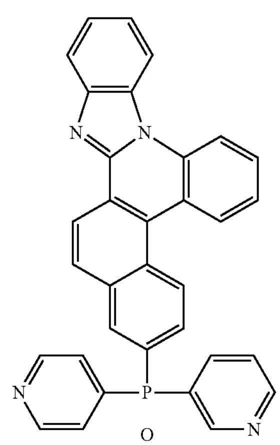

[Compound 7-138]
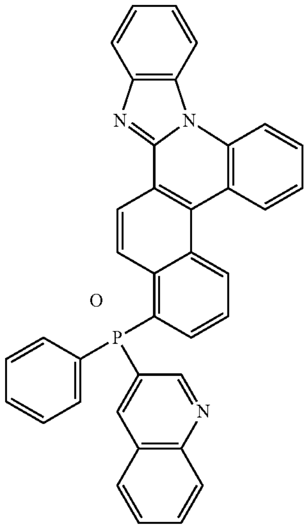
[Compound 7-139]
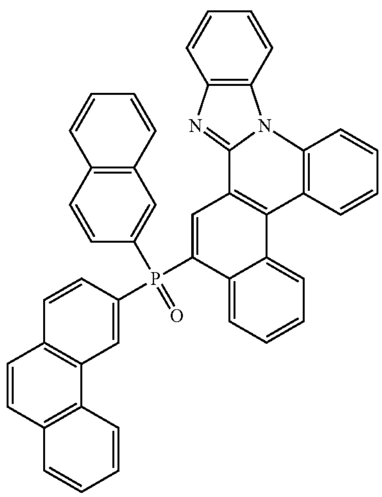
[Compound 7-140]
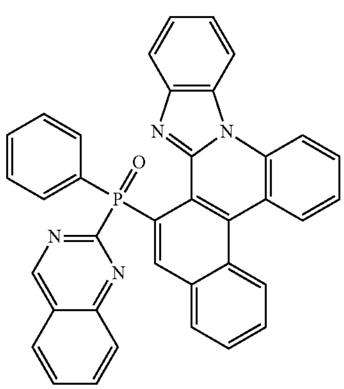
[Compound 7-141]
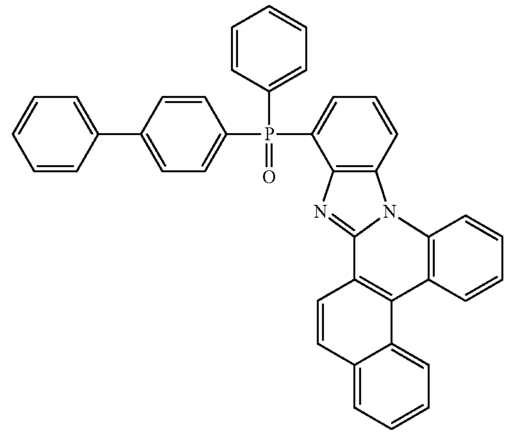
[Compound 7-142]
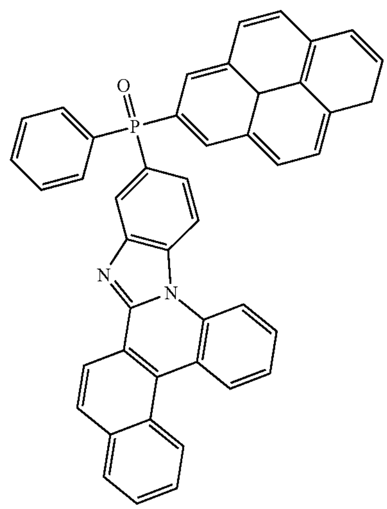
[Compound 7-143]
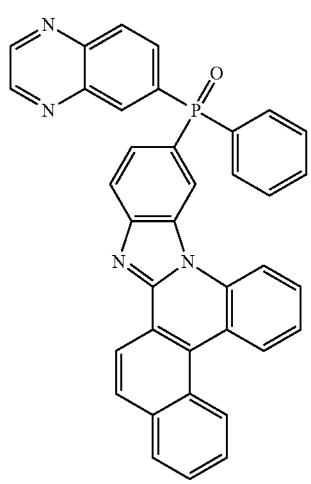

-continued
[Compound 7-144]
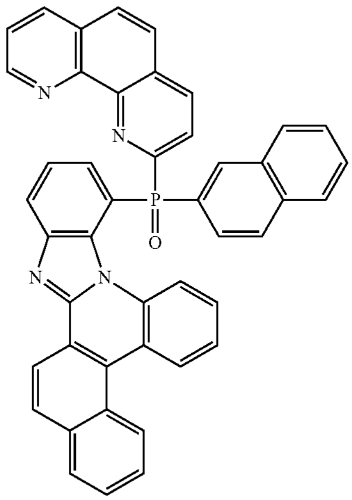
[Compound 7-145]
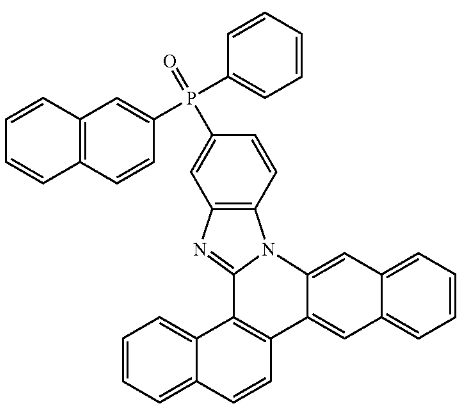
[Compound 7-146]
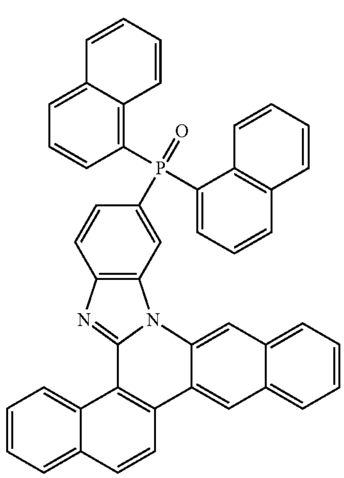
-continued
[Compound 7-147]
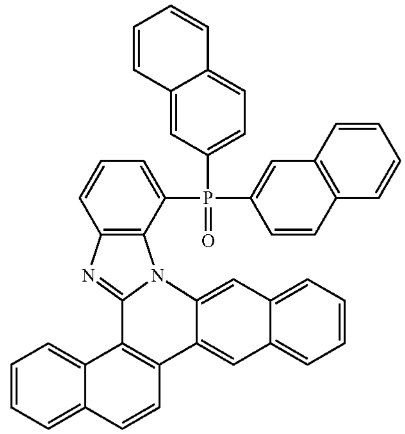
[Compound 7-148]
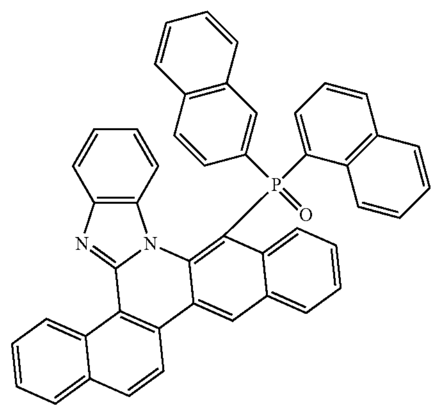
[Compound 7-149]
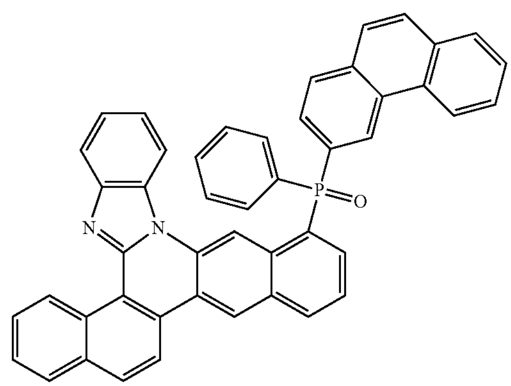
[Compound 7-150]
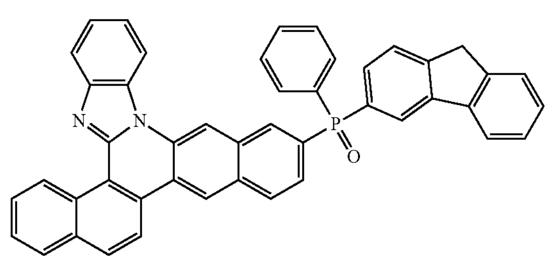

-continued
[Compound 7-151]
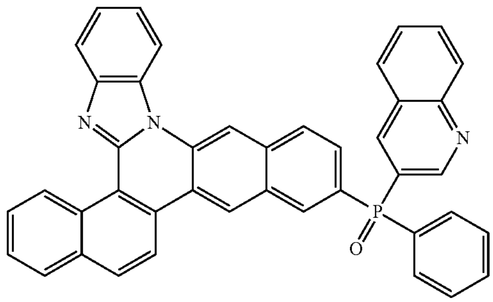
[Compound 7-152]
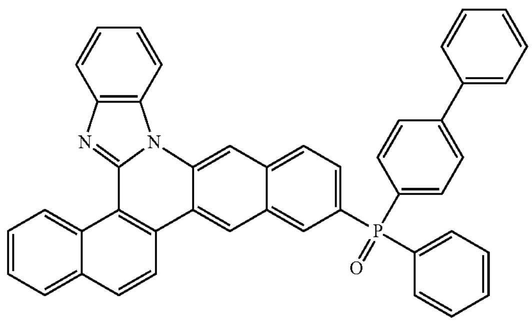
[Compound 7-153]
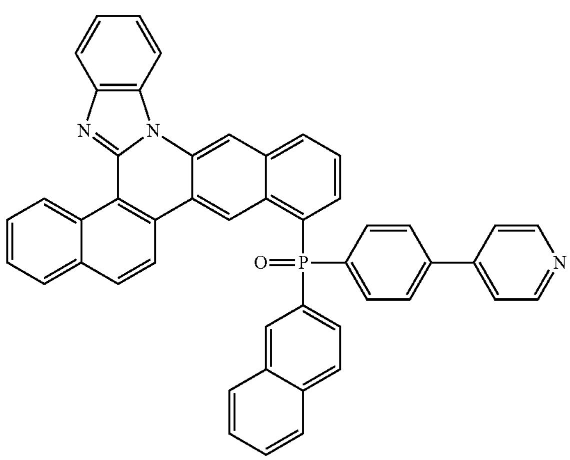
[Compound 7-154]
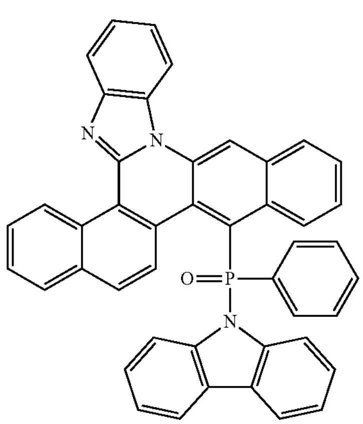
-continued
[Compound 7-155]
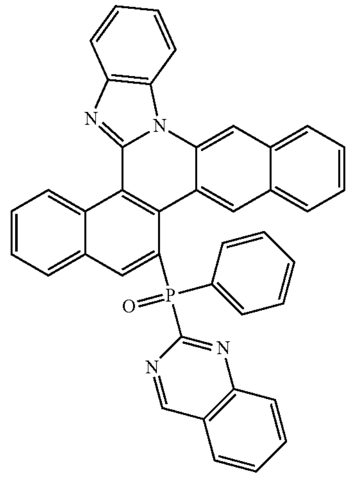
[Compound 7-156]
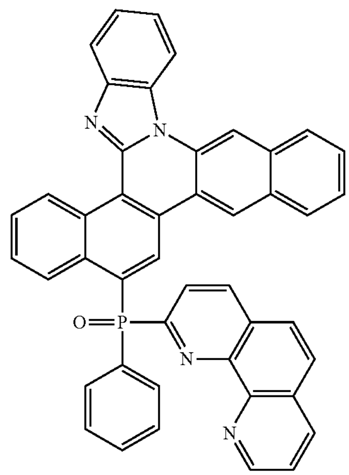
[Compound 7-157]
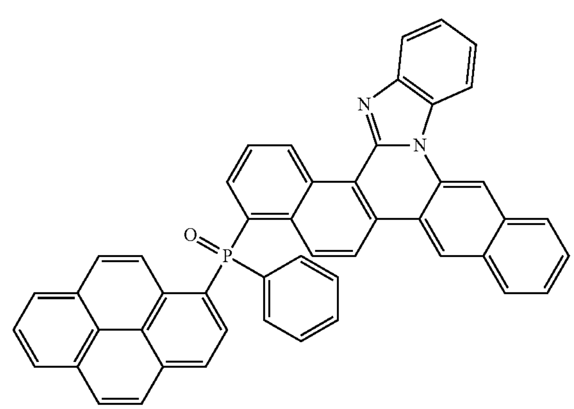

-continued
[Compound 7-158]
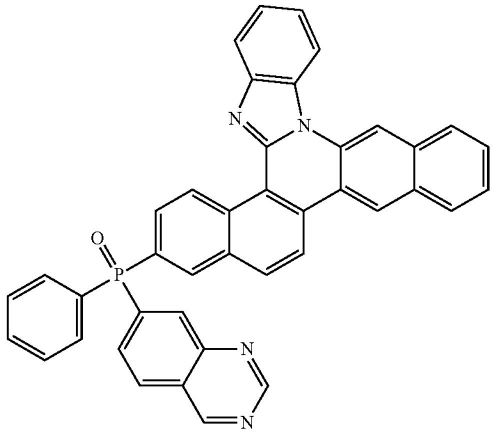
[Compound 7-159]
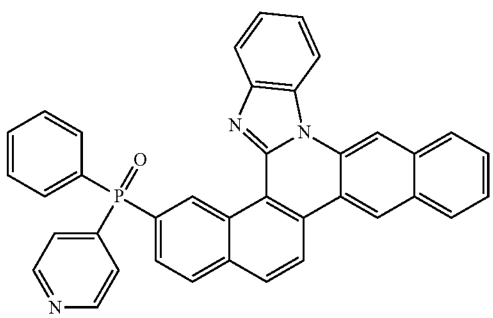
[Compound 7-160]
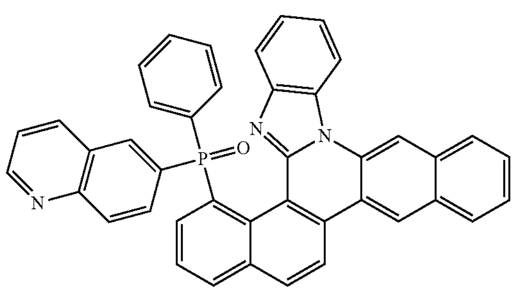
[Compound 7-161]
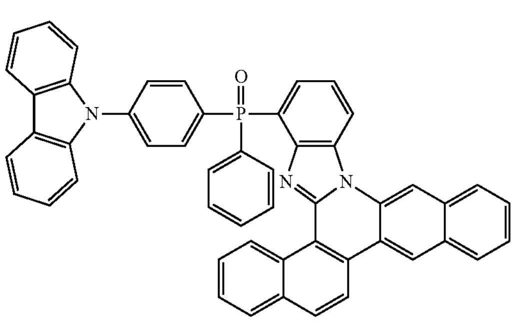
-continued
[Compound 7-162]
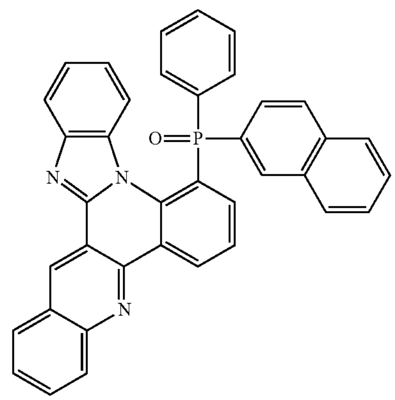
[Compound 7-163]
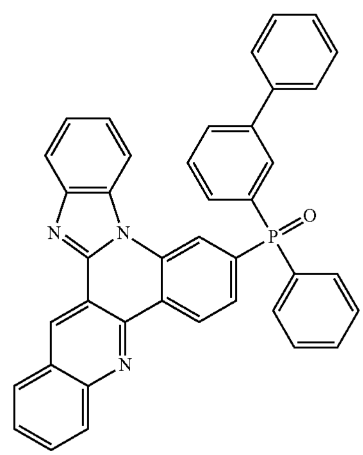
[Compound 7-164]
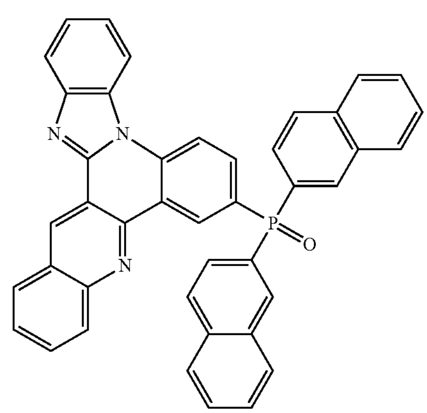

-continued
[Compound 7-165]
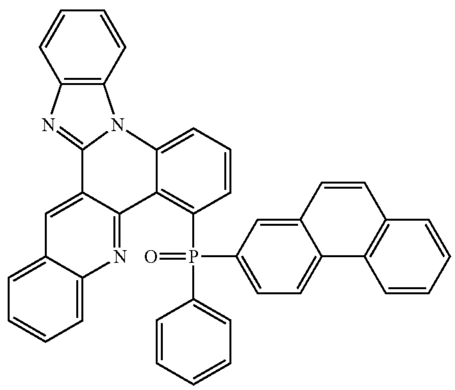
[Compound 7-166]
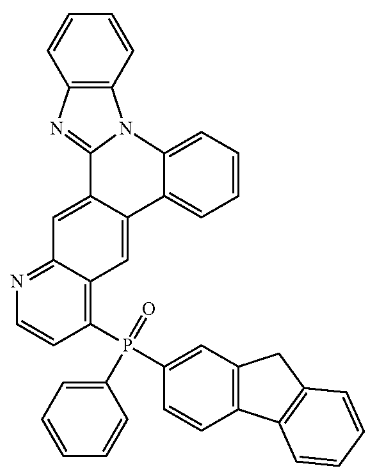
[Compound 7-167]
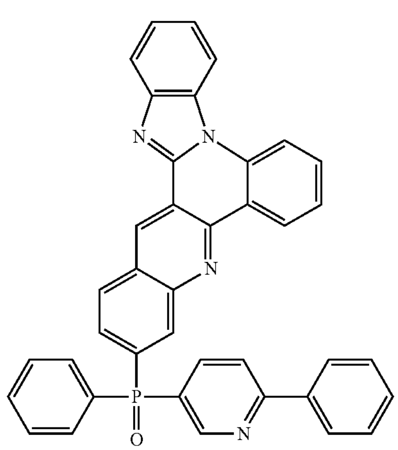
-continued
[Compound 7-168]
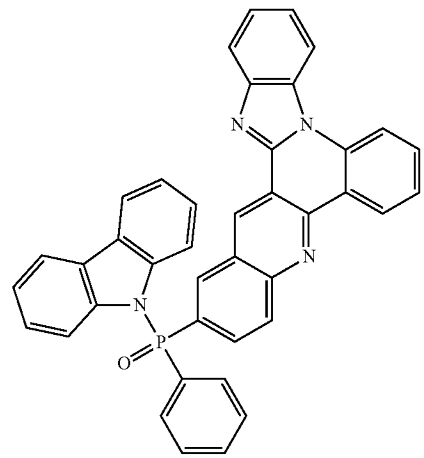
[Compound 7-169]
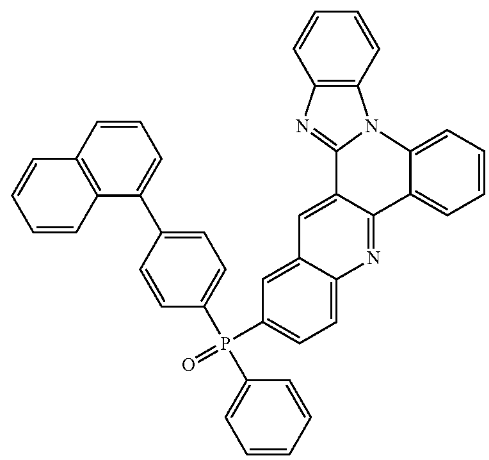
[Compound 7-170]
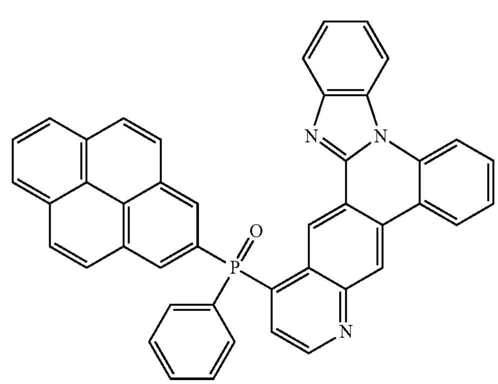

-continued
[Compound 7-171]
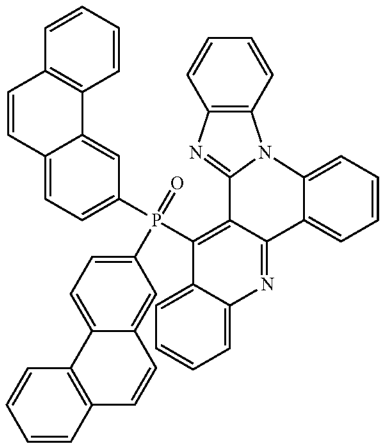
[Compound 7-172]
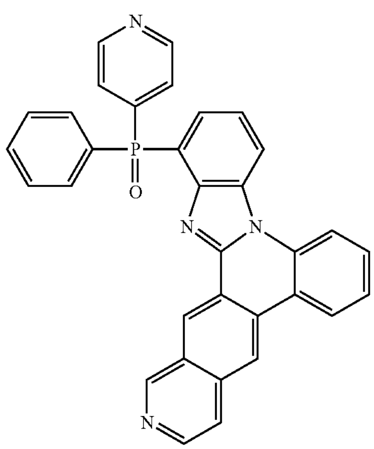
[Compound 7-173]
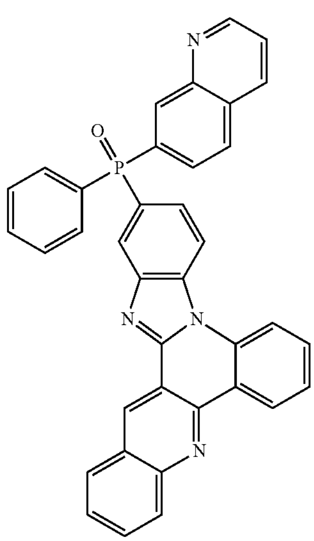
-continued
[Compound 7-174]
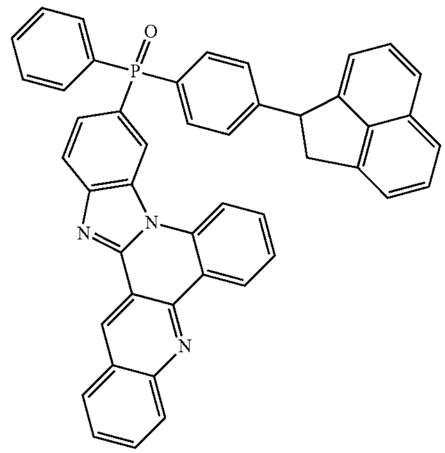
[Compound 7-175]
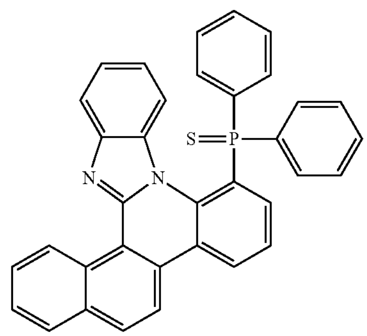
[Compound 7-176]
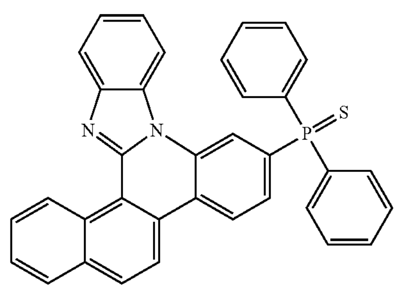
[Compound 7-177]
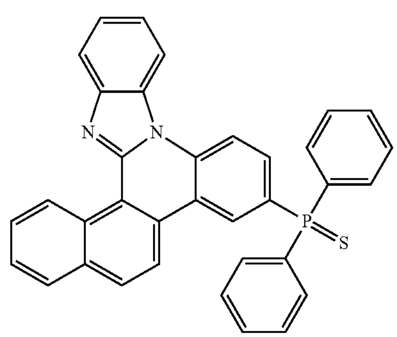

-continued
[Compound 7-178]
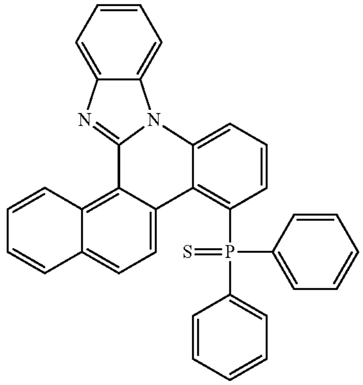
[Compound 7-179]
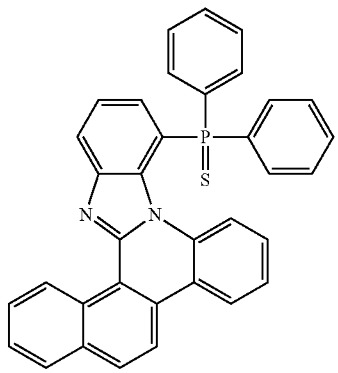
[Compound 7-180]
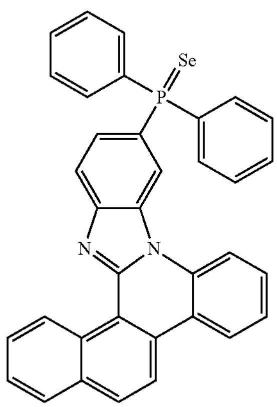
[Compound 7-181]
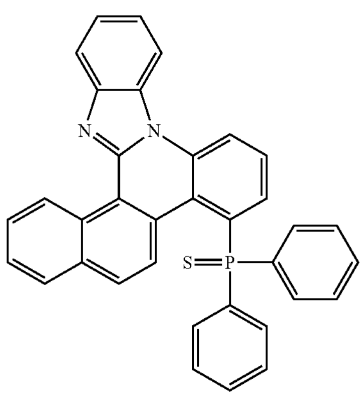
-continued
[Compound 7-182]
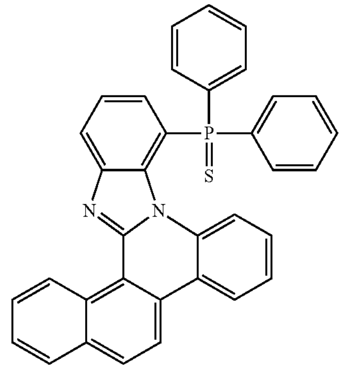
[Compound 7-183]
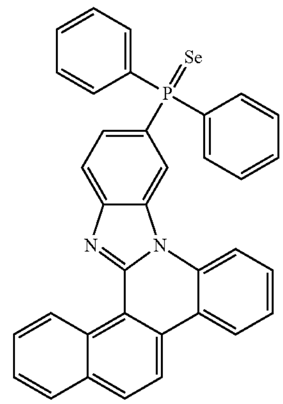
[Compound 7-184]
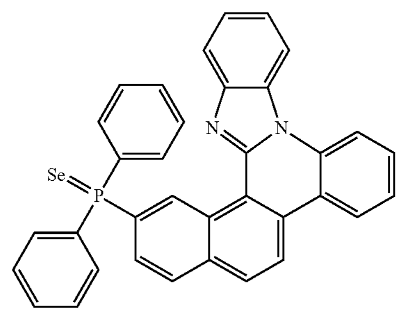
[Compound 7-185]
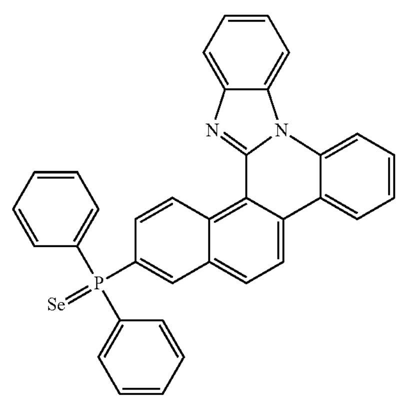

-continued
[Compound 7-186]
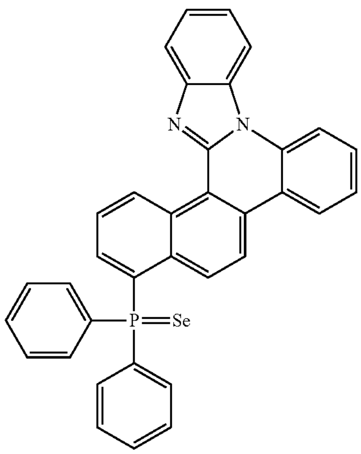
[Compound 7-187]
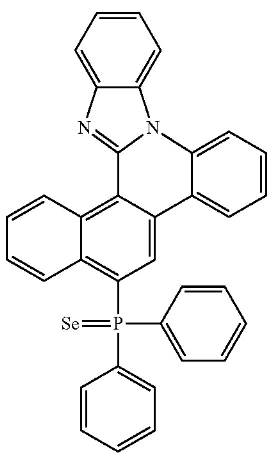
[Compound 7-188]
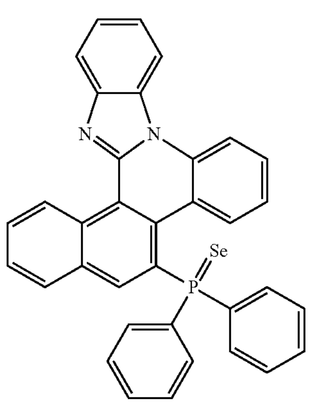
-continued
[Compund 7-189]
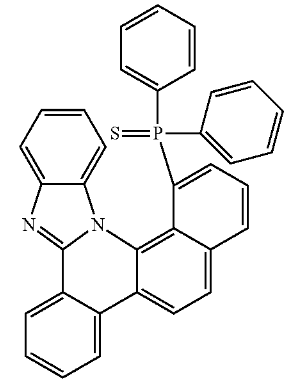
[Compound 7-190]
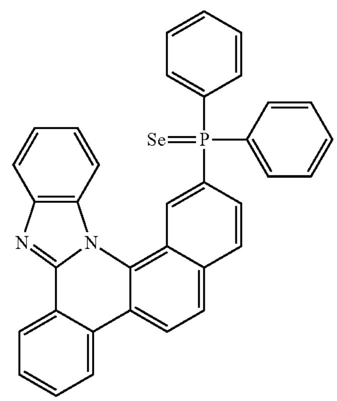
[Compound 7-191]
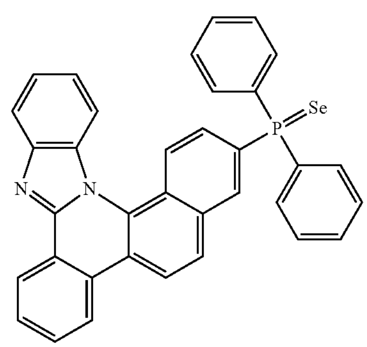
[Compound 7-192]
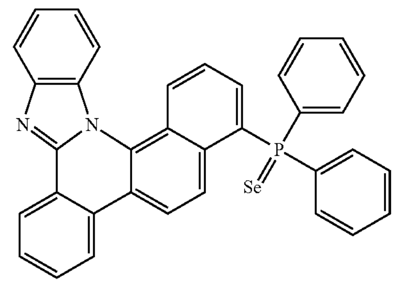

-continued
[Compound 7-193]
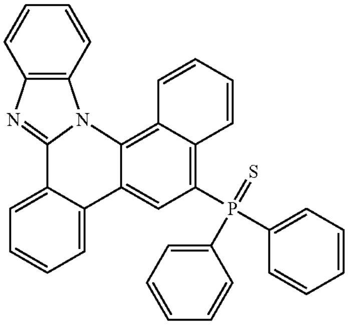
[Compound 7-194]
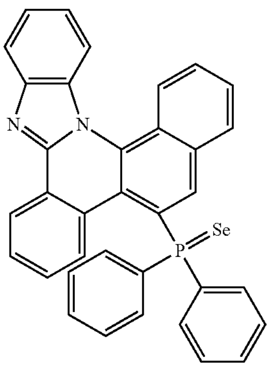
[Compound 7-195]
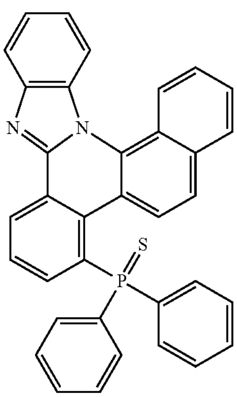
[Compound 7-196]
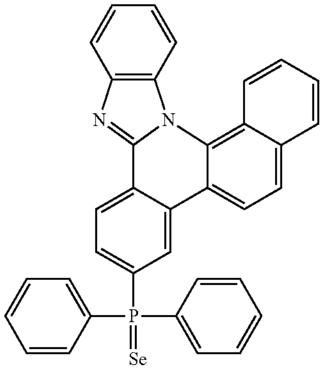
-continued
[Compound 7-197]
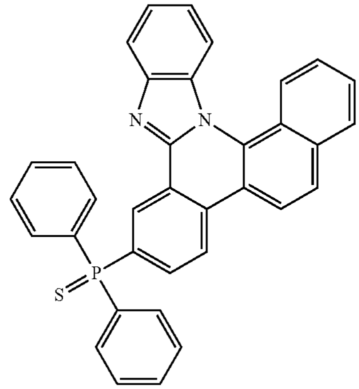
[Compound 7-198]
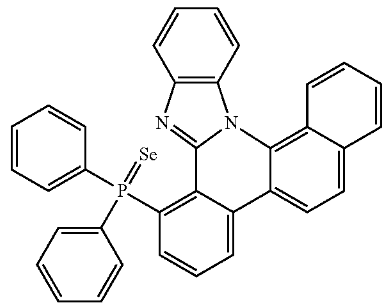
[Compound 7-199]
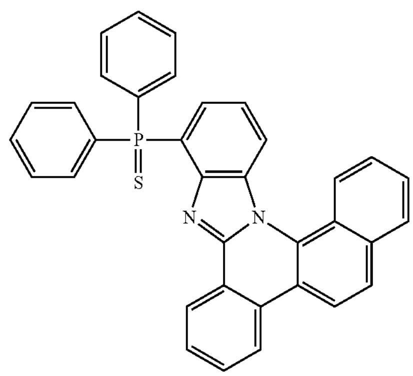
[Compound 7-200]
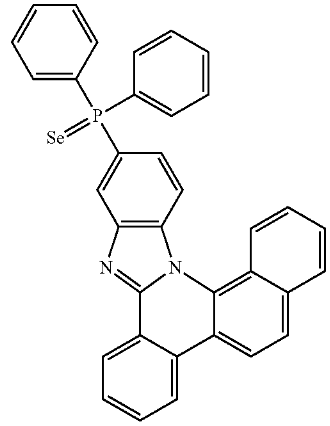

-continued
[Compound 7-201]
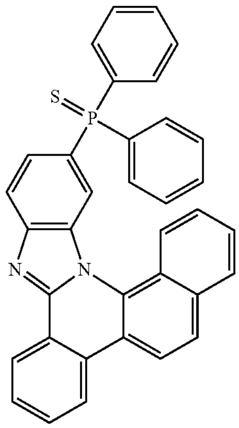
[Compound 7-202]
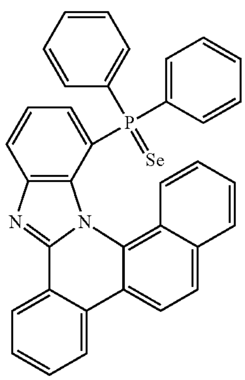
[Compound 7-203]
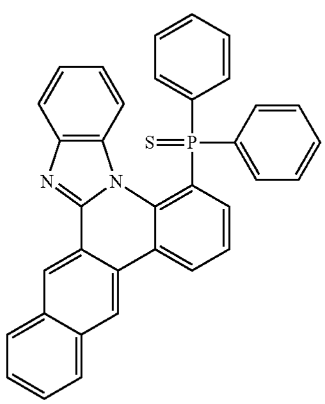
[Compound 7-204]
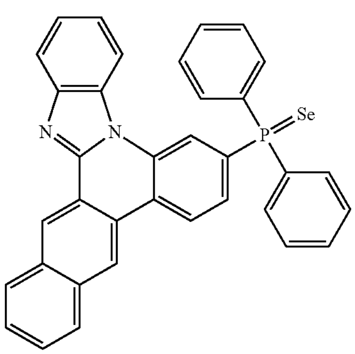
-continued
[Compound 7-205]
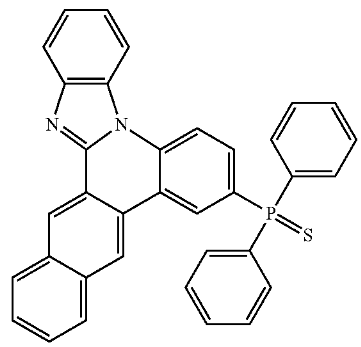
[Compound 7-206]
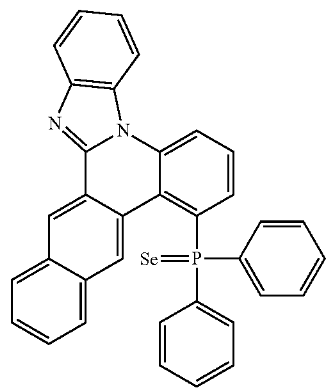
[Compound 7-207]
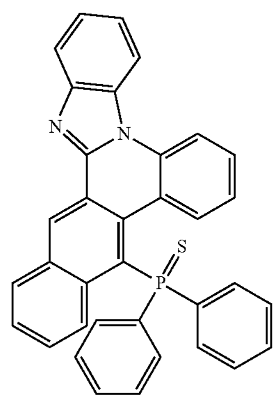
[Compound 7-208]
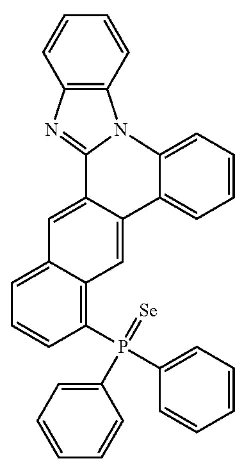

-continued
[Compound 7-209]
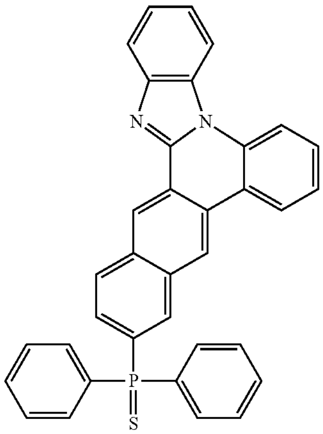
[Compound 7-210]
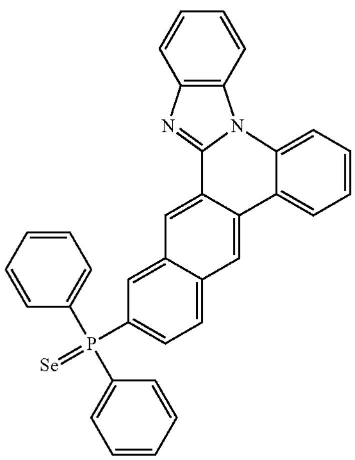
[Compound 7-211]
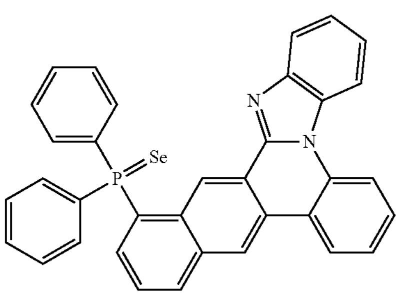
[Compound 7-212]
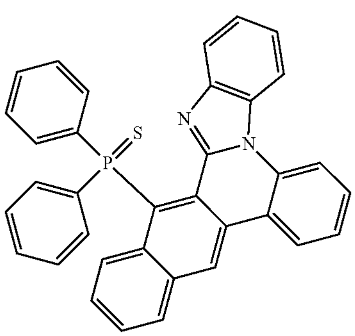
-continued
[Compound 7-213]
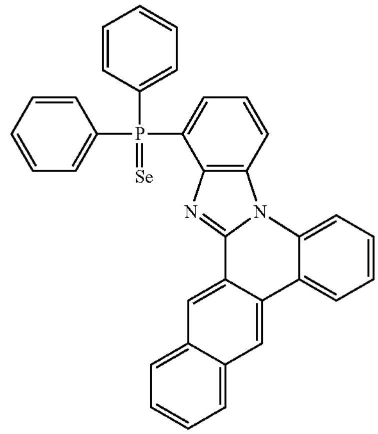
[Compound 7-214]
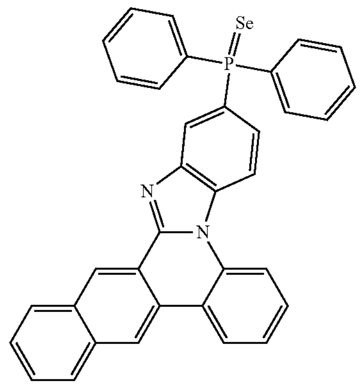
[Compound 7-215]
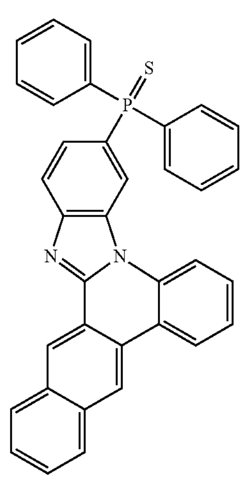

-continued
[Compound 7-216]
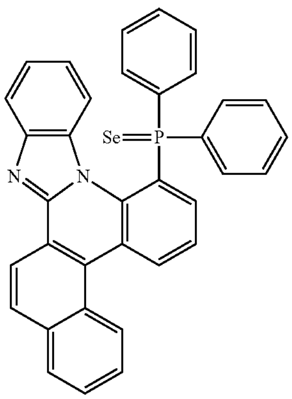
[Compound 7-217]
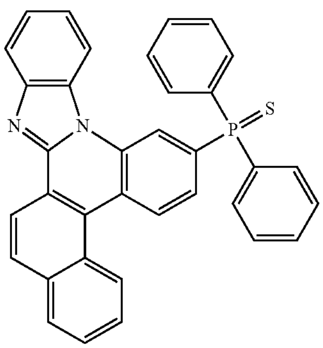
[Compound 7-218]
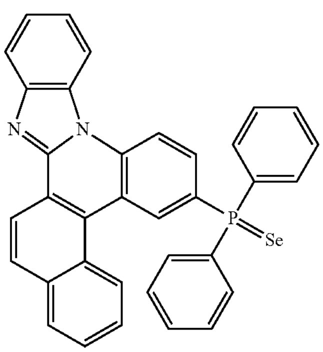
[Compound 7-219]
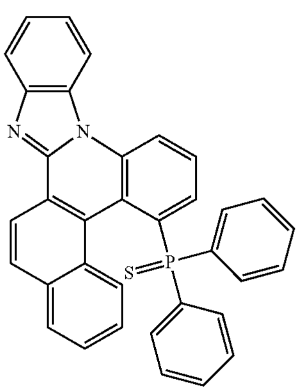
-continued
[Compound 7-220]
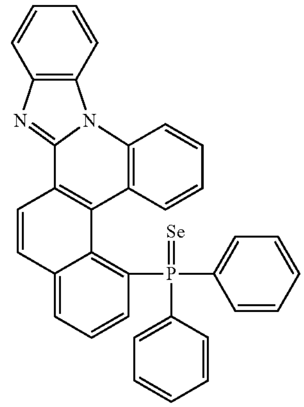
[Compound 7-221]
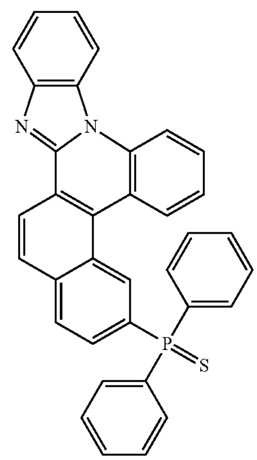
[Compound 7-222]
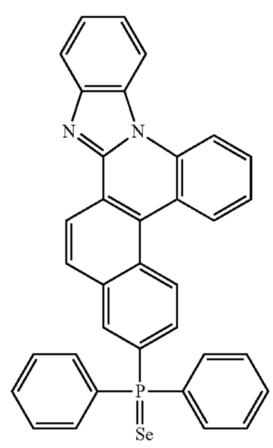

-continued
[Compound 7-223]
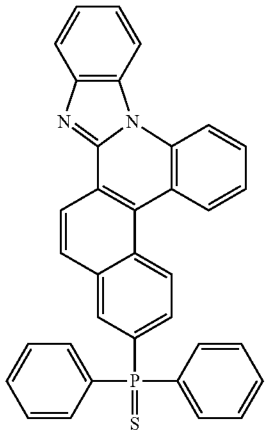
[Compound 7-224]
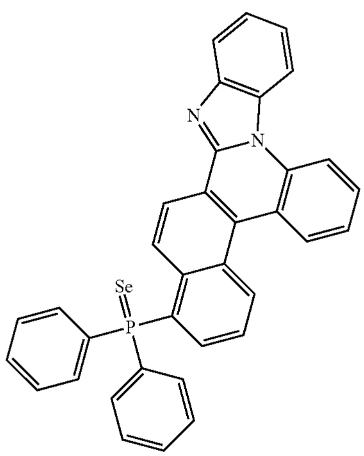
[Compound 7-225]
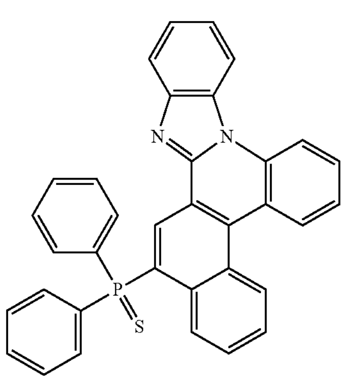
-continued
[Compound 7-226]
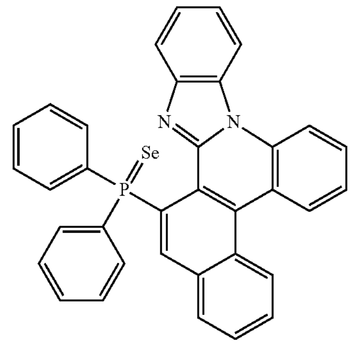
[Compound 7-227]
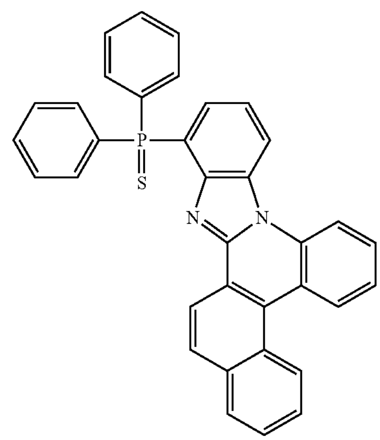
[Compound 7-228]
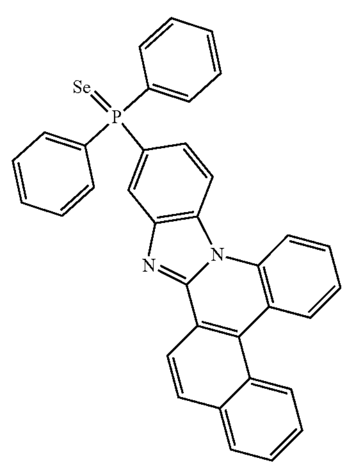

-continued
[Compound 7-229]
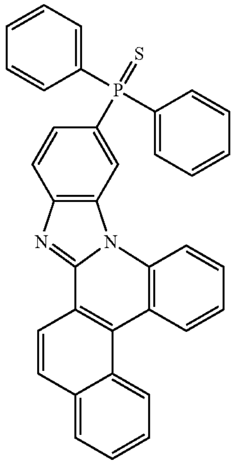
[Compound 7-230]
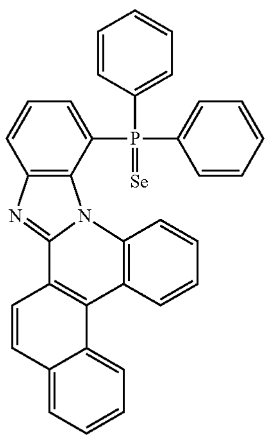
[Compound 7-231]
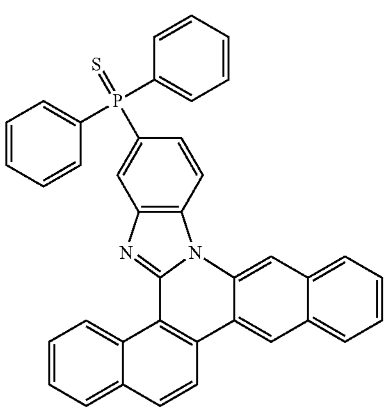
-continued
[Compound 7-232]
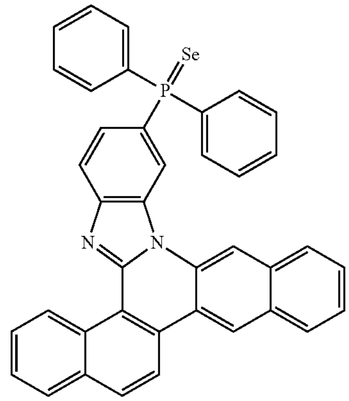
[Compound 7-233]
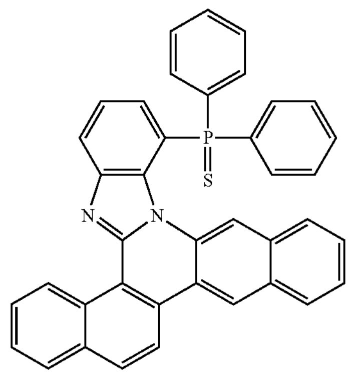
[Compound 7-234]
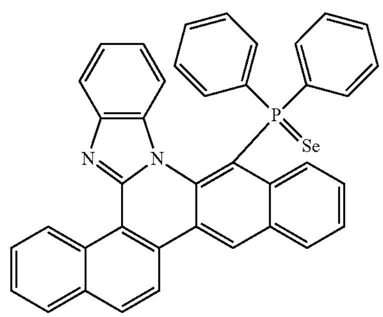
[Compound 7-235]
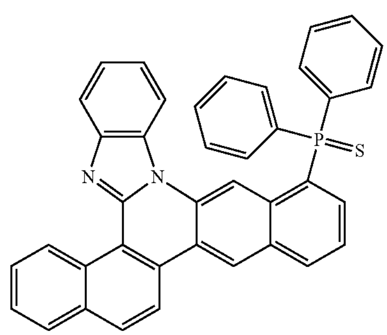

[Compound 7-236]
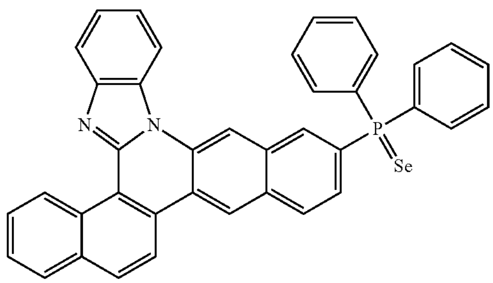
[Compound 7-237]
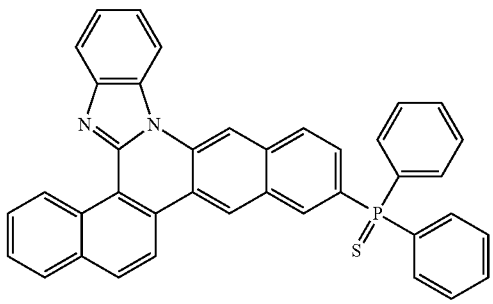
[Compound 7-238]
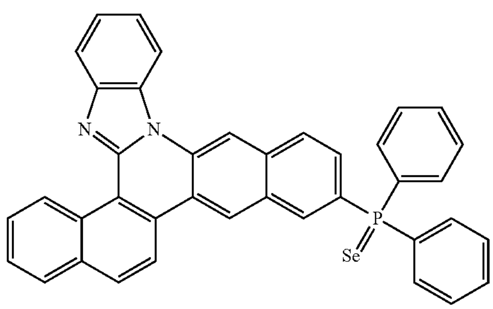
[Compound 7-239]
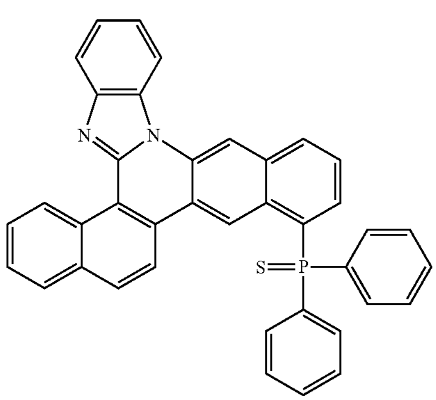
[Compound 7-240]
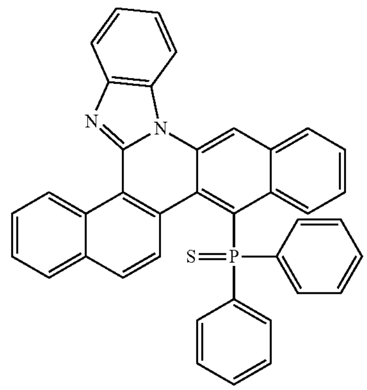
[Compound 7-241]
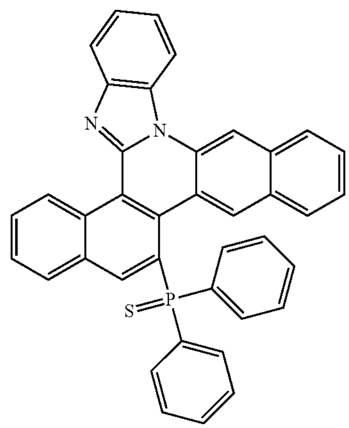
[Compound 7-242]
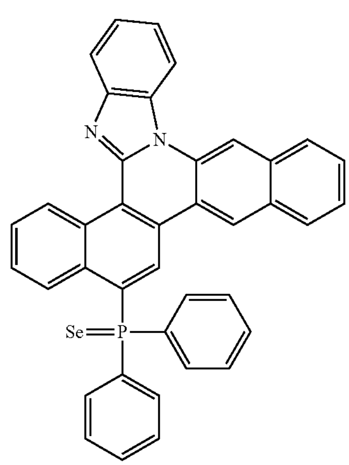

-continued
[Compound 7-243]
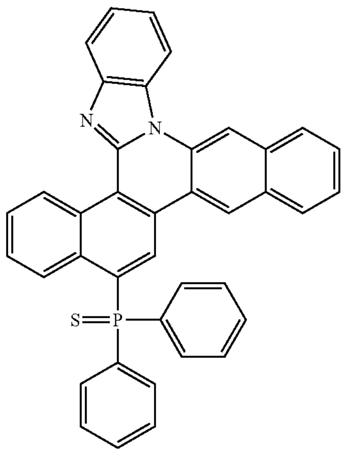
[Compound 7-244]
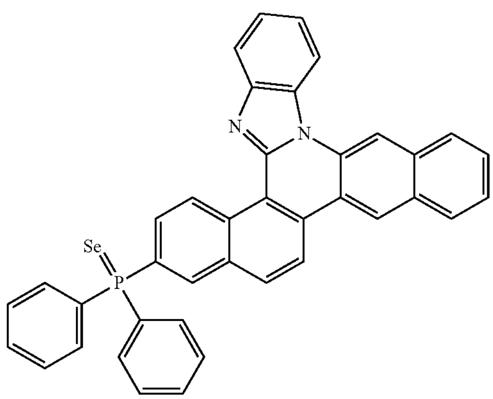
[Compound 7-245]
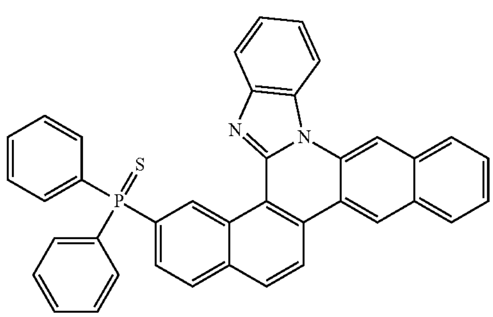
[Compound 7-246]
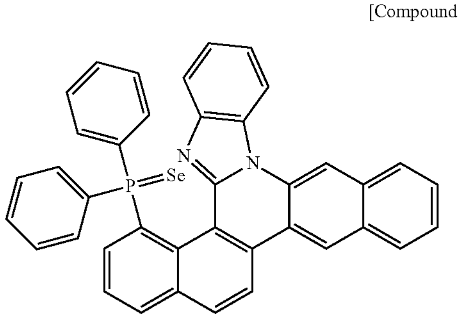
-continued
[Compound 7-247]
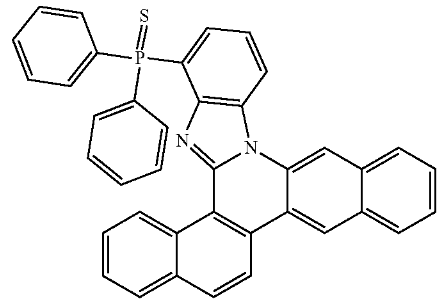
[Compound 7-248]
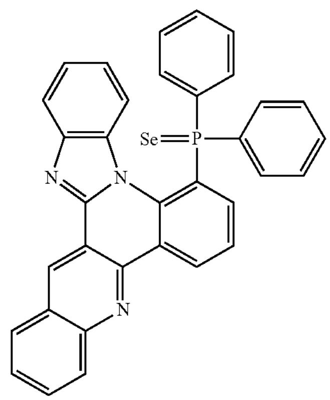
[Compound 7-249]
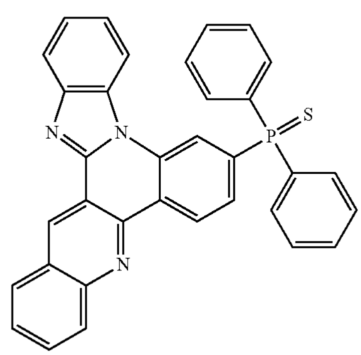
[Compound 7-250]
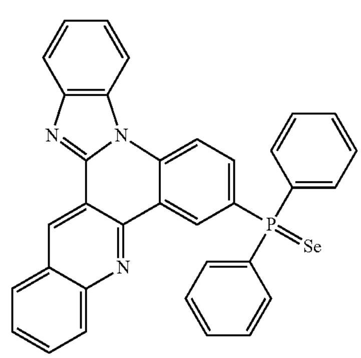

[Compound 7-251]
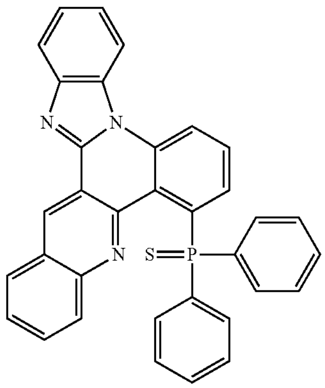
[Compound 7-252]
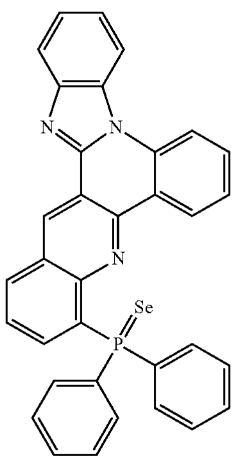
[Compound 7-253]
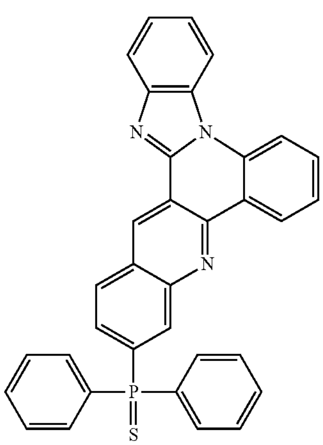
[Compound 7-254]
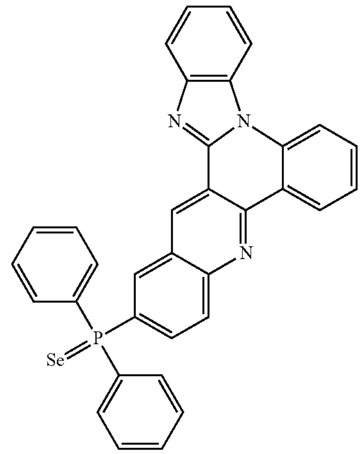
[Compound 7-255]
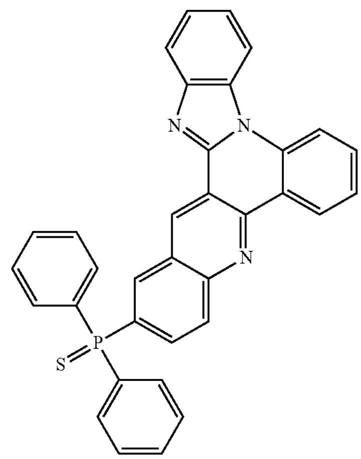
[Compound 8-1]
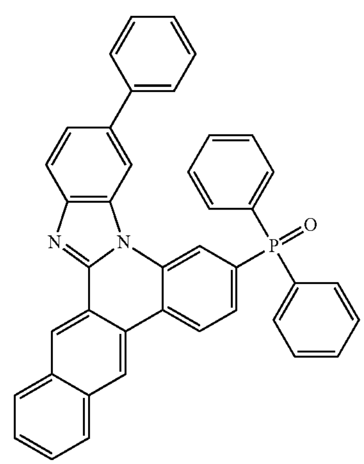

-continued
[Compound 8-2]
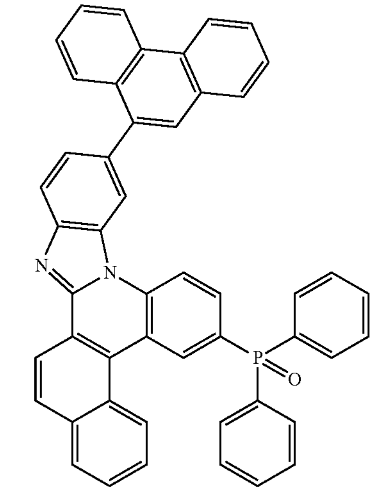
[Compound 8-3]
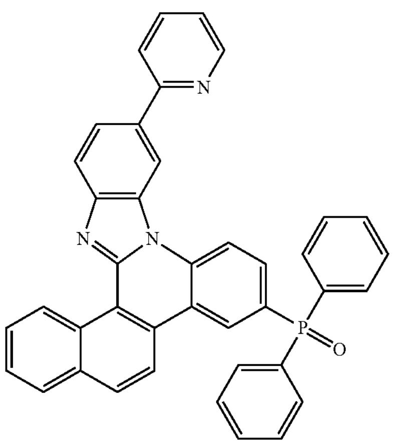
[Compound 8-4]
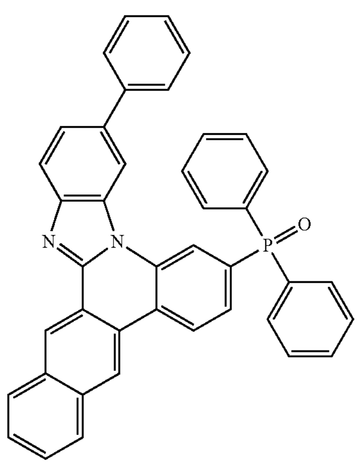
-continued
[Compound 8-5]
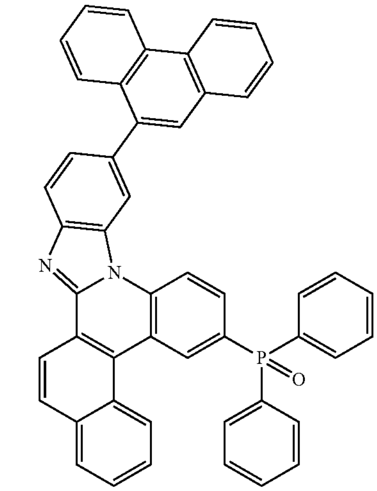
[Compound 8-6]
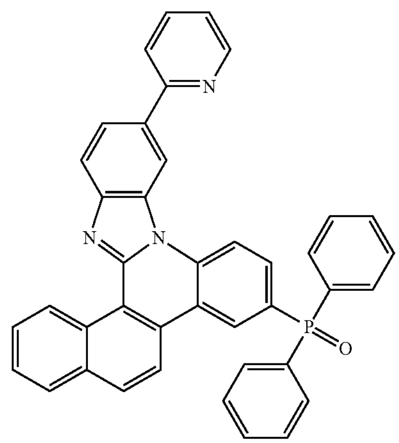
[Compound 8-7]
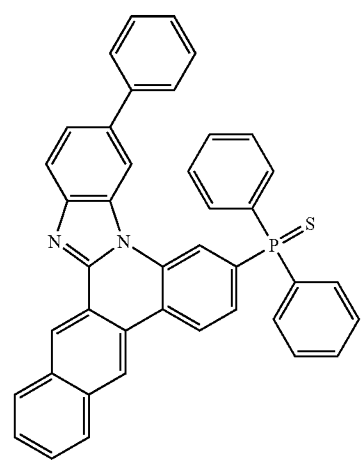

-continued
[Compound 8-8]
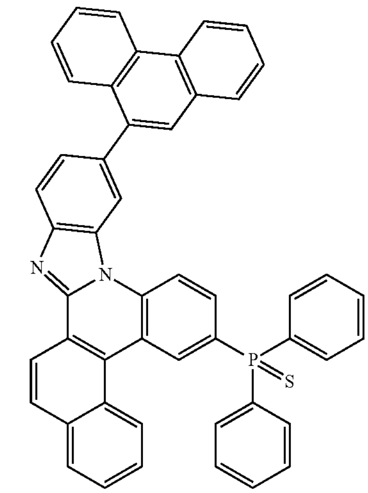
[Compound 8-9]
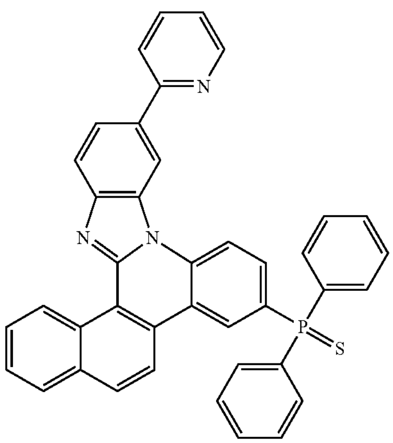
[Compound 8-10]
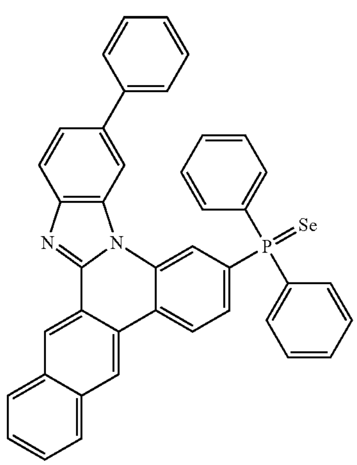
-continued
[Compound 8-11]
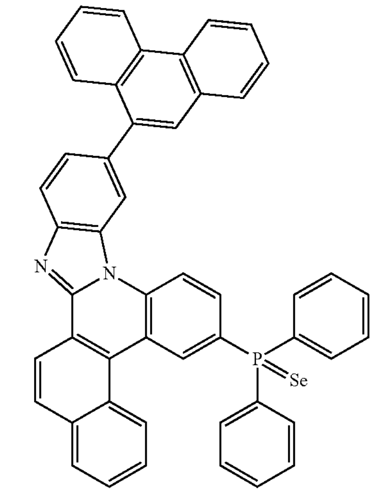
[Compound 8-12]
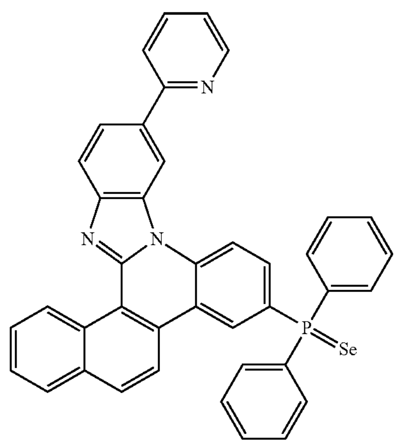
[Compound 8-13]
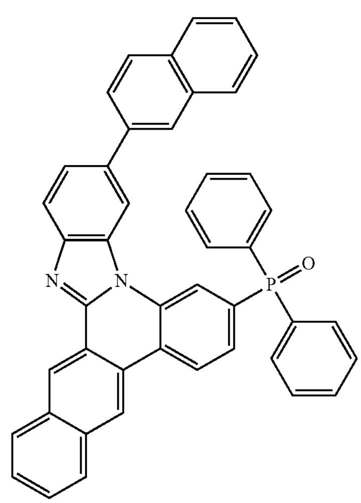

[Compound 8-14]
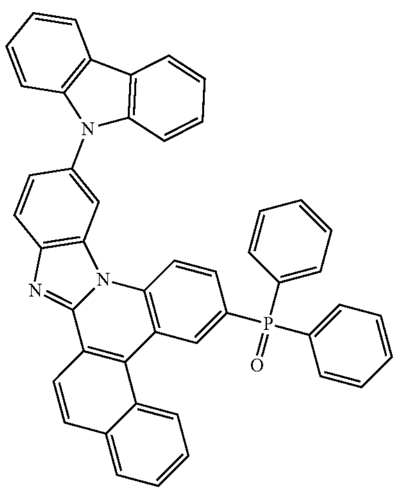
[Compound 8-15]
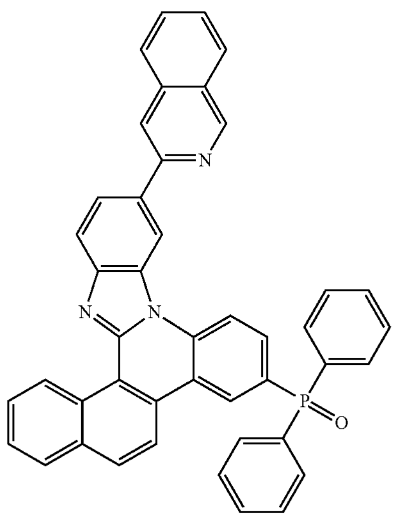
[Compound 8-16]
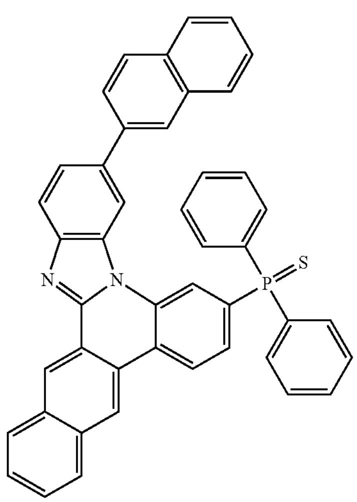
[Compound 8-17]
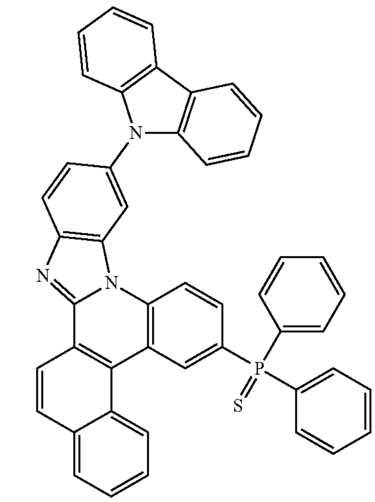
[Compound 8-18]
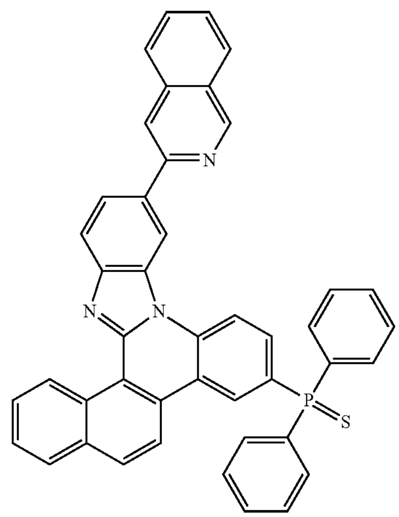
[Compound 8-19]
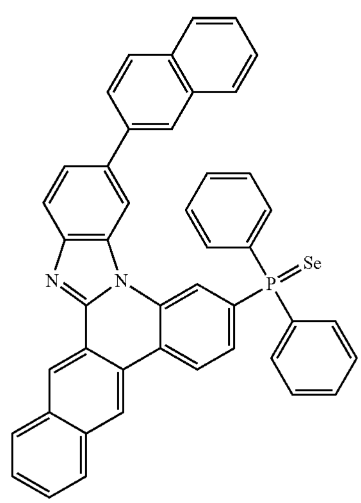

-continued
[Compound 8-20]
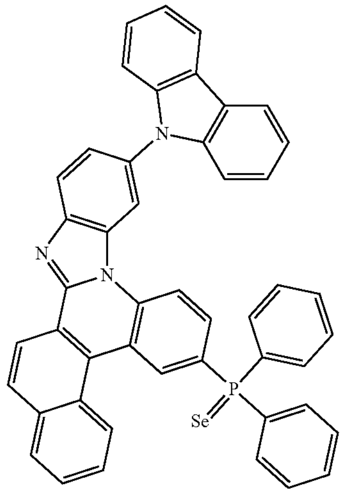
[Compound 8-21]
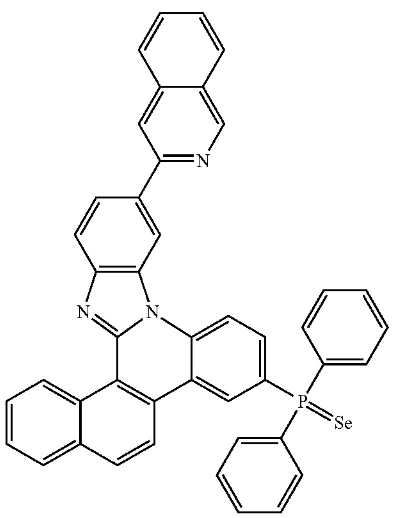
[Compound 8-22]
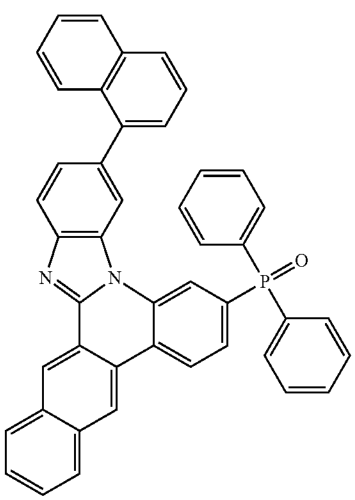
-continued
[Compound 8-23]
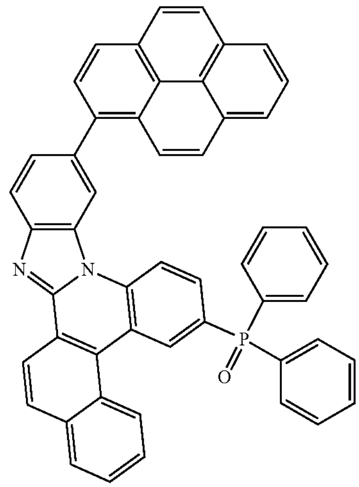
[Compound 8-24]
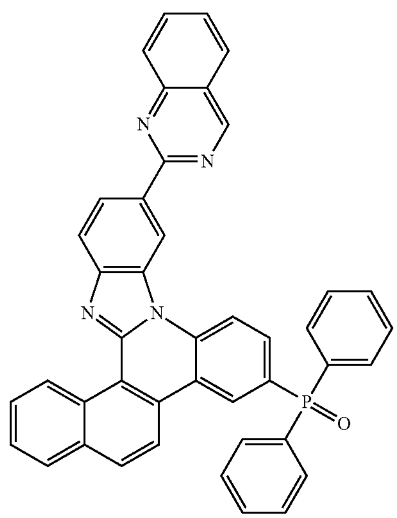
[Compound 8-25]
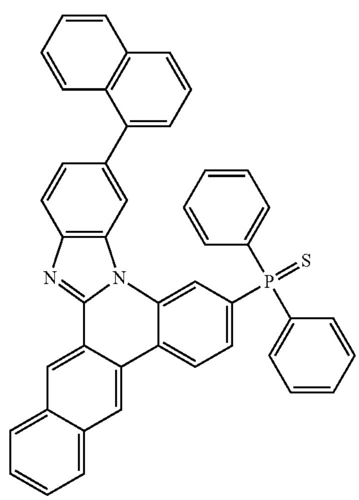

-continued
[Compound 8-26]
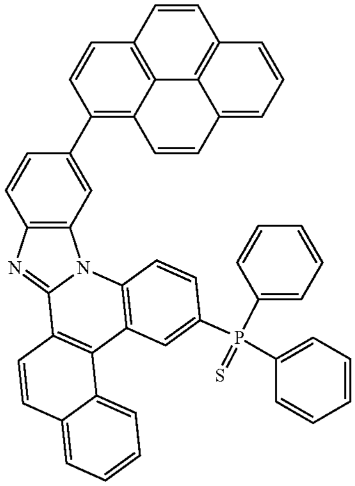
[Compound 8-27]
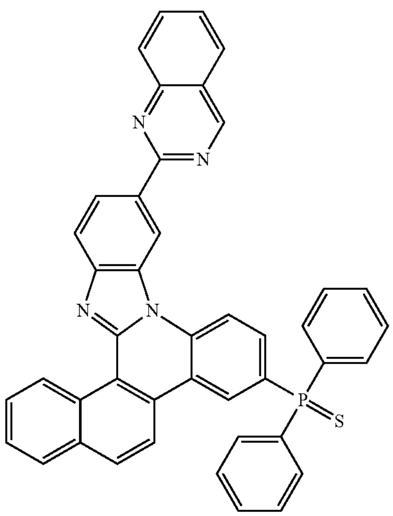
[Compound 8-28]
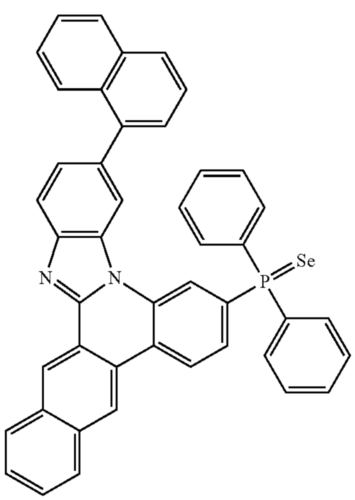
-continued
[Compound 8-29]
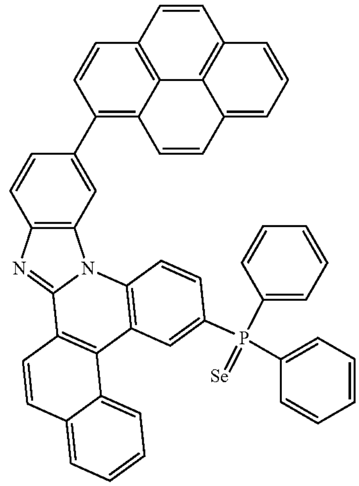
[Compound 8-30]
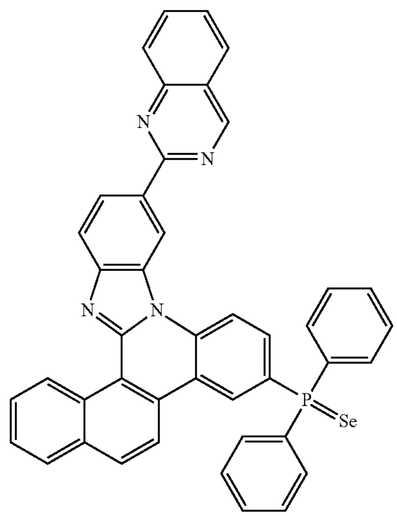
[Compound 8-31]
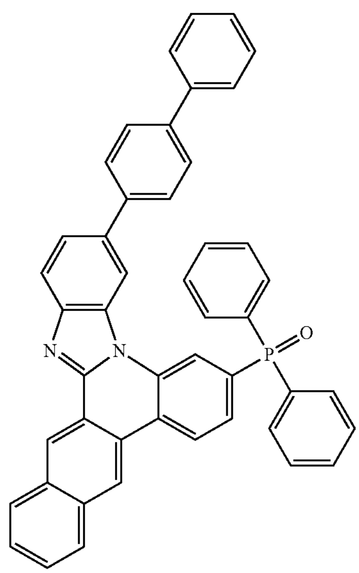

-continued
[Compound 8-32]
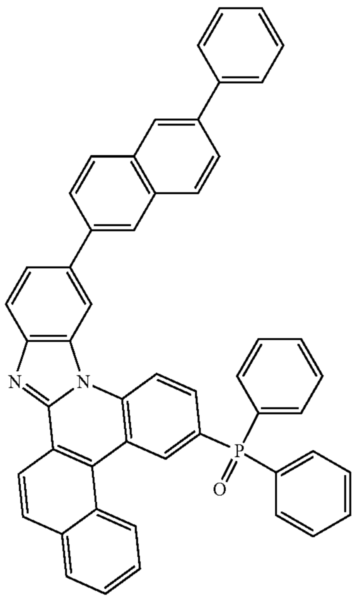
[Compound 8-33]
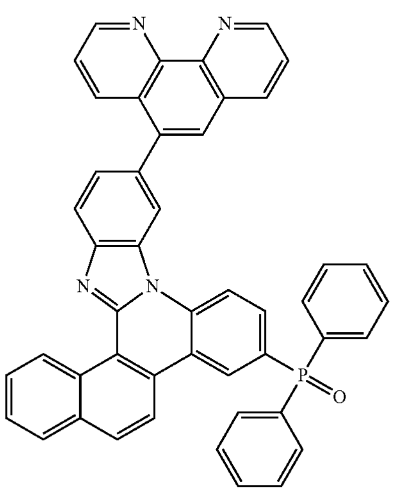
-continued
[Compound 8-34]
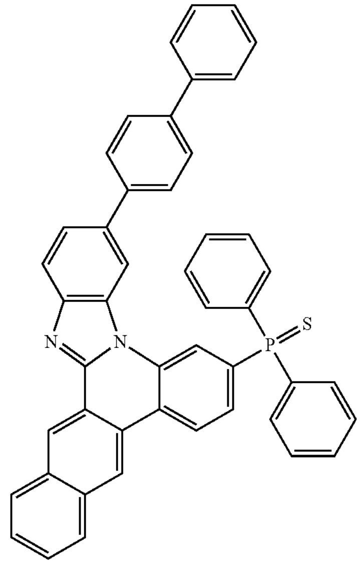
[Compound 8-35]
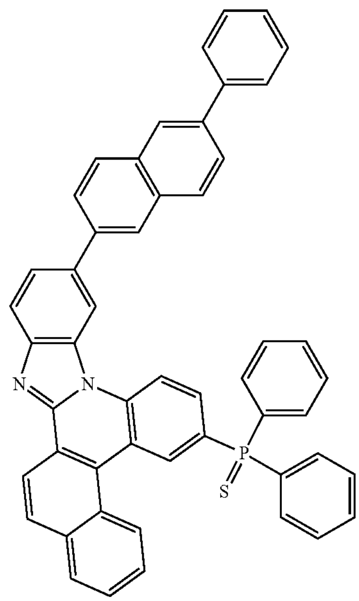
[Compound 8-36]
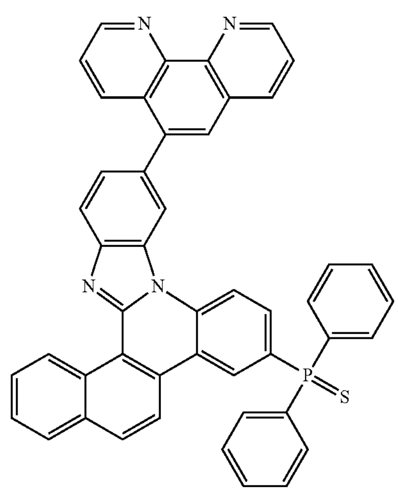

-continued
[Compound 8-37]
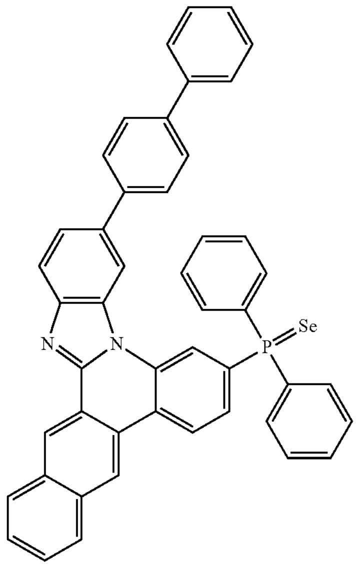
[Compound 8-38]
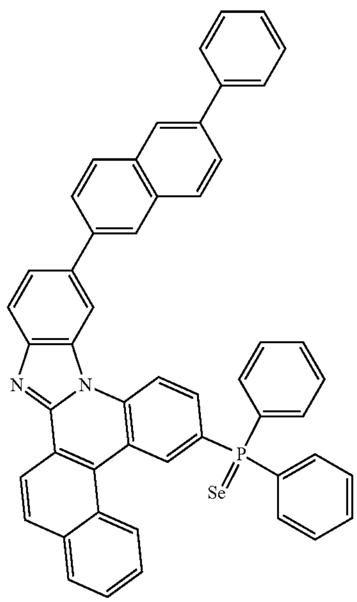
[Compound 8-39]
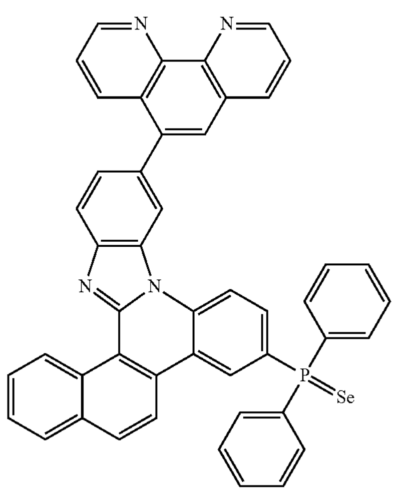
-continued
[Compound 8-40]
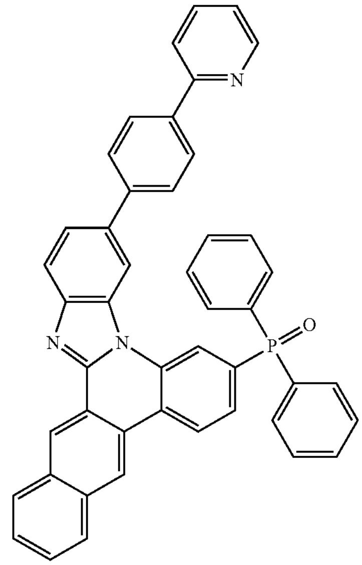
[Compound 8-41]
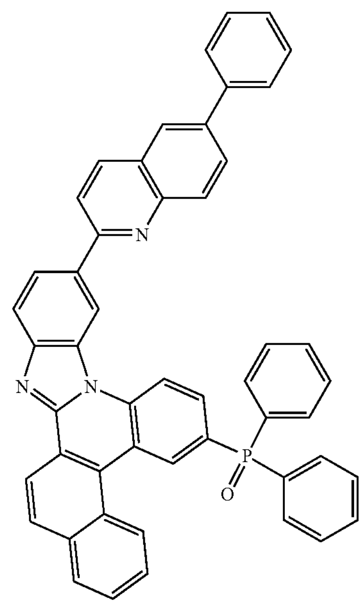
[Compound 8-42]
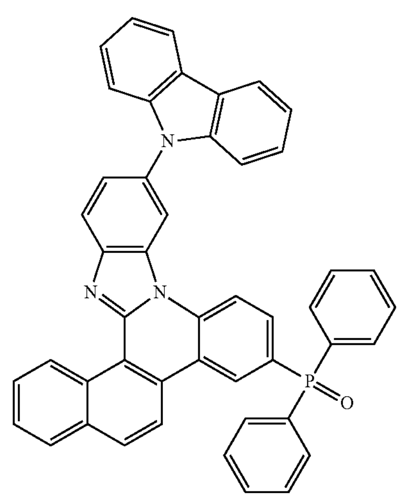

-continued
[Compound 8-43]
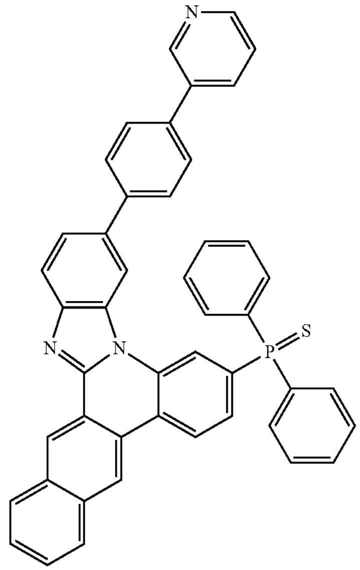
[Compound 8-44]
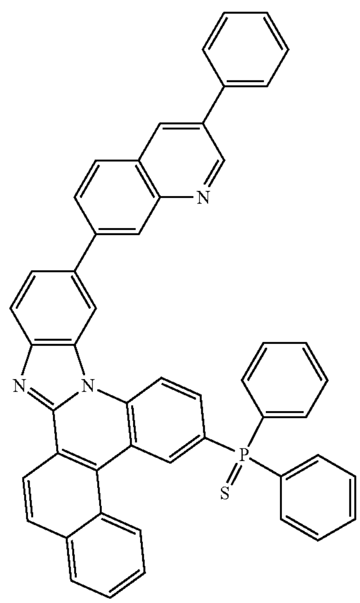
[Compound 8-45]
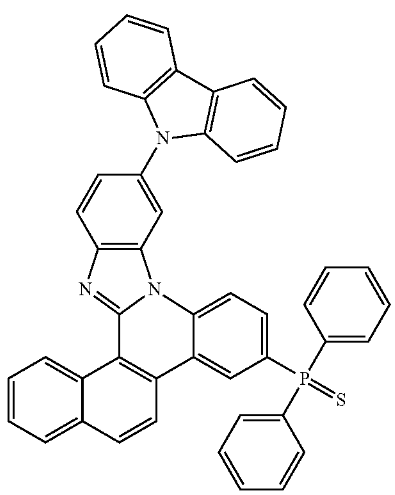
-continued
[Compound 8-46]
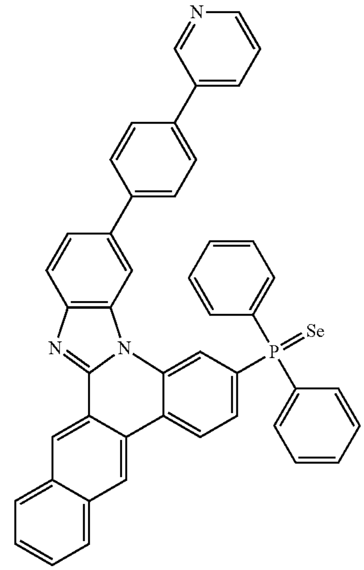
[Compound 8-47]
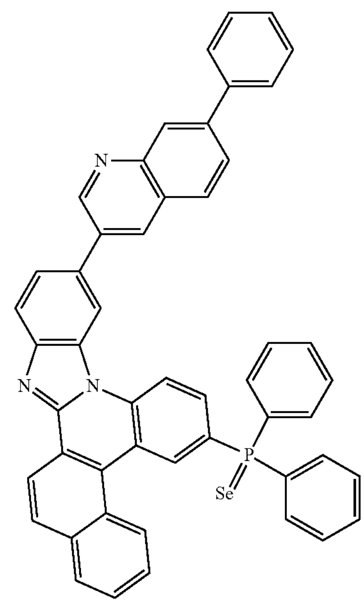
[Compound 8-48]
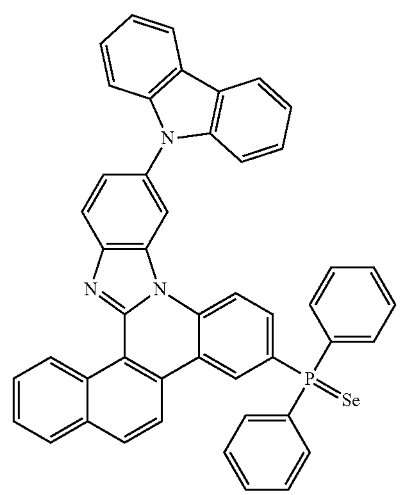

-continued
[Compound 8-49]
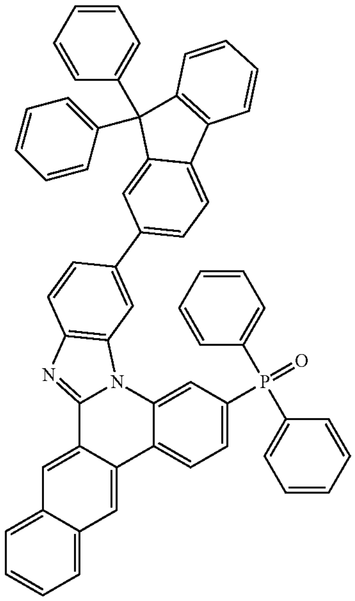
[Compound 8-50]
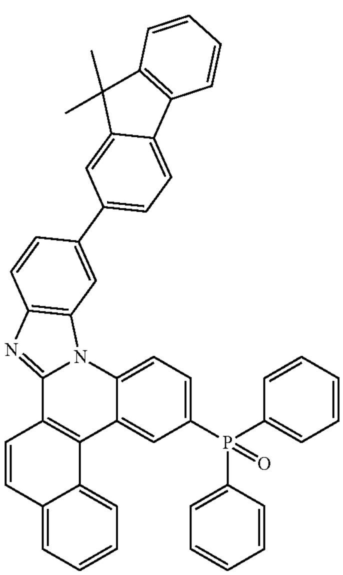
-continued
[Compound 8-51]
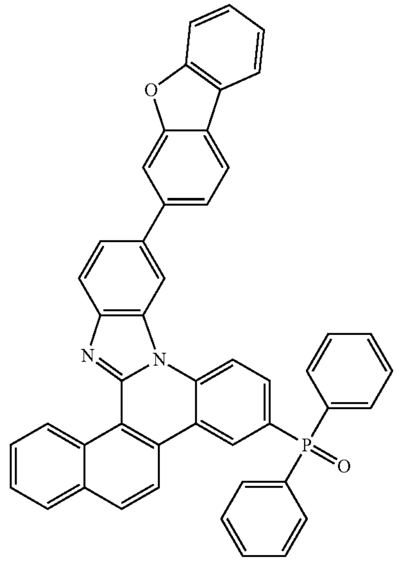
[Compound 8-52]
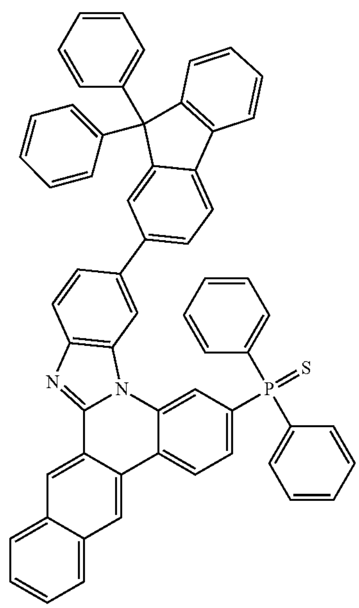

-continued
[Compound 8-53]
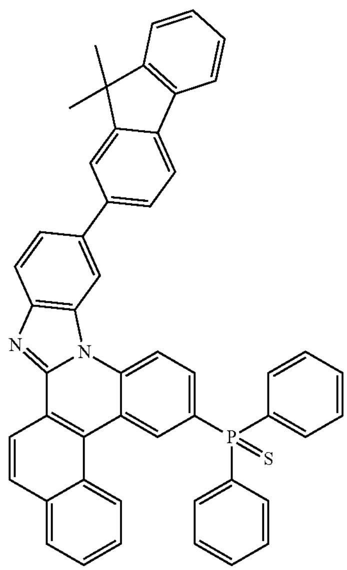
[Compound 8-54]
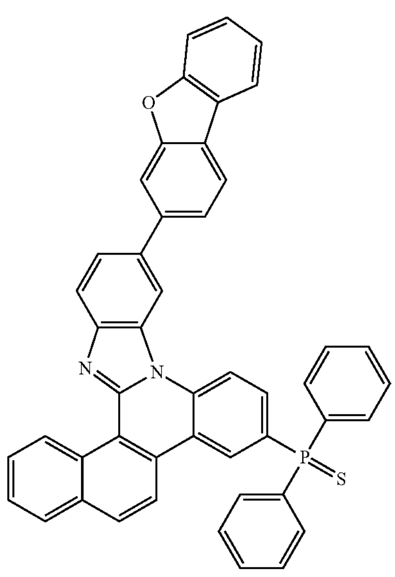
-continued
[Compound 8-55]
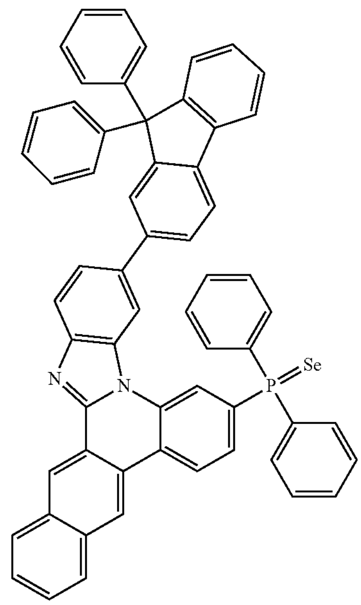
[Compound 8-56]
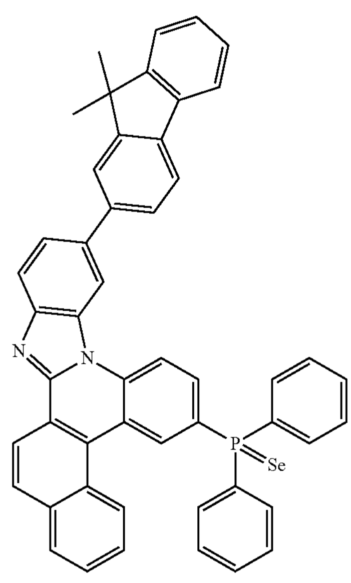

[Compound 8-57]
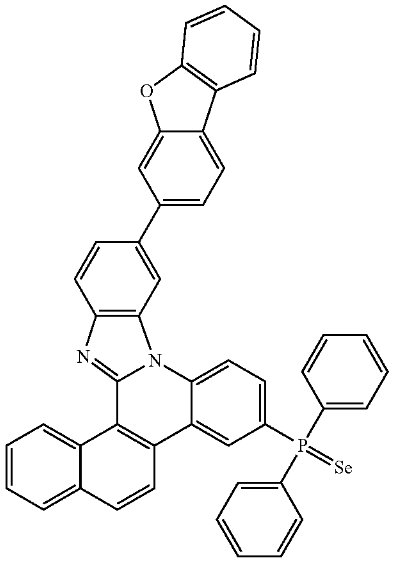
[Compound 8-58]
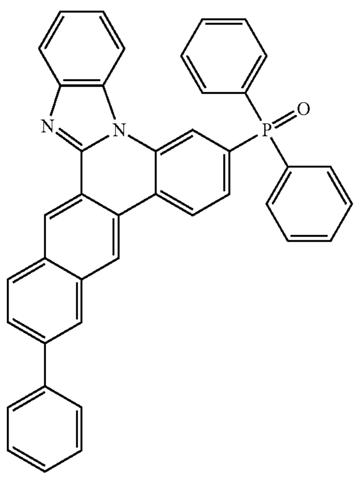
[Compound 8-59]
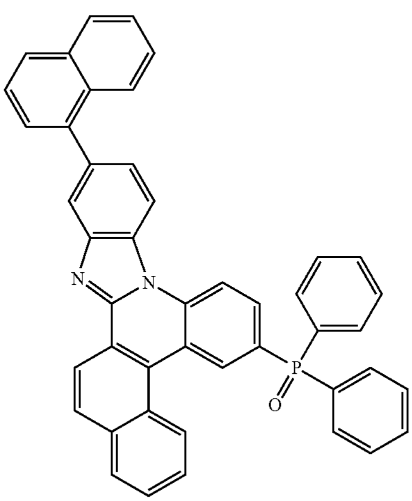
[Compound 8-60]
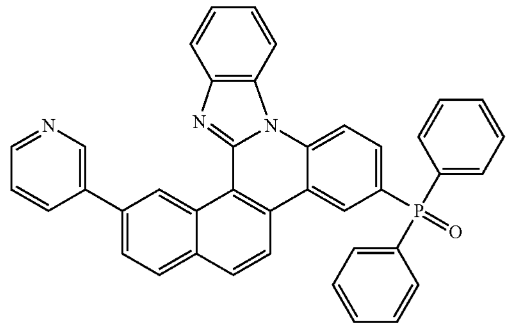
[Compound 8-61]
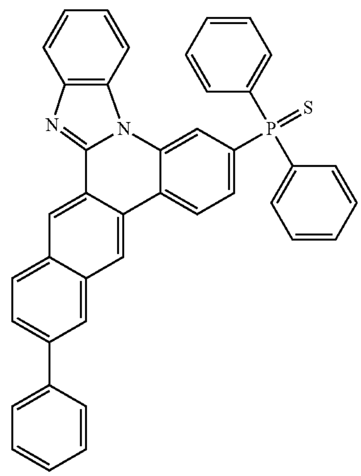
[Compound 8-62]
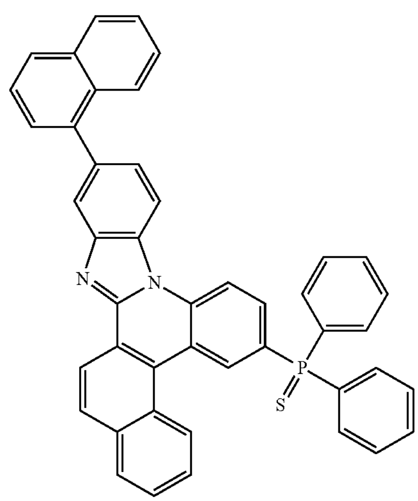

[Compound 8-63]
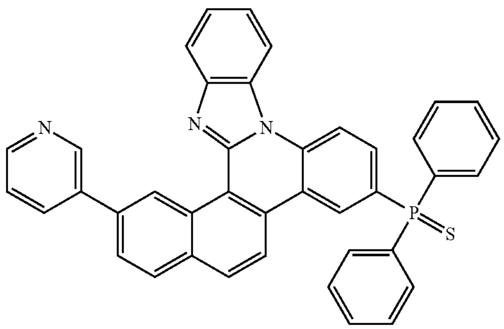
[Compound 8-64]
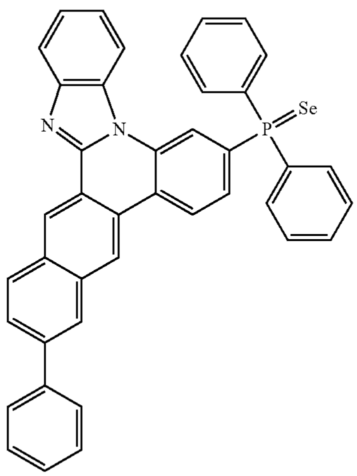
[Compound 8-65]
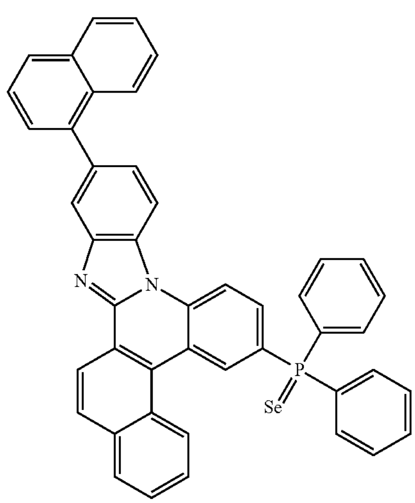
[Compound 8-66]
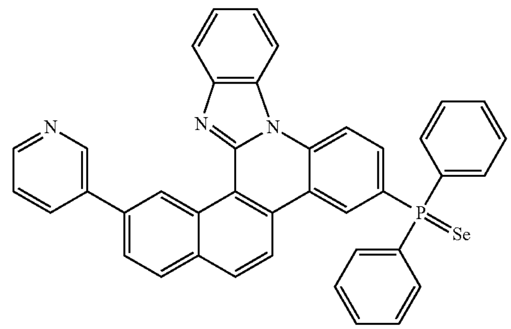
[Compound 8-67]
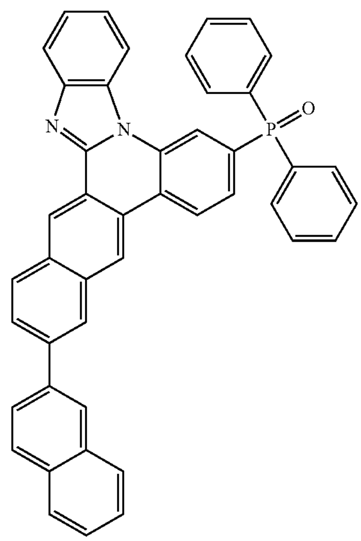
[Compound 8-68]
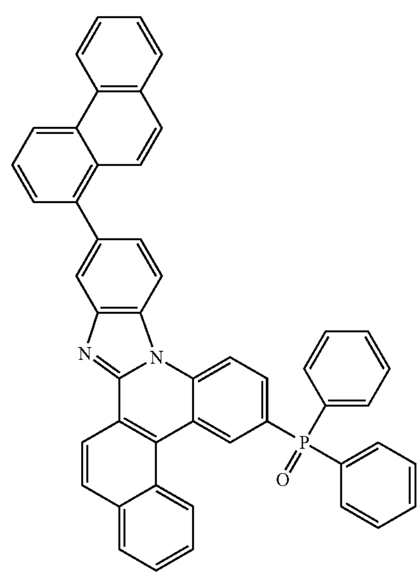

-continued
[Compound 8-69]
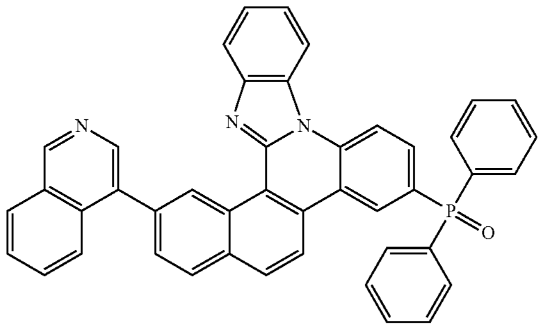
[Compound 8-70]
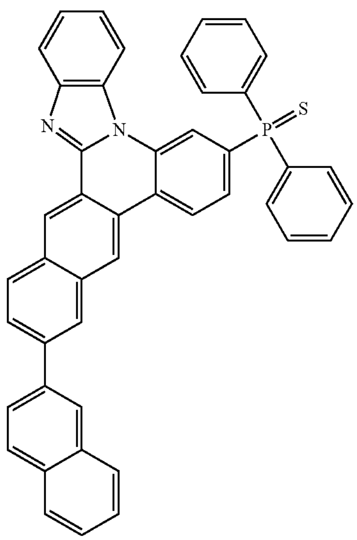
[Compound 8-71]
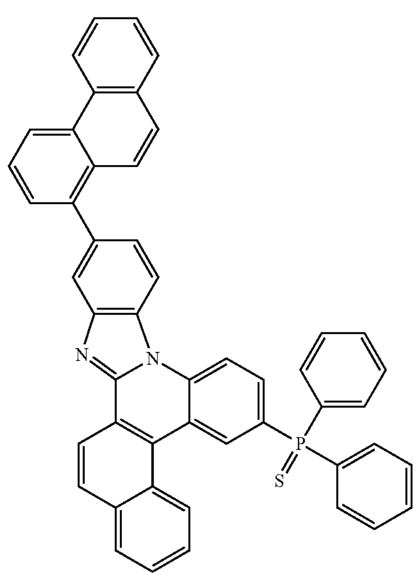
-continued
[Compound 8-72]
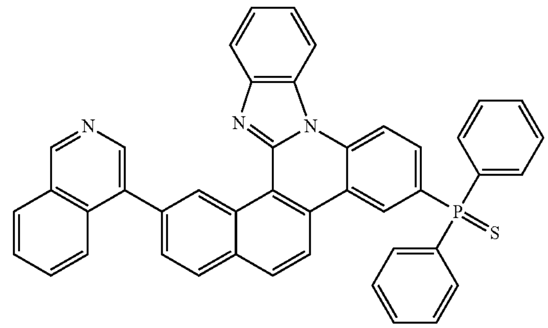
[Compound 8-73]
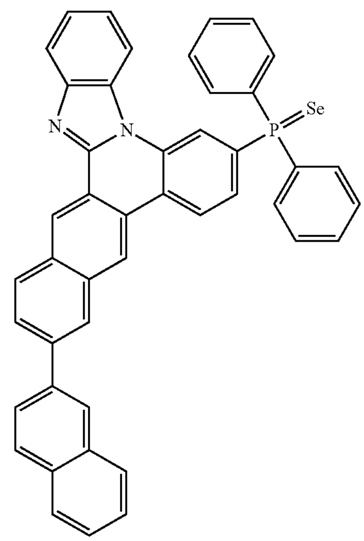
[Compound 8-74]
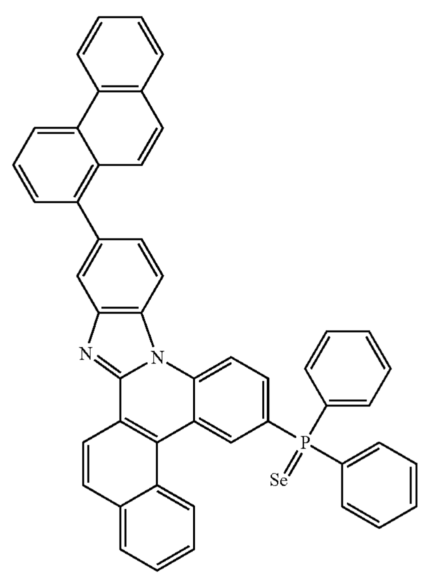

-continued
[Compound 8-75]
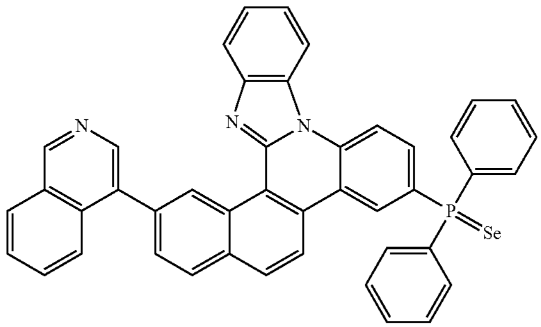
[Compound 9-1]
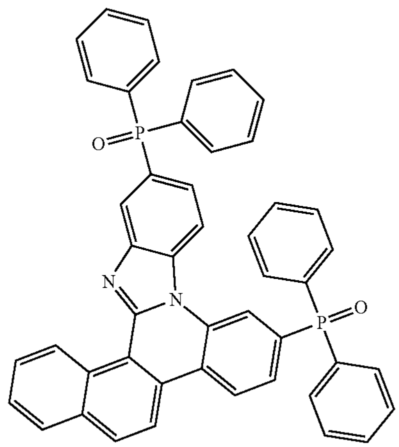
[Compound 9-2]
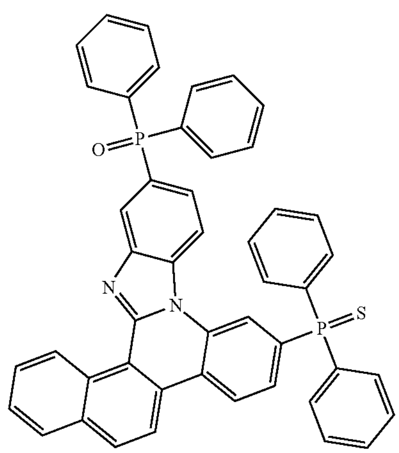
-continued
[Compound 9-3]
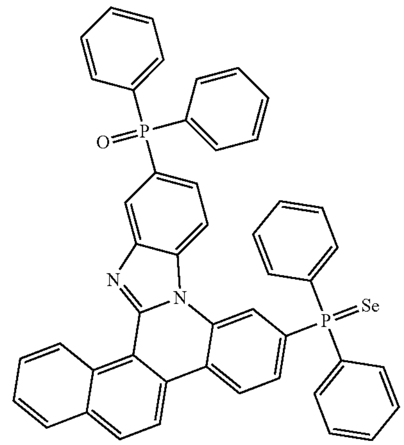
[Compound 9-4]
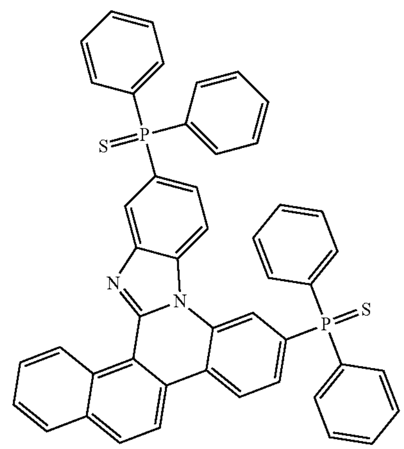
[Compound 9-5]
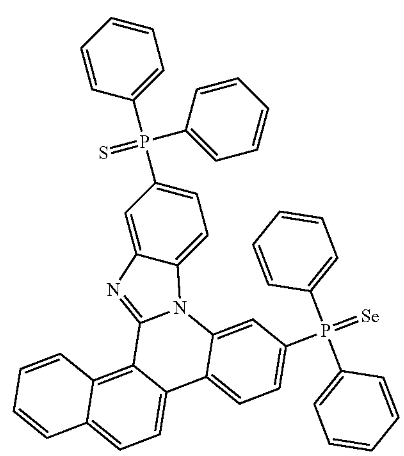

-continued
[Compound 9-6]
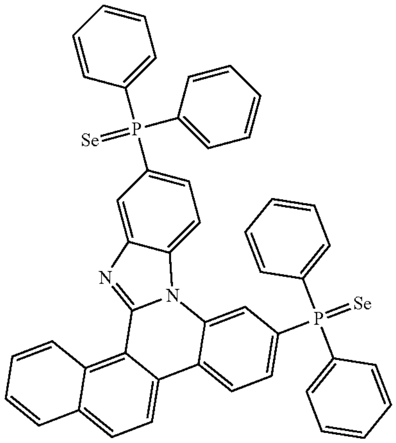
[Compound 9-7]
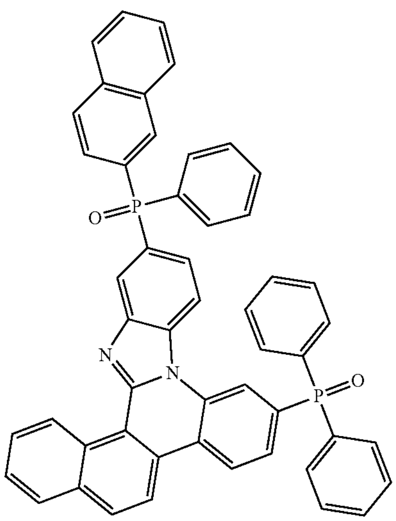
[Compound 9-8]
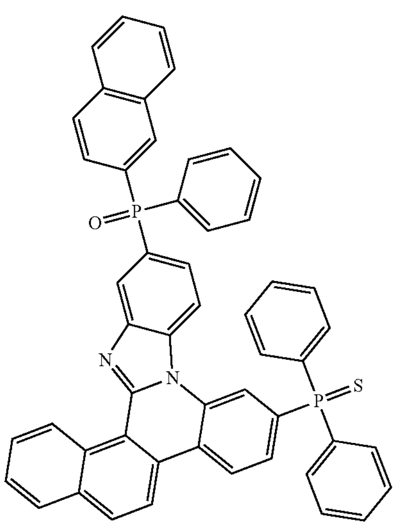
-continued
[Compound 9-9]
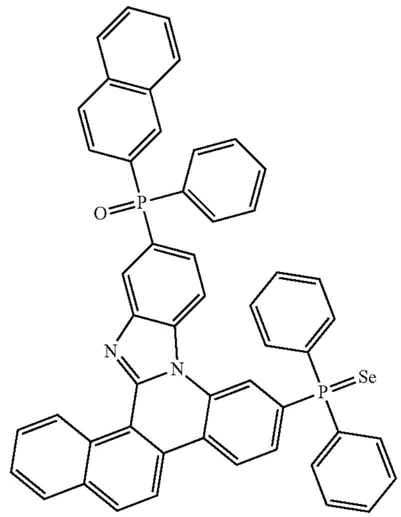
[Compound 9-10]
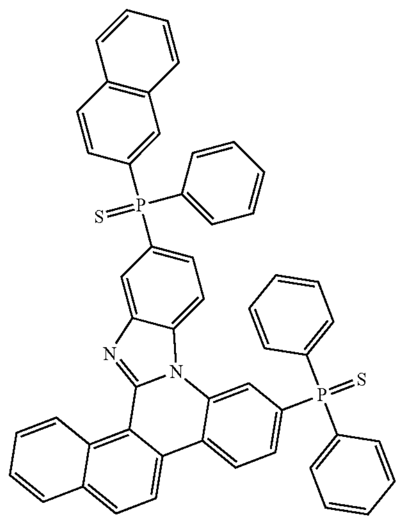
[Compound 9-11]
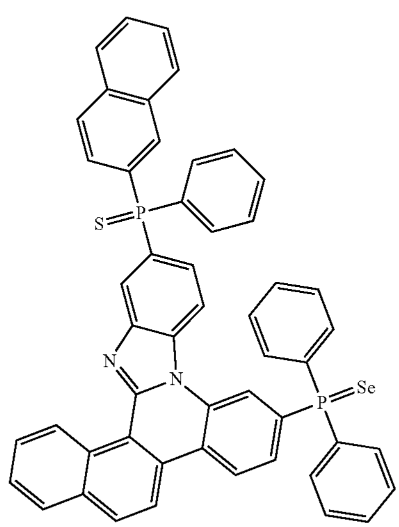

-continued
[Compound 9-12]
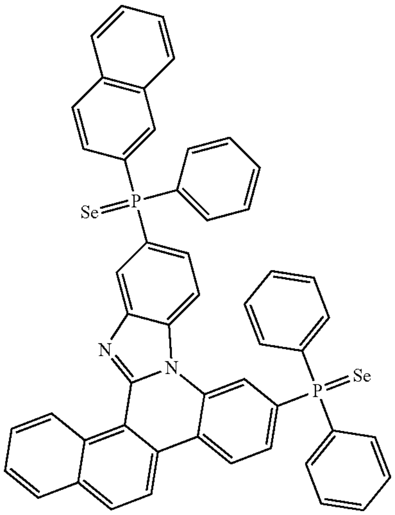
[Compound 9-13]
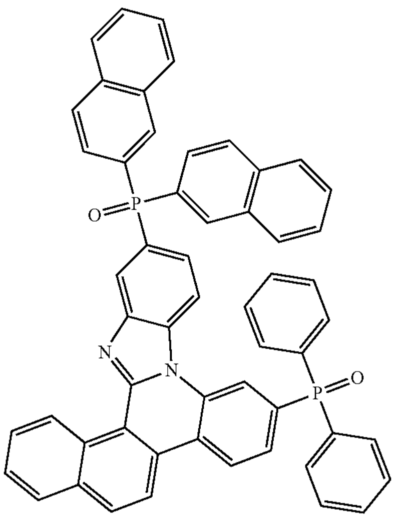
[Compound 9-14]
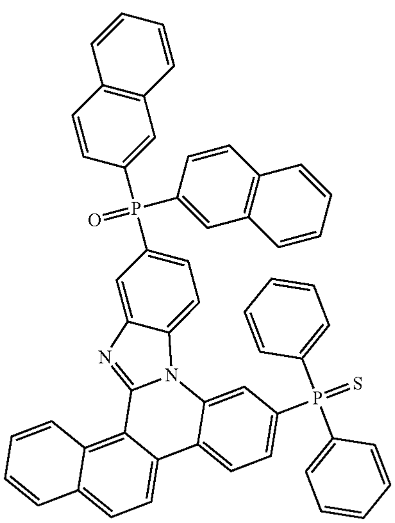
-continued
[Compound 9-15]
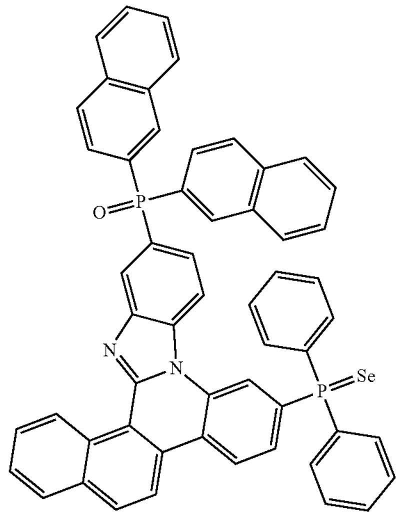
[Compound 9-16]
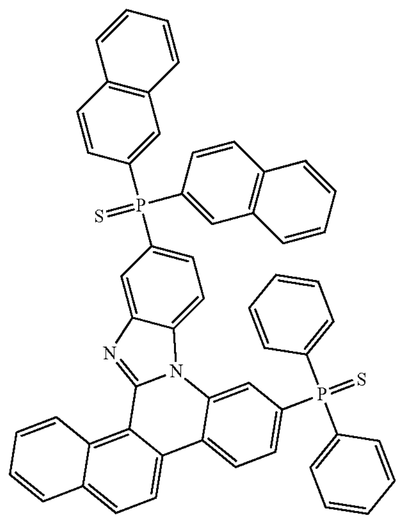
[Compound 9-17]
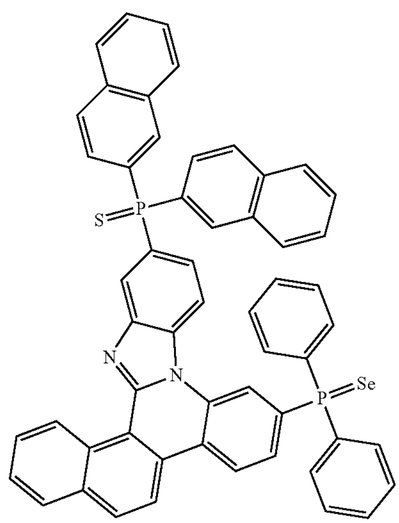

-continued
[Compound 9-18]
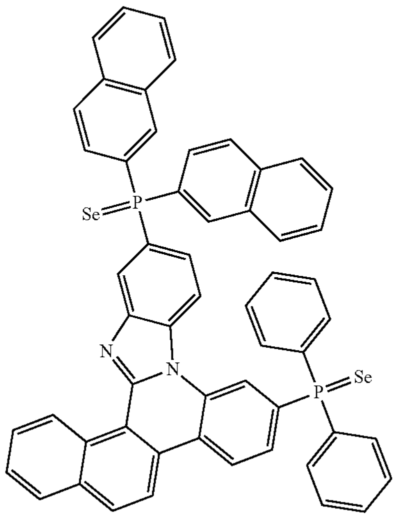
[Compound 9-19]
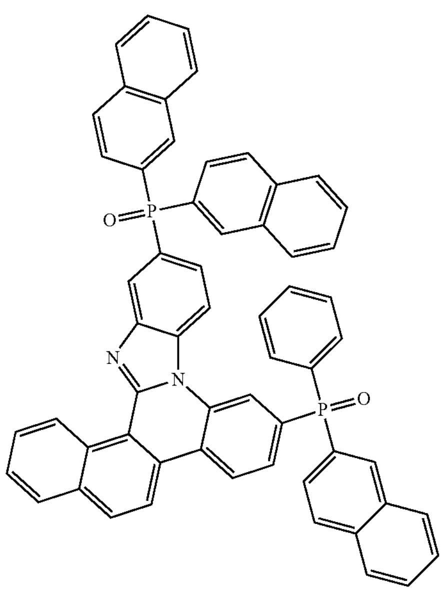
-continued
[Compound 9-20]
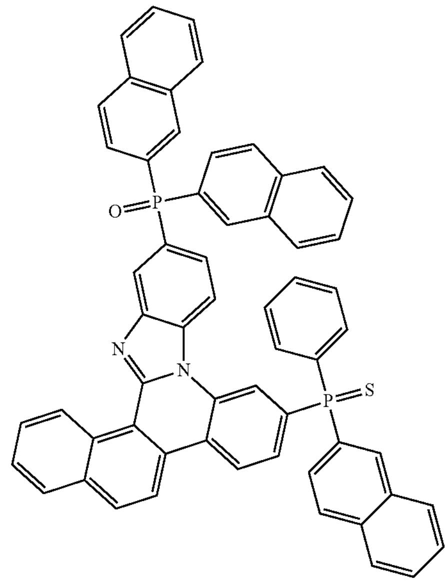
[Compound 9-21]
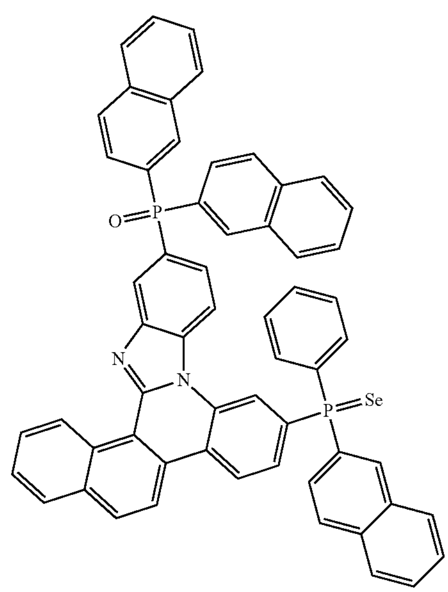

-continued
[Compound 9-22]
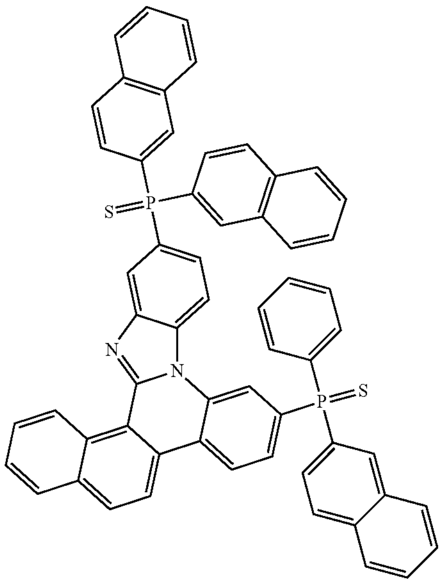
[Compound 9-23]
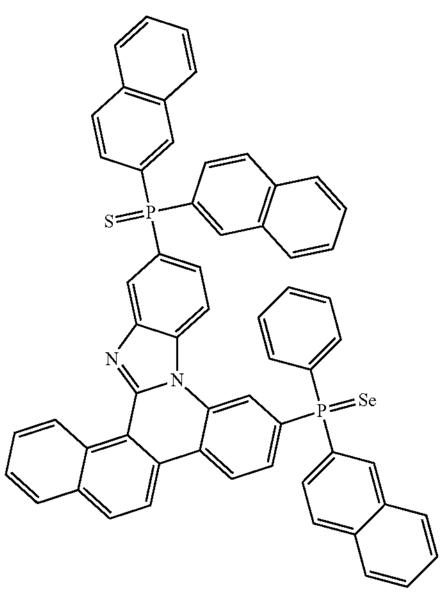
-continued
[Compound 9-24]
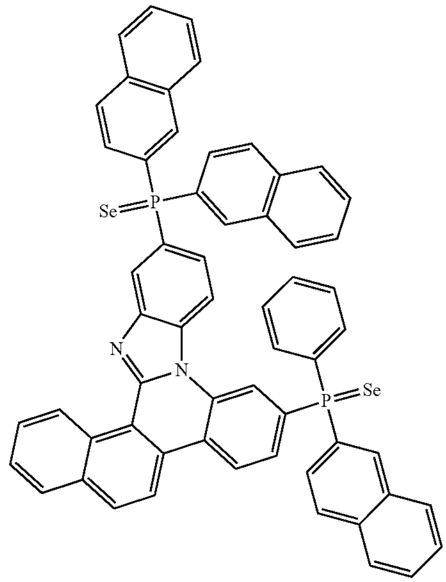
[Compound 9-25]
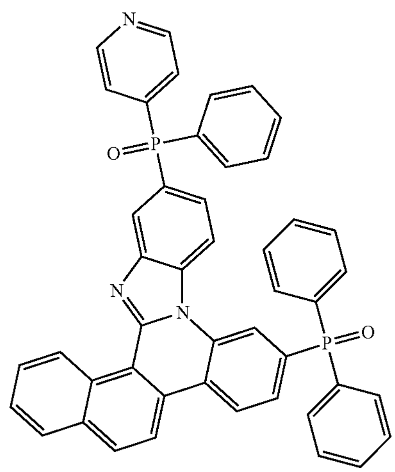
[Compound 9-26]
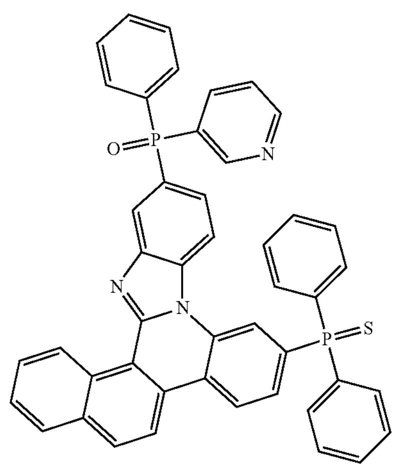

-continued
[Compound 9-27]
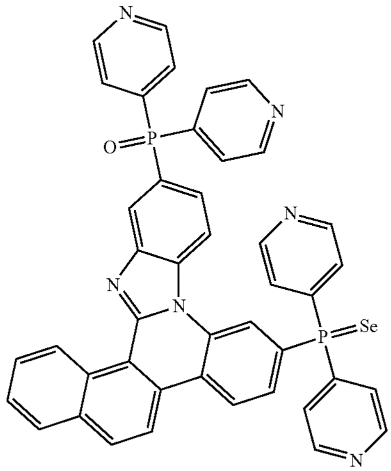
[Compound 9-28]
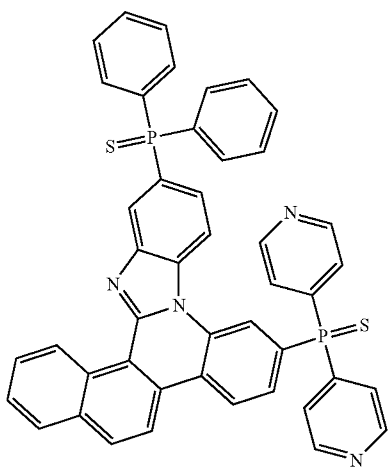
[Compound 9-29]
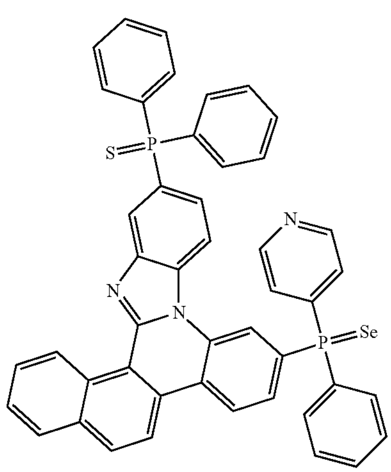
-continued
[Compound 9-30]
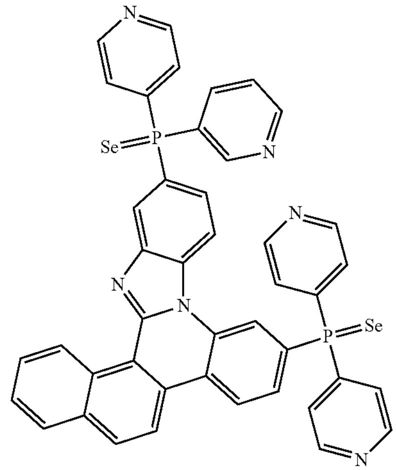
[Compound 9-31]
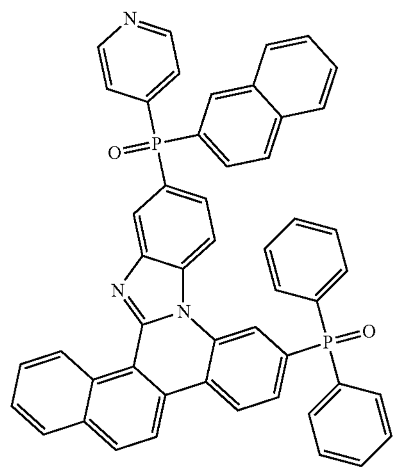
[Compound 9-32]
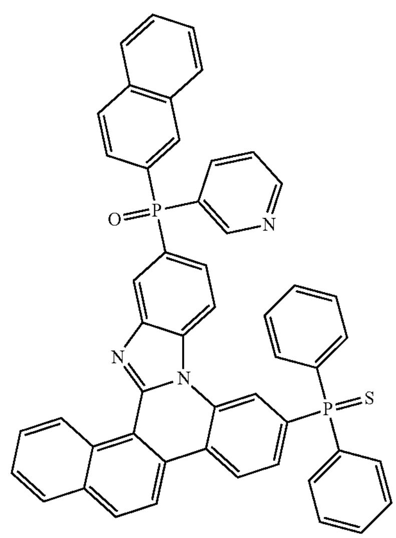

-continued
[Compound 9-33]
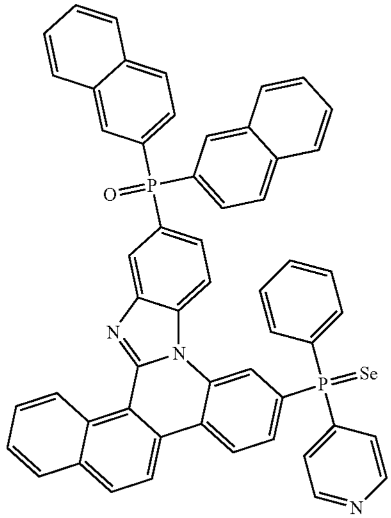
[Compound 9-34]
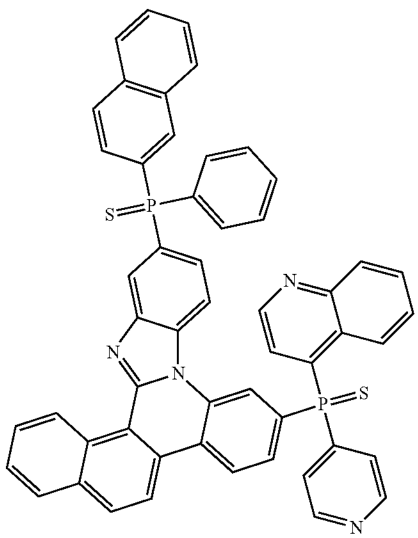
[Compound 9-35]
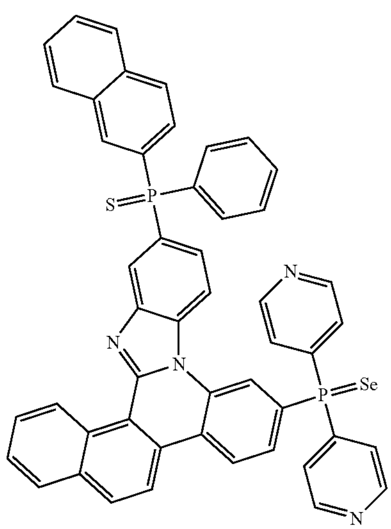
-continued
[Compound 9-36]
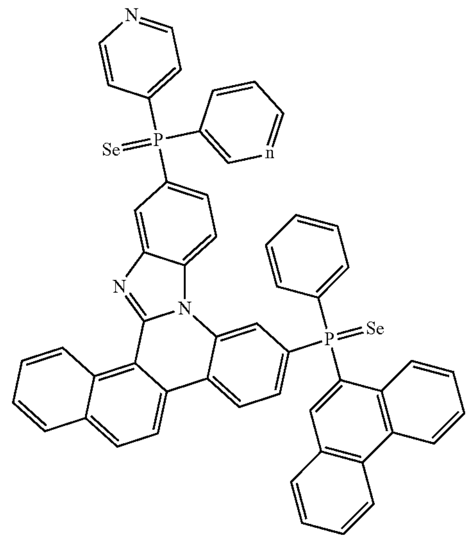
[Compound 10-1]
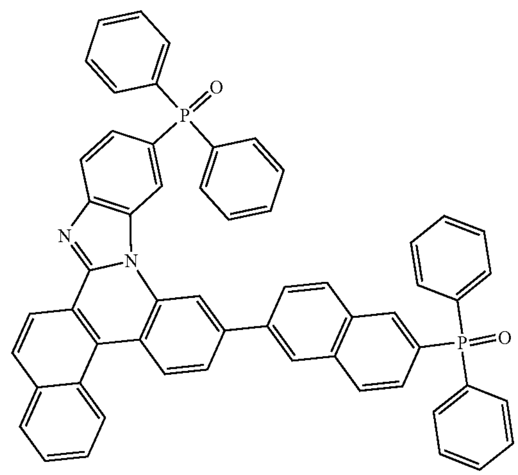
[Compound 10-2]
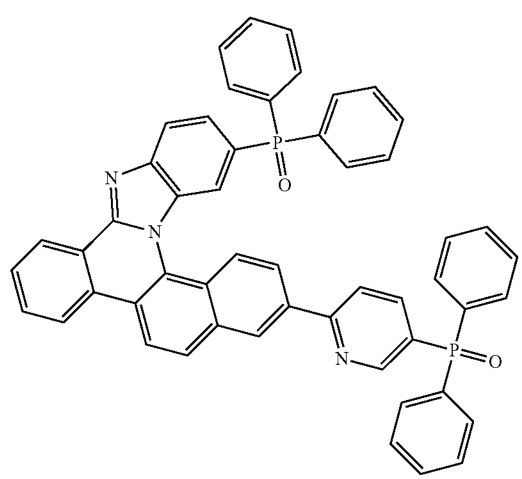

-continued
[Compound 10-3
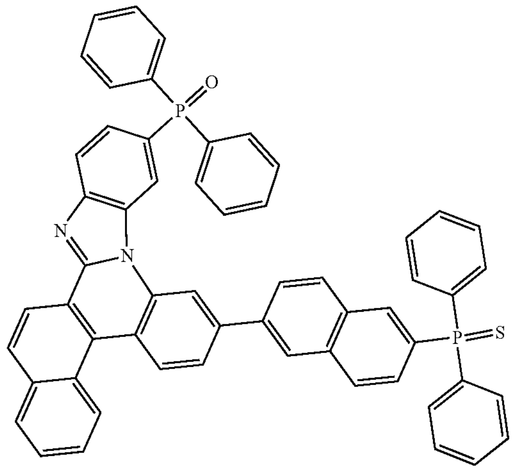
[Compound 10-4]
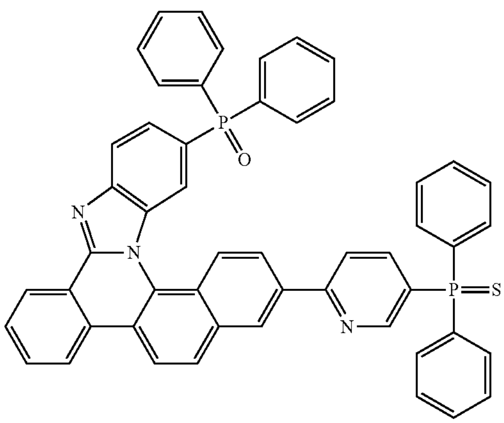
[Compound 10-5]
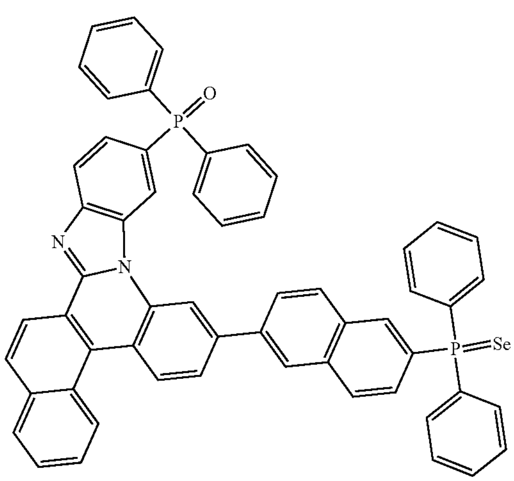
-continued
[Compound 10-6]
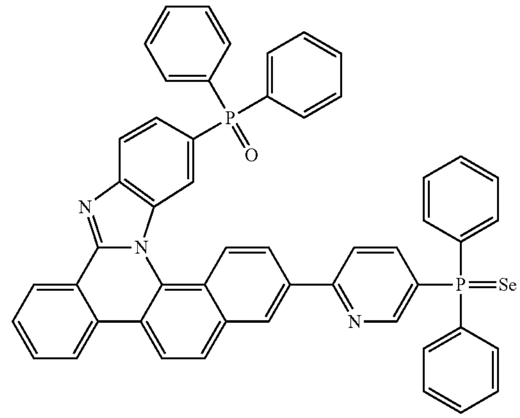
[Compound 10-7]
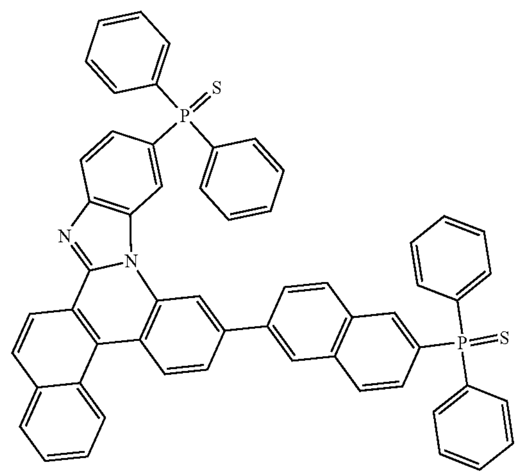
[Compound 10-8]
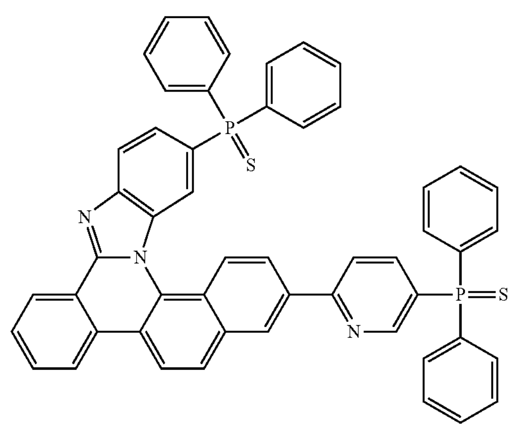

-continued
[Compound 10-9]
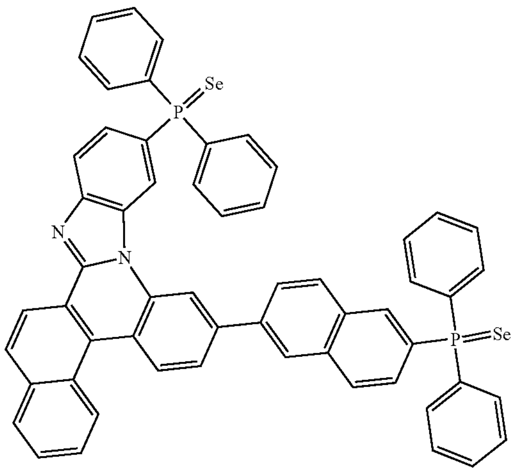
[Compound 10-10]
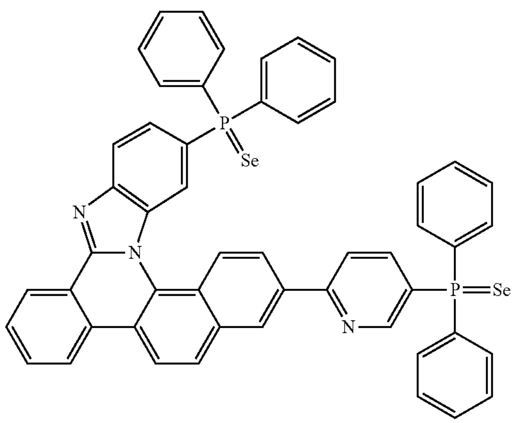
[Compound 10-11]
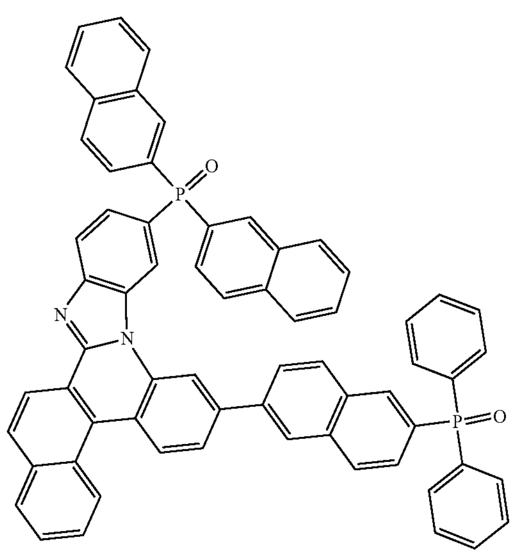
-continued
[Compound 10-12]
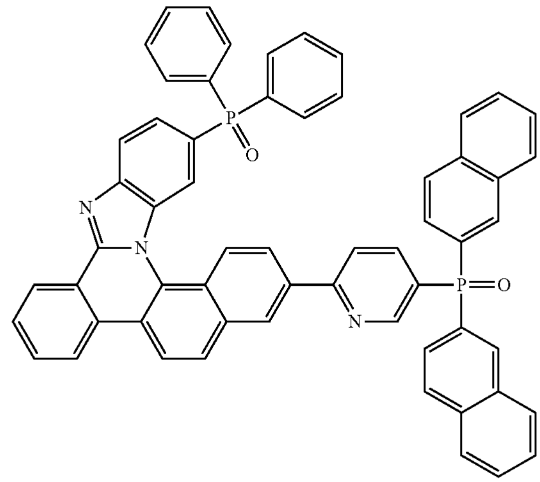
[Compound 10-13]
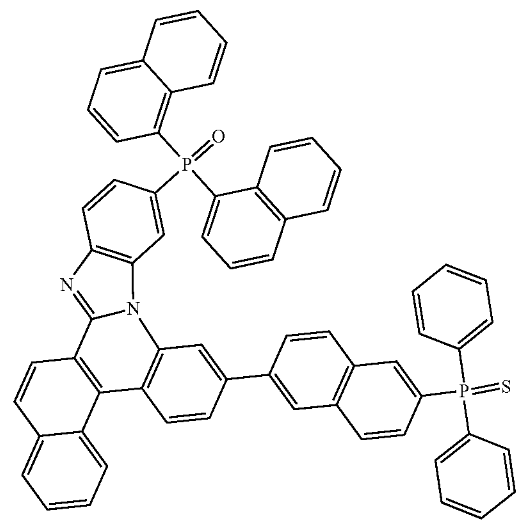
[Compound 10-14]
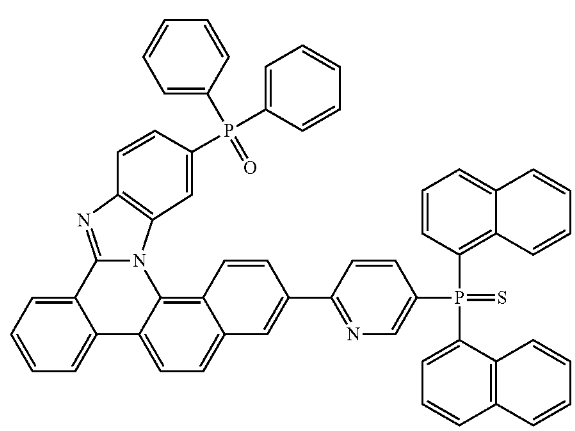

-continued
[Compound 10-15]
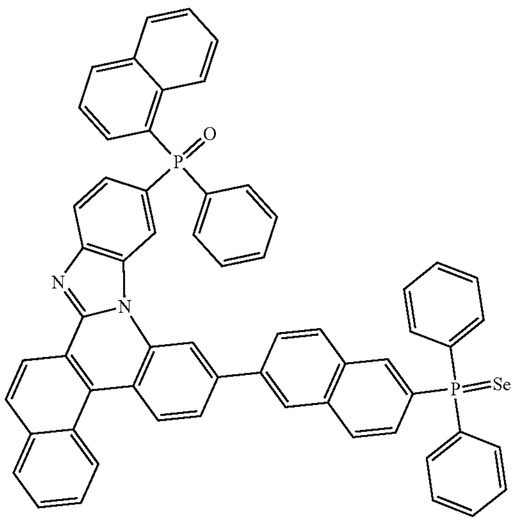
[Compound 10-16]
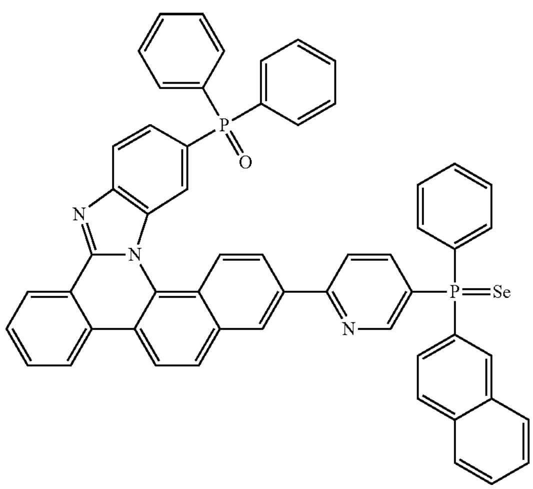
[Compound 10-17]
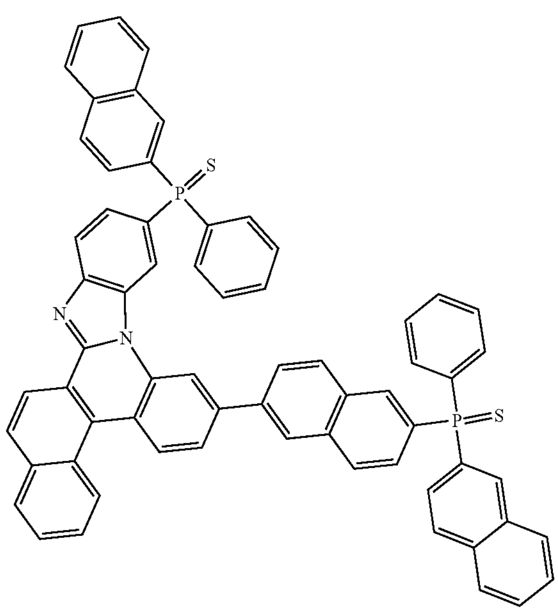
-continued
[Compound 10-18]
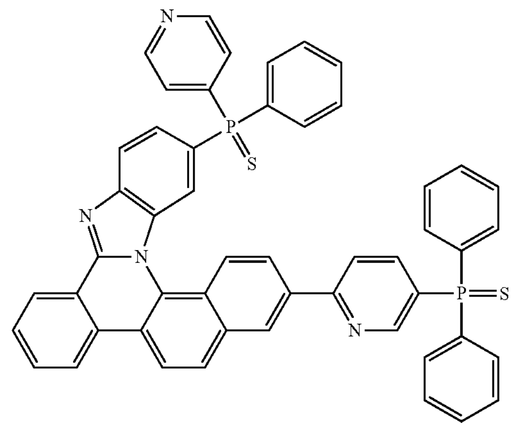
[Compound 10-19]
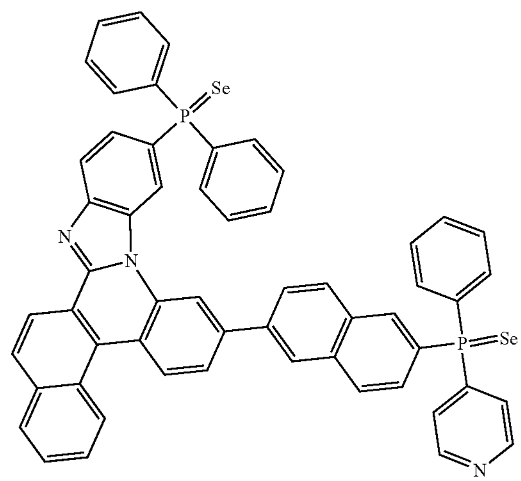
[Compound 10-20]
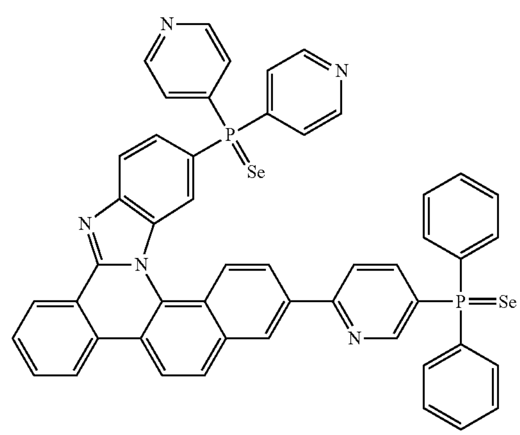

-continued
[Compound 10-22]
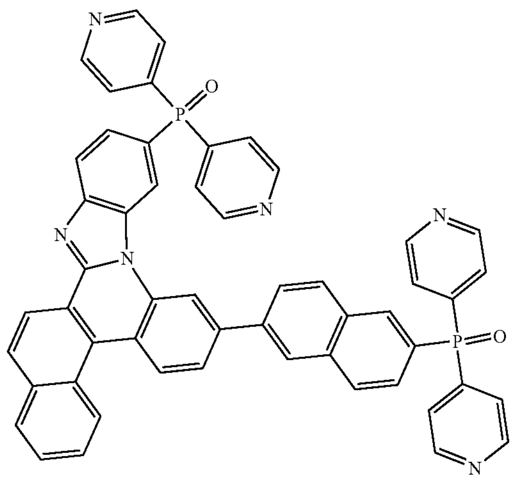
[Compound 10-23]
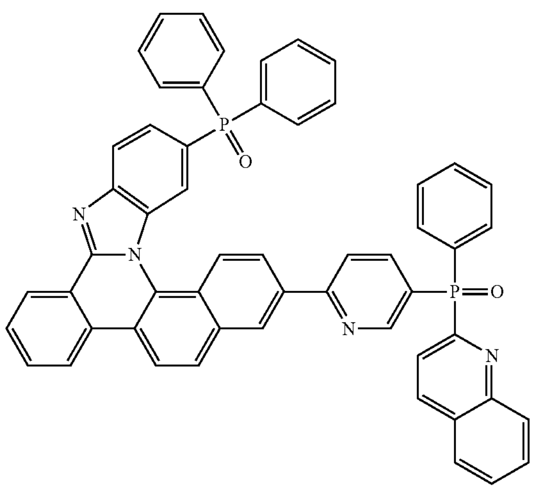
[Compound 10-24]
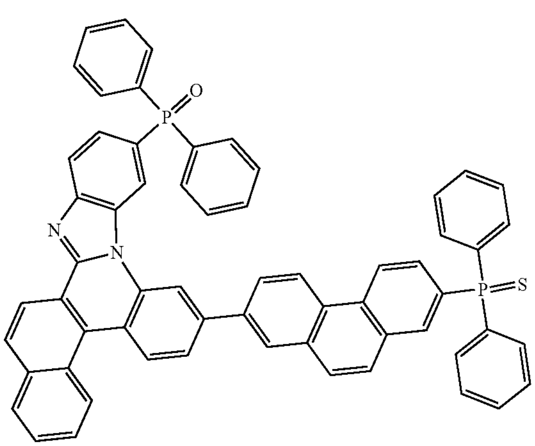
-continued
[Compound 10-24]
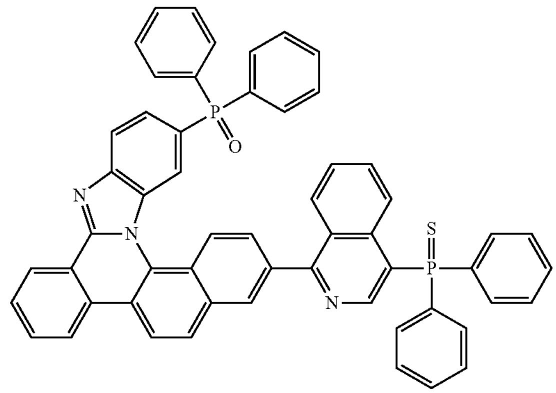
[Compound 10-25]
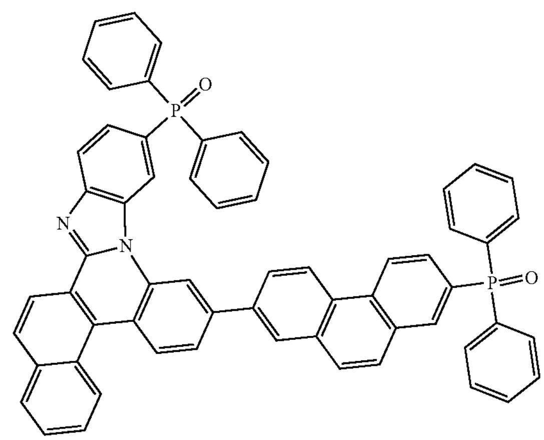
[Compound 10-26]
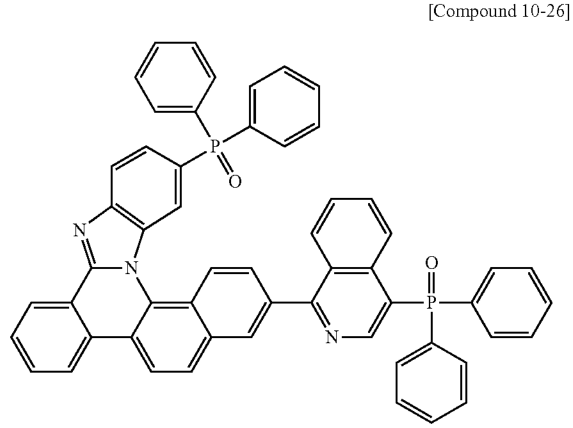

[Compound 10-27]
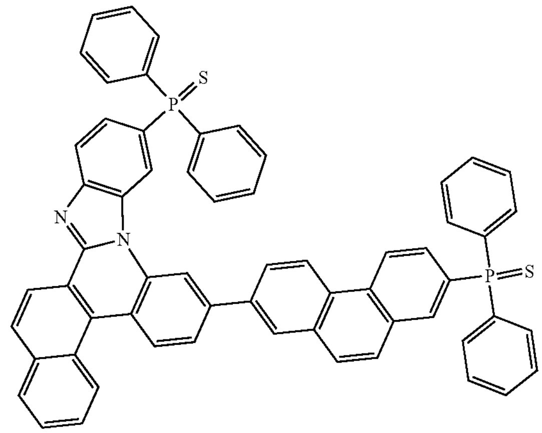
[Compound 10-28]
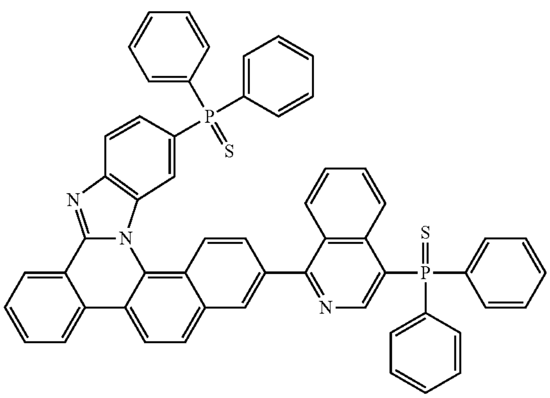
[Compound 10-29]
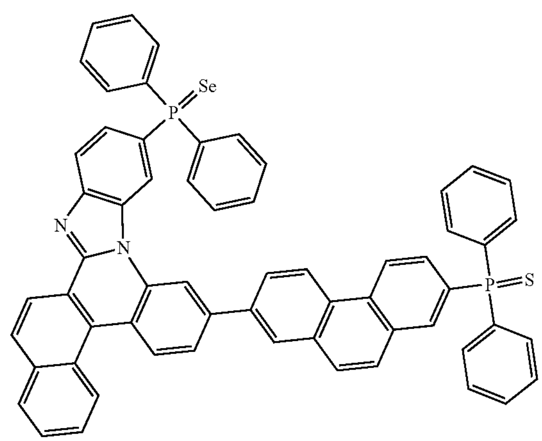
[Compound 10-30]
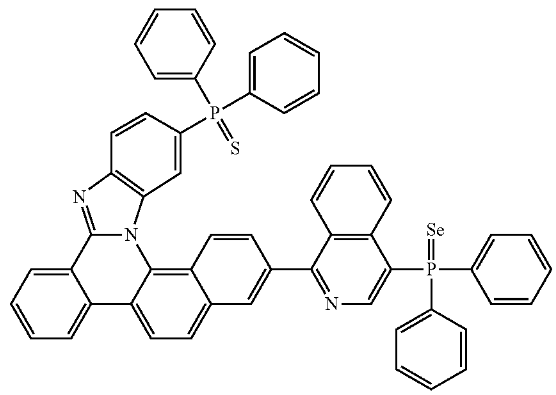
[Compound 10-31]
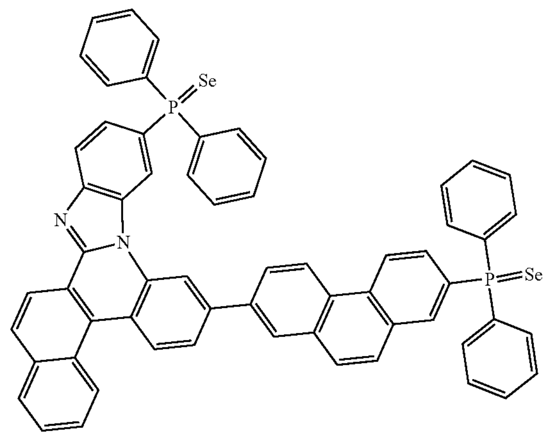
[Compound 10-32]
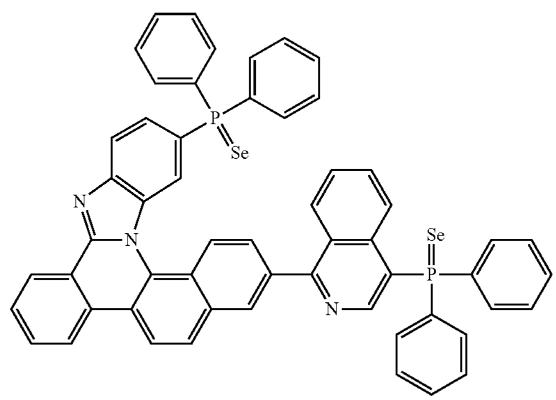
[Compound 11-1]
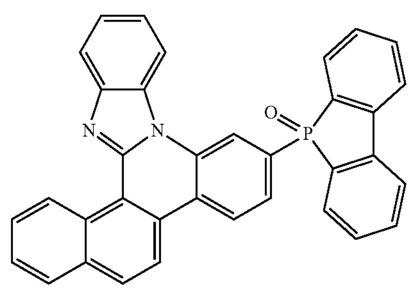

-continued
[Compound 11-2]
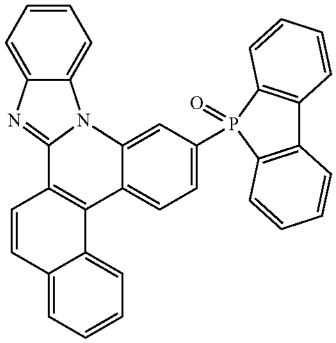
[Compound 11-3]
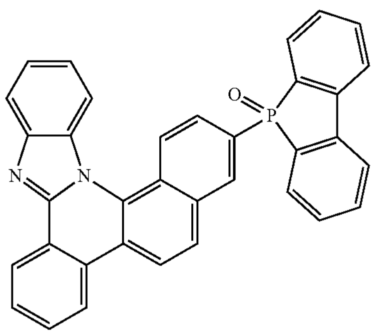
[Compound 11-4]
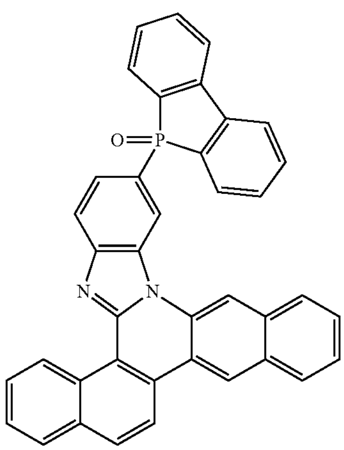
[Compound 11-5]
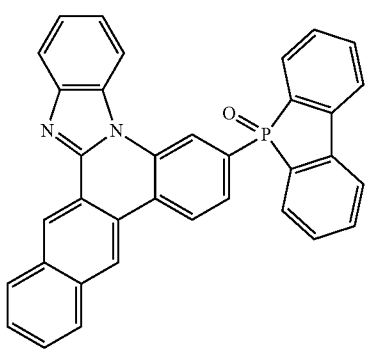
-continued
[Compound 11-6]
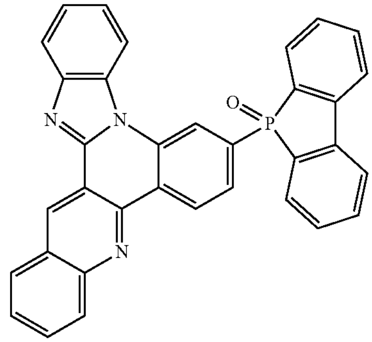
[Compound 11-7]
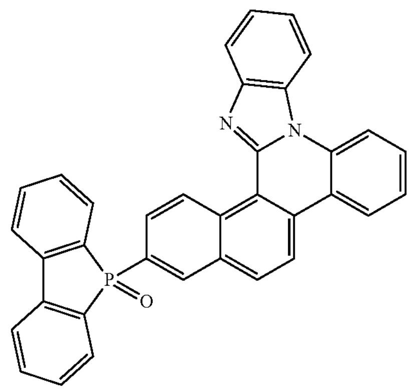
[Compound 11-8]
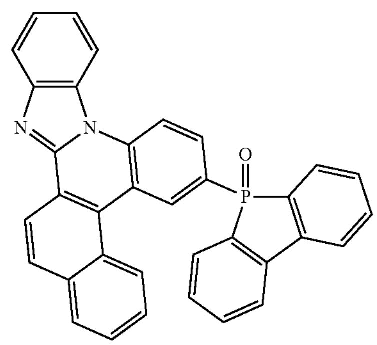
[Compound 11-9]
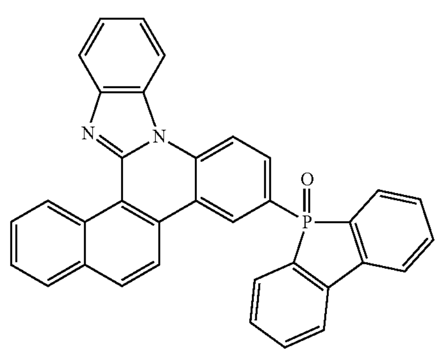

-continued

[Compound 11-10]

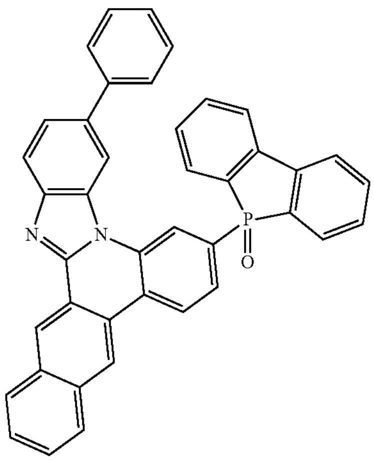

[Compound 11-11]

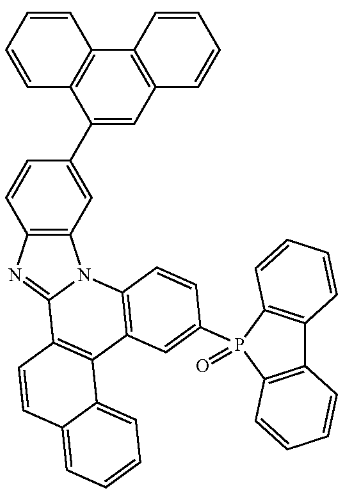

[Compound 11-12]

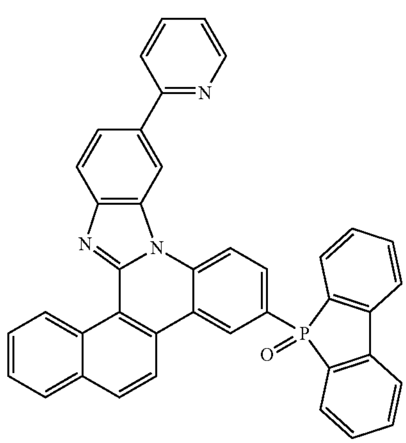

-continued

[Compound 11-13]

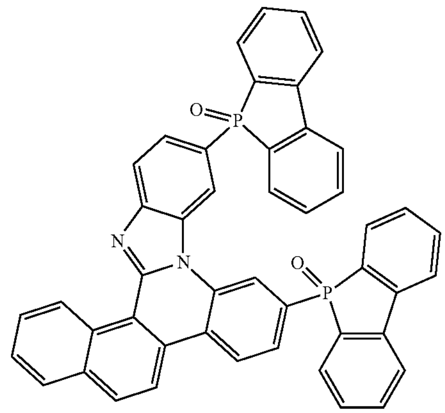

[Compound 11-14]

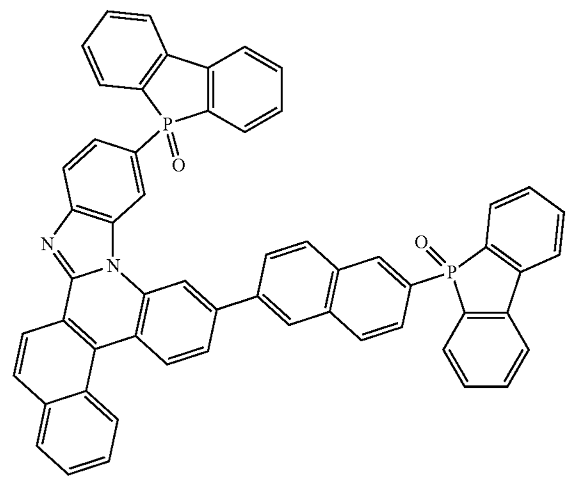

[Compound 11-15]

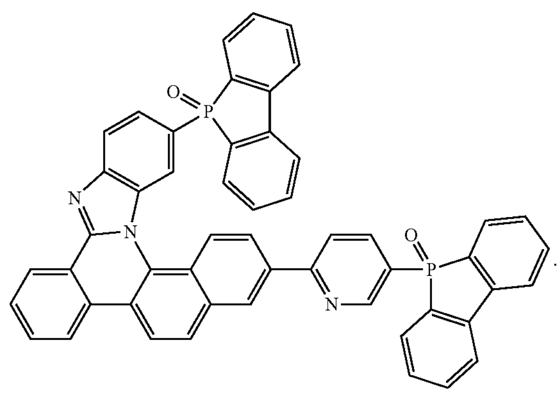

11. An organic light emitting device, comprising:
a first electrode;
a second electrode provided to face the first electrode; and
one or more organic material layers provided between the first electrode and the second electrode,
wherein one or more layers of the organic material layers comprise the compound of claim 10.

12. The organic light emitting device of claim 11, wherein the organic material layer comprising the compound is a hole injection layer, a hole transporting layer, or a layer which simultaneously injects and transports holes.

13. The organic light emitting device of claim 11, wherein the organic material layer comprising the compound is an electron injection layer, an electron transporting layer, or a layer which simultaneously injects and transports electrons.

14. The organic light emitting device of claim 11, wherein the organic material layer comprising the compound is a light emitting layer.

15. An organic light emitting device, comprising:

a first electrode;

a second electrode provided to face the first electrode; and one or more organic material layers provided between the first electrode and the second electrode, wherein one or more layers of the organic material layers comprise a compound of Chemical Formula 1:

[Chemical Formula 1]

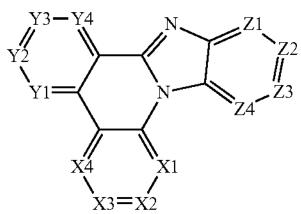

wherein:

X1 is N or CR1; X2 is N or CR2; X3 is N or CR3; and X4 is N or CR4;

Y1 is N or CR5; Y2 is N or CR6; Y3 is N or CR7; and Y4 is N or CR8;

Z1 is N or CR9; Z2 is N or CR10; Z3 is N or CR11; and Z4 is N or CR12;

X1 to X4, Y1 to Y4, and Z1 to Z4 are not simultaneously N;

R1 to R12 are the same as or different from each other, and each independently is hydrogen, deuterium, a halogen group, a nitrile group, a nitro group, a hydroxy group, a carbonyl group, an ester group, an imide group, an amino group, a substituted or unsubstituted silyl group, a substituted or unsubstituted boron group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted aralkyl group, a substituted or unsubstituted aralkenyl group, a substituted or unsubstituted alkylaryl group, a substituted or unsubstituted alkylamine group, a substituted or unsubstituted aralkylamine group, a substituted or unsubstituted heteroarylamine group, a substituted or unsubstituted arylamine group, a substituted or unsubstituted arylphosphine group, a substituted or unsubstituted aryl group, or a substituted or unsubstituted hetero-cyclic group, or two or more adjacent R1 to R5 groups or R7 to R12 groups optionally combine with each other to form a substituted or unsubstituted 6-membered ring;

at least one of a substituent of a ring formed by combining two or more adjacent groups of R1 to R12, and a group of R1 to R12, which does not form a ring, is

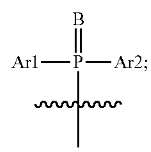

B is O, S, or Se; and

Ar1 and Ar2 are the same as or different from each other, and are each independently a substituted or unsubstituted aryl group, or a substituted or unsubstituted hetero-cyclic group, or combine with each other to form a substituted or unsubstituted ring, wherein the organic material layer comprising the compound is a hole injection layer, a hole transporting layer, a layer which simultaneously injects and transports holes, or a light emitting layer.

* * * * *